US012218052B2

(12) United States Patent
Schenker et al.

(10) Patent No.: US 12,218,052 B2
(45) **Date of Patent: *Feb. 4, 2025**

(54) ADVANCED LITHOGRAPHY AND SELF-ASSEMBLED DEVICES

(71) Applicant: Intel Corporation, Santa Clara, CA (US)

(72) Inventors: Richard E. Schenker, Portland, OR (US); Robert L Bristol, Portland, OR (US); Kevin L. Lin, Beaverton, OR (US); Florian Gstrein, Portland, OR (US); James M. Blackwell, Portland, OR (US); Marie Krysak, Portland, OR (US); Manish Chandhok, Beaverton, OR (US); Paul A Nyhus, Portland, OR (US); Charles H. Wallace, Portland, OR (US); Curtis W. Ward, Hillsboro, OR (US); Swaminathan Sivakumar, Beaverton, OR (US); Elliot N. Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/384,582

(22) Filed: Oct. 27, 2023

(65) Prior Publication Data

US 2024/0071917 A1 Feb. 29, 2024

Related U.S. Application Data

(63) Continuation of application No. 17/735,006, filed on May 2, 2022, now Pat. No. 11,854,787, which is a (Continued)

(51) Int. Cl.
*H01L 23/528* (2006.01)
*H01L 23/522* (2006.01)
(Continued)

(52) U.S. Cl.
CPC ........ *H01L 23/528* (2013.01); *H01L 23/5226* (2013.01); *H01L 23/53238* (2013.01);
(Continued)

(58) Field of Classification Search
CPC ............... H01L 23/528; H01L 23/5226; H01L 23/53238; H01L 23/5329; H01L 27/0886;
(Continued)

(56) References Cited

U.S. PATENT DOCUMENTS 6,172,387 B1 1/2001 Thakur
6,974,729 B2 12/2005 Collaert
(Continued)

FOREIGN PATENT DOCUMENTS

CN 104798183 7/2015
CN 105745745 7/2016
(Continued)

OTHER PUBLICATIONS

Office Action from Korean Patent Application No. 10-2019-7014746 mailed Oct. 23, 2023, 5 pgs.
(Continued)

*Primary Examiner* — Karen Kusumakar
(74) *Attorney, Agent, or Firm* — Schwabe, Williamson & Wyatt, P.C.

(57) ABSTRACT

Advanced lithography techniques including sub-10 nm pitch patterning and structures resulting therefrom are described. Self-assembled devices and their methods of fabrication are described.

20 Claims, 184 Drawing Sheets

Related U.S. Application Data continuation of application No. 17/110,215, filed on Dec. 2, 2020, now Pat. No. 11,373,950, which is a continuation of application No. 16/346,873, filed as application No. PCT/US2016/068586 on Dec. 23, 2016, now Pat. No. 10,892,223.

(51) Int. Cl.
*H01L 23/532* (2006.01)
*H01L 27/088* (2006.01)
*H01L 29/78* (2006.01)

(52) U.S. Cl.
CPC ...... *H01L 23/5329* (2013.01); *H01L 27/0886* (2013.01); *H01L 29/7848* (2013.01)

(58) Field of Classification Search
CPC ........... H01L 29/7848; H01L 29/66545; H01L 21/76801; H01L 21/76807; H01L 21/76808; H01L 21/76811; H01L 21/7682; H01L 23/53295; H01L 21/31144; H01L 21/0337; H01L 21/3086; H01L 21/76816; H01L 21/76834; H01L 21/76883; H01L 21/76885; H01L 21/76897; H01L 21/823821; H01L 27/0924; H01L 21/0274; H01L 21/76813; H01L 21/76829; H01L 21/76838
See application file for complete search history.

(56) References Cited

U.S. PATENT DOCUMENTS

| | | | |
|---|---|---|---|
| 7,488,650 B2 | 2/2009 | Schulz | |
| 8,835,268 B2 | 9/2014 | Sudo | |
| 9,023,222 B2 | 5/2015 | Kawanishi | |
| 9,041,217 B1 | 5/2015 | Bristol et al. | |
| 9,209,077 B2 | 12/2015 | Meyers et al. | |
| 9,236,342 B2 | 1/2016 | Bristol | |
| 9,239,342 B2 | 1/2016 | Bristol et al. | |
| 9,257,505 B2 | 2/2016 | Lai | |
| 9,455,227 B1 | 9/2016 | Hung | |
| 9,666,451 B2 | 5/2017 | Wallace et al. | |
| 9,793,159 B2 | 10/2017 | Wallace et al. | |
| 9,793,163 B2 | 10/2017 | Bristol et al. | |
| 10,014,256 B2 | 7/2018 | Nelson et al. | |
| 10,153,270 B2 | 12/2018 | Kang | |
| 10,211,088 B2 | 2/2019 | Wallace et al. | |
| 10,236,369 B2 | 3/2019 | Pillarisetty | |
| 10,269,623 B2 | 4/2019 | Bristol et al. | |
| 10,325,814 B2 | 6/2019 | Nyhus | |
| 10,535,747 B2 | 1/2020 | Liu | |
| 2009/0200683 A1 | 8/2009 | Colburn et al. | |
| 2011/0193175 A1 | 8/2011 | Huang et al. | |
| 2012/0313251 A1 | 12/2012 | Kato | |
| 2013/0026571 A1 | 1/2013 | Kawa et al. | |
| 2013/0256425 A1 | 10/2013 | Misuraca et al. | |
| 2015/0171010 A1 | 6/2015 | Bristol et al. | |
| 2015/0179513 A1 | 6/2015 | Myers et al. | |
| 2015/0255284 A1 | 9/2015 | Bristol et al. | |
| 2015/0371852 A1 | 12/2015 | Zhang et al. | |
| 2016/0020110 A1* | 1/2016 | Lu | H01L 29/78 257/618 |
| 2016/0155662 A1 | 6/2016 | Lee | |
| 2016/0336187 A1 | 11/2016 | Liou et al. | |
| 2017/0092506 A1* | 3/2017 | deVilliers | H01L 21/0337 |
| 2017/0294350 A1 | 10/2017 | Golonzka | |
| 2018/0308754 A1 | 10/2018 | Guler | |
| 2018/0315590 A1 | 11/2018 | Schenker et al. | |
| 2018/0323100 A1 | 11/2018 | Nyhus et al. | |
| 2018/0323104 A1 | 11/2018 | Younkin et al. | |
| 2019/0013175 A1 | 1/2019 | Tandon | |
| 2019/0013246 A1 | 1/2019 | Wallace et al. | |
| 2019/0019748 A1 | 1/2019 | Wallace et al. | |
| 2019/0025694 A1 | 1/2019 | Choi | |
| 2019/0043731 A1 | 2/2019 | Bristol et al. | |
| 2019/0139887 A1 | 5/2019 | Lin et al. | |

FOREIGN PATENT DOCUMENTS

| | | |
|---|---|---|
| CN | 105793977 | 7/2016 |
| EP | 3174105 | 5/2017 |
| JP | 2008073768 | 4/2008 |
| JP | 2013-513250 A | 4/2013 |
| JP | 2014-192336 | 10/2014 |
| KR | 1020150139281 | 12/2015 |
| KR | 1020160098194 | 8/2016 |
| KR | 1020160098195 | 8/2016 |
| KR | 101688699 | 1/2017 |
| TW | 201714208 | 4/2017 |
| TW | 201801319 | 1/2018 |
| TW | I806638 B | 6/2023 |
| WO | WO 2015094305 | 6/2015 |
| WO | WO-2015191106 | 12/2015 |
| WO | WO-2017111868 | 6/2017 |
| WO | WO-2017111923 | 6/2017 |
| WO | WO-2017111925 | 6/2017 |
| WO | WO-2017204820 | 9/2017 |
| WO | WO-2017204821 | 11/2017 |
| WO | WO2018094073 | 5/2018 |

OTHER PUBLICATIONS

International Search Report and Written Opinion for International Patent Application No. PCT/US2016/068586 mailed Sep. 12, 2017, 11 pgs.
Office Action for Brazil Patent Application No. 112019010217-5 mailed Jun. 2, 2020, 5 pgs., with English translation.
International Preliminary Report on Patentability for International Patent Application No. PCT/US2016/068586 mailed Jul. 4, 2019, 8 pgs.
Office Action from Indian Patent Application No. 201947021249 mailed Dec. 30, 2020, 6 pgs.
Office Action from Japanese Patent Application No. 2019-527458 mailed Mar. 16, 2021, 5 pgs.
Notice of Allowance from Japanese Patent Application No. 2019-527458 mailed Jun. 29, 2021, 3 pgs.
Notice of Allowance from Taiwan Patent Application No. 107106019 mailed Feb. 24, 2022, 5 pgs.
Office Action from Japanese Patent Application No. 2021-122723 mailed Sep. 13, 2022, 2 pgs., no translation.
Office Action from Chinese Patent Application No. 201680091835.X mailed Nov. 2, 2022, 7 pgs., no translation.
Notice of Allowance from Japanese Patent Application No. 2021-122723 mailed Feb. 21, 2023, 2 pgs.
Notice of Allowance from Chinese Patent Application No. 201680091835.X mailed May 19, 2023, 5 pgs.
Notice of Allowance from Taiwan Patent Application No. 111120350 mailed Feb. 22, 2023, 5 pgs., with English translation.
Office Action from Taiwan Patent Application No. 112119046 mailed Mar. 22, 2024, 4 pgs.
Notice of Allowance from Korean Patent Application No. 10-2019-7014746 mailed Jun. 24, 2024, 5 pgs.

* cited by examiner

PLAN VIEWS

ANGLED VIEWS

CROSS-SECTIONAL VIEWS

PLAN VIEWS
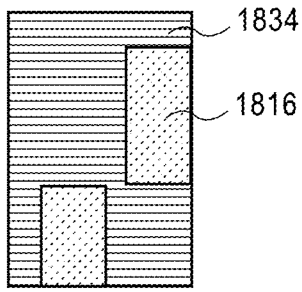
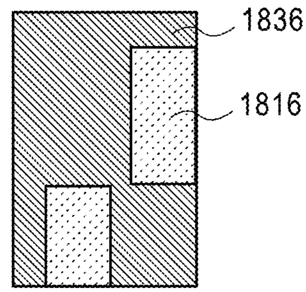
ANGLED VIEWS
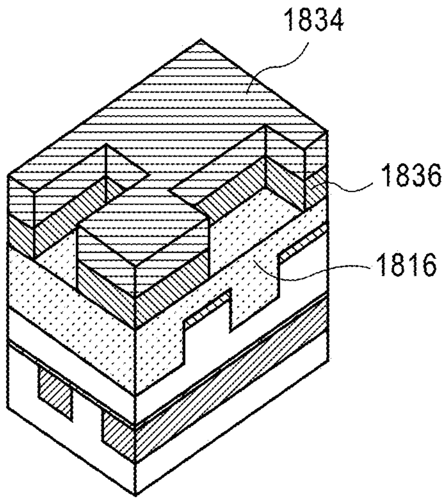
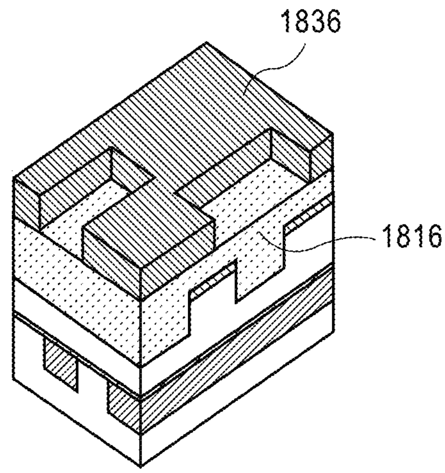
CROSS-SECTIONAL VIEWS
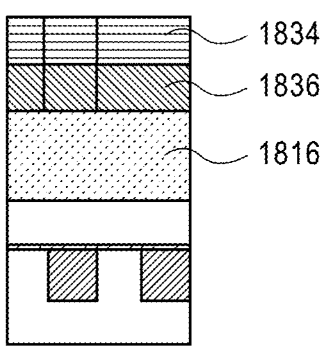
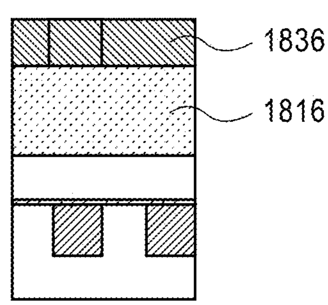
FIG. 18Q
FIG. 18R

PLAN VIEWS

ANGLED VIEWS

CROSS-SECTIONAL VIEWS

PLAN VIEWS

ANGLED VIEWS

CROSS-SECTIONAL VIEWS

PLAN VIEWS

ANGLED VIEWS

CROSS-SECTIONAL VIEWS

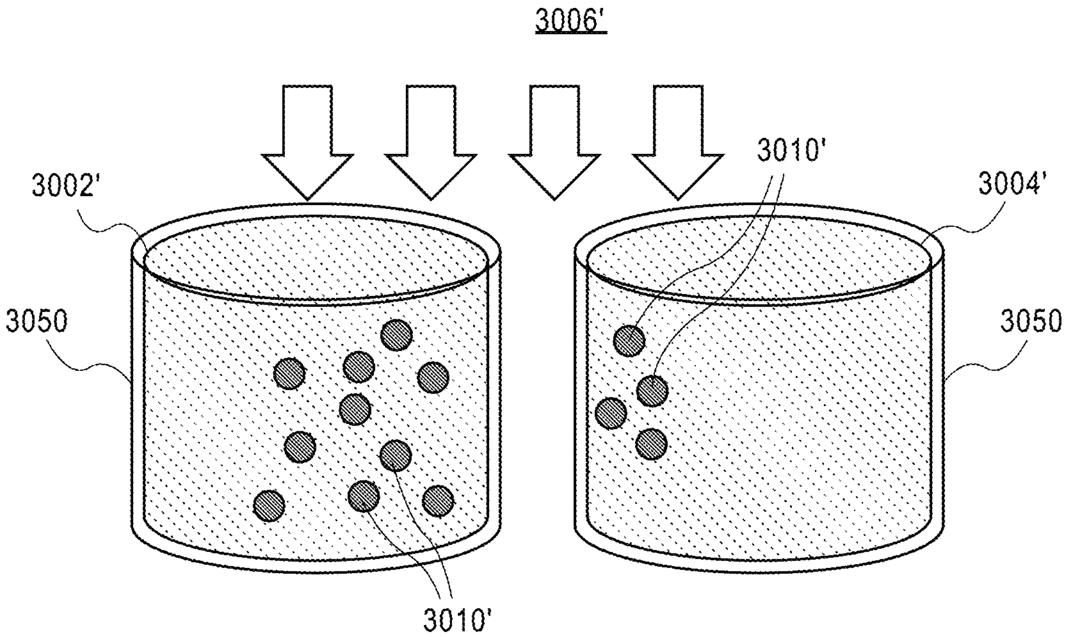
FIG. 30A'
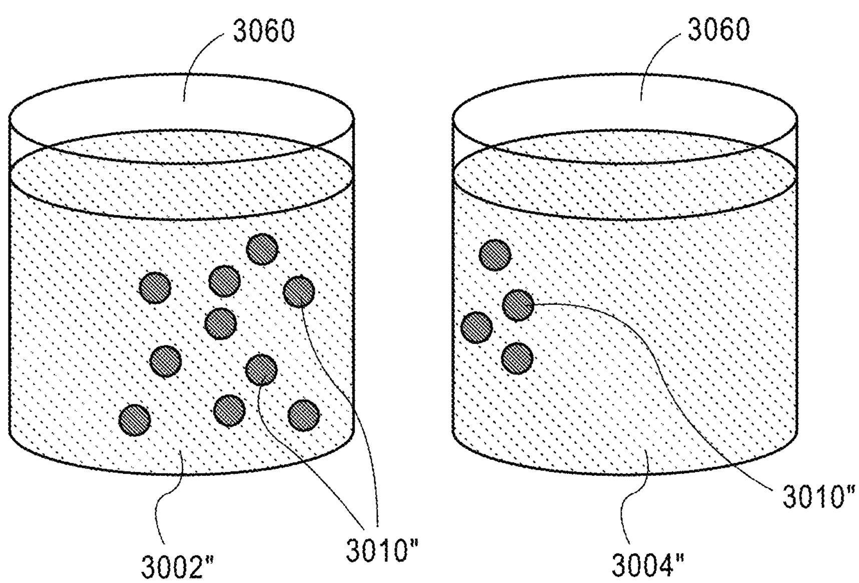
FIG. 30A"

3300

3320

3340

ANGLED VIEW

PLAN VIEW

PLAIN VIEW

CROSS-SECTIONAL VIEW

PLAIN VIEW

CROSS-SECTIONAL VIEW

PLAIN VIEW

CROSS-SECTIONAL VIEW

PLAIN VIEW

CROSS-SECTIONAL VIEW

ADVANCED LITHOGRAPHY AND SELF-ASSEMBLED DEVICES

CROSS-REFERENCE TO RELATED APPLICATION

This patent application is a continuation of U.S. patent application Ser. No. 17/735,006, filed May 2, 2022, which is a continuation of U.S. patent application Ser. No. 17/110,215, filed Dec. 2, 2020, now U.S. Pat. No. 11,373,950, issued Jun. 28, 2022, which is a continuation of U.S. patent application Ser. No. 16/346,873, filed May 1, 2019, now U.S. Pat. No. 10,892,223, issued Jan. 12, 2021, which is a U.S. National Phase Application under 35 U.S.C. § 371 of International Application No. PCT/US2016/068586, filed Dec. 23, 2016, entitled "ADVANCED LITHOGRAPHY AND SELF-ASSEMBLED DEVICES," which designates the United States of America, the entire disclosure of which is hereby incorporated by reference in its entirety and for all purposes.

TECHNICAL FIELD

Embodiments of the disclosure are in the field of semiconductor devices and processing and, in particular, sub-10 nm pitch patterning and self-assembled devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 8H' and 8H" illustrate cross-sectional views of exemplary structures following via and plug patterning, in accordance with an embodiment of the present disclosure.

FIGS. 30A' illustrates a schematic view of an operation in another method of patterning using photobuckets, in accordance with an embodiment of the present disclosure.

FIGS. 30A" illustrates a schematic view of an operation in another method of patterning using photobuckets, in accordance with an embodiment of the present disclosure.

DESCRIPTION OF THE EMBODIMENTS

Figure 1A:
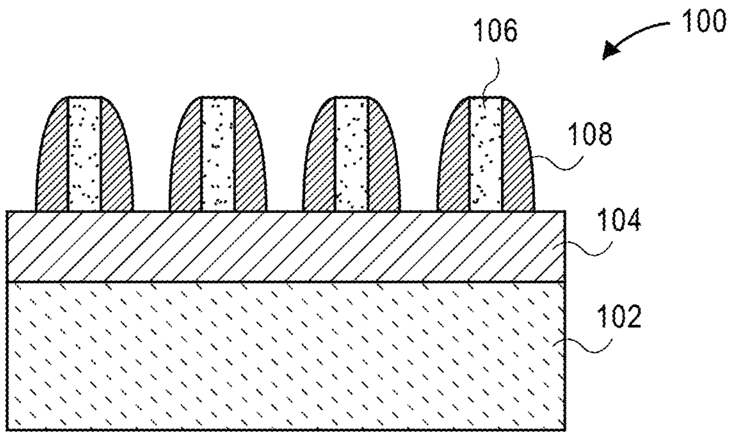
FIG. 1A illustrates a cross-sectional view of a starting structure following deposition, but prior to patterning, of a hardmask material layer formed on an interlayer dielectric (ILD) layer.

Advanced pitch patterning and self-assembled devices are described, in particular advanced pitch patterning techniques and self-assembled device fabrication methods to generate sub-10 nanometer (nm) devices and structures. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL. Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 1B:
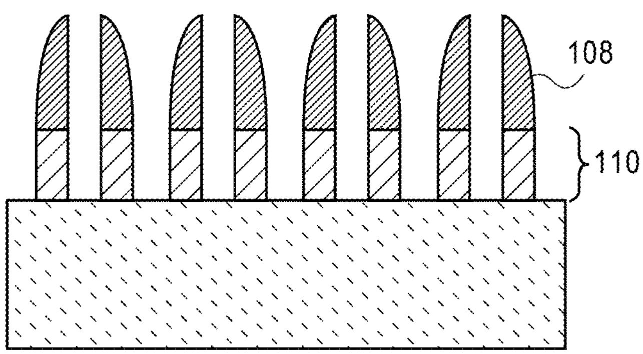
FIG. 1B illustrates a cross-sectional view of the structure of FIG. 1A following patterning of the hardmask layer by pitch halving.

In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 2:
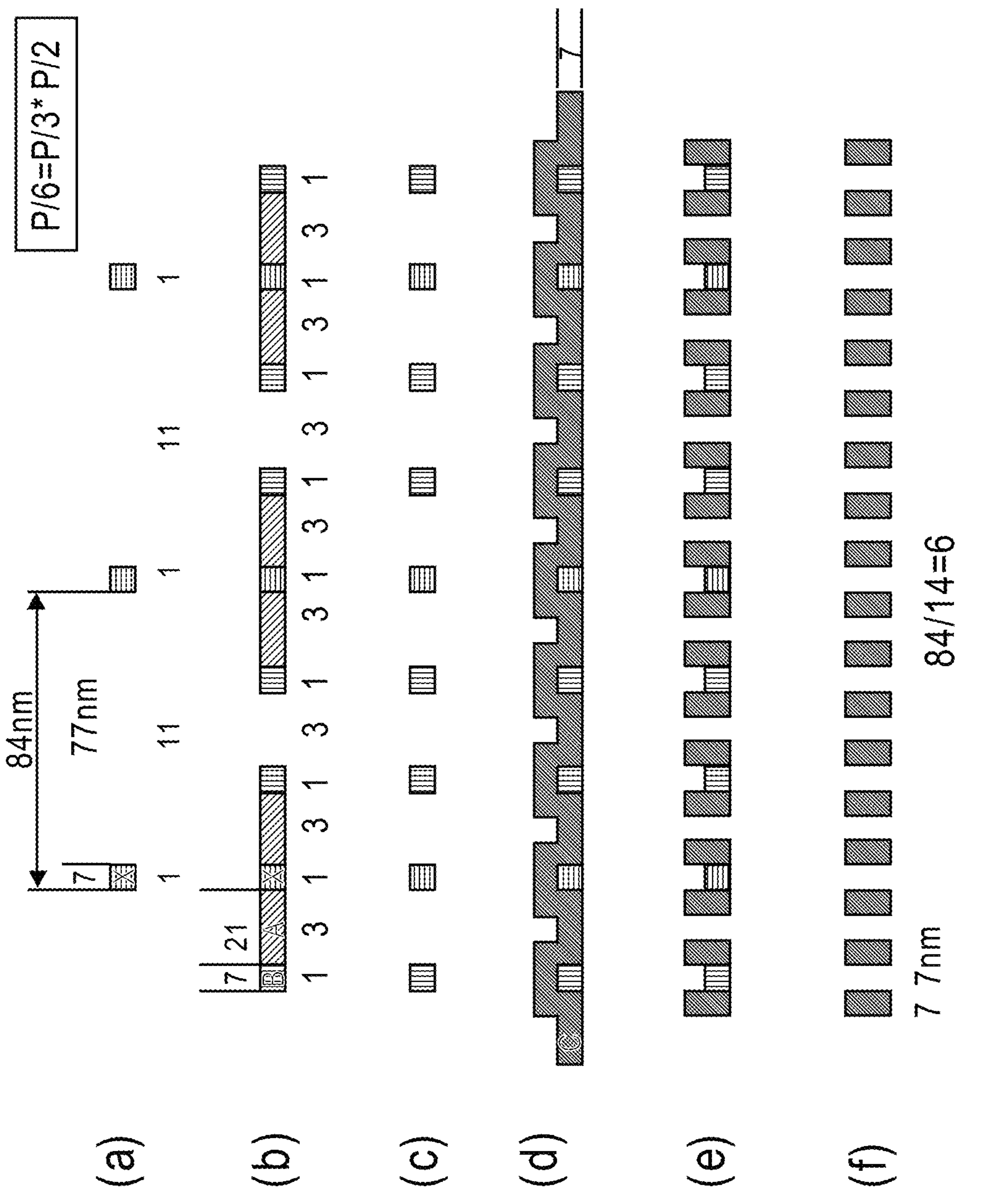
FIG. 2 illustrates cross-sectional views in a spacer-based-sextuple-patterning (SBSP) processing scheme which involves pitch division by a factor of six.

For example, FIG. 2 illustrates cross-sectional views in a spacer-based-sextuple-patterning (SBSP) processing scheme which involves pitch division by a factor of six. Referring to FIG. 2, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 3:
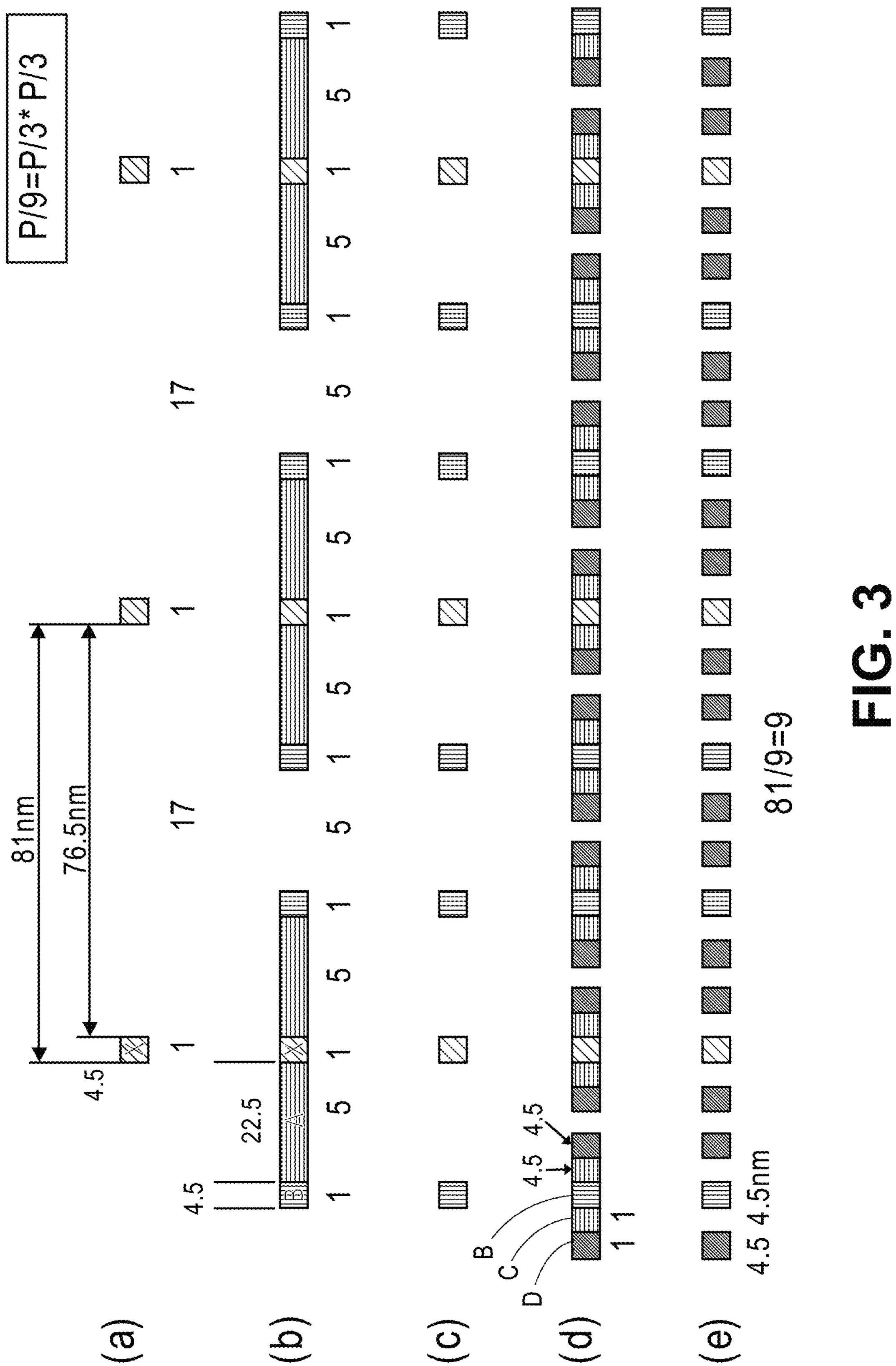
FIG. 3 illustrates cross-sectional views in a spacer-based-nonuple-patterning (SBNP) processing scheme which involves pitch division by a factor of nine.

In another example, FIG. 3 illustrates cross-sectional views in a spacer-based-nonuple-patterning (SBNP) processing scheme which involves pitch division by a factor of nine. Referring to FIG. 3, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C and D deposition and etch. At operation (e), a pitch/9 pattern is achieved following spacer C removal.

In any case, in an embodiment, a gridded layout may be fabricated by conventional or state-of-the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In an embodiment, directed self-assembly (DSA) is implemented for hardmask differentiation (e.g., forming hardmasks with different etch properties). In some embodiments differentiated hardmasks may also be referred to as "colored" hardmasks, wherein hardmasks having the same color have the same or similar etch selectivities and wherein hardmasks having different colors have different etch selectivities. It should be noted that in actual practice, the term "color" does not refer to the actual color of the hardmask material. Hardmask differentiation (or coloring) may be used for patterning or selectively removing semiconductor fins among a plurality of gridded semiconductor fins. One or more embodiments described herein is directed to processes and structures based on and resulting from aligned pitch-quartered (or other) patterning approaches for edge placement error (EPE) rectification. One or more embodiments may be described as a differentiated or "colored" alternating hardmask approach for semiconductor fin patterning. Embodiments may include one or more of DSA, semiconductor material patterning, pitch division such as pitch quartering, differentiated hardmask selectivity, self-alignment for fin patterning. One or more embodiments is particularly suited for non-planar semiconductor device fabrication.

In accordance with an embodiment of the present disclosure, doubling of allowed edge placement error and doubling of the cut size for cutting of small features at tight pitch is implemented for very fine fin patterning. In one embodiment, all features (e.g., fin lines) are transferred into a semiconductor substrate with a single population of critical dimension (CD) variation. This approach is in contrast to state of the art approaches that rely on spacer-based pitch quartering which typically has three discrete populations of line widths (e.g., backbone or mandrel, complement and spacer dimensions).

To provide context, it may be desirable to use bulk silicon for fins or trigate based semiconductor devices. In an embodiment, directed self-assembly (DSA) is implemented to accomplish pitch division and "coloring" of every other feature in a desired pattern. In one such embodiment, the patterning approach is particularly applicable to patterning silicon fins in a tri-gate transition patterning flow. In an embodiment advantages of implementing approaches described herein may include one or more of: (1) enabling a single population of feature widths, (2) doubling the edge placement error requirements for feature cutting, (3) doubling dimensions of the hole or opening required to cut a single feature (e.g., relaxing the restrictions on the size of the opening), or (4) reducing the cost of the patterning process. Structural artifacts resulting from the process include, in an embodiment, a single population of critical dimensions and at the transitions from one pitch to another and/or from one grid to another at the guard rings surrounding the die of the chips. Embodiments may enable cutting of tight pitch lines without scaling the edge-placement error requirements.

Figure 4A:
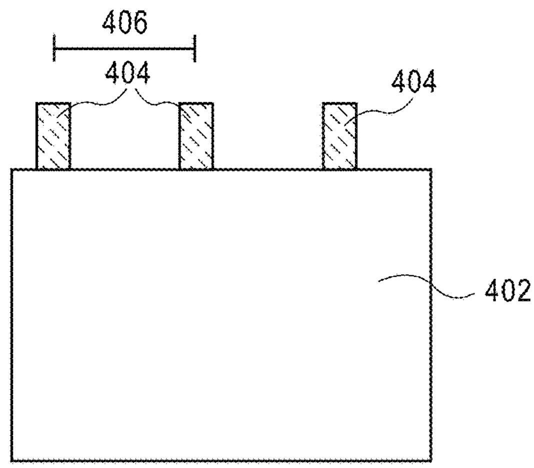
FIGS. 4A-4N illustrate cross-sectional view of various operations in a method of fabricating non-planar semiconductor devices, in accordance with an embodiment of the present disclosure, where.
Figure 4B:
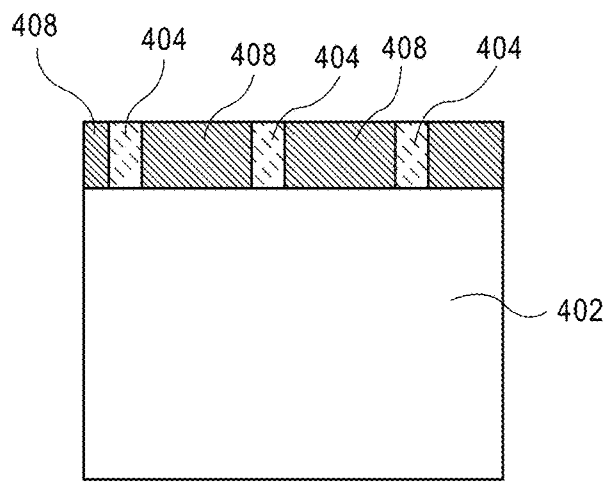
Figure 4C:
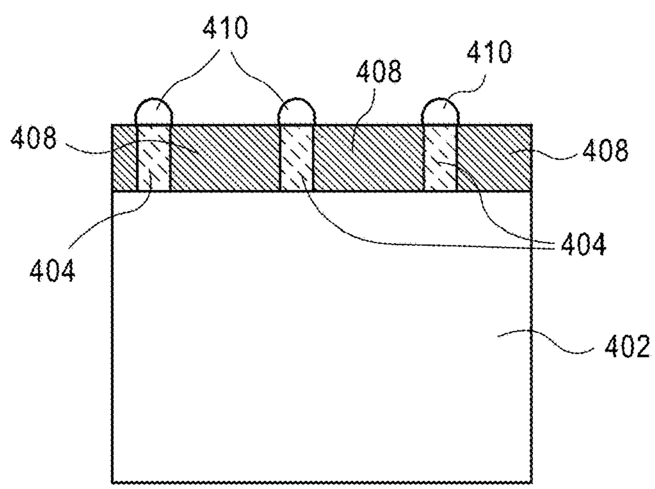
Figure 4D:
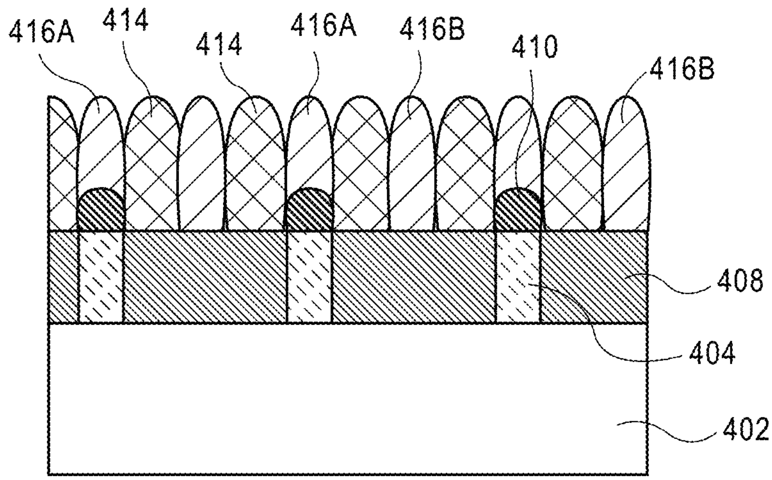
Figure 4E:
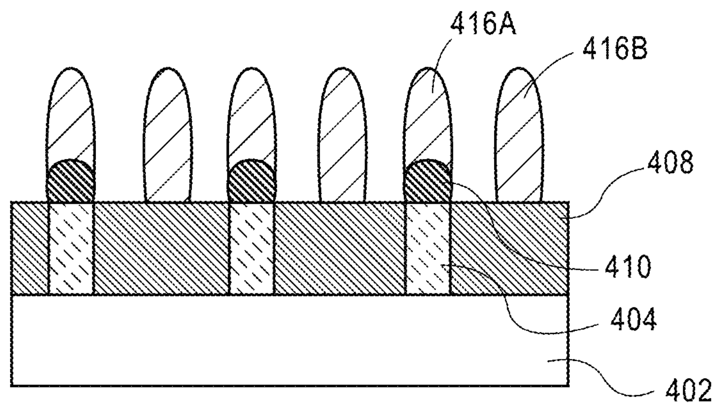
Figure 4F:
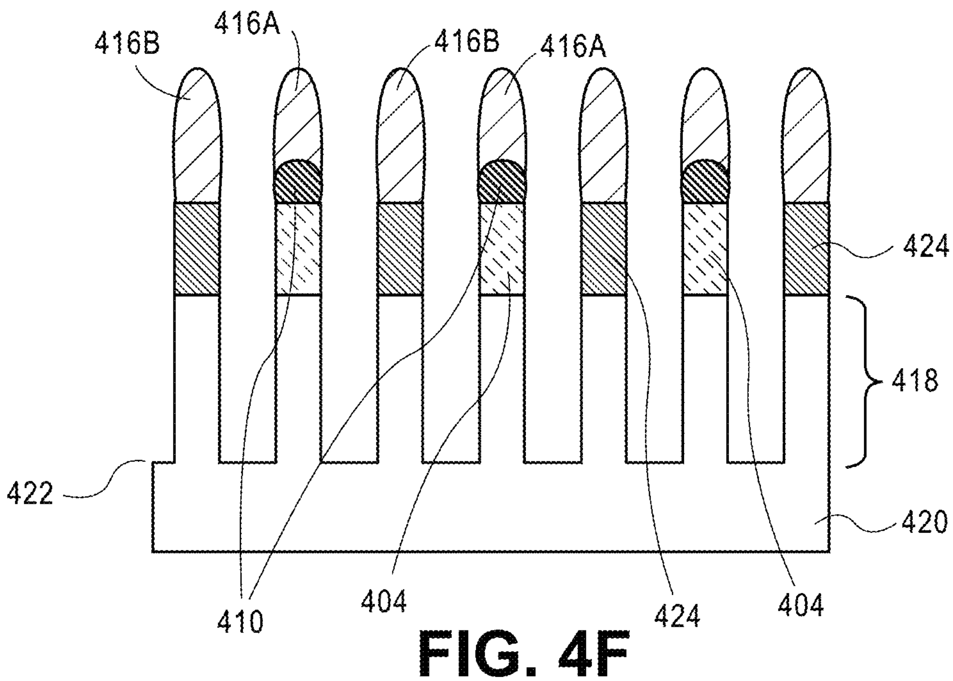
Figure 4G:
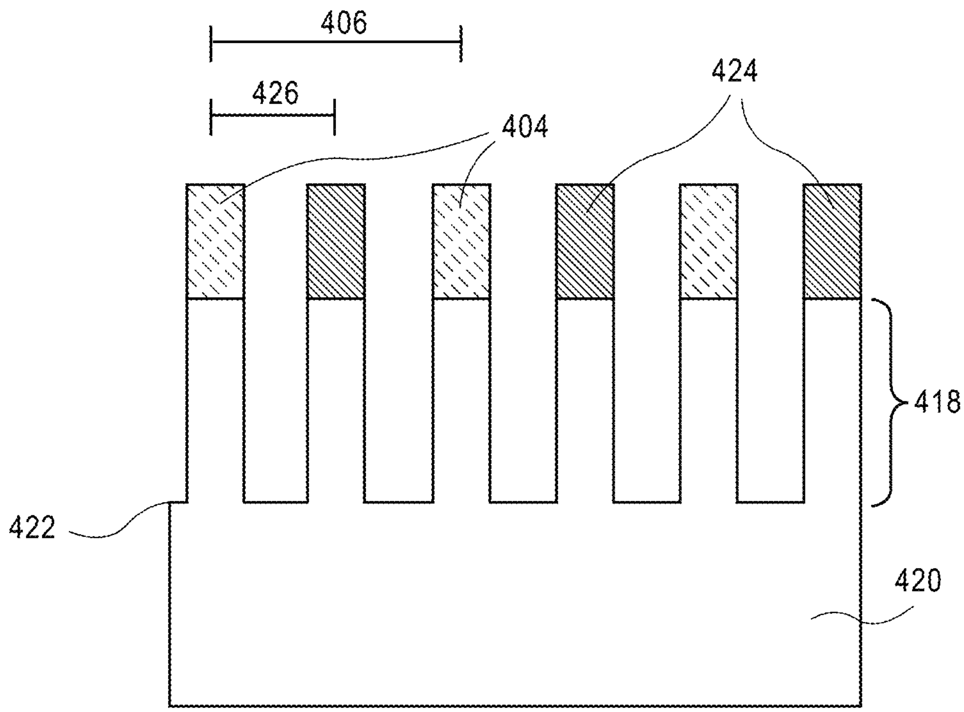
Figure 4H:
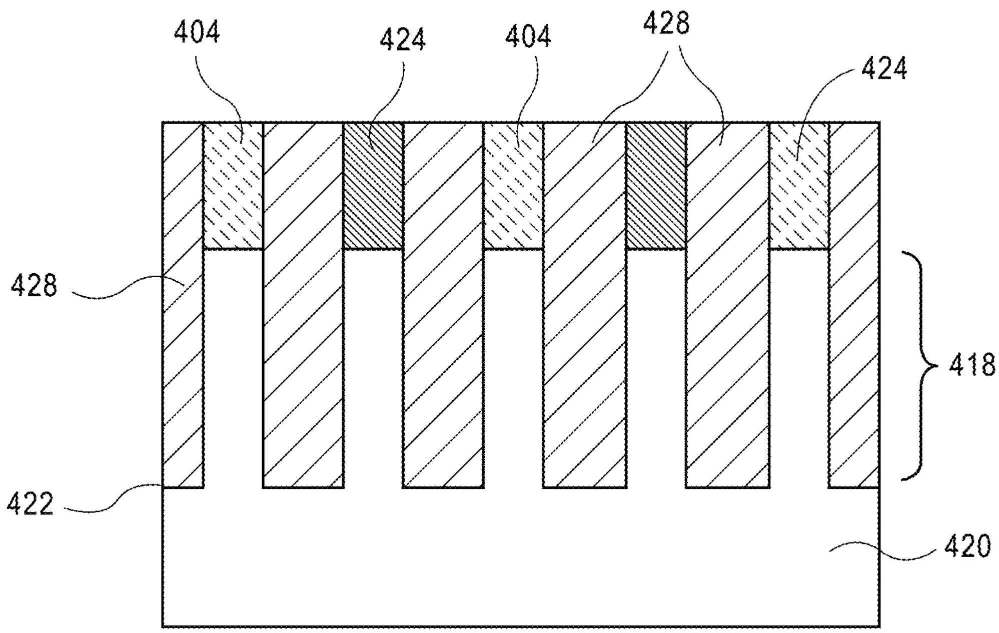
Figure 4I:
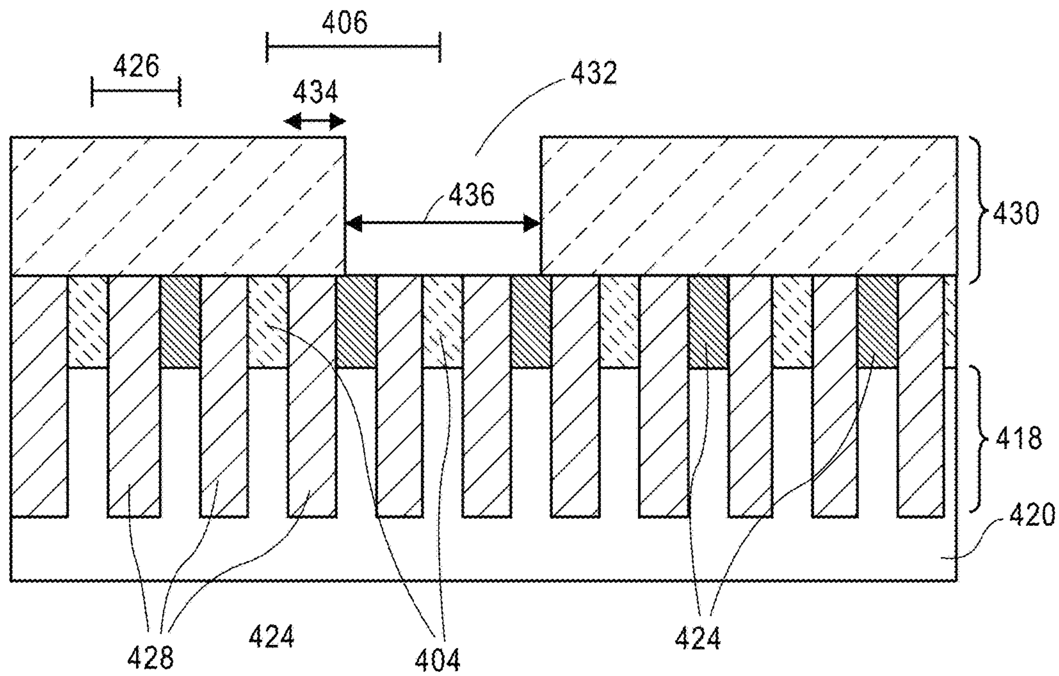
Figure 4J:
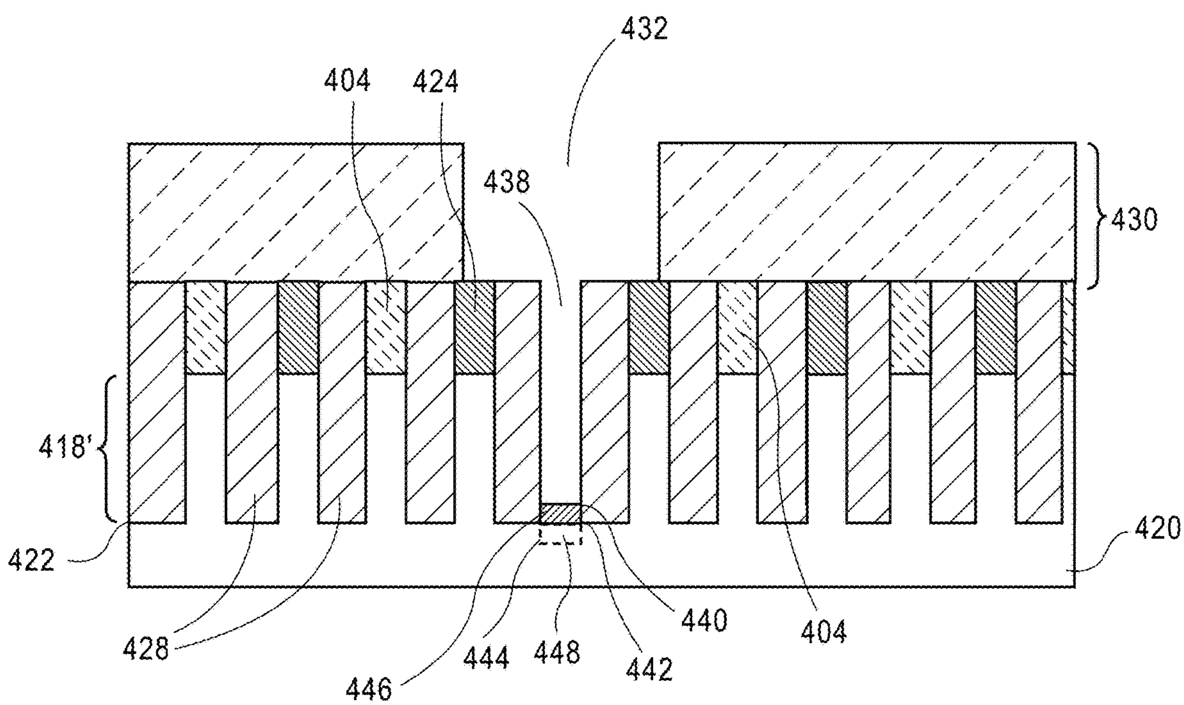
Figure 4K:
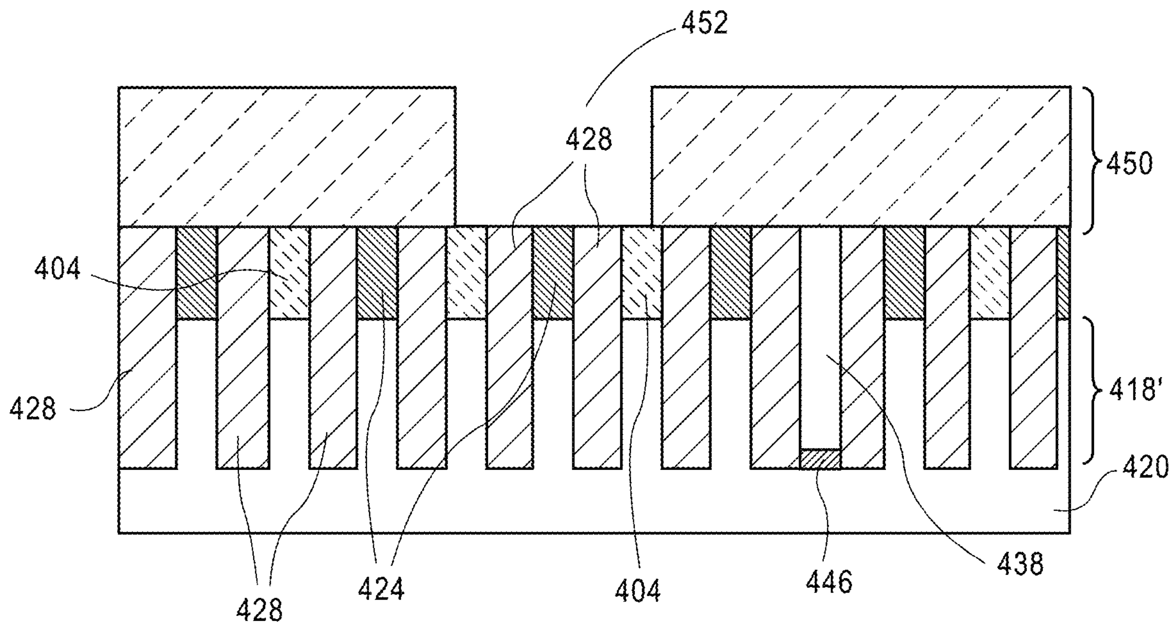
Figure 4L:
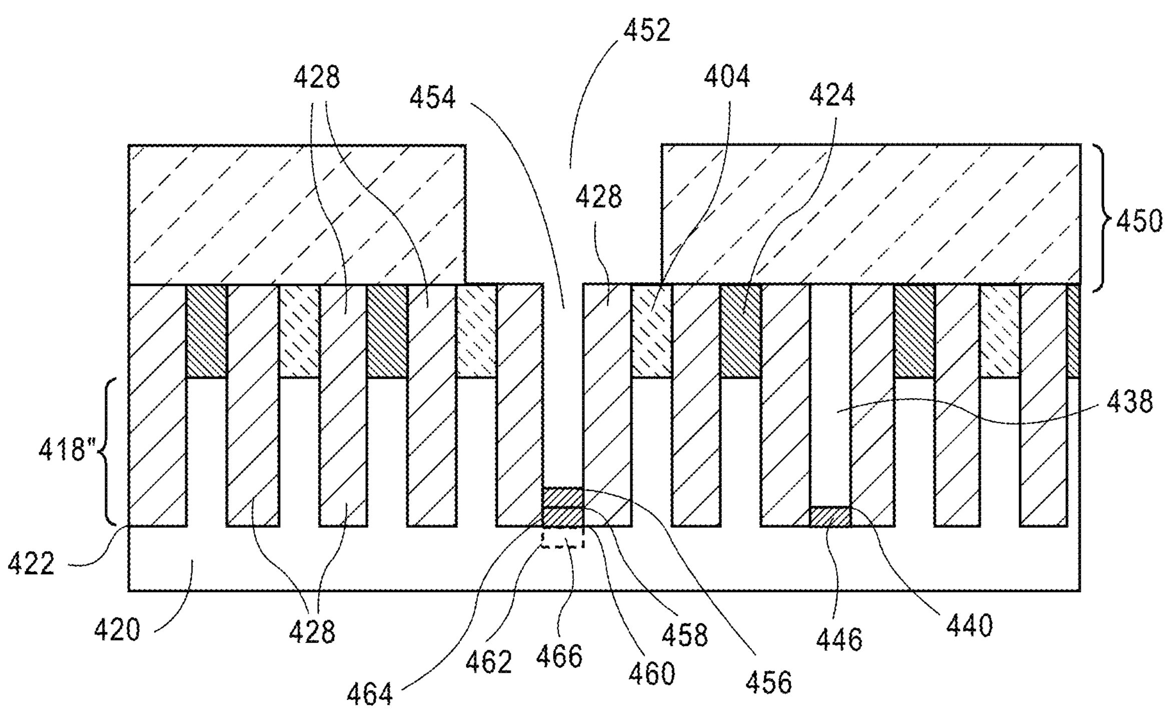
Figure 4M:
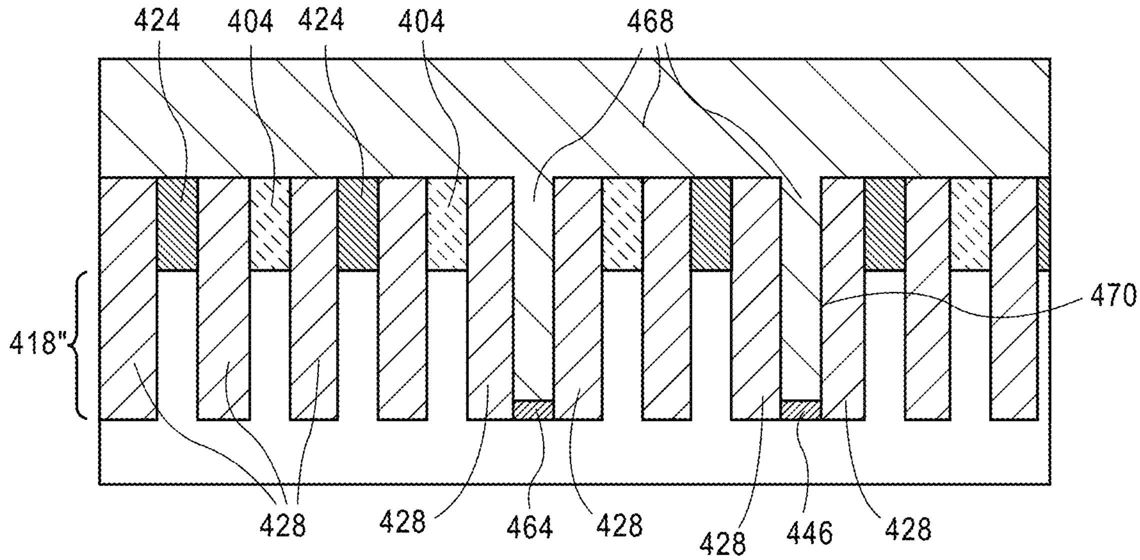
Figure 4N:
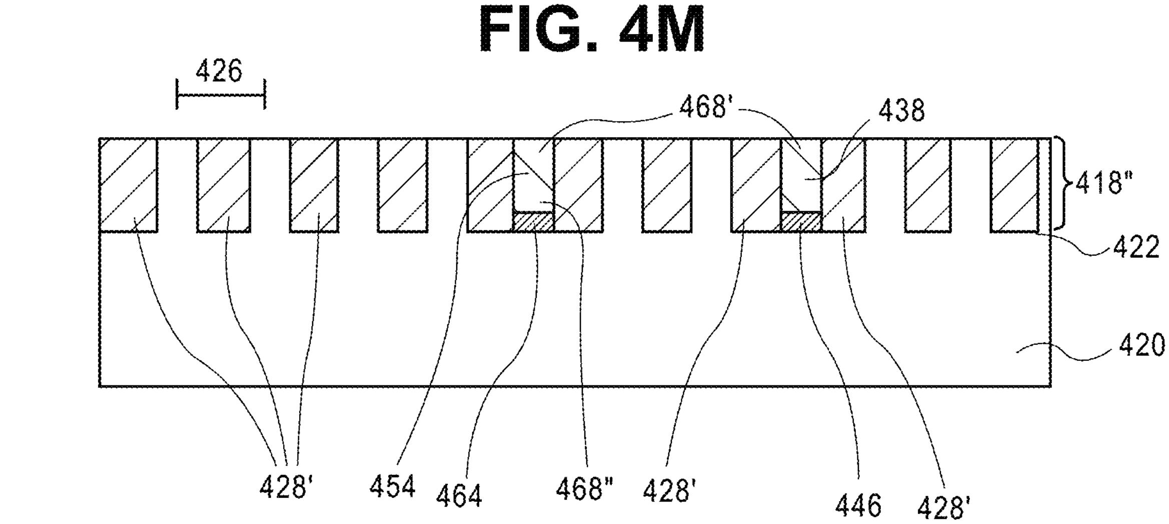

In an exemplary processing scheme, FIGS. 4A-4N illustrate cross-sectional view of various operations in a method of fabricating non-planar semiconductor devices, in accordance with an embodiment of the present disclosure.

FIG. 4A illustrates a bulk semiconductor substrate 402 having a first patterned hardmask 404 formed thereon. In an embodiment, the bulk semiconductor substrate 402 is a bulk single crystalline silicon substrate having fins 402 etched therein. In one embodiment, the bulk semiconductor substrate 402 is undoped or lightly doped at this stage. For example, in a particular embodiment, the bulk semiconductor substrate 402 has a concentration of less than approximately 1E17 atoms/$cm^3$ of boron dopant impurity atoms.

In an embodiment, the first patterned hardmask 404 includes features having a pitch 406. In one such embodiment, the first patterned hardmask 404 represents half of the possible number of fins ultimately formed in the substrate 402. That is, the pitch 406 is effectively relaxed to double the pitch of the final pattern of fins formed. In one embodiment, the first hardmask 404 is patterned directly using a lithographic process. However, in other embodiments, pitch division is applied, e.g., pitch halving, and is used to provide patterned hardmask 404 with pitch 406. It is to be appreciated that, in an embodiment, the first guide pattern can be formed using conventional patterning (litho/etch), only litho, spacer-based double patterning or other pitch division methods. In one embodiment, the guide pattern is separated from the DSA pattern through the use of two or more hardmasks such that the CDs are formed from a single population (e.g., one etch)).

FIG. 4B illustrates the structure of FIG. 4A following formation of a second hardmask layer 408 between the first patterned hardmask 404. In an embodiment, the second hardmask layer 408 is formed by forming a blanket hardmask layer over the substrate 402 and first patterned hardmask 404 and then planarizing the blanket hardmask layer to form second hardmask layer 408, e.g., by chemical mechanical planarization (CMP). In another embodiment, ALD or CVD techniques will follow the contour of the surface of the wafer and since fin cuts are used as an example, the wafer is substantially flat at this point in the process.

In an embodiment, the second hardmask layer 408 has an etch characteristic different from an etch characteristic of the first patterned hardmask 404.

In one embodiment, one or both of the second hardmask layer 408 or the first patterned hardmask 404 is a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium (e.g., titanium nitride) or another metal. Potentially lesser amounts of other materials, such as oxygen, may be included in one or more of these layers. The hardmask layers maybe formed by CVD, PVD, or by other deposition methods.

FIG. 4C illustrates the structure of FIG. 4B following application of a selective brush material layer 410. The selective brush material 410 is a selective material that may be applied, in some embodiments, by a brush. It should be noted that "brush material" is often used as a term of art in DSA processes and does not imply that the selective material 410 is used as a brush. In an embodiment, the selective brush material layer 410 adheres to only the first patterned hardmask 404, as is depicted in FIG. 4C. In another embodiment, however, the selective brush material is applied to the second hardmask layer 408 instead. In yet another embodiment, the selective brush material layer 410 adheres to only the first patterned hardmask 404 and a second different selective brush material is formed on the second hardmask layer 408.

In an embodiment, the selective brush material layer 410 includes a molecular species including polystyrene with a head group selected from the group consisting of —SH, —$PO_3H_2$, —$CO_2H$, —NRH, —NRR', and —$Si(OR)_3$. In another embodiment, selective brush material layer 410 includes a molecular species including polymethacrylate with a head group selected from the group consisting of —SH, —$PO_3H_2$, —$CO_2H$, —NRH, —NRR', and —$Si(OR)_3$. In an embodiment, the selective brush material layer 410 is attracted to one constituent of a DSA block co-polymer (e.g., polystyrene or polymethylmethacrylate). The selective material layer 410 may include other suitable materials in other embodiments.

FIG. 4D illustrates the structure of FIG. 4C following application of a direct self-assembly (DSA) block co-polymer 414/416(A/B) and polymer assembly process. In an embodiment, a DSA block co-polymer is coated on the surface and annealed to segregate the polymer into first polymer blocks 414 and second polymer blocks 416 (identified as 416A and 416B in FIG. 4D). In one embodiment, polymer blocks 416 preferentially attach to the selective brush material layer 410 during the anneal process. The polymer blocks 414 adhere to the second hardmask layer 408. In a particular embodiment, however, the pitch of the assembly is half the pitch of the first patterned hardmask 404. In this case, portions 416A of the polymer blocks 416 adhere to the selective brush material layer 410 on the first hardmask 404 while portions 416B of the polymer blocks 416 are formed on the second hardmask layer 408 between polymer blocks 414.

In an embodiment, the block copolymer molecule 414/416(A/B) is a polymeric molecule formed of a chain of covalently bonded monomers. In a di-block copolymer, there are two different types of monomers, and these different types of monomers are primarily included within two different blocks or contiguous sequences of monomers. The illustrated block copolymer molecule includes a block of polymer 414 and a block of polymer 416(A/B). In an embodiment, the block of polymer 414 includes predominantly a chain of covalently linked monomer A (e.g., A-A-A-A-A . . . ), whereas the block of polymer 416(A/B) includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), or vice versa, although the scope of the disclosure is not so limited. In other embodiments, there may be more than two blocks. Moreover, in other embodiments, each of the blocks may include different types of monomers (e.g., each block may itself be a copolymer). In one embodiment, the block of polymer 414 and the block of polymer 416(A/B) are covalently bonded together. The block of polymer 414 and the block of polymer 416(A/B) may be of approximately equal length, or one block may be significantly longer than the other.

Typically, the blocks of block copolymers (e.g., the block of polymer 414 and the block of polymer 416(A/B)) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, in two block copolymers, if the blocks are approximately the same length, a grid like pattern of alternating polymer 414 lines and polymer 416(A/B) lines is generated.

In an embodiment, the polymer 414/polymer 416(A/B) grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form semiconductor fin lines.

FIG. 4E illustrates the structure of FIG. 4D following removal of one of the blocks of the di-block co-polymer. In an embodiment, the polymer portions 414 are removed selectively through a wet or dry etch process to leave portions 416(A/B). The pitch of the remaining portions 416(A/B) is approximately half the pitch of the first patterned hardmask 404.

FIG. 4F illustrates the structure of FIG. 4E following transfer of the pattern of the remaining polymer portions into the underlying bull crystalline semiconductor substrate. In an embodiment, the pattern of the remaining polymer portion 416(A/B), i.e., the pattern of first patterned hardmask 404 as pitch halved, is etched into the bulk semiconductor substrate 402. The patterning patterns second hardmask layer 408 to form second patterned hardmask layer 424 corresponding to polymer portions 416B. First patterned hardmask 404 corresponds to polymer portions 416A. In an embodiment, a plurality of fins 418 is formed directly in the bulk substrate 402 which becomes patterned substrate 420 and, as such, are formed continuous with the bulk substrate 402/420 at an approximately planar surface 422.

FIG. 4G illustrates the structure of FIG. 4F following removal of the remaining polymer layer and any brush layers. In an embodiment, the remaining polymer layer 416(A/B) and the brush layer 410 are removed to leave the plurality of alternating fins 418 having alternating "colored" first patterned hardmask 404 and second patterned hardmask 424 thereon. In one embodiment, the remaining polymer layer 416(A/B) and the brush layer 410 are removed using an ashing and cleans process. The resulting pitch 426 of the fins is half of the pitch 406 of the original first patterned hardmask 404.

FIG. 4H illustrates the structure of FIG. 4G following formation of an inter-layer dielectric (ILD) layer 428 between the plurality of fins 418. In an embodiment, the ILD layer 428 is composed of silicon dioxide, such as is used in a shallow trench isolation fabrication process. However, other dielectrics may be used instead, such as nitrides of carbides. The ILD layer 428 may be deposited by a chemical vapor deposition (CVD) or other deposition process (e.g., ALD, PECVD, PVD, HDP assisted CVD, low temp CVD) and may be planarized by a chemical mechanical polishing (CMP) technique to reveal uppermost surfaces of hardmask layers 404 and 428.

FIG. 4I illustrates the structure of FIG. 4H following formation and patterning of a photoresist material to form a patterned mask 430. In an embodiment, patterned mask 430 has an opening 432 formed therein. The opening 432 exposes a target one of the plurality of fins 418 having first patterned hardmask 404 thereon for ultimate fin removal. The opening 432 has a cut dimension 436. In an embodiment, restraints on the cut dimension 436 are relaxed, and may even expose portions of neighboring fins having second patterned hardmask 424 thereon. In an embodiment, the patterning operation prepares for cutting away of unwanted features using "coloring" or hardmask material differentiation to allow for cut sizes to be twice the pitch 426 of the features 418 (i.e., to result in the original pitch 406). In one embodiment, the hardmask material allows differentiation through plasma or wet etch selectivity between the two hardmask materials. Furthermore, the edge placement error (EPE) 434 is half pitch. By comparison, in a standard patterning process, without coloring, the cut dimension is 1× pitch and the edge-placement error (EPE) is ¼ pitch. Thus, in an embodiment, the process described herein doubles the edge placement error budget and doubles the size of the holes or openings required to cut a single feature.

In an embodiment, patterned mask 430 is composed of a photoresist layer, as is known in the art, and may be patterned by conventional lithography and development processes. In a particular embodiment, the portions of the photoresist layer exposed to the light source are removed upon developing the photoresist layer. Thus, patterned photoresist layer is composed of a positive photoresist material. In a specific embodiment, the photoresist layer is composed of a positive photoresist material such as, but not limited to, a 248 nm resist, a 193 nm resist, a 157 nm resist, an extreme ultraviolet (EUV) resist, an e-beam resist, an imprint layer, or a phenolic resin matrix with a diazonaphthoquinone sensitizer. In another particular embodiment, the portions of the photoresist layer exposed to the light source are retained upon developing the photoresist layer. Thus, the photoresist layer is composed of a negative photoresist material. In a specific embodiment, the photoresist layer is composed of a negative photoresist material such as, but not limited to, consisting of poly-cis-isoprene or poly-vinyl-cinnamate. In an embodiment, lithographic operations are performed using 193 nm immersion lithography (193i), EUV and/or electron-beam direct write (EBDW) lithography, or the like. A positive tone or a negative tone resist may be used. In one embodiment, the patterned mask 430 is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon-containing ARC layer. In one such embodiment, a spin-on glass material with added chromophores is used to aid in suppressing reflectivity. Chemically they are (siloxanes) silicon-carbon containing polymers. When annealed they form a mixture of silicon dioxide and carbon polymers.

FIG. 4J illustrates the structure of FIG. 4I following etching of the select one of the plurality of fins 418 and subsequent removal of patterned mask 430. In one embodiment, this process is referred to as a "fin cut", or "feature selection" operation of the process. In an embodiment, one of the plurality of fins 418 is removed at location 438 to form patterned plurality of fins 418' having a first interrupted pattern. In one such embodiment, the exposed first patterned hardmask 404 is first removed using an etch process selective to any exposed second patterned hardmask 424 and selective to ILD layer 428. In another embodiment, a "fin keep" approach is used, where the features are selected using the opposite tone of photoresist and protected during the etch process while the background or unprotected fins are removed. It is the reverse polarity of the lithographic process (e.g., negative vs. positive tone imaging). It is to be appreciated that either process can be used at this operation. The exposed fin is then removed at location 438 with an etch process selective to exposed second patterned hardmask 424 and selective to ILD layer 428. In a first embodiment, the fin is removed at location 438 to a level 440 leaving a protruding portion 446 above planar surface 422. In a second embodiment, the fin is removed at location 438 to a level 442 approximately co-planar with planar surface 422. In a third embodiment, the fin is removed at location 438 to a level 444 leaving a recess 448 below planar surface 422.

FIG. 4K illustrates the structure of FIG. 4J following formation and patterning of a photoresist material to form a patterned mask 450. In an embodiment, patterned mask 450 has an opening 452 formed therein. The opening 452 exposes a target second of the plurality of fins 418' having second patterned hardmask 424 thereon for ultimate fin removal. In an embodiment, the patterning operation prepares for cutting away of unwanted features using "coloring" or hardmask material differentiation to allow for cut sizes to be twice the pitch 426 of the features 418'. As described in association with FIG. 4I, the process described herein doubles the edge placement error budget and doubles the size of the holes or openings required to cut a single feature. In an embodiment, patterned mask 450 is composed of a material such as described in association with FIG. 4I.

FIG. 4L illustrates the structure of FIG. 4K following etching of the select second of the plurality of fins 418'. In an embodiment, the second of the plurality of fins 418' is removed at location 454 to form patterned plurality of fins 418" having a second interrupted pattern. In one such embodiment, the exposed second patterned hardmask 424 is first removed using an etch process selective to any exposed first patterned hardmask 104 and selective to ILD layer 428. The exposed fin is then removed at location 454 with an etch process selective to exposed first patterned hardmask 404 and selective to ILD layer 428. In a first embodiment, the fin is removed at location 454 to a level 456 leaving a protruding portion above planar surface 422 at a height above surface 440 of protruding portion 446. In a second embodiment, the fin is removed at location 454 to a level 458 leaving a protruding portion 464 above planar surface 422 and at approximately the same height as surface 440 of protruding portion 446. In a third embodiment, the fin is removed at location 454 to a level 460 approximately co-planar with planar surface 422. In a fourth embodiment, the fin is removed at location 454 to a level 462 leaving a recess 466 below planar surface 422.

FIG. 4M illustrates the structure of FIG. 4L following removal of the patterned mask 450 and formation of an inter-layer dielectric (ILD) layer 468 over the plurality of fins 418" and in locations 438 and 454 of removed fins. In an embodiment, the ILD layer 468 is composed of silicon dioxide, such as is used in a shallow trench isolation fabrication process. However, other dielectrics may be used instead, such as nitrides or carbides. The ILD layer 468 may be deposited by a chemical vapor deposition (CVD) or other deposition process (e.g., ALD, PECVD, PVD, HDP assisted CVD, low temp CVD). Spin-on materials are another common option for these films. Many low-k dielectric materials can be spun-on the wafer and cured. These are commonly used in the industry.

FIG. 4N illustrates the structure of FIG. 4M following planarization of ILD layer 468 and removal of first and second patterned hardmasks 404 and 424. In an embodiment, a chemical mechanical polishing (CMP) technique is used to remove the first patterned hardmask 404 and the second hardmask 424, to recess the ILD layers 428 and 468 to formed planarized ILD layer 428' and 468', respectively, and to expose surfaces of the plurality of fins 418". In an embodiment, the planarized ILD layer 428' is composed of substantially the same material as planarized ILD layer 468'. In another embodiment, the planarized ILD layer 428' is composed of a different material than planarized ILD layer 468'. In either case, in an embodiment, a seam is formed between ILD layer 468' and ILD layer 428', e.g., at location 438 or 454. It is to be appreciated that, in an embodiment, the exposed surface of the plurality of fins 418" can be used to form planar semiconductor devices.

Figure 5:
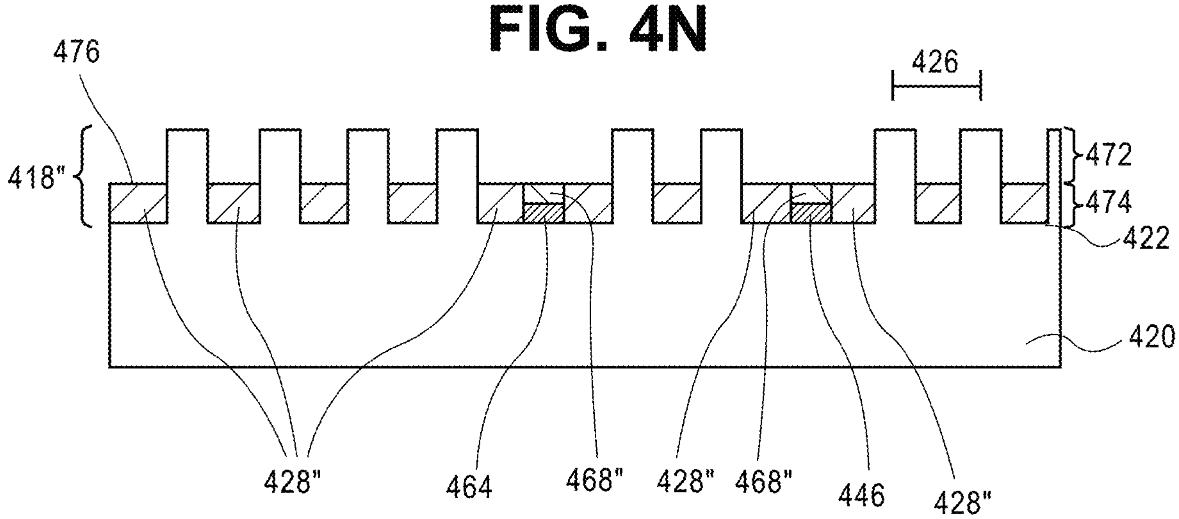
FIG. 5 illustrates the structure of FIG. 4N following exposing of upper portions of the plurality of fins, in accordance with an embodiment of the present disclosure.

In accordance with another embodiment, FIG. 5 illustrates the structure of FIG. 4N following exposing of upper portions of the plurality of fins 418". Referring to FIG. 5, the ILD layer 468' and the ILD layer 428' are recessed to expose protruding portions 472 of fins 418' and to provide recessed ILD layer 468" and recessed ILD layer 428" to a recess height 476. The recess height 476 defines a location between upper fin portions 472 and lower fin portions 474. The recessing of the ILD layer 468' and the ILD layer 428' may be performed by a plasma, vapor or wet etch process. In one embodiment, a dry etch process selective to silicon fins 418" is used, the dry etch process based on a plasma generated from gases such as, but not limited to $NF_3$, $CHF_3$, $C_4F_8$, HBr and $O_2$ with typically pressures in the range of 30-100 mTorr and a plasma bias of 50-1000 Watts.

In an exemplary embodiment, referring again to FIGS. 4J, 4L and 5, a semiconductor structure includes a plurality of semiconductor fins 418" protruding from a substantially planar surface 422 of a semiconductor substrate 420. The plurality of semiconductor fins 418" has a grating pattern interrupted by a first location 438 having a first fin portion 446 having a first height. The grating pattern of the semiconductor fins is further interrupted by a second location 454 having a second fin portion 464 having a second height. In one embodiment, the second height of the second fin portion 454 is different from the first height of the first fin portion 446. In another embodiment, the second height of the second fin portion 454 is the same as the first height of the first fin portion 446. In an embodiment, the grating pattern has a constant pitch 126 when viewed without the interruptions.

In an exemplary embodiment, referring again to FIGS. 4J, 4L, and 5, a semiconductor structure includes a plurality of semiconductor fins 418" protruding from a substantially planar surface 422 of a semiconductor substrate 420. The plurality of semiconductor fins 418" has a grating pattern interrupted by a first location 438 having a first recess. In one embodiment, the grating pattern of the semiconductor fins is further interrupted by a second location 454 having one of a second recess, or a fin portion. In an embodiment, the grating pattern has a constant pitch 426 when viewed without the interruptions. In an embodiment, a trench isolation layer 468" is disposed in and over the recess.

It is to be appreciated that the above approach may be applied to fabricating other semiconductor geometries beyond semiconductor fins. For example, in an embodiment, the above approach is implemented for fabricating semiconductor nanowires or semiconductor nanoribbons. In an embodiment, the term "semiconductor body" or "semiconductor bodies" refers generally to geometries such as fins, nanowires and nanoribbons.

It is to be appreciated that the structures resulting from the above exemplary processing schemes, e.g., structures from FIGS. 4N and 5, may be used in a same or similar form for subsequent processing operations to complete device fabrication, such as PMOS and NMOS device fabrication. As an example of a completed device, FIGS. 6A and 6B illustrate a cross-sectional view and a plan view (taken along the a-a' axis of the cross-sectional view), respectively, of a non-planar semiconductor device, in accordance with an embodiment of the present disclosure.

Figure 6A:
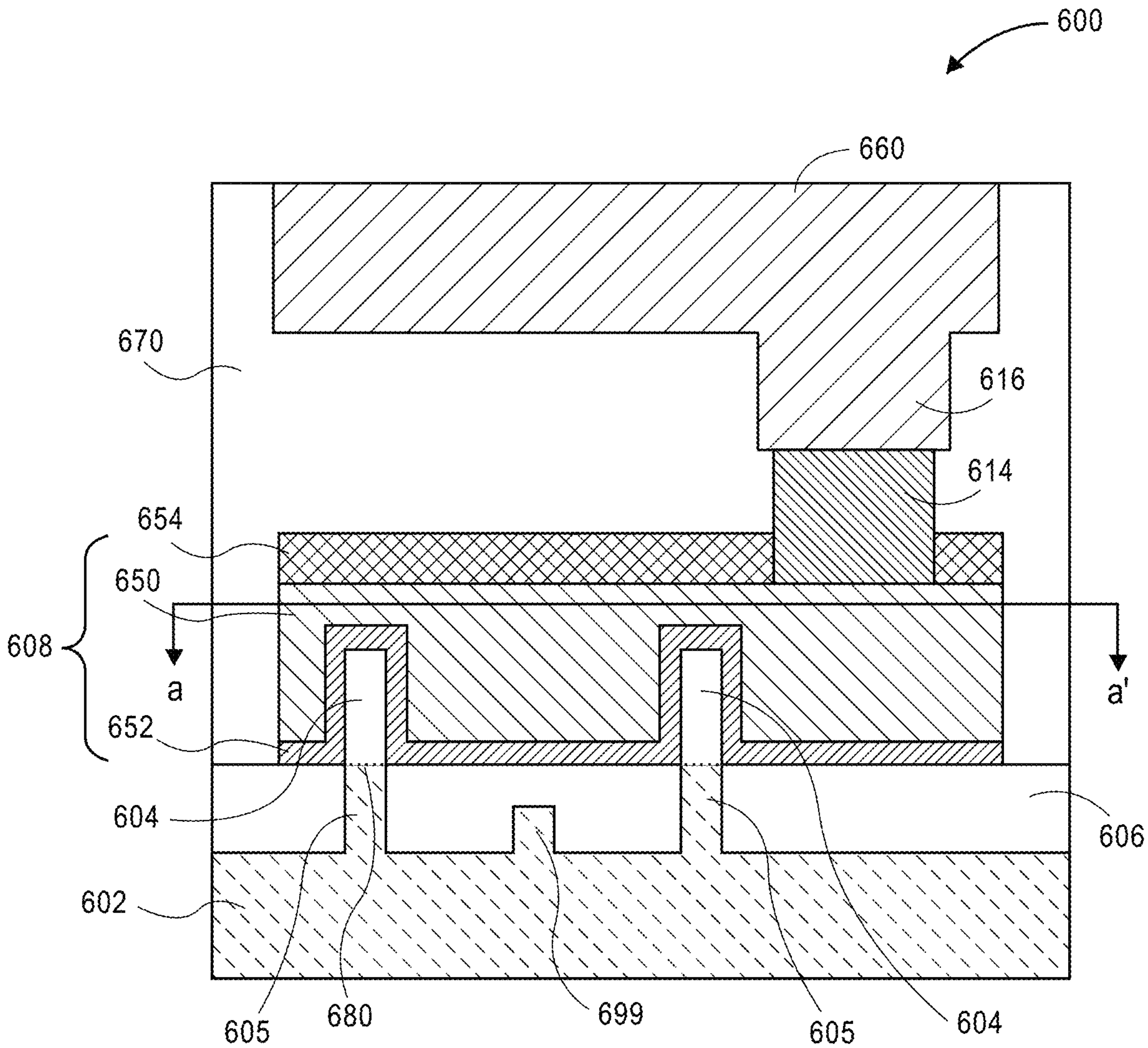
FIG. 6A illustrates a cross-sectional view of a non-planar semiconductor device, in accordance with an embodiment of the present disclosure.
Figure 6B:
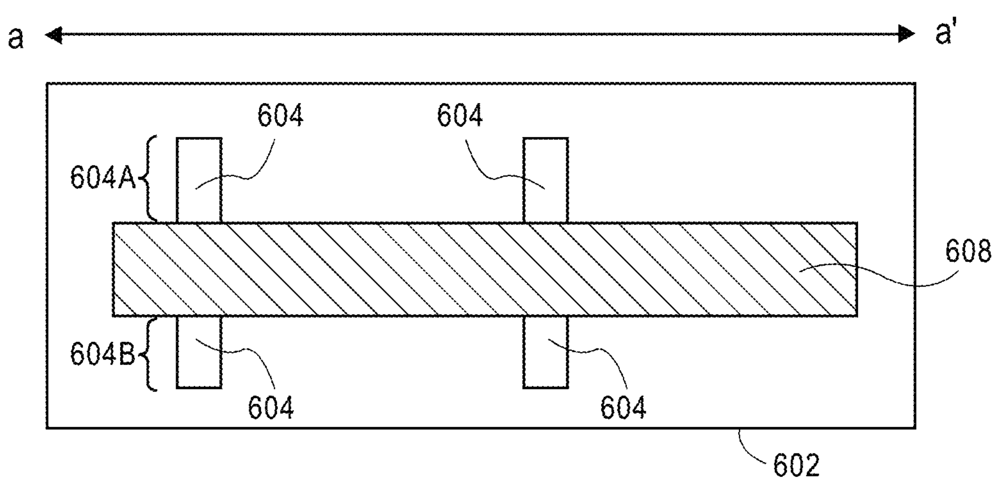
FIG. 6B illustrates a plan view taken along the a-a' axis of the semiconductor device of FIG. 6A, in accordance with an embodiment of the present disclosure.

Referring to FIG. 6A, a semiconductor structure or device 600 includes a non-planar active region (e.g., a fin structure including protruding fin portion 604 and sub-fin region 605) formed from substrate 602, and within isolation region 606. A gate line 608 is disposed over the protruding portions 604 of the non-planar active region as well as over a portion of the isolation region 606. As shown, gate line 608 includes a gate electrode 650 and a gate dielectric layer 652. In one embodiment, gate line 608 may also include a dielectric cap layer 654. A gate contact 614, and overlying gate contact via 616 are also seen from this perspective, along with an overlying metal interconnect 660, all of which are disposed in inter-layer dielectric stacks or layers 670. Also seen from the perspective of FIG. 6A, the gate contact 614 is, in one embodiment, disposed over isolation region 606, but not over the non-planar active regions.

As is also depicted in FIG. 6A, in an embodiment, an artifact of fin select recessing remains in the final structure. For example, in the embodiment shown, a residual protruding portion 699 remains. In other embodiments, a recess may remain, as described above.

As is also depicted in FIG. 6A, in an embodiment, an interface 680 exists between a protruding fin portion 604 and sub-fin region 605. The interface 680 can be a transition region between a doped sub-fin region 605 and a lightly or undoped upper fin portion 604. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Referring to FIG. 6B, the gate line 608 is shown as disposed over the protruding fin portions 604. Source and drain regions 604A and 604B of the protruding fin portions 604 can be seen from this perspective. In one embodiment, the source and drain regions 604A and 604B are doped portions of original material of the protruding fin portions 604. In another embodiment, the material of the protruding fin portions 604 is removed and replaced with another semiconductor material, e.g., by epitaxial deposition. In either case, the source and drain regions 604A and 604B may extend below the height of dielectric layer 606, i.e., into the sub-fin region 605. In accordance with an embodiment of the present disclosure, the more heavily doped sub-fin regions, i.e., the doped portions of the fins below interface 680, inhibits source to drain leakage through this portion of the bulk semiconductor fins.

In an embodiment, the semiconductor structure or device 600 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 608 surround at least a top surface and a pair of sidewalls of the three-dimensional body.

Substrate 602 may be composed of a semiconductor material that can withstand a manufacturing process and in which charge can migrate. In an embodiment, substrate 602 is a bulk substrate composed of a crystalline silicon, silicon/germanium or germanium layer doped with a charge carrier, such as but not limited to phosphorus, arsenic, boron or a combination thereof, to form active region 604. In one embodiment, the concentration of silicon atoms in bulk substrate 602 is greater than 97%. In another embodiment, bulk substrate 602 is composed of an epitaxial layer grown atop a distinct crystalline substrate, e.g. a silicon epitaxial layer grown atop a boron-doped bulk silicon mono-crystalline substrate. Bulk substrate 602 may alternatively be composed of a group III-V material. In an embodiment, bulk substrate 602 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 602 is composed of a III-V material and the charge-carrier dopant impurity atoms are ones such as, but not limited to, carbon, silicon, germanium, oxygen, sulfur, selenium or tellurium.

Isolation region 606 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 606 is composed of a dielectric material such as, but not limited to, silicon dioxide, silicon oxy-nitride, silicon nitride, or carbon-doped silicon nitride.

Gate line 608 may be composed of a gate electrode stack which includes a gate dielectric layer 652 and a gate electrode layer 650. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 602. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 614 and overlying gate contact via 616 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 600 involves formation of a contact pattern which is very well aligned to an existing gate pattern while eliminating the use of a lithographic operation with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 608 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 600. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 6A, the arrangement of semiconductor structure or device 600 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a sub-10 nanometer (10 nm) technology node.

It is to be appreciated that in the above exemplary FEOL embodiments, in an embodiment, sub-10 nanometer processing is implemented to directly to in the fabrication schemes and resulting structures. In other embodiment, FEOL considerations may be driven by BEOL sub-10 nanometer processing requirements. For example, material selection and layouts for FEOL layers and devices may need to accommodate BEOL sub-10 nanometer processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers. As such, FEOL structures and processing may be directly impacted by sub-10 nanometer processing or may be indirectly impacted as a result of sub-10 nanometer processing of BEOL layers.

Back end of line (BEOL) layers of integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners.

The above factors are also relevant for considering placement and scaling of non-conductive spaces or interruptions between metal lines (referred to as "plugs," "dielectric plugs" or "metal line ends" among the metal lines of back end of line (BEOL) metal interconnect structures. The above factors are also relevant for conductive tabs which, by definition, are conductive linkers between two conductive metal lines, such as between two parallel conductive lines. The tabs are typically in a same layer as the metal lines. Thus, improvements are needed in the area of back end metallization manufacturing technologies for fabricating metal lines, metal vias, conductive tabs, and dielectric plugs.

In some embodiments described below, patterning and aligning of via features (or other BEOL features) is achieved using several reticles and critical alignment strategies. In other embodiments, by contrast, approaches described herein enable fabrication of self-aligned plugs and/or vias. In latter embodiments, it may be the case that only one critical overlay step (Mx+1 grating) need be implemented.

It is to be appreciated that the layers and materials described below in association with back end of line (BEOL) structures and processing are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the following methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication. Also, it is to be appreciated that the process operations described for the following process flows may be practiced in alternative sequences, not every operation need be performed and/or additional process operations may be performed.

In some cases, the resulting structures enable fabrication of vias that are directly centered on underlying metal lines. The vias may be wider than, narrower than, or the same thickness as the underlying metal lines, e.g., due to non-perfect selective etch processing. Nonetheless, in an embodiment, the centers of the vias are aligned (match up) with the centers of the metal lines. As such, in an embodiment, offset due to conventional lithograph/dual damascene patterning that must otherwise be tolerated, may not be a factor for the resulting structures of one or more of the following process schemes.

It is to be appreciated that some of the interconnect fabrication schemes described below can be implemented to save numerous alignment/exposures, can be implemented to improve electrical contact (e.g., by reducing via resistance), or can be implemented to reduce total process operations and processing time otherwise required for patterning such features using conventional approaches. It is also to be appreciated that in subsequent or additional fabrication operations beyond those shown, in some instances, dielectric layer(s) may be removed from a layer of metal lines to provide air gaps between the metal lines.

In accordance with an embodiment of the present disclosure, a backbone approach is described. The backbone approach may involve multiple stages of atomic layer deposition (ALD). In an embodiment, tight pitch formation is achieved by iterative spacer formation, e.g., using ALD processing.

To provide context, lithographic patterning of features for semiconductor manufacturing is limited to the resolution of imaging tool whether it be optical (e.g. 193 nm), electron beam or EUV. Process methods such as multiple pass patterning, pattern shrink methods and spacer-based pitch division can be used to extend the resolution by factors of 2 to 4 or even possibly a factor of 8. Such methods, however, may be limited in that the process variation in the original lithographic steps remain with the similar magnitude in the final pattern. For example, a lithographic operation may have a variation of +/−3 nm. If this is employed with pitch division process methods to generate a final pitch of 8 nm (4 nm feature size), the resulting final patterns vary by 4 nm+/−3 nm.

One or more embodiments described herein involve the use of iterative spacer or thin film deposition to define all or substantially all of the final critical small features for a layer such as a BEOL layer. The variation of such features may be better than +/−1 nm which is consistent with ALD technology. Multiple materials may be employed to enable "coloring" of patterns to enable addressing alternative features (e.g., vias, cuts, plugs, etc.) with enlarged margin for edge placement errors.

Figure 7A:
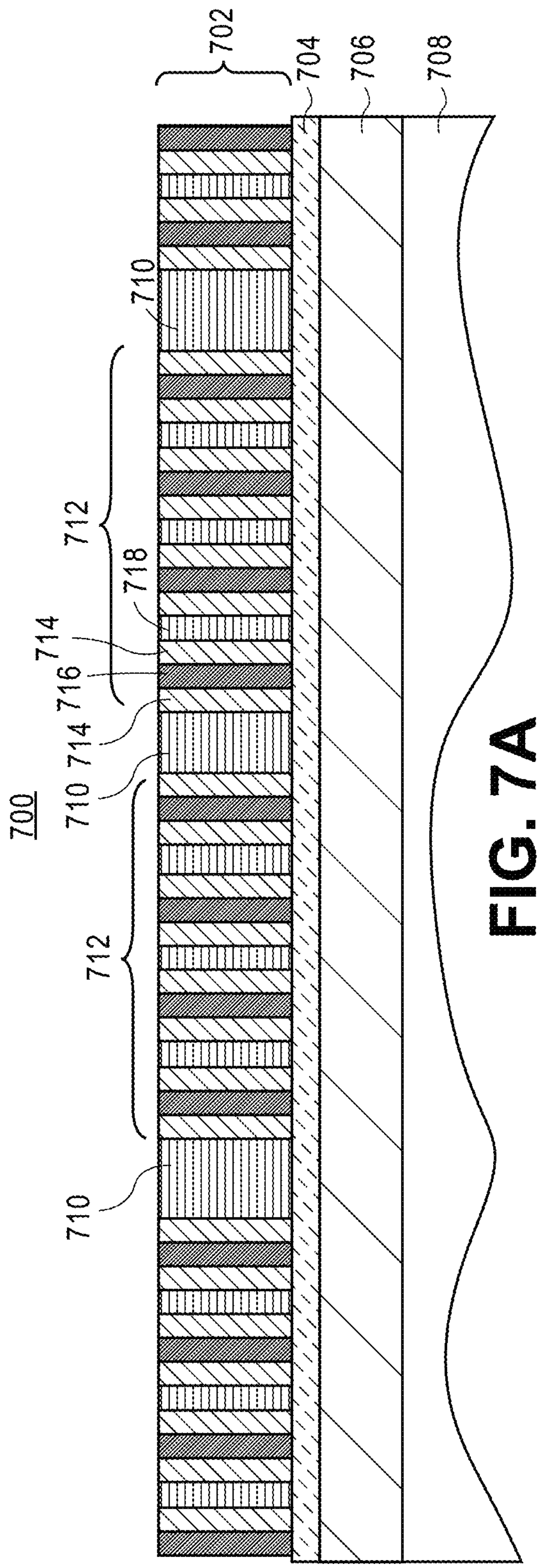
FIGS. 7A and 7B illustrate cross-sectional views of target foundation structures for enabling very tight pitch final patterns for semiconductor layers, in accordance with embodiments of the present disclosure.
Figure 7B:
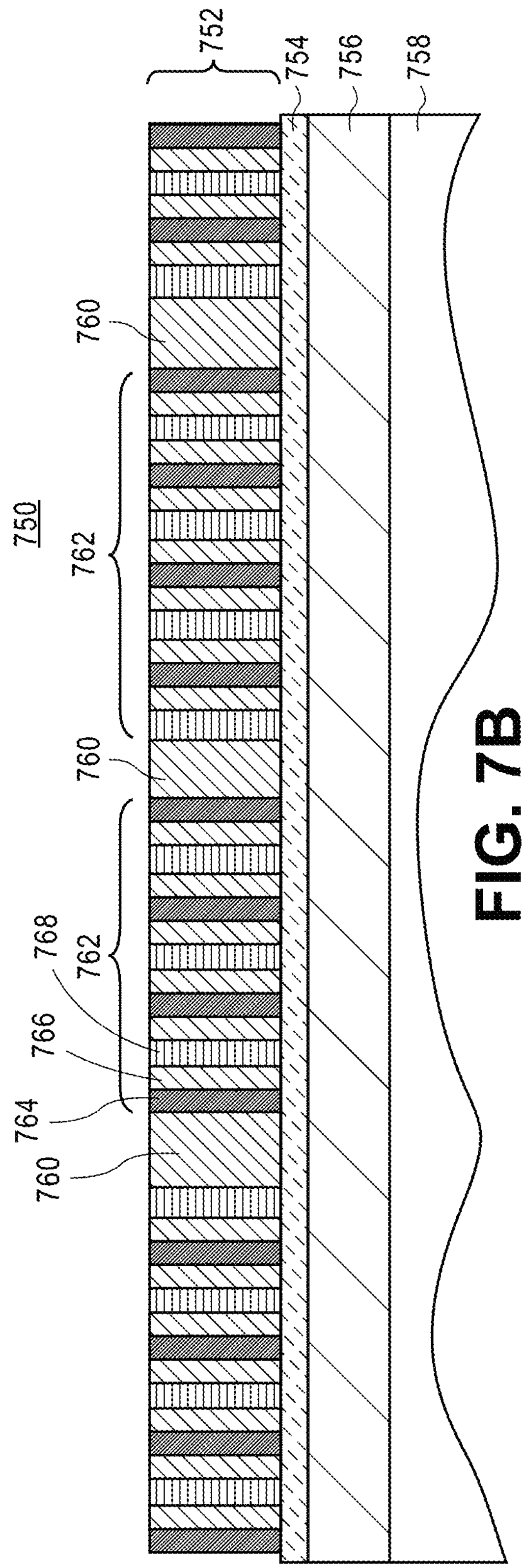

FIGS. 7A and 7B illustrate cross-sectional views of target foundation structures for enabling very tight pitch final patterns for semiconductor layers, in accordance with embodiments of the present disclosure.

Referring to FIG. 7A, a target foundation layer 700 includes a patterning layer 702 above a hardmask layer 704 above a transfer layer 706 above a substrate 708. The patterning layer 702 includes backbone features 710. The backbone features 710 are relatively wider features (e.g., 6-12 nanometers) with intervening groupings 712 of relatively smaller features (e.g., 6-100 s of smaller features between adjacent backbone features 710, where the smaller features are, e.g., 4-6 nanometers wide).

In an embodiment, each of the intervening groupings 712 of relatively smaller features includes small features 716 of a first material type, small features 714 of a second material type different from the first material type, and small features 718 of a third material type different from the first material type and the second material type. The difference in material types may provide differing etch characteristics or selectivity between the material types. In an embodiment, the material of the backbone features 710 is the same as the material of the third material type of the small features 718, as is depicted in FIG. 7A. In another embodiment, the material of the backbone features 710 is the different from the material of the third material type of the small features 718, but has similar etch characteristics or selectivity the third material type of the small features 718.

Referring to FIG. 7B, a target foundation layer 750 includes a patterning layer 752 above a hardmask layer 754 above a transfer layer 756 above a substrate 758. The patterning layer 752 includes backbone features 760. The backbone features 760 are relatively wider features (e.g., 6-12 nanometers) with intervening groupings 762 of relatively smaller features (e.g., 6-100 s of smaller features between adjacent backbone features 760, where the smaller features are, e.g., 4-6 nanometers wide).

In an embodiment, each of the intervening groupings 762 of relatively smaller features includes small features 764 of a first material type, small features 766 of a second material type different from the first material type, and small features 768 of a third material type different from the first material type and the second material type. The difference in material types may provide differing etch characteristics or selectivity between the material types. In an embodiment, the material of the backbone features 760 is the same as the material of the second material type of the small features 766, as is depicted in FIG. 7B. In another embodiment, the material of the backbone features 760 is the different from the material of the second material type of the small features 766, but has similar etch characteristics or selectivity the third material type of the small features 766.

Referring to both FIGS. 7A and 7B, in an embodiment, the structures 700 or 750 include several iterative vertical layers of alternating materials that will ultimately define the final locations of features in a semiconductor pattern (e.g., metals, transistors, etc.) Occasional larger feature are present as they represent the lithographically defined structures that, in an embodiment, are larger (wider) since they have larger size variation. In an embodiment, six to hundreds of narrow features are between the wide features.

FIGS. 8A-8H illustrate cross-sectional views of representing various operations in a method of fabricating target foundation structures for enabling very tight pitch final patterns for semiconductor layers, in accordance with embodiments of the present disclosure. Overall, in an embodiment, iterative thin film generation operations are employed. For example, conformal thin film deposition followed by an anisotropic etch (e.g., spacer formation), selective growth, or directed self-assembly (DSA) is performed. A patterning process such as described below may be implemented to provide a patterning process suitable to generate very tight pitch final patterns for semiconductor layers. In an embodiment, advantages of implementing such a process flow include improved dimensional control of tight pitch features with a built-in method to color alternating features to allow self-aligned via, plug and cut formation.

Figure 8A:
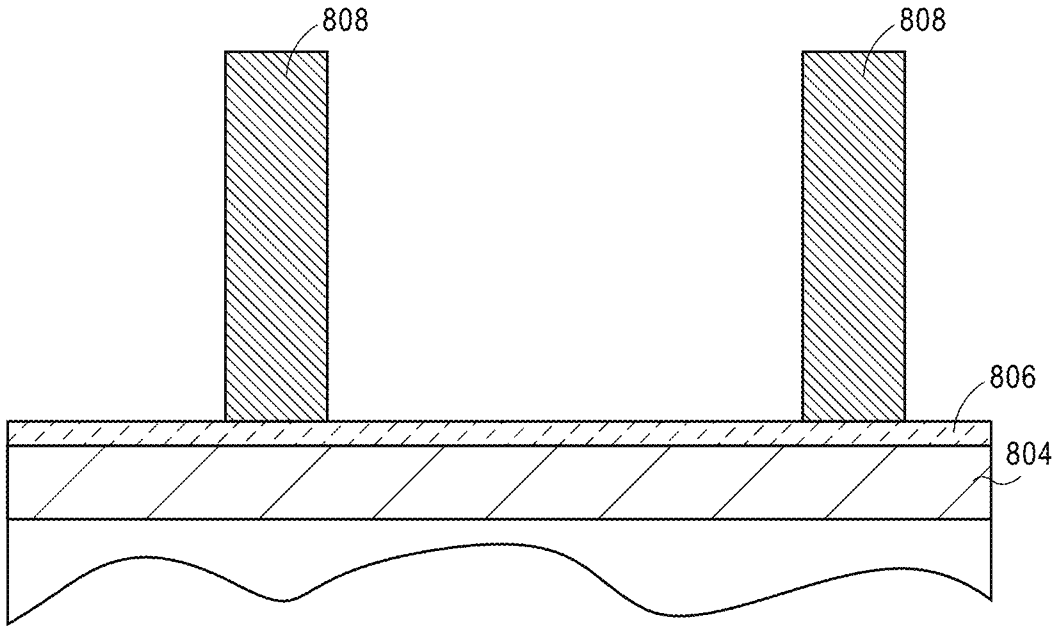
FIGS. 8A-8H illustrate cross-sectional views representing various operations in a method of fabricating target foundation structures for enabling very tight pitch final patterns for semiconductor layers, in accordance with embodiments of the present disclosure.

FIG. 8A illustrates a process operation involving tall backbone formation. A plurality of backbone features 808 is formed above a hardmask layer 806 formed above a transfer layer 804 formed above a substrate 802. In an embodiment, formation of the plurality of backbone features 808 involves use of a standard lithography operation (e.g., 193 nm or EUV) followed by etch transfer into a hardmask (e.g., SiN, $SiO_2$, SiC) and then removal of any remaining resist and/or anti-reflection layers (e.g., thru ash or wet cleans).

Figure 8B:
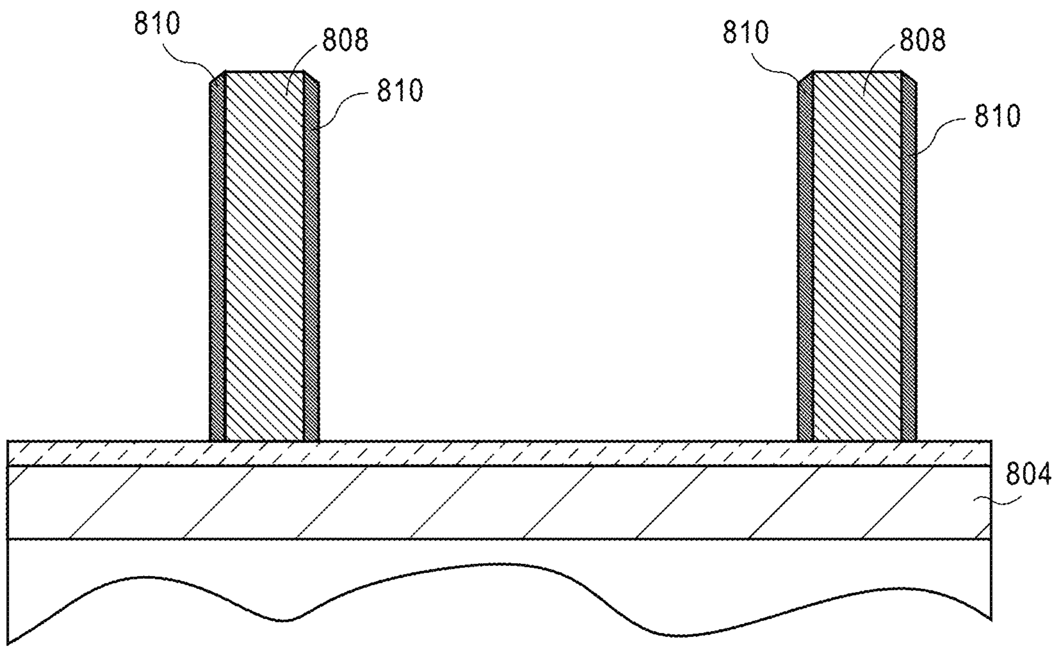

FIG. 8B illustrates a process operation involving first spacer (spacer 1) formation. A first set of small features 810 of a first material composition is formed along the sidewalls of each of the plurality of backbone features 808. In an embodiment, the first set of small features 810 is formed using a deposition (e.g., ALD) and etch approach. In another embodiment, the first set of small features 810 is formed using a selective growth approach.

Figure 8C:
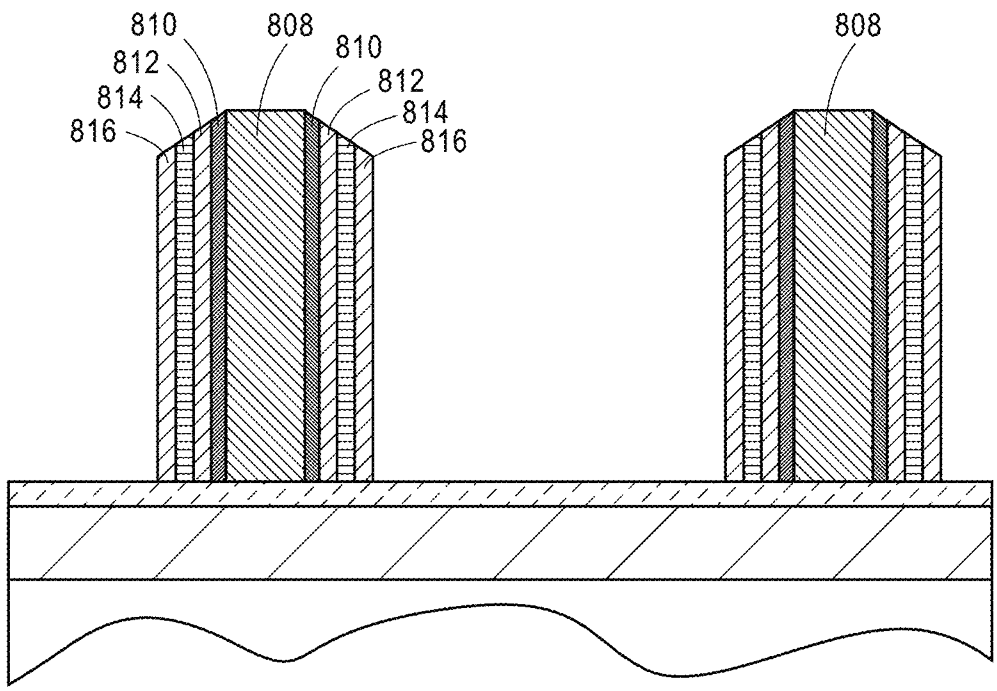

FIG. 8C illustrates a process operation involving second spacer (spacer 2) formation, third spacer (spacer 3) formation, and fourth spacer (spacer 4) formation, with the specific layers shown as one possible exemplary embodiment. A second set of small features 812 of a second material composition is formed along the exposed sidewalls of each of the first set of small features 810. A third set of small features 814 of a third material composition is formed along the exposed sidewalls of each of the second set of small features 812. A fourth set of small features 816 of the second material composition is formed along the exposed sidewalls of each of the third set of small features 814. In an embodiment, the second set of small features 812 is first formed using a deposition (e.g., ALD) and etch approach or selective growth approach. The third set of small features 814 is then formed using another deposition (e.g., ALD) and etch approach or selective growth approach. The fourth set of small features 816 is then formed using another deposition (e.g., ALD) and etch approach or selective growth approach.

Figure 8D:
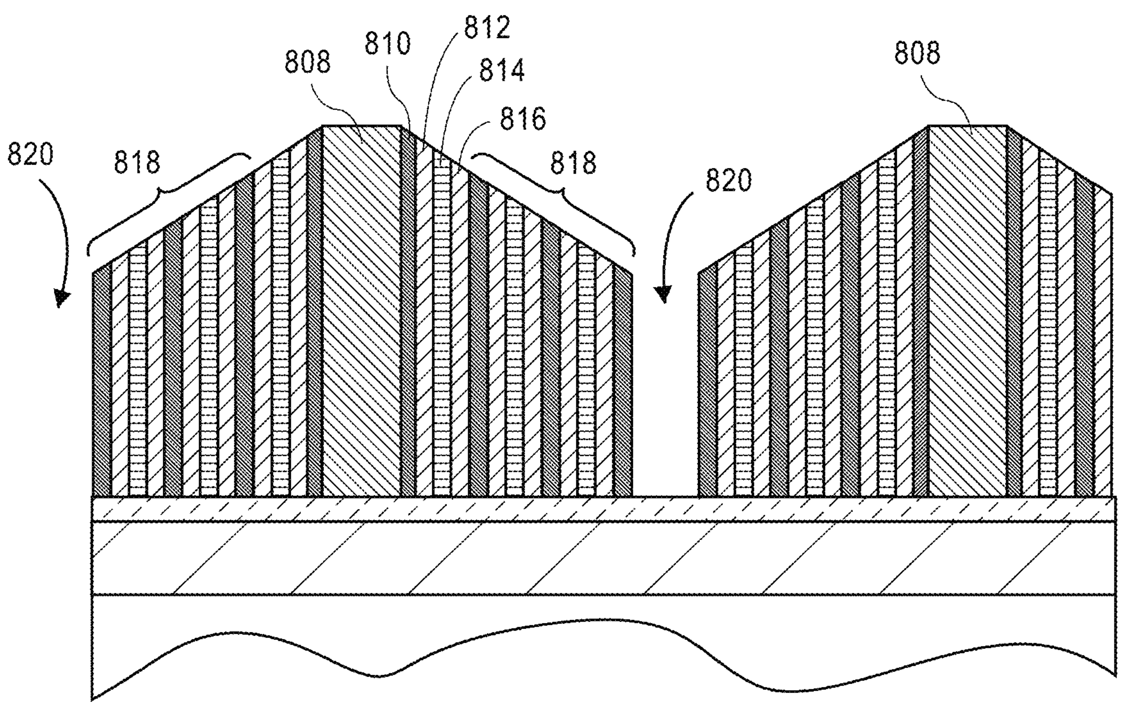

FIG. 8D illustrates a process operation involving continued layer generation. Additional spacer layers 818 are formed in sequence with select ordering of material types. The additional spacer layers 818 may be fabricated using deposition and etch approaches, selective growth approaches, or a combination thereof. It is to be appreciated that more layers mat be added than are shown. For example, in an embodiment, additional 20-200 sets of spacers are formed at this stage. The deposition of spacers may be completed prior to merging of adjacent sidewall growth, e.g., spacer formation is halted when an opening 820 remains. It is to be appreciated that although deposition and etch approaches or selective growth approaches are described as options for FIGS. 8A-8D, directed self-assembly (DSA) may be used in place of or as one of the options for spacer formation described herein. In one such example, tri-block based DSA is used. An example of tri-block based DSA is described below in association with FIGS. 12A-12K.

In an embodiment, referring collectively to FIGS. 8A-8D, iterative generation of thin layers of alternating materials on sides of original lithography-defined template features is performed. One potential method to achieve such a structure is through thin film deposition followed by anisotropic etch. In an embodiment, a single process tool is used to perform both the deposition and etch to greatly improve the efficiency of this approach. Other methods of generating thin layers of well-controlled thickness include selective growth or DSA.

Figure 8E:
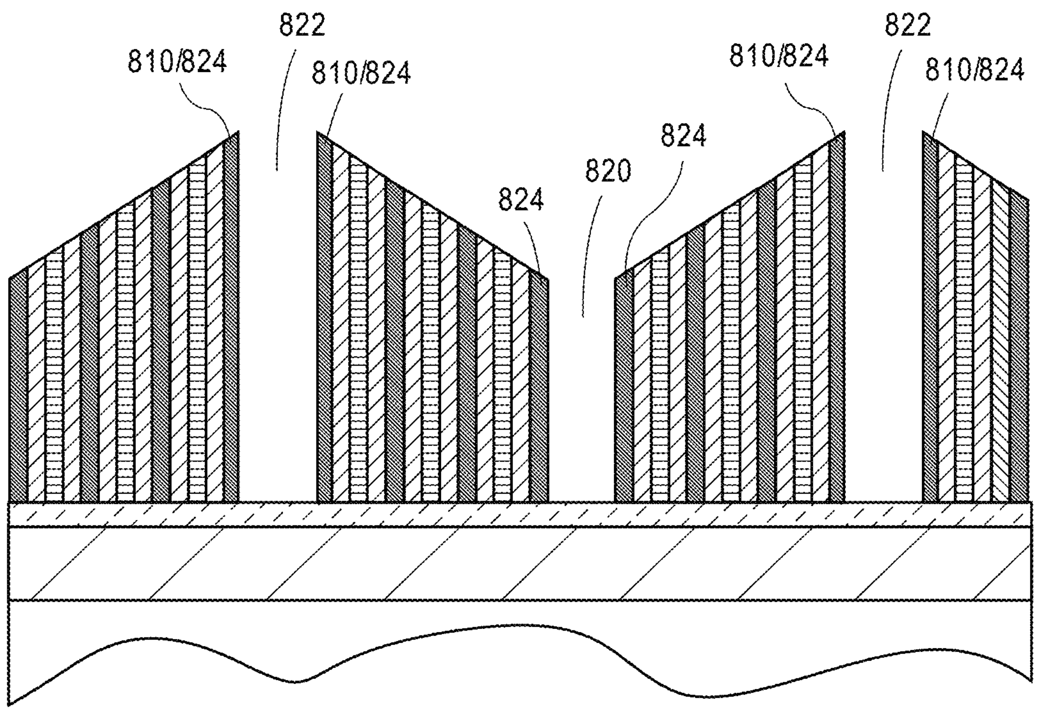

FIG. 8E illustrates a process operation involving backbone removal. The backbone features 808 are removed to leave openings 822. In an embodiment, the openings 822 have a width approximately the same as the width of opening 820, as is depicted in FIG. 8E. In an embodiment, each of the openings 820 and 822 has spacers 824 as sidewalls, the spacers 824 of the first material composition. As indicated, some of the spacers 824 are as re-designated from previously labeled spacers 810. In an embodiment, the backbone features 808 are removed in order to provide more space for further small feature generation.

Figure 8F:
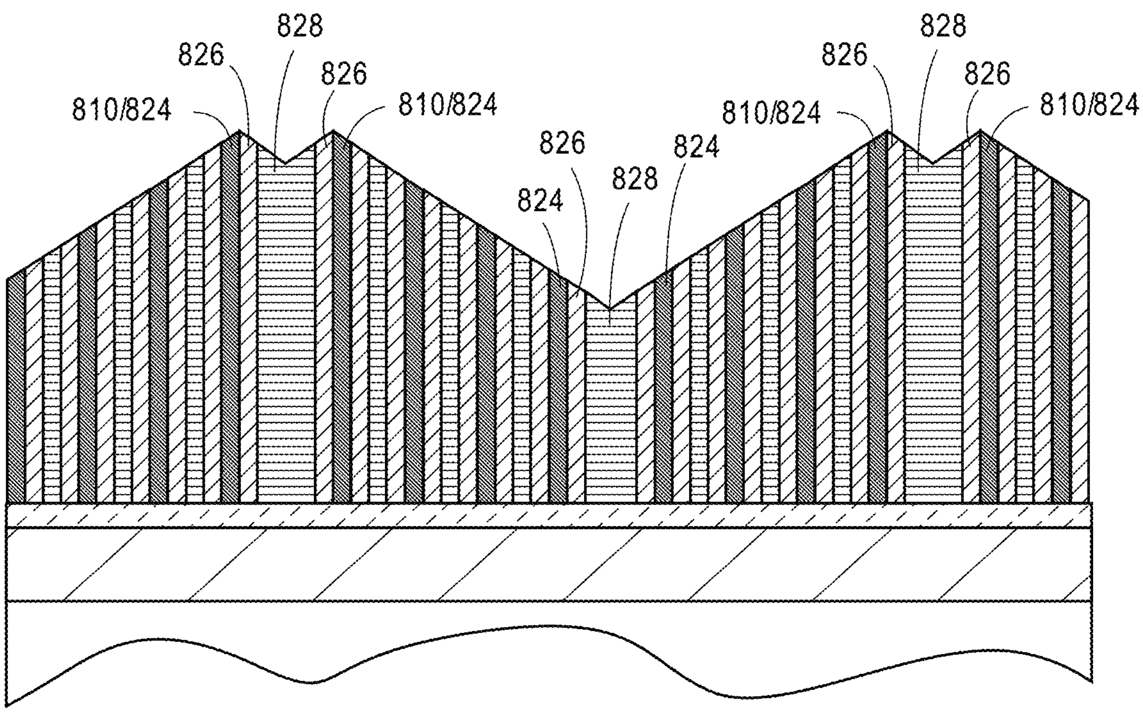

FIG. 8F illustrates a process operation involving continued layer generation. The openings 820 and 822 are ultimately completely filled using continued spacer formation. In an exemplary embodiment, spacers 826 are formed along the exposed sidewalls of the spacers 824. In one such embodiment, the spacers 826 are of the second material composition. In an embodiment, a final wide feature 828 is ultimately formed at the centers of each of the openings 820 and 822 at a stage when further spacer formation is not desired or achievable. In an embodiment, the formation of the final wide features 828 involves merging of material growth formed along adjacent sidewalls of the spacers 826. In one such embodiment, the merging of material growth provides final wide features 828 each having a seam approximately centered within the final wide feature 828. In an embodiment, the final wide features 828 are of the third material composition.

Figure 8G:
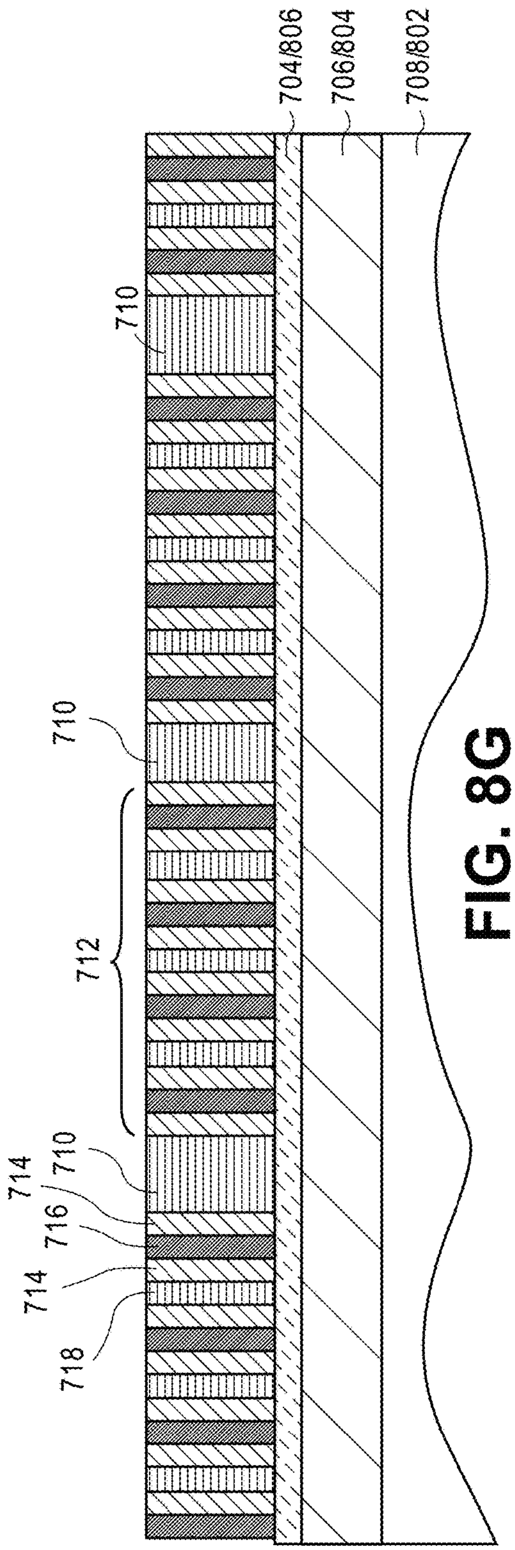

FIG. 8G illustrates a process operation involving planarization of the structure of FIG. 8F. In an embodiment, the planarization is performed using a chemical mechanical polishing (CMP) operation. In an embodiment, the planarization process provides a flat structure prior to plug/cut and via process operations. The locations 828 directly centered under the original lithographic features (which resulted in openings 822) and half-way spaced there between (which resulted in opening 820) may be targeted to be larger in order to accommodate larger size variation associated with lithographic operations compared to a single thin film (plus etch) operation. In an embodiment, as shown, the structure of FIG. 8G is similar to or the same as described in association with FIG. 7A.

Figure 8H:
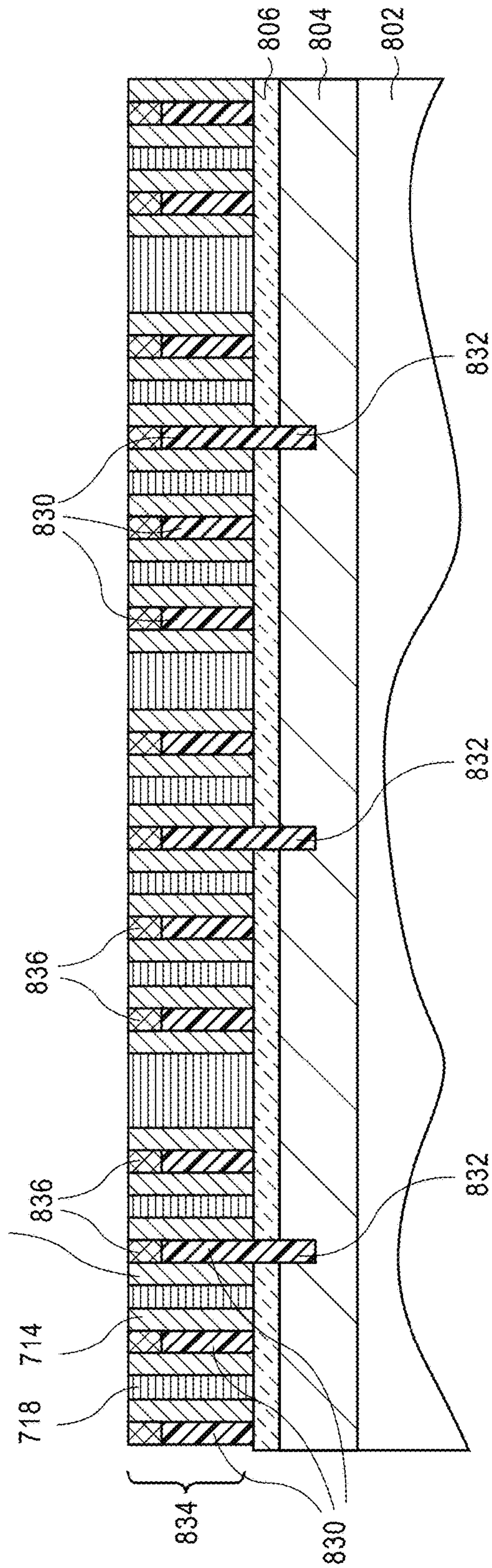
Figure 8H:
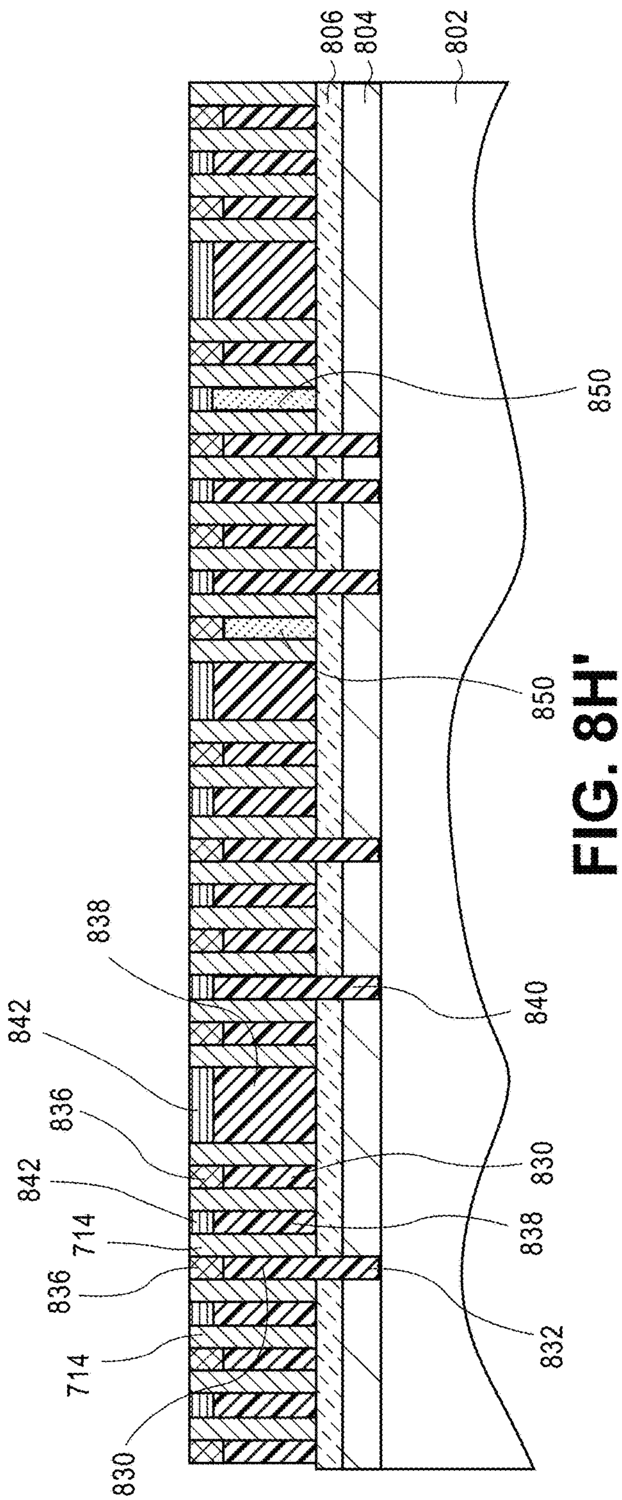
Figure 8H:
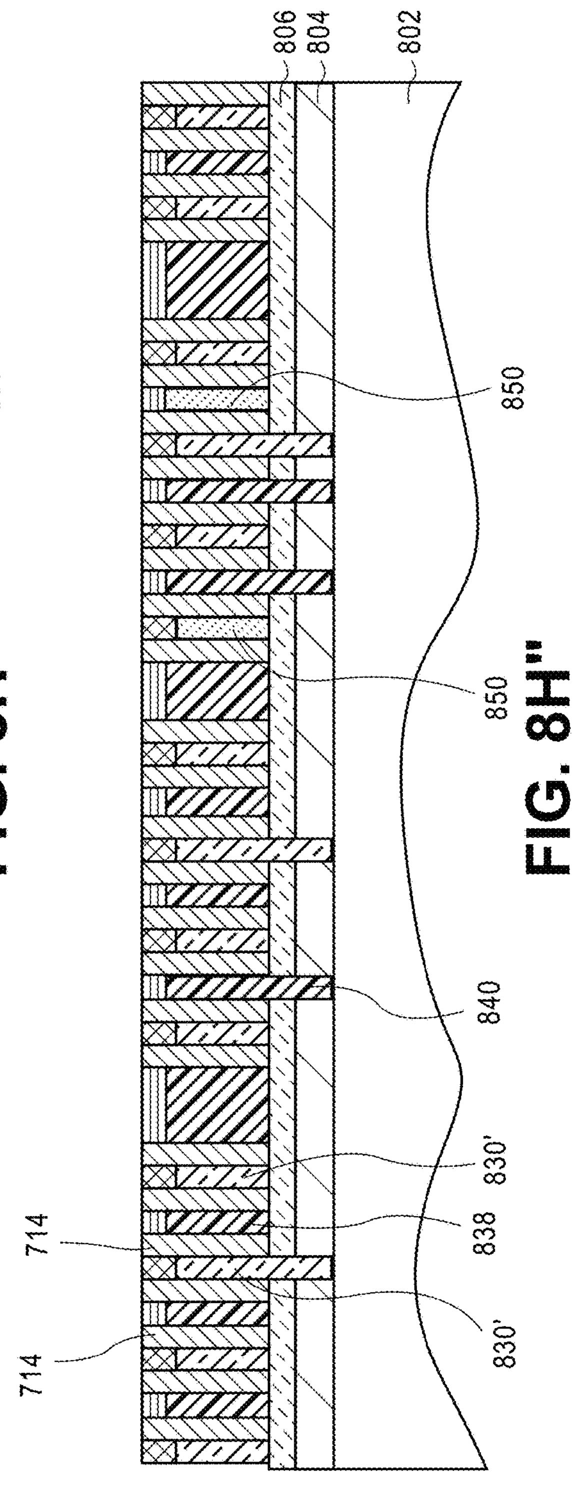

FIG. 8H illustrates a process operation involving selective removal of all of the features of the first material composition, e.g., spacers 810/824 (corresponding to small features 716 of the first material type from the structure of FIG. 7A, as shown in FIG. 8G). In an embodiment, the small features 716 of the first material type are removed using a selective etch process that does not remove, or only marginally removes the remaining spacer materials. In the exemplary embodiment shown in FIG. 8H, subsequent to removing the small features 716 of the first material type, metal line patterning features 830 are formed in the openings created upon removing of all of the small features 716 of the first material type. Some of the metal line patterning features 830 are associated with underlying via patterning features 832. Although not depicted, select ones of the small features 716 of the first material type may be retained (e.g., through a photolithography blocking process that blocks the select ones of the small features 716 of the first material type from removal) to form plug patterning features. In an embodiment, the metal line patterning features 830, the via patterning features 832, and any plug patterning features, are ultimately patterned into the hardmask layer 806 and transfer layer 804 for ultimate patterning of an underlying layer. In another embodiment, as depicted, the metal line patterning features 830, the via patterning features 832, and any plug patterning features actually represent metal lines, vias and plugs formed in the layer 834 as shown. Whether metal line patterning features 830 or actual metal lines, each may have an overlying hardmask cap layer 836 to protect the features during subsequent processing of layer 834, as is depicted in FIG. 8H. Referring again to FIG. 8H, in an embodiment, by only removing one spacer type, additional margin is provided for process variation in plug, via and/or cut patterning operations.

FIGS. 8H' and 8H" illustrate cross-sectional views of exemplary structures following via and plug patterning, in accordance with an embodiment of the present disclosure.

FIG. 8H' illustrates a process operation involving selective removal of all of the material of the backbone features 710 and all of the small features 718 of the third material type from the structure of 8H. In an embodiment, the backbone features 710 and the small features 718 of the third material type are removed using a selective etch process that does not remove, or only marginally removes the remaining spacer materials or already replaced spacer materials. In the exemplary embodiment shown in FIG. 8H', subsequent to removing backbone features 710 and the small features 718 of the third material type, second metal line patterning features 838 are formed in most or all of the openings created upon removing the backbone features 710 and the small features 718 of the third material type. In one embodiment, any remaining of the openings created upon removing the backbone features 710 and the small features 718 of the third material type are filled with a plug material 850 (e.g., to provide a line-end feature composed of non-conductive material such as SiN or $SiO_2$), or are preserved as a plug region. Some of the second metal line patterning features 838 are associated with underlying second via patterning features 840. In an embodiment, the second metal line patterning features 838, the second via patterning features 840, and any plug patterning features 850, are ultimately patterned into the hardmask layer 806 and transfer layer 804 for ultimate patterning of an underlying layer. In another embodiment, as depicted, the second metal line patterning features 838, the second via patterning features 840, and any plug patterning features 850 actually represent metal lines, vias and plugs, respectively.

Whether metal line second patterning features 838 or actual metal lines, or whether patterning plug features 850 or actual plug features 850, each may have an overlying hardmask cap layer 842 to protect the features during subsequent processing operations, as is depicted in FIG. 8H'. In an embodiment, the overlying hardmask cap layer 842 is different in composition as compared to the overlying hardmask cap layer 836. Thus, in an embodiment, alternating features have different hardmask materials. Such an arrangement may better facilitate subsequent connecting of a via from a subsequently formed layer above with increased edge placement margin for preventing via to wrong metal feature.

It is to be appreciated that since the metal lines 830 (or patterning features) and the second metal lines 838 (or patterning features) are formed in different processing operations, the composition of the metal lines 830 and second metal lines 838 may differ. In an exemplary embodiment, FIG. 8H" illustrates an example where metal lines 830' differ in composition from metal lines 838. Thus, alternating features may be composed of different conducting material.

It is to be appreciated that some older forms of spacer-based pitch division techniques may be used in high volume manufacturing. Embodiments described above surrounding the backbone approach may be implemented to extend one or two passes of spacer-based pitch division to a very high number of iterative spacer formation operations. One or more embodiments provides an approach for semiconductor chip density scaling at high manufacturing yields. One or more embodiments provide an approach for fabricating dense interconnects, or even transistors (if applied to FEOL processing), with consistently well-formed feature sizes. It is to be appreciated that reverse engineering of a product fabricated using a backbone approach may reveal predominantly tight pitch features (e.g., sub 10 nm pitch features) with occasional wide one-dimensional (1D) features. Cross-sectional scanning electron microscopy (XSEM) may reveal "colored" (e.g., differing from one another with respect to a property such as etch selectivity) hardmasks on alternating features.

In accordance with an embodiment of the present disclosure, pitch division is applied to provide an approach for fabricating alternating metal lines in a BEOL fabrication scheme. One or more embodiments described herein are directed to pitch division patterning process flows that increase overlay margins for vias, cuts and plugs. Embodiments may enable continued scaling of the pitch of metal layers beyond the resolution capability of state-of-the art lithography equipment. In an embodiment, spacing between metal lines is constant and can be controlled to Angstrom level precision using ALD. In an embodiment, a process flow is designed so that a "replacement ILD" flow is possible. That is, the ILD can be deposited after the pattern and metallization is complete. The patterning flows typically damage the ILD through the etch/cleans steps but in this flow, the ILD can be deposited last and therefore avoid damage during patterning.

To provide context, edge placement error of via, cut and plug patterning is problematic when feature sizes and pitches are scaled. State of the art solutions to address such problems involve either attempts to tighten edge placement error by improving scanner overlay and improving critical dimension (CD) control or attempts to use super-self-aligned integration approaches. By contrast, embodiments described herein involve implementation of a process that can achieve similar improvements in edge placement error margin without requiring improvements in lithographic tooling or super-self-alignment.

In accordance with an embodiment of the present disclosure, metal lines are fabricated in two separate operation sequences in order to double the amount of overlay margin for cuts/plugs and via patterning. In a first portion of an exemplary process flow, pitch division methods are used to pattern metal lines, plugs and then vias into an interlayer dielectric material. In a second portion of the exemplary process flow, trenches/via openings are filled with metal (e.g., dual damascene metallization) and then polished. Sacrificial hardmask layers are then removed in between the metal lines. The metal lines are then coated with a sacrificial dielectric material using, e.g., atomic layer deposition (ALD). In a third portion of the exemplary process flow, an isotropic spacer etch is performed to expose bottoms of the trenches. Using a plug patterning flow, dielectric material is added to the locations where metal lines ends should occur, and via etches are completed on the complementary metal lines. The metal from the first metal lines acts as an etch stop to prevent etching in these locations. In a fourth portion of the exemplary process flow, trenches are filled with metal and polished to expose the metal. After polish, sacrificial hardmask material is removed and, optionally, replaced with a dielectric material and then polished again to finish the metallization process. By tuning the deposition of the dielectric material, airgaps can be inserted as well. Additionally, embodiments may involve use of a sacrificial hardmask material instead of metal. The sacrificial hardmask can be removed and replaced with metal at the "second" metallization operation.

In an exemplary processing scheme, FIGS. 9A-9L illustrate angled cross-sectional views of portions of integrated circuit layers representing various operations in a method involving pitch division patterning with increased overlay margin for back end of line (BEOL) interconnect fabrication, in accordance with an embodiment of the present disclosure.

Figure 9A:
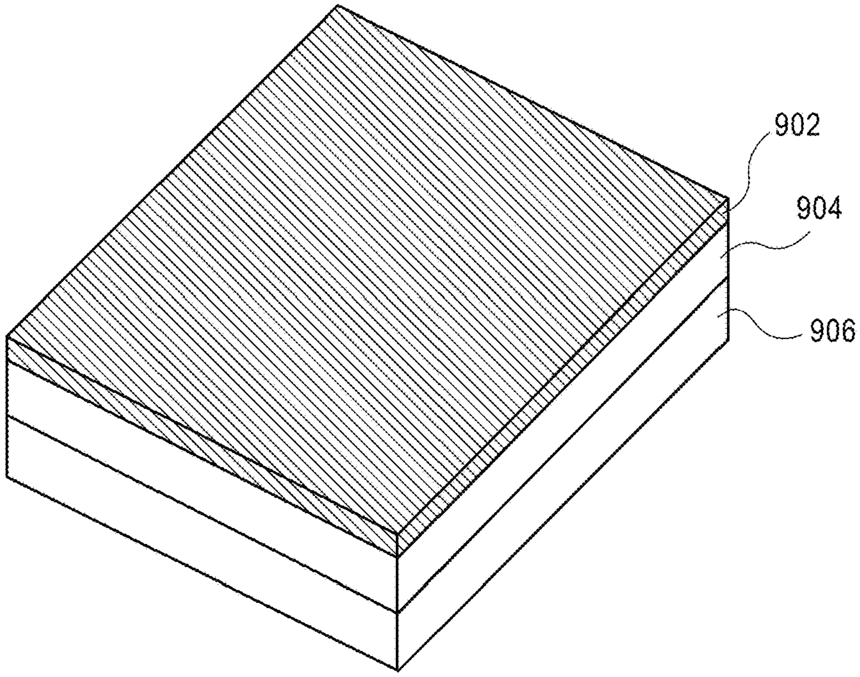
FIGS. 9A-9L illustrate angled cross-sectional views of portions of integrated circuit layers representing various operations in a method involving pitch division patterning with increased overlay margin for back end of line (BEOL) interconnect fabrication, in accordance with an embodiment of the present disclosure.

Referring to FIG. 9A, a starting point structure 900 is provided as a beginning point for fabricating a new metallization layer. The starting point structure 900 includes a hardmask layer 902 disposed on a sacrificial layer 904 disposed on an inter-layer dielectric (ILD) layer 906. The ILD layer may be disposed above a substrate and, in one embodiment, is disposed over an underlying metallization layer. In one embodiment, the hardmask layer 902 is a silicon nitride (SiN) or titanium nitride hardmask layer. In one embodiment, the sacrificial layer is a silicon layer such as a polycrystalline silicon layer or an amorphous silicon layer.

Figure 9B:
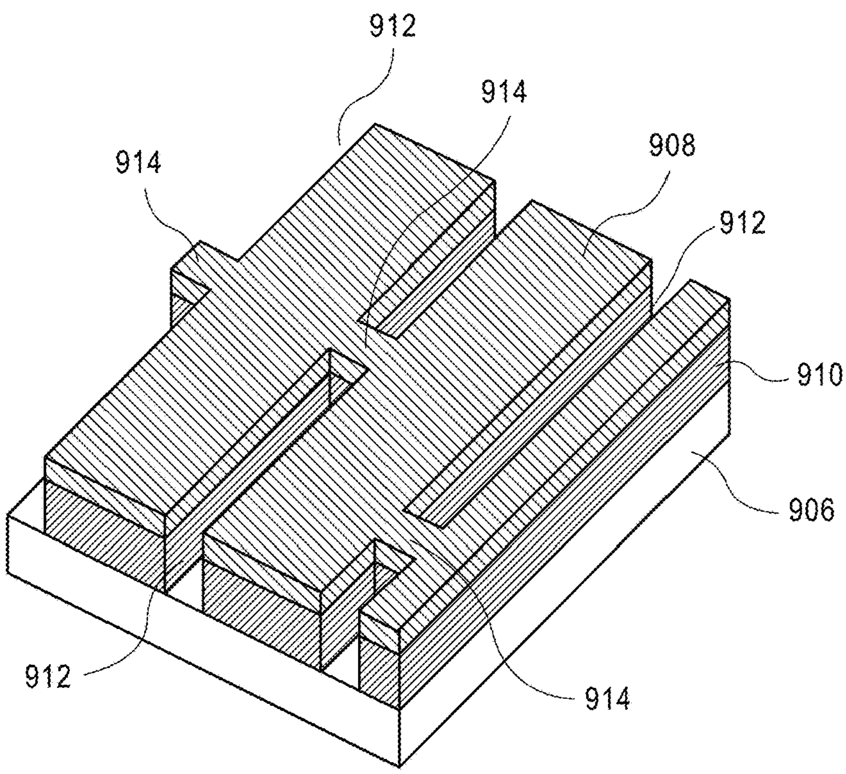

Referring to FIG. 9B, the hardmask layer 902 and the sacrificial layer 904 of the structure of FIG. 9B are patterned. The hardmask layer 902 and the sacrificial layer 904 are patterned to form patterned hardmask layer 908 and patterned sacrificial layer 910, respectively. Patterned hardmask layer 908 and patterned sacrificial layer 910 include a pattern of first line openings 912 and line end regions 914. In an embodiment, a silicon sacrificial layer is suitable for patterning to fine features using an anisotropic plasma etch process. In an embodiment, a lithographic resist mask exposure and etch process is used to form patterned hardmask layer 908 and patterned sacrificial layer 910, with subsequent removal of the resist layer or stack. In an embodiment, the first line openings 912 have a grating type pattern, as is depicted in FIG. 9B. In an embodiment, a pitch division patterning scheme is used to form the pattern of first line openings 912. Examples of suitable pitch division schemes are described in greater detail below. A subsequent line "cut" or plug preservation lithography process may then be used to define line end regions 914.

Figure 9C:
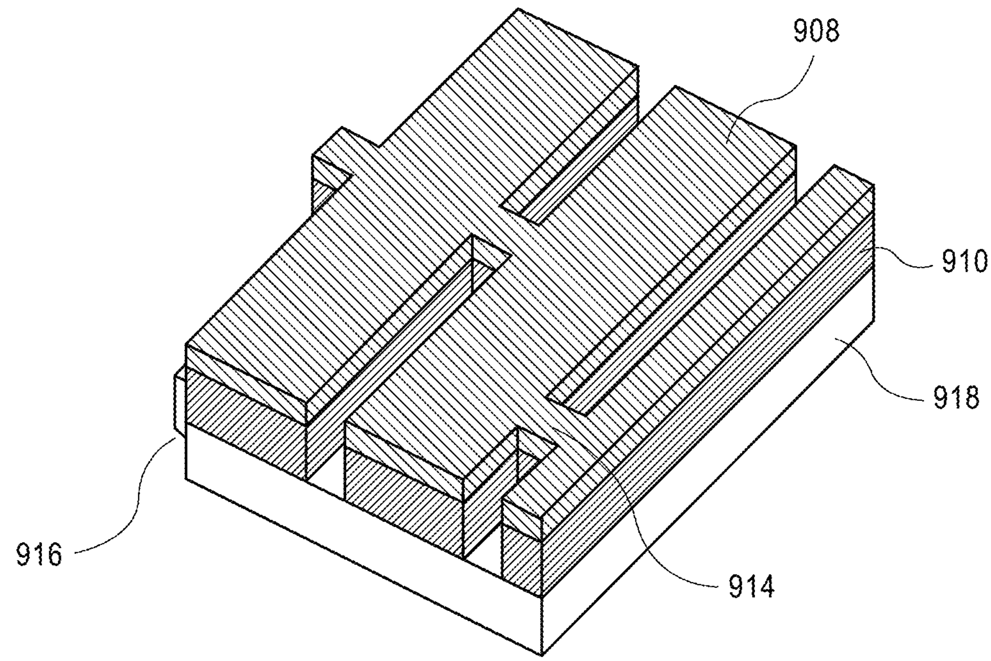

FIG. 9C illustrates the structure of FIG. 9B following underlying via location patterning. Via openings 916 may be formed at select locations of the ILD layer 906 to form patterned ILD layer 918. In an embodiment, vias are patterned using a self-aligned via process. The select locations are formed within regions of the ILD layer 906 exposed by the first line openings 912. In an embodiment, a separate lithographic and etch process is used to form via openings 916 subsequent to the lithographic patterning process used to form first line openings 912.

Figure 9D:
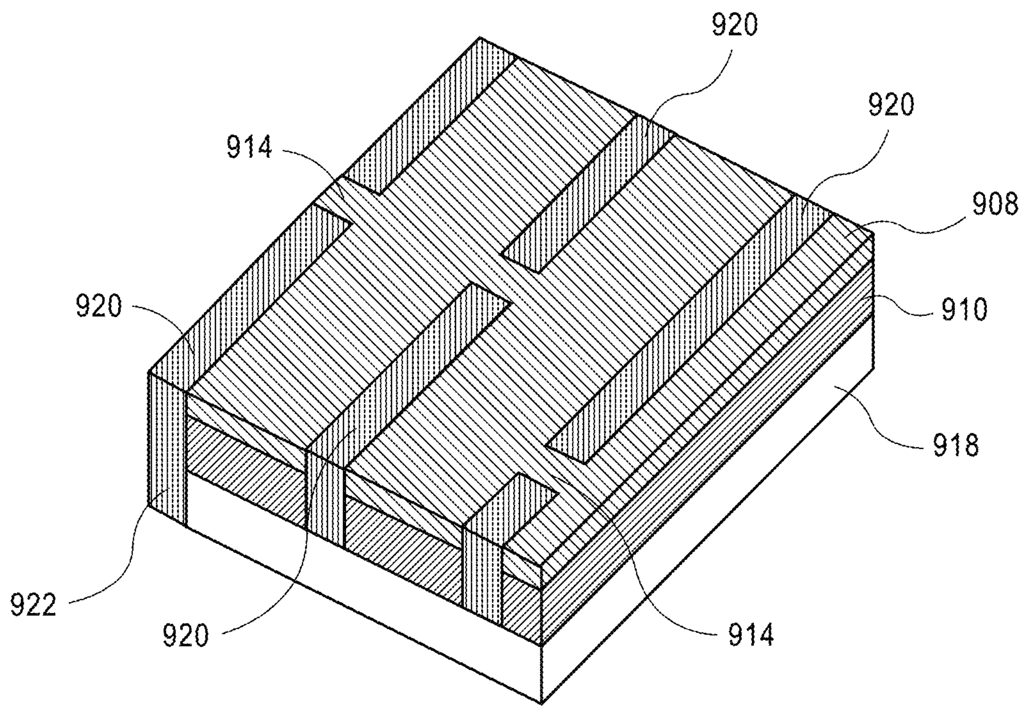

FIG. 9D illustrates the structure of FIG. 9C following a first metallization process. In an embodiment, a dual-damascene metallization process is used where vias and metal lines are filled at the same time. Interconnect lines 920 and conductive vias 920 are formed in the first line openings and the via openings 916. In an embodiment, a metal fill process is performed to provide interconnect lines 920 and conductive vias 920. In an embodiment, the metal fill process is performed using a metal deposition and subsequent planarization processing scheme, such as a chemical mechanical planarization (CMP) process. In the case that the patterned sacrificial hardmask layer 910 is composed substantially of silicon, a liner material may be deposited prior to forming a conductive fill layer, in order to inhibit silicidation of the patterned sacrificial hardmask layer 910.

Figure 9E:
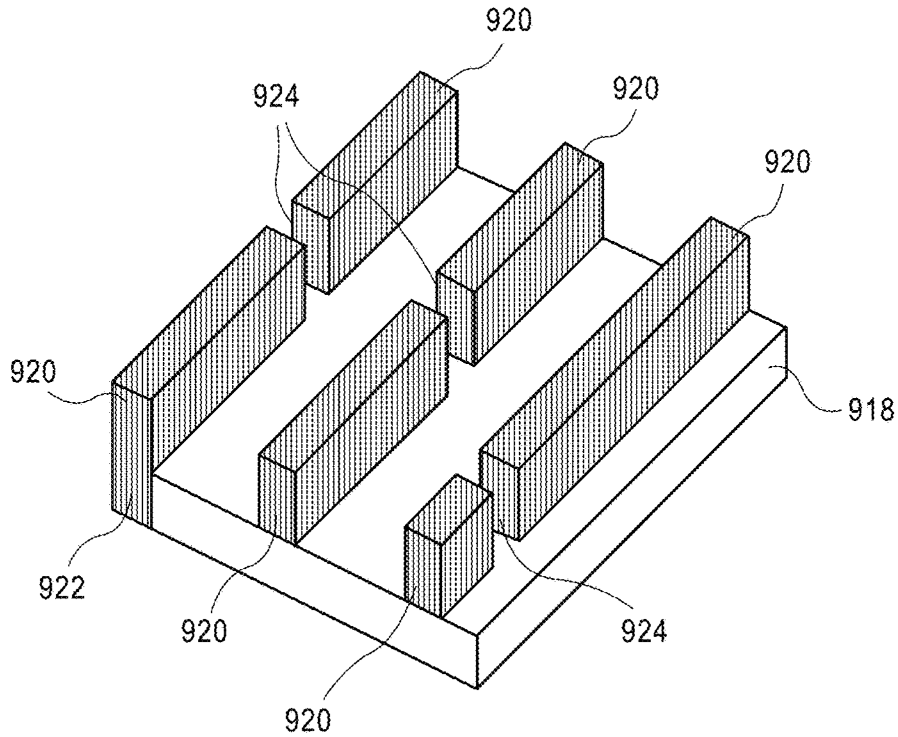

FIG. 9E illustrates the structure of FIG. 9D following exposure of the interconnect lines 920. The patterned hardmask layer 908 and the patterned sacrificial layer 910 are removed to leave interconnect lines 920 exposed, with underlying conductive vias in the patterned ILD layer 918. Line end openings 924 are revealed. Line end openings 924 provide breaks in the grating pattern of the interconnect lines 920. In an embodiment, the patterned hardmask layer 908 and the patterned sacrificial layer 910 are removed using a selective wet etch process.

Figure 9F:
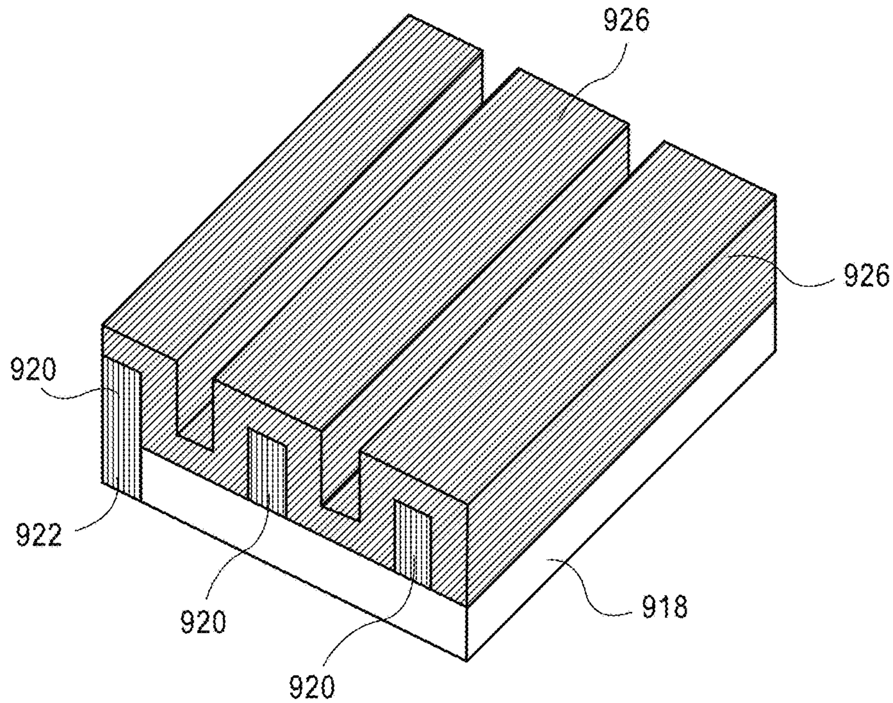

FIG. 9F illustrates the structure of FIG. 9E following formation of a conformal patterning layer. A spacer material layer 926 is formed over and conformal with the grating pattern of the interconnect lines 920. In an embodiment, atomic layer deposition (ALD) is used due to the fact that it is highly conformal and extremely accurate (e.g., control to the Angstrom level). It is to be appreciated that the line end openings 924 are, in an embodiment, too short to effectively disrupt the general grating pattern of the interconnect lines 920 with respect to formation of the conformal spacer material layer 926. In one such embodiment, the line end openings 924 are filled with the spacer material layer 926 without disrupting the general grating pattern of the interconnect lines 920. In an embodiment, the spacer material layer 926 is deposited using a chemical vapor deposition (CVD) or atomic layer deposition (ALD) process. In one embodiment, the spacer material layer 926 is a silicon layer such as a polycrystalline silicon layer or an amorphous silicon layer. In a specific such embodiment, a liner material is deposited on the interconnect lines 920 prior to forming a silicon spacer material layer, in order to inhibit silicidation of the spacer material layer 926. In an embodiment, the line end cuts (plugs) are less than or equal to 2× the spacer thickness so that they are completely filled with the conformal dielectric material. If they are larger than 2× the thickness, seams may form and metal may short the lines together during subsequent processing.

Figure 9G:
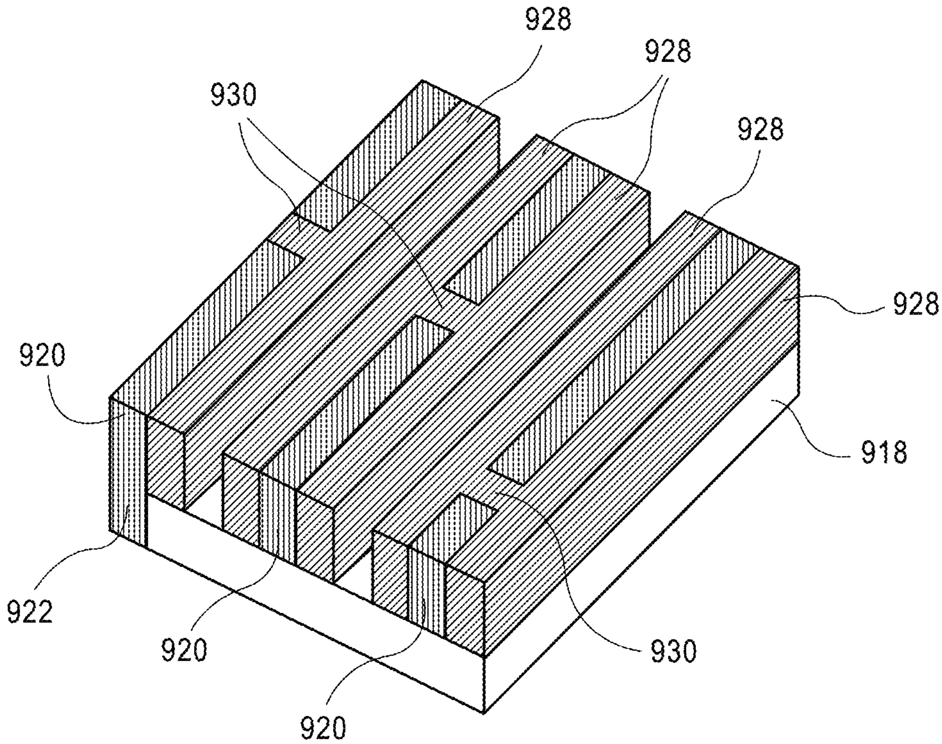

FIG. 9G illustrates the structure of FIG. 9F following formation of spacer lines from the spacer material layer. In an embodiment, spacers 928 are formed along the sidewalls of interconnect lines 920 using an anisotropic plasma etching process. In one embodiment, the spacer material layer 926 remains in the line end openings 924 to form line end placeholder portions 930 for interconnect lines 920.

Figure 9H:
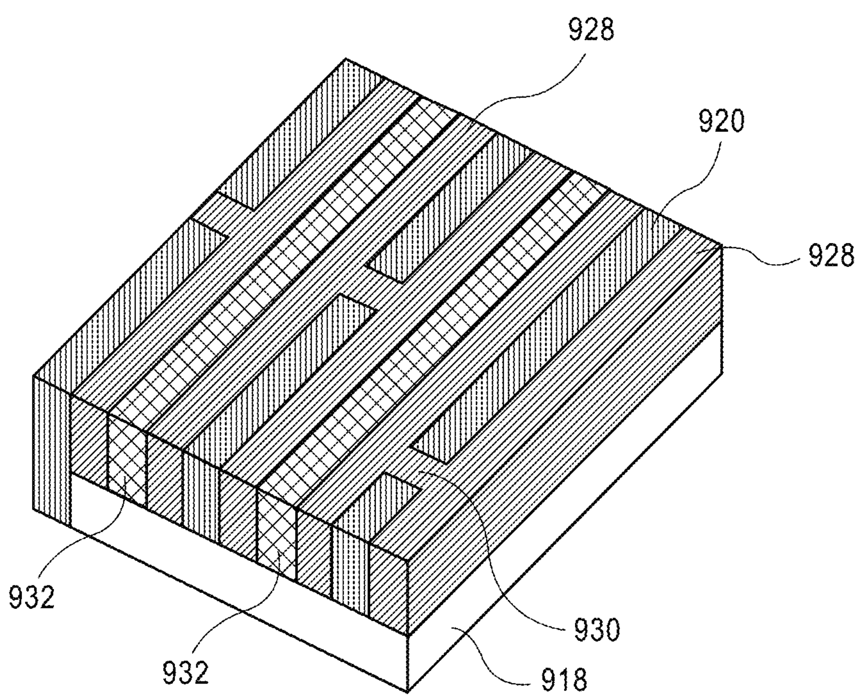

FIG. 9H illustrates the structure of FIG. 9G following formation of a plug placeholder layer. A plug placeholder layer 932 is formed between spacers 928 of adjacent interconnect lines 920. The plug placeholder layer 932 is initially formed in locations where a second set of interconnect lines will ultimately be formed. In an embodiment, the plug placeholder layer 932 is formed using a deposition and planarization process, confining the plug placeholder layer 932 between the spacers 928.

Figure 9I:
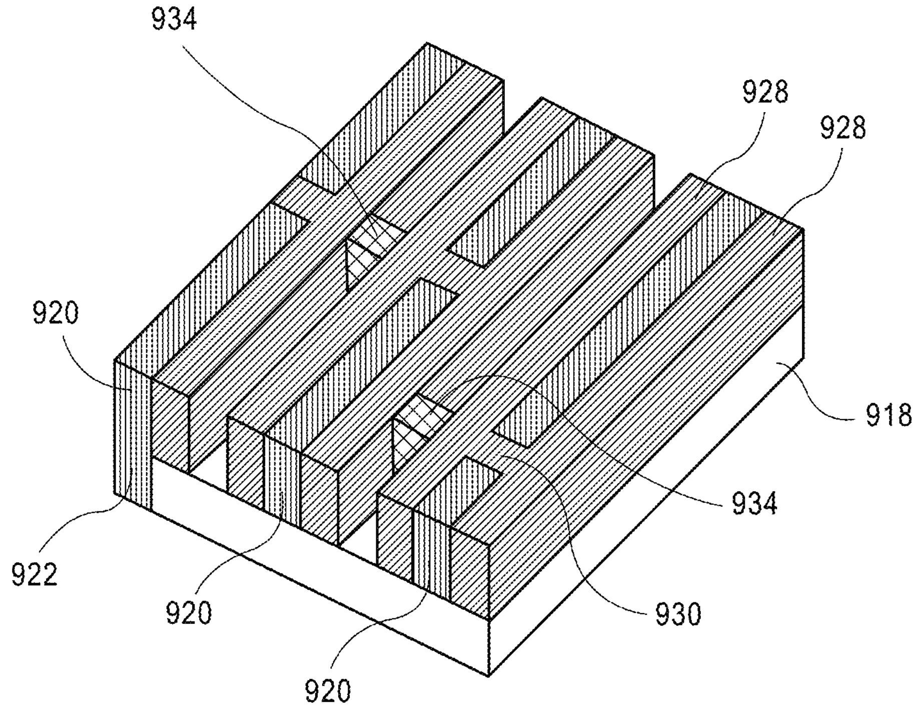

FIG. 9I illustrates the structure of FIG. 9H following patterning of the plug placeholder layer. The plug placeholder layer 932 is patterned to retain plug placeholders 934 in select locations where line ends are ultimately formed. In an embodiment, a lithographic resist mask exposure and etch process is used to form plug placeholders 934, with subsequent removal of the resist layer or stack.

Figure 9J:
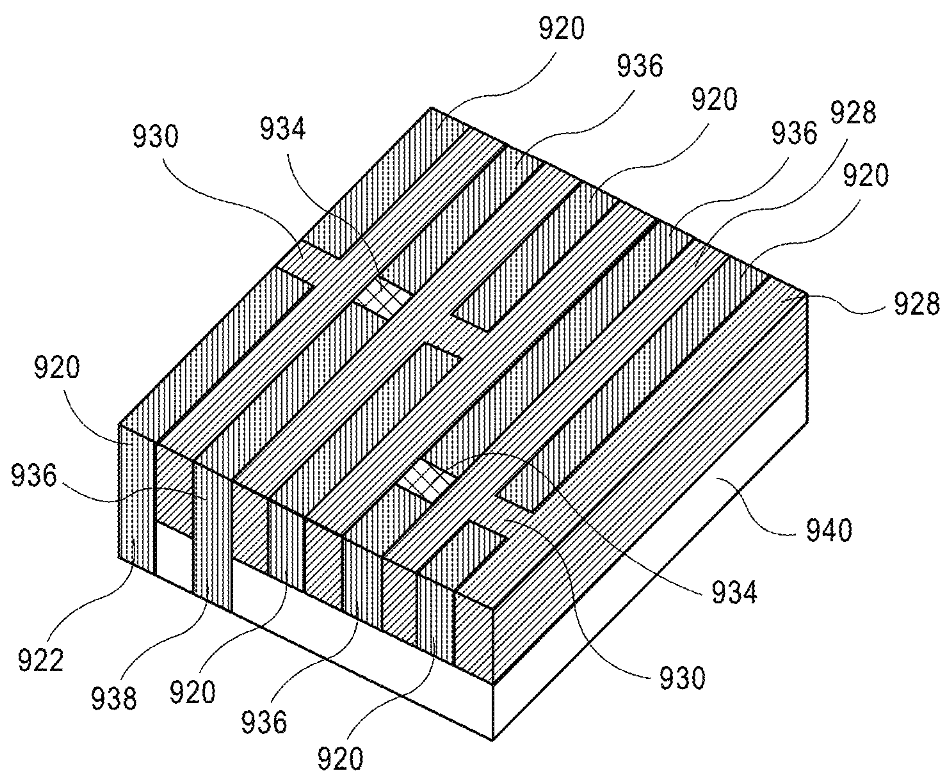

FIG. 9J illustrates the structure of FIG. 9I following a second metallization process. Interconnect lines 936 are formed in the openings (second line openings) formed upon patterning of the plug placeholder layer 932 to form plug placeholders 934. Additionally, although the separate processing operations are omitted from the figures, via openings, and ultimately conductive vias 938, may be formed in select locations below the conductive lines 936. Such a process results in a double patterned (two different via patterning operations) ILD layer 940, as is depicted in FIG. 9J.

In an embodiment, a metal fill process is performed to provide interconnect lines 936 and conductive vias 938. In an embodiment, the metal fill process is performed using a metal deposition and subsequent planarization processing scheme, such as a chemical mechanical planarization (CMP) process. In the case that the spacers 928 are composed substantially of silicon, a liner material may be deposited prior to forming a conductive fill layer, in order to inhibit silicidation of the spacers 928.

It is to be appreciated that, in an embodiment, since interconnect lines 936 (and corresponding conductive vias 938) are formed in a later process than the process used to fabricate interconnect lines 920 (and corresponding conductive vias 922), the interconnect lines 936 can be fabricated using a different material than is used to fabricate the conductive lines 920. In one such embodiment, a metallization layer ultimately includes conductive interconnects of alternating, differing first and second compositions.

Figure 9K:
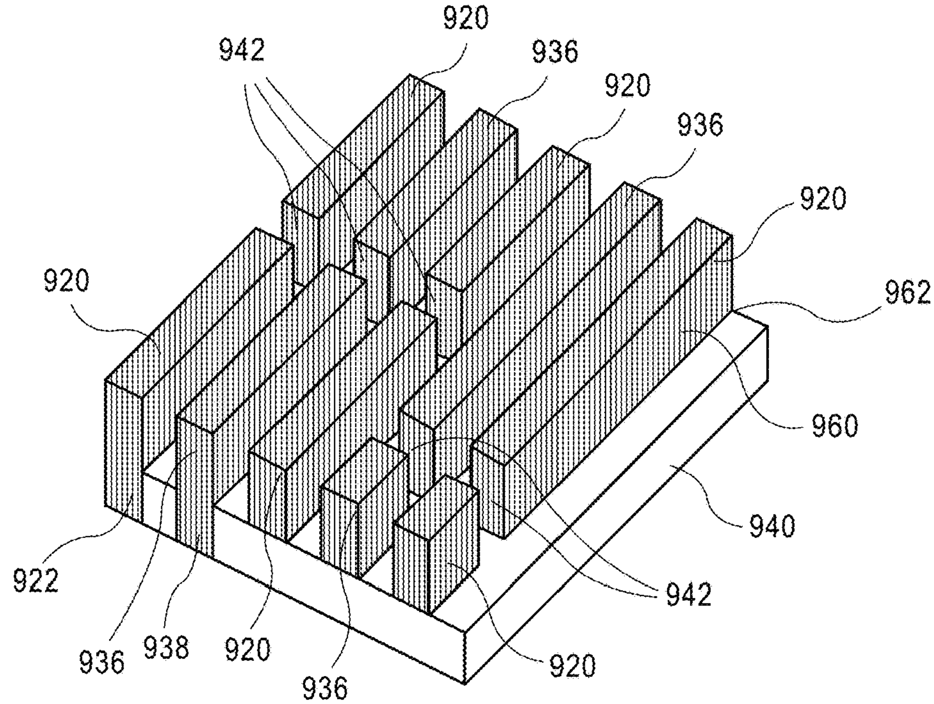

FIG. 9K illustrates the structure of FIG. 9J following exposure of the two sets of interconnect lines 920 and 936. The spacers 928, the line end placeholder portions 930, and the plug placeholders 934 are removed to leave interconnect lines 920 and 936 exposed, with underlying conductive vias 922 and 938, respectively, in the patterned ILD layer 940. Line end openings 942 are revealed. Line end openings 942 provide breaks in the grating pattern of the interconnect lines 920 and in the grating pattern of the interconnect lines 936. In an embodiment, the spacers 928, the line end placeholder portions 930, and the plug placeholders 934 are removed using a selective wet etch process.

In an embodiment, the structure of FIG. 9K represents a final metallization structure having an air gap architecture. That is, since the interconnect lines 920 and 936 are ultimately exposed in the process described herein, an air gap architecture is enabled. In another embodiment, since the interconnect lines 920 and 936 are exposed at this stage in the process, there is an opportunity to remove sidewall portions of a diffusion barrier layer of the interconnect lines. For example, in one embodiment, removal of such a diffusion barrier layer physically thins the conductive features of the interconnect lines 920 and 936. In another embodiment, resistance of such interconnect lines 920 and 936 is reduced upon removal of sidewall portions of such a diffusion barrier layer. As labeled in FIG. 9K, features sidewall portions 960 of interconnect lines 920 and 936 are exposed, while portions 962 beneath the lines are not. As such, in one embodiment, a diffusion barrier layer of interconnect lines 920 and 936 is removed from the sidewalls 960 of the interconnect lines 920 and 936 but not from regions 962 of the interconnect lines 920 and 936. In a particular embodiment, removal of sidewall portions of such a diffusion barrier layer involves removal of a Ta and/or TaN layer.

Thus, with reference to operations 9A-9K, in an embodiment, a method of fabricating a back end of line (BEOL) metallization layer includes forming a plurality of conductive lines 920/936 in a sacrificial material 928 formed above a substrate. Each of the plurality of conductive lines 920/936 includes a barrier layer formed along a bottom of and sidewalls a conductive fill layer. The sacrificial material 928 is then removed. The barrier layer is removed from the sidewalls of the conductive fill layer (e.g., at locations 960).

In one embodiment, removing the barrier layer from the sidewalls of the conductive fill layer includes removing a tantalum or tantalum nitride layer from sidewalls of a conductive fill layer including a material selected from the group consisting of Cu, Al, Ti, Zr, Hf, V, Ru, Co, Ni, Pd, Pt, Cu, W, Ag, Au and alloys thereof.

Figure 9L:
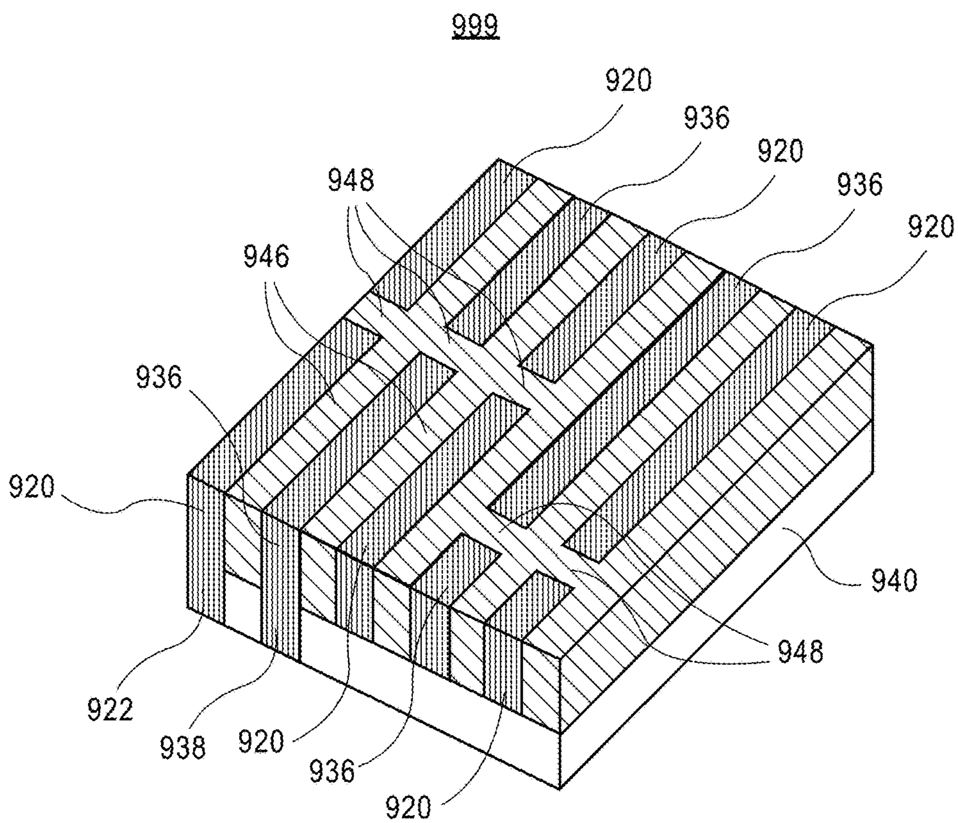

FIG. 9L illustrates the structure of FIG. 9K following formation of a permanent ILD layer. Inter-layer dielectric (ILD) layer 946/948 is formed among the interconnect lines 920 and 936. The ILD layer 946/948 includes portions 946 between interconnect lines 920 and 936. The ILD layer 946/948 also includes line end (or dielectric plug) portions 948 between at locations of the line breaks of the interconnect lines 920 and 936.

Referring again to FIG. 9L, in an embodiment, a semiconductor structure 999 includes a substrate (underlying ILD layer 940 of which is shown). A plurality of alternating first 920 and second 936 conductive line types is disposed along a same direction of a back end of line (BEOL) metallization layer disposed above the substrate. In one embodiment, as described in association with FIG. 9K, a total composition of the first conductive line type 920 is different from a total composition of the second conductive line type 936. In a specific such embodiment, the total composition of the first conductive line type 920 is substantially composed of copper, and the total composition of the second conductive line type 936 is substantially composed of a material selected from the group consisting of Al, Ti, Zr, Hf, V, Ru, Co, Ni, Pd, Pt, Cu, W, Ag, Au and alloys thereof, or vice versa. However, in another embodiment, a total composition of the first conductive line type 920 is the same as a total composition of the second conductive line type 936.

In an embodiment, the lines of the first conductive line type 920 are spaced apart by a pitch, and the lines of the second conductive line type 936 are spaced apart by the same pitch. In one embodiment, the plurality of alternating first and second conductive line types is disposed in an inter-layer dielectric (ILD) layer 946/948. In another embodiment, however, the lines of the plurality of alternating first and second conductive line types 920/936 are separated by an air gap, as described in association with FIG. 9K.

In an embodiment, the lines of the plurality of alternating first and second conductive line types 920/936 each include a barrier layer disposed along a bottom of and sidewalls of the line. In another embodiment, however, the lines of the plurality of alternating first and second conductive line types 920/936 each include a barrier layer disposed along a bottom 962 of the line but not along sidewalls 960 of the line, as was described in an embodiment of FIG. 9K. In one embodiment, one or more of the lines of the plurality of alternating first and second conductive line types is connected to an underlying via 922/938 connected to an underlying metallization layer of the semiconductor structure. In an embodiment, one or more of the lines of the plurality of alternating first and second conductive line types 920/936 is interrupted by a dielectric plug 948.

A resulting structure 999 such as described in association with FIG. 9L (or the air gap structure of FIG. 9K) may subsequently be used as a foundation for forming subsequent metal line/via and ILD layers. Alternatively, the structure 999 of FIG. 9L (or the structure of FIG. 9K) may represent the final metal interconnect layer in an integrated circuit. It is to be appreciated that the above process operations may be practiced in alternative sequences, not every operation need be performed and/or additional process operations may be performed. It is also to be appreciated that the above examples have focused on metal line and plug or line end formation. However, in other embodiments, similar approaches may be used to form via openings in an ILD layer.

In accordance with one or more embodiments of the present disclosure, self-aligned DSA di-block or selective growth bottom-up approaches are described. One or more embodiments described herein are directed to self-aligned via and plug patterning. The self-aligned aspect of the processes described herein may be based on a directed self-assembly (DSA) mechanism, as described in greater detail below. However, it is to be appreciated that selective growth mechanisms may be employed in place of, or in combination with, DSA-based approaches. In an embodiment, processes described herein enable realization of self-aligned metallization for back-end of line feature fabrication. More specifically, one or more embodiments are directed to an approach that employs an underlying metal as a template to build the conductive vias and non-conductive spaces or interruptions between metals (referred to as "plugs").

FIGS. 10A-10M illustrate portions of integrated circuit layers representing various operations in a method of self-aligned via and metal patterning, in accordance with an embodiment of the present disclosure. In each illustration at each described operation, plan views are shown on the left-hand side, and corresponding cross-sectional views are shown on the right-hand side. These views will be referred to herein as corresponding cross-sectional views and plan views.

Figure 10A:
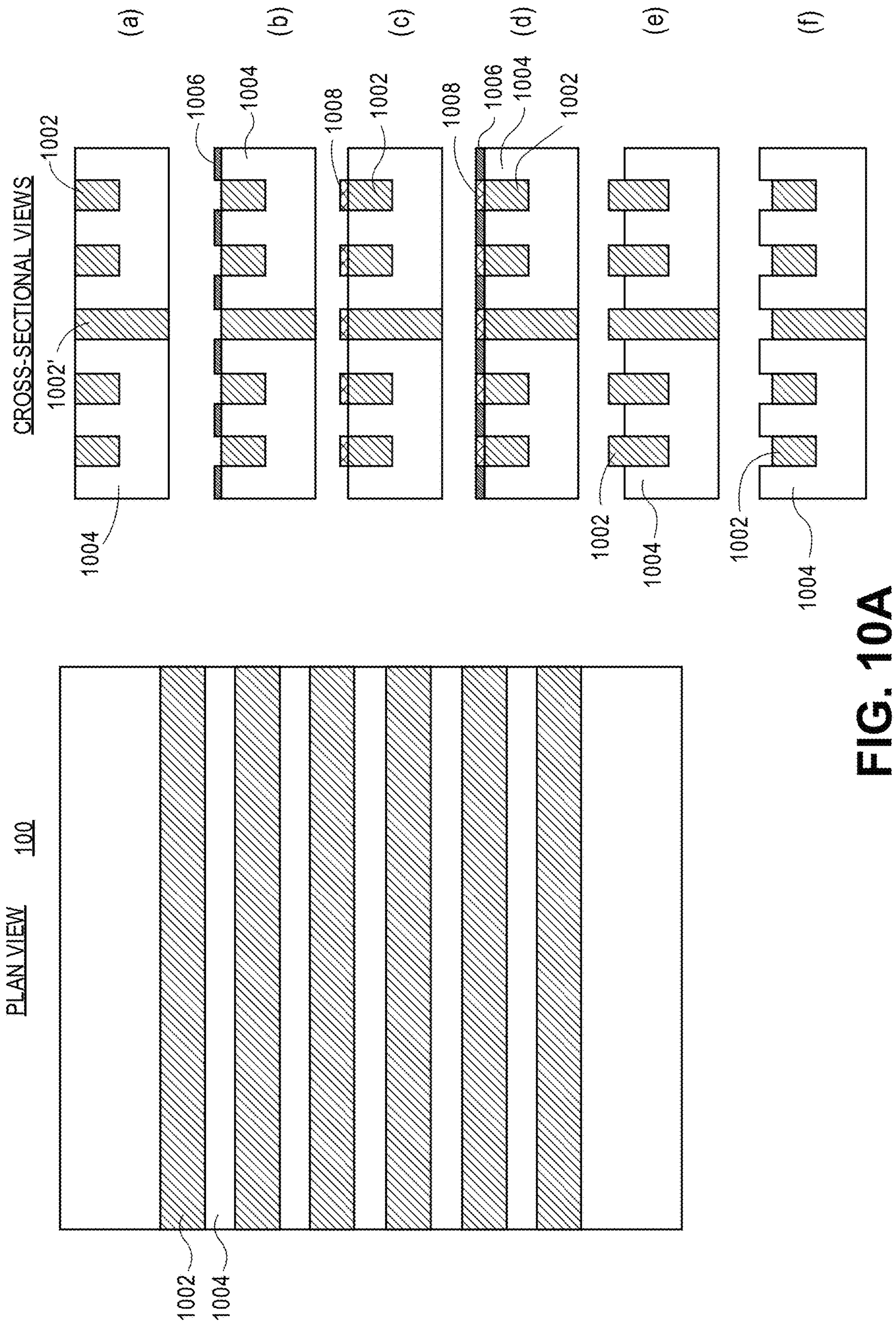
FIGS. 10A-10M illustrate portions of integrated circuit layers representing various operations in a method of self-aligned via and metal patterning, in accordance with an embodiment of the present disclosure.

FIG. 10A illustrates a plan view and corresponding cross-sectional views of options for a previous layer metallization structure, in accordance with an embodiment of the present disclosure. Referring to the plan view and corresponding cross-section view option (a), a starting structure 1000 includes a pattern of metal lines 1002 and interlayer dielectric (ILD) lines 1004. The starting structure 1000 may be patterned in a grating-like pattern with metal lines spaced at a constant pitch and having a constant width (e.g., for a DSA embodiment, but not necessarily needed for a directed selective growth embodiment), as is depicted in FIG. 10A. The pattern, for example, may be fabricated by a pitch halving or pitch quartering approach. Some of the lines may be associated with underlying vias, such as line 1002' shown as an example in the cross-sectional views.

Referring again to FIG. 10A, alternative options (b)-(f) address situations where an additional film is formed (e.g., deposited, grown, or left as an artifact remaining from a previous patterning process) on a surface of one of, or both of, the metal lines 1002 and interlayer dielectric lines 1004. In example (b), an additional film 1006 is disposed on the interlayer dielectric lines 1004. In example, (c), an additional film 1008 is disposed on the metal lines 1002. In example, (d) an additional film 1006 is disposed on the interlayer dielectric lines 1004, and an additional film 1008 is disposed on the metal lines 1002. Furthermore, although the metal lines 1002 and the interlayer dielectric lines 1004 are depicted as co-planar in (a), in other embodiments, they are not co-planar. For example, in (e), the metal lines 1002 protrude above the interlayer dielectric lines 1004. In example, (f), the metal lines 1002 are recessed below the interlayer dielectric lines 1004.

Referring again to examples (b)-(d), an additional layer (e.g., layer 1006 or 1008) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

Figure 10B:
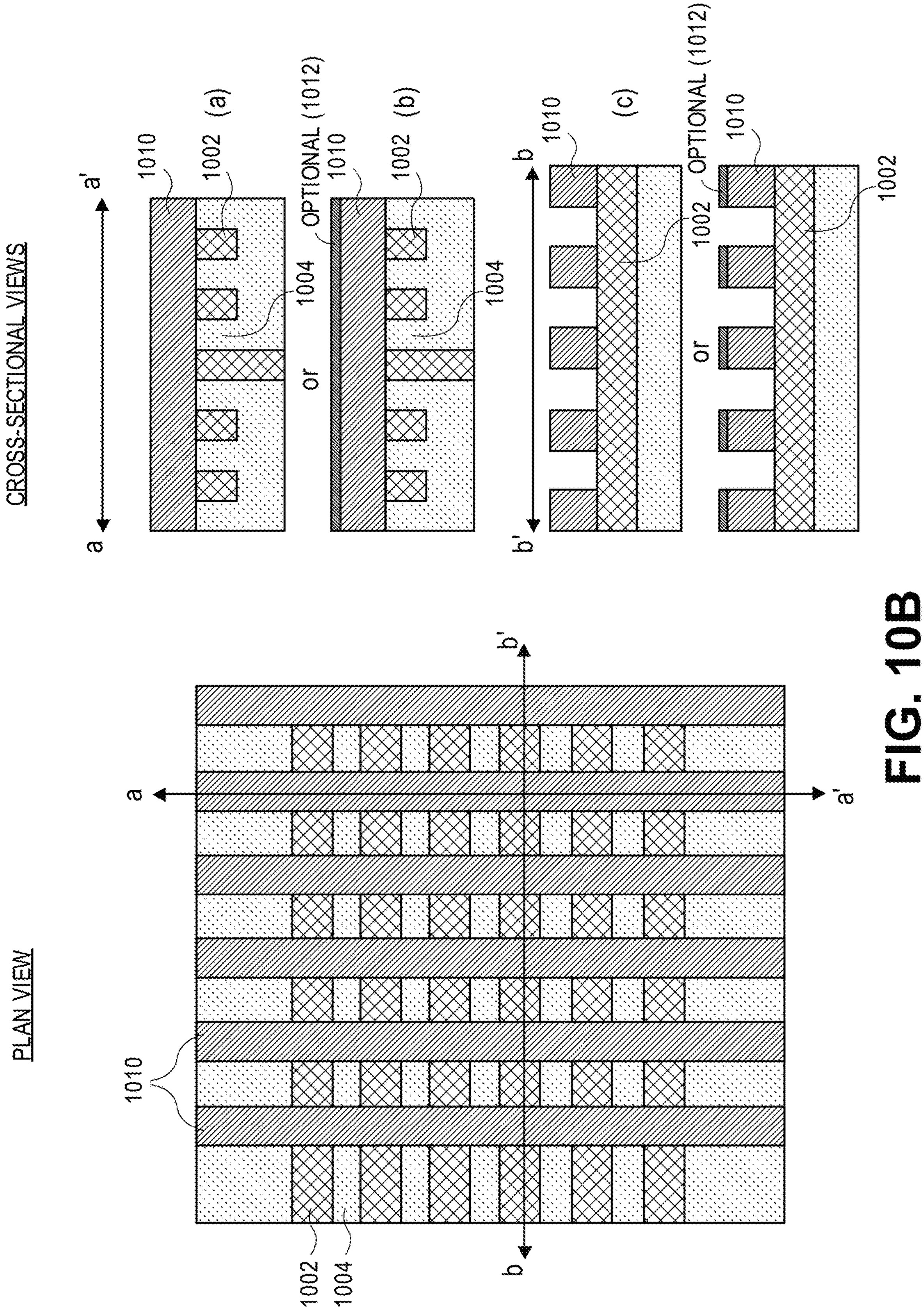

FIG. 10B illustrates a plan view and corresponding cross-sectional views of the structure of FIG. 10A following formation of interlayer dielectric (ILD) lines 1010 above the structure of FIG. 10A, in accordance with an embodiment of the present disclosure. Referring to the plan view and corresponding cross-sectional views (a) and (c) taken along axes a-a' and c-c', respectively, the ILD lines 1010 are formed in a grating structure perpendicular to the direction of underlying lines 1004. In an embodiment, a blanket film of the material of lines 1010 is deposited by chemical vapor deposition or like techniques. In an embodiment, the blanket film is then patterned using lithography and etch processing which may involve, e.g., spacer-based-quadruple-patterning (SBQP) or pitch quartering. It is to be appreciated that the grating pattern of lines 1010 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 1010 is orthogonal to the direction of the underlying structure. In one embodiment, a single 193 nm lithography mask is used with alignment/registration to the previous metal layer 1002 (e.g., grating of lines 1010 aligns to the previous layer 'plug' pattern in X and to the previous metal grating in Y). Referring to cross-sectional structures (b) and (d), a hardmask 1012 may be formed on, or retained following pattering of, dielectric lines 1010. The hardmask 1012 can be used to protect lines 1010 during subsequent patterning steps. As described in greater detail below, the formation of lines 1010 in a grating pattern exposes regions of the previous metal lines 1002 and previous ILD lines 1004 (or corresponding hardmask layers on 1002/1004). The exposed regions correspond to all possible future via locations where metal is exposed. In one embodiment, the previous layer metal layer (e.g., lines 1002) is protected, labeled, brushed, etc. at this point in the process flow.

Figure 10C:
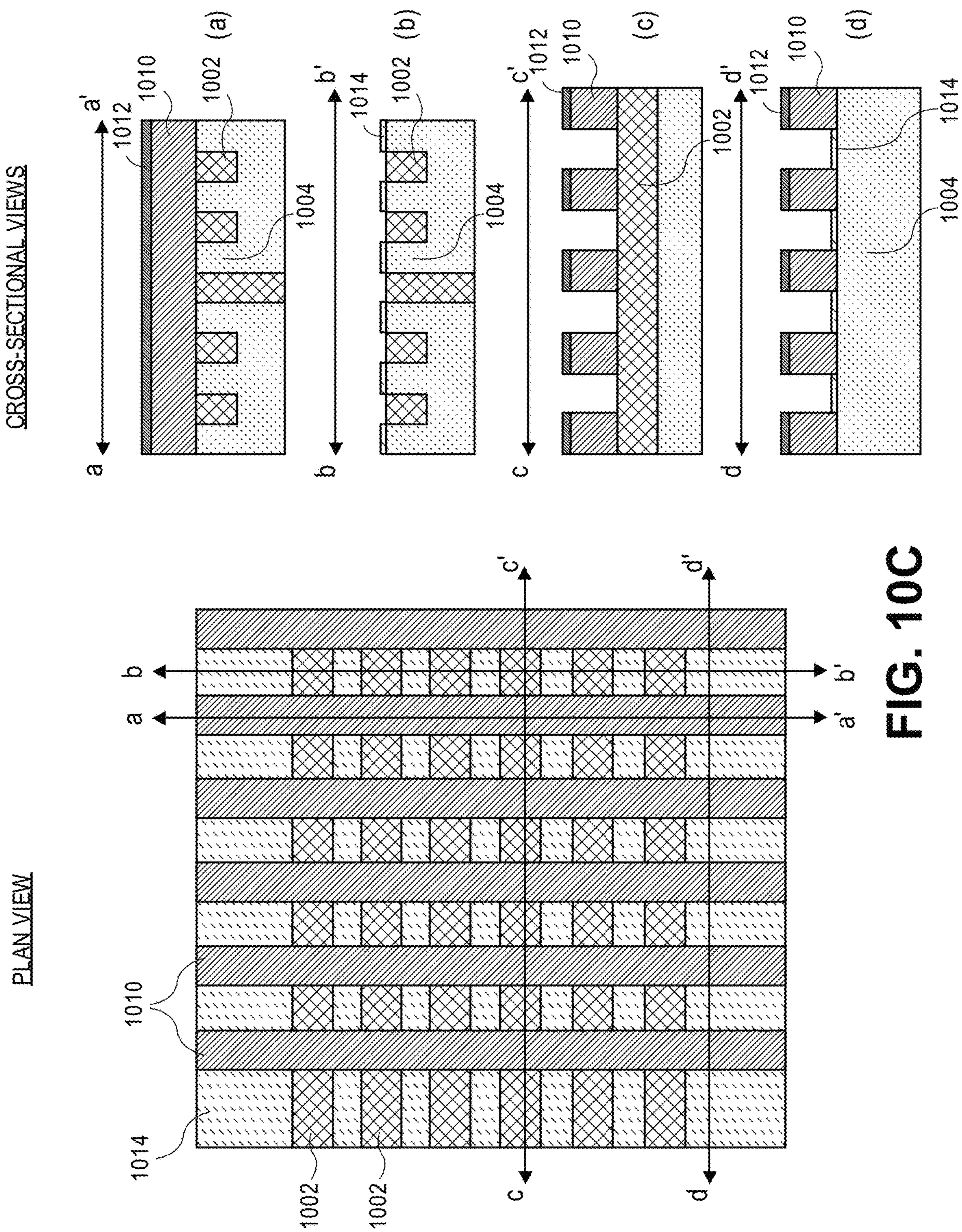

FIG. 10C illustrates a plan view and corresponding cross-sectional views of the structure of FIG. 10B following selective differentiation all of the potential via locations from all of the plug locations, in accordance with an embodiment of the present disclosure. Referring to the plan view and corresponding cross-sectional views (a)-(d) taken along axes, a-a', b-b', c-c' and d-d', respectively, following formation of ILD lines 1010, a surface modification layer 1014 is formed on exposed regions of the underlying ILD lines 1004. In an embodiment, surface modification layer 1014 is a dielectric layer. In an embodiment, surface modification layer 1014 is formed by a selective bottom-up growth approach. In one such embodiment, the bottom-up growth approach involves a directed self-assembly (DSA) brush coat that has one polymer component which assembles preferentially on the underlying ILD lines 1004 or, alternatively, on the metal lines 1002 (or on a sacrificial layer deposited or grown on the underlying metal or ILD material).

Figure 10D:
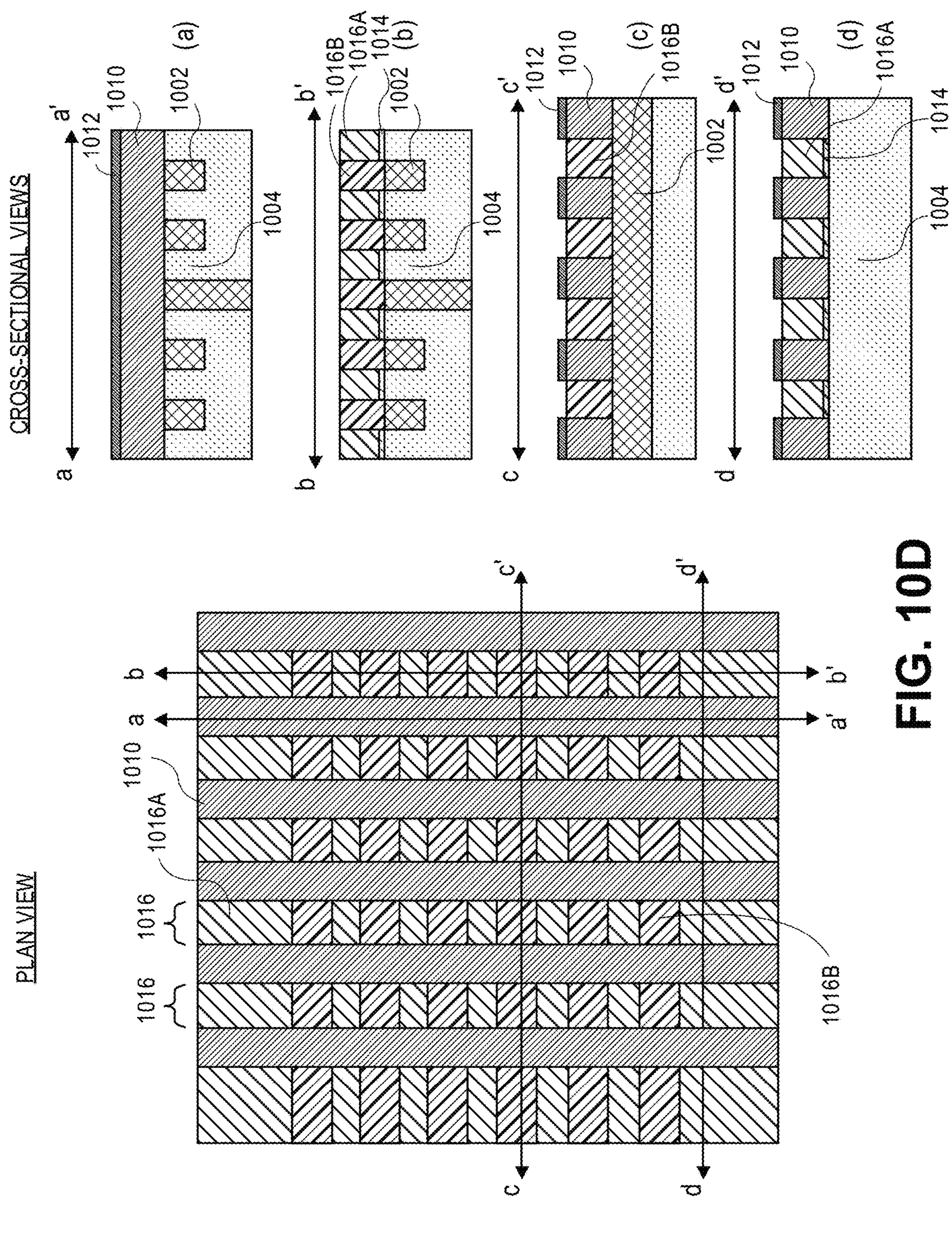

FIG. 10D illustrates a plan view and corresponding cross-sectional views of the structure of FIG. 10C following differential polymer addition to the exposed portions of underlying metal and ILD lines of FIG. 10C, in accordance with an embodiment of the present disclosure. Referring to the plan view and corresponding cross-sectional views (a)-(d) taken along axes, a-a', b-b', c-c' and d-d', respectively, directed self-assembly (DSA) or selective growth on exposed portions of the underlying metal/ILD 1002/1004 grating is used to form intervening lines 1016 with alternating polymers or alternating polymer components in between the ILD lines 1010. For example, as shown, polymer 1016A (or polymer component 1016A) is formed on or above the exposed portions of interlayer dielectric (ILD) lines 1004 of FIG. 10C, while polymer 1016B (or polymer component 1016B) is formed on or above the exposed portions of the metal lines 1002 of FIG. 10C. Although polymer 1016A is formed on or above the surface modification layer 1014 described in association with FIG. 10C (see cross-sectional views (b) and (d) of FIG. 10D), it is to be appreciated that, in other embodiments, the surface modification layer 1014 can be omitted and the alternating polymers or alternating polymer components can instead be formed directly in the structure described in association with FIG. 10B.

Referring again to FIG. 10D, in an embodiment, once the surface of the underlying structure (e.g., structure 1000 of FIG. 10A) has been prepared (e.g., such as the structure of FIG. 10B or the structure of FIG. 10C) or is used directly, a 50-50 diblock copolymer, such as polystyrene-polymethyl methacrylate (PS-PMMA), is coated on the substrate and annealed to drive self-assembly, leading to the polymer 1016A/polymer 1016B layer 1016 of FIG. 10D. In one such embodiment, with appropriate surface energy conditions, the block copolymers segregate based on the underlying material exposed between ILD lines 1010. For example, in a specific embodiment, polystyrene aligns selectively to the exposed portions of underlying metal lines 1002 (or corresponding metal line cap or hardmask material). Meanwhile, the polymethyl methacrylate aligns selectively to the exposed portions of ILD lines 1004 (or corresponding metal line cap or hardmask material).

Thus, in an embodiment, the underlying metal and ILD grid, as exposed between ILD lines 1010 is recreated in the block co-polymer (BCP, i.e., polymer 1016A/polymer 1016B). This can particularly be so if the BCP pitch is commensurate with the underlying grating pitch. The polymer grid (polymer 1016A/polymer 1016B) is, in one embodiment, robust against certain small deviations from a well aligned grid. For example, if small plugs effectively place an oxide or like material where a well aligned grid would have metal, a well aligned polymer 1016A/polymer 1016B grid can still be achieved. However, since the ILD lines grating is, in one embodiment, an idealized grating structure, with no metal disruptions of the ILD backbone, it may be necessary to render the ILD surface neutral since both types of polymer (1016A and 1016B) will, in such an instance, be exposed to ILD like material while only one type is exposed to metal.

In an embodiment, the thickness of the coated polymer (polymer 1016A/polymer 1016B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer 1016 (polymer 1016A/polymer 1016B) can be important since it may be used to define the ultimate thickness of a subsequently formed permanent ILD layer. That is, in one embodiment, the polymer grating shown in FIG. 10D is eventually replaced with an ILD grating of roughly the same thickness.

In an embodiment, as mentioned above, the grid of polymer 1016A/polymer 1016B of FIG. 10D is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 1016A and a block of polymer 1016B. In an embodiment, the block of polymer 1016A includes predominantly a chain of covalently linked monomer A (e.g., A-A-A-A-A . . . ), whereas the block of polymer 1016B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the disclosure is not so limited. In other embodiments, there may be more than two blocks. Moreover, in other embodiments, each of the blocks may include different types of monomers (e.g., each block may itself be a copolymer). In one embodiment, the block of polymer 1016A and the block of polymer 1016B are covalently bonded together. The block of polymer 1016A and the block of polymer 1016B may be of approximately equal length, or one block may be significantly longer than the other.

Typically, the blocks of block copolymers (e.g., the block of polymer 1016A and the block of polymer 1016B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example (as shown in FIG. 10D), in two block copolymers, if the blocks are approximately the same length, a grid like pattern of alternating polymer 1016A lines and polymer 1016B lines is generated. In another embodiment (not shown), in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer 1016A were longer than the block of polymer 1016B, but not too much longer, columnar structures may formed in which many block copolymer molecules align with their shorter blocks of polymer 1016B forming columnar structures surrounded by a phase having the longer blocks of polymer 1016A. When this occurs in an area of sufficient size, a two-dimensional array of generally hexagonally-packed columnar structures may be formed.

In an embodiment, the polymer 1016A/polymer 1016B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 10D. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self-assembly of block copolymers may be used to form vias that are self-aligned with interconnects, as described in greater detail below.

Referring again to FIG. 10D, in an embodiment, for a DSA process, in addition to direction from the underlying ILD/metal 1004/1002 surfaces the growth process can be affected by the sidewalls of the material of ILD lines 1010. As such, in one embodiment, DSA is controlled through graphoepitaxy (from the sidewalls of lines 1010) and chemoepitaxy (from the underlying exposed surface characteristics). Constraining the DSA process both physically and chemically can significantly aid the process from a defectivity standpoint. The resulting polymers 1016A/1016B have fewer degrees of freedom and are fully constrained in all directions through chemical (e.g., underlying ILD or metal lines, or surface modifications made thereto by, for example, a brush approach) and physical (e.g., from the trenches formed between the ILD lines 1010).

Figure 10E:
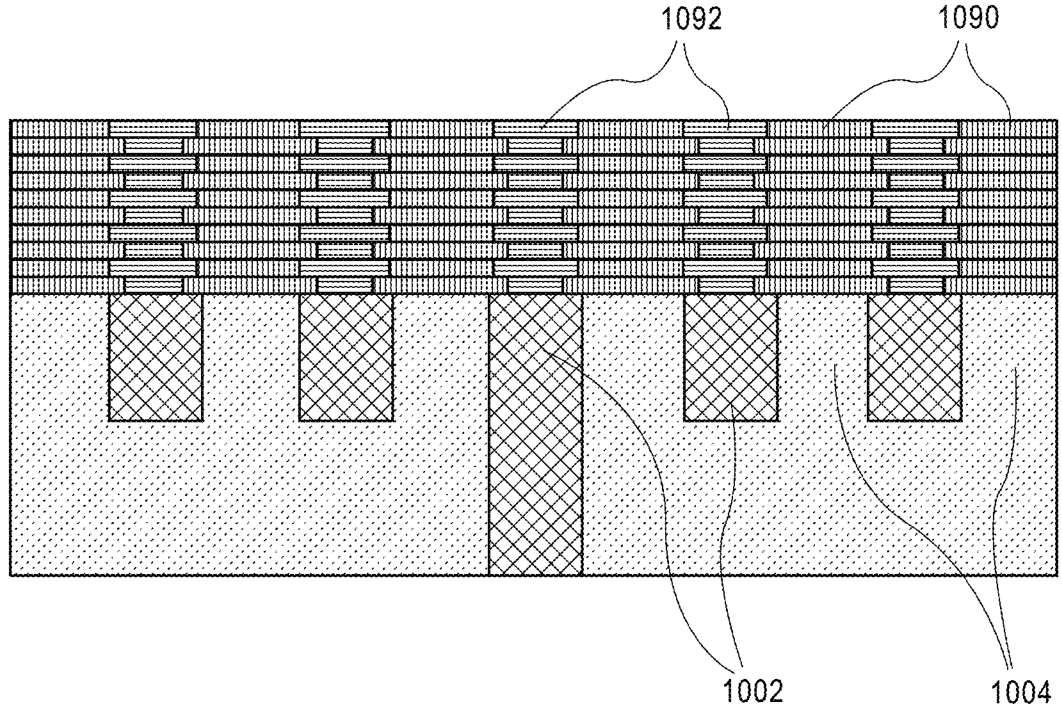

In an alternative embodiment, a selective growth process is used in place of a DSA approach. FIG. 10E illustrates a cross-sectional view of the structure of FIG. 10B following selective the exposed portions of underlying metal and ILD lines, in accordance with another embodiment of the present disclosure. Referring to FIG. 10E, a first material type 1090 is grown above exposed portions of underlying ILD lines 1004. A second, different, material type 1092 is grown above exposed portions of underlying metal lines 1002. In an embodiment, the selective growth is achieved by a dep-etch-dep-etch approach for each of the first and second materials, resulting in a plurality of layers of each of the materials, as depicted in FIG. 10E. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

Figure 10F:
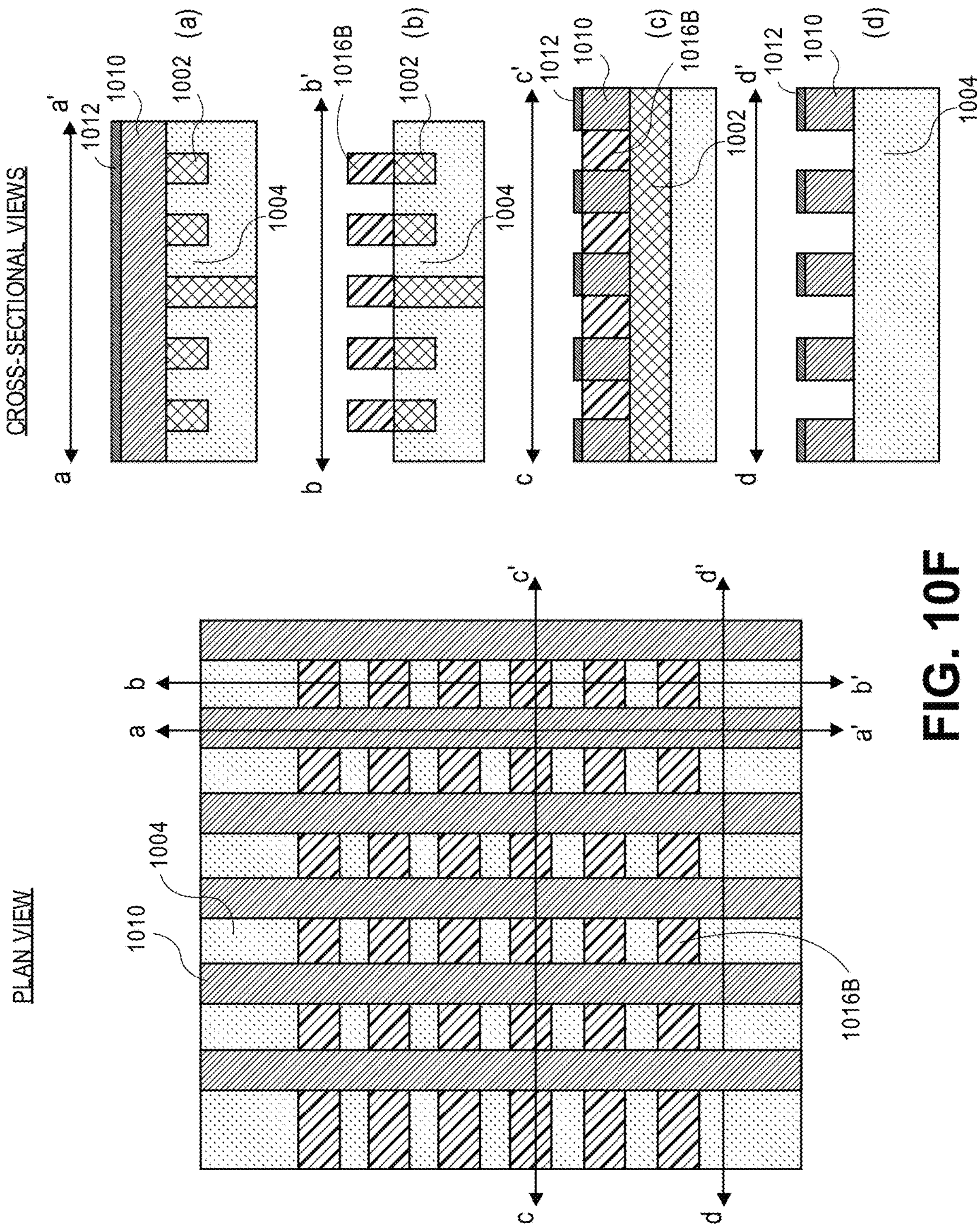

FIG. 10F illustrates a plan view and corresponding cross-sectional views of the structure of FIG. 10D following removal of one species of polymer, in accordance with an embodiment of the present disclosure. Referring to the plan view and corresponding cross-sectional views (a)-(d) taken along axes, a-a', b-b', c-c' and d-d', respectively, polymer or polymer portion 1016A is removed to re-expose the ILD lines 1004 (or hardmask or cap layers formed on the ILD lines 1004), while polymer or polymer portion 1016B is retained above the metal lines 1002. In an embodiment, a deep ultra-violet (DUV) flood expose followed by a wet etch or a selective dry etch is used to selectively remove polymer 1016A. It is to be appreciated that, instead of first removal of the polymer from the ILD lines 1004 (as depicted), removal from the metal lines 1002 may instead be first performed. Alternatively, a dielectric film is selectively grown over the region, and a mixed scaffolding is not used.

Figure 10G:
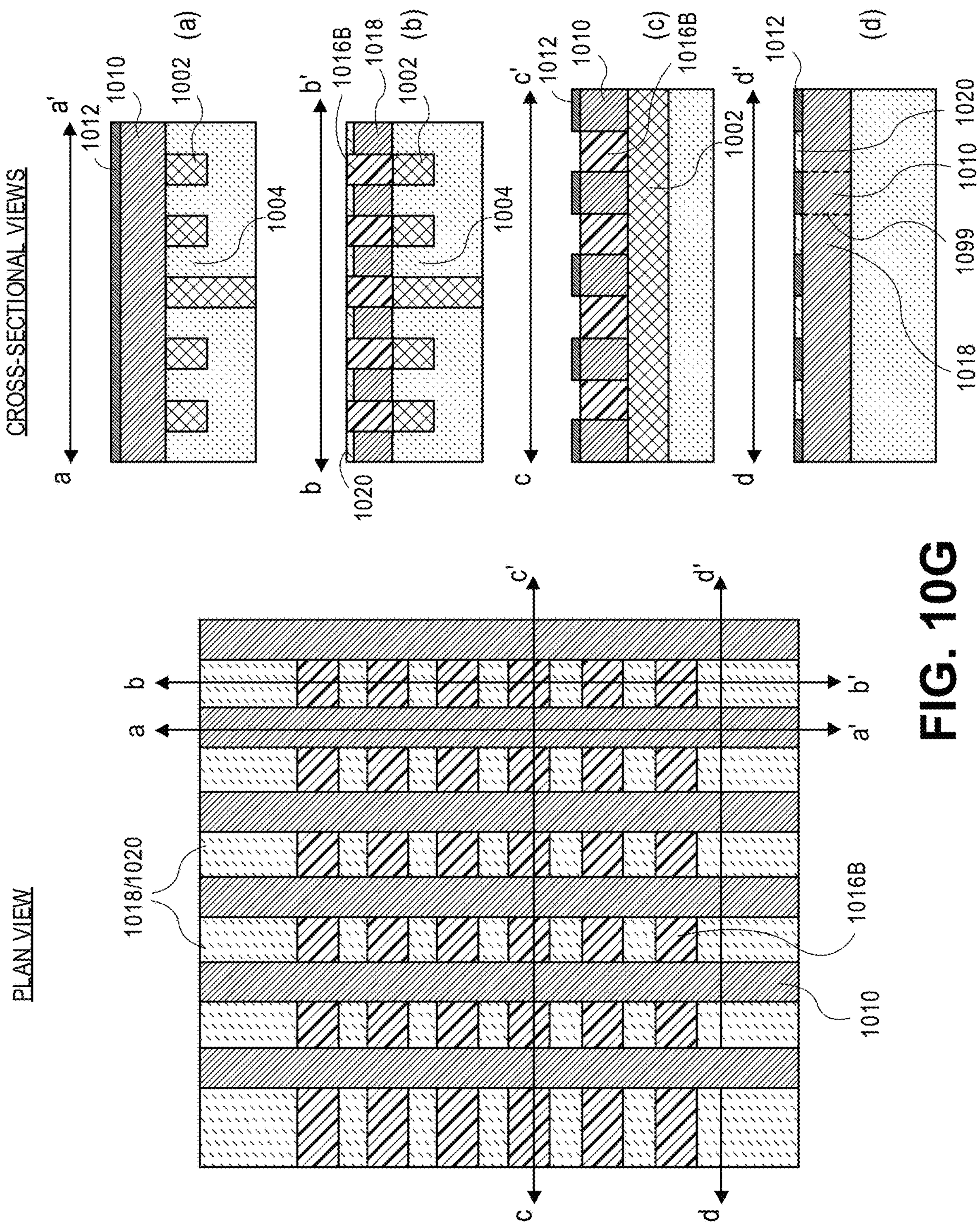

FIG. 10G illustrates a plan view and corresponding cross-sectional views of the structure of FIG. 10F following formation of an ILD material in the locations opened upon removal of the one species of polymer, in accordance with an embodiment of the present disclosure. Referring to the plan view and corresponding cross-sectional views (a)-(d) taken along axes, a-a', b-b', c-c' and d-d', respectively, the exposed regions of underlying ILD lines 1004 are filled with a permanent interlayer dielectric (ILD) layer 1018. As such, the open spaces between all possible via positions are filled with an ILD layer 1018 includes a hardmask layer 1020 disposed thereon, as depicted in the plan view and in the cross-sectional views (b) and (d) of FIG. 10G. It is to be appreciated that the material of ILD layer 1018 need not be the same material as ILD lines 1010. In an embodiment, the ILD layer 1018 is formed by a deposition and polish process. In the case where ILD layer 1018 is formed with an accompanying hardmask layer 1020, a special ILD fill material may be used (e.g., polymer encapsulated nanoparticles of ILD that fills holes/trenches). In such a case, a polish operation may not be necessary.

Referring again to FIG. 10G, in an embodiment, the resulting structure includes a uniform ILD structure (ILD lines 1010+ILD layer 1018), and the locations of all possible plugs are covered in hardmask 1020 and all possible vias are in areas of polymer 1016B. In one such embodiment, ILD lines 1010 and ILD layer 1018 are composed of a same material. In another such embodiment, ILD lines 1010 and ILD layer 1018 are composed of different ILD materials. In either case, in a specific embodiment, a distinction such as a seam between the materials of ILD lines 1010 and ILD layer 1018 may be observed in the final structure. Exemplary seams 1099 are shown in FIG. 10G for illustrative purposes.

Figure 10H:
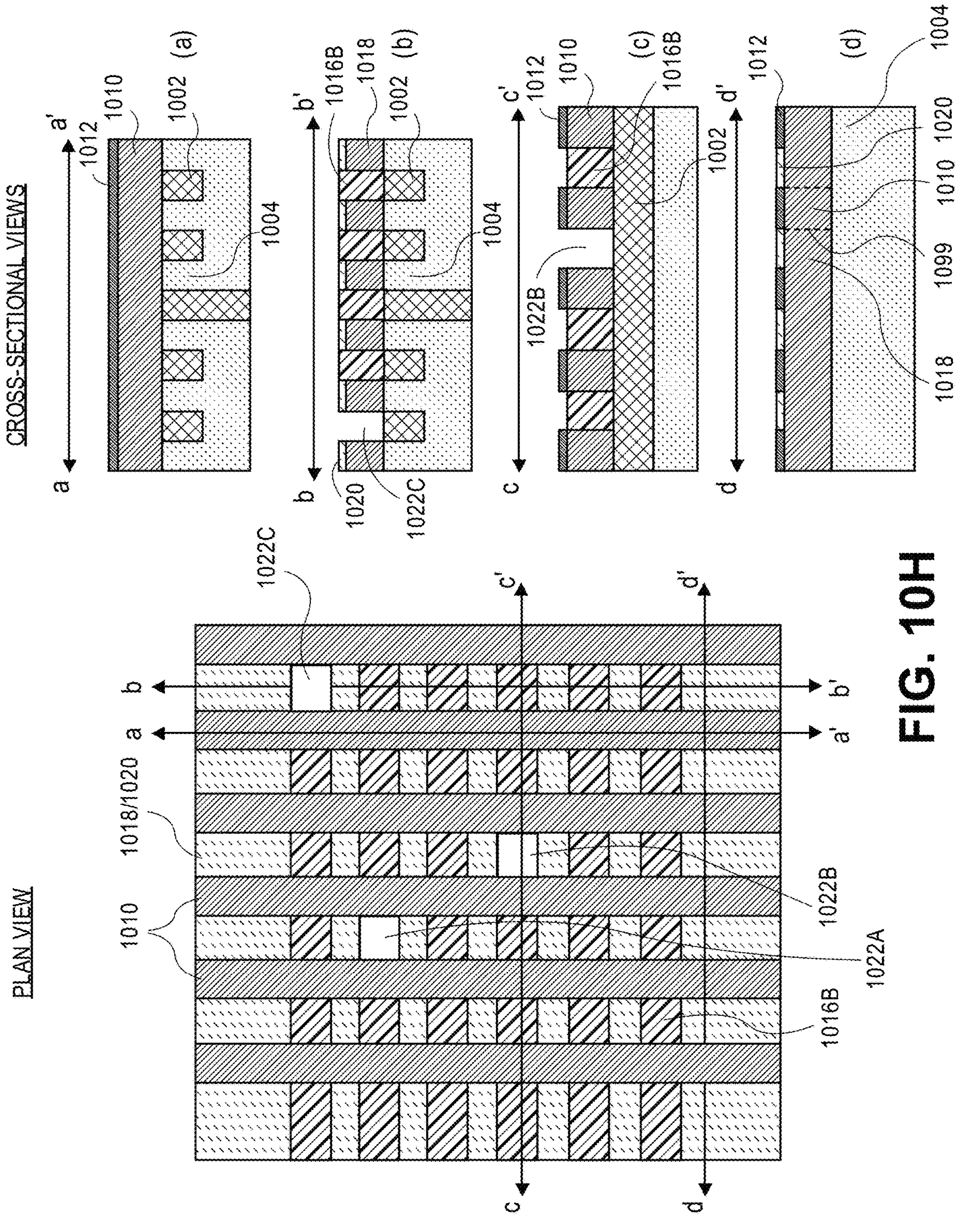

FIG. 10H illustrates a plan view and corresponding cross-sectional views of the structure of FIG. 10G following via patterning, in accordance with an embodiment of the present disclosure. Referring to the plan view and corresponding cross-sectional views (a)-(d) taken along axes, a-a', b-b', c-c' and d-d', respectively, via locations 1022A, 1022B and 1022C are opened by removal of polymer 1016B in select locations. In an embodiment, selective via location formation is accomplished by using a lithographic technique. In one such embodiment, polymer 1016B is globally removed with an ash and refilled with photoresist. The photoresist may be highly sensitive and have a large acid diffusion and aggressive deprotection or crosslinking (depending on resist tone) because the latent image is confined in both directions by ILD (e.g., by ILD lines 1010 and ILD layer 1018). The resist serves as a digital switch to turn "on" or "off" depending whether a via is required in a particular location or not. Ideally, the photoresist can be used to fill the holes only, without spilling over. In an embodiment, the via locations 1022A, 1022B and 1022C are fully confined with the process such that line edge or width roughness (LWR) and line collapse and/or reflection is mitigated if not eliminated. In an embodiment, low doses are used with EUV/EBDW and increase runrate significantly. In one embodiment, an additional advantage with the use of EBDW is that only a single shot type/size that can increase runrate by significantly reducing the number of apertures required as well as lowering the dose that needs to be delivered. In a case that 193 nm immersion lithography is used, in an embodiment, the process flow confines the via locations in both directions such the size of the via that actually is patterned is twice the size of the actual via on the wafer (e.g., assuming 1:1 line/space patterns). Alternatively, the via locations can be selected in the reverse tone where the vias that need to be retained are protected with photoresist and the remaining sites are removed and later filled with ILD. Such an approach can allow a single metal fill/polish process at the end of the patterning flow rather than two separate metal deposition steps.

Figure 10I:
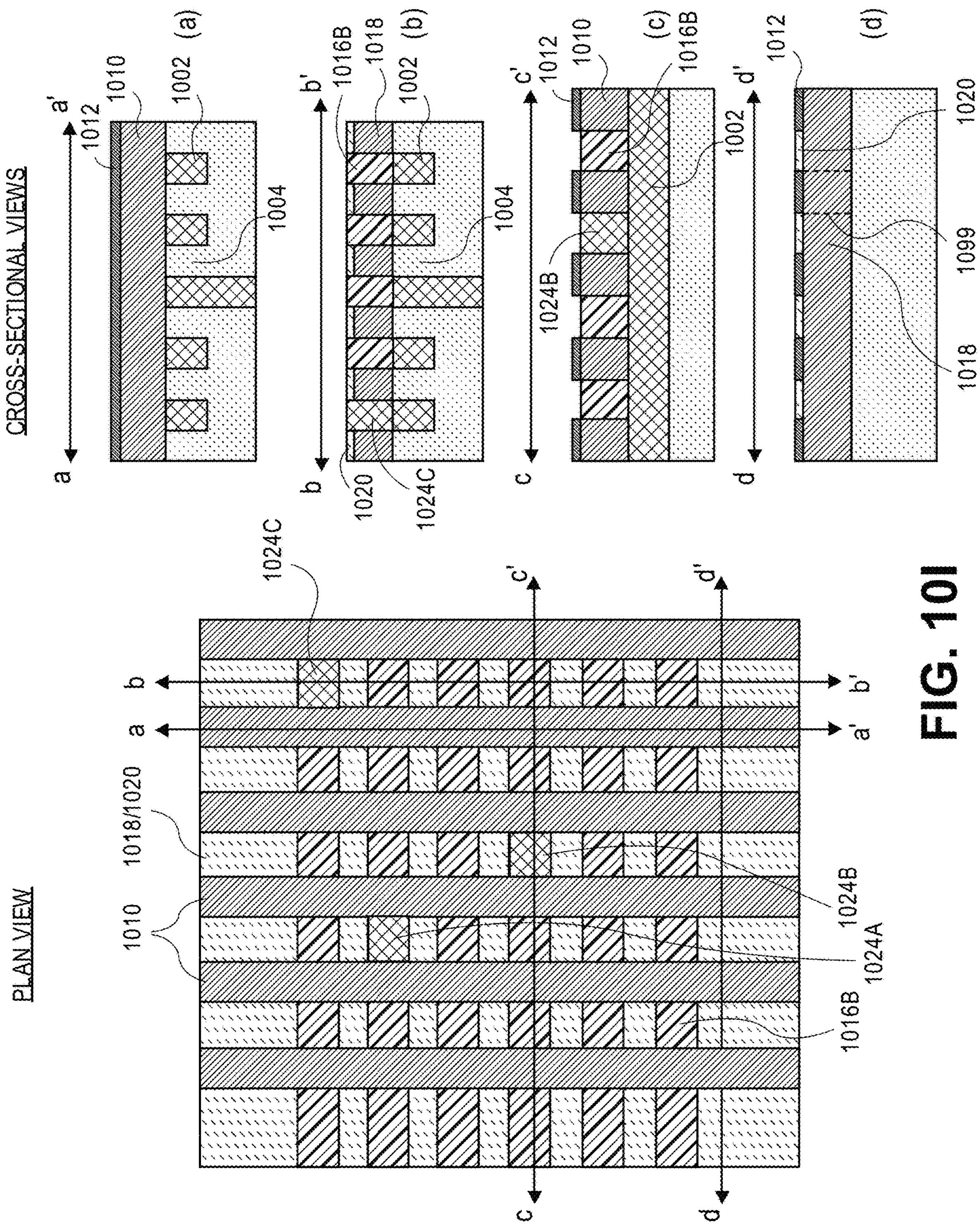

FIG. 10I illustrates a plan view and corresponding cross-sectional views of the structure of FIG. 10H following via formation, in accordance with an embodiment of the present disclosure. Referring to the plan view and corresponding cross-sectional views (a)-(d) taken along axes, a-a', b-b', c-c' and d-d', respectively, via locations 1022A, 1022B and 1022C are filled with metal to form vias 1024A, 1024B and 1024C, respectively. In an embodiment, via locations 1022A, 1022B and 1022C are filled with excess metal, and a subsequent polish operation is performed. In another embodiment, however, via locations 1022A, 1022B and 1022C are filled without metal overfilling and the polishing operation is omitted. It is to be appreciated that the via fill illustrated in FIG. 10I may be skipped in a reverse tone via selection approach.

Figure 10J:
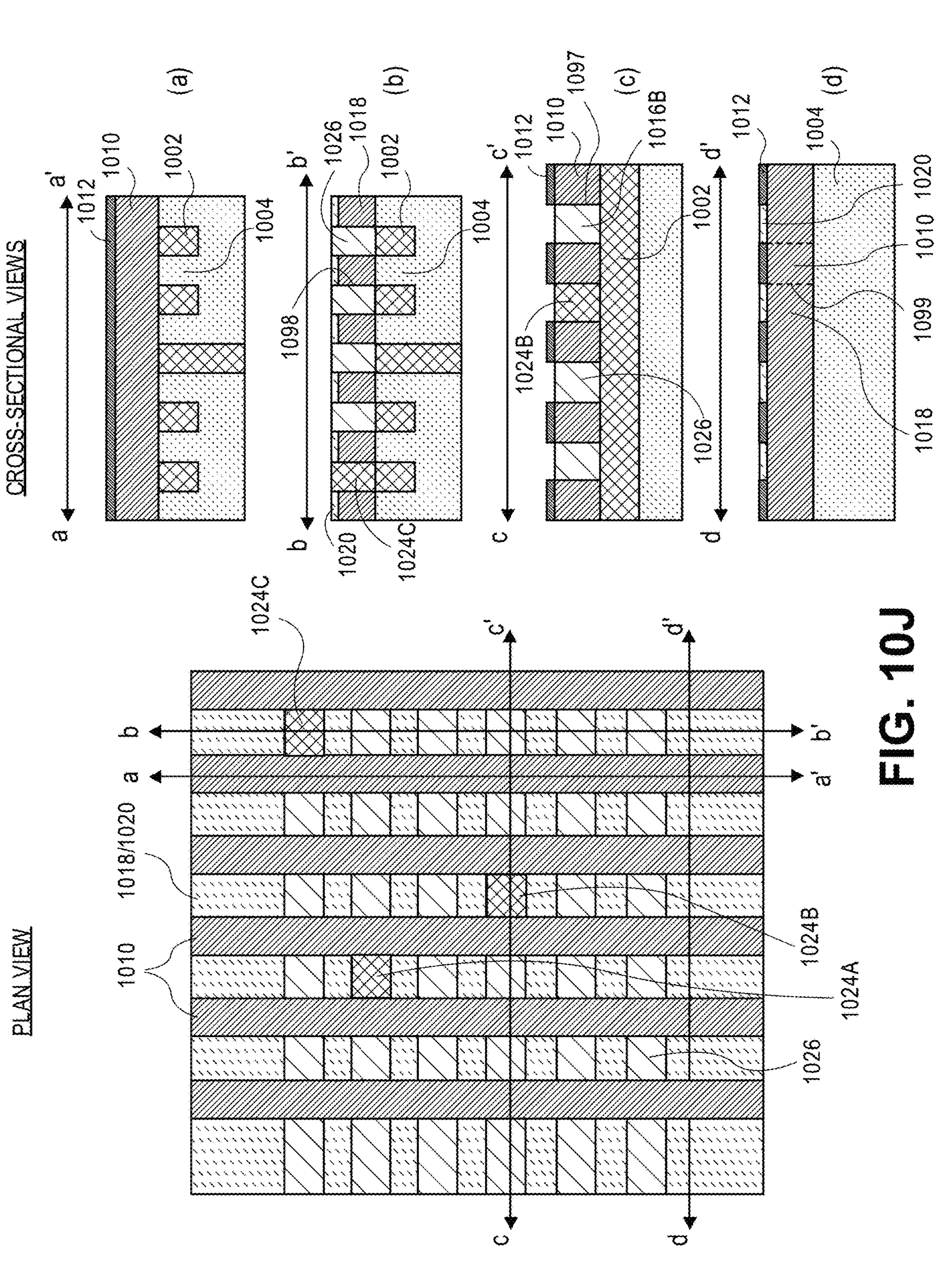

FIG. 10J illustrates a plan view and corresponding cross-sectional views of the structure of FIG. 10I following removal of the second species of polymer and replacement with an ILD material, in accordance with an embodiment of the present disclosure. Referring to the plan view and corresponding cross-sectional views (a)-(d) taken along axes, a-a', b-b', c-c' and d-d', respectively, remaining polymer or polymer portion 1016B (e.g., where vias locations have not been selected) is removed to re-expose the metal lines 1002. Subsequently, an ILD layer 1026 is formed in the locations where the remaining polymer or polymer portion 1016B was removed, as depicted in FIG. 10J.

Referring again to FIG. 10J, in an embodiment, the resulting structure includes a uniform ILD structure (ILD lines 1010+ILD layer 1018+ILD layer 1026), and the locations of all possible plugs are covered in hardmask 1020. In one such embodiment, ILD lines 1010, ILD layer 1018 and ILD layer 1026 are composed of a same material. In another such embodiment, two of ILD lines 1010, ILD layer 1018 and ILD layer 1026 are composed of a same material and the third is composed of a different ILD material. In yet another such embodiment, all of ILD lines 1010, ILD layer 1018 and ILD layer 1026 are composed of a different ILD material with respect to one another. In any case, in a specific embodiment, a distinction such as a seam between the materials of ILD lines 1010 and ILD layer 1026 may be observed in the final structure. Exemplary seams 1097 are shown in FIG. 10J for illustrative purposes. Likewise, a distinction such as a seam between the materials of ILD layer 1018 and ILD layer 1026 may be observed in the final structure. Exemplary seams 1098 are shown in FIG. 10J for illustrative purposes.

Figure 10K:
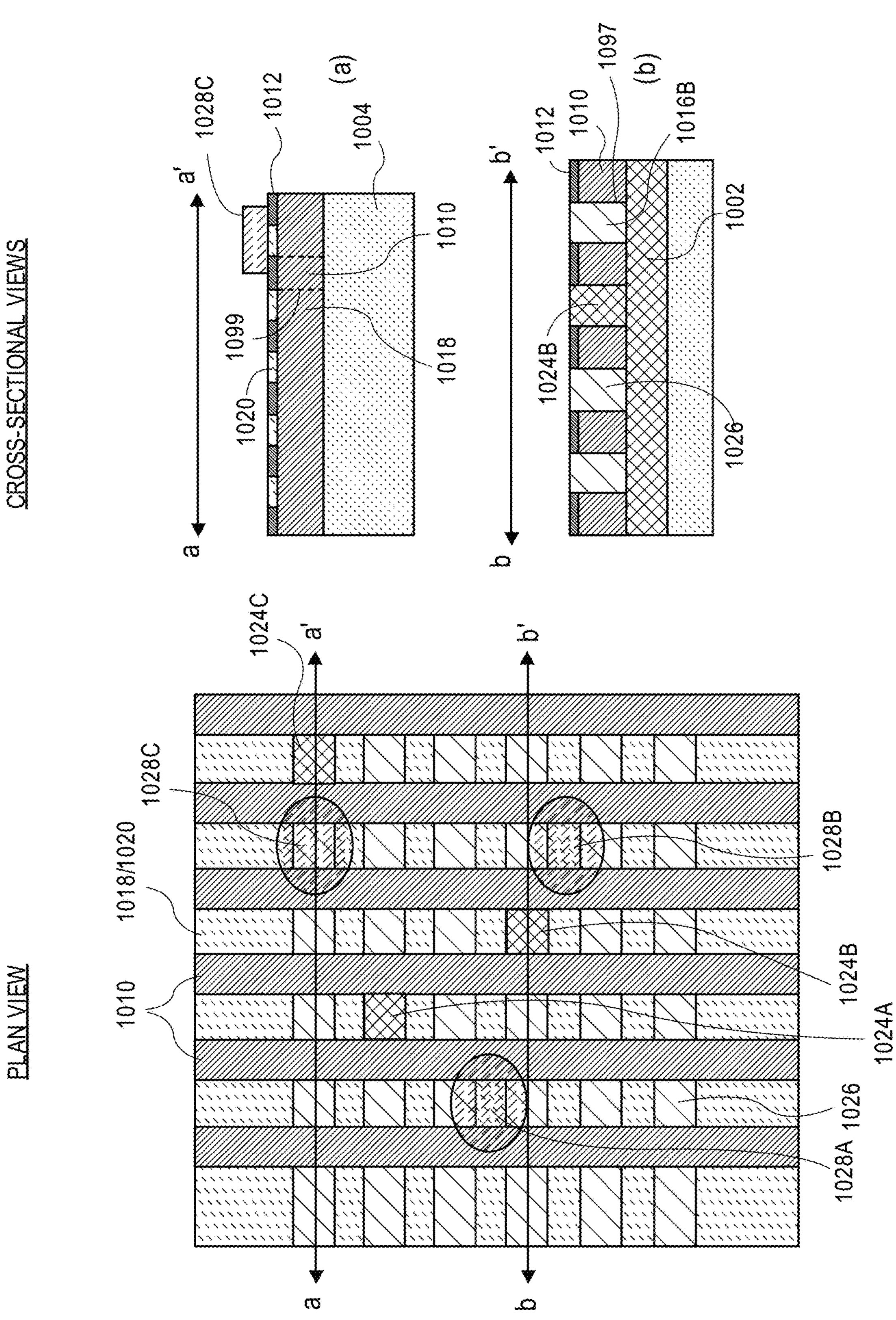

FIG. 10K illustrates a plan view and corresponding cross-sectional views of the structure of FIG. 10J following patterning of a resist or mask in selected plug locations, in accordance with an embodiment of the present disclosure. Referring to the plan view and corresponding cross-sectional views (a) and (b) taken along axes, a-a' and b-b', respectively, plug positions 1028A, 1028B and 1028C are preserved by forming a mask or resist layer over those locations. Such preservation patterning may be referred to as metal end-to-end lithographic patterning, wherein plug positions are determined where breaks in subsequently formed metal lines are required. It is to be appreciated that since the plug locations can only be in those locations where ILD layer 1018/hardmask 1020 are positioned, plugs can occur over the previous layer ILD lines 1004. In an embodiment, the patterning is achieved by using a lithography operation (e.g., EUV, EBDW or immersion 193 nm). In an embodiment, the process illustrated in FIG. 10K, demonstrates use of a positive tone patterning process where the regions where spaces between metal need to occur are preserved. It is to be appreciated that, in another embodiment, it is also possible to open holes instead and reverse the tone of the process.

Figure 10L:
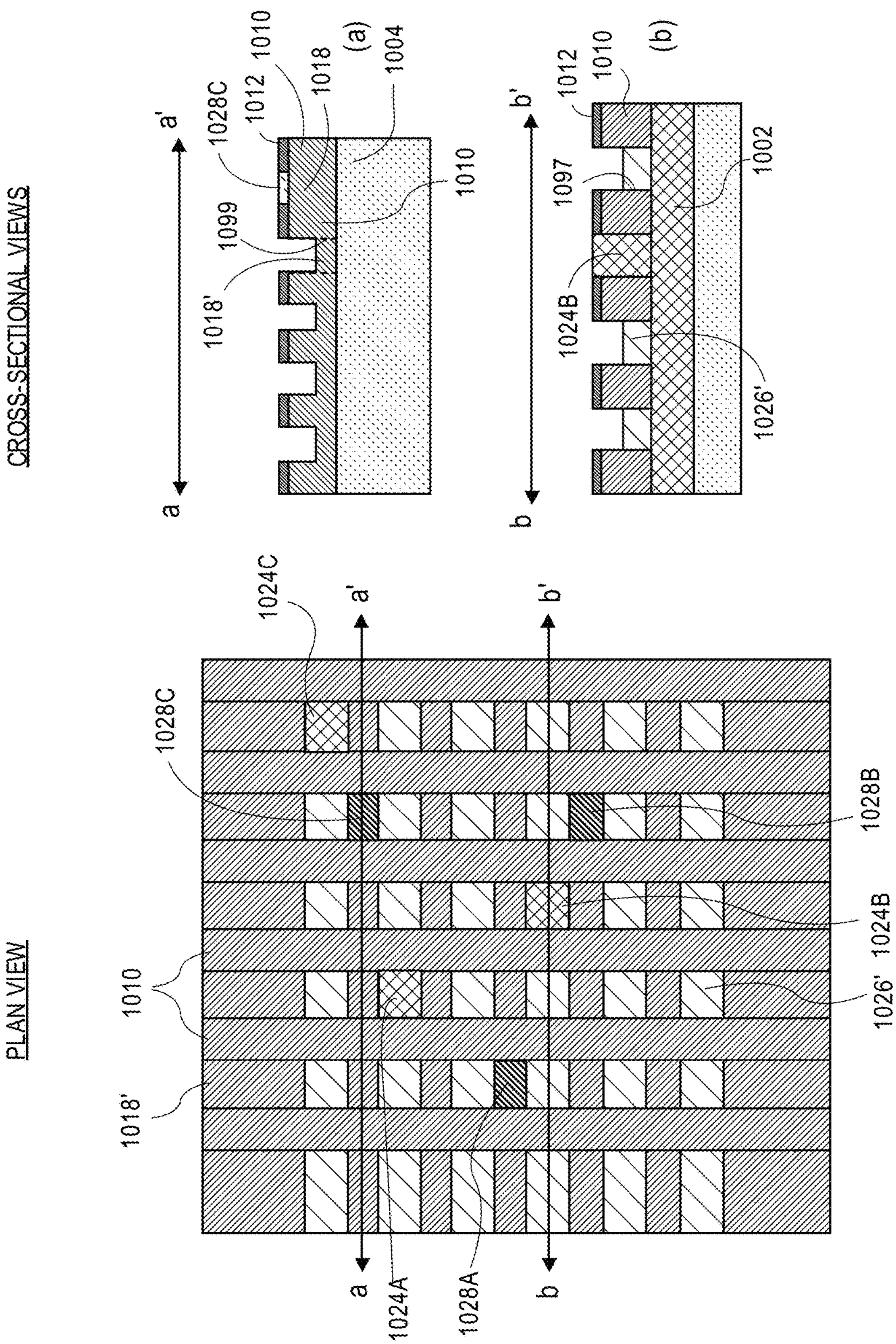

FIG. 10L illustrates a plan view and corresponding cross-sectional views of the structure of FIG. 10K following hardmask removal and ILD layer recessing, in accordance with an embodiment of the present disclosure. Referring to the plan view and corresponding cross-sectional views (a) and (b) taken along axes, a-a' and b-b', respectively, hardmask 1020 is removed and ILD layer 1018 and ILD layer 1026 are recessed to form recessed ILD layer 1018' and recessed ILD layer 1026', respectively, by etching of these layers below their original uppermost surfaces. It is to be appreciated that the recessing of ILD layer 1018 and ILD layer 1026 is performed without etching or recessing ILD lines 1010. The selectivity may be achieved by use of a hardmask layer 1012 on the ILD lines (as depicted in cross-sectional views (a) and (b)). Alternatively, in a case that the ILD lines 1010 are composed of an ILD material different from the material of ILD layer 1018 and ILD layer 1026, a selective etch may be used even in the absence of a hardmask 1012. The recessing of ILD layer 1018 and ILD layer 1026 is to provide locations for the second level of metal lines, as isolated by ILD lines 1010, as described below. The extent or depth of the recess is, in one embodiment, selected based on the desired ultimate thickness of the metal lines formed thereon. It is to be appreciated that the ILD layer 1018 in the plug locations 1028A, 1028B and 1028C is not recessed.

Figure 10M:
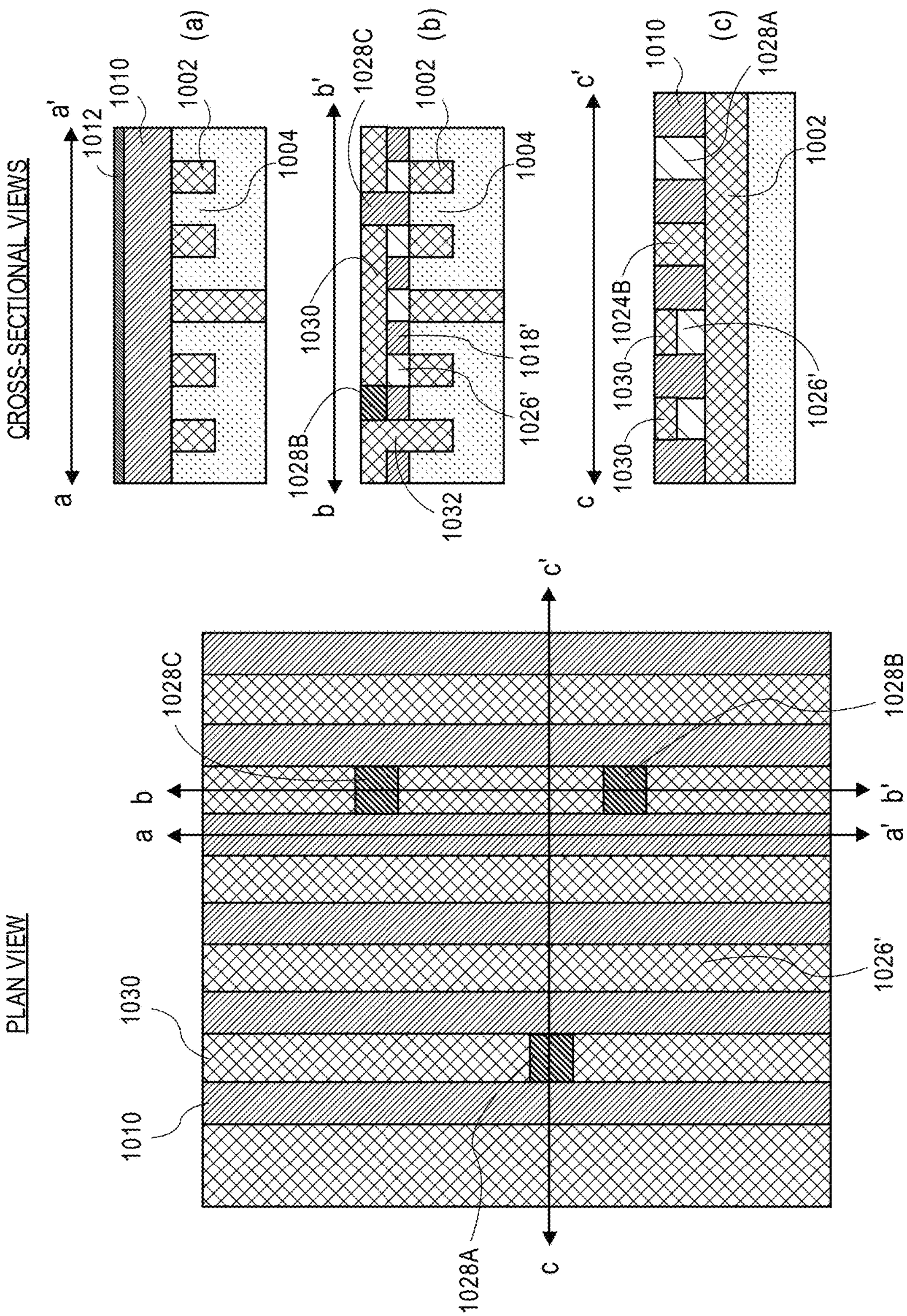

FIG. 10M illustrates a plan view and corresponding cross-sectional views of the structure of FIG. 10L following metal line formation, in accordance with an embodiment of the present disclosure. Referring to the plan view and corresponding cross-sectional views (a), (b) and (c) taken along axes, a-a', b-b' and c-c', respectively, metal for forming metal interconnect lines is formed conformally above the structure of FIG. 10L. The metal is then planarized, e.g., by CMP, to provide metal lines 1030, which are confined to locations above recessed ILD layer 1018' and recessed ILD layer 1026'. The metal lines 1030 are coupled with underlying metal lines 1002 through the predetermined via locations 1024A, 1024B and 1024C (1024B is shown in cross-sectional view (c); note that for illustrative purposes, another via 1032 is depicted directly adjacent plug 1028B in cross-sectional view (b) even though this is inconsistent with the previous figures). The metal lines 1030 are isolated from one another by ILD lines 1010 and are disrupted or broken-up by the preserved plugs 1028A, 1028B and 1028C. Any hardmask remaining on the plug locations and/or on the ILD lines 1010 may be removed at this portion of the process flow, as depicted in FIG. 10M. The metal (e.g., copper and associated barrier and seed layers) deposition and planarization process to form metal lines 1030 may be that typically used for standard back end of line (BEOL) single or dual damascene processing. In an embodiment, in subsequent fabrication operations, the ILD lines 1010 may be removed to provide air gaps between the resulting metal lines 1030.

The structure of FIG. 10M may subsequently be used as a foundation for forming subsequent metal line/via and ILD layers. Alternatively, the structure of FIG. 10M may represent the final metal interconnect layer in an integrated circuit. It is to be appreciated that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

One or more embodiments described herein are directed to previous layer self-aligned via and plug patterning. The self-aligned aspect of the processes described herein may be based on a directed self-assembly (DSA) mechanism, as described in greater detail below. However, it is to be appreciated that selective growth mechanisms may be employed in place of, or in combination with, DSA-based approaches. In an embodiment, processes described herein enable realization of self-aligned metallization for back-end of line feature fabrication.

FIGS. 11A-11M illustrate portions of integrated circuit layers representing various operations in a method of self-aligned via and metal patterning, in accordance with an embodiment of the present disclosure. In each illustration at each described operation, plan views are shown on the left-hand side, and corresponding cross-sectional views are shown on the right-hand side. These views will be referred to herein as corresponding cross-sectional views and plan views.

Figure 11A:
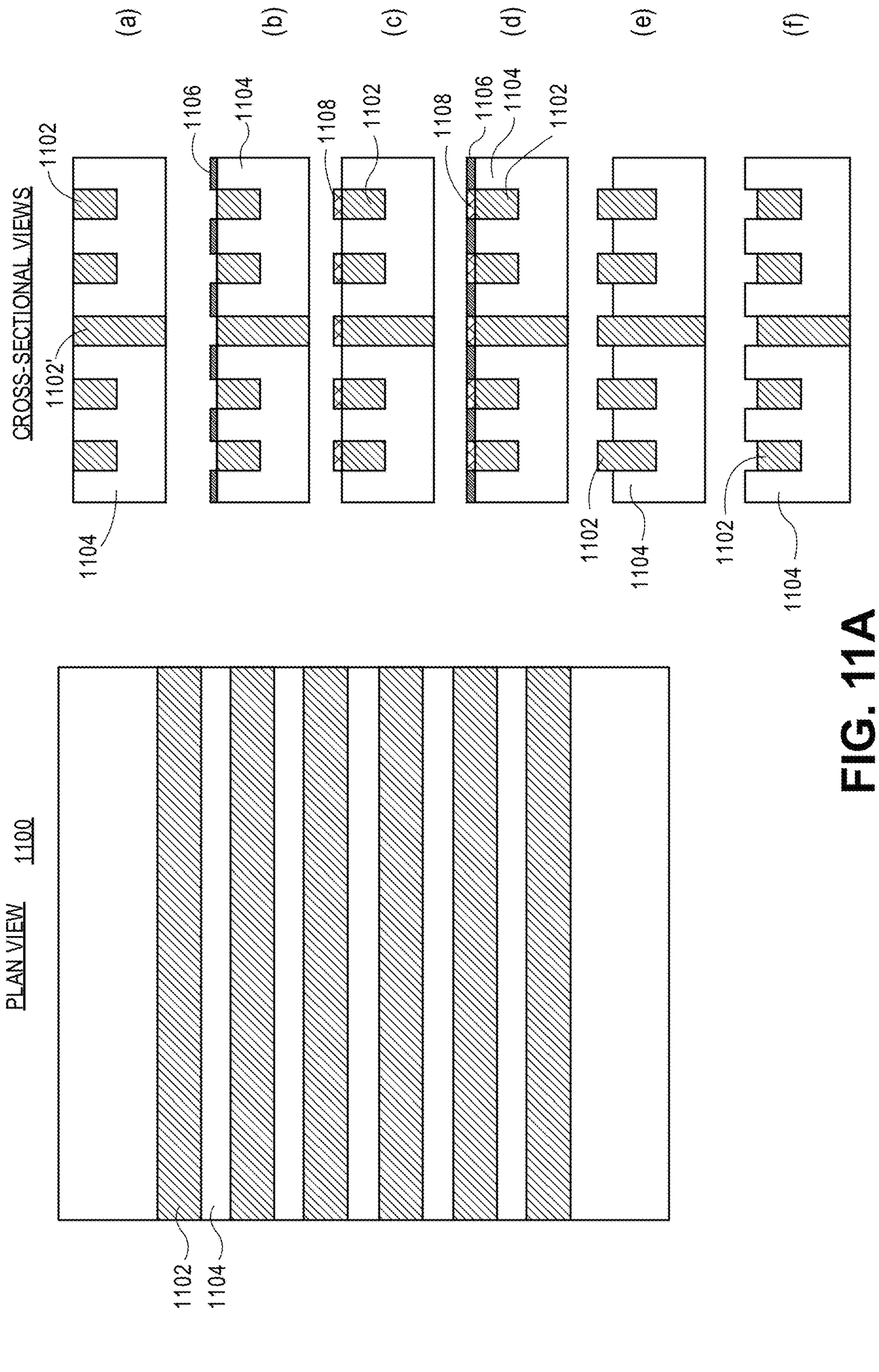
FIGS. 11A-11M illustrate portions of integrated circuit layers representing various operations in a method of self-aligned via and metal patterning, in accordance with an embodiment of the present disclosure.

FIG. 11A illustrates a plan view and corresponding cross-sectional views of options for a previous layer metallization structure, in accordance with an embodiment of the present disclosure. Referring to the plan view and corresponding cross-section view option (a), a starting structure 1100 includes a pattern of metal lines 1102 and interlayer dielectric (ILD) lines 1104. The starting structure 1100 may be patterned in a grating-like pattern with metal lines spaced at a constant pitch and having a constant width, as is depicted in FIG. 11A if self-assembling materials are being used. If a directed selective growth technique is used, then the underlying pattern does not have to be a single pitch or width. The pattern, for example, may be fabricated by a pitch halving or pitch quartering approach. Some of the lines may be associated with underlying vias, such as line 1102' shown as an example in the cross-sectional views.

Referring again to FIG. 11A, alternative options (b)-(f) address situations where an additional film is formed (e.g., deposited, grown, or left as an artifact remaining from a previous patterning process) on a surface of one of, or both of, the metal lines 1102 and interlayer dielectric lines 1104. In example (b), an additional film 1106 is disposed on the interlayer dielectric lines 1104. In example, (c), an additional film 1108 is disposed on the metal lines 1102. In example, (d) an additional film 1106 is disposed on the interlayer dielectric lines 1104, and an additional film 1108 is disposed on the metal lines 1102. Furthermore, although the metal lines 1102 and the interlayer dielectric lines 1104 are depicted as co-planar in (a), in other embodiments, they are not co-planar. For example, in (e), the metal lines 1102 protrude above the interlayer dielectric lines 1104. In example, (f), the metal lines 1102 are recessed below the interlayer dielectric lines 1104.

Referring again to examples (b)-(d), an additional layer (e.g., layer 1106 or 1108) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

Figure 11B:
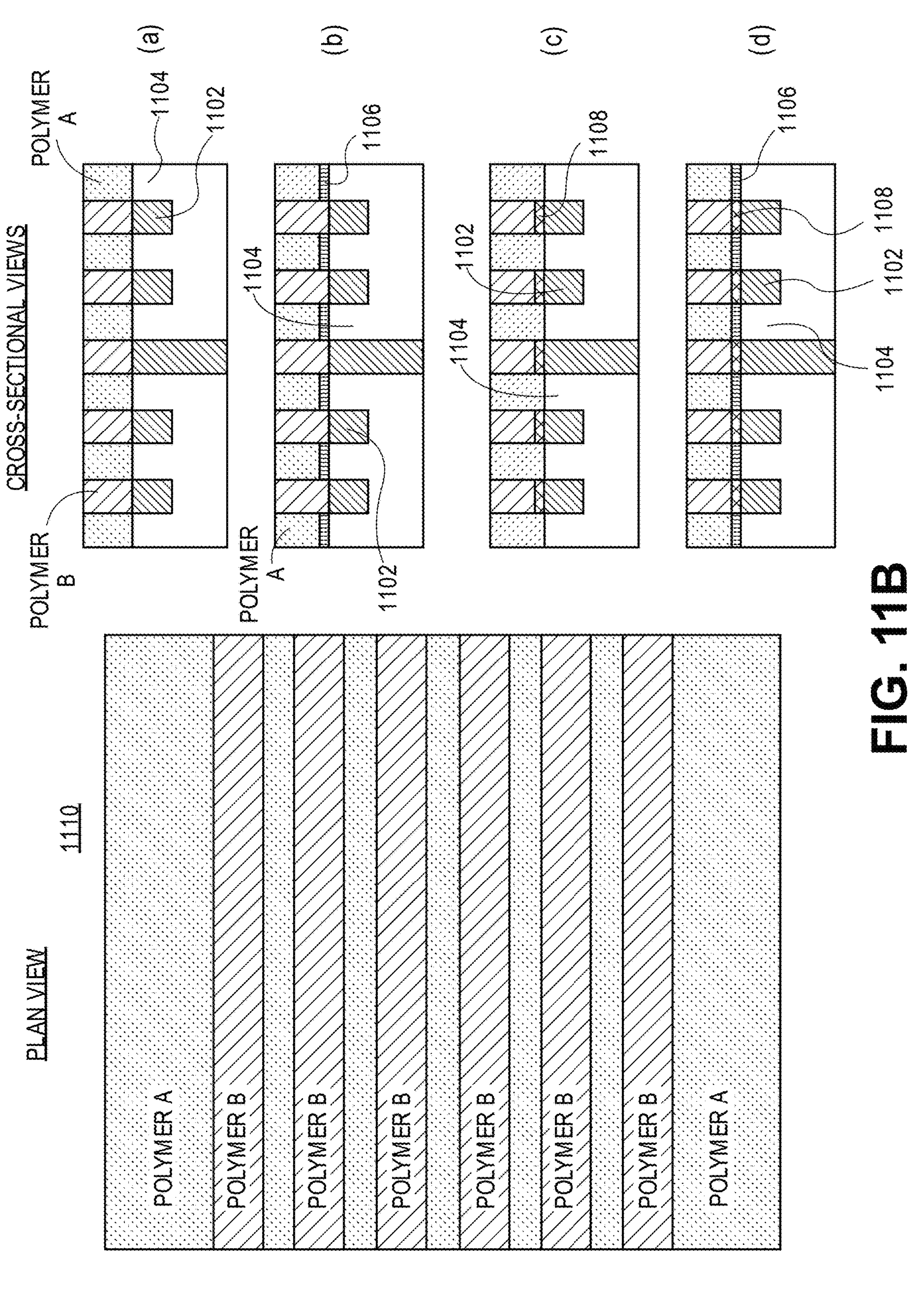

FIG. 11B illustrates a plan view and corresponding cross-sectional views of options for directed self-assembly (DSA) growth on an underlying metal/ILD grating (e.g., on a structure such as shown in FIG. 11A), in accordance with an embodiment of the present disclosure. Referring to the plan view, the structure 1110 includes a layer with alternating polymers or alternating polymer components. For example, as shown, Polymer A (or polymer component A) is formed on or above the interlayer dielectric (ILD) lines 1104 of FIG. 11A, while Polymer B (or polymer component B) is formed on or above the metal lines 1102 of FIG. 11A. Referring to the cross-sectional views, in (a) Polymer A (or polymer component A) is formed on the ILD lines 1104, and Polymer B (or polymer component B) is formed on the metal lines 1102. In (b), Polymer A (or polymer component A) is formed on an additional film 1106 formed on the ILD lines 1104, while Polymer B (or polymer component B) is formed on the metal lines 1102. In (c), Polymer A (or polymer component A) is formed on the ILD lines 1104, while Polymer B (or polymer component B) is formed on an additional film 1108 formed on the metal lines 1102. In (d), Polymer A (or polymer component A) is formed on an additional film 1106 formed on the ILD lines 1104, and Polymer B (or polymer component B) is formed on an additional film 1108 formed on the metal lines 1102.

Referring again to FIG. 11B, in an embodiment, once the surface of the underlying structure (e.g., structure 1100 of FIG. 11A) has been prepared, a 50-50 diblock copolymer, such as polystyrene-polymethyl methacrylate (PS-PMMA), is coated on the substrate and annealed to drive self-assembly, leading to the Polymer A/Polymer B layer of structure 1110 of FIG. 11B. In one such embodiment, with appropriate surface energy conditions, the block copolymers segregate based on the underlying material of structure 1100. For example, in a specific embodiment, polystyrene aligns selectively to the underlying metal lines 1102 (or corresponding metal line cap or hardmask material). Meanwhile, the polymethyl methacrylate aligns selectively to the ILD lines 1104 (or corresponding metal line cap or hardmask material).

Thus, in an embodiment, the underlying metal and ILD grid is recreated in the block co-polymer (BCP, i.e., Polymer A/Polymer B). This can particularly be so if the BCP pitch is commensurate with the underlying grating pitch. The polymer grid (Polymer A/Polymer B) is, in one embodiment, robust against certain small deviations from a highly well-aligned grid. For example, if small plugs effectively place an oxide or like material where a highly well-aligned grid would have metal, a highly well-aligned Polymer A/Polymer B grid can still be achieved. However, since the ILD lines grating is, in one embodiment, an idealized grating structure, with no metal disruptions of the ILD backbone, it may be necessary to render the ILD surface neutral since both types of polymer (A and B) will, in such an instance, be exposed to ILD like material while only one type is exposed to metal.

In an embodiment, the thickness of the coated polymer (Polymer A/B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer (A/B) can be important since it may be used to define the ultimate thickness of a subsequently formed permanent ILD layer. That is, in one embodiment, the polymer grating shown in FIG. 11B is eventually replaced with an ILD grating of roughly the same thickness.

In an embodiment, as mentioned above, the grid of Polymer A/Polymer B of FIG. 2 is a block copolymer. In one such embodiment, the block copolymer molecule is one such as described above in association with FIG. 10D. In an embodiment, by way of a first example (as shown in FIG. 11B), in two block copolymers, if the blocks are approximately the same length, a grid like pattern of alternating Polymer A lines and Polymer B lines is generated. In another embodiment, by way of a second example (not shown), in two block copolymers, if one of the blocks is longer than the other, but not too much longer than the other, vertical columnar structures may be formed. In the columnar structures, the block copolymer molecules may align with their shorter polymer blocks microphase separated into the interior of the columns and their longer polymer blocks extending away from the columns and surrounding the columns. For example, if the block of Polymer A were longer than the block of Polymer B, but not too much longer, columnar structures may formed in which many block copolymer molecules align with their shorter blocks of Polymer B forming columnar structures surrounded by a phase having the longer blocks of Polymer A. When this occurs in an area of sufficient size, a two-dimensional array of generally hexagonally-packed columnar structures may be formed.

In an embodiment, the Polymer A/Polymer B grating is first applied as an unassembled block copolymer layer portion that includes a block copolymer material applied, e.g., by brush or other coating process, as described above in association with FIG. 10D. In such embodiment, an annealing treatment is applied to an unassembled block copolymer in order to initiate, accelerate, increase the quality of, or otherwise promote microphase separation and/or self-assembly, as described above in association with FIG. 10D.

Figure 11C:
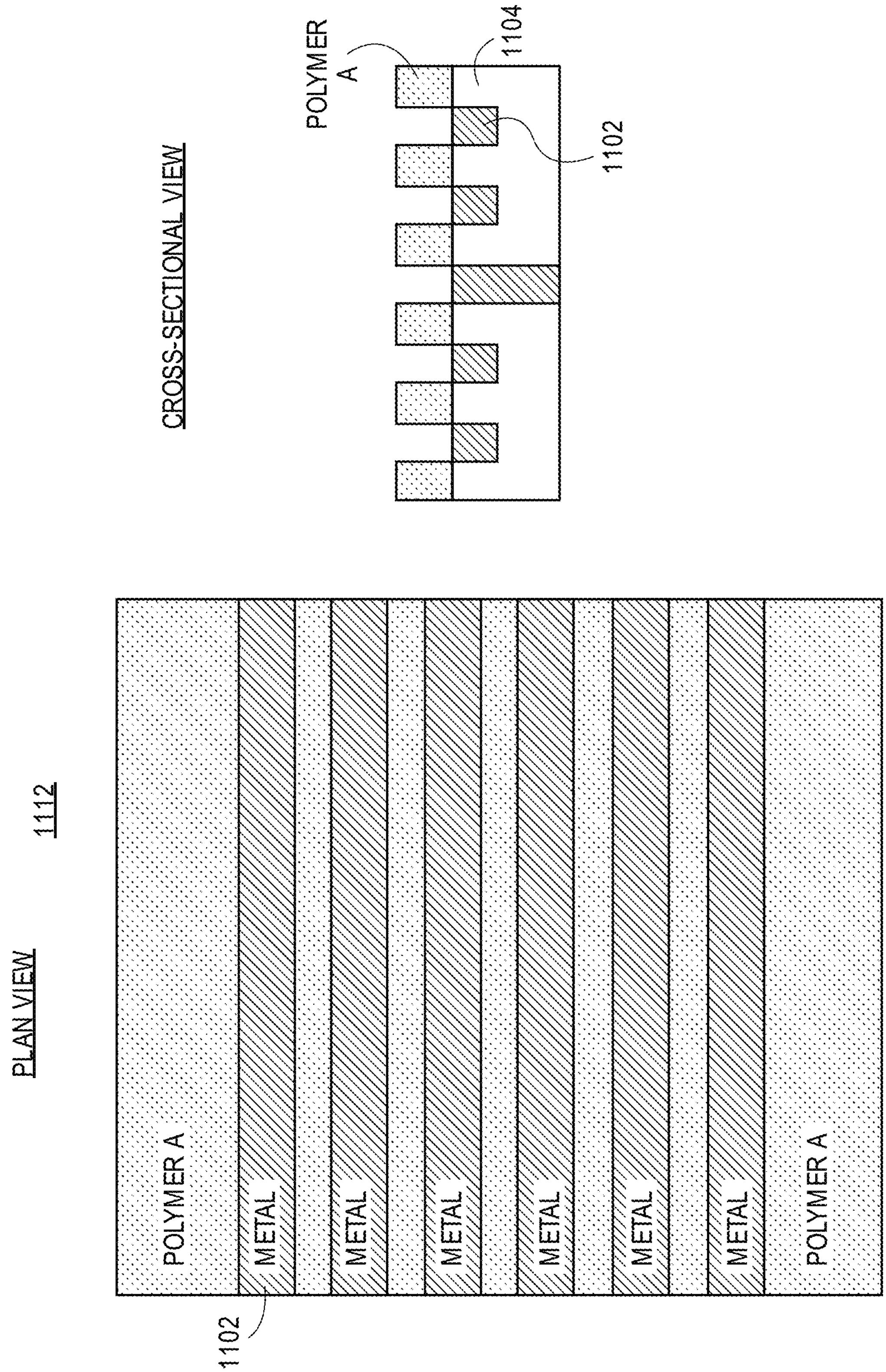

FIG. 11C illustrates a plan view and corresponding cross-sectional view of the structure of FIG. 11B following removal of one species of polymer, in accordance with an embodiment of the present disclosure. Referring to FIG. 11C, Polymer B is removed to re-expose the metal lines 1102 (or hardmask or cap layers formed on the metal lines 1102), while Polymer A is retained in the ILD lines 1104, forming structure 1112. In an embodiment, a deep ultraviolet (DUV) flood expose followed by a wet etch or a selective dry etch is used to selectively remove Polymer B. It is to be appreciated that, instead of first removal of the polymer from the metal lines 1102 (as depicted), removal from the ILD lines may instead be first performed.

Figure 11D:
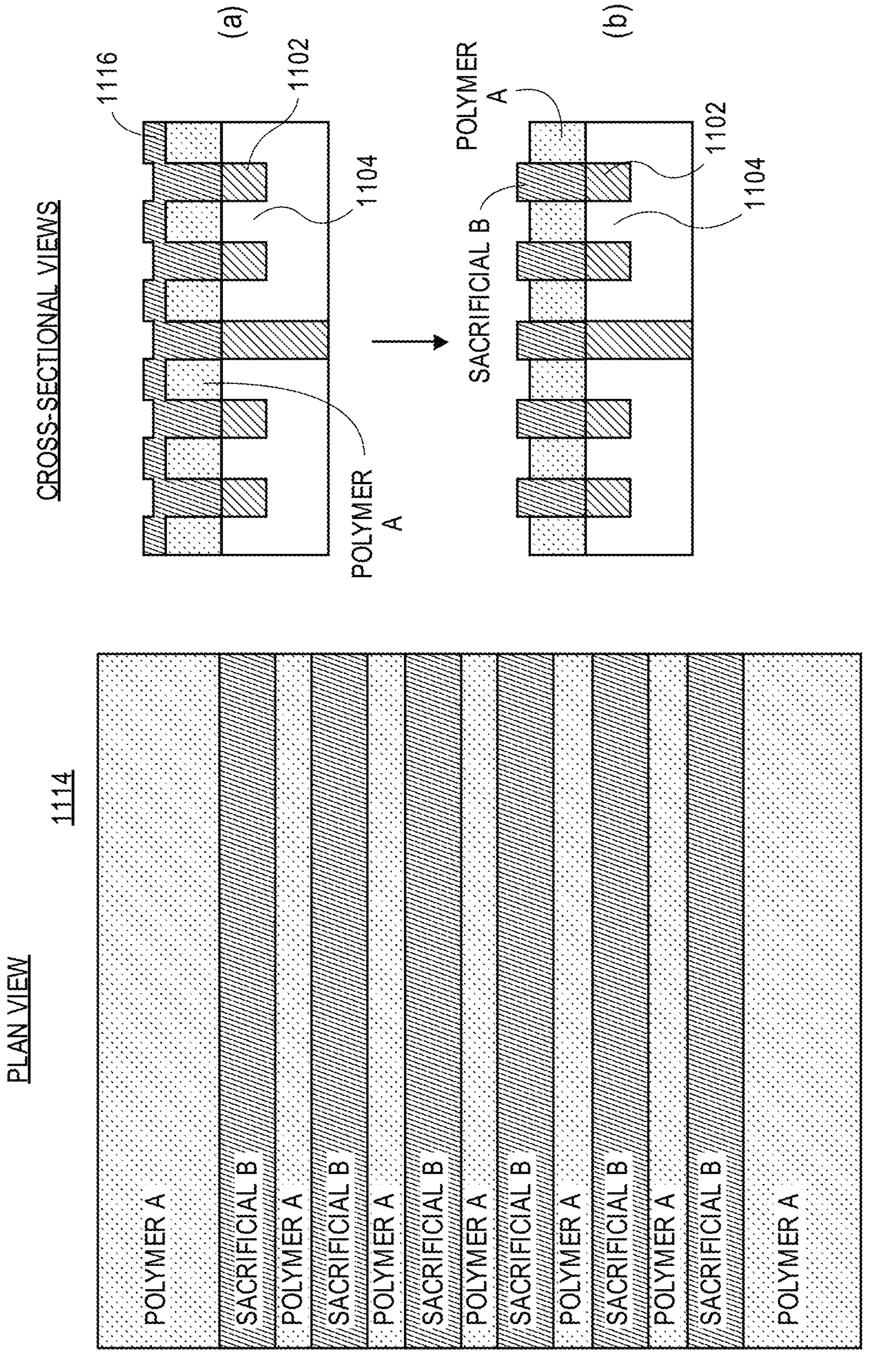

FIG. 11D illustrates a plan view and corresponding cross-sectional views of the structure of FIG. 11C following formation of a sacrificial material layer over the metal lines 1102, in accordance with an embodiment of the present disclosure. Referring to the plan view and corresponding cross-sectional view (b), structure 1114 includes a Sacrificial B layer formed above or on the metal lines 1102 and between the Polymer A lines which are above or on the ILD lines 1104. In an embodiment, referring to cross-sectional view (a), a low temperature deposition fills trenches between Polymer A lines, e.g., with an oxide (e.g., $TiO_x$) or other sacrificial material as a conformal layer 1116. The conformal layer 1116 is then confined to regions above metal lines 1102 by a dry etch or chemical mechanical planarization (CMP) process. The resulting layer is referred to herein as Sacrificial B, since in some embodiments the material is ultimately replaced with a permanent ILD material. However, in other embodiments, it is to be appreciated that a permanent ILD material may instead be formed at this stage. In the case that a sacrificial material is used, in an embodiment, the sacrificial material has the requisite deposition properties, thermal stability, and etch selectivity to other materials used in the process.

Figure 11E:
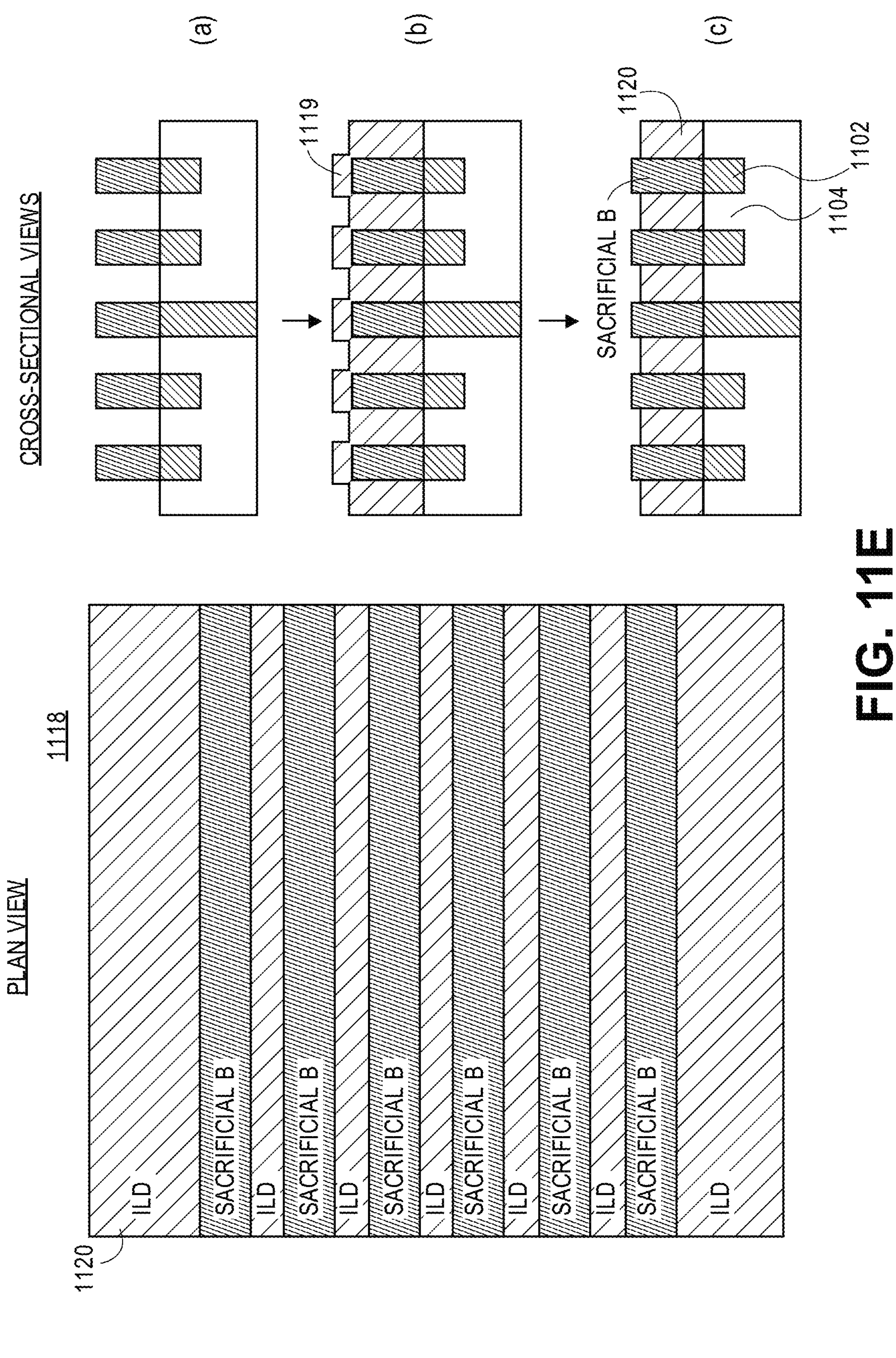

FIG. 11E illustrates a plan view and corresponding cross-sectional views of the structure of FIG. 11D following replacement of Polymer A with a permanent interlayer dielectric (ILD) material, in accordance with an embodiment of the present disclosure. Referring to the plan view and corresponding cross-sectional view (c), structure 1118 includes permanent interlayer dielectric (ILD) lines 1120 on or above the ILD lines 1104 and between the Sacrificial B material lines. In an embodiment, as depicted in cross-sectional view (a), the Polymer A lines are removed. Then, referring to cross-sectional view (b), an ILD material layer 1119 is formed conformally over the resulting structure. The conformal layer 1119 is then confined to regions above the ILD lines 1104 by a dry etch or chemical mechanical planarization (CMP) process. In an embodiment, the structure 1118 effectively replaces the polymer (A/B) grating of FIG. 11B with a very thick material grating (e.g., permanent ILD 1120 and Sacrificial B) commensurate with the underlying metal grating and aligned with the underlying grating. The two different materials may be used to ultimately define possible locations for plugs and vias, as described in greater detail below.

Figure 11F:
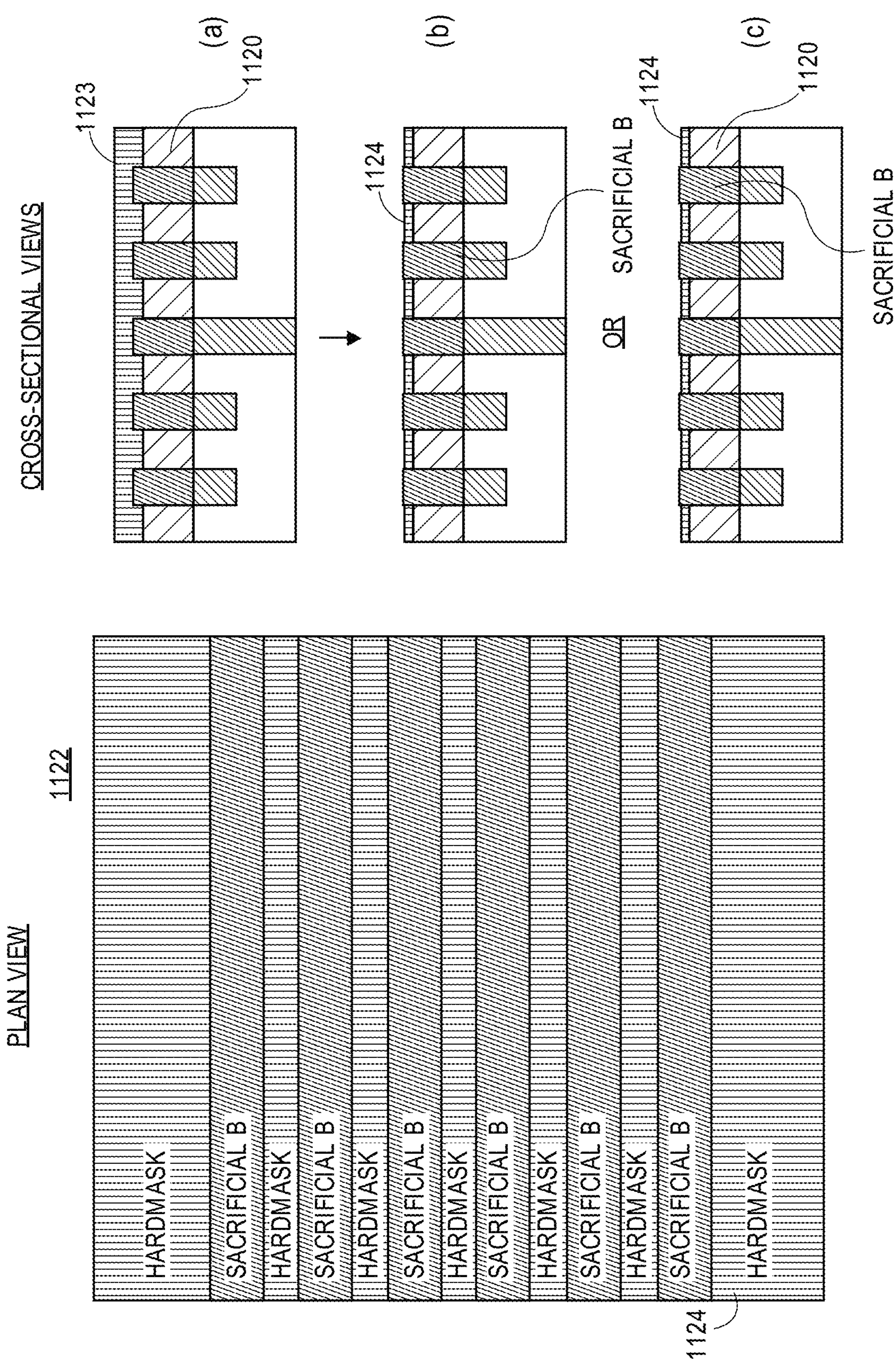

FIG. 11F illustrates a plan view and corresponding cross-sectional views of the structure of FIG. 11E following selective hardmask formation on the permanent ILD lines, in accordance with an embodiment of the present disclosure. Referring to the plan view and corresponding cross-sectional view (c), structure 1122 includes a hardmask layer 1124 formed on the permanent interlayer dielectric (ILD) lines 1120. In one embodiment, referring to cross-sectional view (c), a selective growth process is used to form hardmask layer 1124 as confined to the surfaces of the permanent ILD lines 1120. In another embodiment, a conformal material layer 1123 is first formed (cross-sectional view (a)) on a structure having recessed permanent ILD lines 1120. The conformal layer 1123 is then subjected to a timed etch and or CMP process to form hardmask layer 1124 (cross-sectional view (b)). In the latter case, the ILD lines 1120 are recessed relative to the Sacrificial B material and then a non-conformal (planarizing) hardmask 1123 is deposited on the resulting grating. The material 1123 is thinner on Sacrificial B lines than on the recessed ILD lines 1120 such that a timed etch of the hardmask or a polish operation removes the material 1123 selectively from the Sacrificial B material.

Figure 11G:
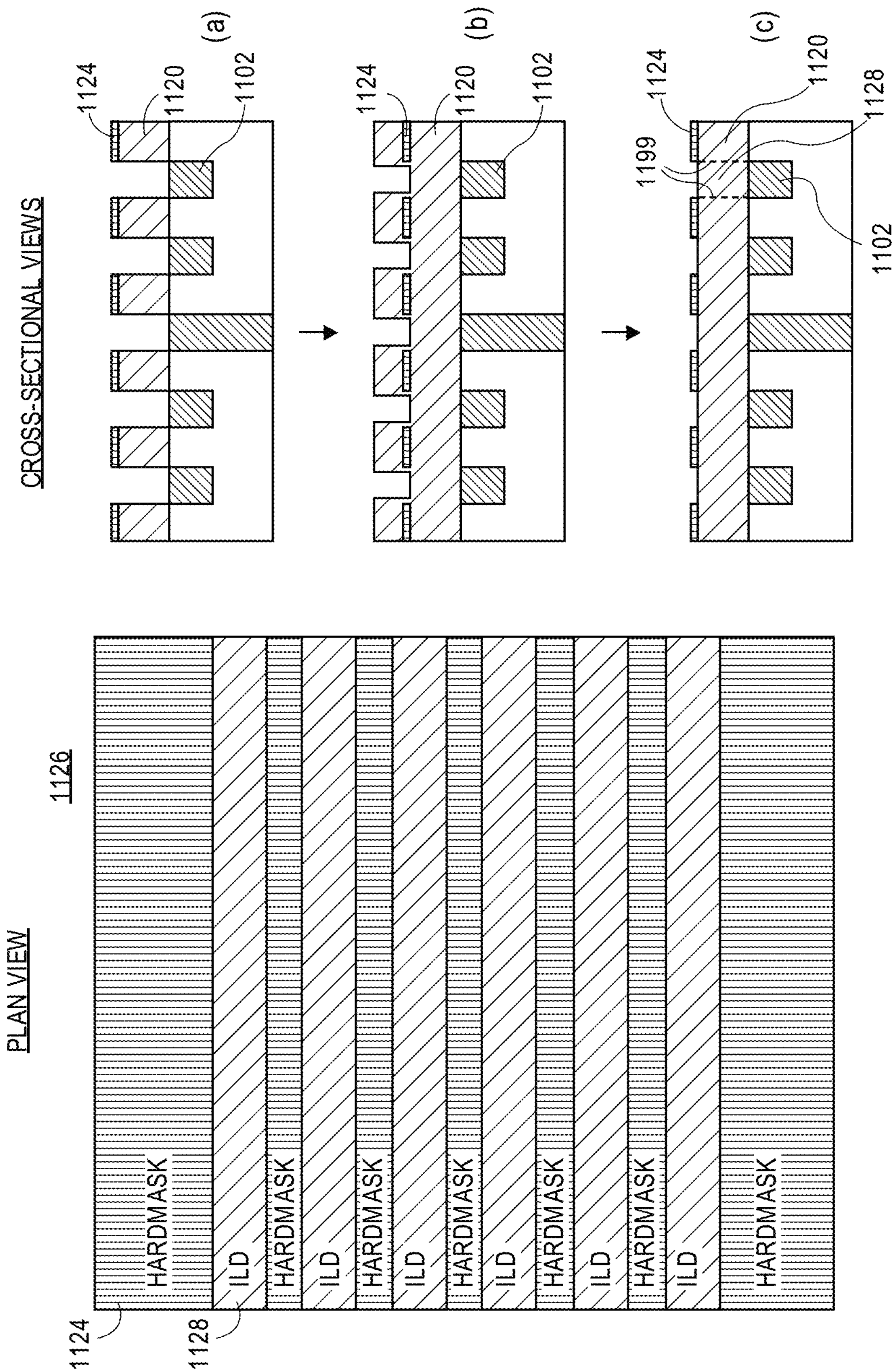

FIG. 11G illustrates a plan view and corresponding cross-sectional views of the structure of FIG. 11F following removal of Sacrificial B lines and replacement with permanent ILD lines 1128, in accordance with an embodiment of the present disclosure. Referring to the plan view and corresponding cross-sectional view (c), structure 1126 includes permanent ILD lines 1128 in place of the Sacrificial B lines of FIG. 11F, i.e., above and in alignment with the metal lines 1102. In an embodiment, the Sacrificial B material is removed (cross-sectional view (a)) and replaced with permanent ILD lines 1128 (cross-sectional view (c)), e.g., by deposition of a conformal layer and subsequent timed etch or CMP processing (cross-sectional view (b)). In an embodiment, the resulting structure 1126 includes a uniform ILD material (permanent ILD lines 1120+permanent ILD lines 1128) where the locations of all possible plugs are covered in hardmask 1124 and all possible vias are in areas of exposed permanent ILD lines 1128. In one such embodiment, permanent ILD lines 1120 and permanent ILD lines 1128 are composed of a same material. In another such embodiment, permanent ILD lines 1120 and permanent ILD lines 1128 are composed of different ILD materials. In either case, in a specific embodiment, a distinction such as a seam between the materials of permanent ILD lines 1120 and permanent ILD lines 1128 may be observed in the final structure 1126. Exemplary seams 1199 are shown in FIG. 11F for illustrative purposes.

Figure 11H:
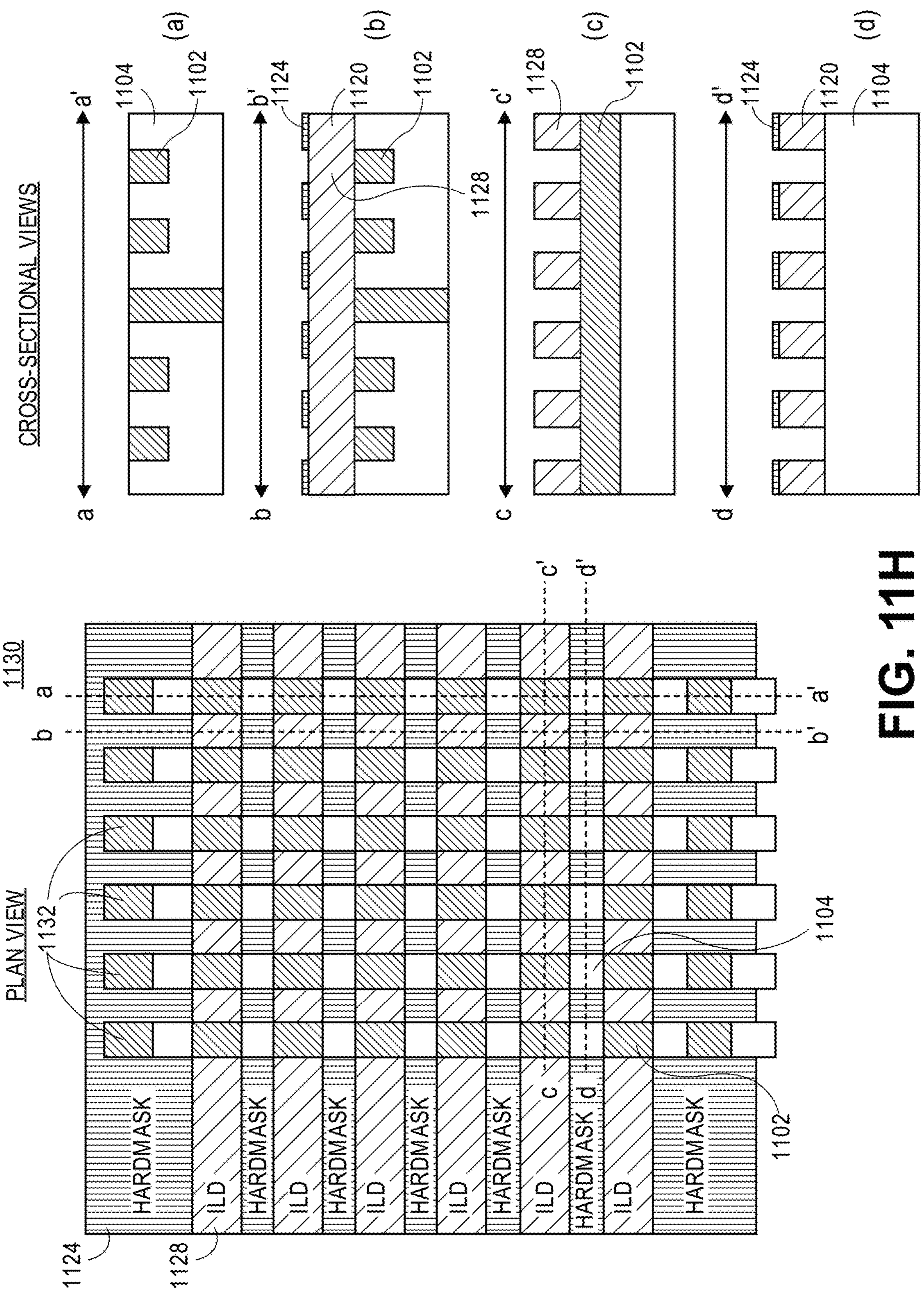

FIG. 11H illustrates a plan view and corresponding cross-sectional views of the structure of FIG. 11G following trench formation (e.g., grating definition), in accordance with an embodiment of the present disclosure. Referring to the plan view and corresponding cross-sectional views (a)-(d) taken along axes, a-a', b-b', c-c' and d-d', respectively, a grating in structure 1130 for ultimately defining regions between a pattern of metal lines is defined by forming trenches 1132 in the structure of FIG. 11G, perpendicular to the grating of FIG. 11G. In an embodiment, the trenches 1132 are formed by patterning and etching a grating pattern into the sacrificial grating of earlier structures. In one embodiment, a grid is formed, effectively, defining the location of all spaces between ultimately formed metal lines along with all plugs and vias simultaneously. In an embodiment, the trenches 1132 reveal portions of underlying ILD lines 1104 and metal lines 1102.

Figure 11I:
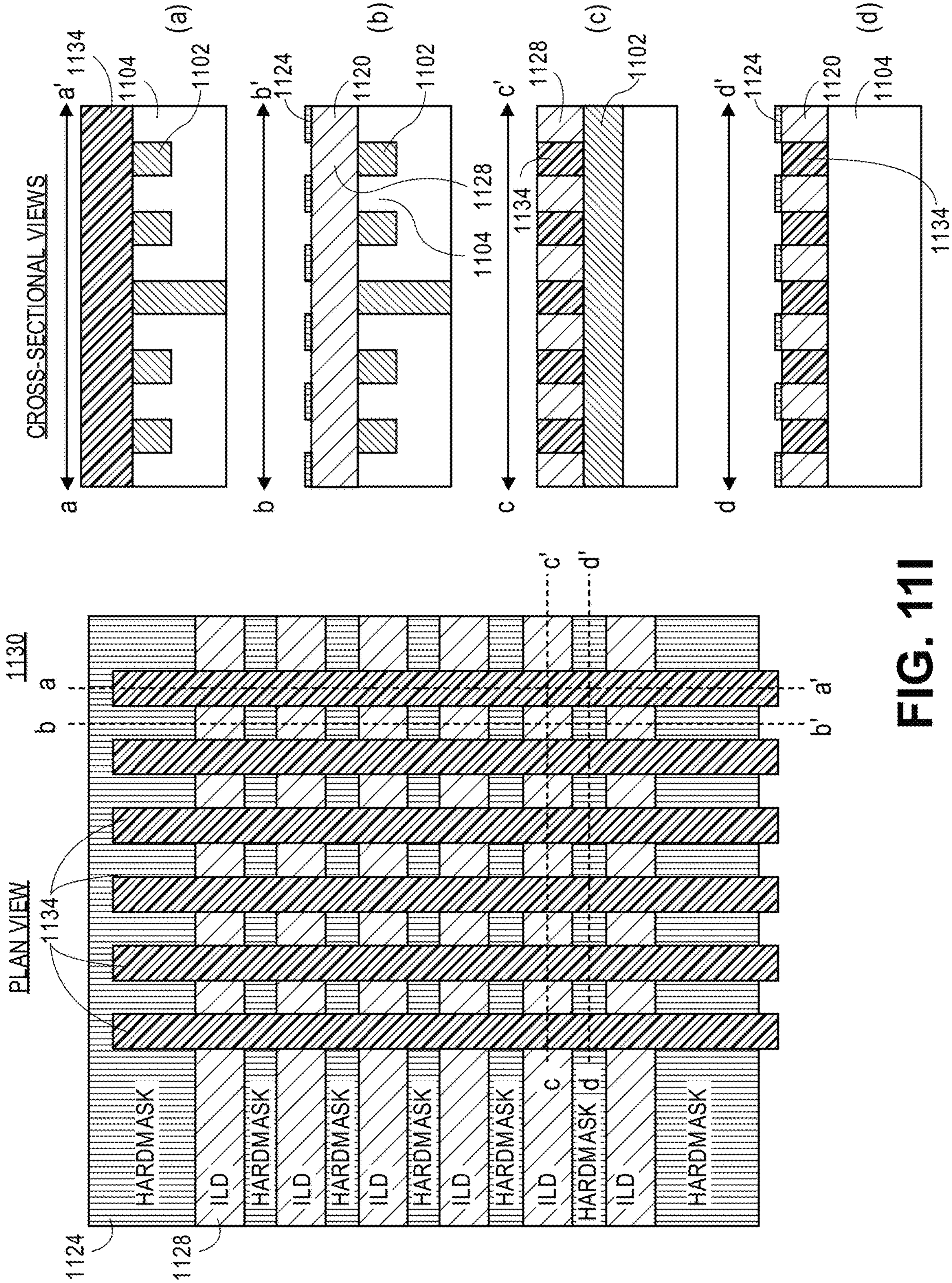

FIG. 11I illustrates a plan view and corresponding cross-sectional views of the structure of FIG. 11H following formation of a sacrificial material grating in the trenches of FIG. 11H, in accordance with an embodiment of the present disclosure. Referring to the plan view and corresponding cross-sectional views (a)-(d) taken along axes, a-a', b-b', c-c' and d-d', respectively, a material layer 1134, which is an interlayer dielectric layer or sacrificial layer is formed in the trenches 1132 of the structure of FIG. 11H. In an embodiment, the material layer 1134 is formed by conformal deposition and subsequent timed etch or CMP with permanent ILD material or a sacrificial layer (e.g., which can be later removed if an air gap is to be fabricated). In the former case, the material layer 1134 ultimately becomes ILD material between subsequently formed parallel metal lines on a same metal layer. In the latter case, the material may be referred to as Sacrificial C material, as depicted. In one embodiment, material layer 1134 has a high etch selectivity to other ILD material and to the hardmask layer 1128.

Figure 11J:
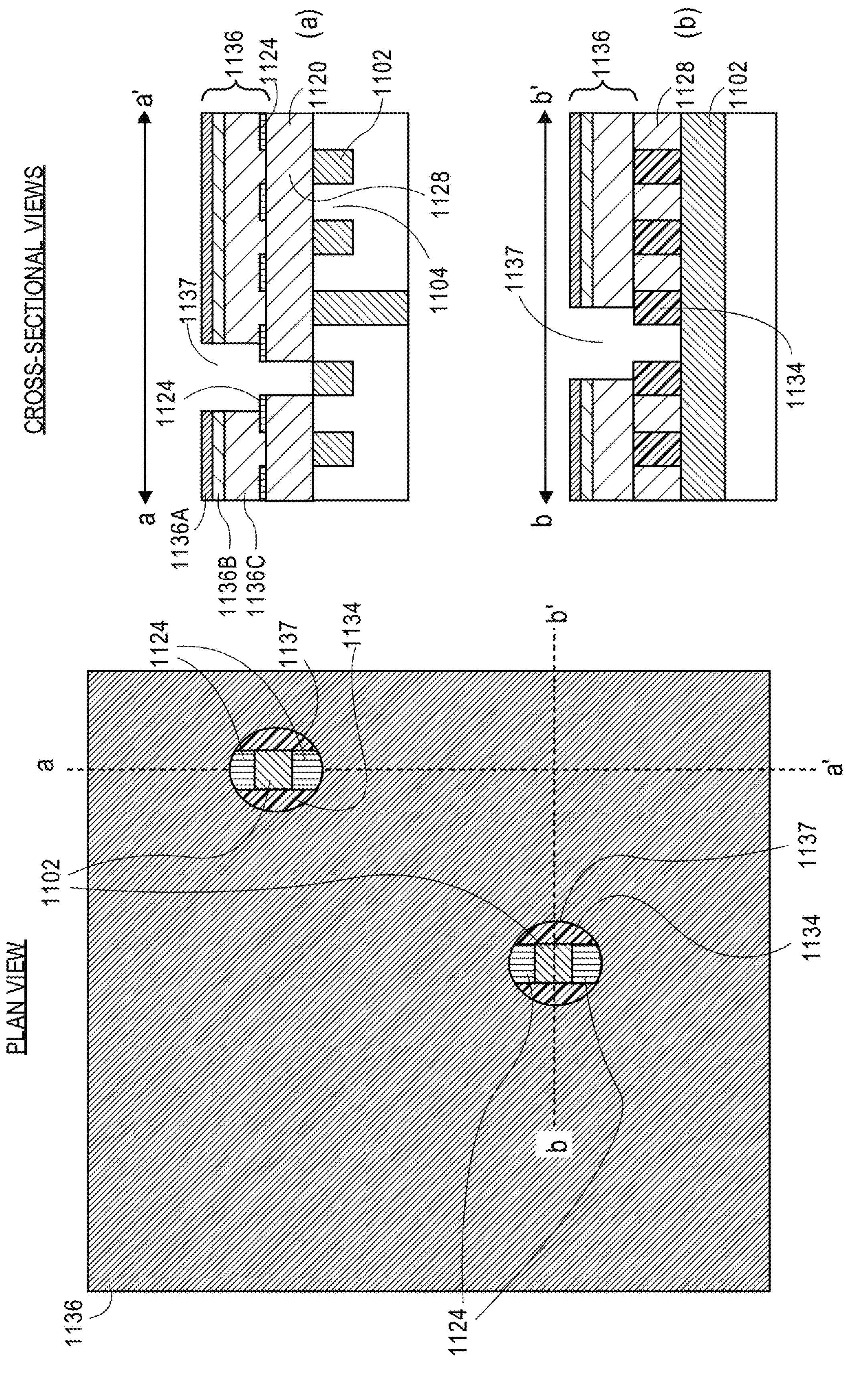

FIG. 11J illustrates a plan view and corresponding cross-sectional views of the structure of FIG. 11I following formation and patterning of a mask and subsequent etching of via locations, in accordance with an embodiment of the present disclosure. Referring to the plan view and corresponding cross-sectional views (a) and (b) taken along axes, a-a' and b-b', respectively, a mask 1136 is formed on the structure of FIG. 11I. The mask is patterned, e.g., by a lithographic process, to have openings 1137 formed therein. In an embodiment, the openings are determined based on desired via patterning. That is, at this stage, all possible vias and plugs (e.g., as placeholders) have been patterned and are self-aligned to the ultimate metal layers above and below. Here, a subset of the vias and plug locations is selected for preservation, as are locations for etching metal line positions. In one embodiment, an ArF or EUV or ebeam resist is used to cut or select the vias to be etched, i.e., at locations of the exposed portions of metal lines 1102. It is to be appreciated that the hardmask 1124 and the material layer 1134 act as the actual etch masks which determine the shape and position of the vias. The mask 1136 merely serves to block the remaining vias from being etched. As such, tolerance on opening 1137 size is relaxed since the surrounding materials (e.g., hardmask 1124 and material layer 1134) of the selected via locations (i.e., the portion of openings 1137 directly above the exposed portions of the metal lines 1102) are resistant to the etch process used to remove the ILD line 1128 above the selected portions of the metal lines 1102 for ultimate via fabrication. In one embodiment, the mask 1136 is composed of a topographic masking portion 1136C, an anti-reflective coating (ARC) layer 1136B, and a photoresist layer 1136A. In a particular such embodiment, the topographic masking portion 136C is a carbon hardmask (CHM) layer and the anti-reflective coating layer 136B is a silicon ARC layer.

Figure 11K:
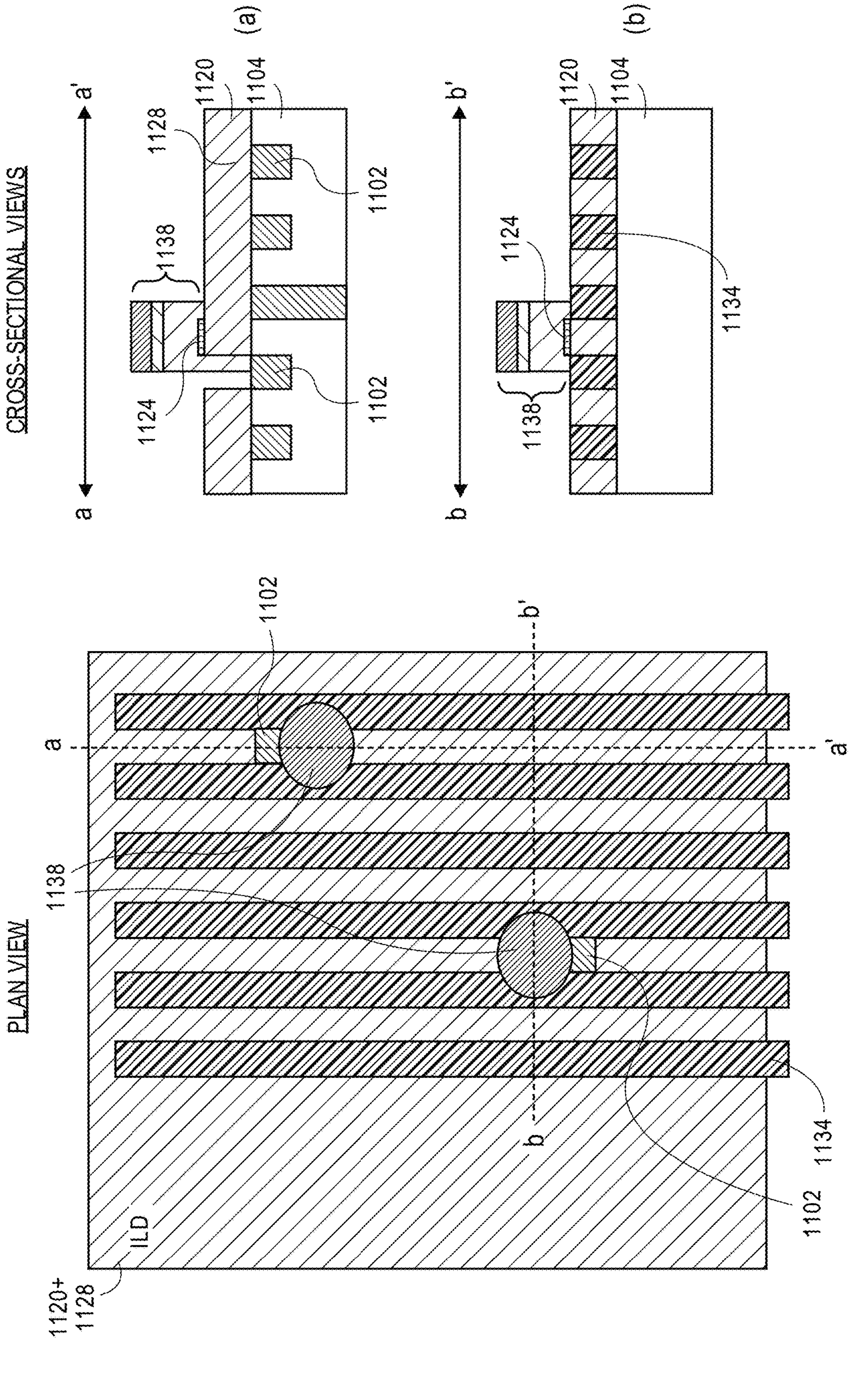

FIG. 11K illustrates a plan view and corresponding cross-sectional views of the structure of FIG. 11J following mask and hardmask removal and subsequent plug patterning and etch, in accordance with an embodiment of the present disclosure. Referring to the plan view and corresponding cross-sectional views (a) and (b) taken along axes, a-a' and b-b', respectively, the mask 1136 shown in FIG. 11J is removed following via location patterning. Subsequently, a second mask 1138 is formed and patterned to cover selected plug locations. Specifically, in an embodiment, and as depicted in FIG. 11K, portions of hardmask 1124 are preserved in locations where plugs will ultimately be formed. That is, at this stage, all possible plugs in the form of hardmask plugs exist. The patterning operation of FIG. 11K serves to remove all hardmask 1124 portions except those selected for plug preservation. The patterning effectively exposes a substantial portion of ILD lines 1120 and 1128, e.g., as a unified dielectric layer.

Figure 11L:
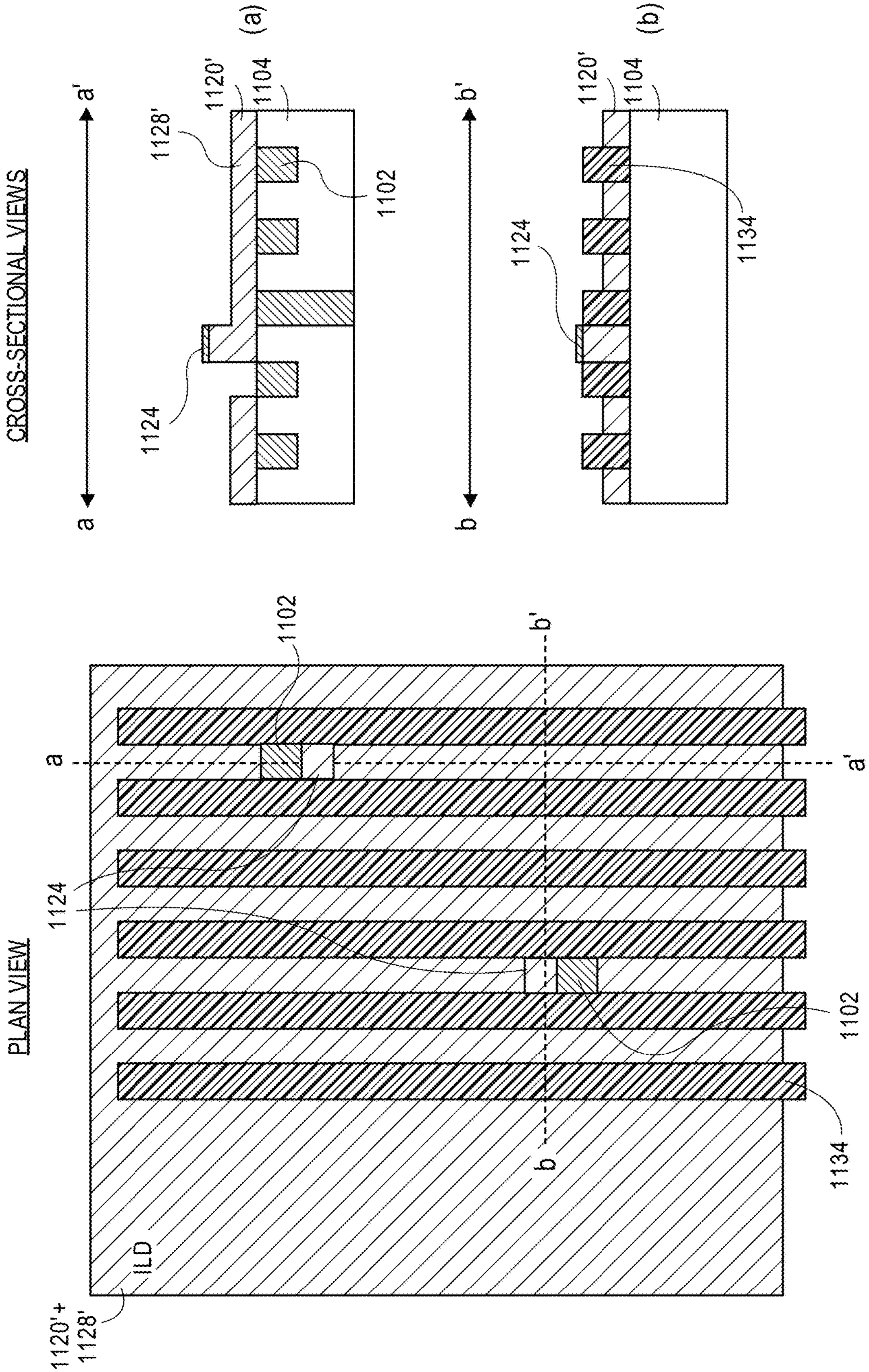

FIG. 11L illustrates a plan view and corresponding cross-sectional views of the structure of FIG. 11K following mask removal and metal line trench etch, in accordance with an embodiment of the present disclosure. Referring to the plan view and corresponding cross-sectional views (a) and (b) taken along axes, a-a' and b-b', respectively, the mask 1138 shown in FIG. 11K is removed following via location patterning. Subsequently, a partial etch of the exposed portions of ILD lines 1120 and 1128 is performed to provide recessed ILD lines 1120' and 1128'. The extent of recess may be based on a timed etch process, as targeted to a depth of a desired metal line thickness. The portions of ILD lines 1120 protected by the preserved hardmask 1124 portions are not recessed by the etch, as depicted in FIG. 11L. Additionally, the material layer 1134 (which may be a sacrificial material or a permanent ILD material) is also not etched or recessed. It is to be appreciated that no lithography operation is needed for the process illustrated by FIG. 11L since the vias locations (at exposed portions of metal lines 1102) have already been etched and the plugs (at locations where hardmask 1124 was preserved).

Figure 11M:
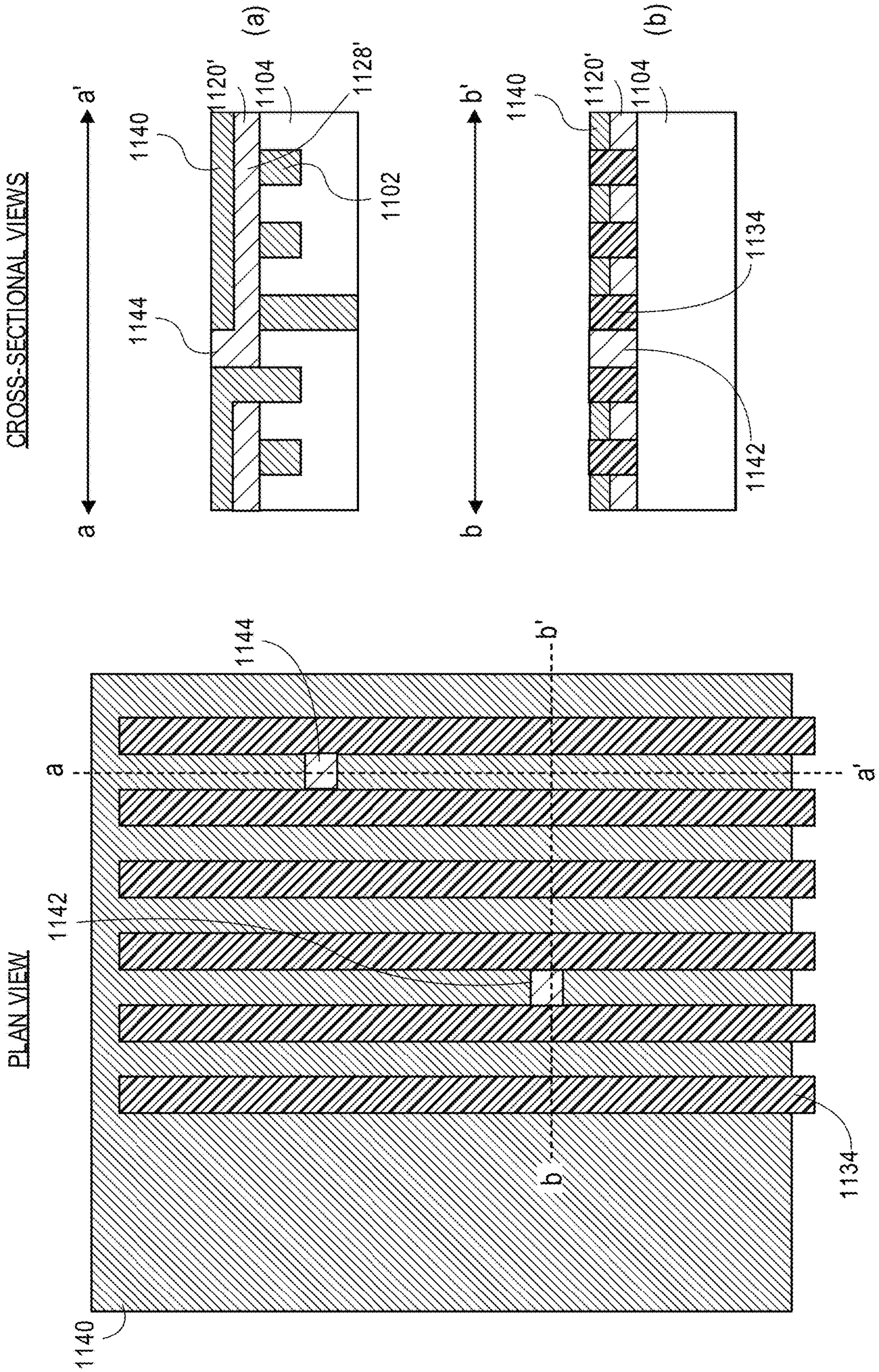

FIG. 11M illustrates a plan view and corresponding cross-sectional views of the structure of FIG. 11L following metal line deposition and polish, in accordance with an embodiment of the present disclosure. Referring to the plan view and corresponding cross-sectional views (a) and (b) taken along axes, a-a' and b-b', respectively, metal for forming metal interconnect lines is formed conformally above the structure of FIG. 11L. The metal is then planarized, e.g., by CMP, to provide metal lines 1140. The metal lines are coupled with underlying metal lines through the predetermined via locations, and are isolated by the preserved plugs 1142 and 1144. The metal (e.g., copper and associated barrier and seed layers) deposition and planarization process may be that of standard BEOL dual damascene processing. It is to be appreciated that, in subsequent fabrication operations, the material layer lines 1134 may be removed to provide air gaps between the resulting metal lines 1140.

The structure of FIG. 11M may subsequently be used as a foundation for forming subsequent metal line/via and ILD layers. Alternatively, the structure of FIG. 11M may represent the final metal interconnect layer in an integrated circuit. It is to be appreciated that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

In accordance with an embodiment of the present disclosure, self-aligned DSA tri-block bottom-up approaches are described. One or more embodiments described herein are directed to triblock copolymers for self-aligning vias or contacts. Through the use of more advanced block copolymers and a directed self-assembly strategy, alignment to an underlying tight metal layer can be achieved. Embodiments described herein may be implemented to improve cost, scalability, pattern placement error, and variability.

In general, one or more embodiments described herein involves the use of the three phases of a triblock copolymer material to effect phase separation into "self-aligned photobuckets," e.g., the use of a self-aligning triblock copolymer to generate aligned photobuckets is described. Additional embodiments directed at the fabrication and use of photobuckets is described in greater detail below in embodiments beyond the present embodiments of FIGS. 12A-12K. It is also to be appreciated, however, that embodiments are not limited to the concept of photobuckets, but have far reaching applications to structures having pre-formed features fabricated using bottom-up and/or directed self-assembly (DSA) approach.

Figures 12A, 12B, 12C:
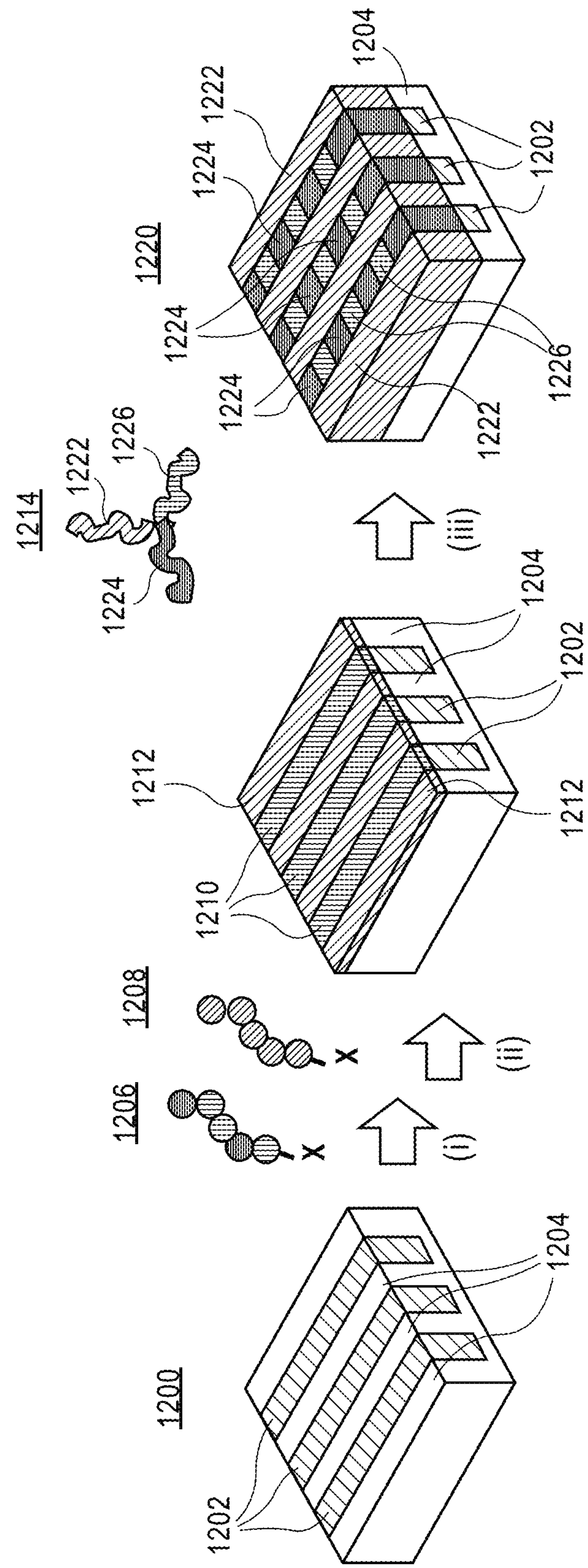
FIGS. 12A-12C illustrate angled cross-sectional views representing various operations in a method using triblock copolymers for forming self-aligning vias or contacts for back end of line (BEOL) interconnects, in accordance with an embodiment of the present disclosure.

FIGS. 12A-12C illustrate angled cross-sectional views representing various operations in a method using triblock copolymers for forming self-aligning vias or contacts for back end of line (BEOL) interconnects, in accordance with an embodiment of the present disclosure.

Referring to FIG. 12A, a semiconductor structure layer 1200 has a grating pattern of alternating metal lines 1202 and interlayer dielectric (ILD) lines 1204. The structure 1200 may be treated with a first molecular brush operation (i) with first molecular species 1206. The structure 1200 may also be treated with a second molecular brush operations (ii) with second molecular species 1208. It is to be appreciated that the order of operations (i) and (ii) may be reversed, or may even be performed at substantially the same time.

Referring to FIG. 12B, the molecular brush operations may be performed to alter or provide a derivative surface for the alternating metal lines 1202 and ILD lines 1204. For example, the surface of metal lines 1202 may be treated to have an A/B surface 1210 on metal lines 1202. The surface of ILD lines 1204 may be treated to have a C surface 1212 on ILD lines 1204.

Referring to FIG. 12C, the structure of FIG. 12B may be treated with a treatment operation (iii) which involves application of a triblock block copolymer (triblock BCP) 1214, and possible subsequent segregating treatment, to form a segregated structure 1220. Segregated structure 1220 includes first regions 1222 of a segregated triblock BCP above the ILD lines 1204. Alternating second regions 1224 and third regions 1226 of the segregated triblock BCP are above the metal lines 1202. The ultimate arrangement of the three blocks of the triblock copolymer 1214 is based on chemo-epitaxy since only an underlying pattern (and not a co-planar pattern, as is used in grapho-epitaxy) is used to direct the assembly of the triblock copolymer 1214 to form the segregated structure 1220.

Referring collectively to FIGS. 12A-12C, in an embodiment, a structure 1220 for directed self-assembly of a back end of line (BEOL) semiconductor structure metallization layer includes a substrate (not shown, but described below, and to be appreciated as being below ILD lines 1204 and metal lines 1202)). A lower metallization layer includes alternating metal lines 1202 and dielectric lines 1204 disposed above the substrate. A triblock copolymer layer 1214 is disposed above the lower metallization layer. The triblock copolymer layer includes a first segregated block component 1222 disposed over the dielectric lines 1204 of the lower metallization layer. The triblock copolymer layer includes alternating second 1224 and third 1226 segregated block components disposed over the metal lines 1202 of the lower metallization layer.

In an embodiment, the third segregated block 1226 component of the triblock copolymer layer 1214 is photosensitive. In an embodiment, the triblock copolymer layer 1214 is formed to a thickness approximately in the range of 5-100 nanometers. In an embodiment, the triblock copolymer layer 1214 includes a triblock copolymer species selected from the group consisting of any three of poly-styrene and other polyvinylarenes, polyisoprene and other polyolefins, polymethacrylate and other poly-esters, polydimethylsiloxane (PDMS) and related Si-based polymers, polyferrocenylsilanes, polyethyelene oxide (PEO) and related poly-ethers and poly-vinylpyridine. In one embodiment, the alternating second 1224 and third 1226 segregated block components have a ratio of approximately 1:1, as is depicted in FIG. 21C (and as is described below in association with FIG. 12H). In another embodiment, the alternating second 1224 and third 1226 segregated block components have a ratio of X:1, second segregated block component 1224 to third segregated block component 1226, where X is greater than 1, and where the third segregated block component 1226 has a columnar structure surrounded by the second segregated block component, as is described below in association with FIG. 12I. In another embodiment, the triblock copolymer layer 1214 is a blend of homopolymers of A, B, and/or C or diblock BCPs of the A-B, B-C, or A-C components in order to achieve the desired morphology.

In an embodiment, the structure 1220 further includes a first molecular brush layer 1212 disposed on the dielectric lines 1204 of the lower metallization layer. In that embodiment, the first segregated block component 1222 is disposed on the first molecular brush layer. In an embodiment, the structure 1220 also includes a second, different, molecular brush layer 1210 disposed on the metal lines 102 of the lower metallization layer. The alternating second 1224 and third 1226 segregated block components are disposed on the second molecular brush layer 1210. In one embodiment, the first molecular brush layer 1212 includes a molecular species 1208 including polystyrene with a head group selected from the group consisting of —SH, —$PO_3H_2$, —$CO_2H$, —NRH, —NRR', and —$Si(OR)_3$, and the second molecular brush layer 1210 includes a molecular species 1206 including polymethacrylate with a head group selected from the group consisting of —SH, —$PO_3H_2$, —$CO_2H$, —NRH, —NRR', and —$Si(OR)_3$.

In an embodiment, the alternating metal lines 1202 and dielectric lines 1204 of the lower metallization layer have a grating pattern with a constant pitch. In an embodiment, the third segregated block component 1226 of the triblock copolymer layer 1214 defines all possible via locations for a metallization layer above the lower metallization layer. In an embodiment, the third segregated block component 1226 of the triblock copolymer layer 1214 is photosensitive to an extreme ultra-violet (EUV) source or an e-beam source.

Figure 12D:
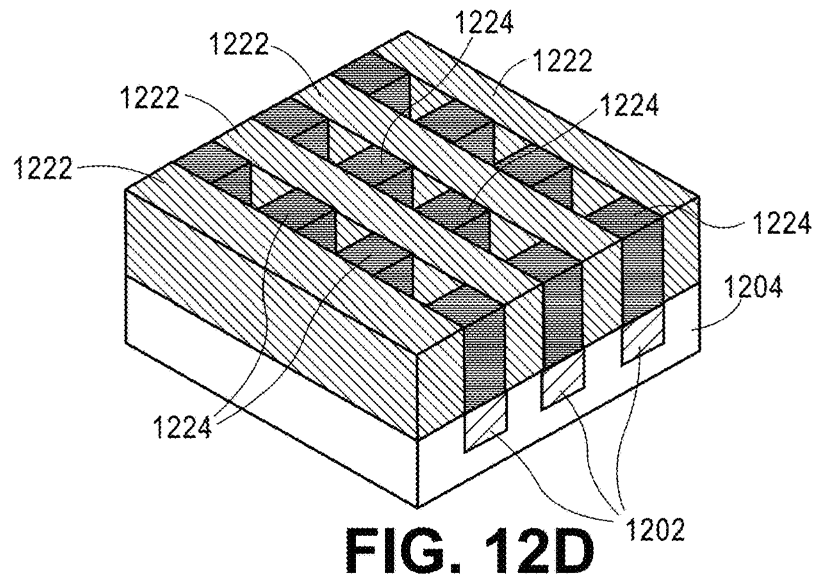
FIG. 12D illustrates an angled cross-sectional view representing an operation in a method using triblock copolymers for forming self-aligning vias or contacts for back end of line (BEOL) interconnects, in accordance with an embodiment of the present disclosure.

FIG. 12D illustrates an angled cross-sectional view representing an operation in a method using triblock copolymers for forming self-aligning vias or contacts for back end of line (BEOL) interconnects, in accordance with an embodiment of the present disclosure.

Referring to FIG. 12D, all portions of the third segregated block component 1226 of the structure 1220 of FIG. 12C are removed. In one such embodiment, the removal of all portions of the third segregated block component 1226 opens all possible via locations that may be formed above the underlying metallization later. The openings may be filled with a photo-resist layer to ultimately allow for selection of only those via locations need for a particular design. It is to be appreciated that, in the case of FIG. 12D, the third segregated block component 1226 of the structure 1220 may be, but need not be, photosensitive, since the removal of all portions of the third segregated block component 1226 of the structure 1220 of FIG. 12C may be performed by selective etching alone (e.g., selective to first segregated block component 1222 and to second segregated block component 1224). In one such embodiment, the selective etching may be performed using a selective dry etch or a selective wet etch, or both.

Figure 12E:
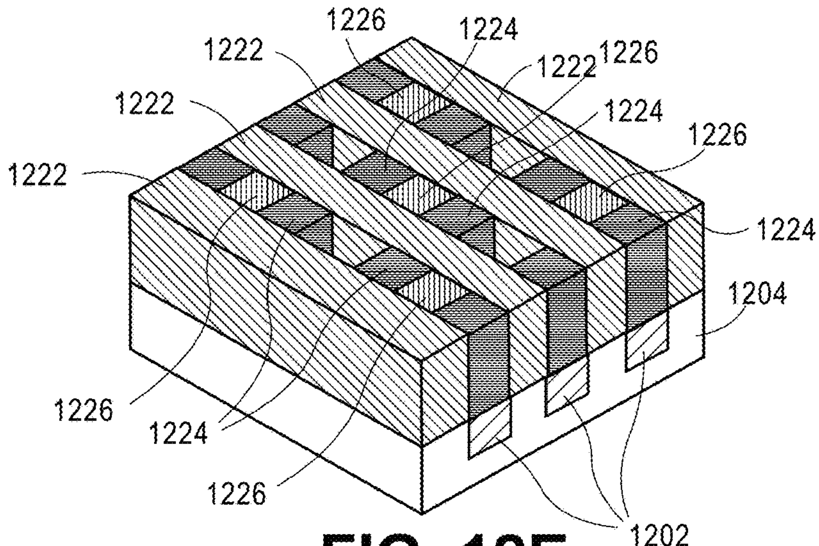
FIG. 12E illustrates an angled cross-sectional view representing an operation in another method using triblock copolymers for forming self-aligning vias or contacts for back end of line (BEOL) interconnects, in accordance with another embodiment of the present disclosure.

FIG. 12E illustrates an angled cross-sectional view representing an operation in another method using triblock copolymers for forming self-aligning vias or contacts for back end of line (BEOL) interconnects, in accordance with another embodiment of the present disclosure.

Referring to FIG. 12E, only select portions of the third segregated block component 1226 of the structure 1220 of FIG. 12C are removed. In one such embodiment, the removal of only select portions of the third segregated block component 1226 only those via locations above the underlying metallization layer needed for a particular design. It is to be appreciated that, in the case of FIG. 2E, the third segregated block component 1226 of the structure 1220 is photosensitive, and location selection is performed using localized, but highly tolerant lithographic exposure. The exposure may be described as tolerant since neighboring materials 1222 and 1224 adjacent locations 1226 are, in one embodiment, not photosensitive to the lithography used to select the locations for portions of removal of component 1226.

Figure 12F:
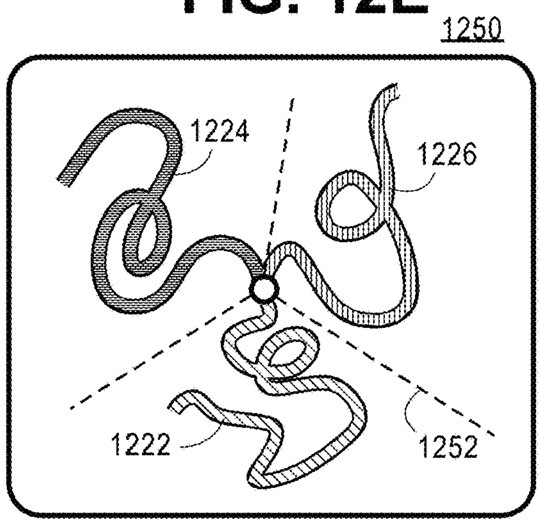
FIG. 12F illustrates a triblock copolymer for forming self-aligning vias or contacts for back end of line (BEOL) interconnects, in accordance with an embodiment of the present disclosure.

FIG. 12F illustrates a triblock copolymer for forming self-aligning vias or contacts for back end of line (BEOL) interconnects, in accordance with an embodiment of the present disclosure.

Referring to FIG. 12F, a segregated triblock BCP 1250 may be partitioned along axis 1252 by portions 1222, 1224, 1226. It is to be appreciated that other partitioning arrangements may be possible, such as asymmetrical arrangements. In an embodiment, there is etch selectivity between components 1222, 1224 and 1226, which may be a s great as 10:1 etch selectivity for one component relative to the other two components. In an embodiment, the use of triblock BCP 1250 can improve pattern fidelity and reduce critical dimension (CD) variation. In an embodiment, the segregated triblock BCP 1250 can be implemented to enable a self-aligning strategy that complements a 193 nanometer immersion lithography (193i) or an extreme ultraviolet lithography (EUVL) process.

It is to be appreciated that, typically, the blocks of triblock copolymers may each have different chemical properties. As one example, one of the blocks may be relatively more hydrophobic (e.g., water repelling) while the two blocks may be relatively more hydrophilic (water attracting), or vice versa. At least conceptually, one of the blocks may be relatively more similar to oil and the other two blocks may be relatively more similar to water, or vice versa. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible.

Similarly, differences in hydrophilicity between the polymer blocks may cause a roughly analogous microphase separation where the different polymer blocks try to "separate" from each other due to chemical dislike for one another. However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, FIGS. 12C, 12H and 12I depict possible assembly schemes for a triblock copolymer.

It is to be appreciated that a pattern needed to open a pre-formed via or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. The pattern features can also be made to be shallow, which can improve the patterning resolution. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

The following describes portions of integrated circuit layers representing various operations in a method of self-aligned via and metal patterning. In particular, FIGS. 12G and 12H illustrate plan views and corresponding cross-sectional views representing various operations in a method using triblock copolymers for forming self-aligning vias or contacts for back end of line (BEOL) interconnects, in accordance with an embodiment of the present disclosure.

Figure 12G:
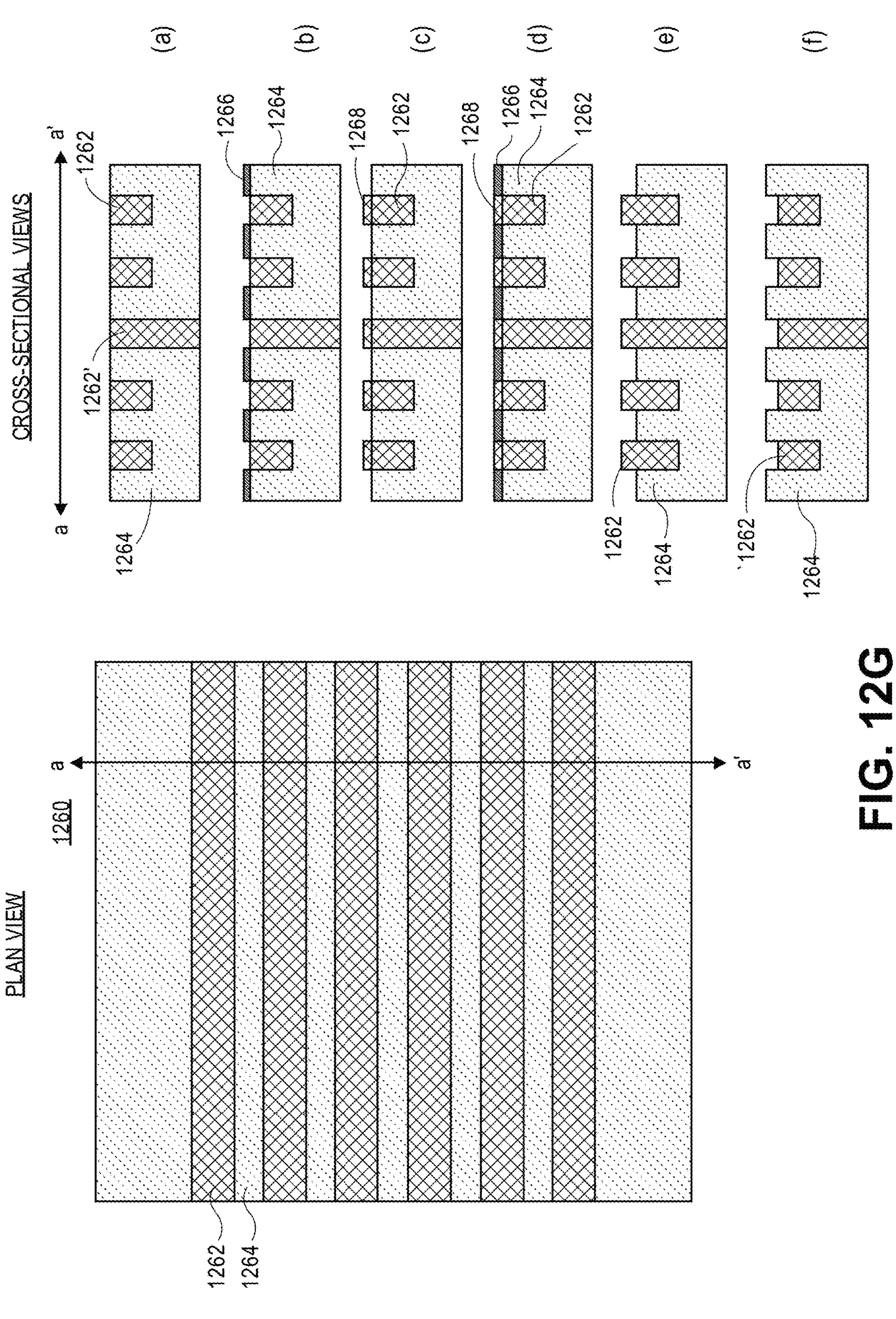
FIGS. 12G and 12H illustrate plan views and corresponding cross-sectional views representing various operations in a method using triblock copolymers for forming self-aligning vias or contacts for back end of line (BEOL) interconnects, in accordance with an embodiment of the present disclosure.
Figure 12H:
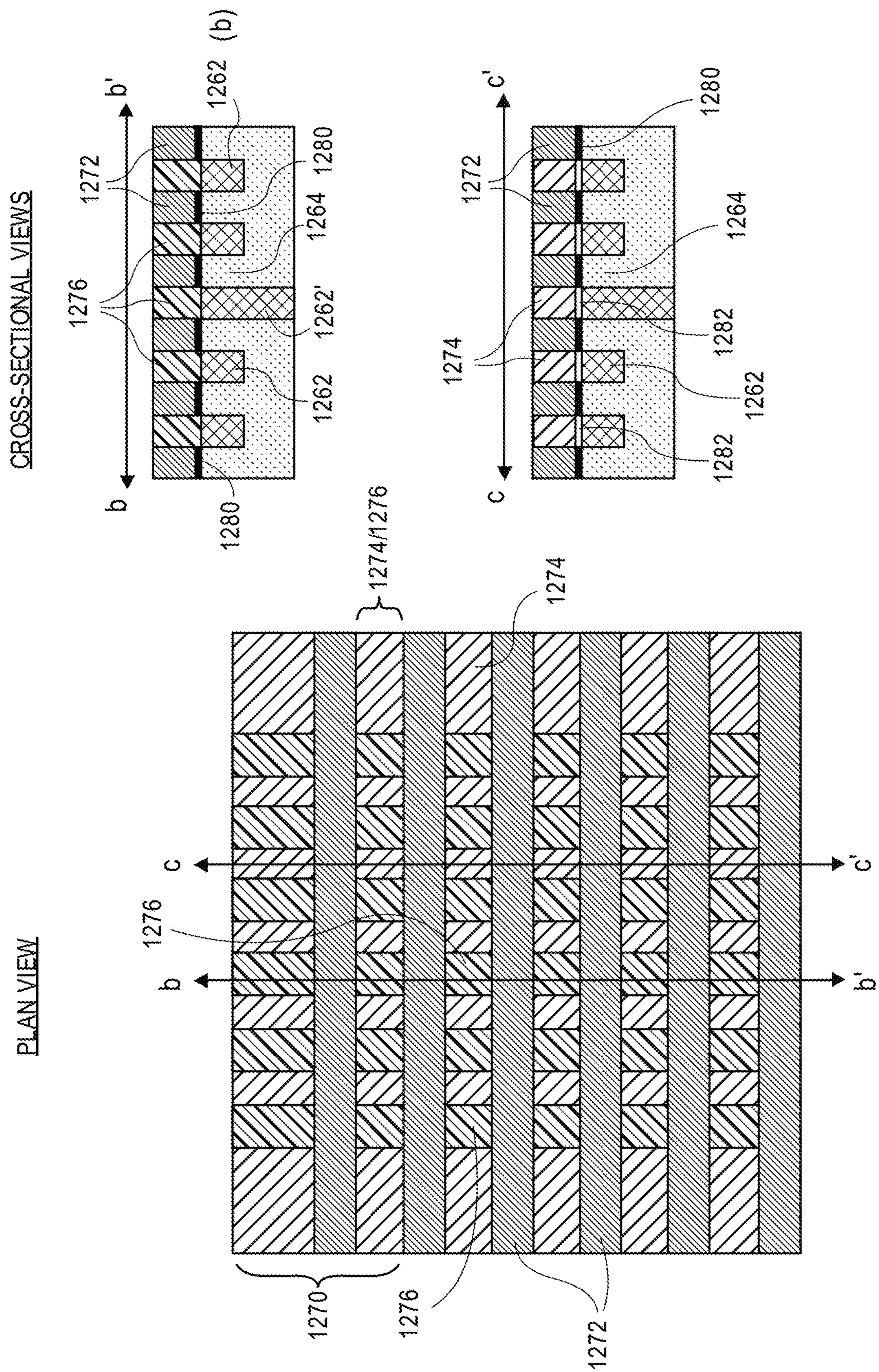
Figure 12I:
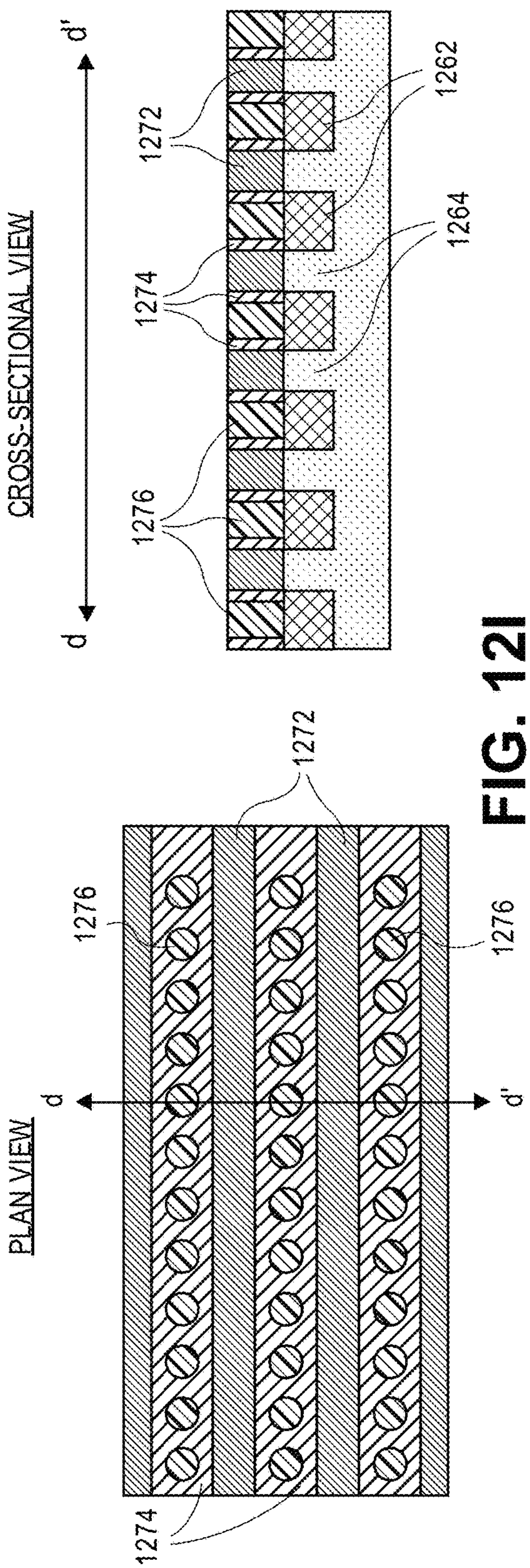
FIGS. 12I-12L illustrate plan views and corresponding cross-sectional views representing various operations in a method using triblock copolymers for forming self-aligning vias or contacts for back end of line (BEOL) interconnects, in accordance with an embodiment of the present disclosure.

FIG. 12G illustrates a plan view and corresponding cross-sectional views taken along the a-a' axis of options for a previous layer metallization structure, in accordance with an embodiment of the present disclosure. Referring to the plan view and corresponding cross-section view option (a), a starting structure 1260 includes a pattern of metal lines 1262 and interlayer dielectric (ILD) lines 1264. The starting structure 1260 may be patterned in a grating-like pattern with metal lines spaced at a constant pitch and having a constant width, as is depicted in FIG. 12G in the case that self-assembling materials are ultimately formed thereon. In the case of cross-sectional view (a), the pattern of metal lines 1262 and interlayer dielectric (ILD) lines 1264 are planar with one another. Some of the lines may be associated with underlying vias, such as line 1262' shown as an example in the cross-sectional views.

Referring again to FIG. 12G, alternative options (b)-(f) address situations where an additional film is formed (e.g., deposited, grown, or left as an artifact remaining from a previous patterning process) on a surface of one of, or both of, the metal lines 1262 and interlayer dielectric lines 1264. In example (b), an additional film 1266 is disposed on the interlayer dielectric lines 1264. In example, (c), an additional film 1268 is disposed on the metal lines 1262. In example, (d) an additional film 1266 is disposed on the interlayer dielectric lines 1264, and an additional film 1268 is disposed on the metal lines 1262. Furthermore, although the metal lines 1262 and the interlayer dielectric lines 1264 are depicted as co-planar in (a), in other embodiments, they are not co-planar. For example, in (e), the metal lines 1262 protrude above the interlayer dielectric lines 1264. In example, (f), the metal lines 1262 are recessed below the interlayer dielectric lines 1264.

Referring again to examples (b)-(d), an additional layer (e.g., layer 1266 or 1268) can be used as a hardmask (HM) or protection layer or be used to enable self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a directed self-assembly process.

Referring to FIG. 12H, a triblock copolymer layer 1270 is formed on the structure of FIG. 12G (e.g., plan view and cross-sectional structure (a)). The triblock copolymer layer 1270 is segregated to have regions 1272 formed above the ILD lines 1264, and to have alternating second regions 1274 and third regions 1276 formed above metal lines 1262.

Referring to the cross-sectional view along the b-b' axis of FIG. 12H, the third regions 1276 are shown above the metal lines 1262, and the first regions 1272 are shown above the ILD lines 1264. In accordance with one embodiment, also shown between first regions 1272 and ILD lines 1264 is layer 1280 which may be a remnant of a molecular brush layer. However, it is to be appreciated that layer 1280 may not be present. In accordance with one embodiment, third regions 1276 are shown as formed directly on metal lines 1262. However, it is to be appreciated that remnants of a molecular brush layer may be between the third regions 1276 and the metal lines 1262.

Referring to the cross-sectional view along the c-c' axis of FIG. 12H, the second regions 1274 are shown above the metal lines 1262, and the first regions 1272 are shown above the ILD lines 1264. In accordance with one embodiment, also shown between first regions 1272 and ILD lines 1264 is layer 1280 which may be a remnant of a molecular brush layer. However, it is to be appreciated that layer 1280 may not be present. In accordance with one embodiment, also shown between second regions 1274 and metal lines 1262 is layer 1282 which may be a remnant of a molecular brush layer. However, it is to be appreciated that layer 1282 may not be present. It is also to be appreciated that regions 1276 may be formed as photosensitive or may be replaced by a photosensitive material.

Thus, in an embodiment, an underlying metal and ILD grid is recreated in a block copolymer (BCP). This can particularly be so if the BCP pitch is commensurate with the underlying grating pitch. The polymer grid is, in one embodiment, robust against certain small deviations from a highly well-aligned grid such. For example, if small plugs effectively place an oxide or like material where a highly well-aligned grid would have metal, an essentially highly well-aligned block copolymer grid can still be achieved.

In an embodiment, referring again to FIG. 12H, the thickness of the coated with triblock copolymer layer 1270 is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the with triblock copolymer layer 1270 can be important since it may be used to define the ultimate thickness of a subsequently formed permanent ILD layer. That is, in one embodiment, the polymer grating shown in FIG. 12H is eventually replaced with an ILD/metal line grating of roughly the same thickness.

In an embodiment, the triblock copolymer layer 1270 molecule is a polymeric molecule formed of a chain of covalently bonded monomers. In a triblock copolymer, there are three different types of monomers, and these different types of monomers are primarily included within different blocks or contiguous sequences of monomers. In an embodiment, the triblock copolymer layer 1270 is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled triblock copolymer layer 1270 discussed in association with the resulting structure of FIG. 12H. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the art for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules to form triblock copolymer layer 1270.

In one such embodiment, an annealing treatment may be applied to the unassembled block copolymer in order to initiate, accelerate, increase the quality of, or otherwise promote microphase separation and/or self-assembly to form triblock copolymer layer 1270. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of forces such as surface tension, molecular likes and dislikes, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines) in the form of triblock copolymer layer 12720. In some embodiments, they may be used to form nano-scale lines or other nano-scale structures that can ultimately be used to form via openings. In some embodiments, directed self-assembly of block copolymers may be used to form vias that are self-aligned with interconnects, as described in greater detail below.

It is to be appreciated that the two components of a triblock copolymer structure that are formed above metal lines need not have a 1:1 ratio (a 1:1 ratio was shown in FIGS. 12C and 12H). For example, the third segregated block component may be present in a lesser amount than the second component and may have a columnar structure surrounded by the second segregated block component. FIGS. 12I-12L illustrate plan views and corresponding cross-sectional views representing various operations in a method using triblock copolymers for forming self-aligning vias or contacts for back end of line (BEOL) interconnects, in accordance with an embodiment of the present disclosure.

Referring to FIG. 12I, a plan view and corresponding cross-sectional view taken along the d-d' axis shows the third component 1276 in lesser amount than the second component 1274. The third segregated block component 1276 has a columnar structure surrounded by the second segregated block component 1274.

Figure 12J:
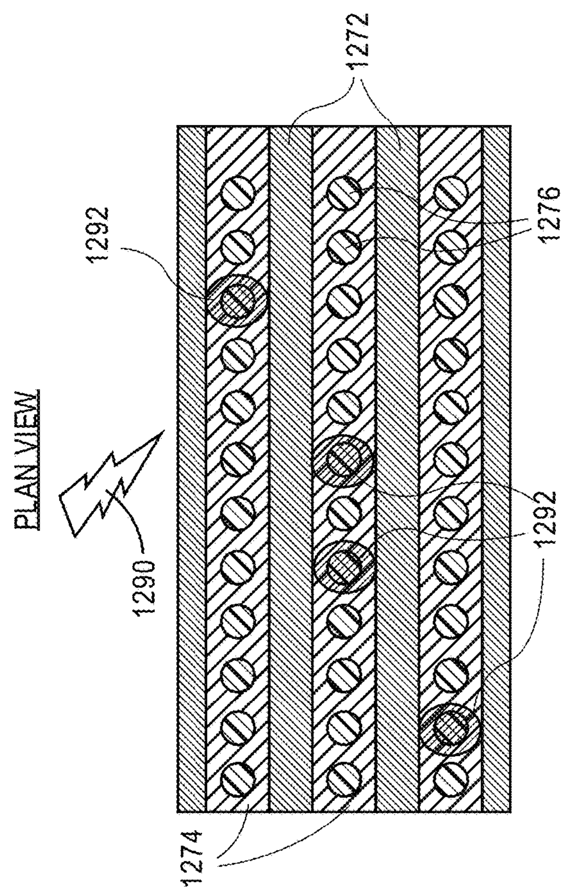

Referring to FIG. 12J, a plan view shows lithography 1290 selection of certain ones 1292 of the third segregated block component 1276 is performed to ultimately provide via locations for an upper metallization structure.

It is to be appreciated that FIG. 12I effectively illustrates an unexposed photosensitive DSA structure, while FIG. 12J illustrates an exposed photosensitive DSA structure. In contrast to FIG. 12H, FIGS. 12I and 12J demonstrate an example of a columnar structure which may formed when many block copolymer molecules align with their shorter blocks of one of polymer forming columnar structures surrounded by a phase having the longer blocks of another polymer. In accordance with an embodiment of the present disclosure, the photoactive properties of a DSA structure provides the ability to effectively "plug" or "cut" one type of DSA polymer region with, e.g., e-beam or EUV exposure.

Figure 12K:
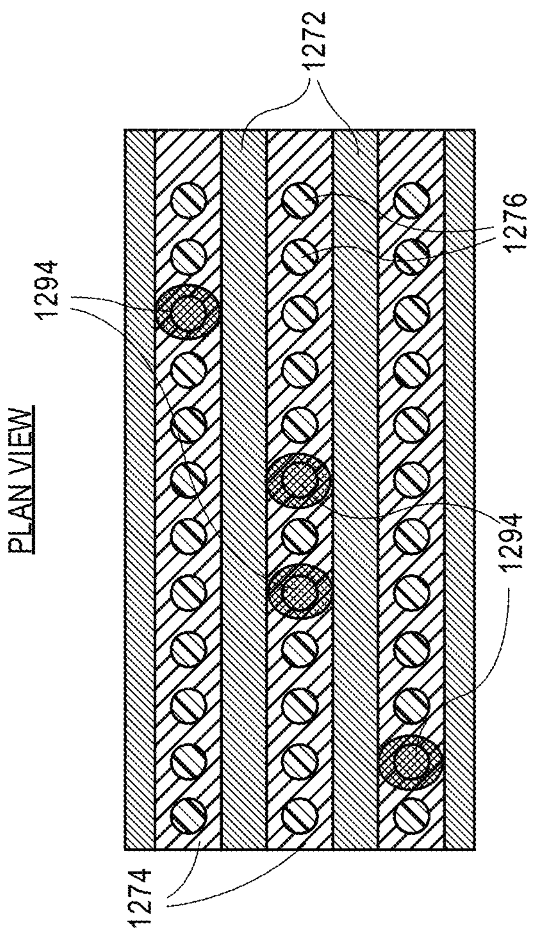

Referring to FIG. 12K, a plan view shows exposed/chemically amplified regions 1294 in the zones of exposure. By selectivity, the only active modification is of the material of exposed portions of the third segregated block component 1276. It is to be appreciated that, although shown as already cleared in FIG. 12K, the select regions may not yet be cleared.

Figure 12L:
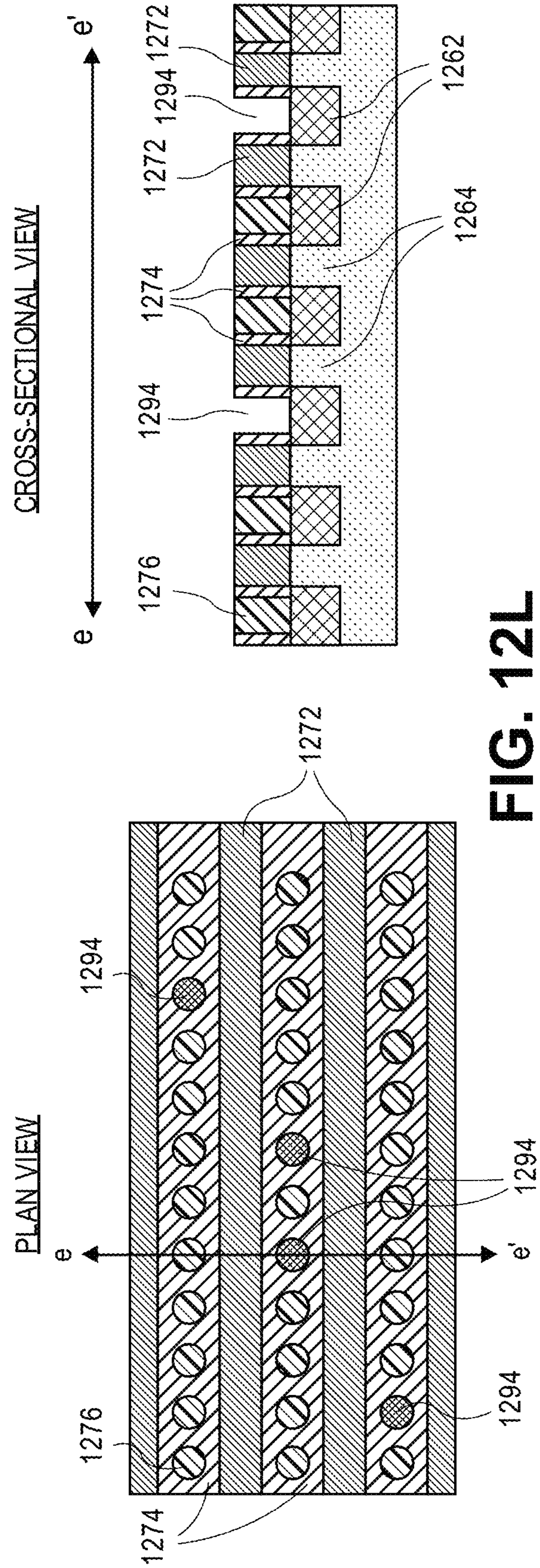

Referring to FIG. 12L, a plan view and corresponding cross-sectional view taken along the e-e' axis shows post lithographic development to provide cleared regions 1294. The cleared regions 1294 may ultimately be used for via formation.

The resulting patterned DSA structure of FIG. 12L (or FIG. 12C, 12D, 12E or 12H) described above in may ultimately be used as a scaffolding from which permanent layers are ultimately formed. That is, it may be the case that none of the DSA materials exist in a final structure, but rather are used to direct fabrication of a finalized interconnect structure. In one such embodiment, a permanent ILD replaces one or more regions of the DSA material and subsequent processing (such as metal line fabrication) is completed. That is, it is possible that all DSA components ultimately removed for final self-aligned via and plug formation. In other embodiments at least some of the DSA material may remain behind in the final structure.

With reference again to FIGS. 12A-12C, 12G, 12H and 12I-12L, in an embodiment, a method of fabricating an interconnect structure for a semiconductor die includes forming a lower metallization layer that has alternating metal lines and dielectric lines above a substrate. A triblock copolymer layer is formed above the lower metallization layer. The triblock copolymer layer is segregated to form a first segregated block component over the dielectric lines of the lower metallization layer, and to form alternating second and third segregated block components disposed over the metal lines of the lower metallization layer. The third segregated block component is photosensitive. The method also includes irradiating and developing select locations of the third segregated block component to provide via openings over the metal lines of the lower metallization layer.

In an embodiment, the alternating second and third segregated block components have a ratio of approximately 1:1, as was described in association with FIGS. 12C and 12H. In another embodiment, the alternating second and third segregated block components have a ratio of X:1, second segregated block component to third segregated block component, where X is greater than 1. In that embodiment, the third segregated block component has a columnar structure surrounded by the second segregated block component, as was described in association with FIG. 12I.

In an embodiment, the method further includes, subsequent to irradiating and developing select locations of the third segregated block component to provide the via openings, using the resulting patterned triblock copolymer layer as a scaffolding to form a second level of alternating metal lines and dielectric lines above, coupled to, and orthogonal with the first level of alternating metal lines and dielectric lines. In one embodiment, one or more components of the triblock copolymer layer are retained in the final structure. However, in other embodiments, all components of the triblock copolymer layer are ultimately sacrificial in the sense that none of the material is retained in the final product. An exemplary embodiment of an implementation of the latter embodiment is described below in association with FIG. 13.

In an embodiment, the method further includes, prior to forming the triblock copolymer layer, forming a first molecular brush layer on the dielectric lines of the lower metallization layer, and forming a second, different, molecular brush layer on the metal lines of the lower metallization layer, exemplary embodiments of which were described above in association with FIGS. 12A-12C. In an embodiment, irradiating and developing the select locations of the third segregated block component includes exposing the select locations of the third segregated block component to an extreme ultra-violet (EUV) source or an e-beam source.

Figure 13:
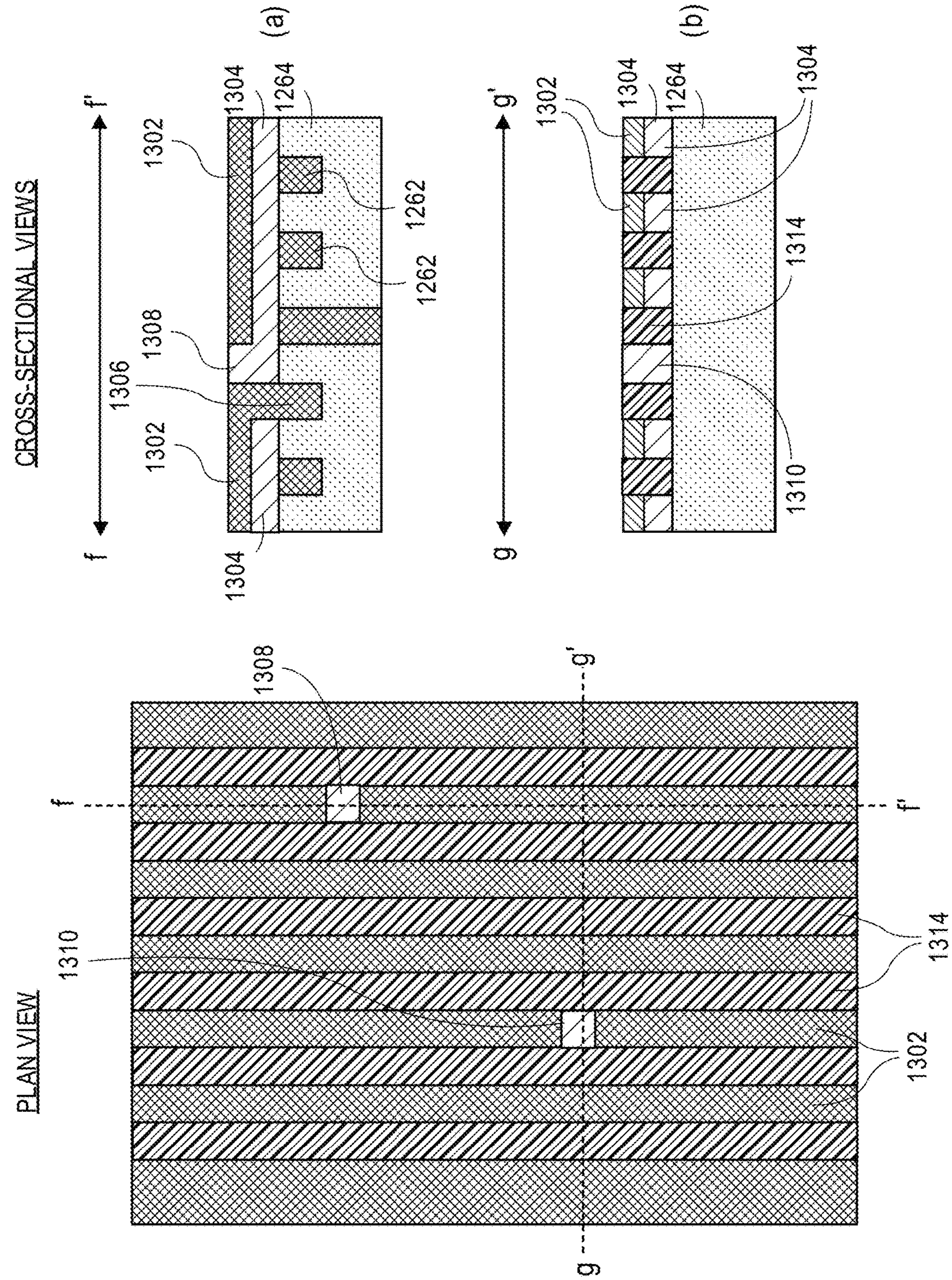
FIG. 13 illustrates a plan view and corresponding cross-sectional views of a self-aligned via structure following metal line, via and plug formation, in accordance with an embodiment of the present disclosure.

Provided merely as an example of a final structure that may ultimately be obtained, FIG. 13 illustrates a plan view and corresponding cross-sectional views of a self-aligned via structure following metal line, via and plug formation, in accordance with an embodiment of the present disclosure. Referring to the plan view and corresponding cross-sectional views (a) and (b) taken along axes, f-f' and g-g', respectively, an upper level of metal lines 1302 is provided in a dielectric framework (e.g., on dielectric layer 1304 and adjacent to dielectric lines 1314. The metal lines 1302 are coupled with underlying metal lines 1262 through the predetermined via locations (an example 1306 of which is shown in cross-sectional view (a)), and are isolated by plugs (examples of which include plugs 1308 and 1310). The underlying lines 1262 and 1264 may be as described above in association with FIG. 12G, as formed in a direction orthogonal to the metal lines 1302. It is to be appreciated that, in subsequent fabrication operations, the dielectric lines 1314 may be removed to provide air gaps between the resulting metal lines 1302.

A resulting structure such as that described in association with FIG. 13 may subsequently be used as a foundation for forming subsequent metal line/via and ILD layers. Alternatively, the structure of FIG. 13 may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein. It is to be appreciated that the above examples have focused on via/contact formation. However, in other embodiments, similar approaches may be used to preserve or form regions for line end termination (plugs) within a metal line layer.

It is to be appreciated that process flows described herein may be described as predominantly DSA-based (such as several of the process schemes described above), while other may be predominantly etch-based. In accordance with an embodiment of the present disclosure, a deep subtractive approach is implemented for BEOL processing. One or more embodiments described herein are directed to subtractive approaches for self-aligned via and plug patterning, and structure resulting there from. In an embodiment, processes described herein enable realization of self-aligned metallization for back-end of line feature fabrication. Overlay problems anticipated for next generation via and plug patterning may be addressed by one or more approaches described herein. In general, one or more embodiment described herein involves the use of a subtractive method to pre-form every via and plug using the trenches already etched. An additional operation is then used to select which of the vias and plugs to retain.

Figure 14A:
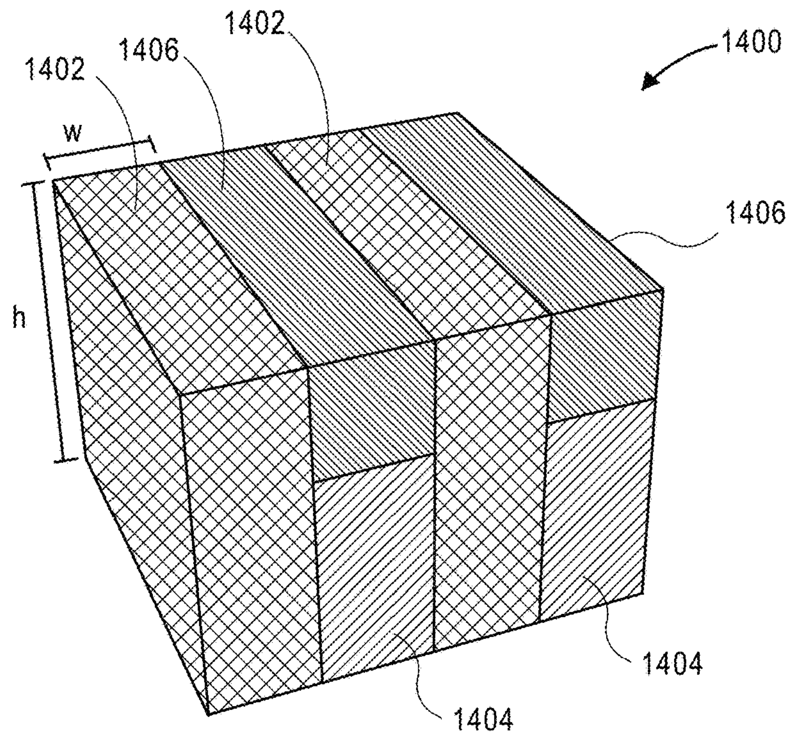
FIGS. 14A-14N illustrate portions of integrated circuit layers representing various operations in a method of subtractive self-aligned via and plug patterning, in accordance with an embodiment of the present disclosure.
Figure 14B:
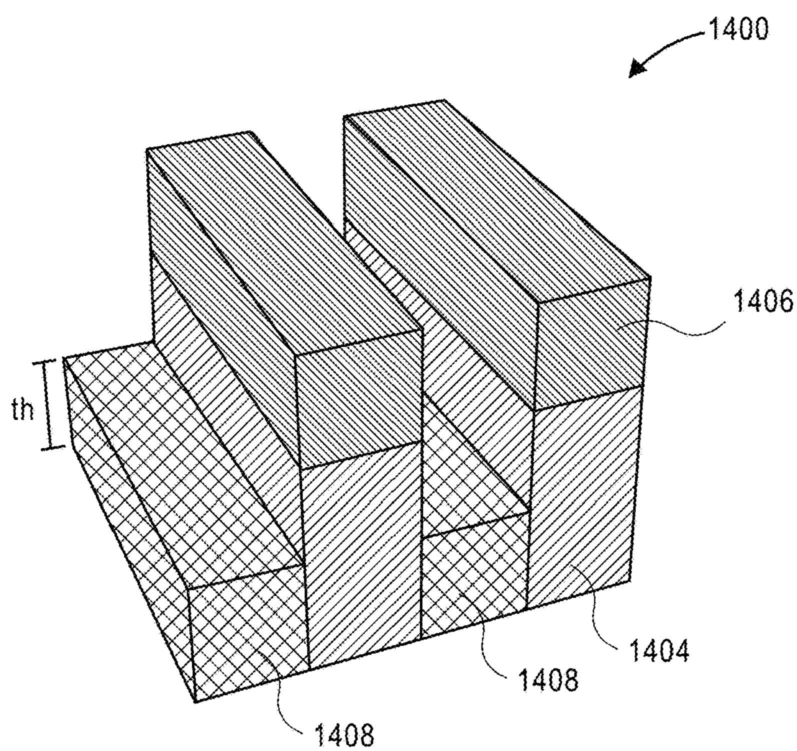
Figure 14C:
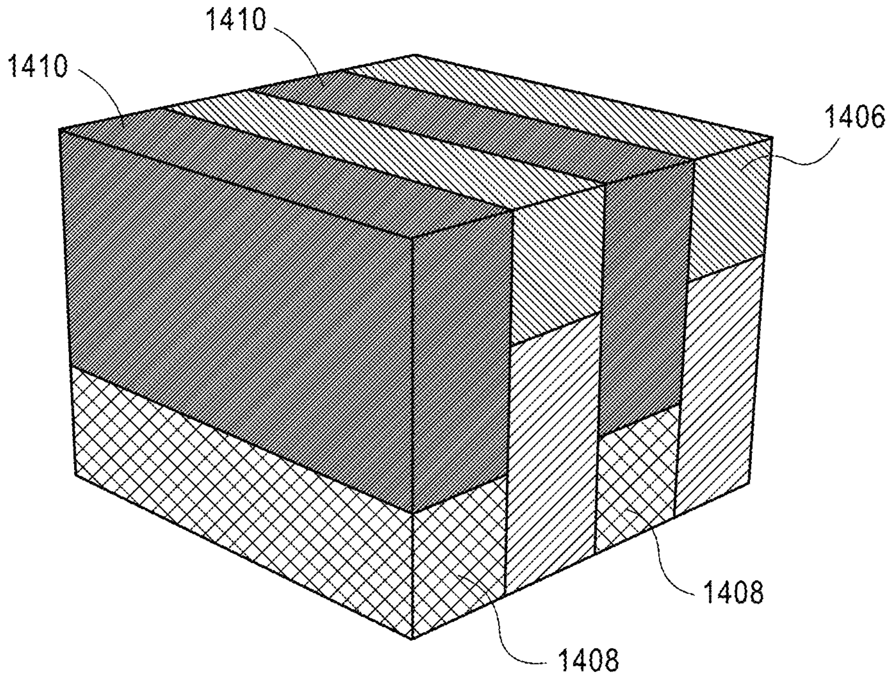
Figure 14D:
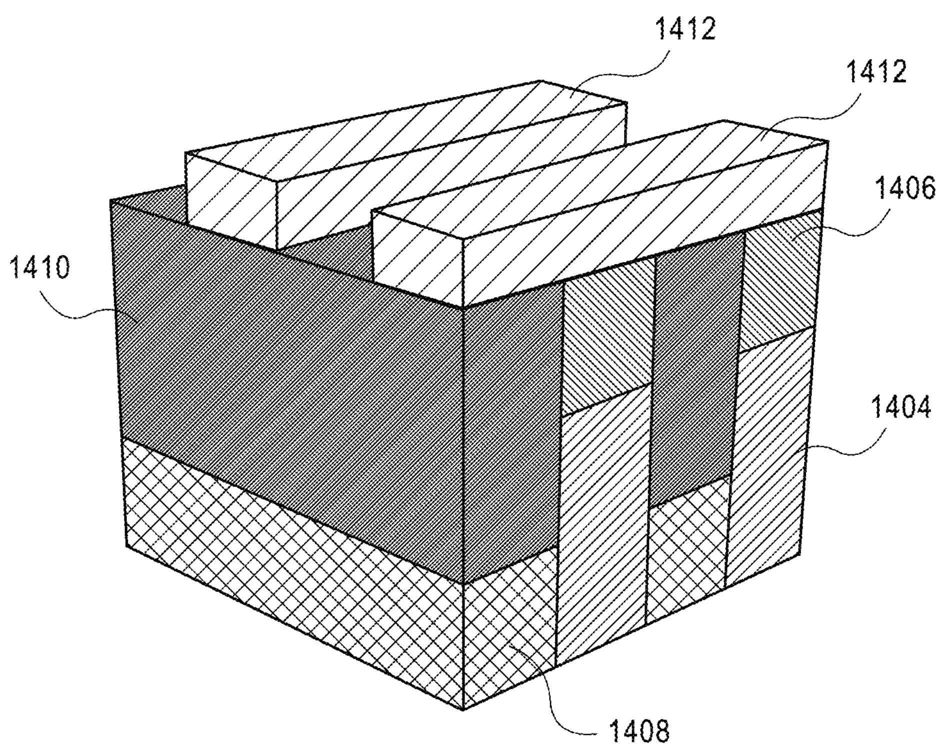
Figure 14E:
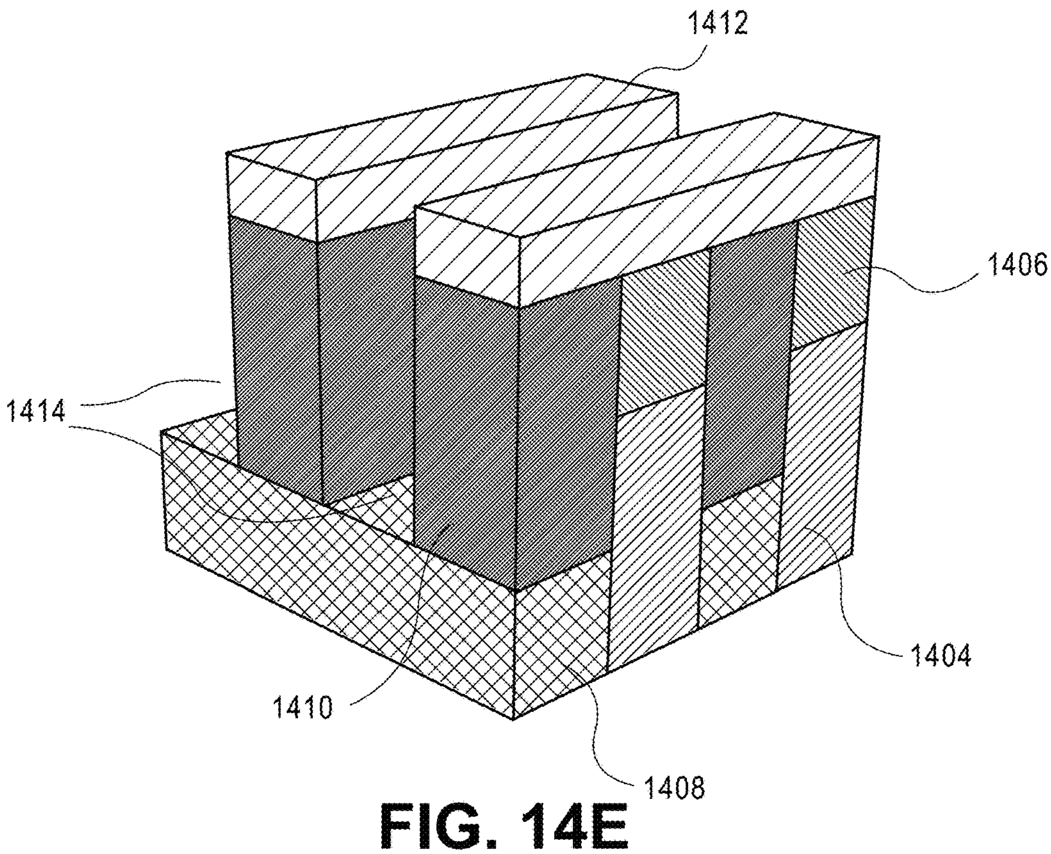
Figure 14F:
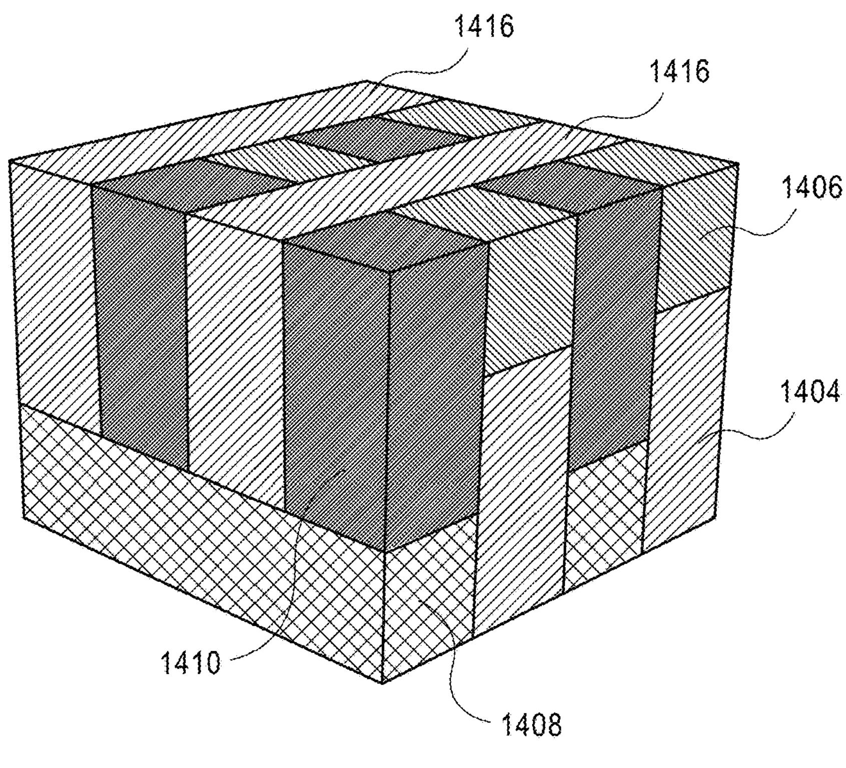
Figure 14G:
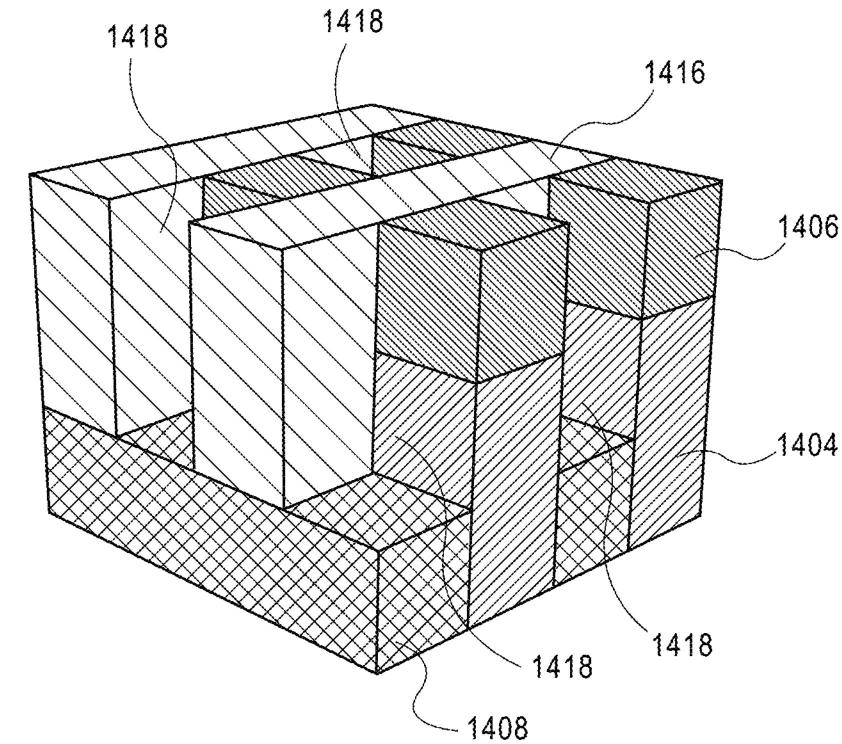
Figure 14H:
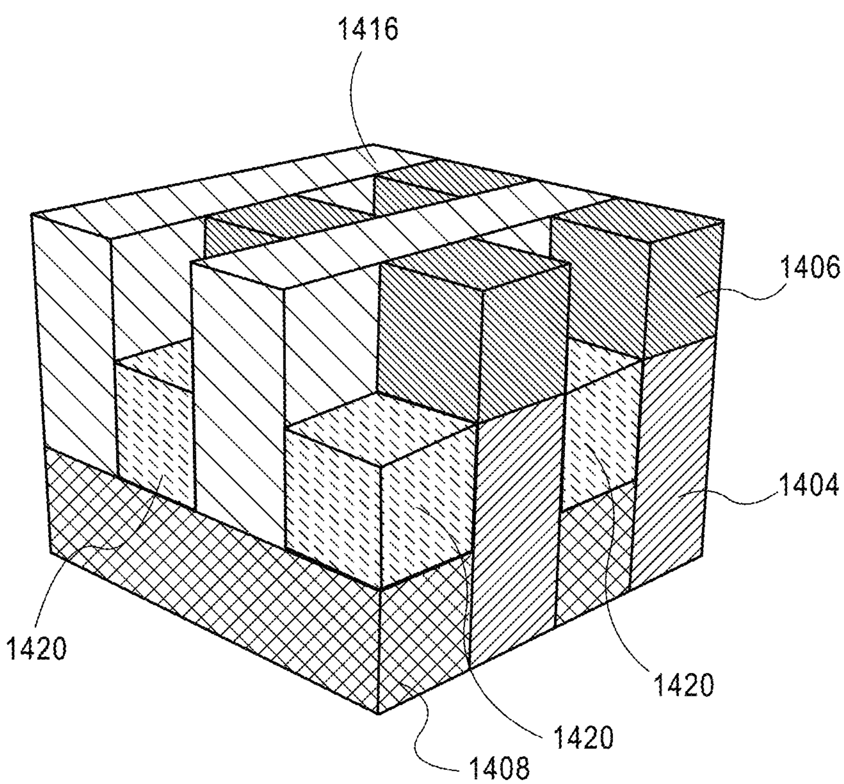
Figure 14I:
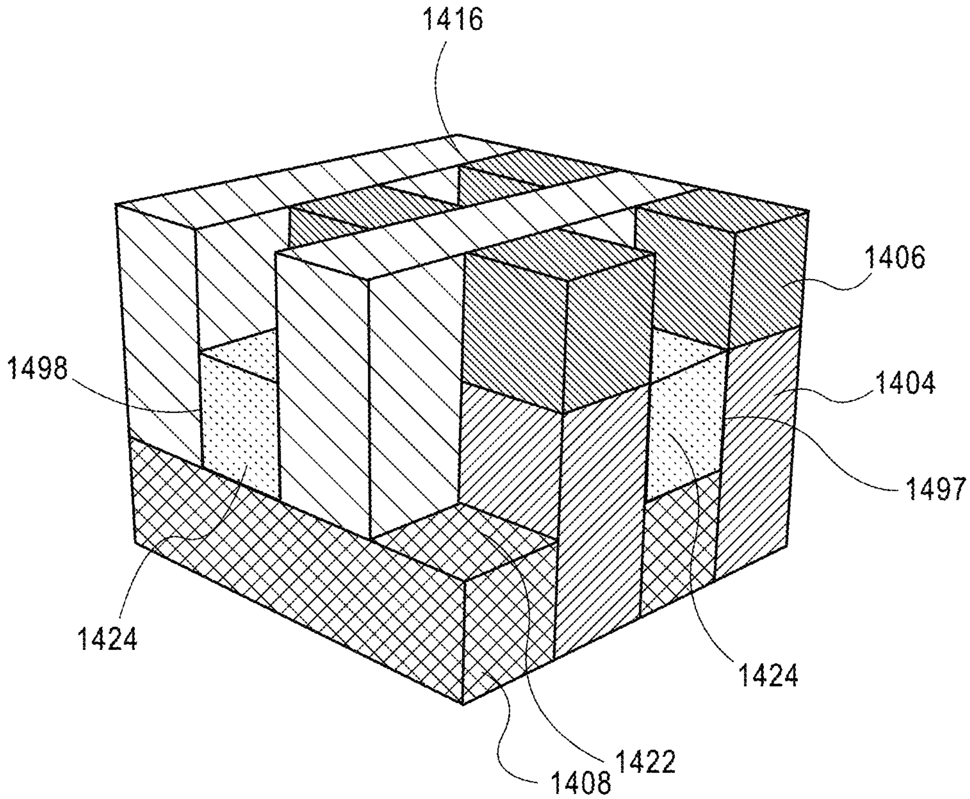
Figure 14J:
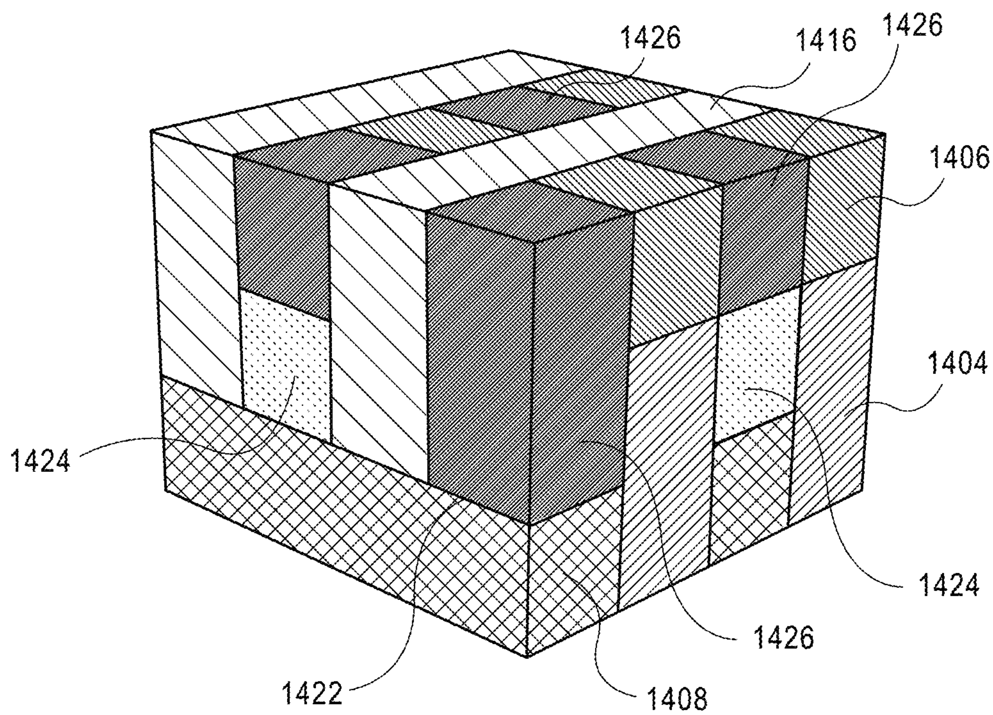
Figure 14K:
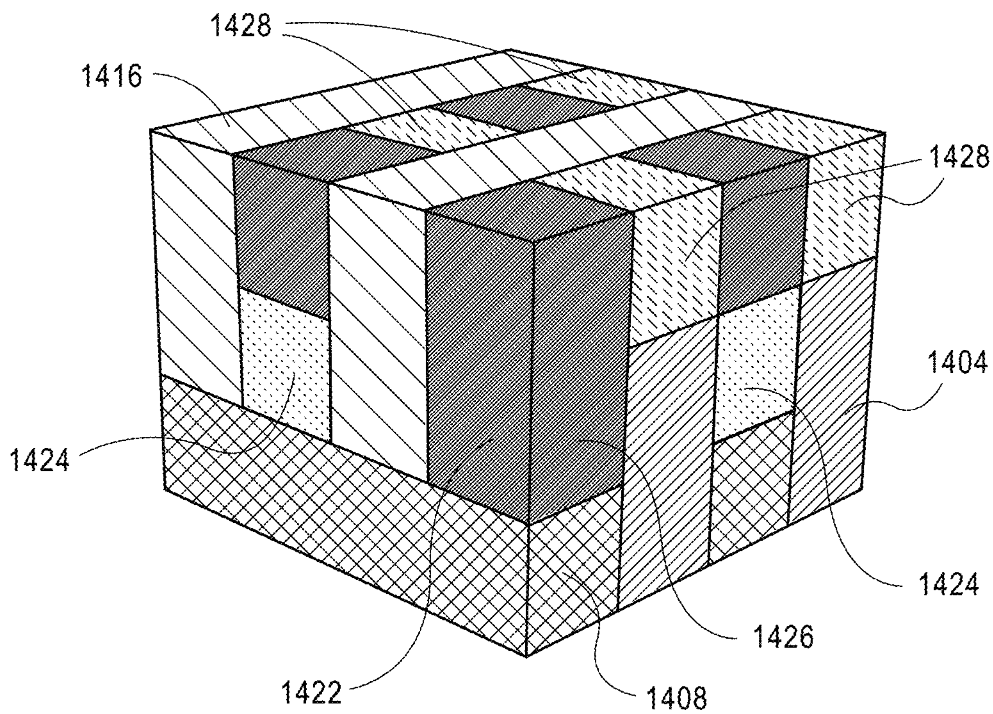
Figure 14L:
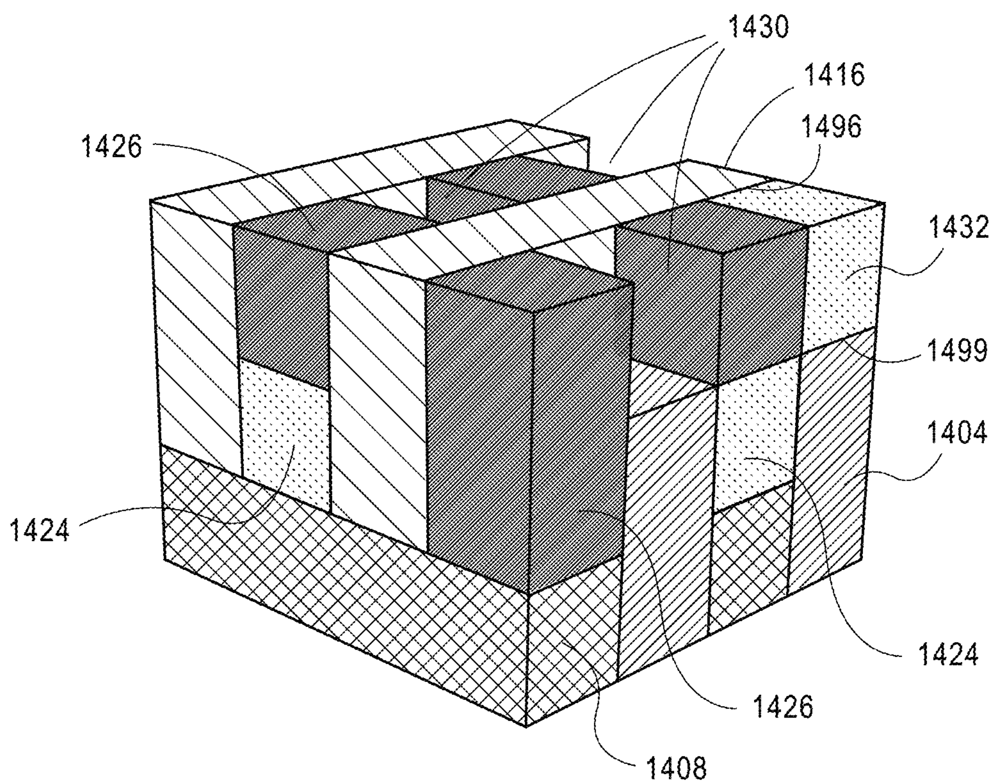
Figure 14M:
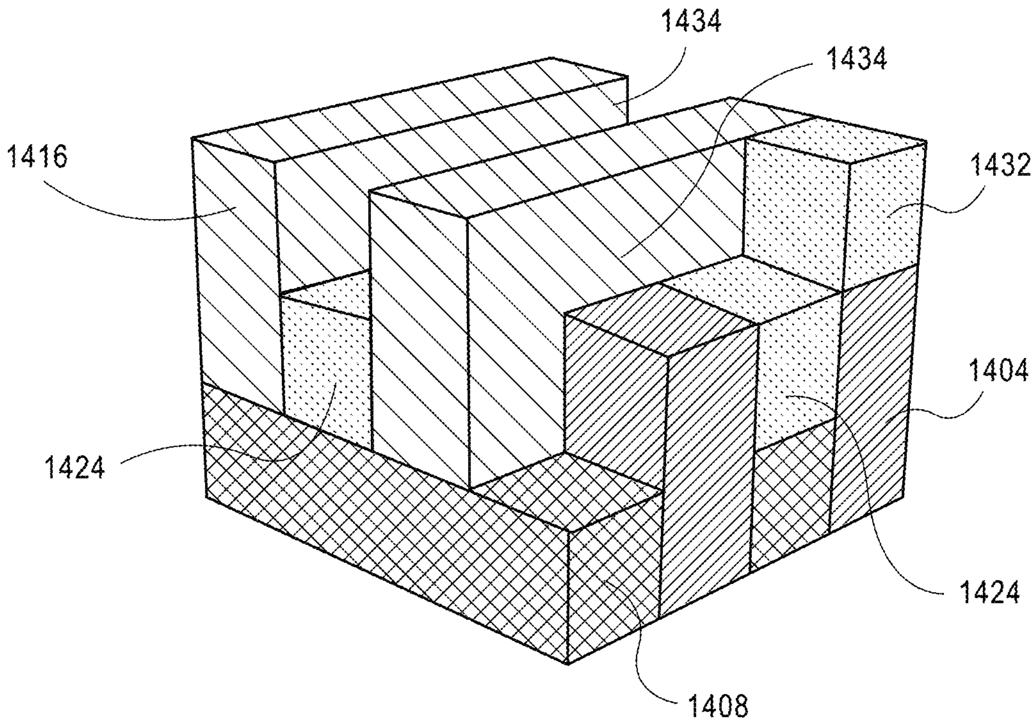
Figure 14N:
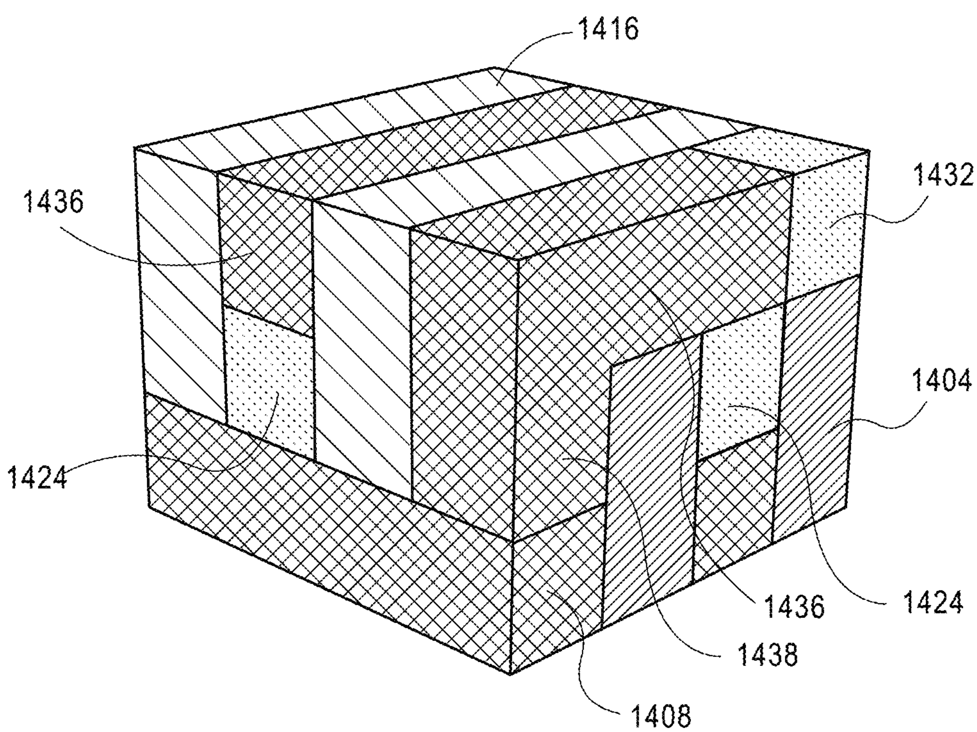

FIGS. 14A-14N illustrate portions of integrated circuit layers representing various operations in a method of subtractive self-aligned via and plug patterning, in accordance with an embodiment of the present disclosure. In each illustration at each described operation, an angled three-dimensional cross-section view is provided.

FIG. 14A illustrates a starting point structure 1400 for a subtractive via and plug process following deep metal line fabrication, in accordance with an embodiment of the present disclosure. Referring to FIG. 14A, structure 1400 includes metal lines 1402 with intervening interlayer dielectric (ILD) lines 1404. The ILD lines 1404 include a plug cap layer 1406. In an embodiment, as described in greater detail below in association with FIG. 14E, the plug cap layer 1406 is later patterned to ultimately define all possible location for later plug formation.

In an embodiment, the grating structure formed by metal lines 1402 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of FIG. 14A may have metal lines spaced at a constant pitch and having a constant width. The pattern may be fabricated by a pitch halving or pitch quartering approach. It is also to be appreciated that some of the lines 1402 may be associated with underlying vias for coupling to a previous interconnect layer.

In an embodiment, the metal lines 1402 are formed by patterning trenches into an ILD material (e.g., the ILD material of lines 1404) having the plug cap layer 1406 formed thereon. The trenches are then filled by metal and, if needed, planarized to the plug cap layer 1406. In an embodiment, the metal trench and fill process involves high aspect ratio features. For example, in one embodiment, the aspect ratio of metal line height (h) to metal line width (w) is approximately in the range of 5-10.

FIG. 14B illustrates the structure of FIG. 14A following recessing of the metal lines, in accordance with an embodiment of the present disclosure. Referring to FIG. 14B, the metal lines 1402 are recessed selectively to provide first level metal lines 1408. The recessing is performed selectively to the ILD lines 1404 and the plug cap layer 1406. The recessing may be performed by etching through dry etch, wet etch, or a combination thereof. The extent of recessing may be determined by the targeted thickness (th) of the first level metal lines 1408 for use as suitable conductive interconnect lines within a back end of line (BEOL) interconnect structure.

FIG. 14C illustrates the structure of FIG. 14B following hardmask fill in the recessed regions of the recessed metal lines, in accordance with an embodiment of the present disclosure. Referring to FIG. 14C, hardmask layer 1410 is formed in the regions formed during recessing to form the first level metal lines 1408. The hardmask layer 1410 may be formed by a material deposition and chemical mechanical planarization (CMP) process to the level of plug cap layer 1406, or by a controlled bottom-up only growth process. In one specific embodiment, the hardmask layer 1410 is composed of a carbon-rich material.

FIG. 14D illustrates the structure of FIG. 14C following deposition and patterning a hardmask layer, in accordance with an embodiment of the present disclosure. Referring to FIG. 14D a second hardmask layer 1412 is formed on or above the hardmask layer 1410 and plug cap layer 1406. In one such embodiment, the second hardmask layer 1412 is formed with a grating pattern orthogonal to the grating pattern of the first level metal lines 1408/ILD lines 1404, as is depicted in FIG. 14D. In one specific embodiment, the second hardmask layer 1412 is composed of a silicon-based anti-reflective coating material. In an embodiment, the grating structure formed by second hardmask layer 1412 is a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like pattern of the second hardmask layer 1412 of FIG. 14D may have hardmask lines spaced at a constant pitch and having a constant width.

FIG. 14E illustrates the structure of FIG. 14D following trench formation defined using the pattern of the hardmask of FIG. 14D, in accordance with an embodiment of the present disclosure. Referring to FIG. 14E, the exposed regions (i.e., unprotected by 1412) of the hardmask layer 1410 and the plug cap layer 1406 are etched to form trenches 1414. The etch stops on, and thus exposes, the top surfaces of the first level metal lines 1408 and the ILD lines 1404.

FIG. 14F illustrates the structure of FIG. 14E following ILD formation in the trenches of FIG. 14E and removal of the second hardmask, in accordance with an embodiment of the present disclosure. Referring to FIG. 14F, second ILD lines 1416 are formed in the trenches 1414 of FIG. 14E. In an embodiment, a flowable ILD material is used to fill trenches 1414. In an embodiment, the trenches 1414 are filled and the fill material is subsequently planarized. The planarization may further be used to remove second hardmask layer 1412, re-exposing the hardmask layer 1410 and the plug cap layer 1406, as is depicted in FIG. 14F.

Referring again to FIG. 14F, in an embodiment, the resulting structure includes a uniform ILD structure (ILD lines 1404+ILD lines 1416). The locations of all possible plugs are occupied by the remaining portions of the plug cap layer 1406, while all possible via locations are occupied by the remaining portions of hardmask layer 1410. In one such embodiment, ILD lines 1404 and ILD line 1416 are composed of a same material. In another such embodiment, ILD lines 1404 and ILD lines 1416 are composed of different ILD materials. In either case, in a specific embodiment, a distinction such as a seam between the materials of ILD lines 1404 and ILD lines 1416 may be observed in the final structure. Furthermore, in an embodiment, there is no distinct etch stop layer where the ILD lines 1404 and ILD lines 1416 meet, in contrast to conventional single or dual damascene patterning.

FIG. 14G illustrates the structure of FIG. 14F following removal of the remaining portions of hardmask layer occupying all possible via locations, in accordance with an embodiment of the present disclosure. Referring to FIG. 14G, the remaining portions of hardmask layer 1410 are selectively removed to form openings 1418 for all possible via locations. In one such embodiment, the hardmask layer 1410 is composed substantially of carbon and is removed selectively with an ash process.

In general, one or more embodiment described herein involves the use of a subtractive method to pre-form every via and plug using the trenches already etched. An additional operation is then used to select which of the vias and plugs to retain. Such operations can be illustrated using "photobuckets," although the selection process may also be performed using a more conventional resist expose and ILD backfill approach. It is also to be appreciated that embodiments are not limited to the concept of photobuckets, but have far reaching applications to structures having preformed features fabricated using bottom-up and/or directed self-assembly (DSA) approach. Additional embodiments directed at the fabrication and use of photobuckets is described in greater detail below in embodiments beyond the present embodiments of FIGS. 14A-14N and 15A-15D.

FIG. 14H illustrates the structure of FIG. 14G following photobucket formation in all possible via locations, in accordance with an embodiment of the present disclosure. Referring to FIG. 14H, photobuckets 1420 are formed in all possible via locations above exposed portions of the first level metal lines 1408. In an embodiment, the openings 1418 of FIG. 14G are filled with an ultrafast photoresist or ebeam resist or other photosensitive material. In one such embodiment, a thermal reflow of a polymer into the openings 1418 is used following a spin coat application. In one embodiment, the fast photoresist is fabricated by removing a quencher from an existing photoresist material. In another embodiment, the photobuckets 1420 are formed by an etch-back process and/or a lithography/shrink/etch process. It is to be appreciated that the photobuckets need not be filled with actual photoresist, so long as the material acts as a photosensitive switch.

FIG. 14I illustrates the structure of FIG. 14H following via location selection, in accordance with an embodiment of the present disclosure. Referring to FIG. 14I, the photobuckets 1420 from FIG. 14H in select via locations are removed. In locations where vias are not selected to be formed, the photobuckets 1420 are retained, converted to a permanent ILD material, or replaced with a permanent ILD material. As an example, FIG. 14I illustrates a via location 1422 with corresponding photobucket 1420 being removed to expose a portion of one of the first level metal lines 1408. The other locations previously occupied by photobuckets 1420 are now shown as regions 1424 in FIG. 14I. The locations 1424 are not selected for via formation and instead make up part of the final ILD structure. In one embodiment, the material of the photobuckets 1420 is retained in the locations 1424 as a final ILD material. In another embodiment, the material of the photobuckets 1420 is modified, e.g., by cross-linking, in the locations 1424 to form a final ILD material. In yet another embodiment, the material of the photobuckets 1420 in the locations 1424 is replaced by a final ILD material.

Referring again to FIG. 14I, to form via location 1422, lithography is used to expose the corresponding photobucket 1420. However, the lithographic constraints may be relaxed and misalignment tolerance may be high since the photobucket 1420 is surrounded by non-photolyzable materials. Furthermore, in an embodiment, instead of exposing at, e.g. 30 mJ/cm2, such a photobucket might be exposed at, e.g., 3 mJ/cm2. Normally this would result in very poor CD control and roughness. But in this case, the CD and roughness control will be defined by the photobucket 1420, which can be very well controlled and defined. Thus, the photobucket approach may be used to circumvent imaging/dose tradeoff which limits the throughput of next generation lithographic processes.

Referring again to FIG. 14I, in an embodiment, the resulting structure includes a uniform ILD structure (ILD 1424+ILD lines 1404+ILD lines 1416). In one such embodiment, two or all of ILD 1424, ILD lines 1404 and ILD line 1416 are composed of a same material. In another such embodiment, ILD 1424, ILD lines 1404 and ILD lines 1416 are composed of different ILD materials. In either case, in a specific embodiment, a distinction such as a seam between the materials of ILD 1424 and ILD lines 1404 (e.g., seam 1497) and/or between ILD 1424 and ILD lines 1416 (e.g., seam 1498) is observed in the final structure.

FIG. 14J illustrates the structure of FIG. 14I following hardmask fill in the openings of FIG. 14I, in accordance with an embodiment of the present disclosure. Referring to FIG. 14J, a hardmask layer 1426 is formed in via location 1422 and above ILD locations 1424. The hardmask layer 1426 may be formed by deposition and subsequent chemical mechanical planarization.

FIG. 14K illustrates the structure of FIG. 14J following removal of the plug cap layer and formation of a second plurality of photobuckets, in accordance with an embodiment of the present disclosure. Referring to FIG. 14K, the plug cap layer 1406 is removed, e.g., by a selective etching process. Photobuckets 1428 are then formed in all possible plug locations above exposed portions of the ILD lines 1404. In an embodiment, openings formed upon removal of the plug cap layer 1406 are filled with an ultrafast photoresist or ebeam resist or other photosensitive material. In one such embodiment, a thermal reflow of a polymer into the openings is used following a spin coat application. In one embodiment, the fast photoresist is fabricated by removing a quencher from an existing photoresist material. In another embodiment, the photobuckets 1428 are formed by an etch-back process and/or a lithography/shrink/etch process. It is to be appreciated that the photobuckets need not be filled with actual photoresist, so long as the material acts as a photosensitive switch.

FIG. 14L illustrates the structure of FIG. 14K following plug location selection, in accordance with an embodiment of the present disclosure. Referring to FIG. 14L, the photobuckets 1428 from FIG. 14K that are not in select plug locations are removed. In locations where plugs are selected to be formed, the photobuckets 1428 are retained, converted to a permanent ILD material, or replaced with a permanent ILD material. As an example, FIG. 14L illustrates non-plug locations 1430 with corresponding photobuckets 1428 being removed to expose a portion of the ILD lines 1404. The other location previously occupied by photobucket 1428 is now shown as region 1432 in FIG. 14L. The region 1432 is selected for plug formation and makes up part of the final ILD structure. In one embodiment, the material of the corresponding photobucket 1428 is retained in the region 1432 as a final ILD material. In another embodiment, the material of the photobucket 1428 is modified, e.g., by cross-linking, in the region 1432 to form a final ILD material. In yet another embodiment, the material of the photobucket 1428 in the region 1432 is replaced by a final ILD material. In any case, region 1432 can also be referred to as plug 1432.

Referring again to FIG. 14L, to form openings 1430, lithography is used to expose the corresponding photobuckets 1428. However, the lithographic constraints may be relaxed and misalignment tolerance may be high since the photobuckets 1428 are surrounded by non-photolyzable materials. Furthermore, in an embodiment, instead of exposing at, e.g. 30 mJ/cm2, such photobuckets might be exposed at, e.g., 3 mJ/cm2. Normally this would result in very poor CD control and roughness. But in this case, the CD and roughness control will be defined by the photobuckets 1428, which can be very well controlled and defined. Thus, the photobucket approach may be used to circumvent imaging/dose tradeoff which limits the throughput of next generation lithographic processes.

Referring again to FIG. 14L, in an embodiment, the resulting structure includes a uniform ILD structure (plug 1432+ILD 1424+ILD lines 1404+ILD lines 1416). In one such embodiment, two or more of plug 1432, ILD 1424, ILD lines 1404 and ILD line 1416 are composed of a same material. In another such embodiment, plug 1432, ILD 1424, ILD lines 1404 and ILD lines 1416 are composed of different ILD materials. In either case, in a specific embodiment, a distinction such as a seam between the materials of plug 1432 and ILD lines 1404 (e.g., seam 1499) and/or between plug 1432 and ILD lines 1416 (e.g., seam 1496) is observed in the final structure.

FIG. 14M illustrates the structure of FIG. 14L following removal of the hardmask layer of FIG. 14L, in accordance with an embodiment of the present disclosure. Referring to FIG. 14M, the hardmask layer 1426 is selectively removed to form metal line and via openings 1434. In one such embodiment, the hardmask layer 1426 is composed substantially of carbon and is removed selectively with an ash process.

FIG. 14N illustrates the structure of FIG. 14M following metal line and via formation, in accordance with an embodiment of the present disclosure. Referring to FIG. 14N, metal lines 1434 and vias (one shown as 1438) are formed upon metal fill of the openings 1434 of FIG. 14M. The metal lines 1436 are coupled to the underlying metal lines 1408 by vias 1438 and are interrupted by plugs 1432. In an embodiment, openings 1434 are filled in a damascene approach, where metal is used to overfill the openings and is then planarized back to provide the structure shown in FIG. 14N. Thus, the metal (e.g., copper and associated barrier and seed layers) deposition and planarization process to form metal lines and vias in the above approach may be that typically used for standard back end of line (BEOL) single or dual damascene processing. In an embodiment, in subsequent fabrication operations, the ILD lines 1416 may be removed to provide air gaps between the resulting metal lines 1436.

The structure of FIG. 14N may subsequently be used as a foundation for forming subsequent metal line/via and ILD layers. Alternatively, the structure of FIG. 14N may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be highly self-aligned in both directions. As such, in an embodiment, offset due to conventional lithograph/dual damascene patterning that must otherwise be tolerated, is not a factor for the resulting structures described herein. Referring again to FIG. 14N, then, self-aligned fabrication by the subtractive approach may be complete at this stage. A next layer fabricated in a like manner may involve performing the described process once again. Alternatively, other approaches may be used at this stage to provide additional interconnect layers, such as conventional dual or single damascene approaches.

The above described process flow involves use of deep trench etching. In another aspect, a shallower approach involves a plug-only self-aligned subtractive processing scheme. As an example, FIGS. 15A-15D illustrate portions of integrated circuit layers representing various operations in a method of subtractive self-aligned plug patterning, in accordance with another embodiment of the present disclosure. In each illustration at each described operation, plan views are shown on top, and corresponding cross-sectional views are shown on the bottom. These views will be referred to herein as corresponding cross-sectional views and plan views.

Figure 15A:
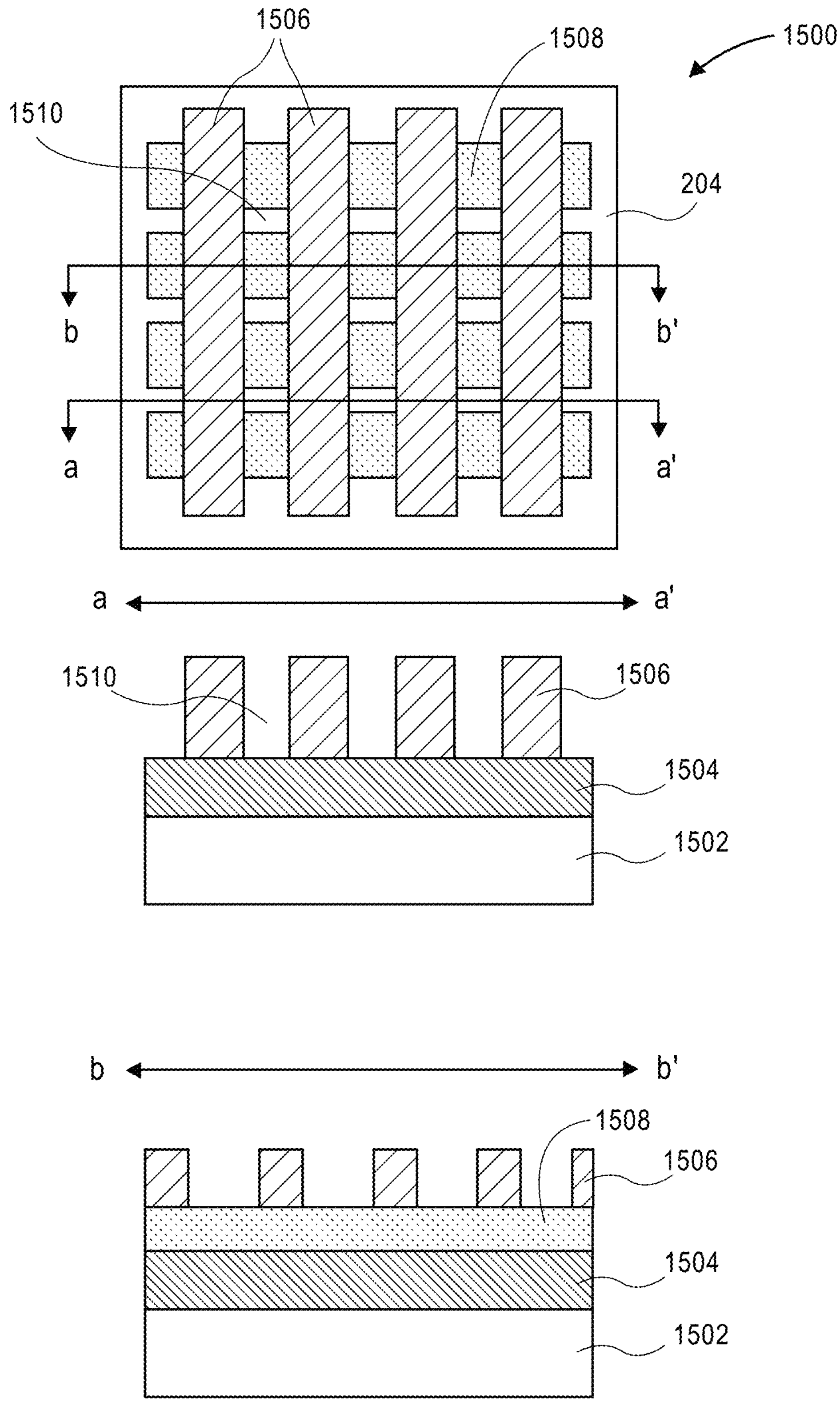
FIGS. 15A-15D illustrate portions of integrated circuit layers representing various operations in a method of subtractive self-aligned plug patterning, in accordance with another embodiment of the present disclosure.

FIG. 15A illustrates a plan view and corresponding cross-sectional views of a starting plug grid, in accordance with an embodiment of the present disclosure. Referring to the plan view and corresponding cross-sectional views (a) and (b) taken along axes a-a' and b-b', respectively, a starting plug grid structure 1500 includes an ILD layer 1502 having a first hardmask layer 1504 disposed thereon. A second hardmask layer 1508 is disposed on the first hardmask layer 1504 and is patterned to have a grating structure. A third hardmask layer 1506 is disposed on the second hardmask layer 1508 and on the first hardmask layer 1504. Additionally, openings 1510 remain between the grating structure of the second hardmask layer 1508 and the third hardmask layer 1506.

Figure 15B:
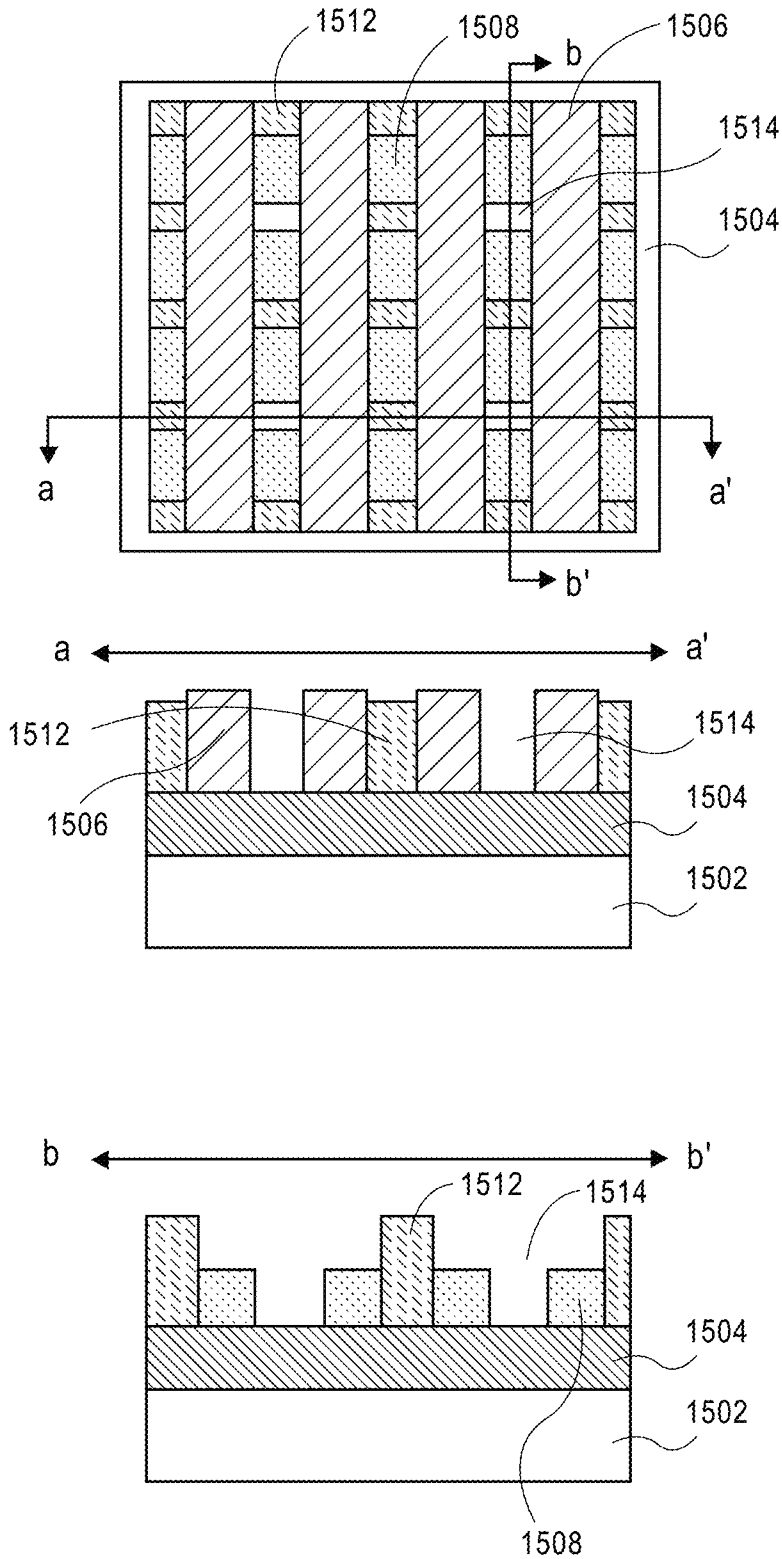

FIG. 15B illustrates a plan view and corresponding cross-sectional views of the structure of FIG. 15A following photobucket fill, exposure and development, in accordance with an embodiment of the present disclosure. Referring to the plan view and corresponding cross-sectional views (a) and (b) taken along axes a-a' and b-b', respectively, photobuckets 1512 are formed in the openings 1510 of FIG. 15A. Subsequently, select photobuckets are exposed and removed to provide selected plug locations 1514, as depicted in FIG. 15B.

Figure 15C:
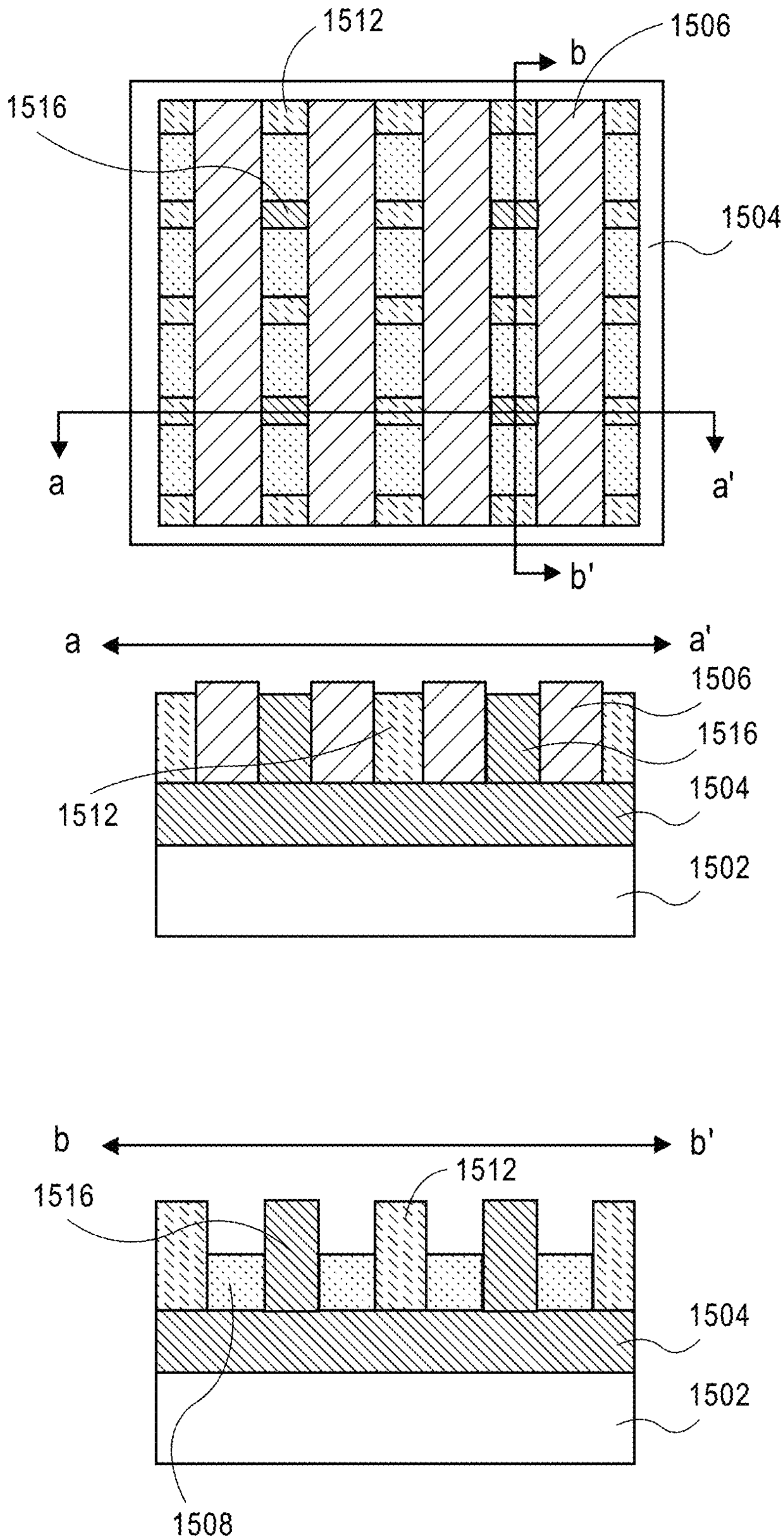

FIG. 15C illustrates a plan view and corresponding cross-sectional views of the structure of FIG. 15B following plug formation, in accordance with an embodiment of the present disclosure. Referring to the plan view and corresponding cross-sectional views (a) and (b) taken along axes a-a' and b-b', respectively, plugs 1516 are formed in the openings 1514 of FIG. 15B. In one embodiment, the plugs 1516 are formed by a spin-on approach and/or a deposition and etch back approach.

Figure 15D:
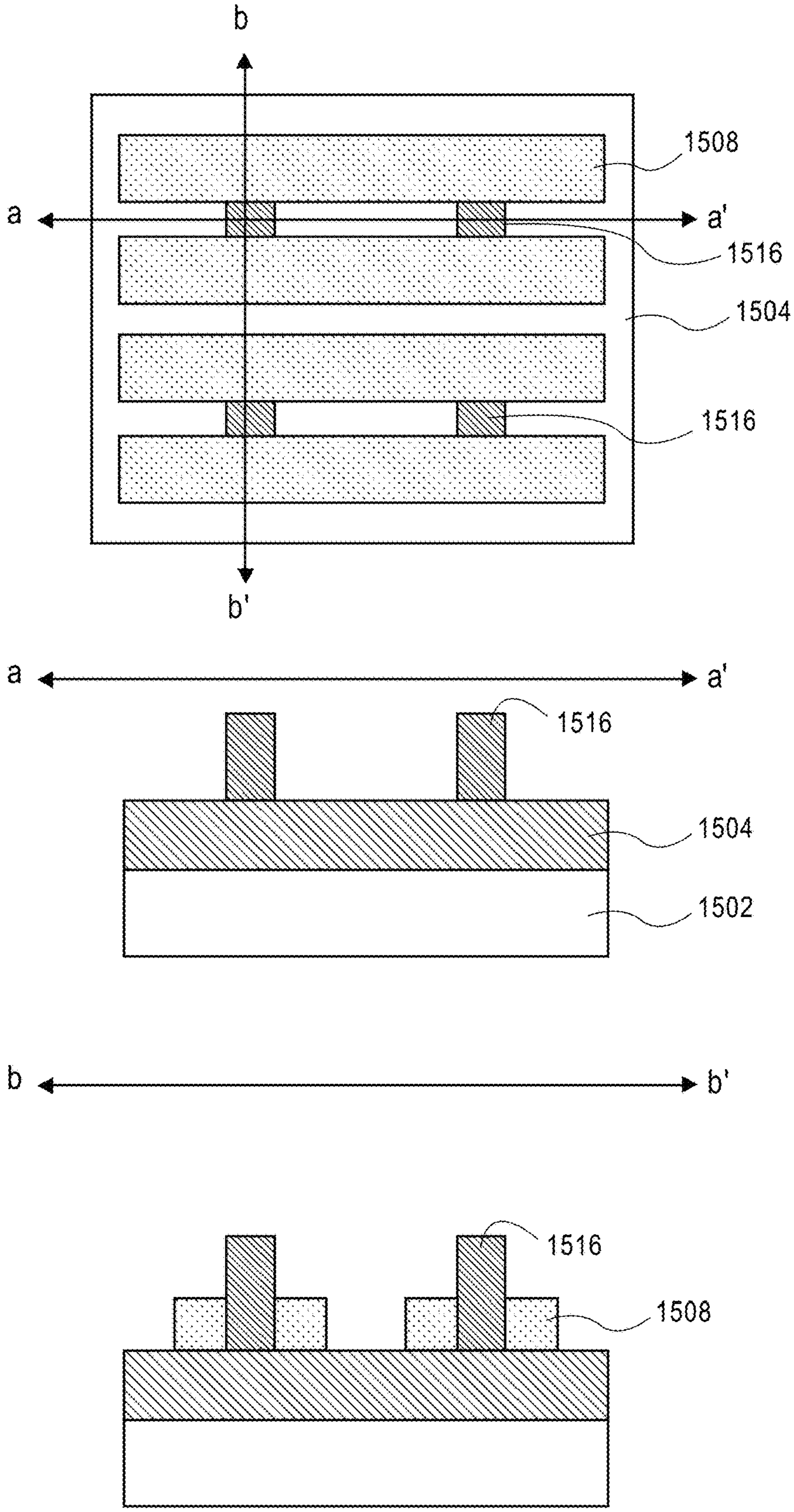

FIG. 15D illustrates a plan view and corresponding cross-sectional views of the structure of FIG. 15C following removal of a hardmask layer and the remaining photobuckets, in accordance with an embodiment of the present disclosure. Referring to the plan view and corresponding cross-sectional views (a) and (b) taken along axes a-a' and b-b', respectively, the third hardmask layer 1506 is removed, leaving the second hardmask layer 1508 and the plugs 1516. The resulting pattern (second hardmask layer 1508 and plugs 1516) can subsequently be used to pattern hardmask layer 1504 for ultimate patterning of ILD layer 1502. In one embodiment, the third hardmask layer 1506 is composed substantially of carbon and is removed by performing an ash process.

Thus, the structure of FIG. 15D may subsequently be used as a foundation for forming ILD line and plug patterns. It is to be appreciated that the above process operations may be practiced in alternative sequences, not every operation need be performed and/or additional process operations may be performed. In any case, the resulting structures enable fabrication of self-aligned plugs. As such, in an embodiment, offset due to conventional lithograph/dual damascene patterning that must otherwise be tolerated, is not a factor for the resulting structures described herein.

In accordance with an embodiment of the present disclosure, dielectric helmet-based approaches and/or hardmask selectivity-based approaches for back end of line (BEOL) interconnect fabrication, and the resulting structures, are described. One or more embodiments described herein are directed to methods of using a dielectric helmet for directed self-assembly (DSA) or selective growth to enable the fabrication of self-aligned interconnects. Embodiments may address or implement one or more of the use of a dielectric helmet, directed self-assembly, selective deposition, self-alignment, or patterning interconnects at tight pitch. Embodiments may be implemented to provide improved via shorting margin by self-alignment with "coloring" through selective deposition, and subsequent directed self-assembly, e.g., for sub-10 nm technology nodes.

To provide context, current solutions to improve shorting margin may include: (1) using metal recess to fill alternate metal trenches with different hard masks, (2) using different "color" metal caps to as a template for directed self-assembly (DSA) or selective growth, or (3) recessing the metal or ILD to "steer" the via towards the line of interest. Overall, typical process flows for improving via shorting margin require a metal recess. However, recessing metal with acceptable uniformity has proven to be a challenge in many such processing schemes.

In accordance with an embodiment of the present disclosure, one or more of the above issues is addressed by implementing a method of depositing a non-conformal dielectric cap on half of a population of interconnects. The non-conformal dielectric cap is used as a template for selective growth or directed self-assembly. In one such embodiment, such an approach may be applied to any interconnect metal layer and, possibly, to gate contacts. In a specific embodiment, a need for metal recess as is seen in state-of-the art approaches is effectively eliminated from the processing schemes described herein.

As a general overview of concepts involved herein, FIGS. 16A-16D illustrate cross-sectional views of portions of integrated circuit layers representing various operations in a method involving dielectric helmet formation for back end of line (BEOL) interconnect fabrication, in accordance with an embodiment of the present disclosure.

Figure 16A:
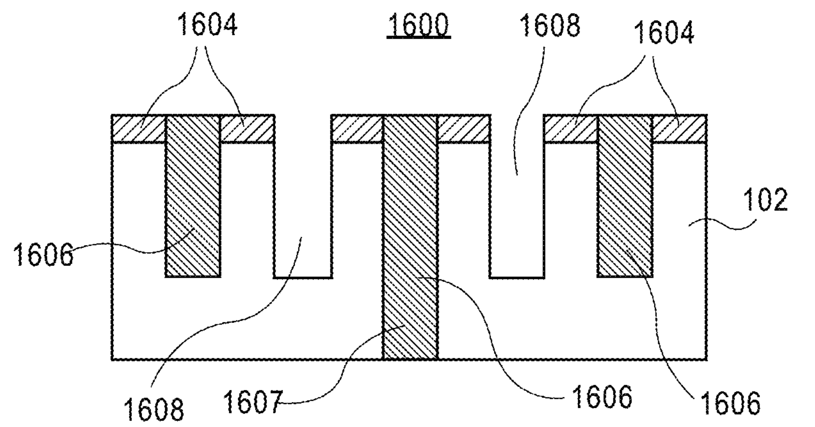
FIGS. 16A-16D illustrate cross-sectional views of portions of integrated circuit layers representing various operations in a method involving dielectric helmet formation for back end of line (BEOL) interconnect fabrication, in accordance with an embodiment of the present disclosure.

Referring to FIG. 16A, a starting point structure 1600 is provided as a beginning point for fabricating a new metallization layer. The starting point structure 1600 includes a hardmask layer 1604 disposed on an inter-layer dielectric (ILD) layer 1602. As described below, the ILD layer may be disposed above a substrate and, in one embodiment, is disposed over an underlying metallization layer. Openings are formed in the hardmask layer 1604 which correspond to trenches formed in the ILD layer 1602. Alternating one of the trenches are filled with a conductive layer to provide first metal lines 1606 (and, in some cases, corresponding conductive vias 1607). The remaining trenches are not filled, providing open trenches 1608. In an embodiment, the starting structure 1600 is fabricated by patterning a hardmask and ILD layer and then metallizing half of the population of metal trenches (e.g., alternating one of the trenches), leaving the other half of the population open. In one embodiment, the trenches in the ILD are patterned using a pitch division patterning process flow. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Figure 16B:
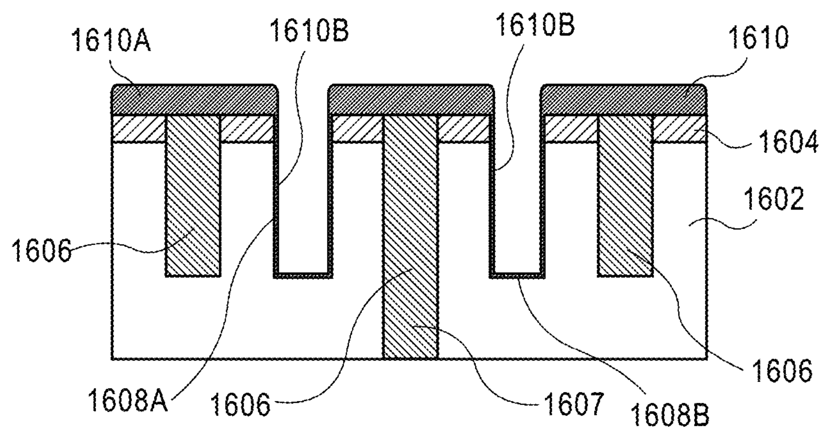

FIG. 16B illustrates the structure of FIG. 16A following deposition of a non-conformal dielectric cap layer 1610 over the structure 1600. The non-conformal dielectric cap layer 1610 includes a first portion 1600A that covers exposed surfaces of the hardmask layer 1604 and the metal lines 1606. The non-conformal dielectric cap layer 1610 includes a second portion 1610B continuous with the first portion 1610A. The second portion 1610B of the non-conformal dielectric cap layer 1610 is formed in the open trenches 1608, along sidewalls 1608A and the bottom 1608B of the open trenches 1608. In an embodiment, the second portion 1610B of the non-conformal dielectric cap layer 1610 is substantially thinner than the first portion 1610A, as is depicted in FIG. 16B. In other embodiments, portion 1610B is nonexistent or is discontinuous. In this way, the deposition of the non-conformal dielectric cap layer 1610 is considered to be a non-conformal deposition since the thickness of non-conformal dielectric cap layer 1610 is not the same in all locations. The resulting geometry may be referred to as a helmet shape for the non-conformal dielectric cap layer 1610 since the uppermost portions of the ILD layer 1602 have the thickest portion of the non-conformal dielectric cap layer 1610 thereon and, thus, are protected to a greater extent than other regions. In one embodiment, the non-conformal dielectric cap layer 1610 is a dielectric material such as, but not limited to silicon nitride or silicon oxy-nitride. In one embodiment, the non-conformal dielectric cap layer 1610 is formed using a plasma-enhanced chemical vapor deposition (PECVD) process or, in another embodiment physical vapor deposition (PVD).

Figure 16C:
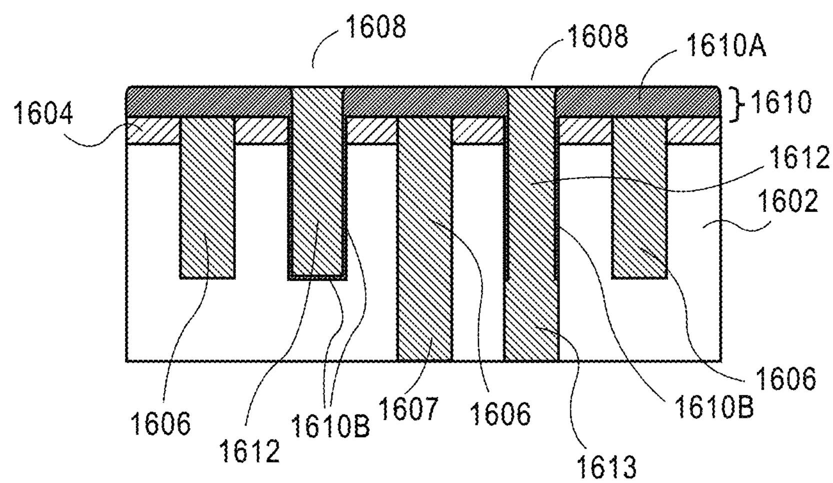

FIG. 16C illustrates the structure of FIG. 16B following via patterning, metallization, and planarization of the second half of the metal lines. In an embodiment, a metal fill process is performed to provide second metal lines 1612. In one embodiment, however, prior to the metal fill, via locations are first selected and opened. Then, upon metal fill, vias 1613 are formed as associated with certain ones of the second metal lines 1612. In one such embodiment, via openings are formed by extending certain one of the open trenches 1608 by etching through the non-conformal dielectric cap layer 1610 at the bottom of the select trenches 1608 and then extended the trench through the dielectric layer 1602. The result is a breaking of the continuity of the non-conformal dielectric cap layer 1610 at the via locations of the second metal lines 1612, as is depicted in FIG. 16C.

In an embodiment, the metal fill process used to form second metal lines 1612 and conductive vias 1613 is performed using a metal deposition and subsequent planarization processing scheme, such as a chemical mechanical planarization (CMP) process. The planarization process exposes, but does not remove, the non-conformal dielectric cap layer 1610, as is depicted in FIG. 16C. It is to be appreciated that, in an embodiment, since the second metal lines 1612 (and corresponding conductive vias 1613) are formed in a later process than the process used to fabricate first metal lines 1606 (and corresponding conductive vias 1607), the second metal lines 1612 can be fabricated using a different material than is used to fabricate the first metal lines 1606. In one such embodiment, a metallization layer ultimately includes conductive interconnects of alternating, differing first and second compositions. In another embodiment, however, the metal lines 1612 and 1606 are fabricated from substantially the same material.

In an embodiment, the first metal lines 1606 are spaced apart by a pitch, and the second metal lines 1612 are spaced apart by the same pitch. In other embodiments, the lines are not necessarily spaced by a pitch. However, by inclusion of the non-conformal dielectric cap layer 1610, or dielectric helmet, only the surfaces of the second metal lines 1612 are exposed. As a result, the pitch between neighboring first and second metal lines that would otherwise be exposed is relaxed to only the pitch of the second metal lines. Thus, alternating exposed dielectric surfaces of the non-conformal dielectric cap layer 1610 and exposed surfaces of the second metal lines 1612 provide a differentiated surface at the pitch of the second metal lines 1612.

Figure 16D:
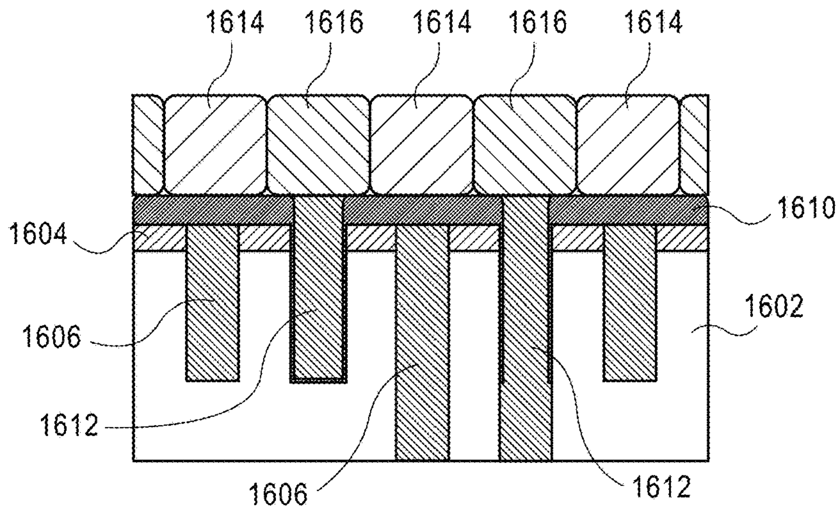

FIG. 16D illustrates the structure of FIG. 16C following a directed self-assembly or selective deposition approach to ultimately form two different, alternating, first and second hardmask layers 1614 and 1616, respectively. In an embodiment, the materials of the hardmask layers 1614 and 1616 exhibit differing etch selectivity to one another. The first hardmask layer 1614 is aligned with exposed regions of the non-conformal dielectric cap layer 1610. The second hardmask layer 1616 is aligned with exposed regions of the second metal lines 1612. As described in greater detail below, directed self-assembly or selective growth can be used to align the first and second hardmask layers 1614 and 1616 selectively to dielectric and metal surfaces, respectively.

In a first general embodiment, in order to ultimately form first and second hardmask layers 1614 and 1616, a direct self-assembly (DSA) block co-polymer deposition and polymer assembly process is performed. In an embodiment, a DSA block co-polymer is coated on the surface and annealed to segregate the polymer into first blocks and second blocks. In one embodiment, the first polymer blocks preferentially attaches to the non-conformal dielectric cap layer 1610. The second polymer blocks adhere to the second metal lines 1612. In an embodiment, the block copolymer molecule is a polymeric molecule formed of a chain of covalently bonded monomers, examples of which are described above.

Referring again to FIG. 16D, in the case of a DSA process, in a first embodiment, the first and second hardmask layers 1614 and 1616 are the first and second block polymers, respectively. In a second embodiment, however, the first and second block polymers are each sequentially replaces with the materials of the first and second hardmask layers 1614 and 1616. In one such embodiment, selective etching and deposition process are used to replace the first and second block polymers with the materials of the first and second hardmask layers 1614 and 1616, respectively.

In a second general embodiment, in order to ultimately form first and second hardmask layers 1614 and 1616, a selective growth process is instead of a DSA approach. In one such embodiment, the material of the first hardmask layer 1614 is grown above exposed portions of the underlying non-conformal dielectric cap layer 1610. A second, different, material of the second hardmask layer 1616 is grown above exposed portions of underlying second metal lines 1612. In an embodiment, the selective growth is achieved by a dep-etch-dep-etch approach for each of the first and second materials, resulting in a plurality of layers of each of the materials. Such an approach may be favorable versus conventional selective growth techniques which can form “mushroom-top” shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

As described in greater detail below, in an embodiment, the resulting structure of FIG. 16D enables improved via shorting margins when fabricating later via layers on the structure of FIG. 16D. In one embodiment, improved shorting margin is achieved since fabricating a structure with alternating “color” hardmasks reduces the risk of a via shorting to the wrong metal line. In one embodiment, self-alignment is achieved since the alternating color hard masks are self-aligned to the metal trenches beneath. In one embodiment, the need for a metal recess is removed from the processing scheme since which can reduce process variation.

In a first more detailed exemplary process flow, FIGS. 16E-16P illustrate cross-sectional views of portions of integrated circuit layers representing various operations in another method involving dielectric helmet formation for back end of line (BEOL) interconnect fabrication, in accordance with an embodiment of the present disclosure.

Figure 16E:
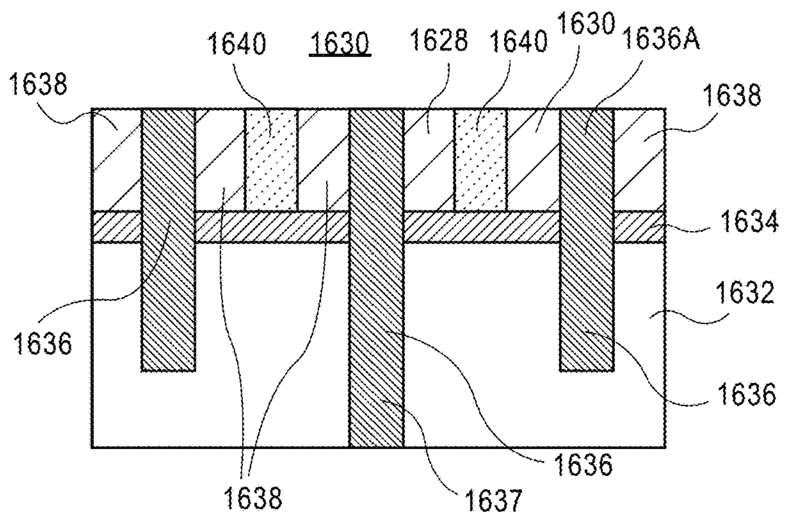
FIGS. 16E-16P illustrate cross-sectional views of portions of integrated circuit layers representing various operations in another method involving dielectric helmet formation for back end of line (BEOL) interconnect fabrication, in accordance with an embodiment of the present disclosure.

Referring to FIG. 16E, a starting point structure 1630 is provided following first metal pass processing as a beginning point for fabricating a new metallization layer. The starting point structure 1630 includes a hardmask layer 1634 (e.g., silicon nitride) disposed on an inter-layer dielectric (ILD) layer 1632. As described below, the ILD layer may be disposed above a substrate and, in one embodiment, is disposed over an underlying metallization layer. First metal lines 1636 (and, in some cases, corresponding conductive vias 1637) are formed in the ILD layer 1632. Protruding portions 1636A of the metal lines 1636 have adjacent dielectric spacers 1638. A sacrificial hardmask layer 1640 (e.g., amorphous silicon) is included between neighboring dielectric spacers 1638. Although not depicted, in one embodiment, the metal lines 1636 are formed by first removal of a second sacrificial hardmask material between dielectric spacers 1638 and then etching of the hardmask layer 1634 and the ILD layer 1632 to form trenches which are then filled in a metallization process.

Figure 16F:
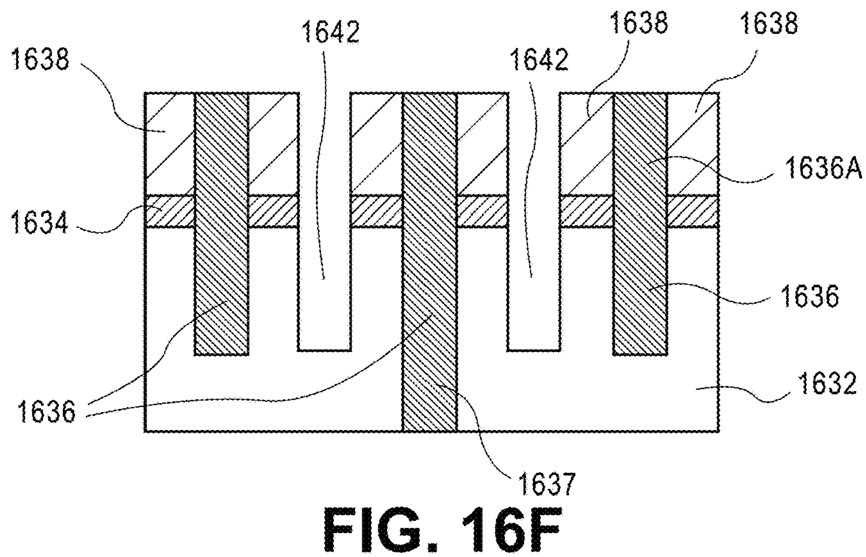

FIG. 16F illustrates the structure of FIG. 16E following second pass metal processing up to an including trench etch. Referring to FIG. 16F, sacrificial hardmask layer 1640 is removed to expose hardmask layer 1634. Exposed portions of the hardmask layer 1634 are removed and trenches 1642 are formed in the ILD layer 1632.

Figure 16G:
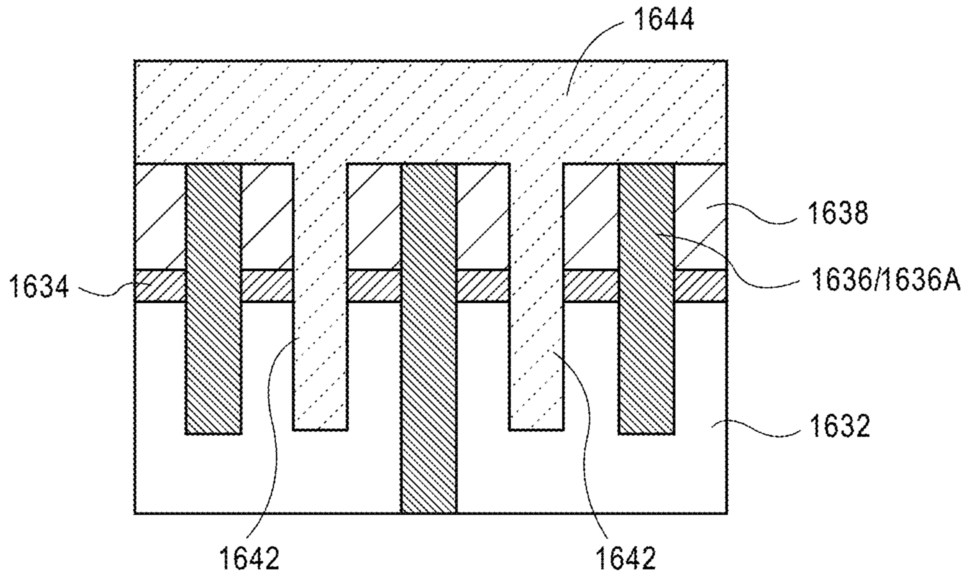

FIG. 16G illustrates the structure of FIG. 16F following sacrificial material fill. A sacrificial material 1644 is formed in the trenches 1642 and over the spacers 1638 and metal lines 1636. In an embodiment the sacrificial material 1644 is formed in a spin-on process, leaving a substantially flat layer, as is depicted in FIG. 16G.

Figure 16H:
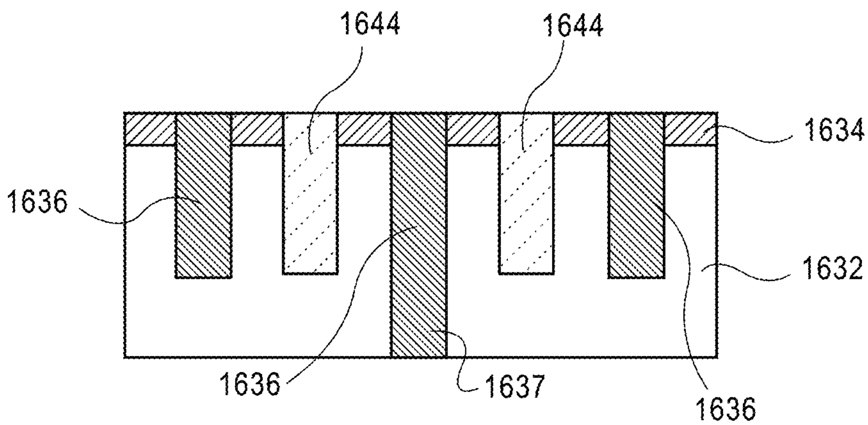

FIG. 16H illustrates the structure of FIG. 16G following a planarization process to re-expose the hardmask layer 1634, to remove the dielectric spacers 1638, and to remove protruding portions 1636A of the metal lines 1636. Additionally, the planarization process confined the sacrificial material 1644 to the trenches 1642 formed in dielectric layer 1632. In an embodiment, the planarization process is performed using a chemical mechanical polishing (CMP) process.

Figure 16I:
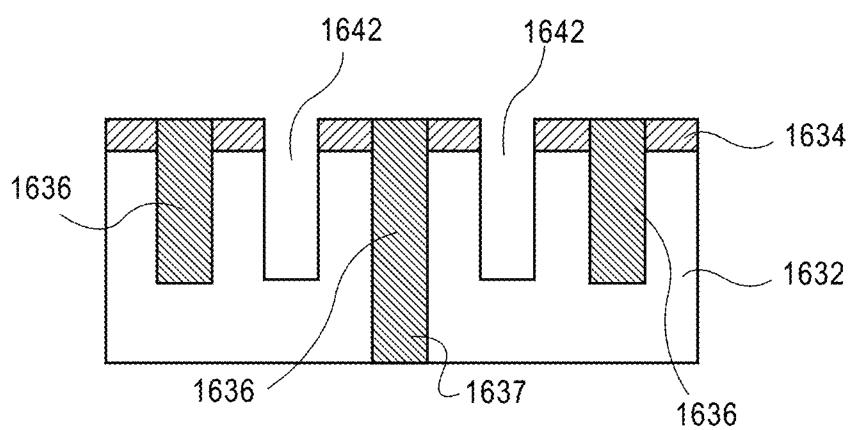

FIG. 16I illustrates the structure of FIG. 16H following sacrificial material removal. In an embodiment, the sacrificial material 1644 is removed from trenches 1642 using a wet etch or dry etch process.

Figure 16J:
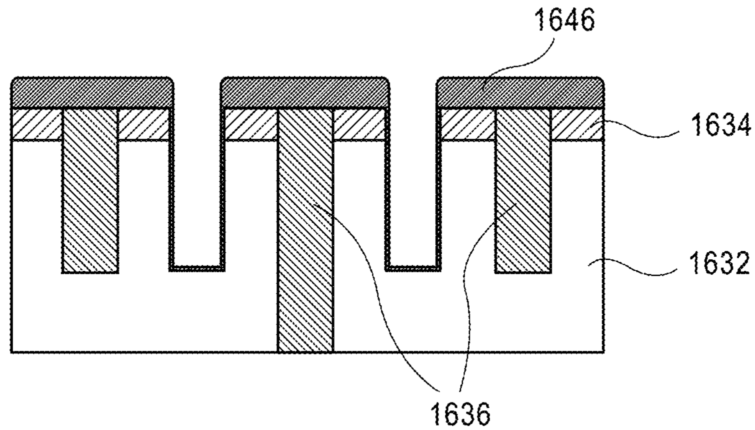

FIG. 16J illustrates the structure of FIG. 16I following deposition of a non-conformal dielectric cap layer 1646, which may be referred to as a dielectric helmet. In an embodiment, the non-conformal dielectric cap layer 1646 is formed using a physical vapor deposition (PVD) or chemical vapor deposition (CVD) process such as a plasma-enhanced CVD (PECVD) process. The non-conformal dielectric cap layer 1646 may be as described above in association with the non-conformal dielectric cap layer 1610.

Figure 16K:
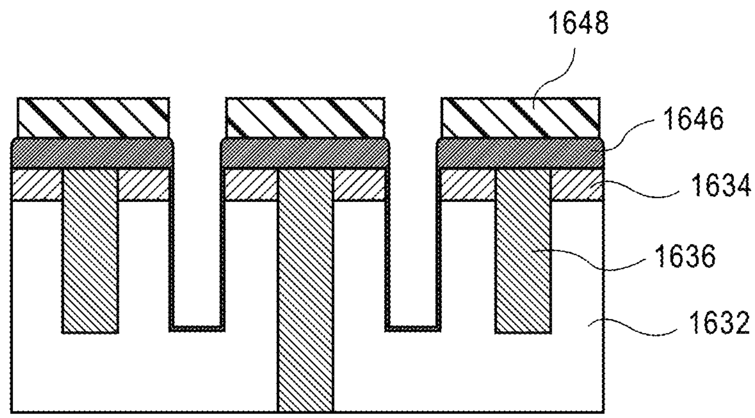

FIG. 16K illustrates the structure of FIG. 16J following deposition of a sacrificial cap layer. A sacrificial cap layer 1648 is formed on upper surfaces of the non-conformal dielectric cap layer 1646, and may be implemented to protect the non-conformal dielectric cap layer 1646 during a subsequent etch or CMP process. In an embodiment, the sacrificial cap layer 1648 is a titanium nitride (TiN) layer formed by, e.g., PVD or CVD processing.

Figure 16L:
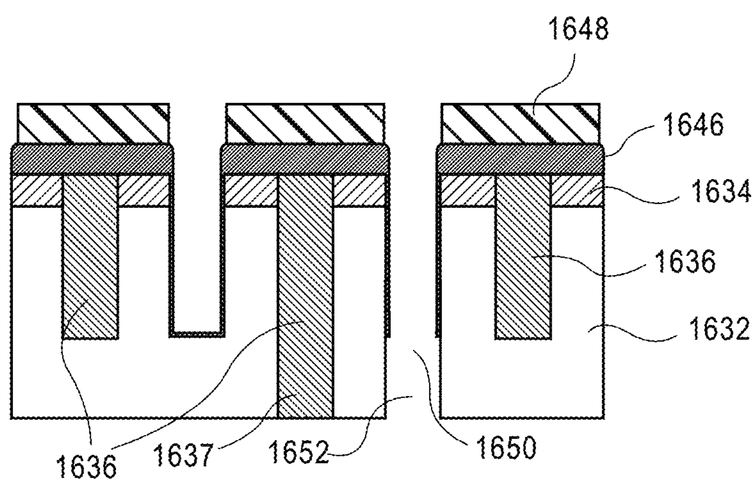

FIG. 16L illustrates the structure of FIG. 16K following via lithography and etch processing. Select ones of the trenches 1638 are exposed and subject to an etch process that breaks through the non-conformal dielectric cap layer 1646 at location 1650 and extends the trench to provide a via location 1652, as was described above.

Figure 16M:
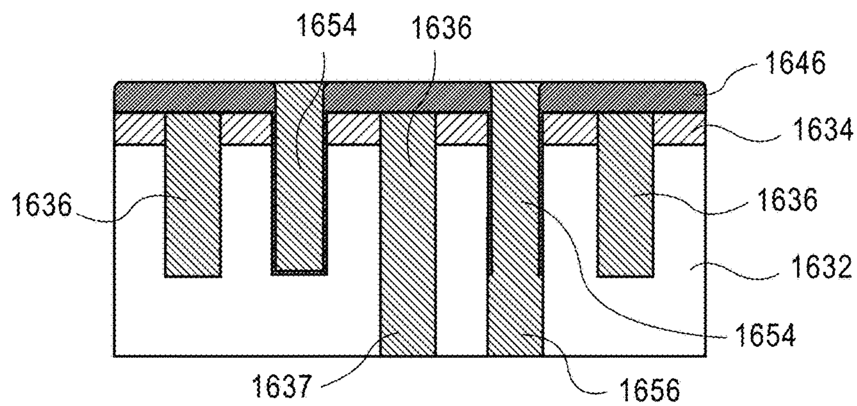

FIG. 16M illustrates the structure of FIG. 16L following second metal line fabrication. In an embodiment, second metal lines 1654 (and in some cases, associated conductive vias 1656) are formed by performing a metal fill and polish process. The polish process may be a CMP process that further removes the sacrificial cap layer 1648.

Figure 16N:
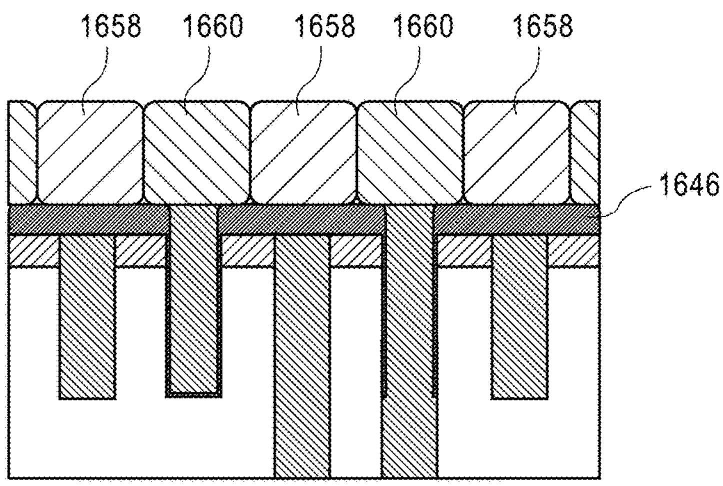

FIG. 16N illustrates the structure of FIG. 16M following directed self-assembly (DSA) or selective growth, e.g., to provide first and second alternating placeholder materials 1658 and 1660 (or can be permanent materials, as described in association with FIG. 16D).

Figure 16O:
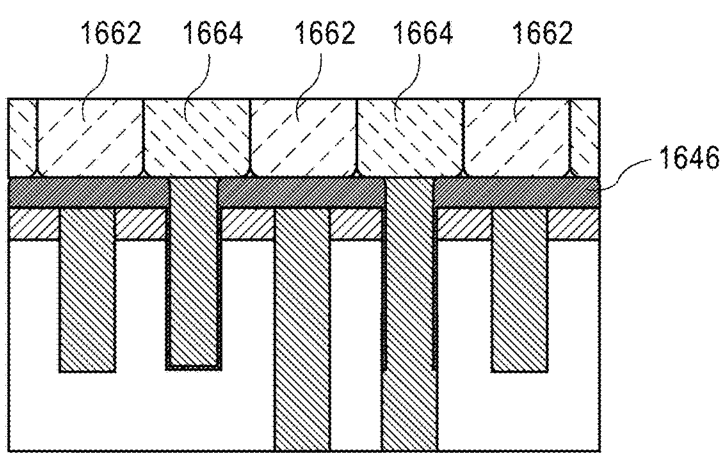

FIG. 16O illustrates the structure of FIG. 16N following replacement of the first and second alternating placeholder materials 1658 and 1660 with permanent first and second hardmask layers 1662 and 1664, respectively. The processing for FIGS. 16N and 16O may be as described in association with FIG. 16D.

Figure 16P:
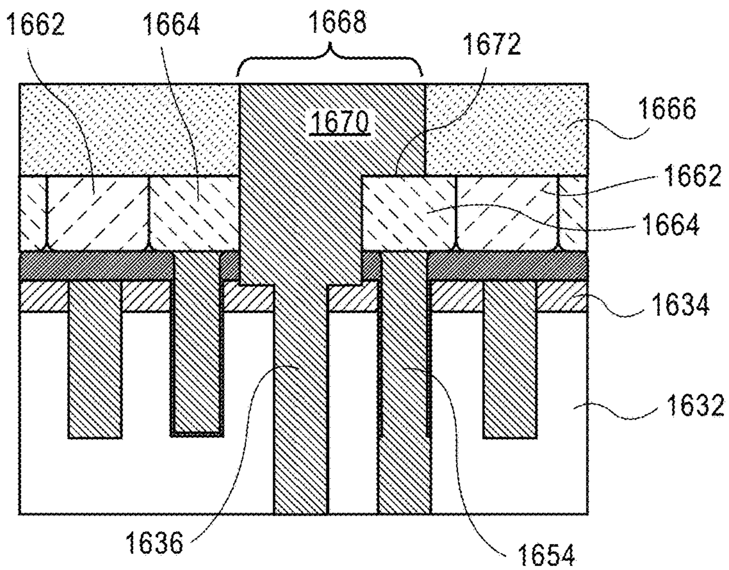

FIG. 16P illustrates the structure of FIG. 16O following next layer via patterning. An upper ILD layer 1666 is formed above the first and second hardmask layers 1662 and 1664. An opening 1668 is formed in the upper ILD layer 1666. In one embodiment, the opening 1668 is formed wider than a via feature size. A select one of the exposed first and second hardmask layers 1662 and 1664 locations is selected for selective removal, e.g., by a selective etch process. In this case, a first hardmask 1662 region is removed selective to exposed portions of the second hardmask layer and 1664. A conductive via 1670 is then formed in the opening 1668 and in the regions where the first hardmask 1662 region has been removed. The conductive via 1670 contacts one of the first metal lines 1636. In an embodiment, the conductive via 1670 contacts one of the first metal lines 1636 without shorting to one of the adjacent second metal lines 1654. In a specific embodiment, a portion 1672 of the conductive via 1670 is disposed on a second hardmask layer 1664 portion without contacting an underlying second metal line 1654, as is depicted in FIG. 16P. In an embodiment, then, an improved shorting margin is realized.

In an embodiment, as described in the embodiment above, a first hardmask 1662 region is removed for via 1670 fabrication. In this case, forming the opening upon removal of the selected first hardmask 1662 region further requires etching through an uppermost portion of the non-conformal dielectric cap layer 1646. In another embodiment, however, a second hardmask 1664 region is removed for via 1670 fabrication. In this case, forming the opening upon removal of such a selected second hardmask 1664 region directly exposes the metal line 1654 to which the via 1670 is connected.

In a second more detailed exemplary process flow, involving a via etch first approach, FIGS. 17A-17J illustrate cross-sectional views of portions of integrated circuit layers representing various operations in another method involving dielectric helmet formation for back end of line (BEOL) interconnect fabrication, in accordance with an embodiment of the present disclosure.

Figure 17A:
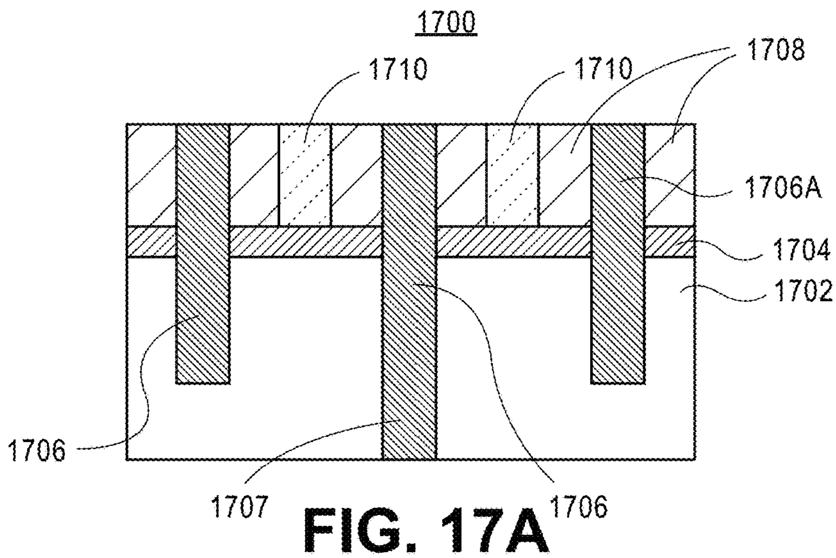
FIGS. 17A-17J illustrate cross-sectional views of portions of integrated circuit layers representing various operations in another method involving dielectric helmet formation for back end of line (BEOL) interconnect fabrication, in accordance with an embodiment of the present disclosure.

Referring to FIG. 17A, a starting point structure 1700 is provided following first metal pass processing as a beginning point for fabricating a new metallization layer. The starting point structure 1700 includes a hardmask layer 1704 (e.g., silicon nitride) disposed on an inter-layer dielectric (ILD) layer 1702. As described below, the ILD layer may be disposed above a substrate and, in one embodiment, is disposed over an underlying metallization layer. First metal lines 1706 (and, in some cases, corresponding conductive vias 1707) are formed in the ILD layer 1702. Protruding portions 1706A of the metal lines 1706 have adjacent dielectric spacers 1708. A sacrificial hardmask layer 1710 (e.g., amorphous silicon) is included between neighboring dielectric spacers 1708. Although not depicted, in one embodiment, the metal lines 1706 are formed by first removal of a second sacrificial hardmask material between dielectric spacers 1708 and then etching of the hardmask layer 1704 and the ILD layer 1702 to form trenches which are then filled in a metallization process.

Figure 17B:
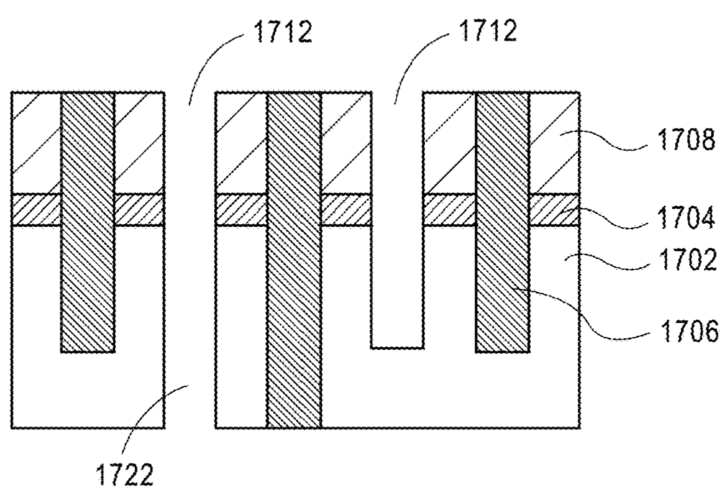

FIG. 17B illustrates the structure of FIG. 17A following second pass metal processing up to an including trench and via location etch. Referring to FIG. 17B, sacrificial hardmask layer 1710 is removed to expose hardmask layer 1704. Exposed portions of the hardmask layer 1704 are removed and trenches 1712 are formed in the ILD layer 1702. Additionally, in an embodiment, via locations 1722 are formed in select locations using a via lithography and etch process, as is depicted in FIG. 17B.

Figure 17C:
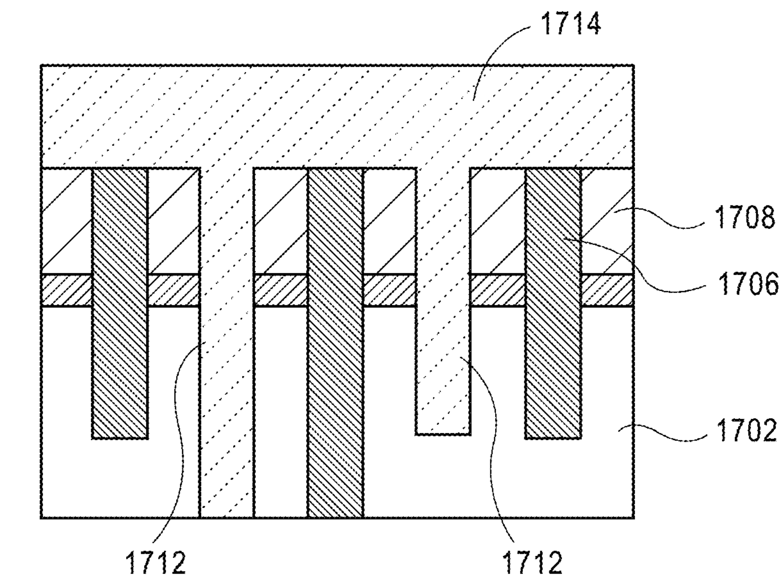

FIG. 17C illustrates the structure of FIG. 17B following sacrificial material fill. A sacrificial material 1714 is formed in the trenches 1712 and over the spacers 1708 and metal lines 1706. In an embodiment the sacrificial material 1714 is formed in a spin-on process, leaving a substantially flat layer, as is depicted in FIG. 17C.

Figure 17D:
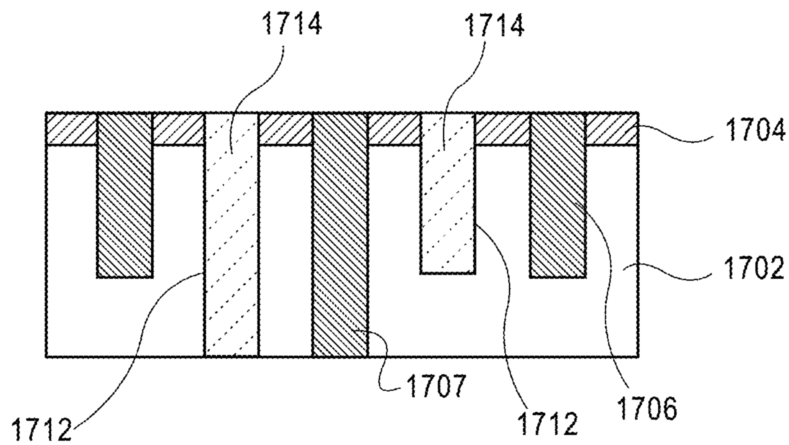

FIG. 17D illustrates the structure of FIG. 17C following a planarization process to re-expose the hardmask layer 1704, to remove the dielectric spacers 1708, and to remove protruding portions 1706A of the metal lines 1706. Additionally, the planarization process confined the sacrificial material 1714 to the trenches 1712 formed in dielectric layer 1702. In an embodiment, the planarization process is performed using a chemical mechanical polishing (CMP) process.

Figure 17E:
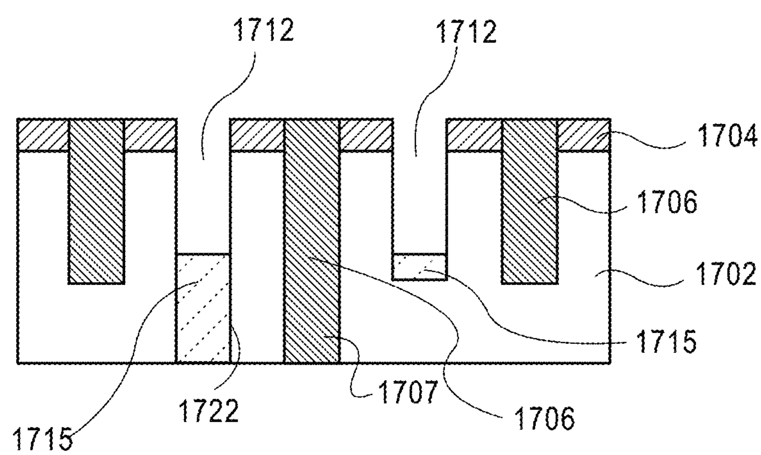

FIG. 17E illustrates the structure of FIG. 17D following partial removal of the sacrificial material 1714 to provide recessed sacrificial material 1715. In an embodiment, the sacrificial material 1714 is recessed within trenches 1712 using a wet etch or dry etch process. The recessed sacrificial material 1715 may be retained at this point to protect a metal layer underlying via location 1722.

Figure 17F:
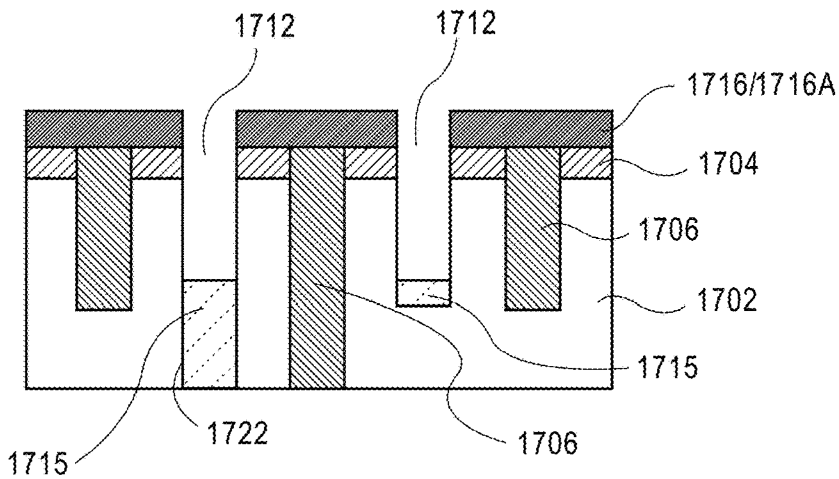

FIG. 17F illustrates the structure of FIG. 17E following deposition of a non-conformal dielectric cap layer 1716, which may be referred to as a dielectric helmet. In an embodiment, the non-conformal dielectric cap layer 1716 is formed using a physical vapor deposition (PVD), a selective growth process, or a chemical vapor deposition (CVD) process such as a plasma-enhanced CVD (PECVD) process. The non-conformal dielectric cap layer 1716 may be as described above in association with the non-conformal dielectric cap layer 1710. Alternatively, the non-conformal dielectric cap layer 1716 may only include upper portions 1716A, with essentially no portion of the non-conformal dielectric cap layer 1716 being formed in trenches 1712, as is depicted in FIG. 17F.

Figure 17G:
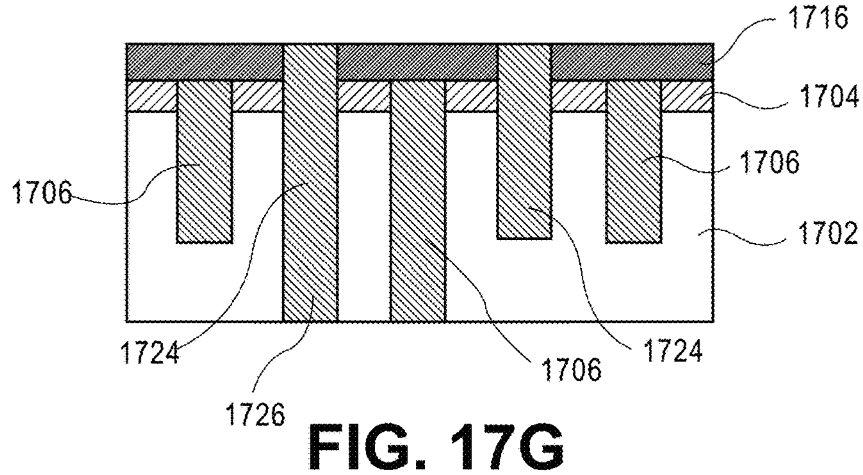

FIG. 17G illustrates the structure of FIG. 17F following second metal line fabrication. In an embodiment, second metal lines 1724 (and in some cases, associated conductive vias 1726) are formed by performing a metal fill and polish process subsequent to removal of the recessed sacrificial material 1715. The polish process may be a CMP process.

Figure 17H:
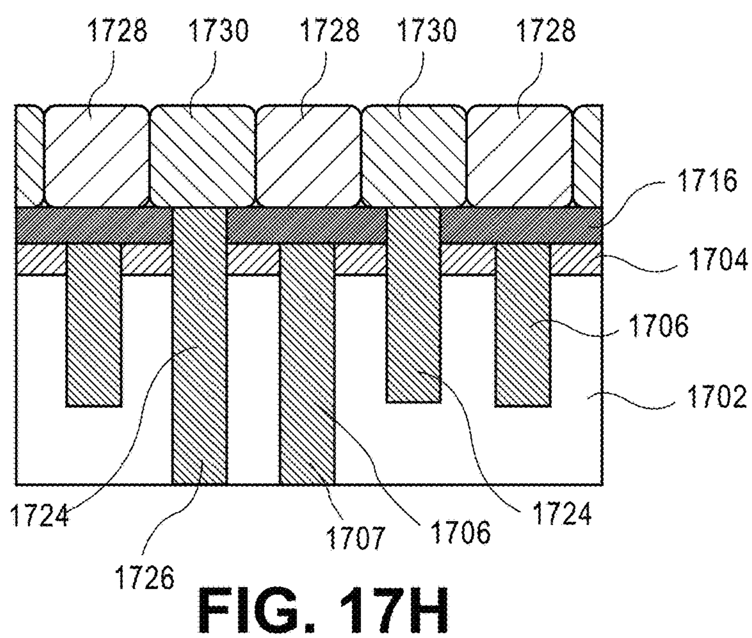

FIG. 17H illustrates the structure of FIG. 17G following directed self-assembly (DSA) or selective growth, e.g., to provide first and second alternating placeholder materials 1728 and 1730 (or can be permanent materials, as described in association with FIG. 16D).

Figure 17I:
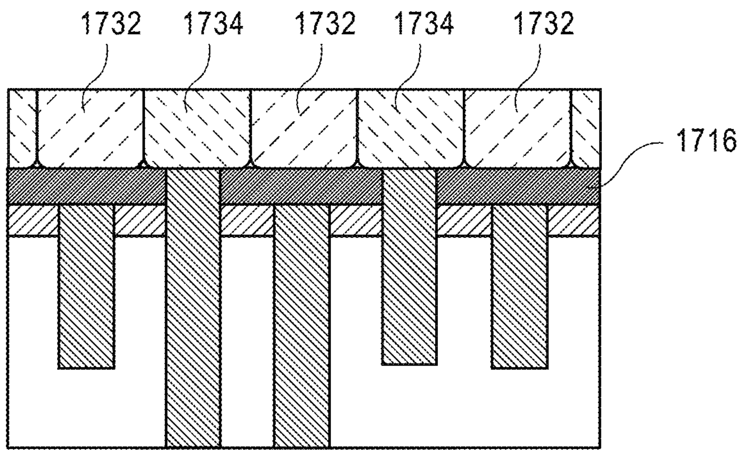

FIG. 17I illustrates the structure of FIG. 17H following replacement of the first and second alternating placeholder materials 1728 and 1730 with permanent first and second hardmask layers 1732 and 1734, respectively. The processing for FIGS. 17H and 3I may be as described in association with FIG. 16D.

Figure 17J:
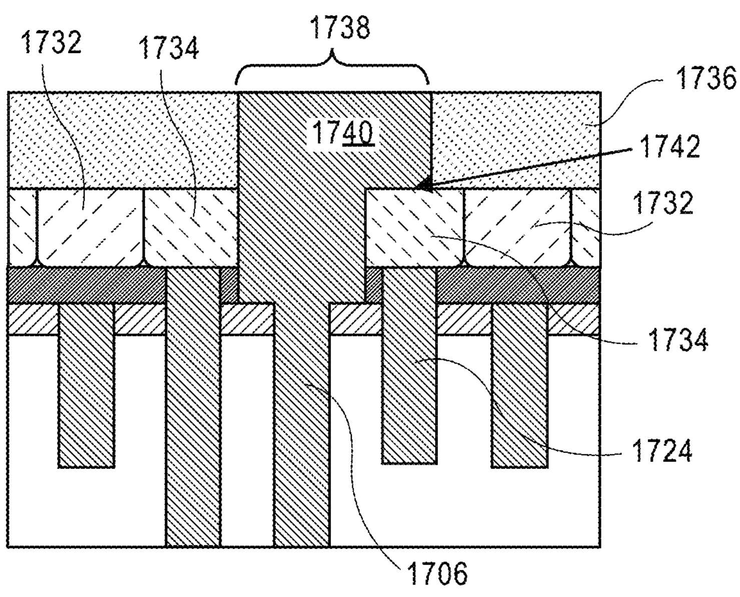

FIG. 17J illustrates the structure of FIG. 17I following next layer via patterning. An upper ILD layer 1736 is formed above the first and second hardmask layers 1732 and 1734. An opening 1738 is formed in the upper ILD layer 1736. In one embodiment, the opening 1738 is formed wider than a via feature size. A select one of the exposed first and second hardmask layers 1732 and 1734 locations is selected for selective removal, e.g., by a selective etch process. In this case, a first hardmask 1732 region is removed selective to exposed portions of the second hardmask layer and 1734. A conductive via 1740 is then formed in the opening 1738 and in the regions where the first hardmask 1732 region has been removed. The conductive via 1740 contacts one of the first metal lines 1706. In an embodiment, the conductive via 1740 contacts one of the first metal lines 1706 without shorting to one of the adjacent second metal lines 1724. In a specific embodiment, a portion 1742 of the conductive via 1740 is disposed on a second hardmask layer 1734 portion without contacting an underlying second metal line 1724, as is depicted in FIG. 17J. In an embodiment, then, an improved shorting margin is realized.

In an embodiment, as described in the embodiment above, a first hardmask 1732 region is removed for via 1740 fabrication. In this case, forming the opening upon removal of the selected first hardmask 1732 region further requires etching through an uppermost portion of the non-conformal dielectric cap layer 1716. In another embodiment, however, a second hardmask 1734 region is removed for via 1740 fabrication. In this case, forming the opening upon removal of such a selected second hardmask 1734 region directly exposes the metal line 1724 to which the via 1740 is connected.

Referring again to FIGS. 16P and 17J, by cross-section analysis, a dielectric helmet can be viewed over half the metal populations. Additionally, hardmasks of different materials are self-aligned to the dielectric helmet. Such structures may include one or more of a conductive via with improved shorting margin, alternating hardmask materials, the presence of a dielectric helmet. A resulting structure such as described in association with FIG. 16P or 17J may subsequently be used as a foundation for forming subsequent metal line/via and ILD layers. Alternatively, the structures of FIG. 16P or 17J may represent the final metal interconnect layer in an integrated circuit. It is to be appreciated that the above process operations may be practiced in alternative sequences, not every operation need be performed and/or additional process operations may be performed.

In accordance with an embodiment of the present disclosure, pattern accumulation layers for vias and plugs are described. One or more embodiments described herein are directed to process schemes for via critical dimension (CD) control. Embodiments may include improvements related to via CD control, via CD uniformity, edge placement error (EPE), via self-alignment. Embodiments may improve edge placement error (EPE) in semiconductor patterning of vias and may enable self-alignment of multiple via lithography passes. In an embodiment, all via edges are defined with gratings instead of standard resist edges. A sacrificial grating is created beneath the via resist in the same direction as the metal the vias are landing on. Vias are patterned with standard photoresist. However, during subsequent etches through the sacrificial grating and the grating of a self-aligned via (SAV) metal grating (e.g., two crossed gratings), all via edges are defined by the gratings. In an embodiment, no variability from the via resist edge is transferred into the substrate, and the resulting process capability enables better control of via CDs and improves yields and process capability.

To provide context for embodiments described below, currently known solutions involve the use of a resist edge to define a via edge which determines the shorting margin to the metal below. However, standard via resist patterning is known to have much higher edge placement error than grating patterning. By contrast, in accordance with embodiments described herein, by using a sacrificial grating to define via edge provides much improves control of the via edge, and the risk of shorting to the wrong metal is greatly improved.

In accordance with embodiments described herein, a pattern accumulation flow is described for multiple via patterns with a sacrificial grating in the stack to define via edges post etch. A "sieve" stack is built by coating a hardmask on a patterned upper metal (M1) inter-layer dielectric layer with plugs already present. The hardmask planarizes the wafer for subsequent processing. The next layer formed may be used as an etch stop, followed by formation of an accumulation layer. At this stage, a grating may be created at twice the pitch of the underlying lower metal (M0) layer and in the same direction as the M0 grating. This grating effectively blocks every other M0 lines below and ultimately defines the critical dimension (CD) of the via post etch. In an embodiment, since the grating is twice the pitch of the underlying M0, a substantial amount of hardmask (+/−20 nm) between vias is included to allow for edge placement error (EPE) of an overlying resist feature.

Next, multiple via mask patterns are accumulated through a grating and in an accumulation layer. After accumulation, the grating is inverted without an extra lithography operation in order to expose other lower metal (M0) lines and protect the vias which have already created. A liner is added between gratings to ensure vias on adjacent M0 lines do not merge. Spacing between vias can be modulated with the thickness of the liner.

Finally, the via patterns from one to several via masks can be accumulated through the inverted grating to complete patterning in the accumulation of all drawn vias. The grating is then removed and the accumulated via pattern in the accumulation layer is etched down through the upper metal (M1) hardmask grating into the inter-layer dielectric below the M1 lines and to the M0 below. The stack above the M1 grating and the overlying hardmask layer are removed. Subsequently, trenches and vias are metallized and then polished. The result is very good CD control of the formed vias in both directions, and self-alignment of all the vias to one another.

In an aspect, then, one or more embodiments described herein are directed to an approach that employs an underlying metal grating structure, or a pair of orthogonal such structures, as a template to build overlying conductive vias. In an exemplary processing scheme, FIGS. 18A-18W illustrate plan views (upper portions of Figures) and corresponding angled (middle portions of Figures) and cross-sectional views (lower portions of Figures) representing various operations in a metal via processing schemes for back end of line (BEOL) interconnects, in accordance with an embodiment of the present disclosure.

Figures 18A, 18B:
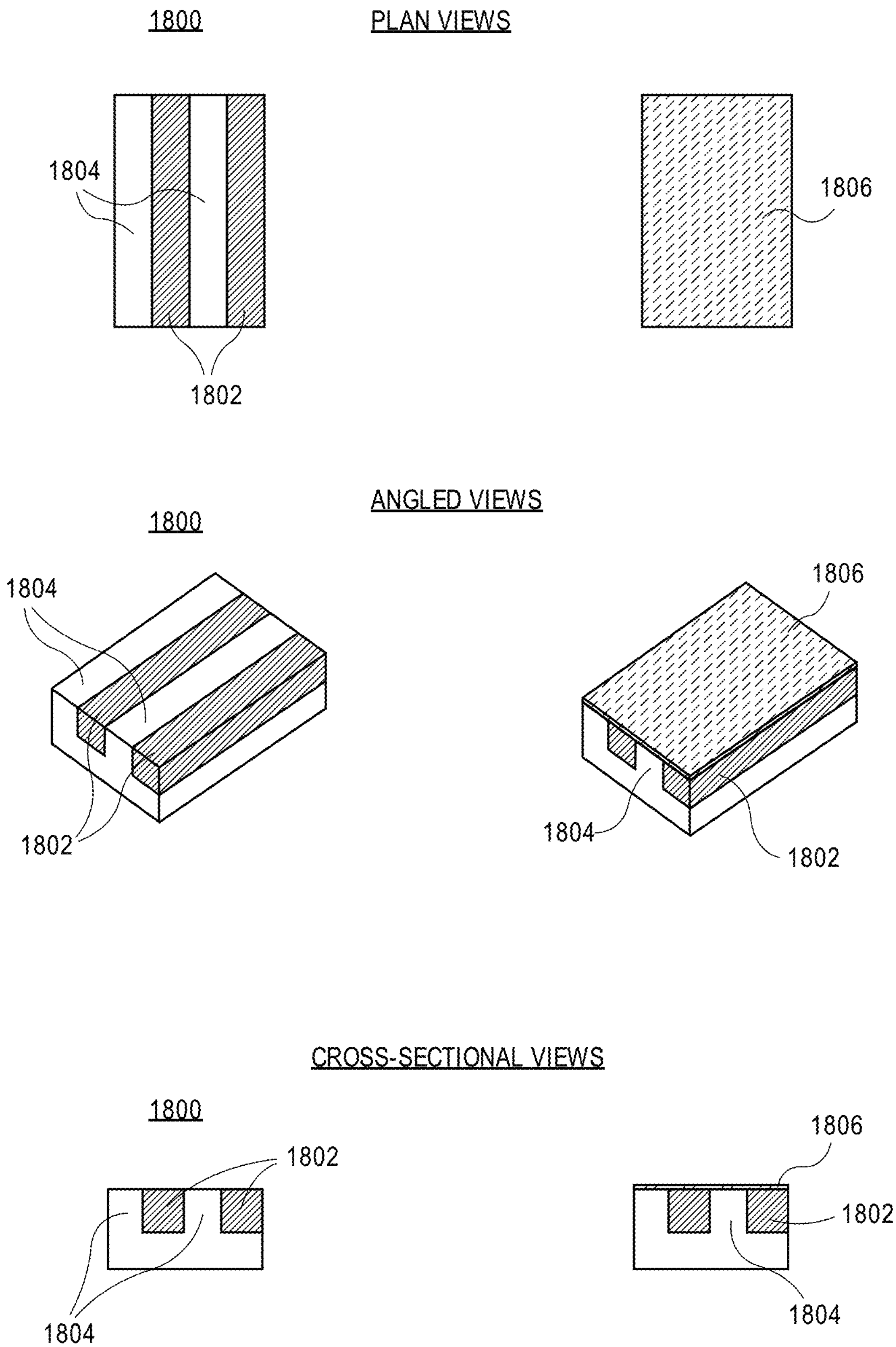
FIGS. 18A-18W illustrate plan views and corresponding angled and cross-sectional views representing various operations in a metal via processing scheme for back end of line (BEOL) interconnects, in accordance with an embodiment of the present disclosure.

Referring to FIG. 18A, a starting point structure 1800 is provided as a beginning point for fabricating a new metallization layer. The starting point structure 1800 includes an array of alternating metal lines 1802 and dielectric lines 1804. The metal lines 1802 have upper surfaces that are approximately co-planar with upper surfaces of the dielectric lines 1804. An etch stop layer 1806 is then formed on the starting structure 1800, as is depicted in FIG. 18B.

Figures 18C, 18D:
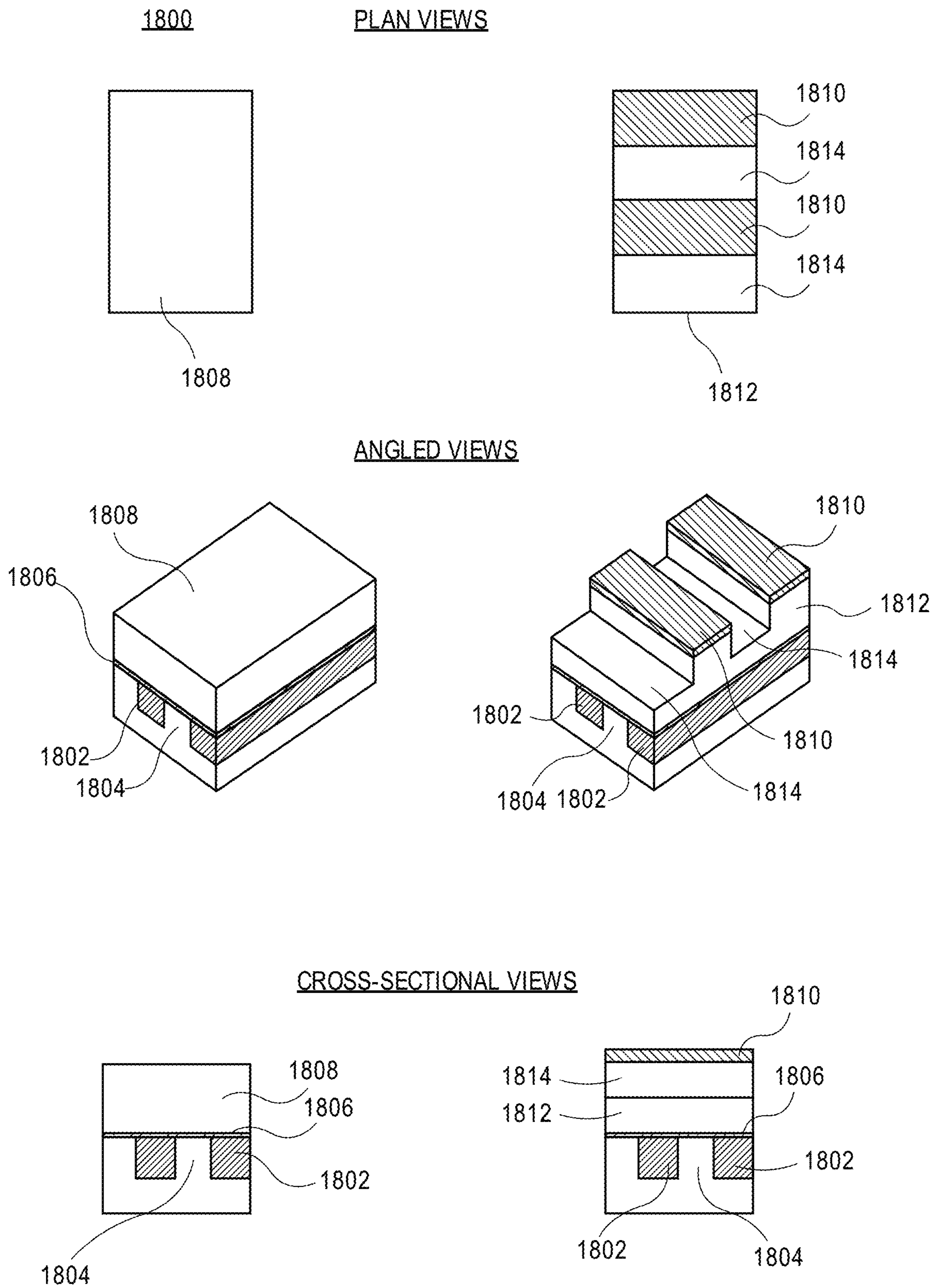

Referring to FIG. 18C, an inter-layer dielectric layer 1808 is formed on the structure of FIG. 18B. A patterned hardmask 1810 is then formed on the structure of FIG. 18C, and the pattern of the patterned hardmask 1810 is transferred partially into the inter-layer dielectric layer 1808 to form patterned inter-layer dielectric layer 1812 having metal line regions 1814 formed therein, as is depicted in FIG. 18D. In an embodiment, the patterned hardmask 1810 has a grating type pattern, as is depicted. In a specific embodiment, the patterned hardmask 1810 is composed of titanium nitride (TiN).

Figures 18E, 18F:
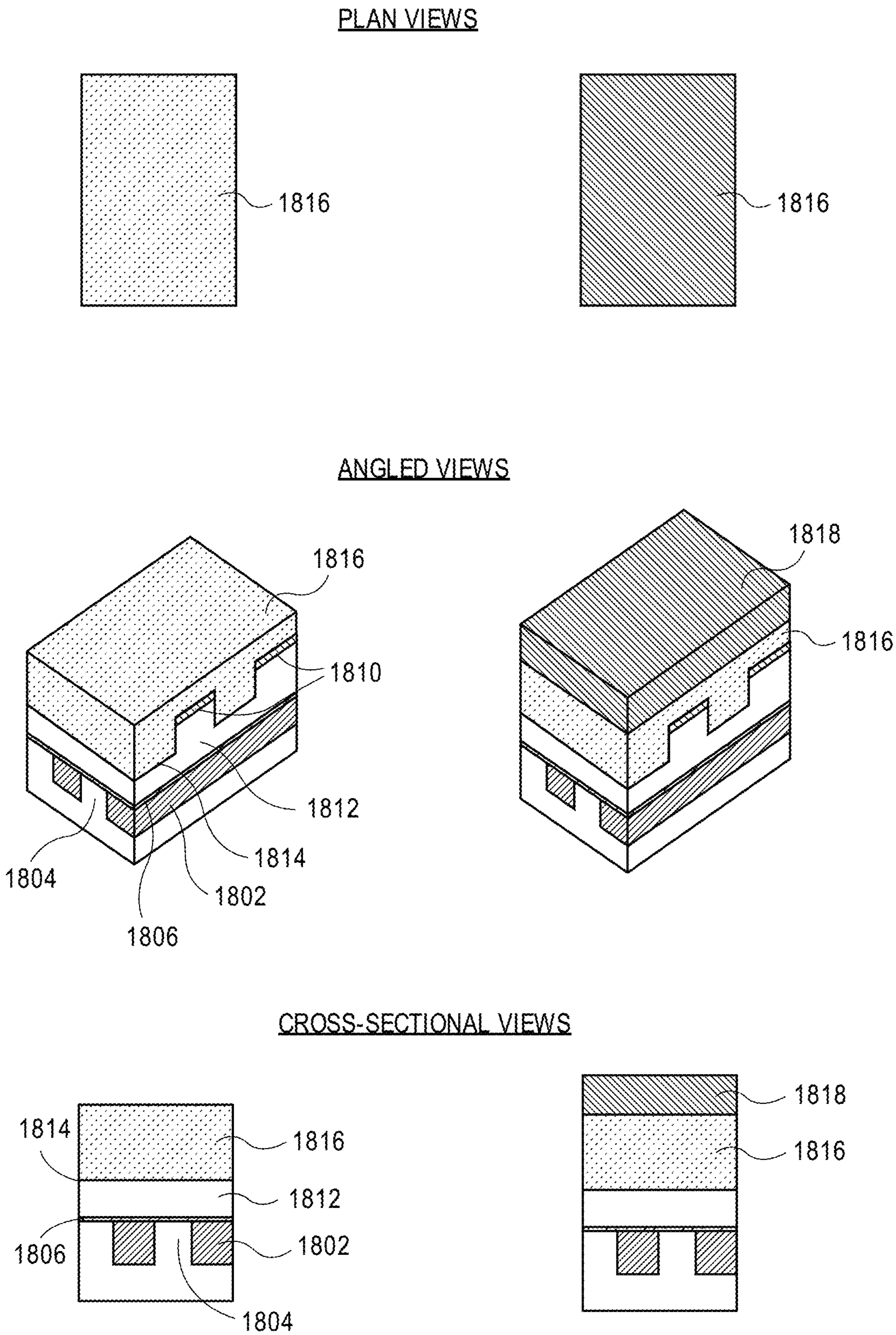

Referring to FIG. 18E, a hardmask layer 1816 is formed on the structure of FIG. 18D. In an embodiment, the bottom surface of the hardmask layer 1816 is conformal with the topography of the structure of FIG. 18D, while the upper surface of the hardmask layer 1816 is planarized. In a specific embodiment, the hardmask layer 1816 is a carbon hardmask (CHM) layer. An etch stop layer 1818 is then formed on the structure of FIG. 18E, as is depicted in FIG. 18F. In a specific embodiment, the etch stop layer 1818 is composed of silicon oxide (SiOx or $SiO_2$).

Figure 18G:
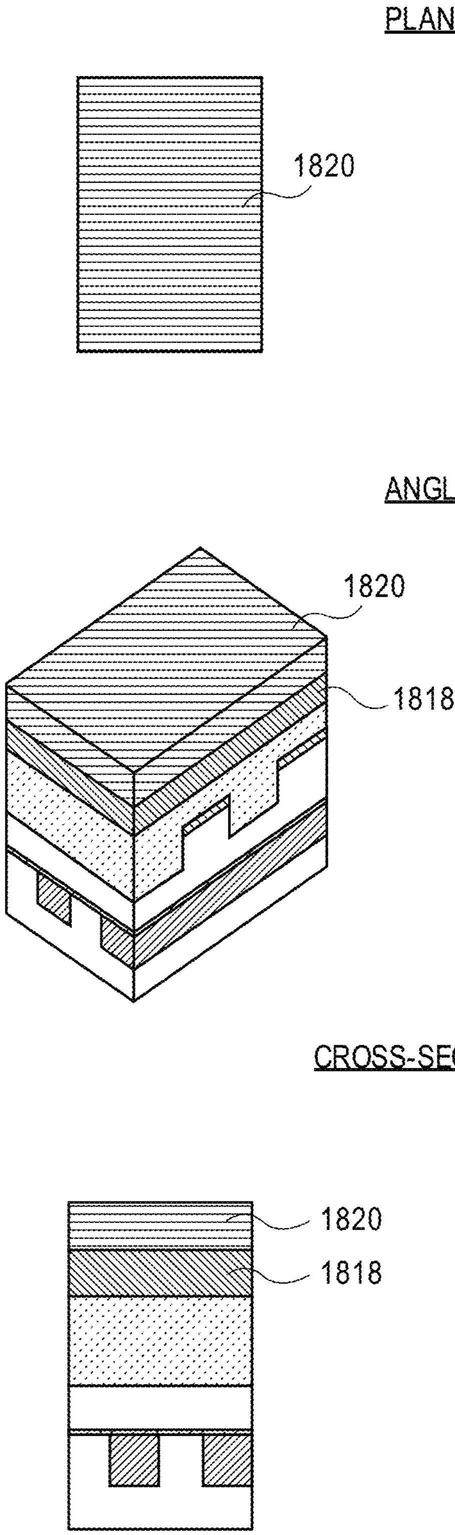
Figure 18H:
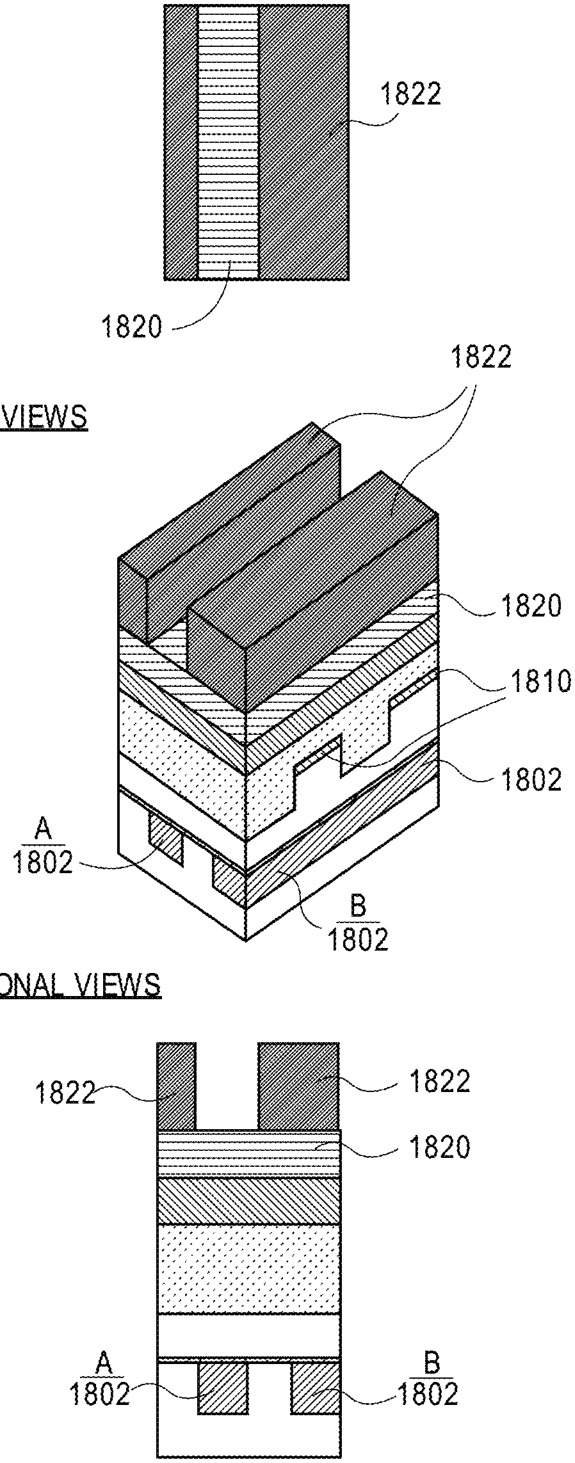

Referring to FIG. 18G, a pattern accumulation layer 1820 is then formed on the structure of FIG. 18F. In an embodiment, the pattern accumulation layer 1820 is a layer in which more than one pattern will ultimately accumulate, e.g., for eventual via patterning. In a specific embodiment, the pattern accumulation layer 1820 is composed of amorphous silicon (a-Si). A patterned hardmask 1822 is then formed on the structure of FIG. 18G, as is depicted in FIG. 18H. In an embodiment, the patterned hardmask 1822 has a grating type pattern, as is depicted. In one such embodiment, the grating type pattern is orthogonal to the grating of patterned hardmask 1810 and parallel to the grating of the metal lines 1802. However, in an embodiment, from a top down perspective, the patterned hardmask 1822 exposes only every other of the metal lines 1802 (e.g., metal line 1802 (A)) and blocks alternating ones of the metal lines 1802 (e.g., metal line 1802 (B)), as is depicted in FIG. 18H. In a specific embodiment, the patterned hardmask 1822 is composed of silicon nitride (SiN).

Figures 18I, 18J:
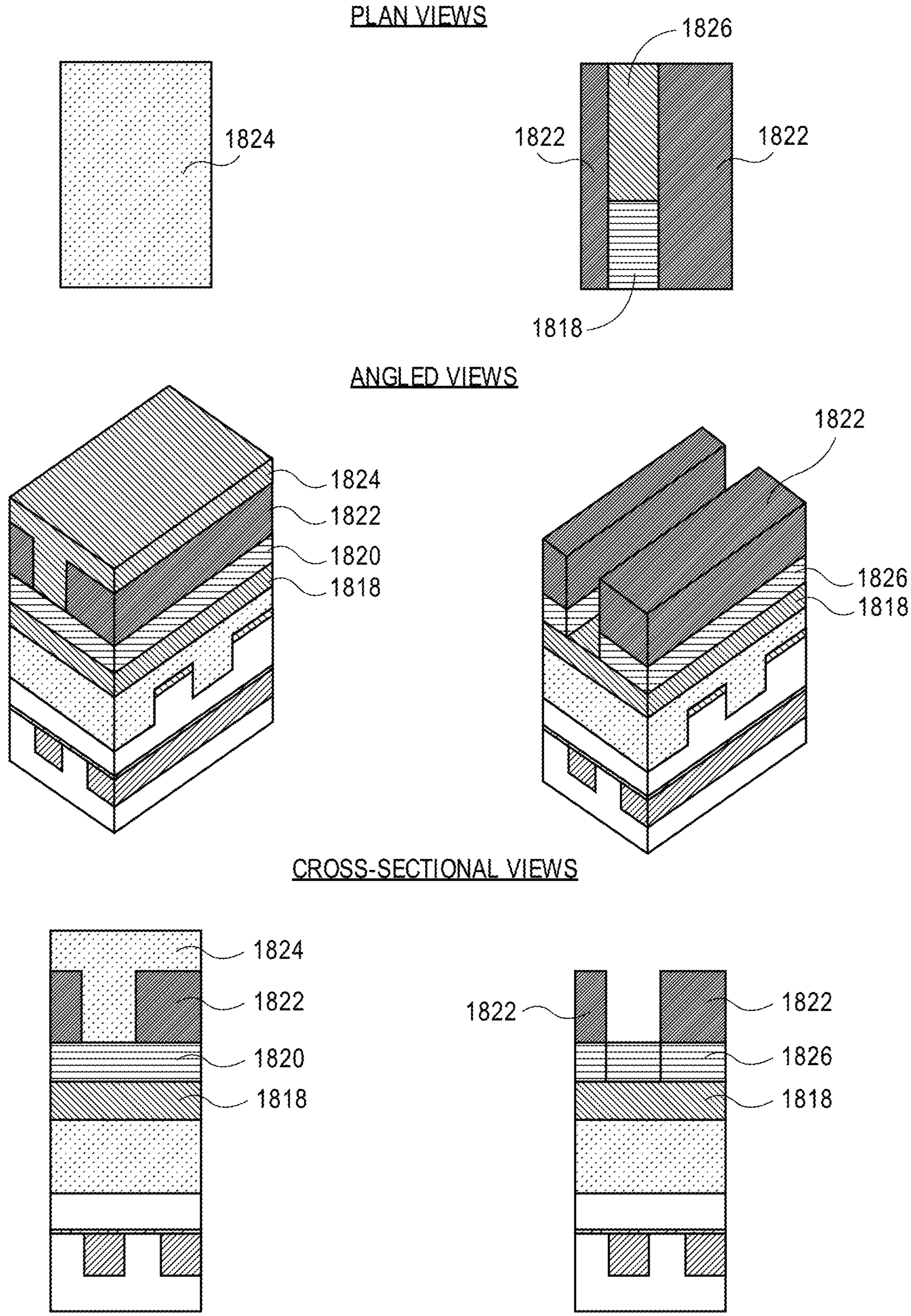

Referring to FIG. 18I, a hardmask 1824 is then formed on the structure of FIG. 18H. In a specific embodiment, the hardmask 1824 is a carbon hardmask (CHM). The hardmask 1824 is then patterned (e.g., by a lithographic process using single or multiple layer resist structures) and the pattern is transferred into portions of the pattern accumulation layer 1820 exposed by the patterned hardmask 1822 to form a once patterned memory layer 1826, as is depicted in FIG. 18J. In an embodiment, the pattern is transferred into portions of the pattern accumulation layer 1820 by an etch process that uses etch stop layer 1818 as a terminating point. In an embodiment, subsequent to forming the once patterned memory layer 1826, the hardmask 1824 is removed, as is also depicted in FIG. 18J. It is to be appreciated that the process may be repeated for several different masking operations.

Figure 18K:
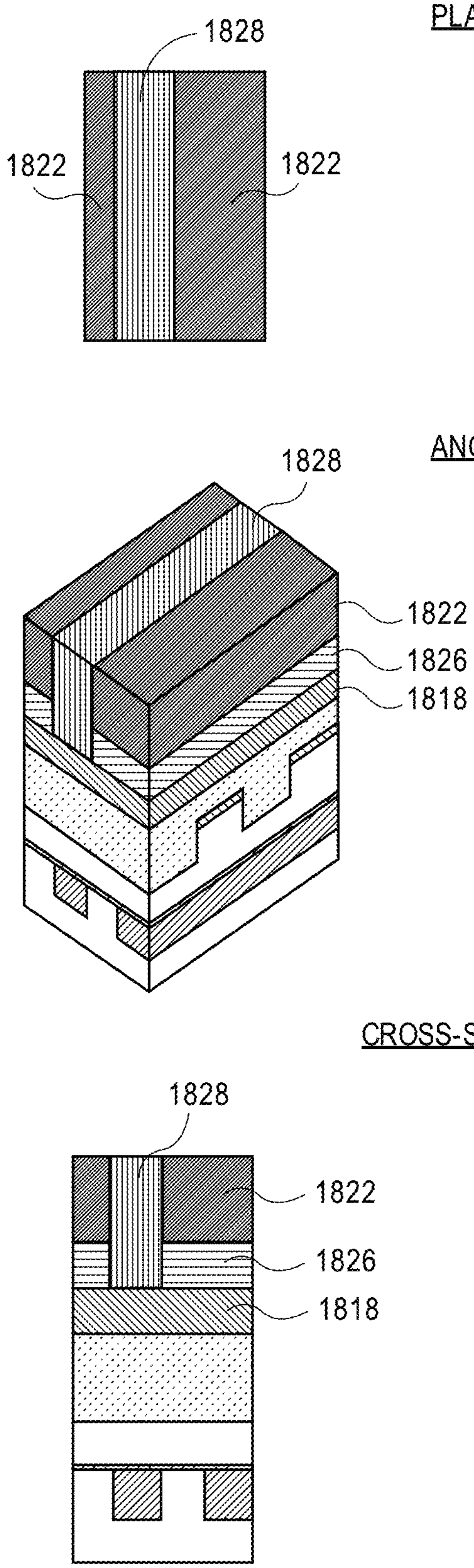

Referring to FIG. 18K, a blocking line 1828 is then formed by filling the opening in patterned hardmask 1822 of the structure of FIG. 18J with a blocking material layer. In a specific embodiment, the blocking material layer is a flowable silicon oxide material. In other embodiments, the blocking material layer is any of a number of other suitable materials. The patterned hardmask 1822 is then removed from the structure of FIG. 18K to leave the blocking line 1828 remaining, as is depicted in FIG. 18L.

Figure 18L:
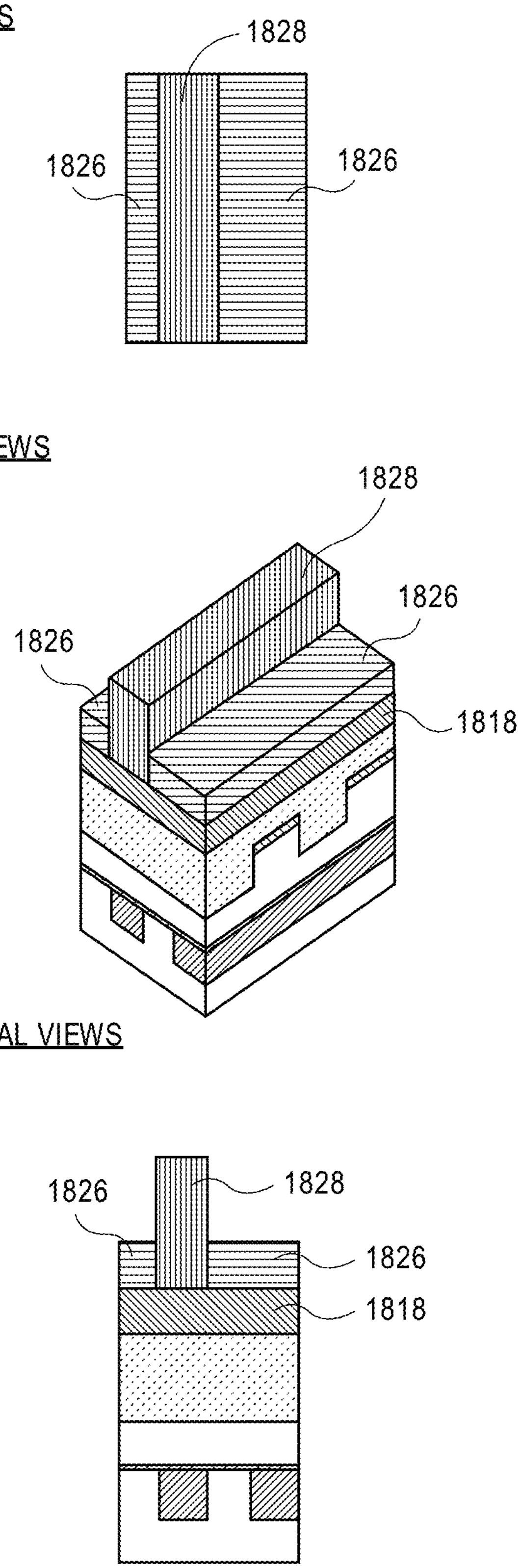
Figures 18M, 18N:
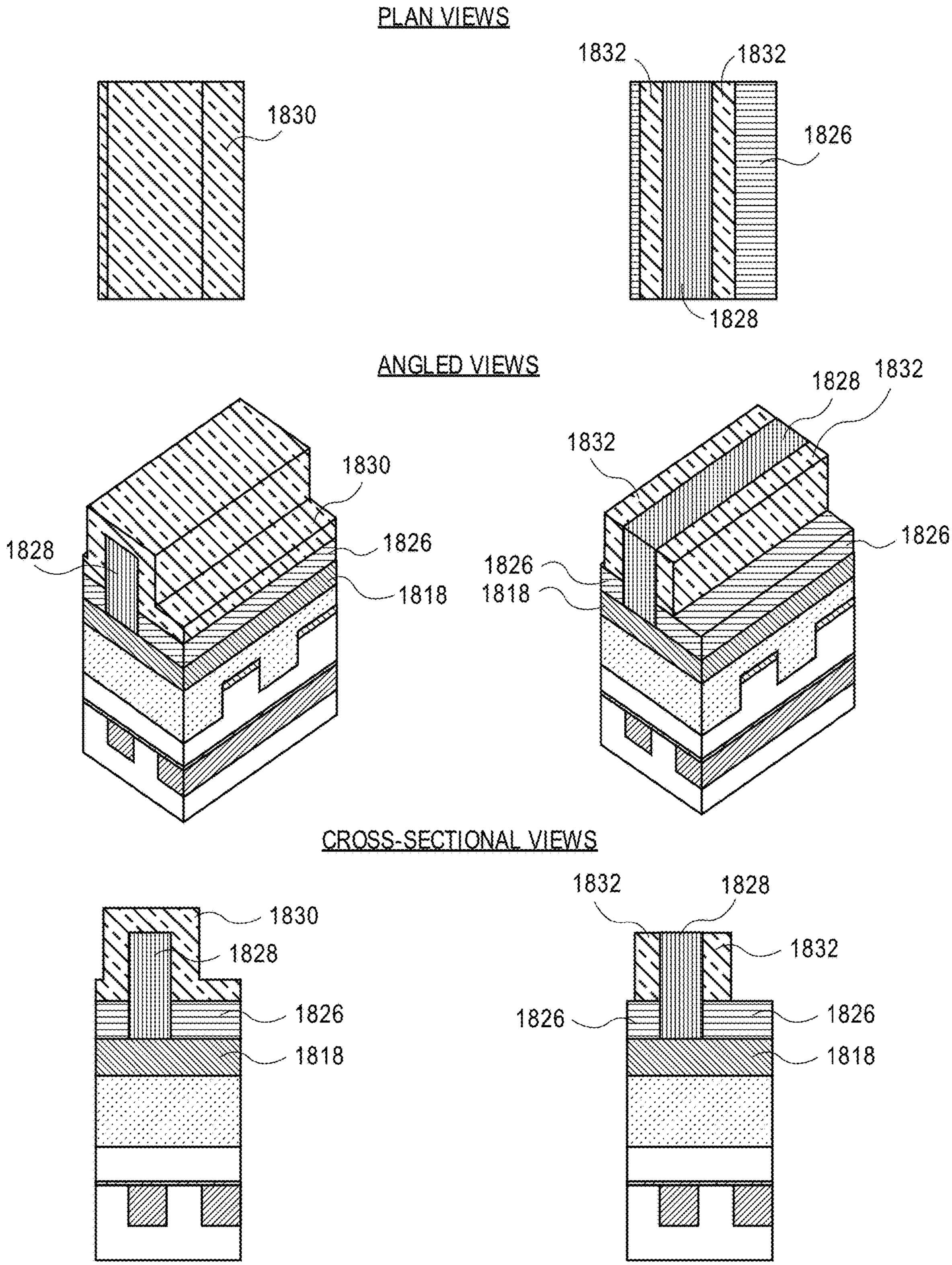

Referring to FIG. 18M, an insulating spacer forming material layer 1830 is then formed on the structure of FIG. 18L, conformal with the blocking line 1828. In an embodiment, the insulating spacer forming material layer 1830 is composed of a dielectric material. In one embodiment, the spacer forming material layer 1830 is composed of silicon oxide (SiOx or $SiO_2$). The spacer forming material layer 1830 is then patterned to form spacers 1832 adjacent the sidewalls of the blocking line 1828, as is depicted in FIG. 18N. In an embodiment, the spacer forming material layer 1830 is patterned to form spacers 1832 using an anisotropic dry etch process.

Figure 18O:
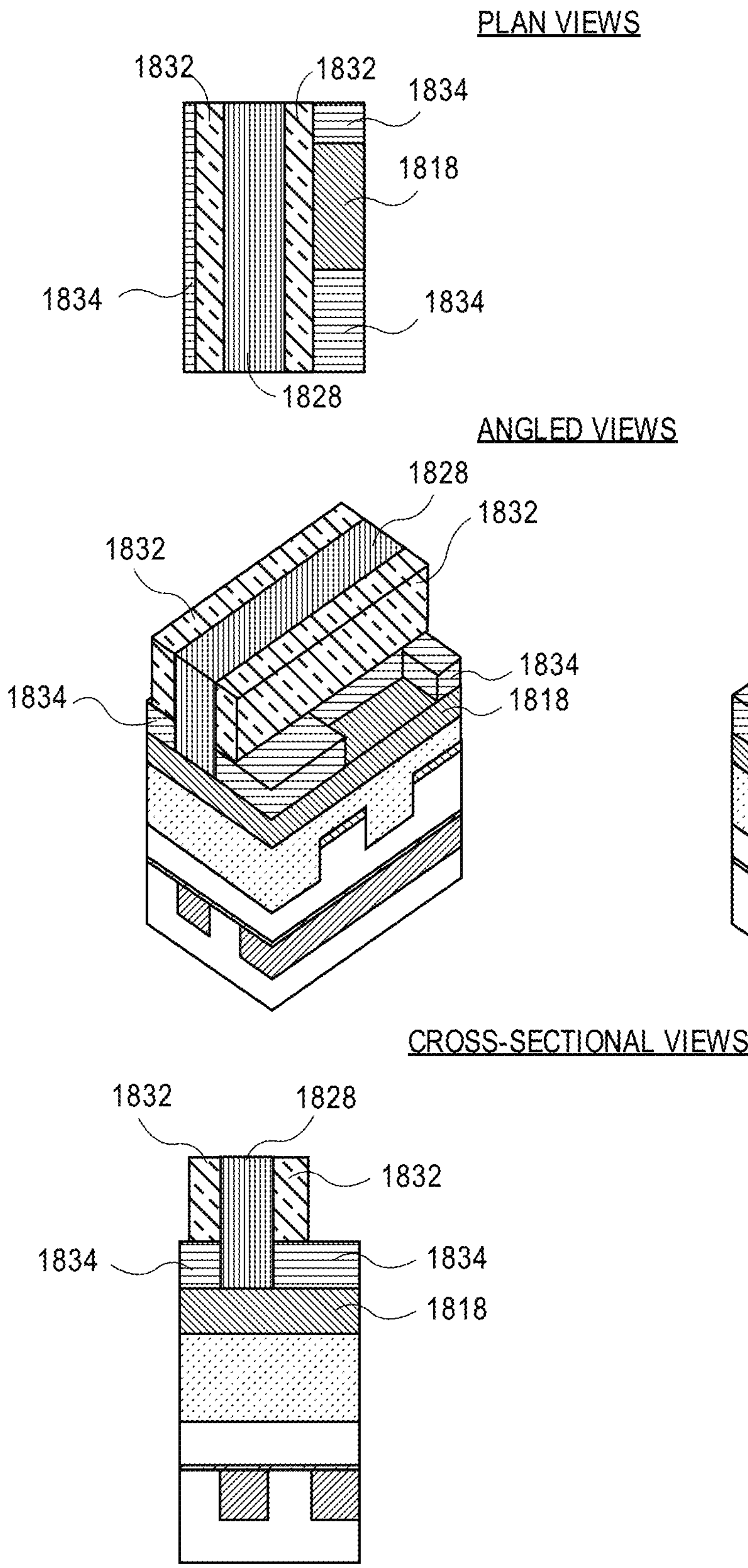

Referring to FIG. 18O, a collective pattern of the blocking line 1828, the spacers 1832, and protective regions of a patterning mask formed subsequent to forming the spacers 1832 is then transferred into the once patterned memory layer 1826 to form a twice patterned memory layer 1834. In an embodiment, the pattern is transferred into the once patterned memory layer 1826 by an etch process that uses etch stop layer 1818 as a terminating point. The blocking line 1828, the spacers 1832, and any additional mask material of the structure of FIG. 18O are then removed to expose the twice patterned memory layer 1834, as is depicted in FIG. 18P.

Figure 18P:
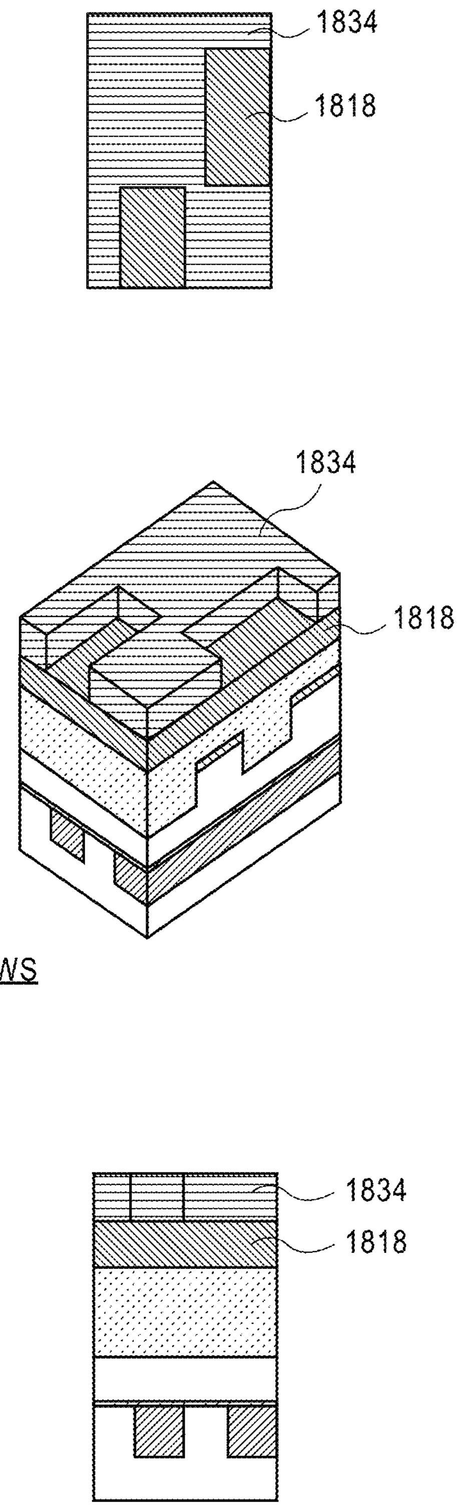

Referring to FIG. 18Q, the pattern of the twice patterned memory layer 1834 of the structure of FIG. 18P is then transferred to the etch stop layer 1818 to form patterned etch stop layer 1836 and to expose portion of the hardmask layer 1816. In one embodiment, the pattern of the twice patterned memory layer 1834 is transferred to the etch stop layer 1818 using a dry etch process. The twice patterned memory layer 1834 of the structure of FIG. 18Q is then removed, as is depicted in FIG. 18R.

Figure 18S:
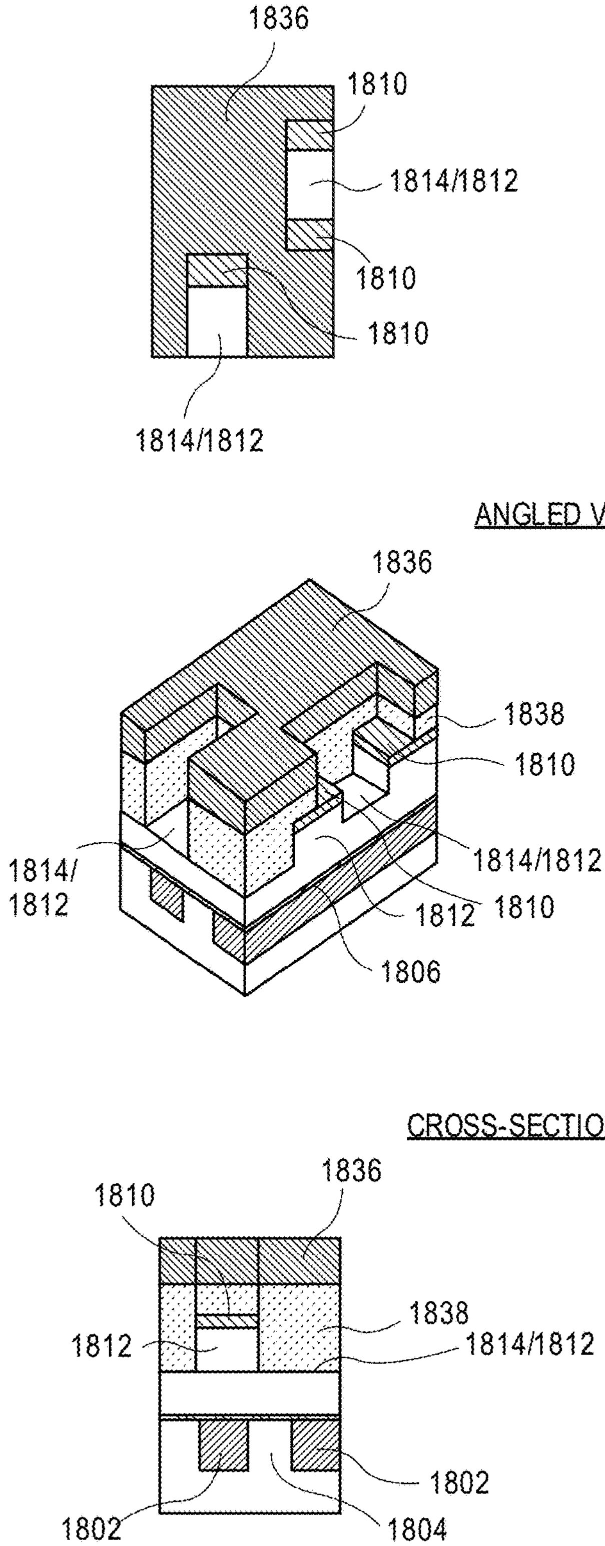
Figure 18T:
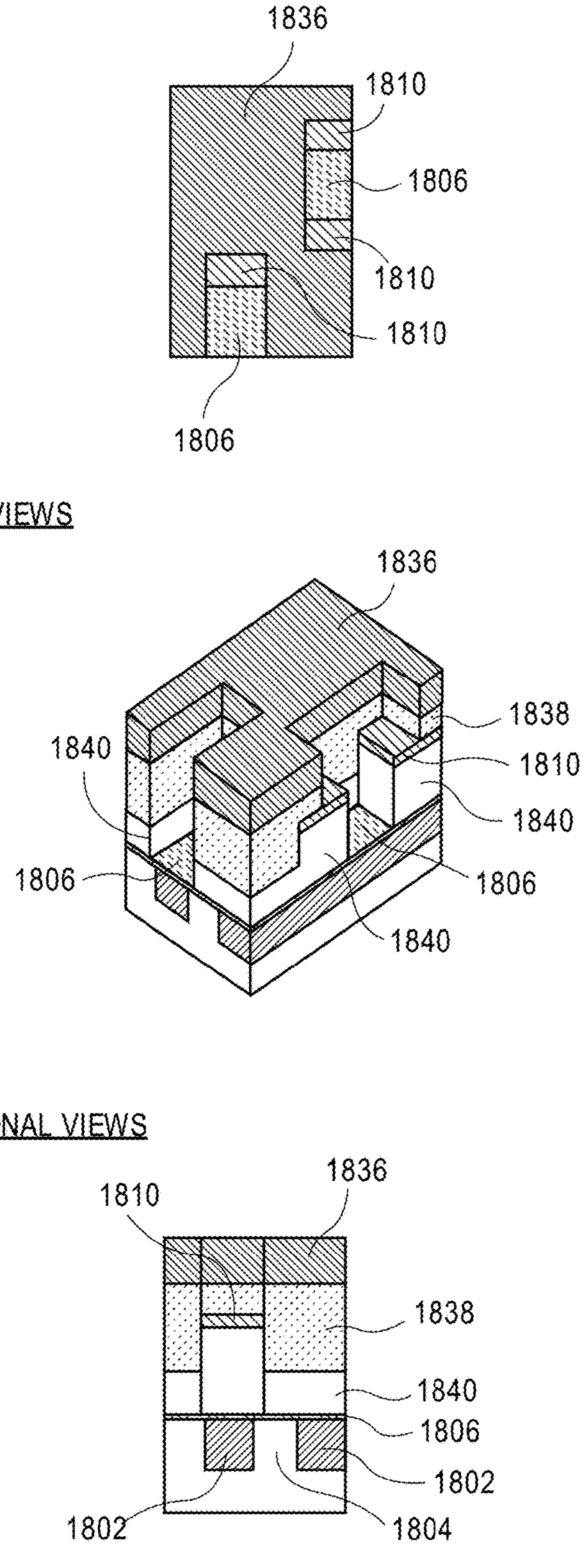

Referring to FIG. 18S, the pattern of the patterned etch stop layer 1836 of the structure of FIG. 18R is then transferred into the hardmask layer 1816 to form patterned hardmask layer 1838. Patterned hardmask layer 1838 exposes portions of the line regions 1814 of the patterned inter-layer dielectric layer 1812 and portions of the patterned hardmask 1810. That is, although the patterned hardmask layer 1838 exposes areas wider than the line regions 1814 of the patterned inter-layer dielectric layer 1812, the patterned hardmask 1810 protects “exposed” regions of the patterned inter-layer dielectric layer 1812 outside of the line regions 1814. The pattern of the patterned hardmask layer 1838 of the structure of FIG. 18S is then transferred to the patterned inter-layer dielectric layer 1812 to form twice patterned inter-layer dielectric layer 1840 and to expose etch stop layer 1806, as is depicted in FIG. 18T. However, in an embodiment, the patterned hardmask 1810 inhibits total transfer pattern, as is also depicted in FIG. 18T. In one embodiment, the pattern of the patterned hardmask layer 1838 is transferred to the patterned inter-layer dielectric layer 1812 by an etch process that uses etch stop layer 1806 as a terminating point.

Figure 18U:
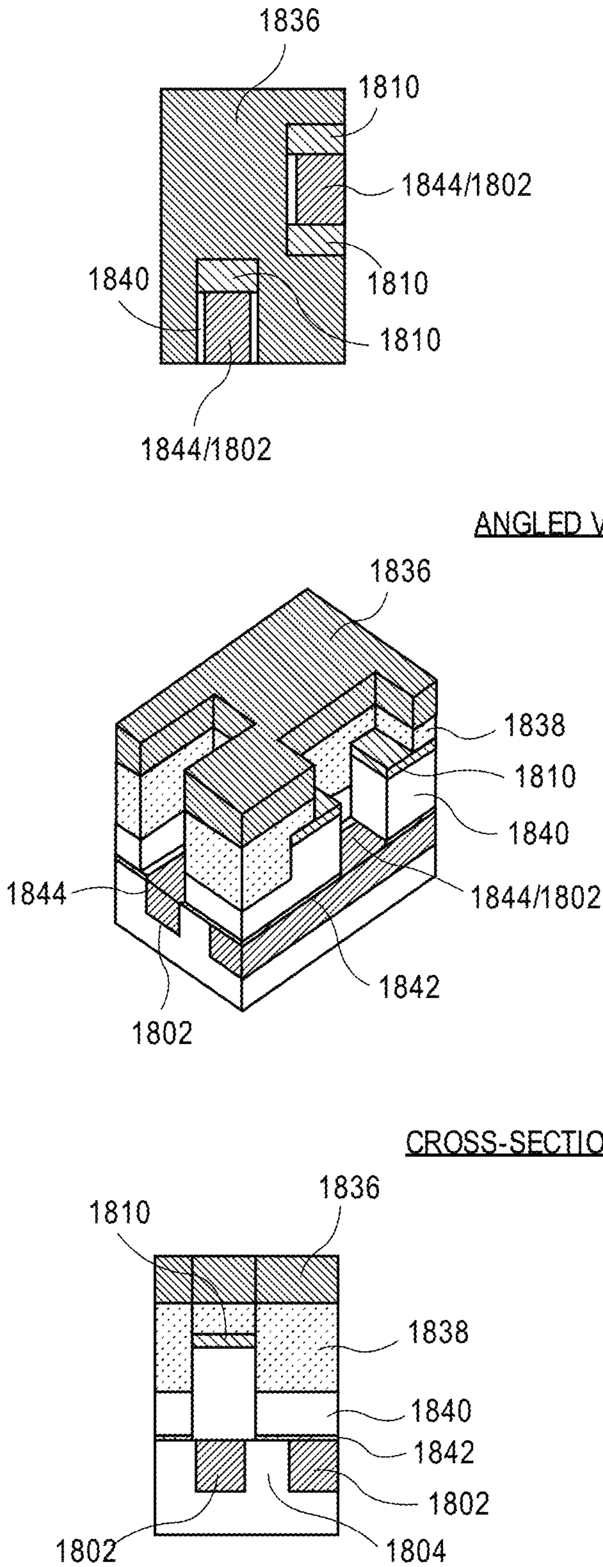
Figure 18V:
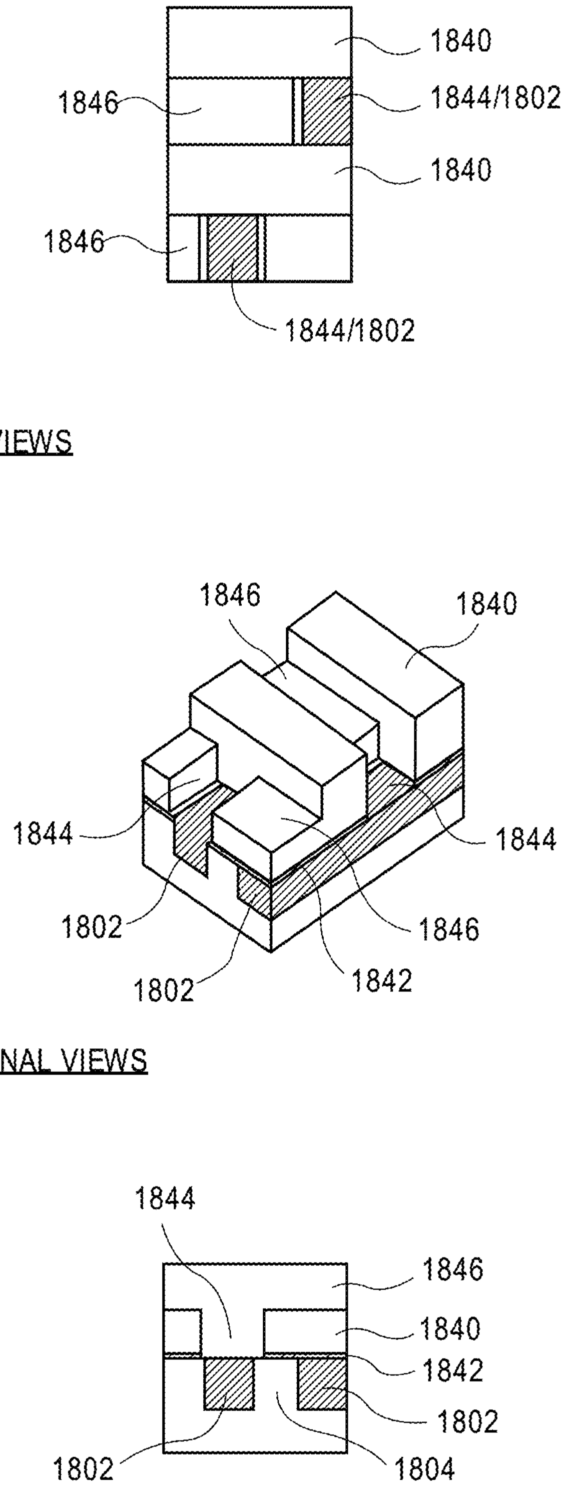
Figure 18W:
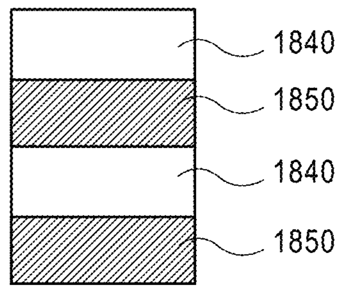
Figure 18W:
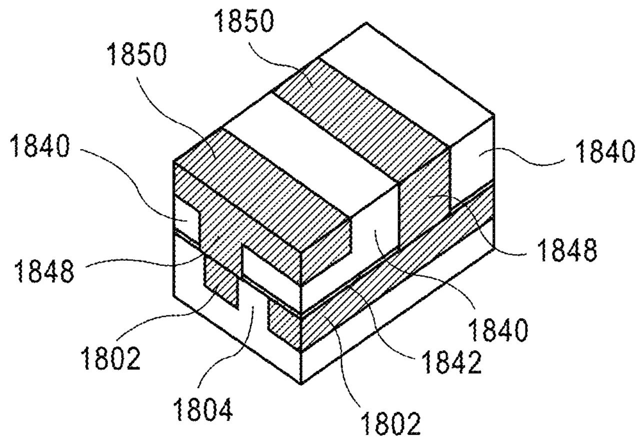
Figure 18W:
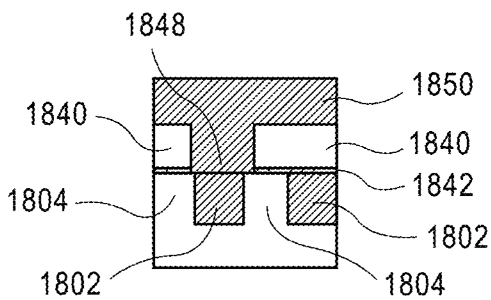

Referring to FIG. 18U, exposed portions of the etch stop layer 1806 of the structure of FIG. 18T are removed to form patterned etch stop layer 1842 and to expose via locations 1844 for metal lines 1802. The patterned etch stop layer 1836, the patterned hardmask layer 1838, and the patterned hardmask 1810 of the structure of FIG. 18U are then removed, as is depicted in FIG. 18V. The removal exposes twice patterned inter-layer dielectric layer 1840 and via locations 1844 for metal lines 1802, as well as locations 1846 for upper metal lines. In an embodiment, the patterned etch stop layer 1836, the patterned hardmask layer 1838, and the patterned hardmask 1810 are removed using a selective wet etch process.

Referring to FIG. 18W, an upper metallization layer is formed for the structure of FIG. 18V. In particular, a metal fill process is performed to provide metal vias 1848 and metal lines 1850. In an embodiment, the metal fill process is performed using a metal deposition and subsequent planarization processing scheme, such as a chemical mechanical planarization (CMP) process. In an embodiment, the surface of the structure formed of FIG. 18W is substantially the same as the surface of, although orthogonal to, the starting structure 1800 of FIG. 18A. Thus, in an embodiment, the process described in association with FIGS. 18B-18W may be repeated on the structure of FIG. 18W to form a next metallization layer, and so on.

A resulting structure such as described in association with FIG. 18W may subsequently be used as a foundation for forming subsequent metal line/via and ILD layers. Alternatively, the structure of FIG. 18W may represent the final metal interconnect layer in an integrated circuit. It is to be appreciated that the above process operations may be practiced in alternative sequences, not every operation need be performed and/or additional process operations may be performed. It is also to be appreciated that the above examples have focused on via/contact formation. However, in other embodiments, similar approaches may be used to preserve or form regions for line end termination (plugs) within a metal line layer.

In accordance with an embodiment of the present disclosure, grid-based via and plug patterning approaches are described. One or more embodiments described herein are directed to grid self-aligned and super self-aligned metal via processing schemes. Embodiments described herein may be implemented to provide self-alignment methodology for metal/via layers. Almost all plug and via geometries are made possible by implementing approaches described herein. Additionally, the final via critical dimension (CD) may be independent from the lithography implemented for patterning. Furthermore, approaches described herein may provide a "circular flow" in that the end of the process flow has an identical or substantially identical layer stack and layout as the beginning of the process flow. Thus, once every operation in the process flow is developed, the process flow can be repeated as many times as needed to add as many metal/via layers as required. In one or more embodiments, overlap between perpendicular grids is used to define placement of vias and metal lines. The size of the via may be determined by the overlapped areas between two grids.

To provide context for embodiments described below, as compared with currently known approaches for via self-alignment, approaches described herein may provide for almost any plug and via placement available. Approaches described herein may require fewer selective etches. Approaches described herein may provide for final plug and via CDs that are independent of the lithography utilized. In an aspect, then, one or more embodiments described herein are directed to an approach that employs an underlying metal grating structure as a template to build overlying conductive vias. It is to be appreciated that similar approaches may be implemented to fabricate non-conductive spaces or interruptions between metals (plugs).

In an exemplary processing scheme, FIGS. 19A-19L illustrate plan views (upper portions of Figures) and corresponding angled cross-sectional views (lower portions of Figures) representing various operations in a grid self-aligned metal via processing schemes for back end of line (BEOL) interconnects, in accordance with an embodiment of the present disclosure. It is to be appreciated that, although in reality they are not, different metallization layers are shown as separated (upper and lower) in the angled cross-sectional views for clarity.

Figure 19A:
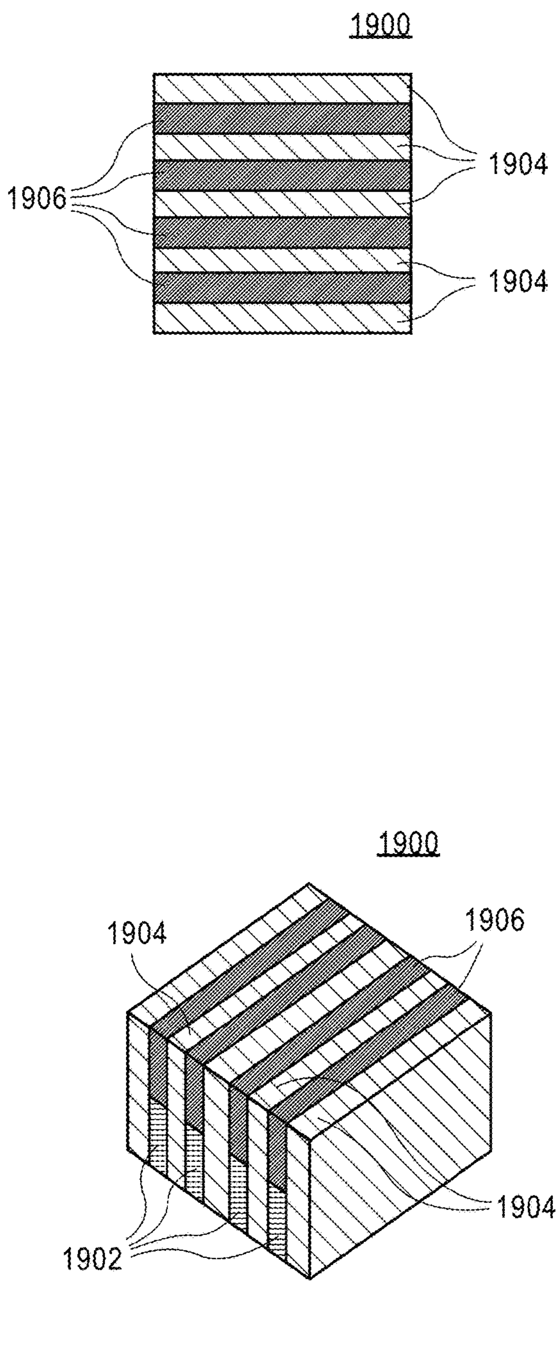
FIGS. 19A-19L illustrate plan views and corresponding angled cross-sectional views representing various operations in a grid self-aligned metal via processing schemes for back end of line (BEOL) interconnects, in accordance with an embodiment of the present disclosure.
Figure 19B:
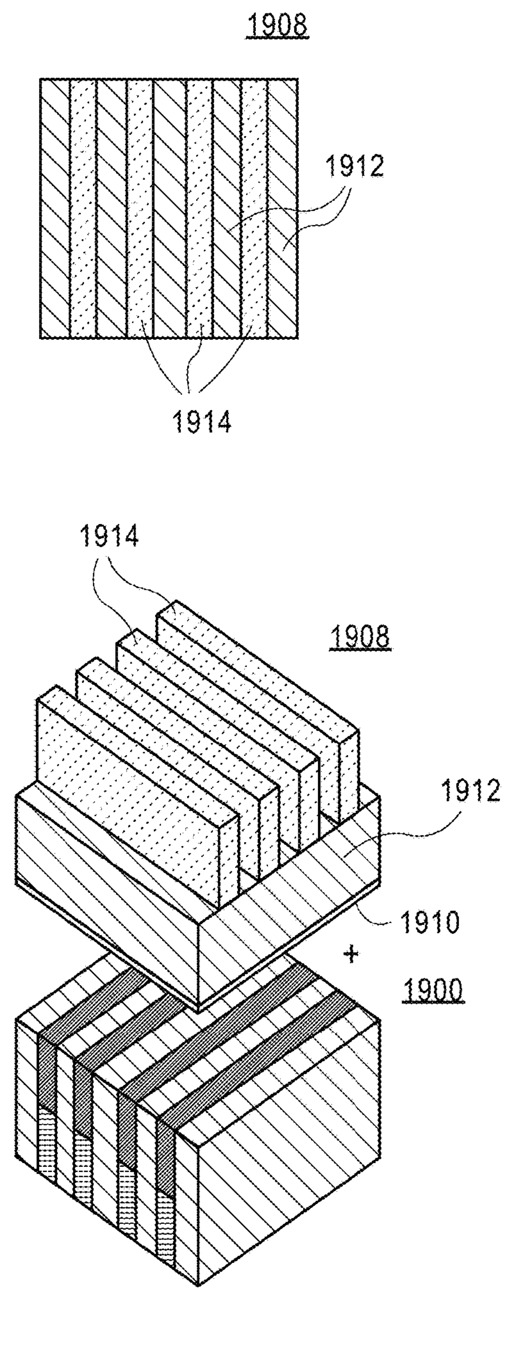

Referring to FIG. 19A, a starting point structure 1900 is provided as a beginning point for fabricating a new metallization layer. The starting point structure 1900 includes an array of alternating metal lines 1902 and dielectric lines 1904. The metal lines 1902 are recessed below the dielectric lines 1904. A hardmask layer 1906 is disposed above the metal lines 1902, and alternating with the dielectric lines 1904. In an embodiment, the dielectric lines 1904 are composed of silicon nitride (SiN), and the hardmask layer 1906 is composed of silicon carbide (SiC) or silicon oxide ($SiO_2$). A next patterning layer 1908 is then fabricated above the starting point structure 1900, as is depicted in FIG. 19B. In an embodiment, the next patterning layer 1908 includes an etch stop layer 1910, a dielectric layer 1912 and a grating structure 1914. In an embodiment, the etch stop layer 1910 is composed of silicon oxide (SiO), the dielectric layer 1912 is composed of silicon nitride (SiN), and the grating structure 1914 is composed of silicon oxide (SiO). In an embodiment, the grating structure 1914 is formed using a pitch halving or pitch quartering scheme, e.g., by spacer patterning.

Figure 19C:
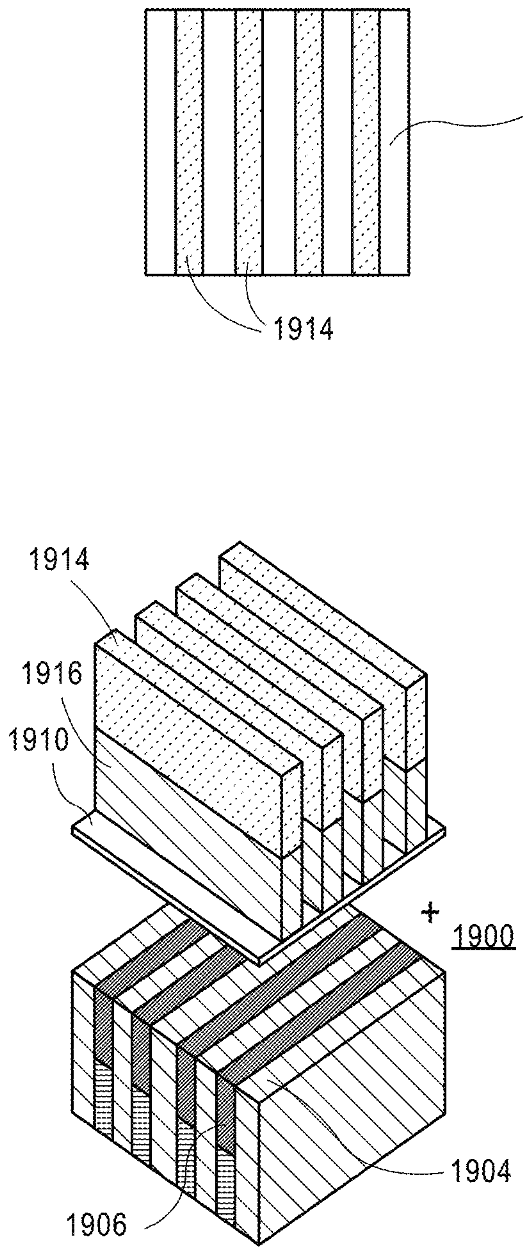
Figure 19D:
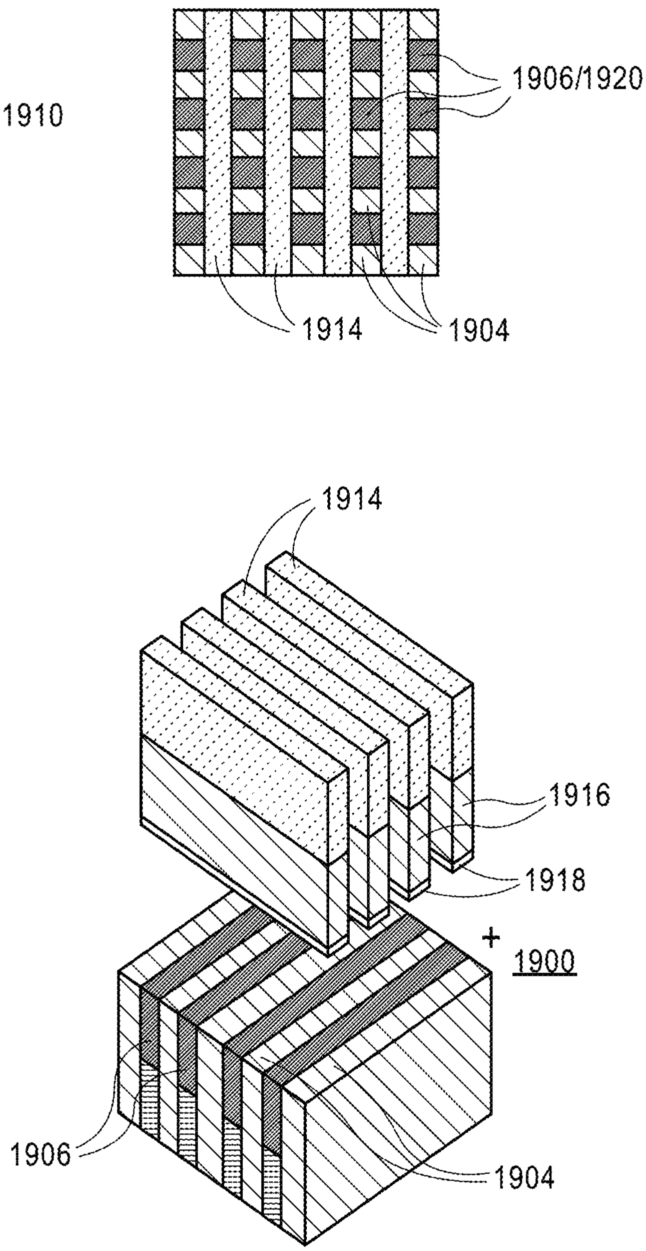

Referring to FIG. 19C, the pattern of the grating structure 1914 is transferred to the dielectric layer 1912 to form patterned dielectric layer 1916. In an embodiment, the pattern of the grating structure 1914 is transferred to the dielectric layer 1912 using an etch process that utilizes etch stop layer 1910 as an end-point for the etch process. A breakthrough etch is then performed to remove exposed portions of the etch stop layer 1910 to form patterned etch stop layer 1918, as is depicted in FIG. 19D. In an embodiment, the breakthrough etch reveals all possible via locations 1920 that could potentially be formed into structure 1900.

Figure 19E:
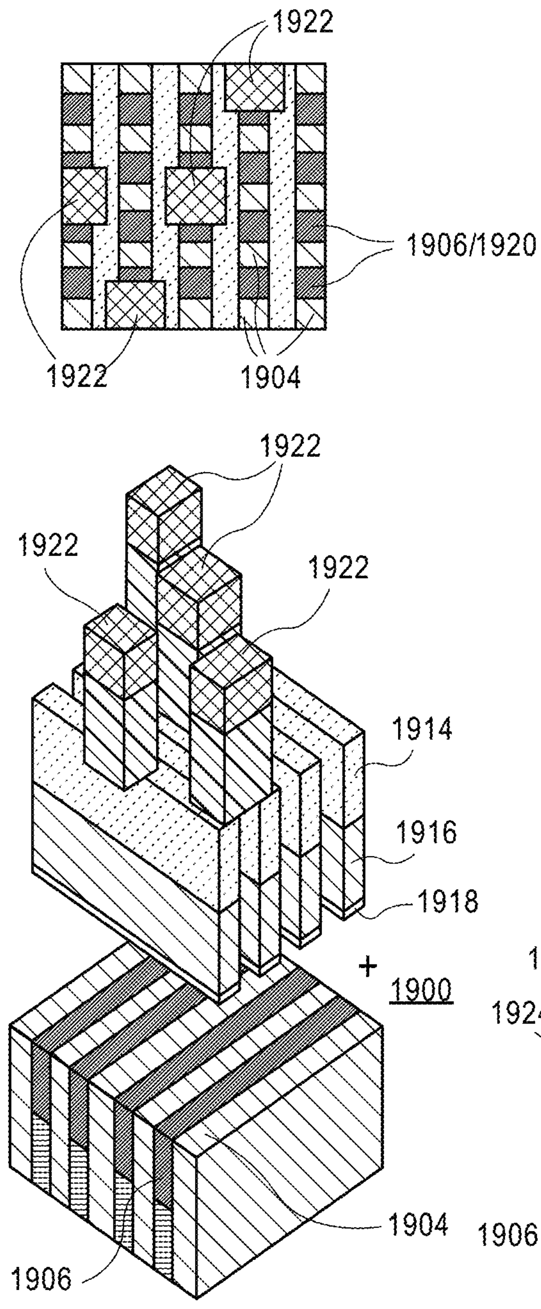
Figure 19F:
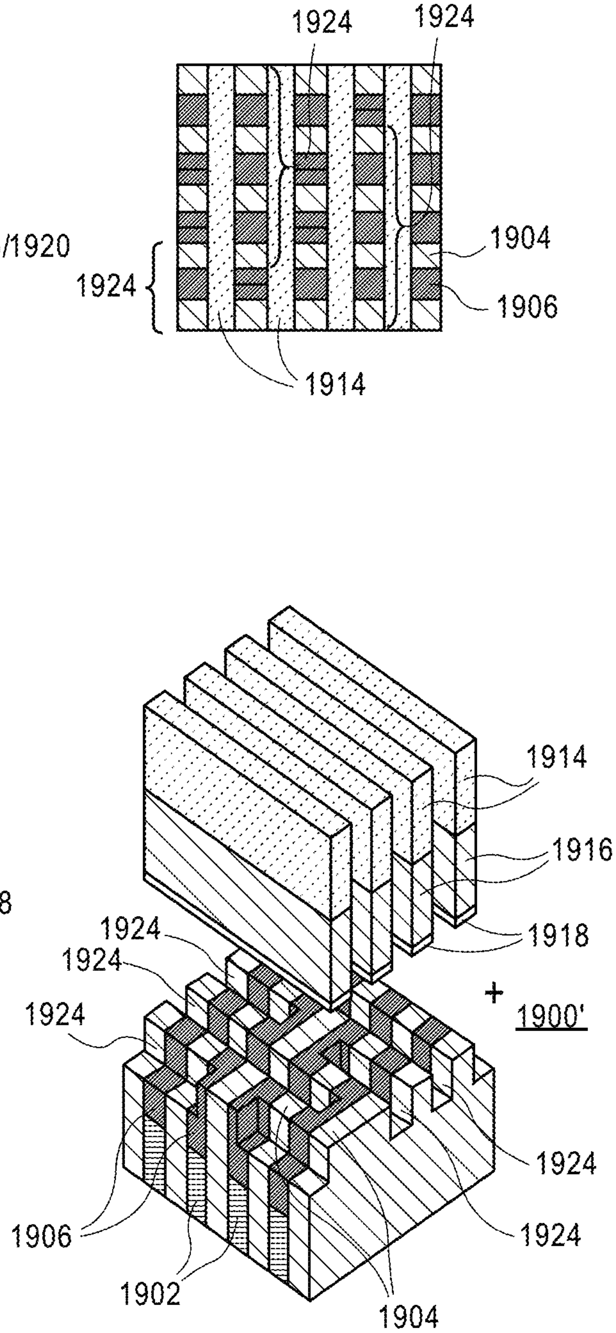

Referring to FIG. 19E, plug patterning is then performed by forming a patterned hard mask 1922 on the structure of FIG. 19D in locations where plugs are to be preserved. A unified pattern of the patterned hard mask 1922 and the grating structure 1914 is then transferred into structure 1900 to form structure 1900' having regions 1924 for metal line formation within structure 1900, as is depicted in FIG. 19F. In an embodiment, the unified pattern of the patterned hard mask 1922 and the grating structure 1914 is transferred into structure 1900 using an etch process. Such an etch process may etch both the layers 1904 and 1906 at substantially the same rate (or may be performed as several etch operations) and may be followed by a cleans process to remove the patterned hard mask 1922, as is also depicted in FIG. 19F.

Figure 19G:
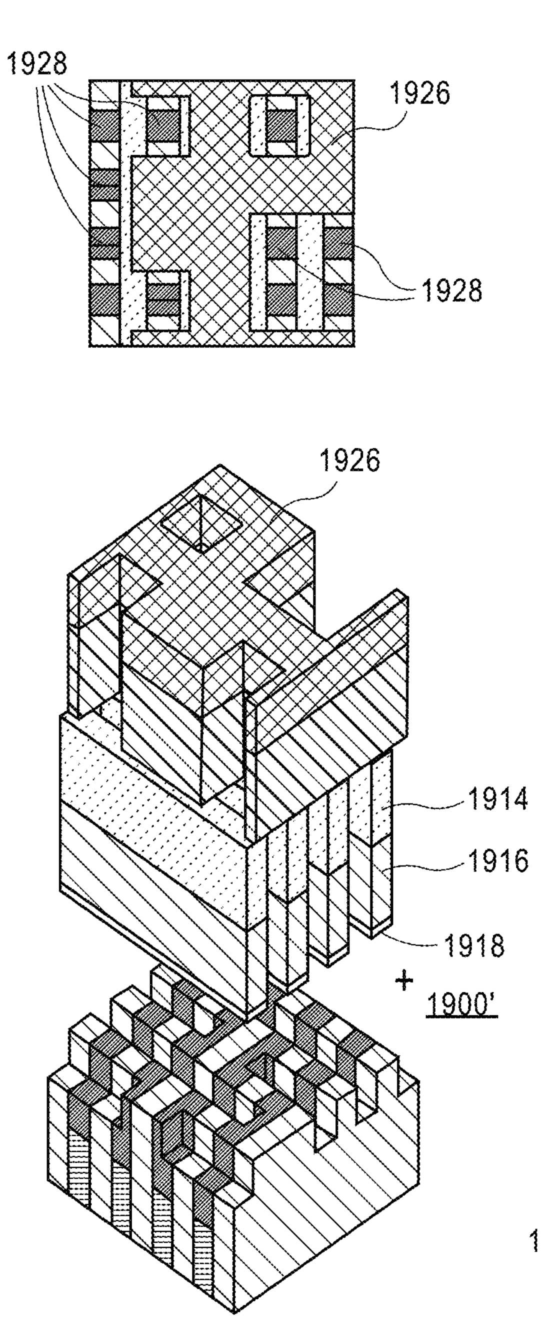
Figure 19H:
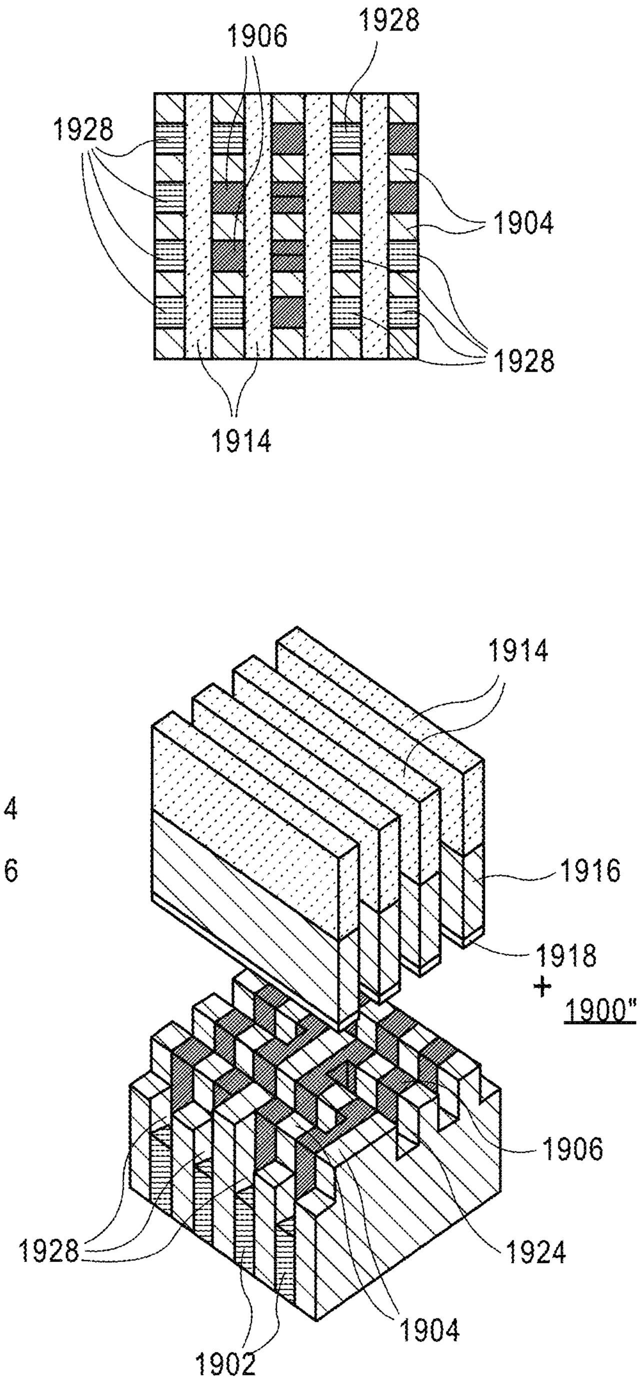

Referring to FIG. 19G, via patterning is then performed by forming a patterned lithographic mask 1926 on the structure of FIG. 19F, the patterned lithographic mask 1926 exposing locations where vias are to be formed (e.g., a via selection process). A unified pattern of the patterned lithographic mask 1926 and the grating structure 1914 is then transferred into structure 1900' to form structure 1900" having regions 1928 for metal via formation within structure 1900', as is depicted in FIG. 19H. In an embodiment, the unified pattern of the patterned lithographic mask 1926 and the grating structure 1914 is transferred into structure 1900' using an etch process. Such an etch process may etch the layer 1906 selective to the layer 1904, and may be followed by a cleans process to remove the patterned lithographic mask 1926, as is also depicted in FIG. 19H.

Figure 19I:
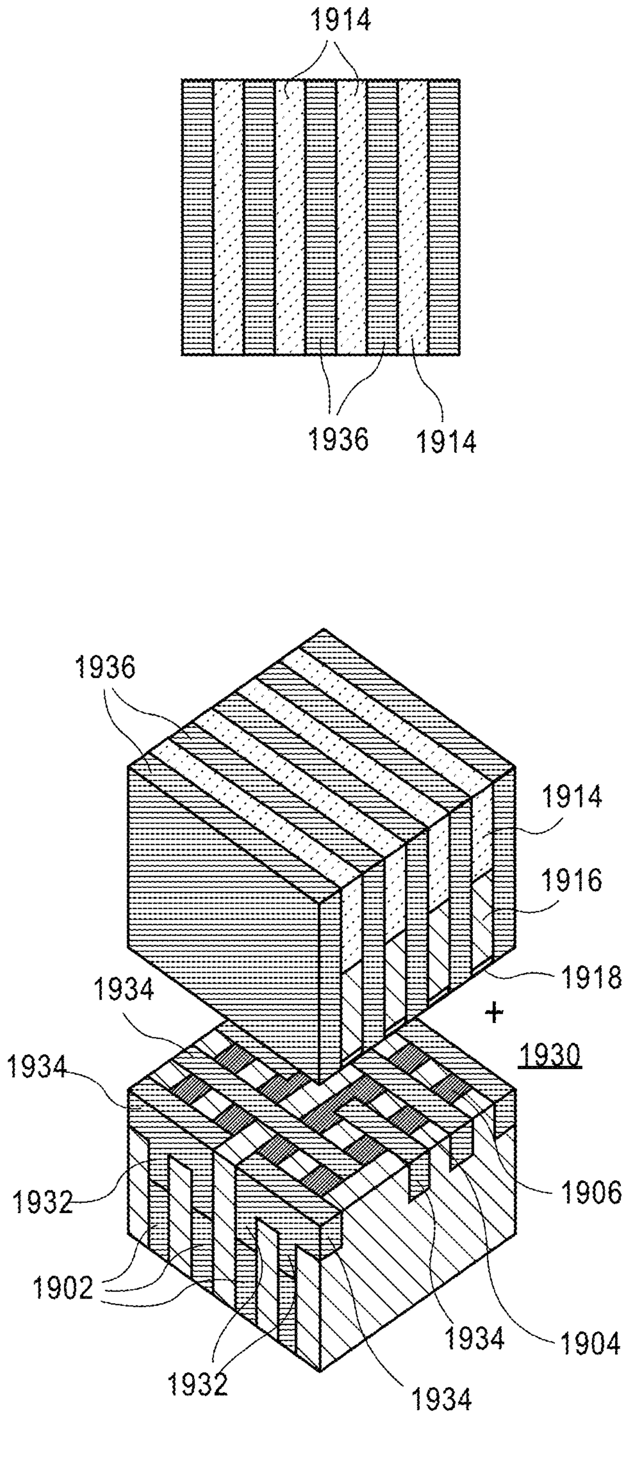
Figure 19J:
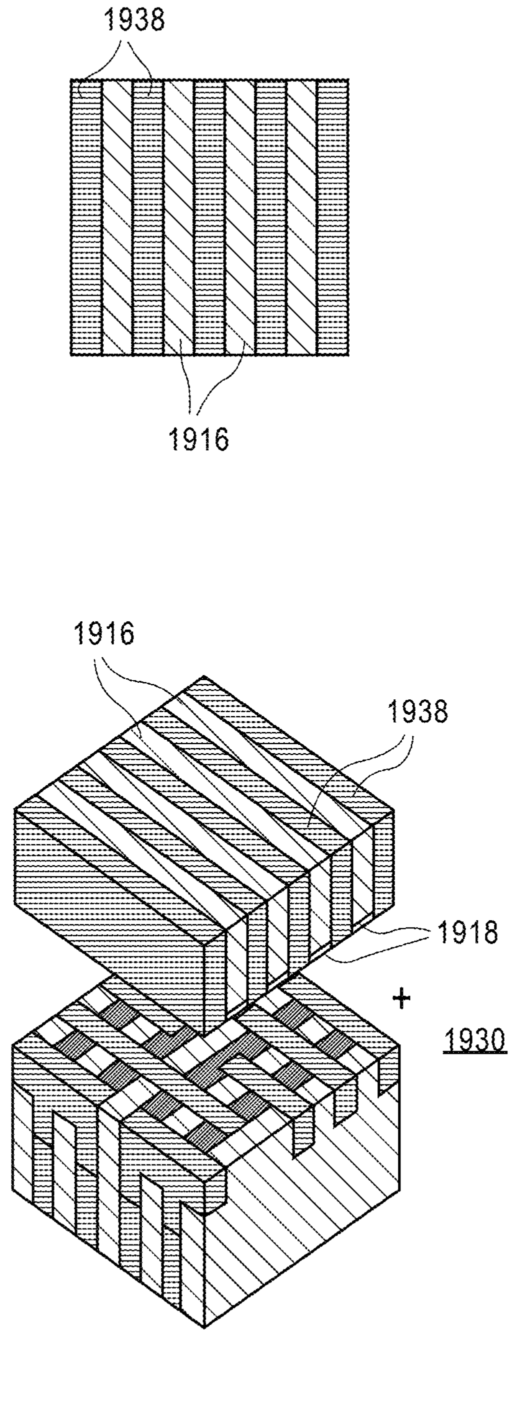

Referring to FIG. 19I, a metal fill process is performed on the structure of FIG. 19I to provide underlying structure 1930. The metal fill process forms metal vias 1932 and metal lines 1934 in structure 1930. The metal fill process may also fill the regions between the grating structure 1914 with metal lines 1936, as is depicted in FIG. 19I. In an embodiment, the metal fill process is performed using a metal deposition and subsequent planarization processing scheme. The structure of FIG. 19I may then be reduced in thickness to remove the grating structure 1914, to expose the patterned dielectric 1916 and top provide metal lines 1938, which are reduced in thickness from metal lines 1936, as is depicted in FIG. 19J. In an embodiment, structure of FIG. 19I may then be reduced in thickness using a planarization process such as a chemical mechanical planarization (CMP) process.

Figure 19K:
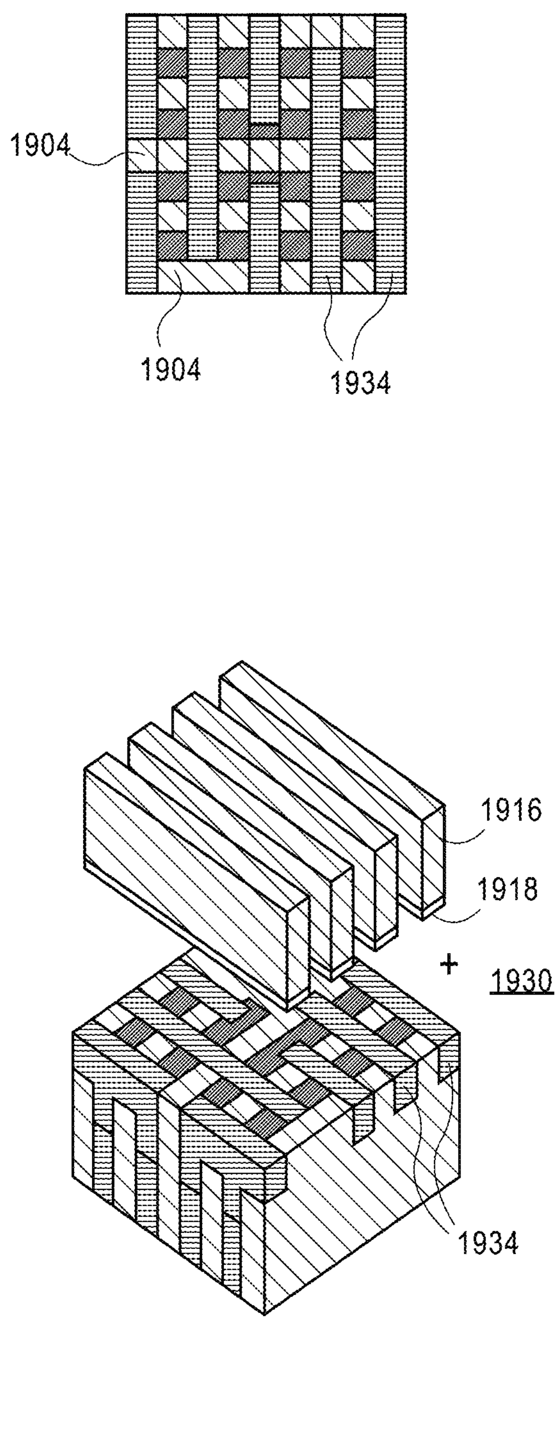
Figure 19L:
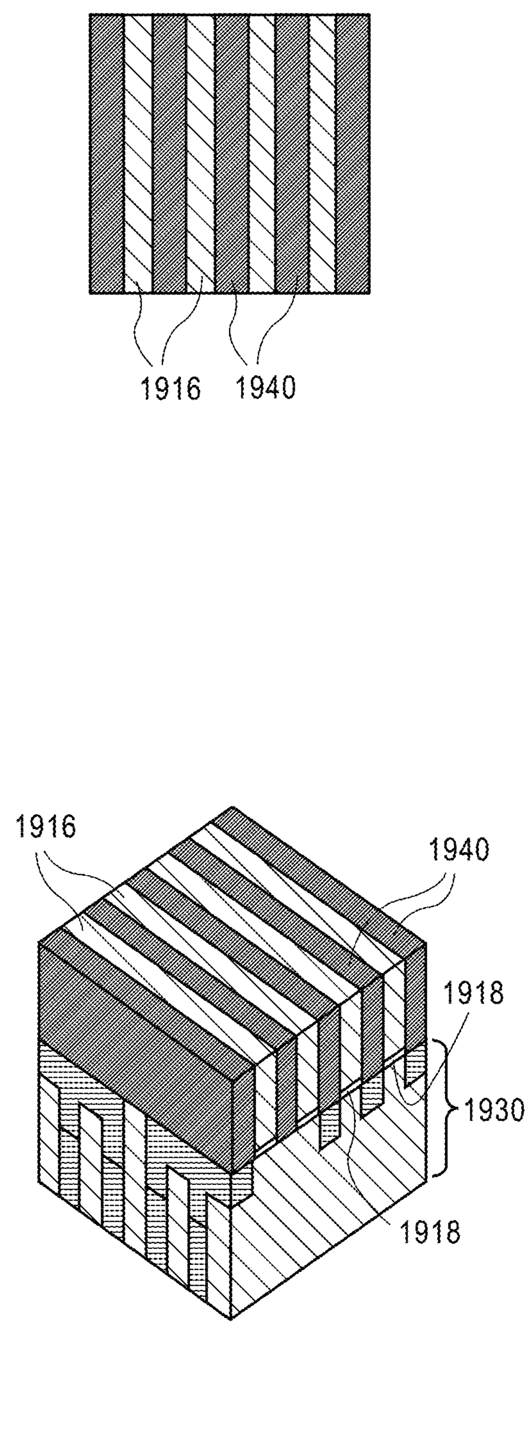

Referring to FIG. 19K, metal lines 1938 are removed from the structure of FIG. 19J to leave patterned dielectric layer 1916 and patterned etch stop layer 1918. The metal lines 1938 may be removed by a selective etch process that removes the metal lines 1938 and also ensures that no metal is left to remain at a height above the material layer 1904 and 1906 (i.e., such that no metal remains above the plug regions of structure 1930). A hardmask layer 1940 is then formed on the structure of FIG. 19K, between the lines of patterned dielectric layer 1916, as is depicted in FIG. 19L. In an embodiment, the hardmask layer 1940 is composed of silicon carbide (SiC) or silicon oxide ($SiO_2$) and is formed using a deposition and planarization processing scheme. In one embodiment, the hardmask layer 1940 is composed of the same material as the hardmask layer 1906. In an embodiment, the surface of the structure formed from patterned dielectric layer 1916 and the hardmask layer 1940 is substantially the same as the surface of, although orthogonal to, the starting structure 1900 of FIG. 19A. Thus, in an embodiment, the process described in association with FIGS. 19B-19L may be repeated on the structure of FIG. 19L to form a next metallization layer, and so on.

It is to be appreciated that the process described in association with FIGS. 19B-19L as repeated on the structure of FIG. 19L to form a next metallization layer may be referred to as a circular flow in that the end of the process flow has an identical or substantially identical layer stack and layout as the beginning of the process flow. In one embodiment, forming an additional metallization layer includes using such a circular flow. However, it is also to be appreciated that a circular or repetitive flow may only be implemented for select metallization layers. Other metallization layers in a resulting stack (e.g., layers above or below or in between layers fabricated using the processing scheme of FIGS. 19B-19L) may be fabricated using convention dual damascene or other approaches.

A resulting structure such as 1931 described in association with FIG. 19L may subsequently be used as a foundation for forming subsequent metal line/via and ILD layers. Alternatively, the structure 1931 of FIG. 19L may represent the final metal interconnect layer in an integrated circuit. It is also to be appreciated that, in subsequent fabrication operations, the dielectric lines may be removed to provide air gaps between the resulting metal lines. It is to be appreciated that the above examples have focused on via/contact formation. However, in other embodiments, similar approaches may be used to preserve or form regions for line end termination (plugs) within a metal line layer.

In accordance with an embodiment of the present disclosure, grating-based via and plug patterning is described. One or more embodiments described herein are directed to grating based plugs and cuts for feature end formation. Embodiments may involve one or more of lithography patterning, associated line-end CD yield, and spacer-based patterning. Embodiments employ methods to create plugs and cuts with placement control and uniformity of one dimensional (1D) features. It is to be appreciated that there is trade-off between better control for line ends (plugs) or via placements with the implication that via and line ends are placed at more restricted locations.

To provide context for embodiments described herein, in order to enable patterning tighter pitch features in semiconductor manufacturing, grating and plug or grating and cut approaches are being applied to more layers. As feature dimensions continue to shrink, the ability to robustly pattern cuts and plugs can limit scaling and yield. Cut and plug features are generally defined directly by a lithographic operation with primarily two dimensional (2D) features. Such 2D features have much higher variation and non-uniformity than one dimensional (1D) features.

With respect to FIGS. 20A-20G described below, in an embodiment, an overview of a simplified patterning process to generate grating defined plugs is presented. A sacrificial 1D pattern is generated orthogonal to a primary direction of a layer being patterned. A selection mask is then used to cut or keep the portions of the 1D pattern that will ultimately be used to cut or keep portions of the primary grating. The final edges of the cut/keep on the primary pattern are thus defined by edges of the 1D sacrificial grating, with much better control and uniformity. FIGS. 20A-20G illustrate plan views (upper) and corresponding cross-sectional views (middle and lower) representing various operations in a method of fabricating grating based plugs and cuts for feature end formation for back end of line (BEOL) interconnects, in accordance with an embodiment of the present disclosure.

Figure 20A:
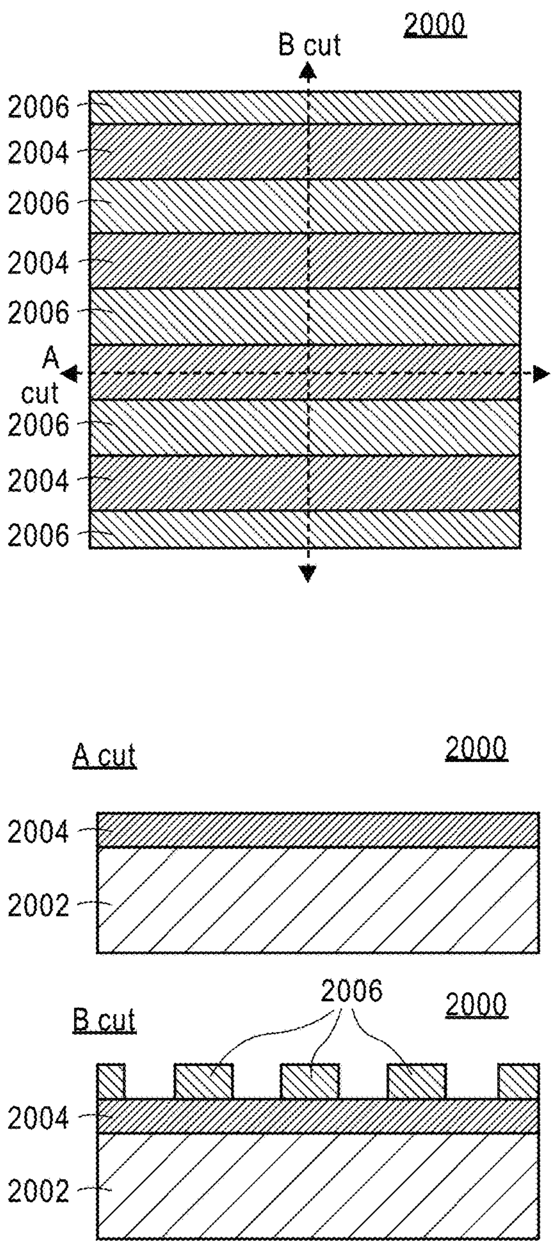
FIGS. 20A-20G illustrate plan views and corresponding cross-sectional views representing various operations in a method of fabricating grating based plugs and cuts for feature end formation for back end of line (BEOL) interconnects, in accordance with an embodiment of the present disclosure.

Referring to FIG. 20A, a starting point structure 2000 is provided as a beginning point for fabricating a new metallization layer. The starting point structure 2000 includes an interlayer dielectric (ILD) material layer 2002 having a first hardmask layer 2004 formed thereon. A second hardmask layer 2006 is formed on the first hardmask layer 2004. The second hardmask layer 2006 has a grating pattern, which may be viewed as a primarily one dimensional (1D) grating pattern. In an embodiment, the grating pattern of the second hardmask 2006 is ultimately used to define 1D locations of the final layer to be patterned but does not yet have the end of feature positions patterned therein. First hardmask layer 2004 and/or second hardmask layer 2006 may be fabricated from a material such as, but not limited to, silicon nitride (SiN), silicon oxide ($SiO_2$), titanium nitride (TiN), or silicon (Si). In one embodiment, first hardmask layer 2004 and second hardmask layer 2006 are fabricated from different materials from one another.

Figure 20B:
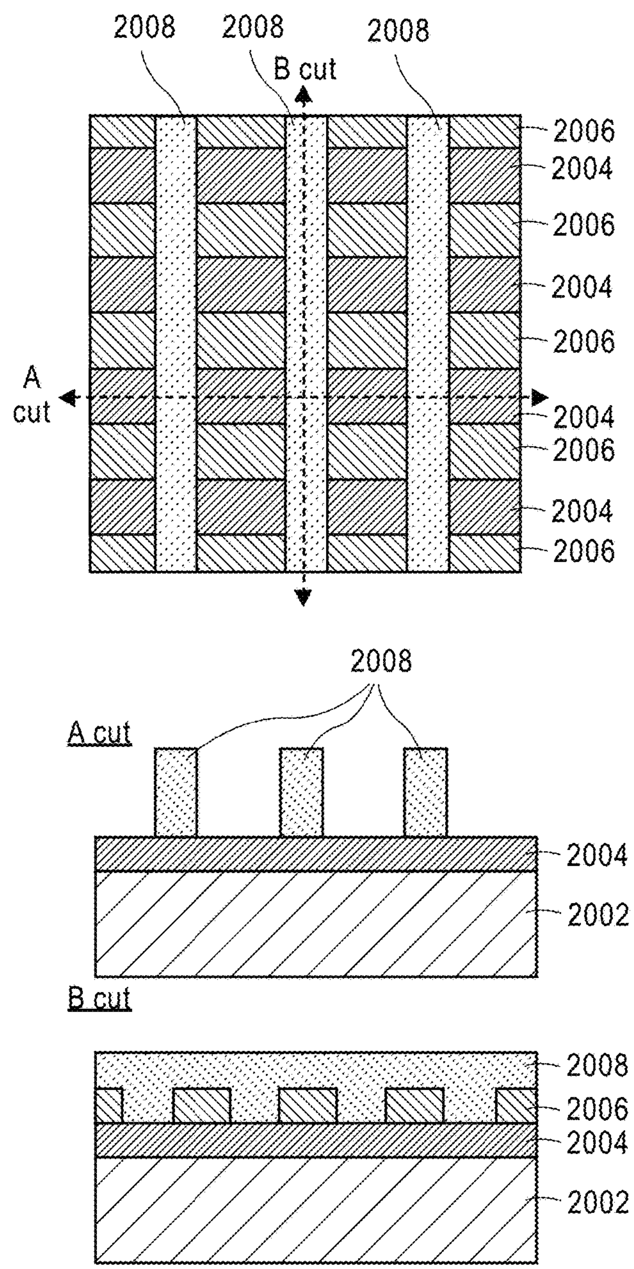

Referring to FIG. 20B, a third hardmask layer 2008 is formed on the structure of FIG. 20A. In an embodiment, the third hardmask layer 2008 has a grating pattern, which may be viewed as a primarily one dimensional (1D) grating pattern orthogonal to the 1D grating pattern of the second hardmask layer 2006. The third hardmask layer 2008 may be fabricated from a material such as, but not limited to, silicon nitride (SiN), silicon oxide ($SiO_2$), titanium nitride (TiN), or silicon (Si). In one embodiment, the third hardmask layer 2008 is fabricated from a material different than the materials of the first hardmask layer 2004 and the second hardmask layer 2006. It is to be appreciated that any one of the hardmask layers described above may actually include a plurality of sublayers, e.g., to provide improved etch selectivity.

In an embodiment, the grating pattern of the third hardmask layer 2008 and the grating pattern of the second hardmask layer 2006 together define all allowed line end locations for a metal line metallization layer. In one such embodiment, the grating pattern of the third hardmask layer 2008 and the grating pattern of the second hardmask layer 2006 together define line end locations at locations where the lines of the grating patterns overlap. In another such embodiment, the grating pattern of the third hardmask layer 2008 and the grating pattern of the second hardmask layer 2006 together define line end locations at locations where spaces are exposed between lines of the grating patterns.

Figure 20C:
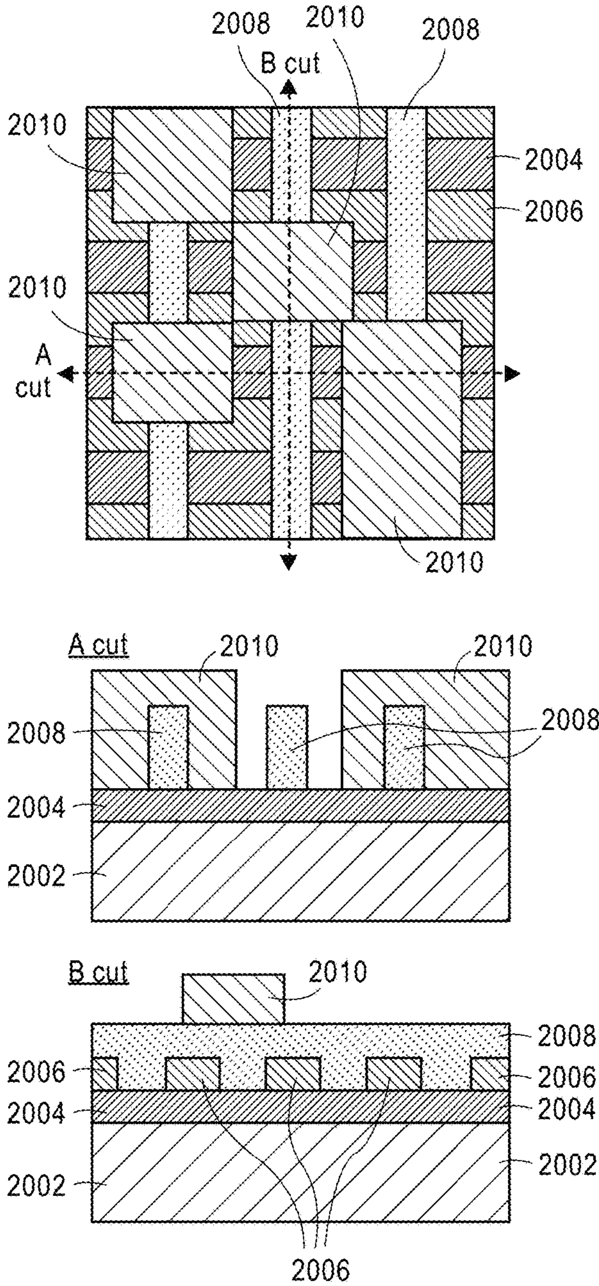

Referring to FIG. 20C, regions of a lithographic patterning mask 2010 are formed on the structure of FIG. 20B. The regions of the lithographic patterning mask 2010 may be formed from a photo-resist layer or layers, or like lithographic patterning mask. In an embodiment, the regions of the lithographic patterning mask 2010 provide a pattern of cut/keep regions on the sacrificial grating formed from the second hardmask layer 2006 and the third hardmask layer 2008. In an embodiment, then, a lithography process is used to select (cut or keep) portions of the sacrificial grating which will eventually define the end locations of a primary pattern of metal lines. In one such embodiment, 193 nm or EUV lithography is used together with an etch transferring of the resist pattern into underlying layers prior to etching the sacrificial grating pattern. In one embodiment, the lithographic process involves multiple exposures of resist layers or deposition/etch/deposition repetitive processing. It is to be appreciated that the masked regions may be referred to as cutting or keeping locations, where the orthogonal grating overlap regions or spaces between gratings are used to define plug (or perhaps via) locations.

Figure 20D:
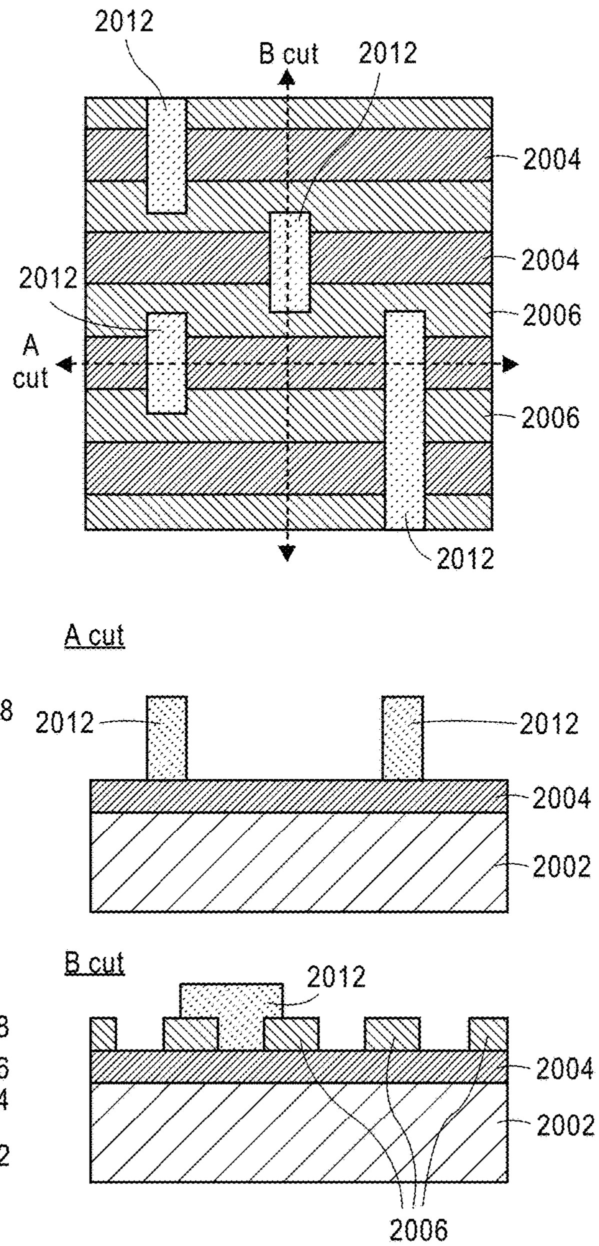

Referring to FIG. 20D, using the regions of the lithographic patterning mask 2010 of the structure of FIG. 20C as a mask, the third hardmask layer 2008 is selectively etched to form patterned hardmask layer 2012. That is, a portion of the sacrificial grating is etched to take on portions of the pattern of the regions of the lithographic patterning mask 2010 that protect portions of the third hardmask layer 2008 from an etching process. In an embodiment, the portions of the third hardmask layer 2008 that are removed in the etch process are not part of the final target design. In an embodiment, the regions of the lithographic patterning mask 2010 are removed subsequent to forming the patterned hardmask layer 2012, as is depicted in FIG. 20D.

Figure 20E:
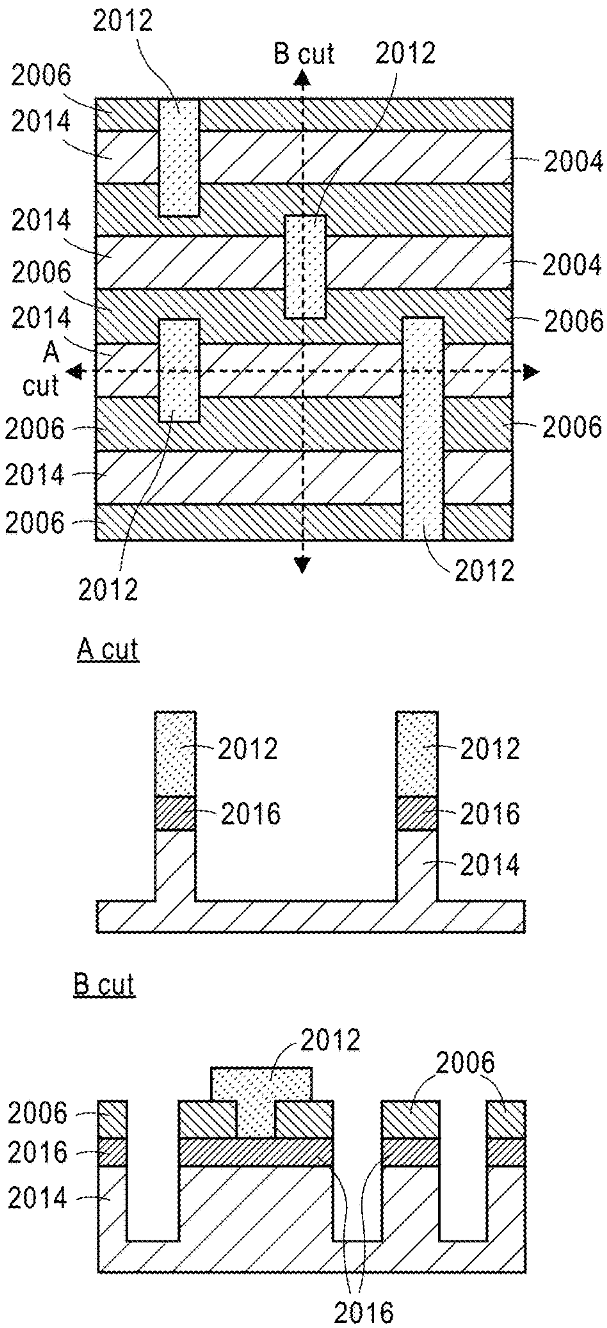

Referring to FIG. 20E, a combined pattern formed the second hardmask layer 2006 and the patterned hard mask layer 2012 of the structure of FIG. 20D is transferred into the first hardmask layer 2004 and into the ILD material layer 2002, e.g., by a selective etch process. The patterning forms a patterned ILD layer 2014 and a patterned hardmask layer 2016.

Figure 20F:
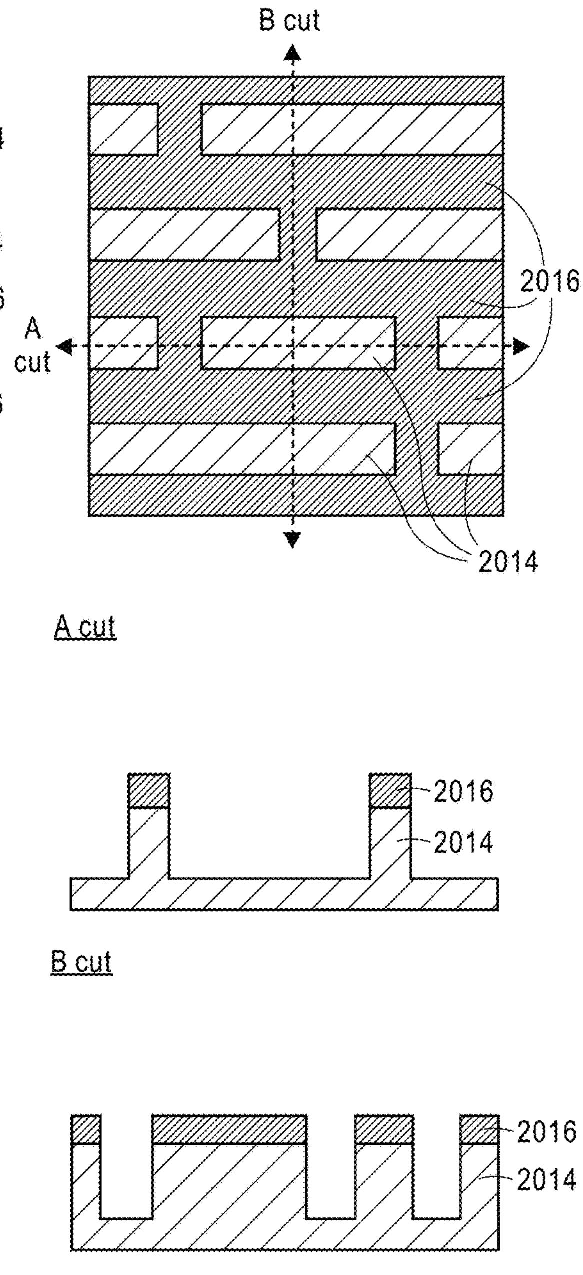

Referring to FIG. 20F, the patterned hard mask layer 2012 and the second hardmask layer 2006 (i.e., the sacrificial grating) of the structure of FIG. 20E is then removed. The patterned hardmask layer 2016 may be retained at this stage, as is depicted in FIG. 20F, or may be removed. Selective wet or dry processing techniques can be employed for removal of the patterned hard mask layer 2012 and the second hardmask layer 2006 (and, possibly, the patterned hardmask layer 2016). It is to be appreciated that the resulting structure of FIG. 20F can subsequently be used as a starting point for metal fill with the option of first removing the remaining patterned hardmask layer 2016. The end locations (line ends) of what will be metal features are defined by the edges of the 1D sacrificial grating transferred in to the ILD material layer 2002 and, hence, are well controlled.

Figure 20G:
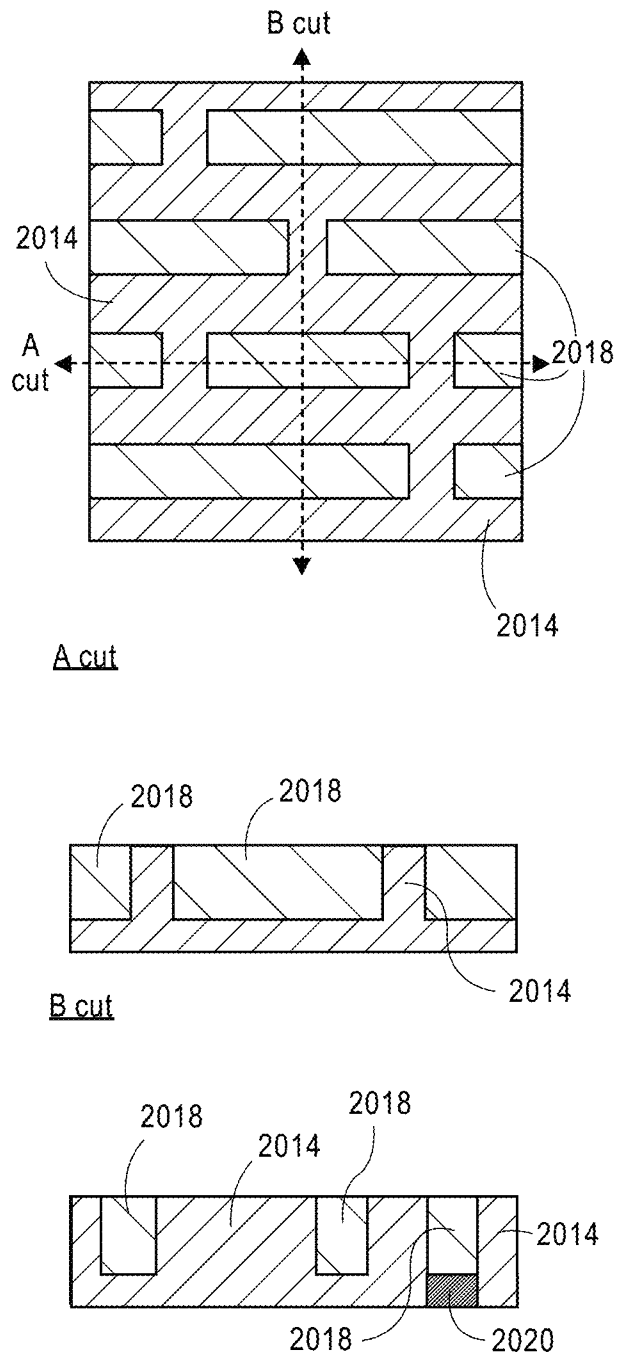

Referring to FIG. 20G, a metal fill process is performed on the structure of FIG. 20F to form metal lines 2018 in the openings patterned ILD layer 2014. The metal lines have lines ends formed by the breaks in continuity formed in the patterned ILD layer 2014. In an embodiment, the metal fill process is performed by depositing and then planarizing one or more metal layers over the patterned ILD layer 2014. The patterned hardmask layer 2016 may be retained during the metal deposition process and then removed during the planarization process, as is depicted in FIGS. 20F and 20G. However, in other embodiments, the patterned hardmask layer 2016 is removed prior to the metal fill process. In still other embodiments, the patterned hardmask layer 2016 is retained in the final structure. Referring again to FIG. 20G, it is to be appreciated that the metal lines 2018 may be formed over underlying features, such, as conductive via 2020 shown as an example.

A resulting structure such as described in association with FIG. 20G may subsequently be used as a foundation for forming subsequent metal line/via and ILD layers. Alternatively, the structure of FIG. 20G may represent the final metal interconnect layer in an integrated circuit. It is to be appreciated that the above process operations may be practiced in alternative sequences, not every operation need be performed and/or additional process operations may be performed. In an embodiment, offset due to conventional lithograph/dual damascene patterning that must otherwise be tolerated, is not a factor for the resulting structures described herein. It is to be appreciated that the above examples have focused on line end/plug/cut formation or preservation. However, in other embodiments, similar approaches may be used to form vias/contacts above or below a metal line layer. It is also to be appreciated that, in subsequent fabrication operations, the dielectric lines may be removed to provide air gaps between the resulting metal lines.

Referring again to FIGS. 20A-20G, in an embodiment, a patterning process to generate grating defined plugs has been described. The advantages of such an embodiment may include better dimensional control of end-to-end features that reduces the probability of end-to-end shorting (yield failure) otherwise observed under conditions of worst case process variation. Improved dimensional control of end-to-end features provides more area under worse case process variation for via landing and coverage. Accordingly, in an embodiment, improved electrical connection may be achieved from layer to layer, with increased yield and product performance. Improved dimensional control of end-to-end features can enable smaller end-to-end widths and, therefore, better product density (cost per functionality) may be achieved.

In embodiment, an advantage of embodiments of the present disclosure is that all the line-end locations are defined by a single lithography operation. For example, when plug/cut pitches become very small the common solution is to use multiple passes of lithography with additional processing to generate a composite plug/cut pattern. By contrast, in embodiments described herein, the feature-end locations are a function of multiple lithography operations and, hence, have larger variation than when a single lithography operation is used to define the feature-end as is the case with embodiments described herein.

In accordance with an embodiment of the present disclosure, line end cutting approaches are described. One or more embodiments described herein are directed to techniques for patterning metal line ends. Embodiments may include aspects of one or more of contact fabrication, damascene processing, dual damascene processing, interconnect fabrications, and metal line trench patterning.

To provide context, in the advanced nodes of semiconductor manufacturing, the low level interconnects are created by separate patterning processes of the line grating, line ends, and vias. The fidelity of the composite pattern tends to degrade as the vias encroach upon the line ends and vice-versa. Embodiments described herein provide for a line end process also known as a plug process that eliminates associated proximity rules. Embodiments may allow for a via to be placed at the line end and a large via to strap across a line end.

Figure 21A:
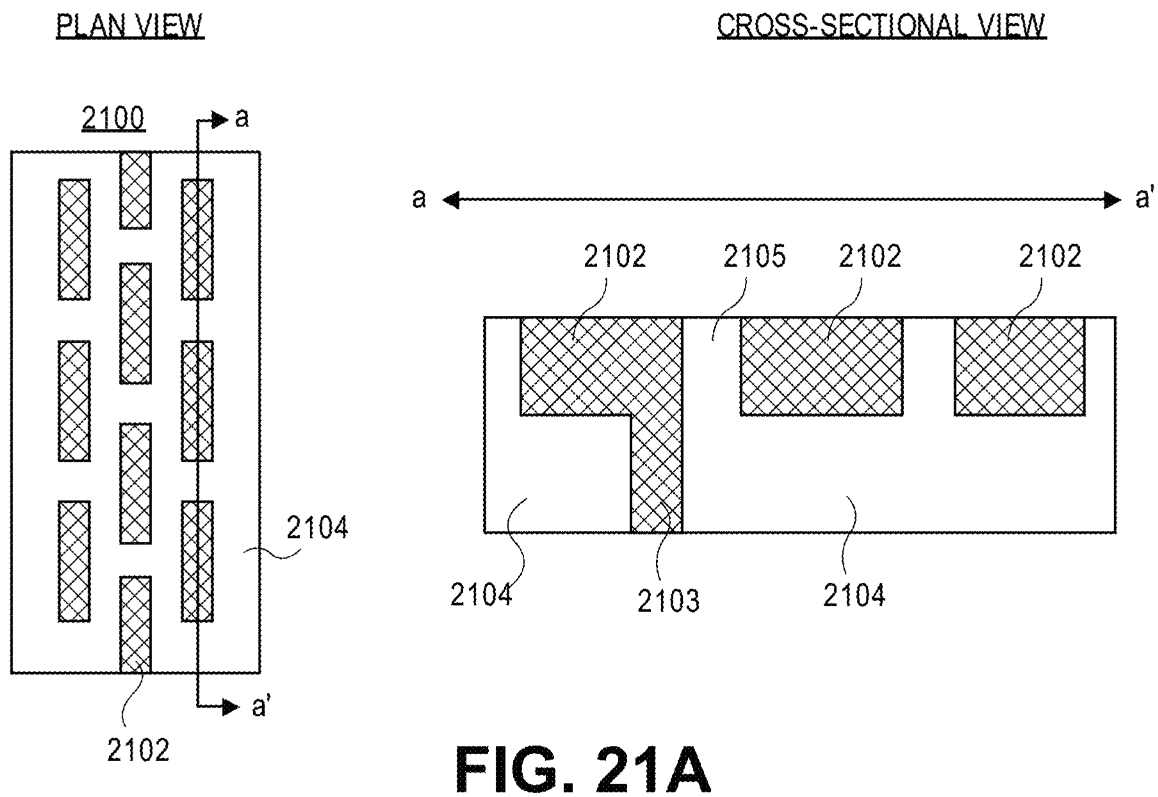
FIG. 21A illustrates a plan view and corresponding cross-sectional view taken along the a-a' axis of the plan view of a metallization layer of a currently known semiconductor device.
Figure 21B:
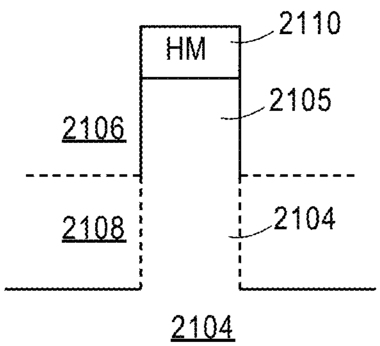
FIG. 21B illustrates a cross-sectional view of a line end or plug fabricated using a currently known processing scheme.
Figure 21C:
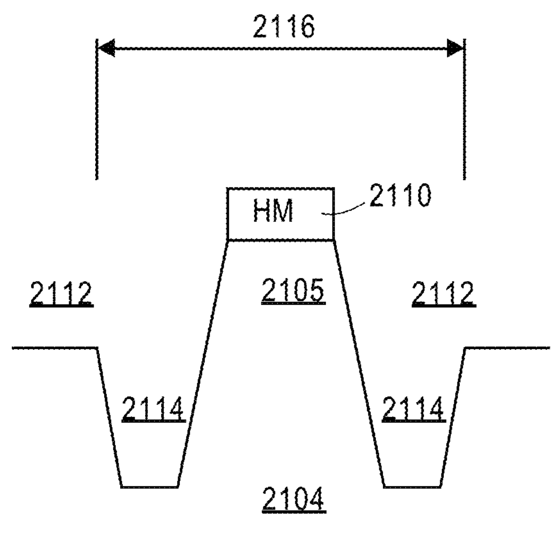
FIG. 21C illustrates another cross-sectional view of a line end or plug fabricated using a currently known processing scheme.

To provide further context, FIG. 21A illustrates a plan view and corresponding cross-sectional view taken along the a-a' axis of the plan view of a metallization layer of a conventional semiconductor device. FIG. 21B illustrates a cross-sectional view of a line end or plug fabricated using a currently known processing scheme. FIG. 21C illustrates another cross-sectional view of a line end or plug fabricated using a currently known processing scheme.

Referring to FIG. 21A, a metallization layer 2100 includes metal lines 2102 formed in a dielectric layer 2104. The metal lines 2102 may be coupled to underlying vias 2103. The dielectric layer 2104 may include line end or plug regions 2105. Referring to FIG. 21B, a conventional line end or plug region 2105 of a dielectric layer 2104 may be fabricated by patterning a hardmask layer 2110 on the dielectric layer 2104 and then etching exposed portions of the dielectric layer 2104. The exposed portions of the dielectric layer 2104 may be etched to a depth suitable to form a line trench 2106 or further etched to a depth suitable to form a via trench 2108. Referring to FIG. 21C, two vias adjacent opposing sidewalls of the line end or plug 2105 may be fabricated in a single large exposure 2116 to ultimately form line trenches 2112 and via trenches 2114.

However, referring again to FIGS. 21A-21C, fidelity issues and/or hardmask erosion issues may lead to imperfect patterning regimes. By contrast, one or more embodiments described herein include implementation of a process flow involving construction of a line end dielectric (plug) after a trench and via patterning process. In a an exemplary processing scheme, FIGS. 21D-21J illustrate cross-sectional views representing various operations in a process for patterning metal line ends for back end of line (BEOL) interconnects, in accordance with an embodiment of the present disclosure.

Figure 21D:
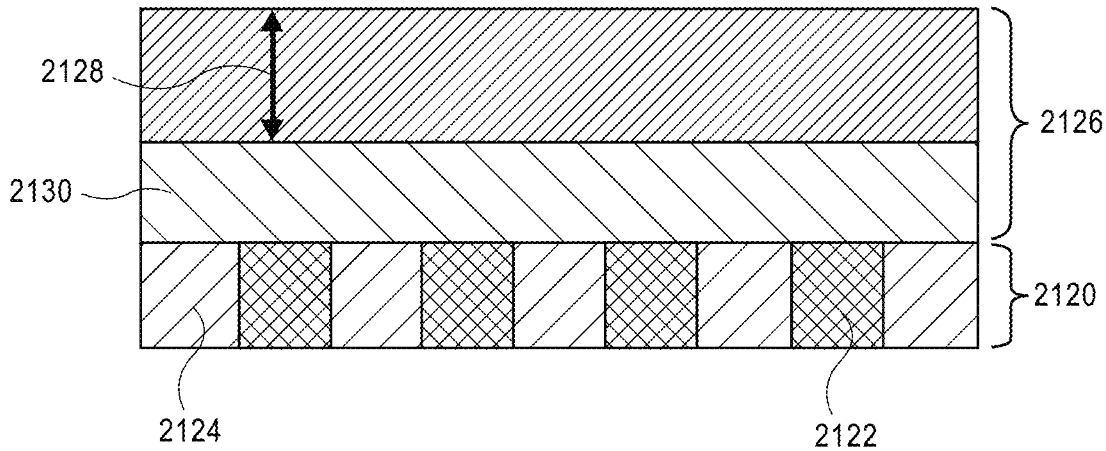
FIGS. 21D-21J illustrate cross-sectional views representing various operations in a process for patterning metal line ends for back end of line (BEOL) interconnects, in accordance with an embodiment of the present disclosure.

Referring to FIG. 21D, a method of fabricating a metallization layer of an interconnect structure for a semiconductor die includes forming a line trench 2128 in an upper portion (above a lower portion 2130) of an interlayer dielectric (ILD) material layer 2126 formed above an underlying metallization layer 2120. The underlying metallization layer 2120 includes metal lines 2122 disposed in a dielectric layer 2124.

Figure 21E:
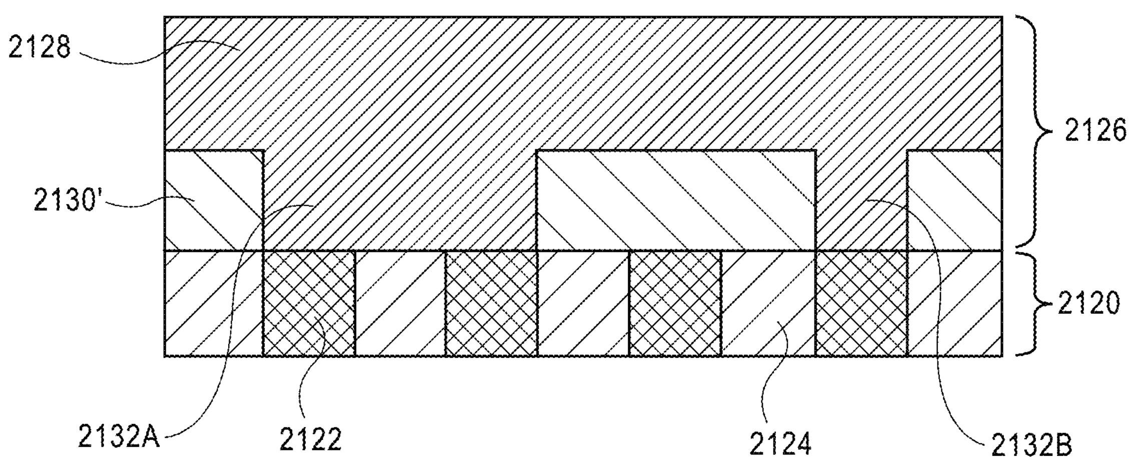

Referring to FIG. 21E, via trenches 2132A and 2132B are formed in the lower portion 2130 of the ILD material layer 2126 to form a patterned lower portion 2130' of the ILD material layer 2126. As an exemplary embodiment, the via trench 2132A exposes two metal lines 2122 of the underlying metallization layer 2120, while the via trench 2132B exposes one metal line 2122 of the underlying metallization layer 2120.

Figure 21F:
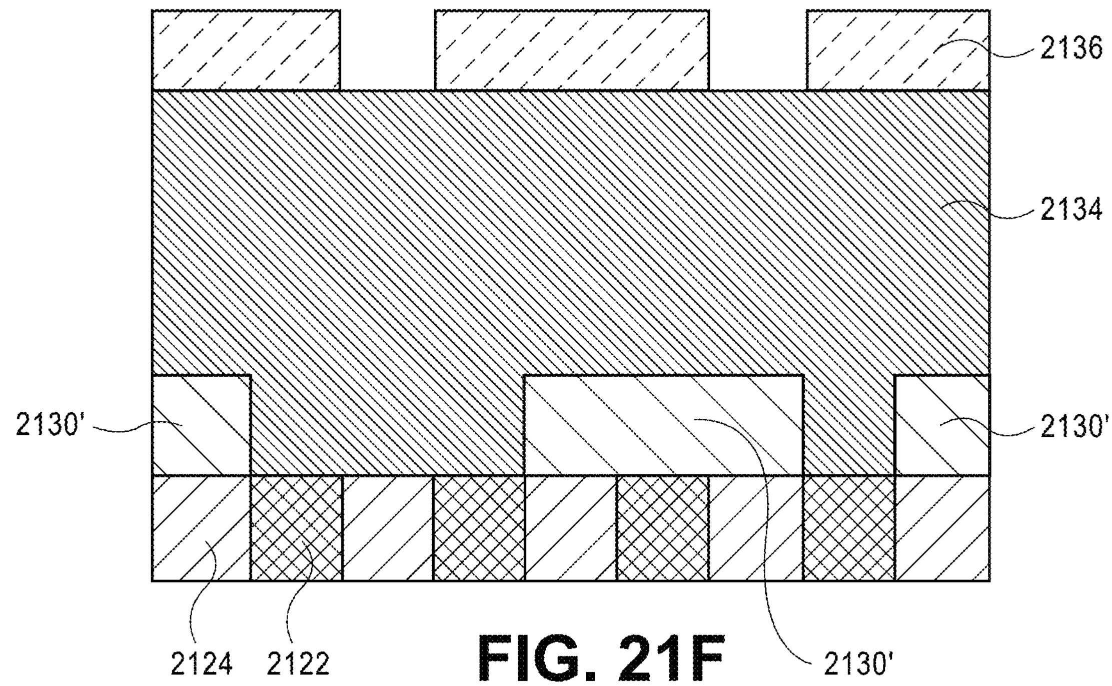

Referring to FIG. 21F, a sacrificial material 2134, such as a matrix material, is formed above the ILD material layer (portions 2130' shown in FIG. 21F) and in the line trench 2128 and the via trenches 2132A and 2132B. In an embodiment, a patterned hardmask layer 2136 is formed on the sacrificial material 2134, as is depicted in FIG. 21F.

Figure 21G:
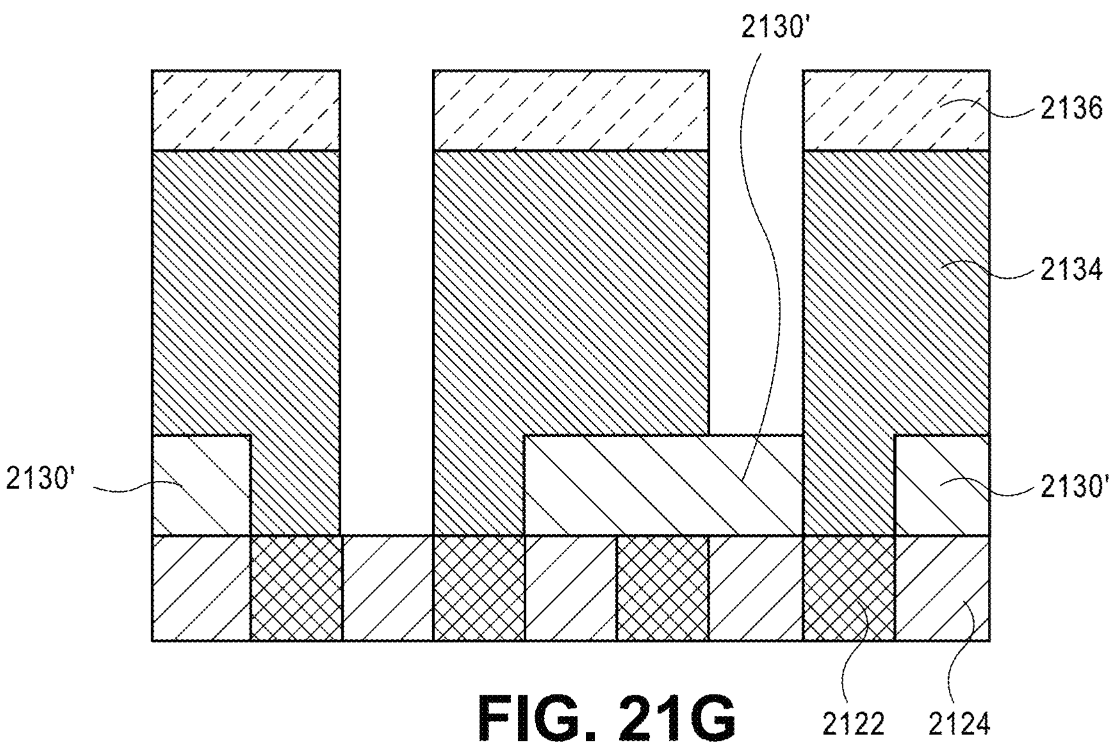

Referring to FIG. 21G, the sacrificial material 2134 is patterned to form an opening (left-hand side opening of FIG. 21G) exposing a portion of the lower metallization layer 2120 between the two metal lines 2122 of the underlying metallization layer 2120 associated with via trench 2132A of FIG. 21E. In the exemplary embodiment shown, the sacrificial material 2134 is further patterned to form an opening (right-hand side opening of FIG. 21G) exposing a portion of the patterned lower portion 2130' of the ILD material layer adjacent via trench 2132B of FIG. 2E. In an embodiment, the sacrificial material 2134 is patterned by transferring the pattern of patterned hardmask 2136 to the sacrificial material 2134 by an etch process.

Figure 21H:
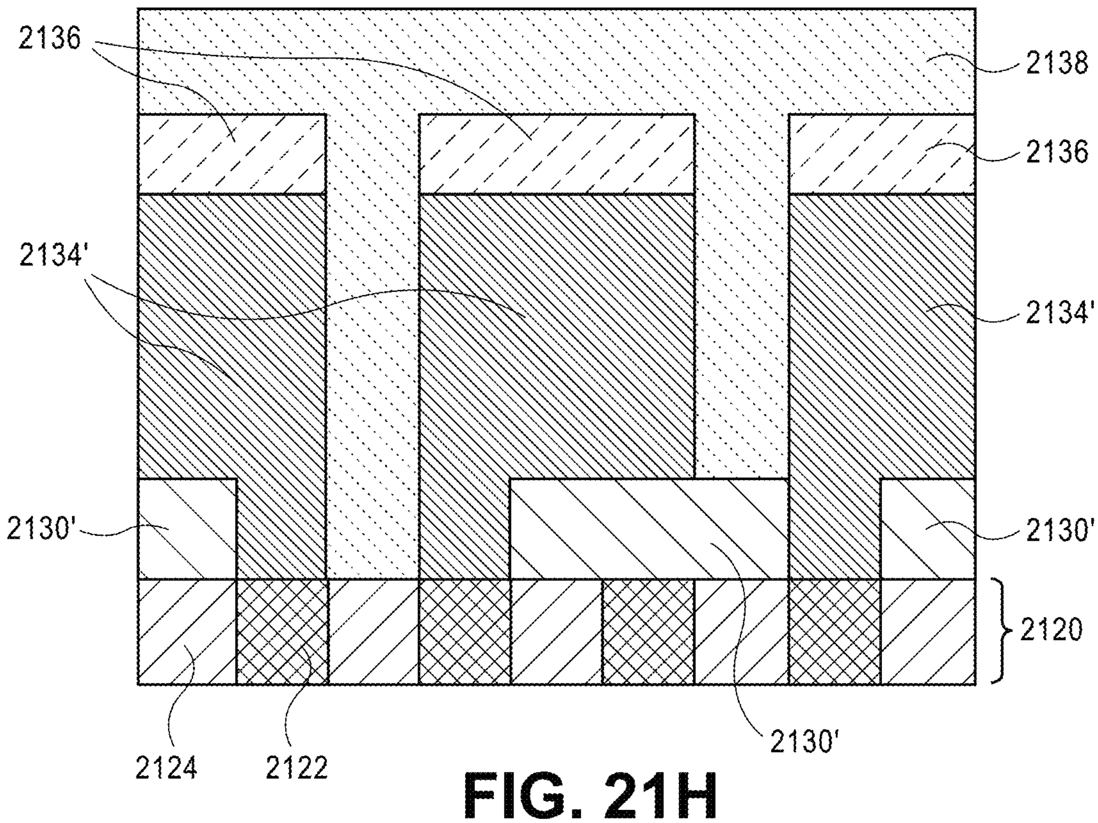

Referring to FIG. 21H, the openings of the sacrificial material 2134 (now shown as patterned and filled sacrificial material 2134') are filled with a dielectric material 2138. In one embodiment, the openings of the sacrificial material 2134 are filled with the dielectric material 2138 using a deposition process selected form the group consisting of atomic layer deposition (ALD) and chemical vapor deposition (CVD). In one embodiment, the openings of the sacrificial material 2134 are filled with the dielectric material 2138 of a first dielectric material composition. In one such embodiment, the ILD material layer 2126 includes a second dielectric material composed of a different material than the first dielectric material composition. In another such embodiment, however, the ILD material layer 2126 is composed of the first dielectric material.

Figure 21I:
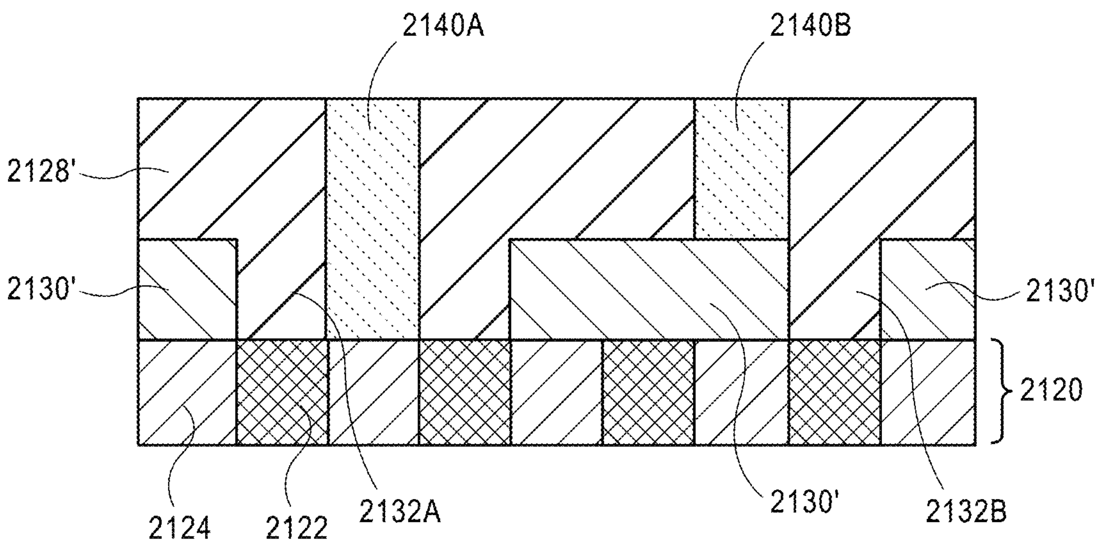

Referring to FIG. 21I, the filled sacrificial material 2134' is removed to provide dielectric plugs 2140A and 2140B. In the exemplary embodiment shown, dielectric plug 2140A is disposed on the portion of the lower metallization layer 2120 between the two metal lines 2122 of the underlying metallization layer 2120. Dielectric plug 2140A is adjacent a via trench 2132A and line trench 2128' and, in the case shown in FIG. 2I, is between essentially symmetric via trenches 2132A and line trenches 2128'. Dielectric plug 2140B is disposed on a portion of the patterned lower portion 2130' of the ILD material layer 2126. Dielectric plug 2140B neighbors a via trench 2142B and corresponding line trench (right-hand side of dielectric plug 2140B). In an embodiment, the structure of FIG. 21H is subjected to a planarization process used to remove overburden regions (regions above and over surfaces on either side of the trench) of the dielectric material 2138, to remove the patterned hardmask 2136, and to reduce a height of the sacrificial material 2134' and the portions of the dielectric material 2138 therein. The sacrificial material 2134' is then removed by using a selective wet or dry processing etch technique.

Figure 21J:
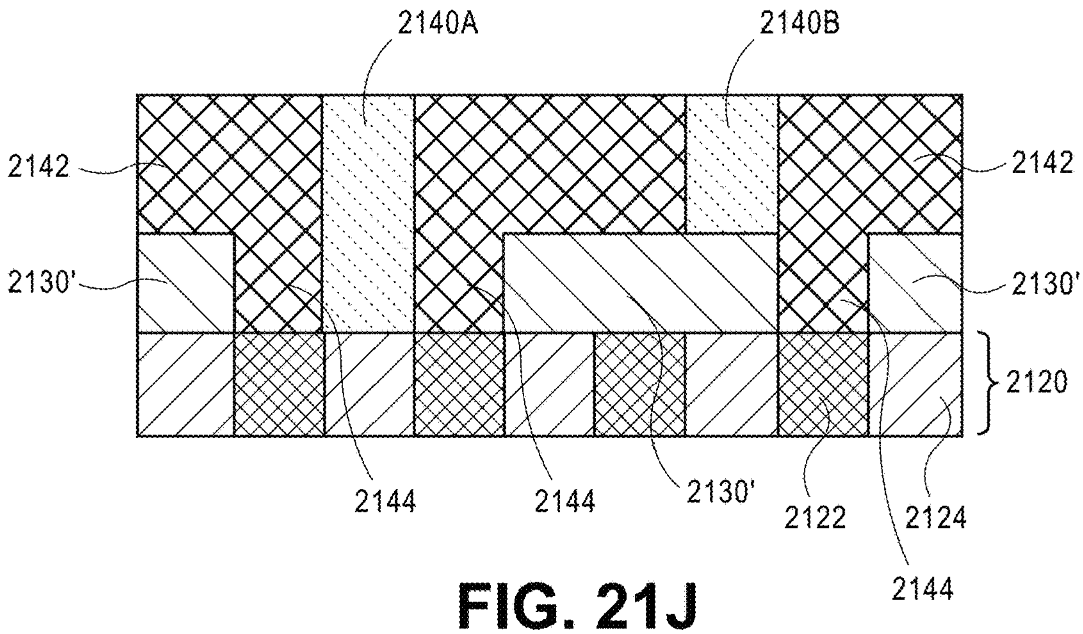

Referring to FIG. 21J, the line trenches 2128' and the via trenches 2132A and 2132B are filled with a conductive material. In one embodiment, filling the line trenches 2128' and the via trenches 2132A and 2132B with the conductive material forms metal lines 2142 and conductive vias 2144 in a patterned dielectric layer 2130'. In an exemplary embodiment, referring to plug 2140A, a first metal line 2142 and a first conductive via 2144 are directly adjacent to the left-hand sidewall of dielectric plug 2140A. A second metal line 2142 and a second conductive via 2144 are directly adjacent to the right-hand sidewall of dielectric plug 2140A. Referring to plug 2140B, a first metal line 2142 is directly adjacent to the right-hand sidewall of dielectric plug 2140B and an underlying portion of the patterned lower portion 2130' of the ILD layer is directly adjacent a first conductive via 2144. On the left-hand side of dielectric plug 2140B, however, only a metal line 2142 and not an associated conductive via are associated with the dielectric plug 2140B. In an embodiment, the metal fill process is performed by depositing and then planarizing one or more metal layers over the structure of FIG. 2I.

Referring again to FIG. 21J several different embodiments can be demonstrated using the illustration. For example, in an embodiment, the structure of FIG. 21J represents a final metallization layer structure. In another embodiment, the dielectric plugs 2140A and 2140B are removed to provide an air gap structure. In another embodiment, the dielectric plugs 2140A and 2140B are replaced with another dielectric material. In another embodiment, the dielectric plugs 2140A and 2140B may be a sacrificial pattern that is ultimately transferred to another underlying interlayer dielectric material layer.

In an exemplary embodiment, referring again to FIG. 21J (and previous processing operations), a metallization layer of an interconnect structure for a semiconductor die includes a metal line 2142 disposed in a trench 2128' of an interlayer dielectric (ILD) material layer 2126. The ILD material layer 2126 is composed of a first dielectric material. A conductive via 2144 is disposed in the ILD 2126 material layer, below and electrically connected to the metal line 2142. A dielectric plug 2140A (or 2140B) is directly adjacent to the metal line 2142 and the conductive via 2144. A second metal line 2142 and conductive via 2144 may also be directly adjacent to the dielectric plug (e.g., dielectric plug 2140A). In one embodiment, the dielectric plug 2140A (or 2140B) is composed of a second dielectric material different from the first dielectric material.

It is to be appreciated that filling the openings of the sacrificial material 2134 with the dielectric material may lead to formation of a seam in the dielectric material approximately in the center of the resulting dielectric plug. For example, FIG. 21K illustrates a cross-sectional view of a metallization layer of an interconnect structure for a semiconductor die that includes dielectric line ends or plugs having a seam therein, in accordance with an embodiment of the present disclosure.

Figure 21K:
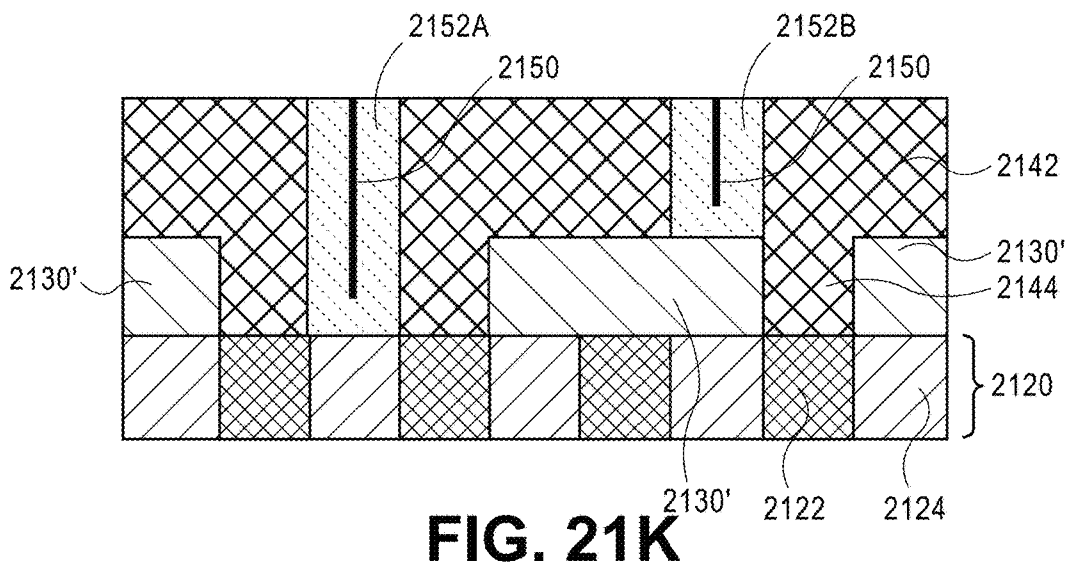
FIG. 21K illustrates a cross-sectional view of a metallization layer of an interconnect structure for a semiconductor die that includes dielectric line ends or plugs having a seam therein, in accordance with an embodiment of the present disclosure.

Referring to FIG. 21K, a metallization layer of an interconnect structure for a semiconductor die includes metal lines 2140 disposed in trenches of an interlayer dielectric (ILD) material layer (lower portion 2130' shown). Conductive vias 2144 are disposed in the ILD material layer 2130', below and electrically connected to the metal lines 2142. Dielectric plugs 2152A and 2152B are directly adjacent to the metal lines 2142 and the conductive vias 2144. The dielectric plugs 2152A and 2152B each include a seam 2150 approximately in the center of the dielectric plug, e.g., attributable to deposition formation of the dielectric plug by chemical vapor deposition (CVD) or atomic layer deposition (ALD).

Figure 21L:
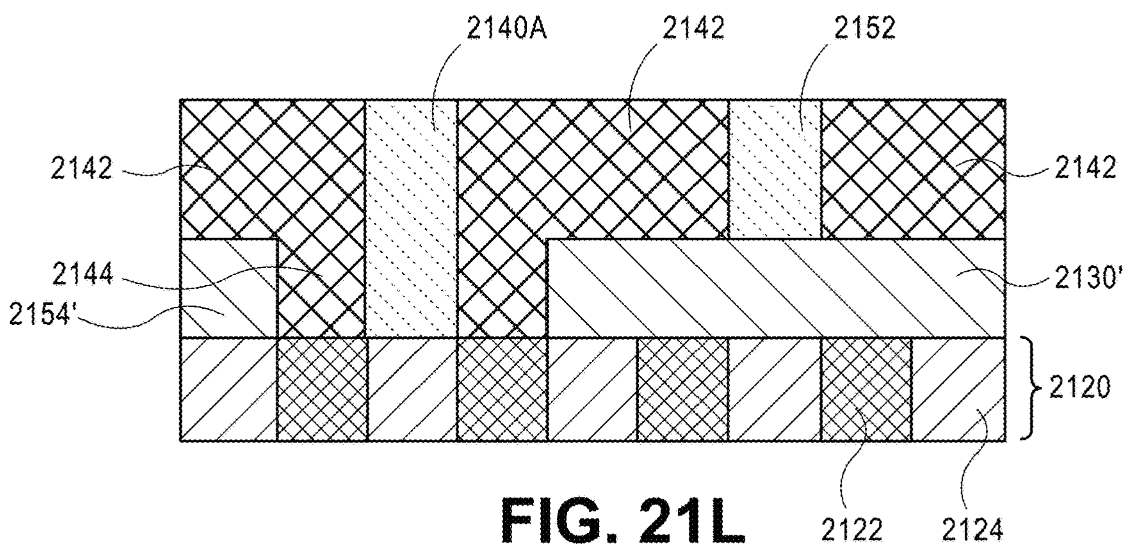
FIG. 21L illustrates a cross-sectional view of a metallization layer of an interconnect structure for a semiconductor die that includes a dielectric line end or plug that is not immediately adjacent a conductive via, in accordance with an embodiment of the present disclosure.

It is to be appreciated that a line end or plug may be associated with metal lines that do not have underlying vias immediately adjacent the dielectric plug. For example, FIG. 21L illustrates a cross-sectional view of a metallization layer of an interconnect structure for a semiconductor die that includes a dielectric line end or plug that is not immediately adjacent a conductive via, in accordance with an embodiment of the present disclosure. Referring to FIG. 21L, dielectric plug 2152 is associated with metal lines 2142 that do not have underlying vias (such as vias 2144) immediately adjacent the dielectric plug 2152 (and over associated patterned dielectric layer 2154').

A resulting structure such as described in association with FIG. 21J, FIG. 21K or FIG. 21L may subsequently be used as a foundation for forming subsequent metal line/via and ILD layers. Alternatively, the structure of FIG. 21J, FIG. 21K or FIG. 21L may represent the final metal interconnect layer in an integrated circuit. In an embodiment, offset due to conventional lithography/dual damascene patterning that must otherwise be tolerated, is mitigated for the resulting structures described herein. It is also to be appreciated that, in subsequent fabrication operations, the dielectric layer(s) may be removed to provide air gaps between the resulting metal lines.

In accordance with an embodiment of the present disclosure, self-aligned etching of pre-formed vias and plugs is described. One or more embodiments described herein are directed to self-aligned via and plug patterning. The self-aligned aspect of the processes described herein may be based on a directed self-assembly (DSA) mechanism, as described in greater detail below. However, it is to be appreciated that selective growth mechanisms may be employed in place of, or in combination with, DSA-based approaches. In an embodiment, processes described herein enable realization of self-aligned metallization for back-end of line feature fabrication.

Embodiments described herein may be directed to self-aligned isotropic etch processing of pre-formed vias or plugs, or both. For example, a processing scheme may involve pre-formation of every possible via and plug in a metallization layer, such as a back end of line metallization layer of a semiconductor structure. Lithography is then employed to select specific via and/or plug locations to open/close (e.g., keep/remove). Implementation of embodiments described herein can involve the use of such an etch scheme to form all vias/plugs in a photo-bucket arrangement for every corresponding via/metal layer in a metallization stack. As will be appreciated, vias may be formed in a layer different from a layer than plugs are formed in (e.g., the latter being formed in a metal line layer that is vertically between via layers), or plugs and vias may be formed in a same layer.

One or more embodiments described herein offer a more efficient approach to patterning by maximizing the overlay process window, minimizing the size and shape of required patterns, and increasing the efficiency of the lithography process to pattern holes or plugs. In a more specific embodiment, a pattern needed to open a pre-formed via or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. The pattern features can also be made to be shallow, which can improve the patterning resolution. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

As an exemplary general processing scheme, FIGS. 22A-22G illustrate portions of integrated circuit layers representing various operations in a method involving self-aligned isotropic etching of pre-formed via or plug locations, in accordance with an embodiment of the present disclosure. In each illustration at each described operation, plan views are shown on the left-hand side, and corresponding cross-sectional views are shown on the right-hand side. These views will be referred to herein as corresponding cross-sectional views and plan views.

Figure 22A:
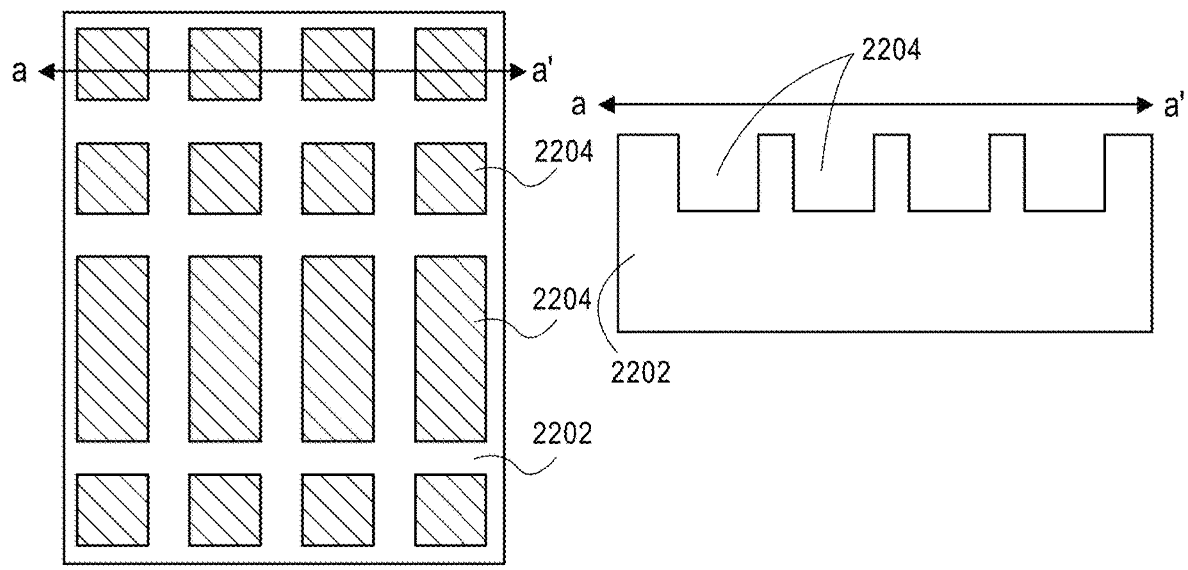
FIGS. 22A-22G illustrate portions of integrated circuit layers representing various operations in a method involving self-aligned isotropic etching of pre-formed via or plug locations, in accordance with an embodiment of the present disclosure.

FIG. 22A illustrates a plan view and corresponding cross-sectional view (taken along the a-a' axis) of a starting structure following pre-patterning of holes/trenches 2204 in a substrate or layer 2202. In one embodiment, the substrate or layer 2202 is an inter-layer dielectric (ILD) material layer.

Although not depicted for simplicity, it is to be appreciated that the holes/trenches 2204 may expose underlying features, such as underlying metal lines. Furthermore, in an embodiment, the starting structure may be patterned in a grating-like pattern with holes/trenches 2204 spaced at a constant pitch and having a constant width. The pattern, for example, may be fabricated by a pitch halving or pitch quartering, etc., approach. In the case that a via layer is fabricated, some of the holes/trenches 2204 may be associated with underlying lower level metallization lines.

Figure 22B:
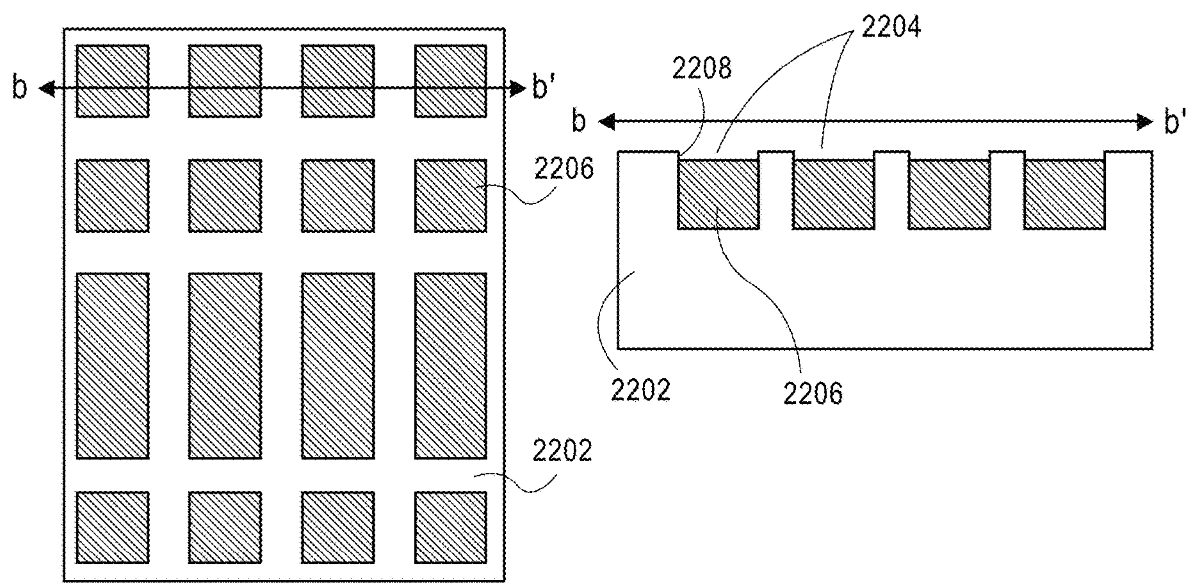

FIG. 22B illustrates a plan view and corresponding cross-sectional view (taken along the b-b' axis) of the structure of FIG. 22A following the filling of holes/trenches 2204 with a sacrificial or permanent placeholder material 2206. In the case that a permanent placeholder material is used, an ILD material may be used to fill holes/trenches 2204. In the case that a sacrificial placeholder material is used, more flexibility in design choice may be afforded. For example, in one embodiment, a material that would not otherwise be suitable for retention in a final structure may be used, such as a structurally weak polymer or a soft photo-resist material. As depicted in the cross-sectional view of FIG. 22B, formation of a slight recess 2208 of the sacrificial or permanent placeholder material 2206 in the holes/trenches 2204 may be included to assist with subsequent processing. In one embodiment, the sacrificial or permanent placeholder material 2206 is a spin-on dielectric material.

Figure 22C:
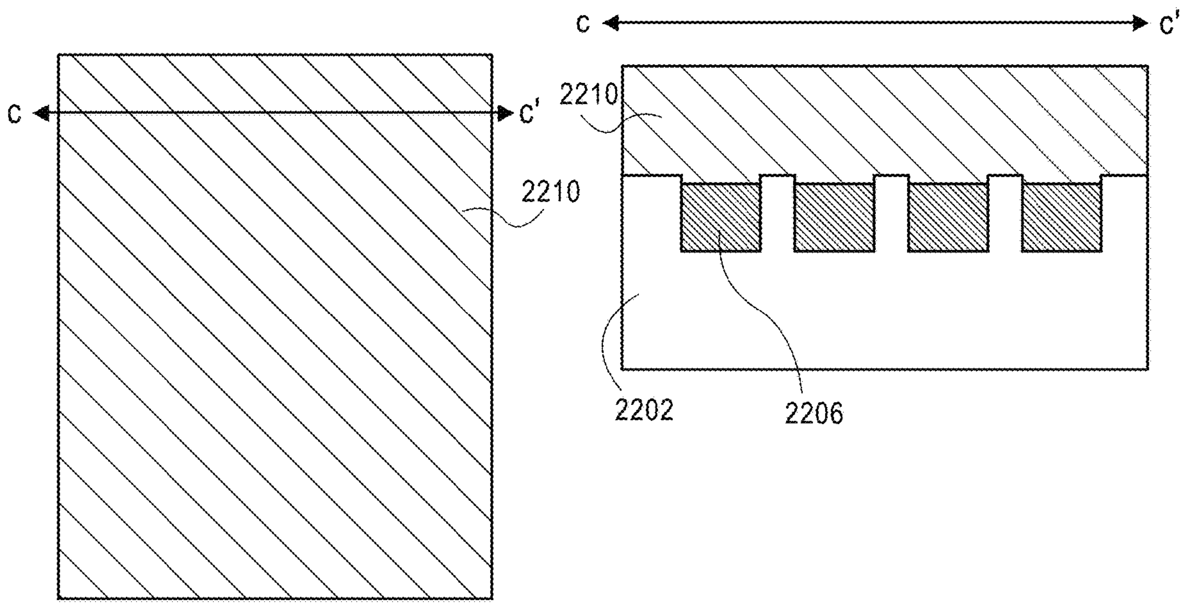

FIG. 22C illustrates a plan view and corresponding cross-sectional view (taken along the c-c' axis) of the structure of FIG. 22B following the formation of a patterning layer 2210. In an embodiment the patterning layer 2210 is a photo-sensitive material, such as a positive tone photo-resist layer. In another embodiment, the patterning layer 2210 is an anti-reflective coating material. In an embodiment, the patterning layer 2210 includes a stack of material layers including one or more photo-sensitive material layers and/or one or more anti-reflective coating material layers.

Figure 22D:
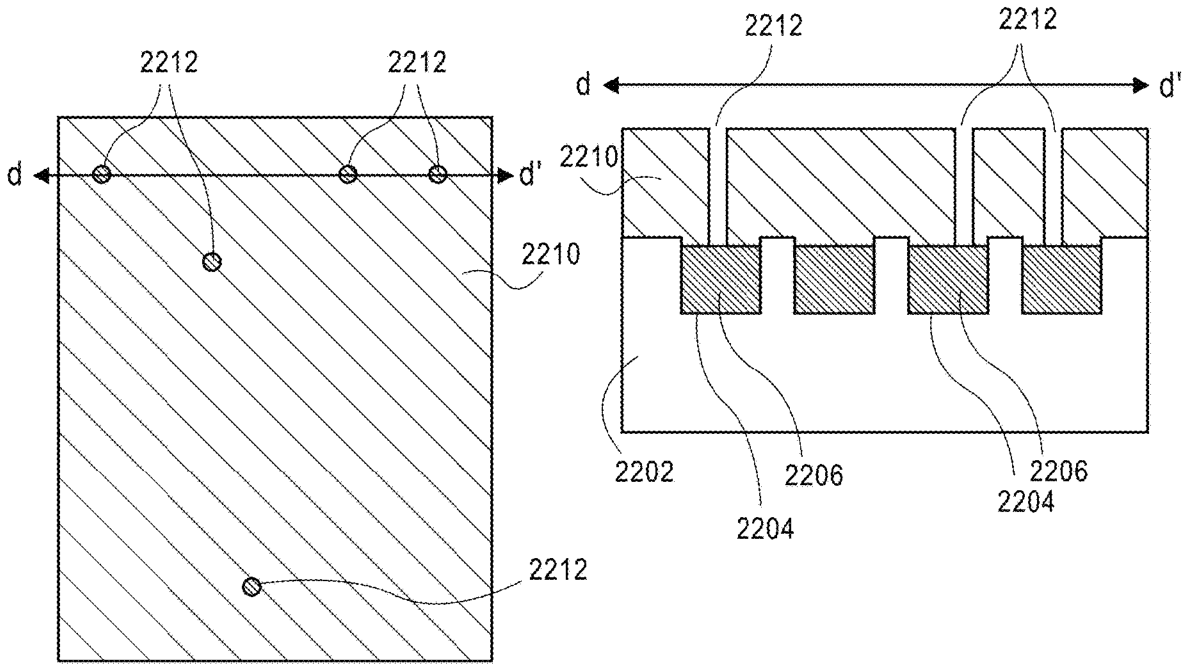

FIG. 22D illustrates a plan view and corresponding cross-sectional view (taken along the d-d' axis) of the structure of FIG. 22C following patterning of the patterning layer 2210 to form openings 2212 in the patterning layer 2210. Referring to FIG. 22D, the openings 2212 expose underlying portions of the sacrificial or permanent placeholder material 2206. In particular, the openings 2212 expose underlying portions of the sacrificial or permanent placeholder material 2206 only at the holes/trenches 2204 where a via or plug is selected to be formed. In an embodiment, the openings 2212 in the patterning layer 2210 are substantially smaller than the exposed holes/trenches 2204. As described briefly above, the formation of openings 2212 that are relatively smaller than exposed holes/trenches 2204 provides a markedly increased tolerance for misalignment issues. In an embodiment, the patterning layer 2210 is a photo-sensitive material and the openings 2212 are formed by a lithographic process, such as a positive tone lithographic process.

Figure 22E:
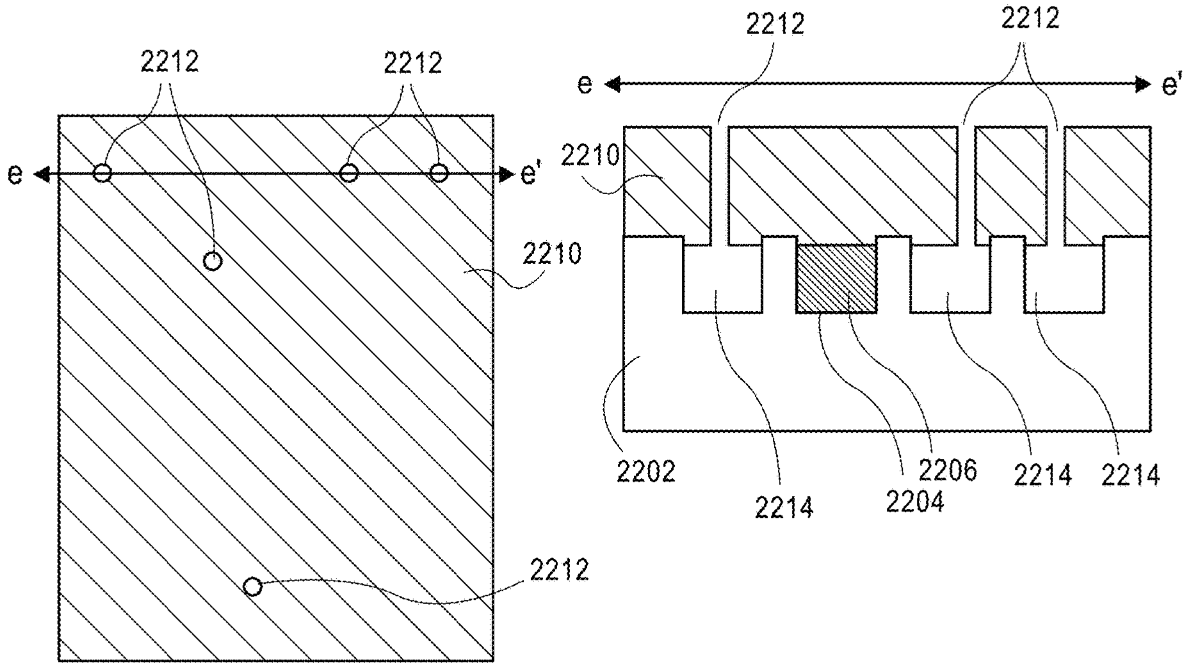

FIG. 22E illustrates a plan view and corresponding cross-sectional view (taken along the e-e' axis) of the structure of FIG. 22D following removal of the sacrificial or permanent placeholder material 2206 in locations exposed by the openings 2212 to form re-exposed holes/trenches 2214. In an embodiment, the sacrificial or permanent placeholder material 2206 is removed by an isotropic etching process. In one such embodiment, the isotropic etching process involves application of a wet etchant. The wet etchant accesses and etches the sacrificial or permanent placeholder material 2206 through openings 2212. The etch process is isotropic in the sense that material that is not exposed by openings 2212, but is accessible through openings 2212, can be etched to selectively formed re-exposed holes/trenches 2214 in desired locations for via or plug formation. In one embodiment, the wet etch process etches the sacrificial or permanent placeholder material 2206 without etching, or without substantially etching the patterning layer 2210.

In an embodiment, the sacrificial or permanent placeholder material 2206 is a spin-on carbon hardmask material and the etch process is a TMAH-based etch process. In another embodiment, the sacrificial or permanent placeholder material 2206 is a spin-on bottom anti-reflective coating (BARC) material and the etch process is a TMAH-based etch process. In another embodiment, the sacrificial or permanent placeholder material 2206 is a spin-on bottom glass material and the etch process is a wet etch process based on an organic solvent, an acid or a base. In another embodiment, the sacrificial or permanent placeholder material 2206 is a spin-on metal oxide material and the etch process is a wet etch process based on commercially available cleans chemicals. In another embodiment, the sacrificial or permanent placeholder material 2206 is a CVD carbon material and the etch process is based on an oxygen plasma ash.

Figure 22F:
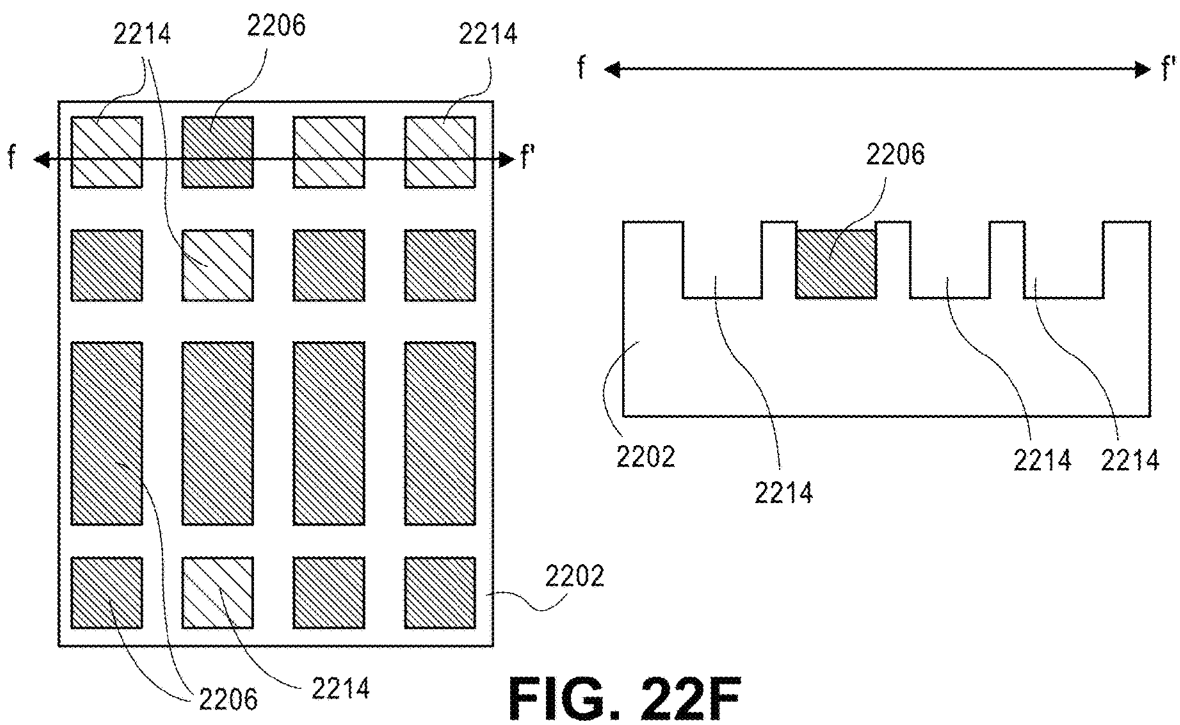

FIG. 22F illustrates a plan view and corresponding cross-sectional view (taken along the f-f' axis) of the structure of FIG. 22E following removal of the patterning layer 2210. In an embodiment, the patterning layer 2210 is a photo-resist layer, and the photo-resist layer is removed by a wet stripping or plasma ashing process. The removal of the patterning layer 2210 completely exposes the re-exposed holes/trenches 2214.

Figure 22G:
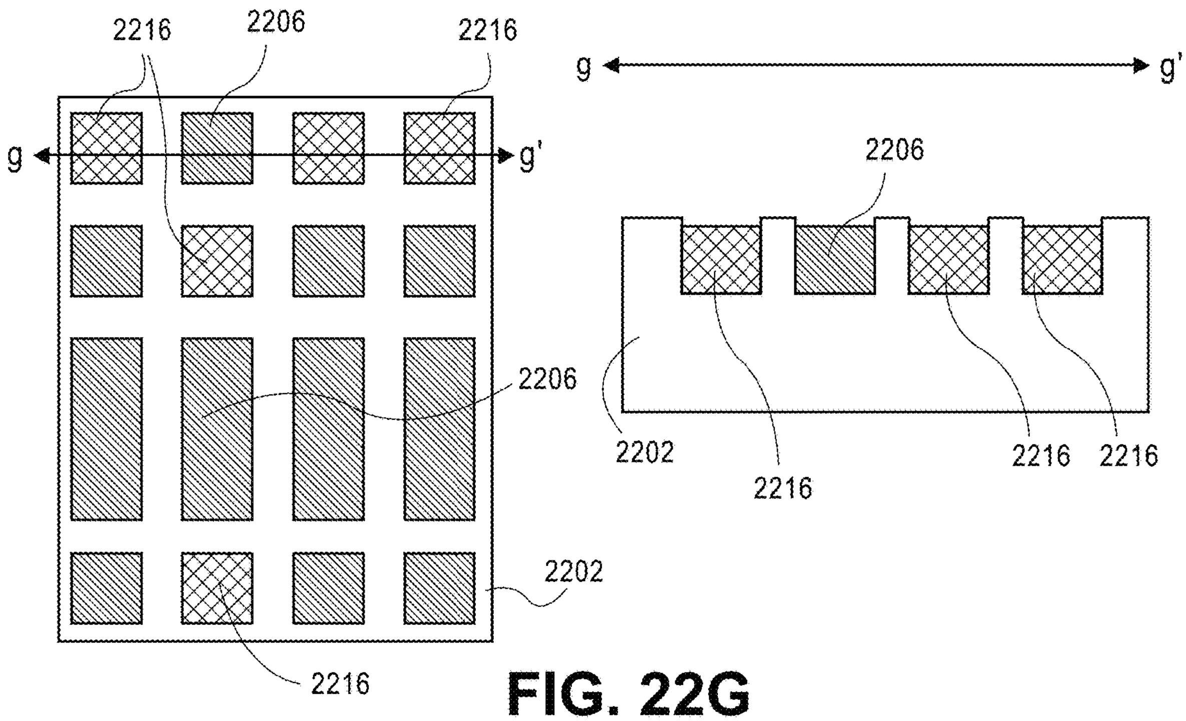

FIG. 22G illustrates a plan view and corresponding cross-sectional view (taken along the g-g' axis) of the structure of FIG. 22F following the filling of the re-exposed holes/trenches 2214 with a material layer 2216 and subsequent planarization. In an embodiment, the material layer 2216 is for forming plugs and is a permanent ILD material. In another embodiment, the material layer 116 is for forming conductive vias and is a metal fill layer. In one such embodiment, the metal fill layer is a single material layer, or is formed from several layers, including conductive liner layers and fill layers. Any suitable deposition process, such as electroplating, chemical vapor deposition or physical vapor deposition, may be used to form such a metal fill layer. In an embodiment, the metal fill layer is composed of a conductive material such as, but not limited to, Al, Ti, Zr, Hf, V, Ru, Co, Ni, Pd, Pt, Cu, W, Ag, Au or alloys thereof. In the case that the material layer 116 is planarized following deposition, a chemical mechanical polishing process may be used.

In an embodiment, the material layer 2216 is a material suitable for forming a conductive via. In one such embodiment, the sacrificial or permanent placeholder material 2206 is a permanent placeholder material such as a permanent ILD material. In another such embodiment, the sacrificial or permanent placeholder material 2206 is a sacrificial placeholder material that is subsequently removed and replaced with a material such as a permanent ILD material. In another embodiment, the material layer 2216 is a material suitable for forming a dielectric plug. In one such embodiment, the sacrificial or permanent placeholder material 2206 is a sacrificial placeholder material that is subsequently removed or partially removed to enable metal line formation.

It is to be appreciated that the resulting structure of FIG. 22G may subsequently be used as a foundation for forming subsequent metal line/via and ILD layers. Alternatively, the structure of FIG. 22G may represent the final metal interconnect layer in an integrated circuit. Furthermore, it is to be appreciated that the above examples do not include etch-stop or metal capping layers in the Figures that may otherwise be necessary for patterning. However, for clarity, such layers are not included in the Figures since they do not impact the overall concept.

In another aspect, embodiments are directed to a process flow implementing an isotropic dry etch together with a hole shrink process. In one such embodiment, a patterning scheme provides pinhole patterning in a mask layer following the filling of all via locations with an organic polymer. As an exemplary processing scheme, FIGS. 22H-22J illustrate angled cross-sectional views showing portions of integrated circuit layers representing various operations in a method involving self-aligned isotropic etching of pre-formed via locations, in accordance with an embodiment of the present disclosure.

Figure 22H:
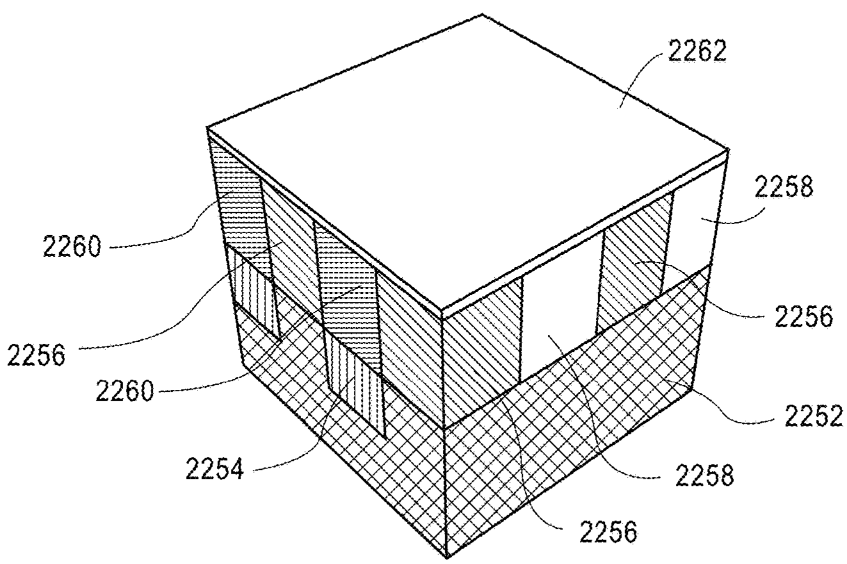
FIGS. 22H-22J illustrate angled cross-sectional views showing portions of integrated circuit layers representing various operations in a method involving self-aligned isotropic etching of pre-formed via locations, in accordance with an embodiment of the present disclosure.

FIG. 22H illustrates a starting structure following filling of all possible via locations with a placeholder material. Referring to FIG. 22H, a metallization layer 2252 (such as an ILD layer of a metallization layer) is formed above a substrate (not shown) and includes a plurality of metal lines 2254 therein. ILD material(s), which may be two or more distinct ILD materials 2256 and 2258 surround the locations where vias may possibly be formed. A sacrificial placeholder material 2260 occupies the locations where all possible vias may be formed above the metal lines 2252. A mask layer 2262, such as a thin low temperature oxide mask layer is formed on the underlying structure. It is to be appreciated that sacrificial placeholder material 2260 is not present over adjacent features, which may be accomplished by a deposition and planarization or recess process.

Figure 22I:
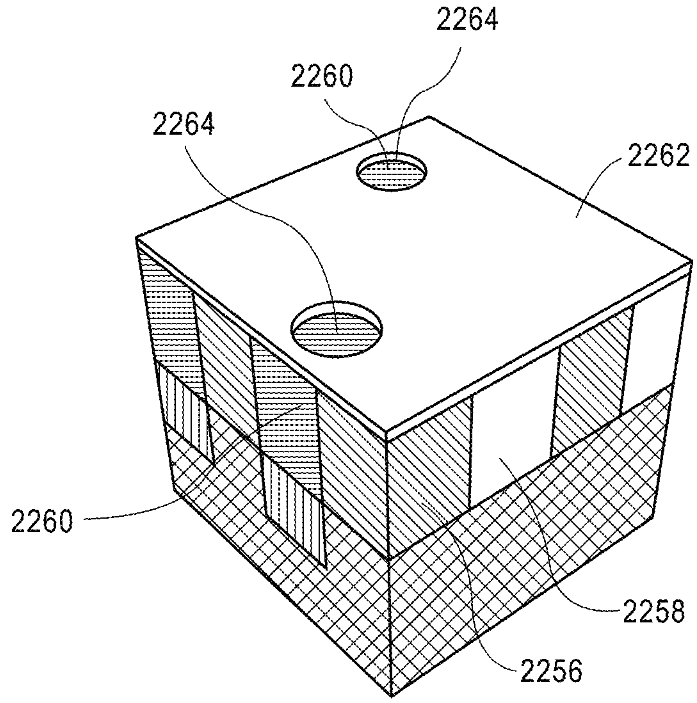

FIG. 22I illustrates the structure of FIG. 22H following patterning of the mask layer 2262 to form openings 2264 in the mask layer 2262. Referring to FIG. 22I, the openings 2264 expose underlying portions of the sacrificial placeholder material 2260. In particular, the openings 2264 expose underlying portions of the sacrificial placeholder material 2260 only at the locations where a via is selected to be formed. In an embodiment, the openings 2264 in the mask layer 2262 are substantially smaller than the exposed sacrificial placeholder material 2260. As described briefly above, the formation of openings 2264 that are relatively smaller than the exposed sacrificial placeholder material 2260 provides a markedly increased tolerance for misalignment issues. The process effectively "shrinks" the via locations to the sizing of "pinholes" with respect to selection and patterning of the actual via locations. In an embodiment, the mask layer 2262 is patterned with openings 2262 by first forming and patterning a photo-sensitive material on the mask layer 2262 by a lithographic process, such as a positive tone lithographic process, and then patterning the mask layer 2262 by an etch process.

Figure 22J:
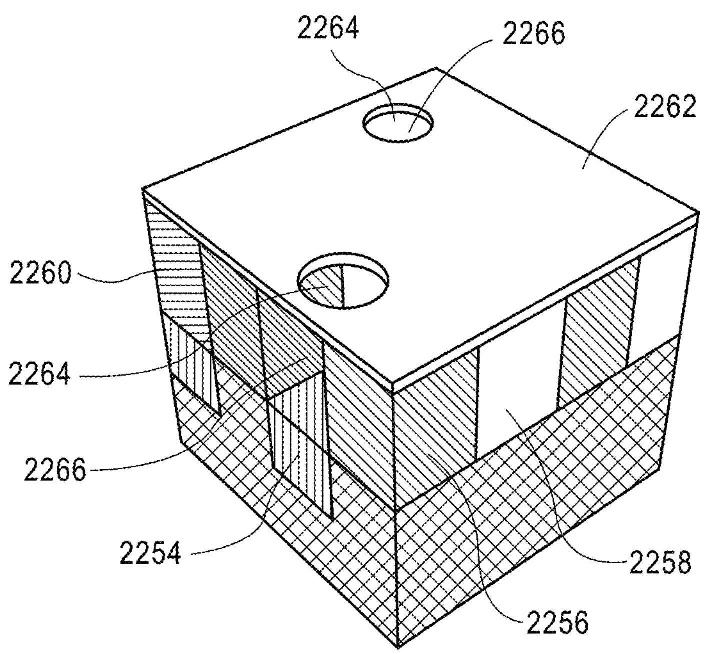

FIG. 22J illustrates the structure of FIG. 22I following removal of the sacrificial placeholder material 2260 in locations exposed by the openings 2264 to form exposed via locations 2266. In an embodiment, the sacrificial placeholder material 2260 is removed at the via locations 2266 by an isotropic etching process. In one such embodiment, the sacrificial placeholder material 2260 is an organic polymer, and the isotropic etching process is an isotropic plasma ash (oxygen plasma) or wet cleans process.

Referring again to FIG. 22J, it is to be appreciated that subsequent processing may involve removal of the mask layer 2262 and filling of holes/trenches 2266 with a conductive via material. Also, remaining sacrificial placeholder material 2260 not exposed by openings 2264 (i.e., not selected as via locations) may be replaced with a permanent ILD material. The resulting structure may subsequently be used as a foundation for forming subsequent metal line/via and ILD layers. Alternatively, the resulting structure may represent the final metal interconnect layer in an integrated circuit.

In accordance with one or more embodiments of the present disclosure, as mentioned above, approaches described herein may build on the use of so-called "photobuckets," in which every possible feature, e.g. via or plug, is pre-patterned into a substrate. Then, a photoresist is filled into patterned features and the lithography operation is merely used to choose select vias for via opening formation. The photobucket approach may allow for larger critical dimensions (CD)s and/or errors in overlay while retaining the ability to choose the via or plug of interest. Lithographic approaches for selecting particular photobuckets may include, but may not be limited to, 193 nm immersion lithography (i193), extreme ultra-violet (EUV) and/or e-beam direct write (EBDW) lithography.

Overall, in accordance with one or more embodiments of the present disclosure, a DSA approach or a subtractive approach is rendered as photosensitive. In one view, a form of photobuckets is achieved where lithographic constraints may be relaxed and misalignment tolerance may be high since the photobucket is surrounded by non-photolyzable materials. Furthermore, in an embodiment, instead of exposing at, e.g. 30 mJ/cm2, such a photobucket might be exposed at, e.g., 3 mJ/cm2. Normally this would result in very poor CD control and roughness. But in this case, the CD and roughness control will be defined by the photobucket geometry, which can be very well controlled and defined. Thus, such a photobucket approach may be used to circumvent imaging/dose tradeoff which limits the throughput of next generation lithographic processes. In an embodiment, photobucket material that is not selected for removal is ultimately retained as a permanent ILD portion in a semiconductor structure. In another embodiment, photobucket material that is not selected for removal is ultimately exchanged for a permanent ILD portion in a semiconductor structure.

In an embodiment, a photobucket "ILD" composition is typically very different from standard ILD and, in one embodiment, is highly self-aligned in both directions. More generally, in an embodiment, the term photobucket as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be appreciated that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. In one embodiment, the photobuckets are subject to exposure of extreme ultraviolet (EUV) light in order to expose the photobuckets, where in a particular embodiment, EUV exposure is in the range of 5-15 nanometers. Although many embodiments described herein involve photobucket material based on polymers, in other embodiments, photobucket material based on nanoparticles are similarly implemented.

In accordance with an embodiment of the present disclosure, a photobucket approach is described. One or more embodiments described herein are directed to subtractive approaches for self-aligned via and plug patterning, and structure resulting there from. In an embodiment, processes described herein enable realization of self-aligned metallization for back-end of line feature fabrication. Overlay problems anticipated for next generation via and plug patterning may be addressed by one or more approaches described herein. More specifically, one or more embodiment described herein involves the use of a subtractive method to pre-form every via and plug using the trenches already etched. An additional operation is then used to select which of the vias and plugs to retain. Such operations can be illustrated using photobuckets, although the selection process may also be performed using a more conventional resist expose and ILD backfill approach.

In a first aspect, a vias first, plugs second approach is used. As an example, FIGS. 23A-23L illustrate portions of integrated circuit layers representing various operations in a method of subtractive self-aligned via and plug patterning, in accordance with an embodiment of the present disclosure. In each illustration at each described operation, cross-sectional and/or angled views are shown. These views will be referred to herein as corresponding cross-sectional views and angled views.

Figure 23A:
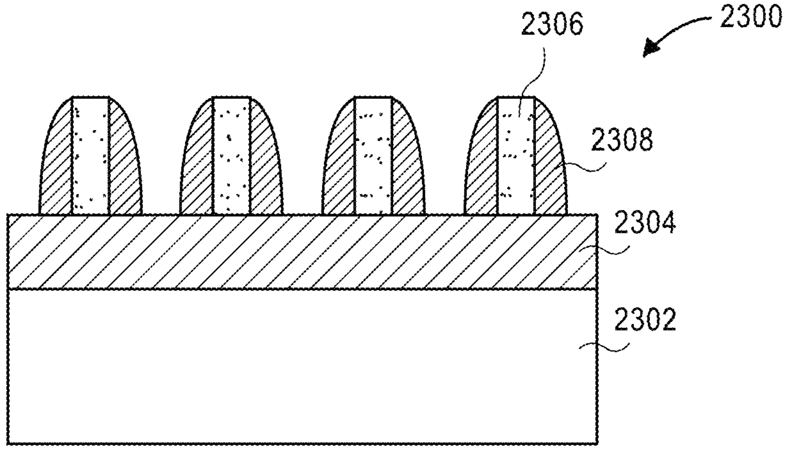
FIGS. 23A-23L illustrate portions of integrated circuit layers representing various operations in a method of subtractive self-aligned via and plug patterning, in accordance with an embodiment of the present disclosure.

FIG. 23A illustrates a cross-sectional view of a starting structure 2300 following deposition, but prior to patterning, of a first hardmask material layer 2304 formed on an interlayer dielectric (ILD) layer 2302, in accordance with an embodiment of the present disclosure. Referring to FIG. 23A, a patterned mask 2306 has spacers 2308 formed along sidewalls thereof, on or above the first hardmask material layer 2304.

Figure 23B:
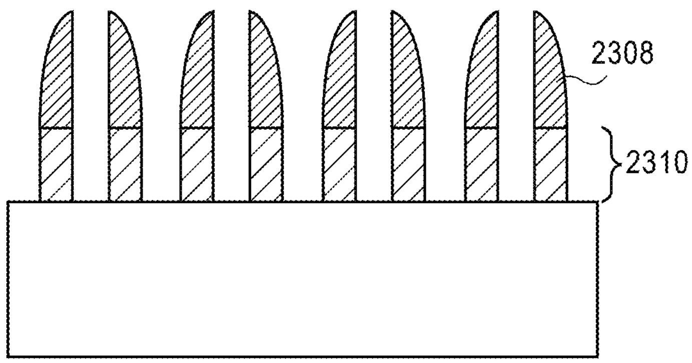

FIG. 23B illustrates the structure of FIG. 23A following patterning of the first hardmask layer by pitch doubling, in accordance with an embodiment of the present disclosure. Referring to FIG. 23B, the patterned mask 2306 is removed and the resulting pattern of the spacers 2308 is transferred, e.g., by an etch process, to the first hardmask material layer 2304 to form a first patterned hardmask 2310. In one such embodiment, the first patterned hardmask 2310 is formed with a grating pattern, as is depicted in FIG. 23B. In an embodiment, the grating structure of the first patterned hardmask 2310 is a tight pitch grating structure. In a specific such embodiment, the tight pitch is not achievable directly through conventional lithography. For example, a pattern based on conventional lithography may first be formed (mask 2306), but the pitch may be halved by the use of spacer mask patterning, as is depicted in FIGS. 23A and 23B. Even further, although not shown, the original pitch may be quartered by a second round of spacer mask patterning. Accordingly, the grating-like pattern of the first patterned hardmask 2310 of FIG. 23B may have hardmask lines spaced at a constant pitch and having a constant width.

Figure 23C:
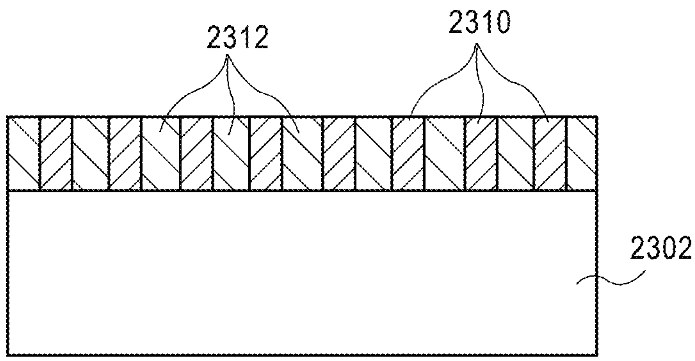

FIG. 23C illustrates the structure of FIG. 23B following formation of a second patterned hardmask, in accordance with an embodiment of the present disclosure. Referring to FIG. 23C, a second patterned hardmask 2312 is formed interleaved with the first patterned hardmask 2310. In one such embodiment, the second patterned hardmask 2312 is formed by deposition of a second hardmask material layer (having a composition different from the first hardmask material layer 2304. The second hardmask material layer is then planarized, e.g., by chemical mechanical polishing (CMP), to provide the second patterned hardmask 2312.

Figure 23D:
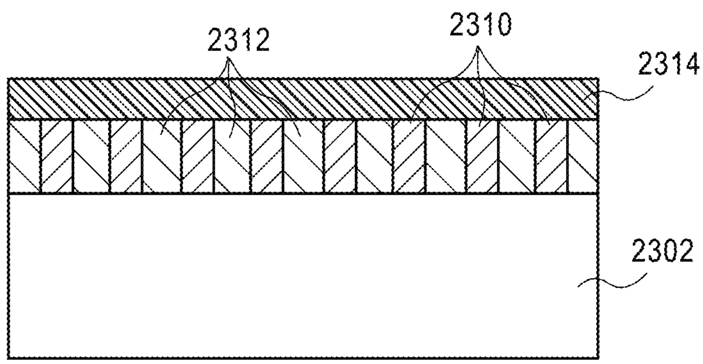

FIG. 23D illustrates the structure of FIG. 23C following deposition of a hardmask cap layer, in accordance with an embodiment of the present disclosure. Referring to FIG. 23D, a hardmask cap layer 2314 is formed on the first patterned hardmask 2310 and the first patterned hardmask 2312. In one such embodiment, the material composition and etch selectivity of the hardmask cap layer 2314 is different as compared to the first patterned hardmask 2310 and the first patterned hardmask 2312.

Figure 23E:
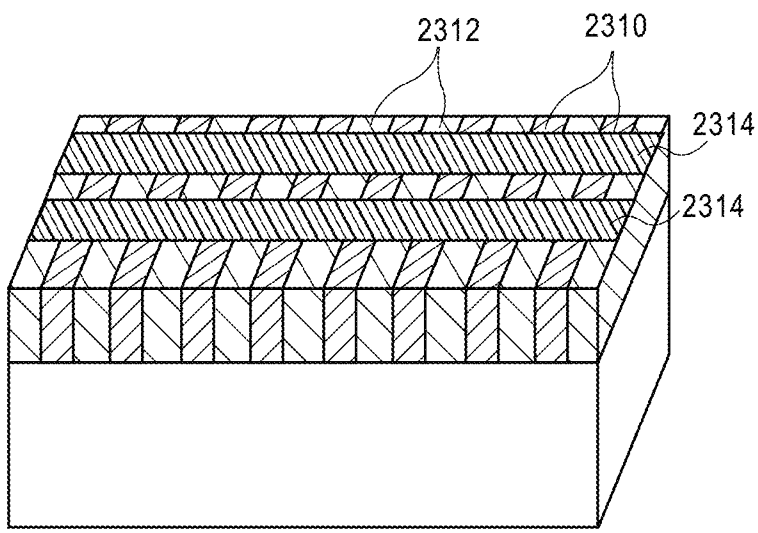

FIG. 23E illustrates the structure of FIG. 23D following patterning of the hardmask cap layer, in accordance with an embodiment of the present disclosure. Referring to FIG. 23E, a patterned hardmask cap layer 2314 is formed on the first patterned hardmask 2310 and the first patterned hardmask 2312. In one such embodiment, the patterned hardmask cap layer 2314 is formed with a grating pattern orthogonal to the grating pattern of the first patterned hardmask 2310 and the first patterned hardmask 2312, as is depicted in FIG. 23E. In an embodiment, the grating structure formed by the patterned hardmask cap layer 2314 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the patterned hardmask cap layer 2314 of FIG. 23E may have hardmask lines spaced at a constant pitch and having a constant width.

Figure 23F:
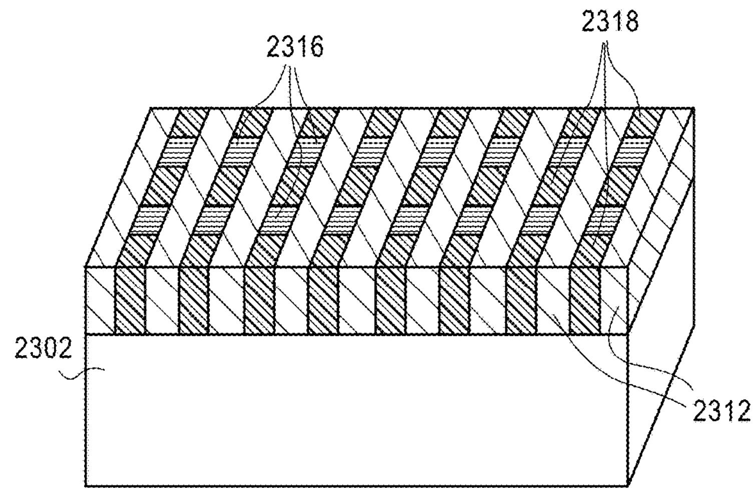

FIG. 23F illustrates the structure of FIG. 23E following further patterning of the first patterned hardmask and subsequent formation of a plurality of photobuckets, in accordance with an embodiment of the present disclosure. Referring to FIG. 23F, using the patterned hardmask cap layer 2314 as a mask, the first patterned hardmask 2310 if further patterned to form first patterned hardmask 2316. The second patterned hardmask 2312 is not further patterned in this process. Subsequently, the patterned hardmask cap layer 2314 is removed, and photobuckets 2318 are formed in the resulting openings above the ILD layer 2302. The photobuckets 2318, at this stage, represent all possible via locations in a resulting metallization layer.

Figure 23G:
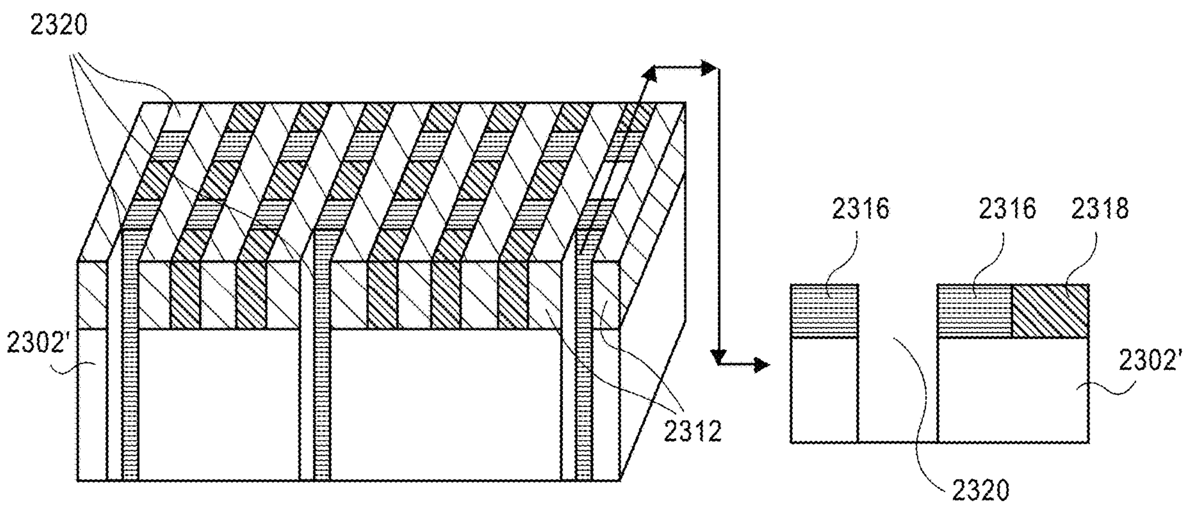

FIG. 23G illustrates the structure of FIG. 23F following photobucket exposure and development to leave selected via locations, and subsequent via opening etch into the underlying ILD, in accordance with an embodiment of the present disclosure. Referring to FIG. 23G select photobuckets 2318 are exposed and removed to provide selected via locations 2320. The via location 2320 are subjected to a selective etch process, such as a selective plasma etch process, to extend the via openings into the underlying ILD layer 2302, forming patterned ILD layer 2302'. The etching is selective to remaining photobuckets 2318, to first patterned hardmask 2316, and to the second patterned hardmask 2312.

Figure 23H:
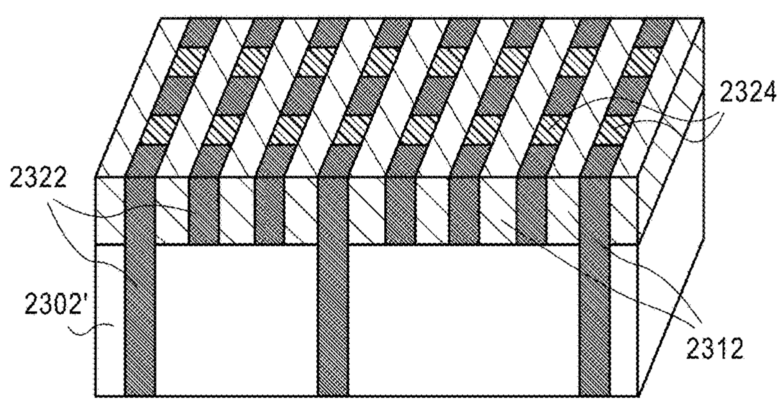

FIG. 23H illustrates the structure of FIG. 23G following removal of the remaining photobuckets, subsequent formation of a hardmask material, and subsequent formation of a second plurality of photobuckets, in accordance with an embodiment of the present disclosure. Referring to FIG. 23H, the remaining photobuckets are removed, e.g., by a selective etch process. All openings formed (e.g., openings formed upon removal of photobuckets 2318 as well as the via locations 2320) are then filled with a hardmask material 2322, such as a carbon-based hardmask material. Subsequently, the first patterned hardmask 2316 is removed, e.g., with a selective etch process, and the resulting openings are filled with a second plurality of photobuckets 2324. The photobuckets 2324, at this stage, represent all possible plug locations in a resulting metallization layer. It is to be appreciated that the second patterned hardmask 2312 is not further patterned at this stage in the process.

Figure 23I:
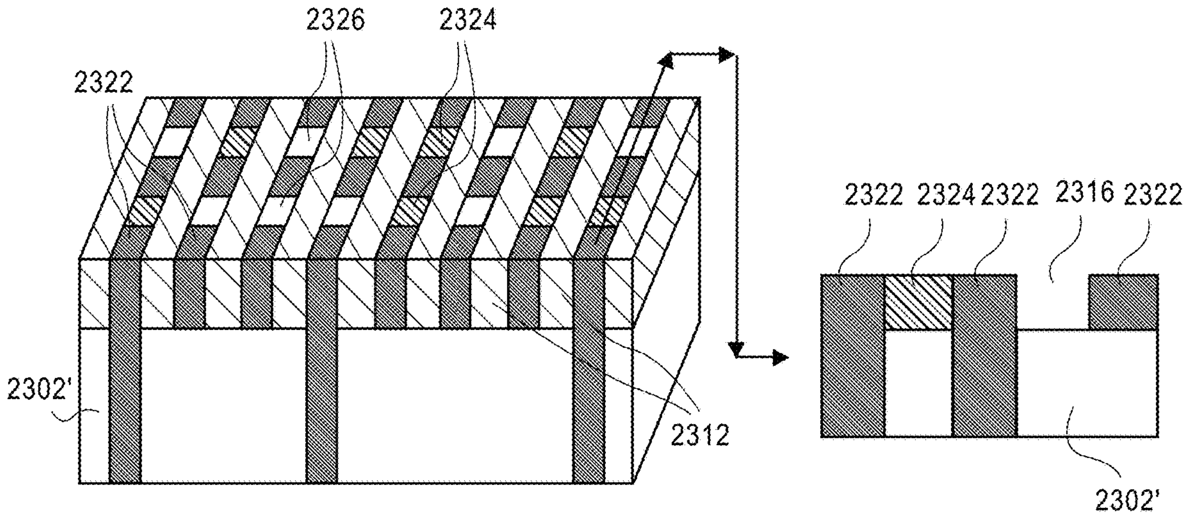

FIG. 23I illustrates the structure of FIG. 23H following plug location selection, in accordance with an embodiment of the present disclosure. Referring to FIG. 23I, the photobuckets 2324 from FIG. 23H in are removed from locations 2326 where plugs will not be formed. In locations where plugs are selected to be formed, the photobuckets 2324 are retained. In one embodiment, in order to form locations 2326 where plugs will not be formed, lithography is used to expose the corresponding photobuckets 2324. The exposed photobuckets may then be removed by a developer.

Figure 23J:
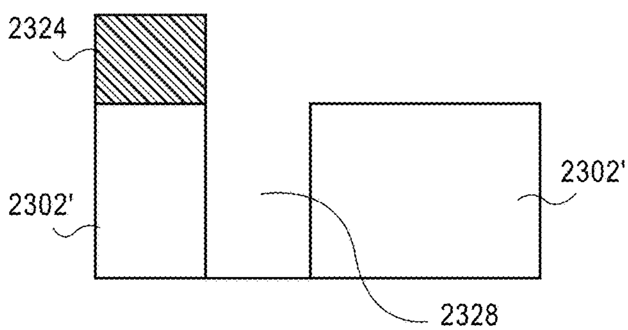

FIG. 23J illustrates the structure of FIG. 23I following removal of the most recently formed hardmask from via and line locations, in accordance with an embodiment of the present disclosure. Referring to FIG. 23J, the hardmask material 2322 depicted in FIG. 23I is removed. In one such embodiment, the hardmask material 2322 is a carbon-based hardmask material and is removed with a plasma ashing process. As shown, features remaining include, the patterned ILD layer 2302', the photobuckets 2324 retained for plug formation, and the via openings 2328. Although not shown, it is to be appreciated that, in an embodiment, the second hardmask layer 2312 is also retained at this stage.

Figure 23K:
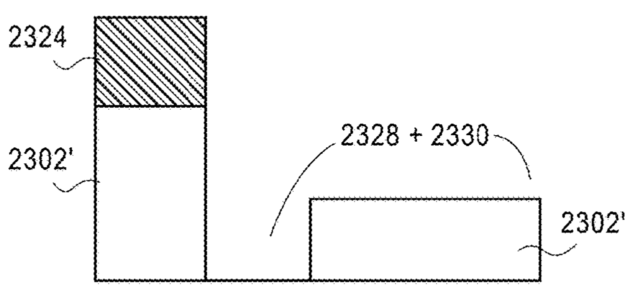

FIG. 23K illustrates the structure of FIG. 23J following recessing of the patterned ILD layer in locations not protected by plug-forming photobuckets, in accordance with an embodiment of the present disclosure. Referring to FIG. 23K, the portions of patterned ILD layer 2302' not protected by photobuckets 2324 are recessed to provide metal line openings 2330, in addition to the via openings 2328.

Figure 23L:
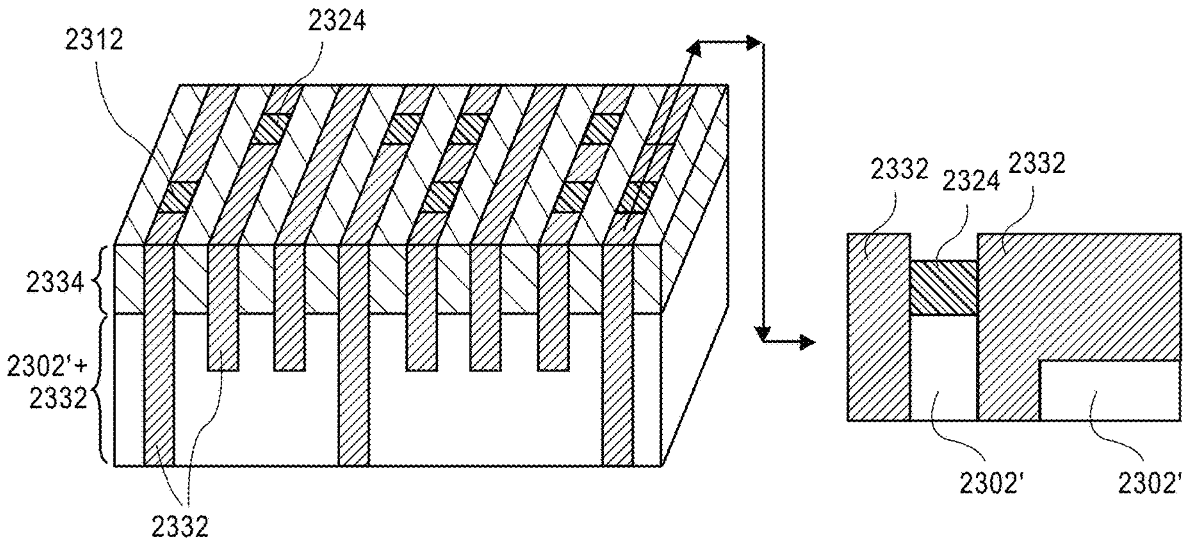

FIG. 23L illustrates the structure of FIG. 23K following metal fill, in accordance with an embodiment of the present disclosure. Referring to FIG. 23L, metallization 2332 is formed in the openings 2328 and 2332. In one such embodiment, the metallization 2332 is formed by a metal fill and polish back process. Referring to the left-hand portion of FIG. 23L, the structure is shown as including a lower portion including patterned ILD layer 2302' having metal lines and vias (shown collectively as 2332) formed therein. An upper region of the structure 2334 includes the second patterned hardmask 2312 as well as the remaining (plug location) photobuckets 2324. In an embodiment, the upper region 2334 is removed, e.g., by CMP or etch back, prior to subsequent fabrication. However, in an alternative embodiment, the upper region 2334 is retained in the final structure.

The structure of FIG. 23L may subsequently be used as a foundation for forming subsequent metal line/via and ILD layers. Alternatively, the structure of FIG. 23L may represent the final metal interconnect layer in an integrated circuit. It is to be appreciated that the above process operations may be practiced in alternative sequences, not every operation need be performed and/or additional process operations may be performed. Referring again to FIG. 23L, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In a second aspect, a plugs first, vias second approach is used. As an example, FIGS. 23M-23S illustrate portions of integrated circuit layers representing various operations in a method of subtractive self-aligned plug and via patterning, in accordance with another embodiment of the present disclosure. In each illustration at each described operation, plan views are shown on top, and corresponding cross-sectional views are shown on the bottom. These views will be referred to herein as corresponding cross-sectional views and plan views.

Figure 23M:
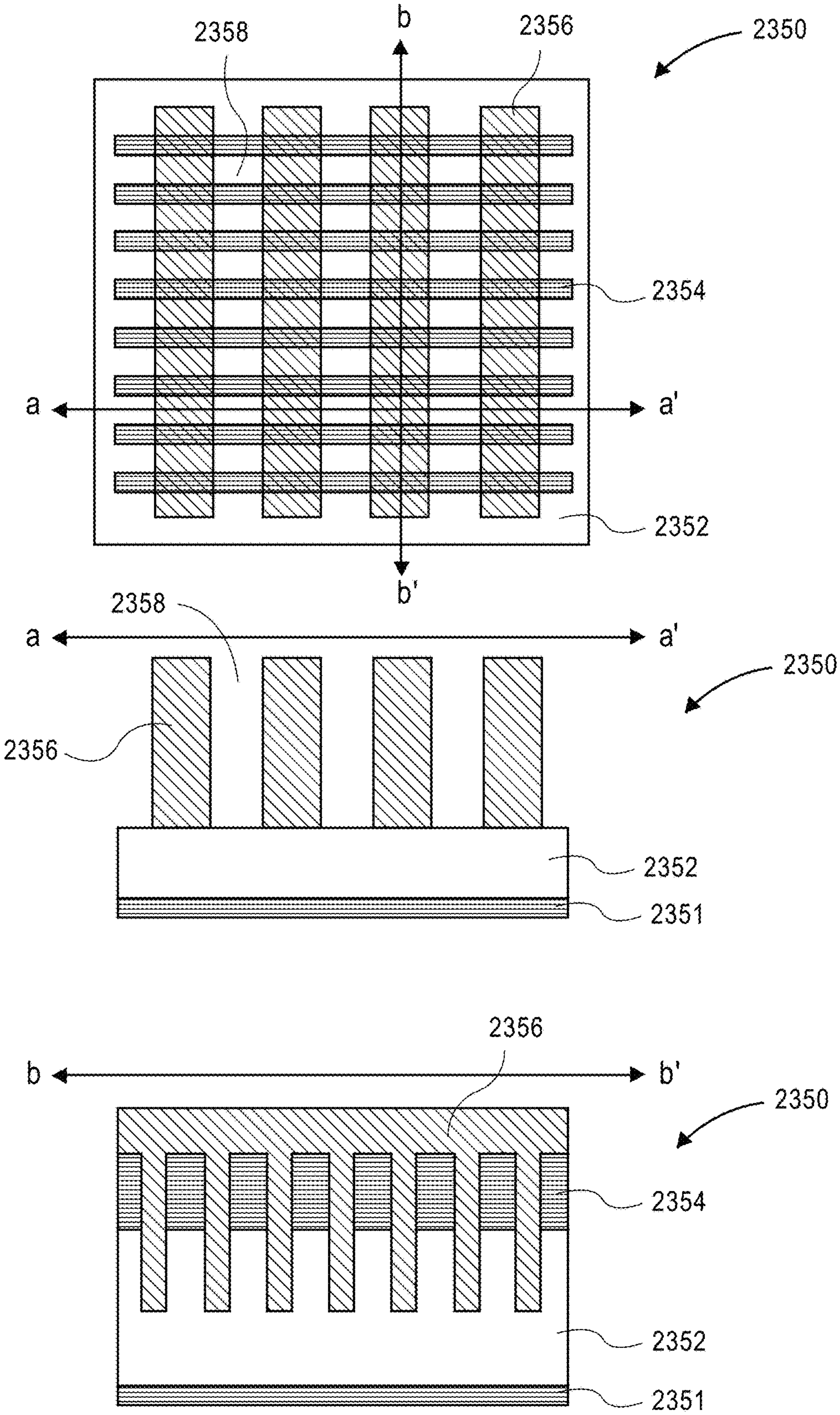
FIGS. 23M-23S illustrate portions of integrated circuit layers representing various operations in a method of subtractive self-aligned via patterning, in accordance with an embodiment of the present disclosure.

FIG. 23M illustrates a plan view and corresponding cross-sectional views of a starting orthogonal grid formed above a substrate 2351, in accordance with an embodiment of the present disclosure. Referring to the plan view and corresponding cross-sectional views (a) and (b) taken along axes a-a' and b-b', respectively, a starting grid structure 2350 includes a grating ILD layer 2352 having a first hardmask layer 2354 disposed thereon. A second hardmask layer 2356 is disposed on the first hardmask layer 2354 and is patterned to have a grating structure orthogonal to the underlying grating structure. Additionally, openings 2358 remain between the grating structure of the second hardmask layer 2356 and the underlying grating formed by the ILD layer 2352 and the first hardmask layer 2354.

Figure 23N:
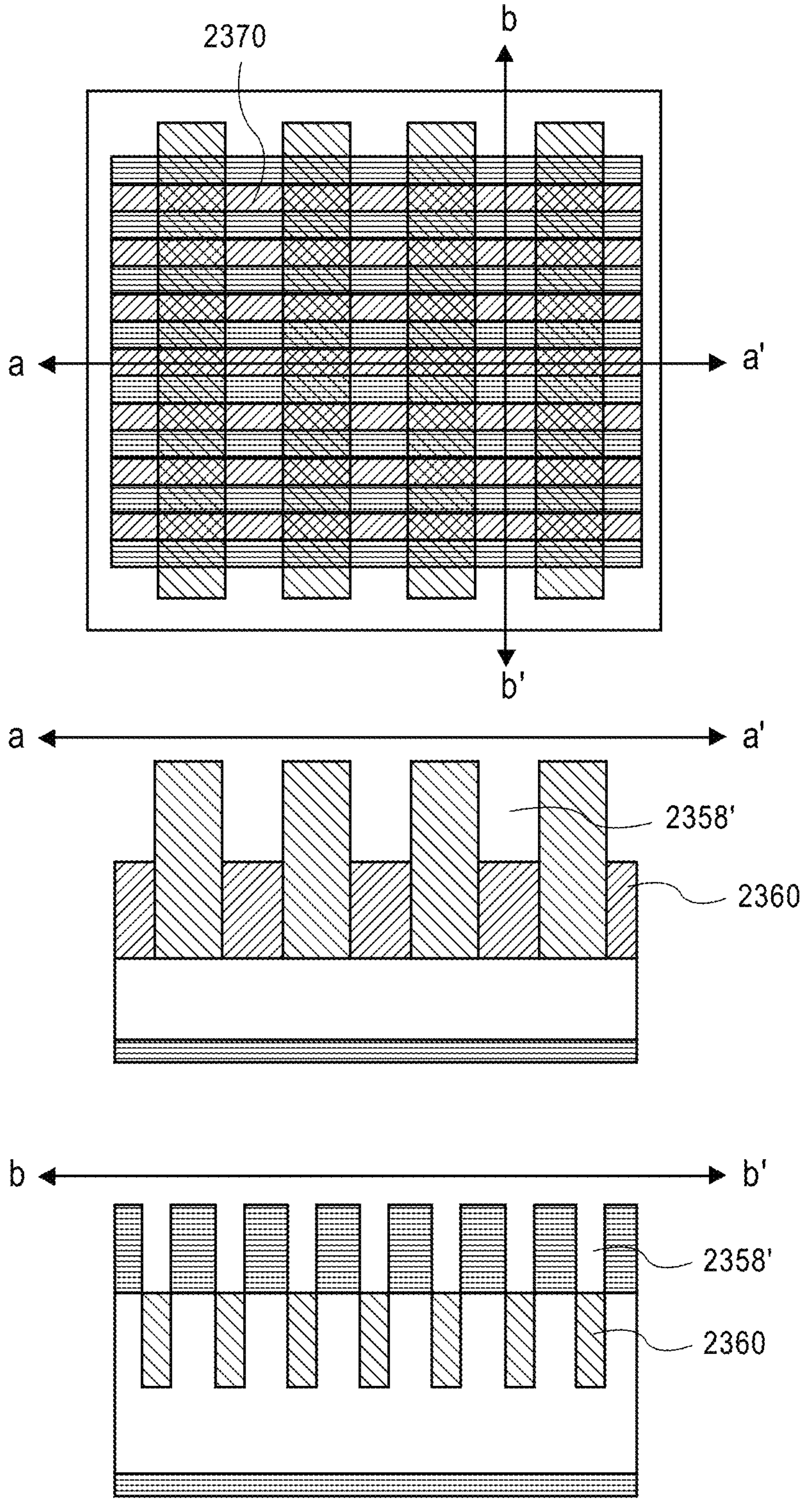

FIG. 23N illustrates a plan view and corresponding cross-sectional views of the structure of FIG. 23M following opening fill and etch back, in accordance with an embodiment of the present disclosure. Referring to the plan view and corresponding cross-sectional views (a) and (b) taken along axes a-a' and b-b', respectively, the openings 2358 of FIG. 23M are filled with a dielectric layer 2360, such as silicon oxide layer. Such a dielectric layer 2360 can be formed with deposited oxide films such as by chemical vapor deposition (CVD), high density plasma deposition (HDP), or spin on dielectrics. The material as deposited may require etch back in order to achieve the relative height shown in FIG. 23N, leaving upper openings 2358'.

Figure 23O:
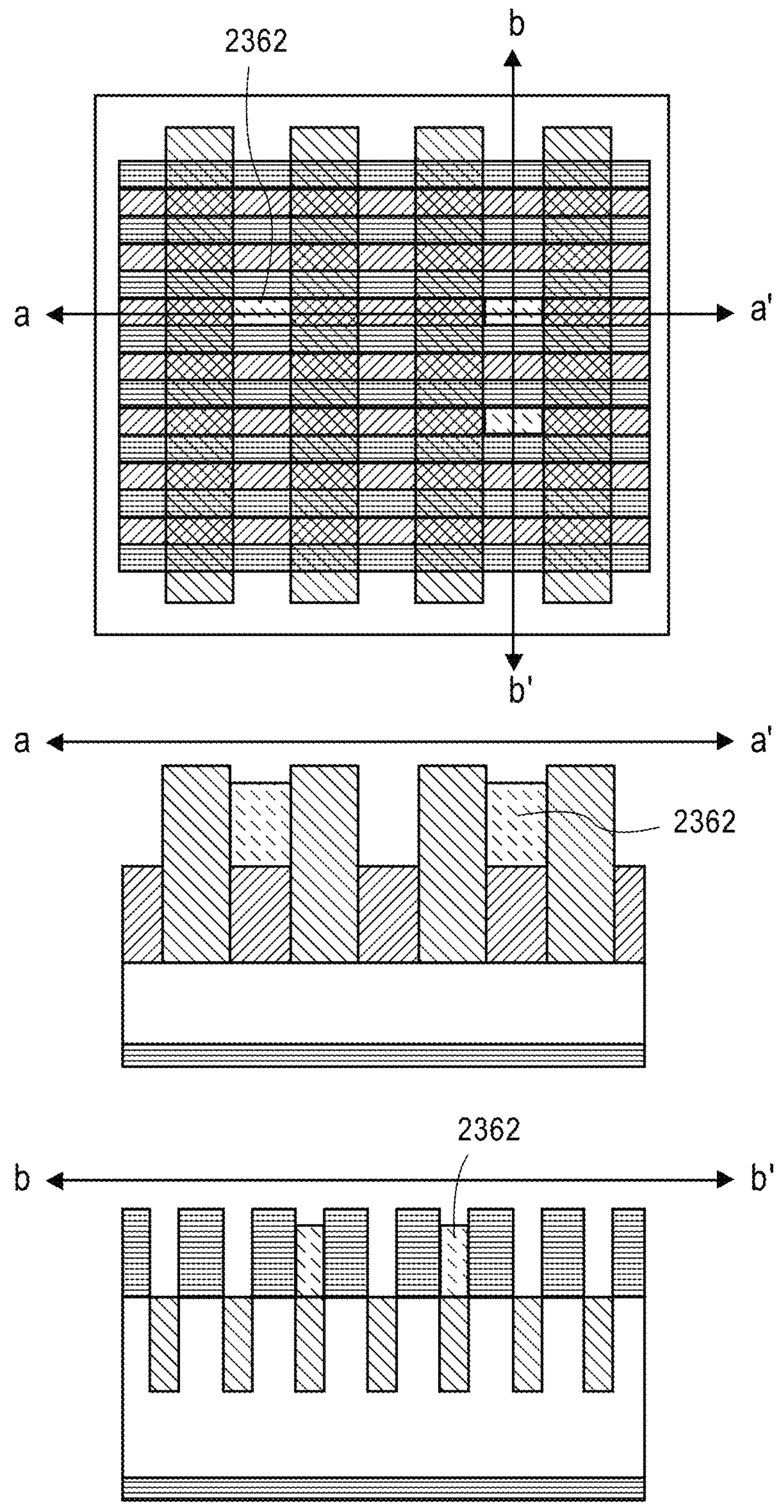

FIG. 23O illustrates a plan view and corresponding cross-sectional views of the structure of FIG. 23N following photobucket fill, exposure, and development to leave selected plug locations, in accordance with an embodiment of the present disclosure. Referring to the plan view and corresponding cross-sectional views (a) and (b) taken along axes a-a' and b-b', respectively, photobuckets are formed in the upper openings 2358' of FIG. 23N. Subsequently, most photobuckets are exposed and removed. However, select photobuckets 2362 are not exposed and thus retained to provide selected plug locations, as depicted in FIG. 23O.

Figure 23P:
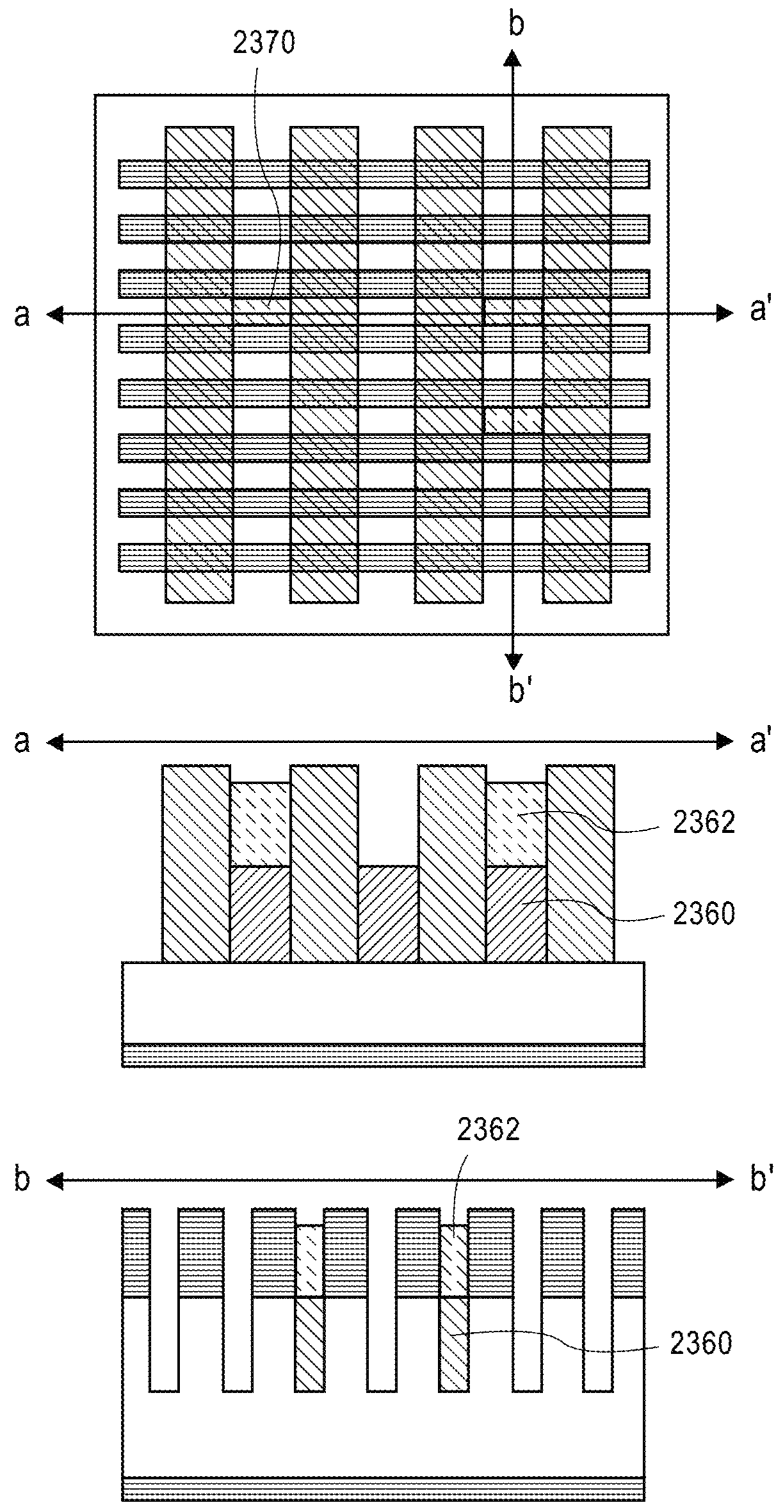

FIG. 23P illustrates a plan view and corresponding cross-sectional views of the structure of FIG. 23O following removal of portions of the dielectric layer 2360, in accordance with an embodiment of the present disclosure. Referring to the plan view and corresponding cross-sectional views (a) and (b) taken along axes a-a' and b-b', respectively, the portions of dielectric layer 2360 that are not covered by a photobucket 2362 are removed. However, the portions of dielectric layer 2360 that are covered by a photobucket 2362 remain in the structure of FIG. 23P. In one embodiment, the portions of dielectric layer 2360 that are not covered by a photobucket 2362 are removed by a wet etch process.

Figure 23Q:
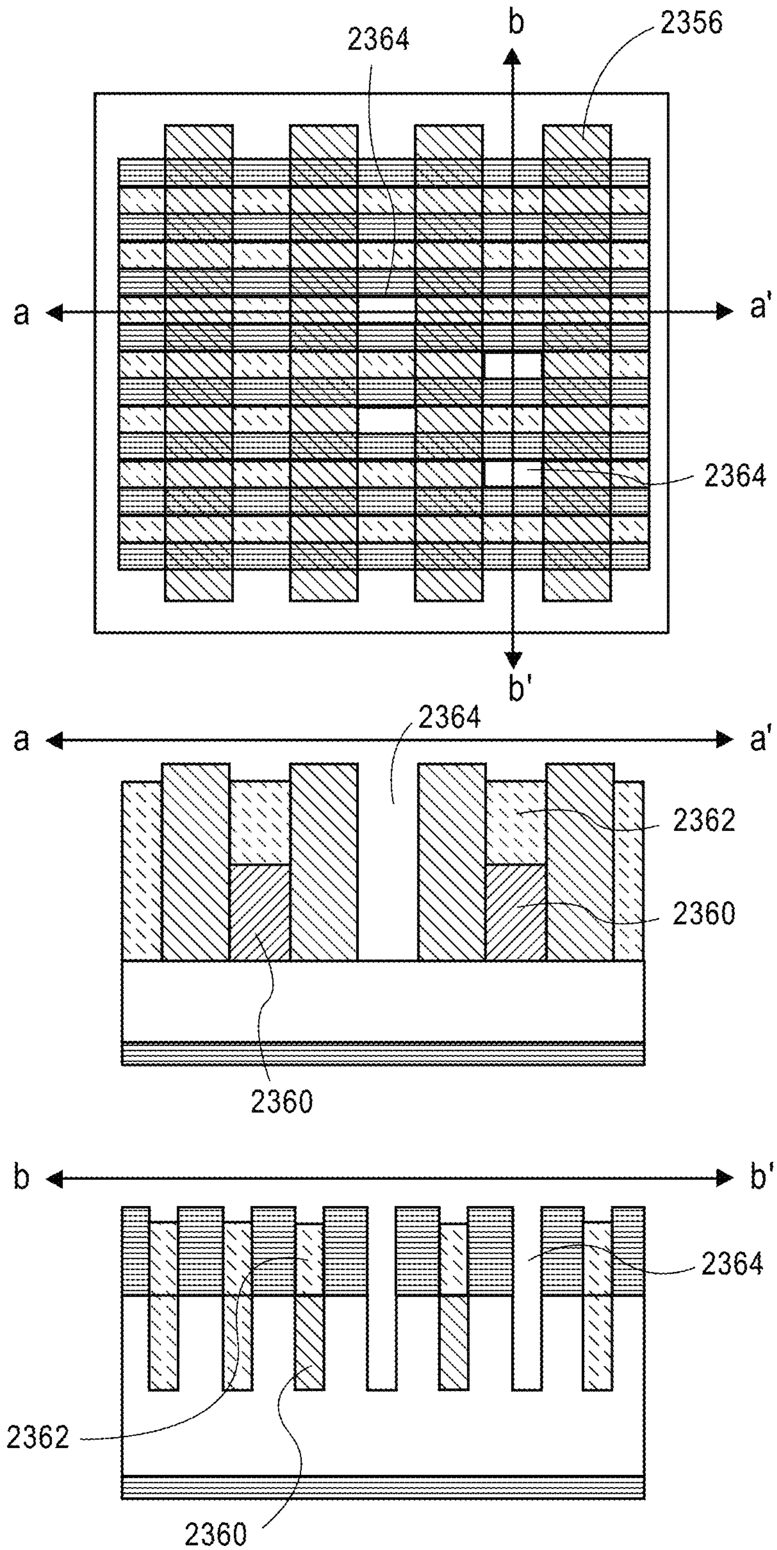

FIG. 23Q illustrates a plan view and corresponding cross-sectional views of the structure of FIG. 23P following photobucket fill, exposure, and development to leave selected via locations, in accordance with an embodiment of the present disclosure. Referring to the plan view and corresponding cross-sectional views (a) and (b) taken along axes a-a' and b-b', respectively, photobuckets are formed in the openings formed upon removal of portions of the dielectric layer 2360. Subsequently, select photobuckets are exposed and removed to provide selected via locations 2364, as is depicted in FIG. 23Q.

Figure 23R:
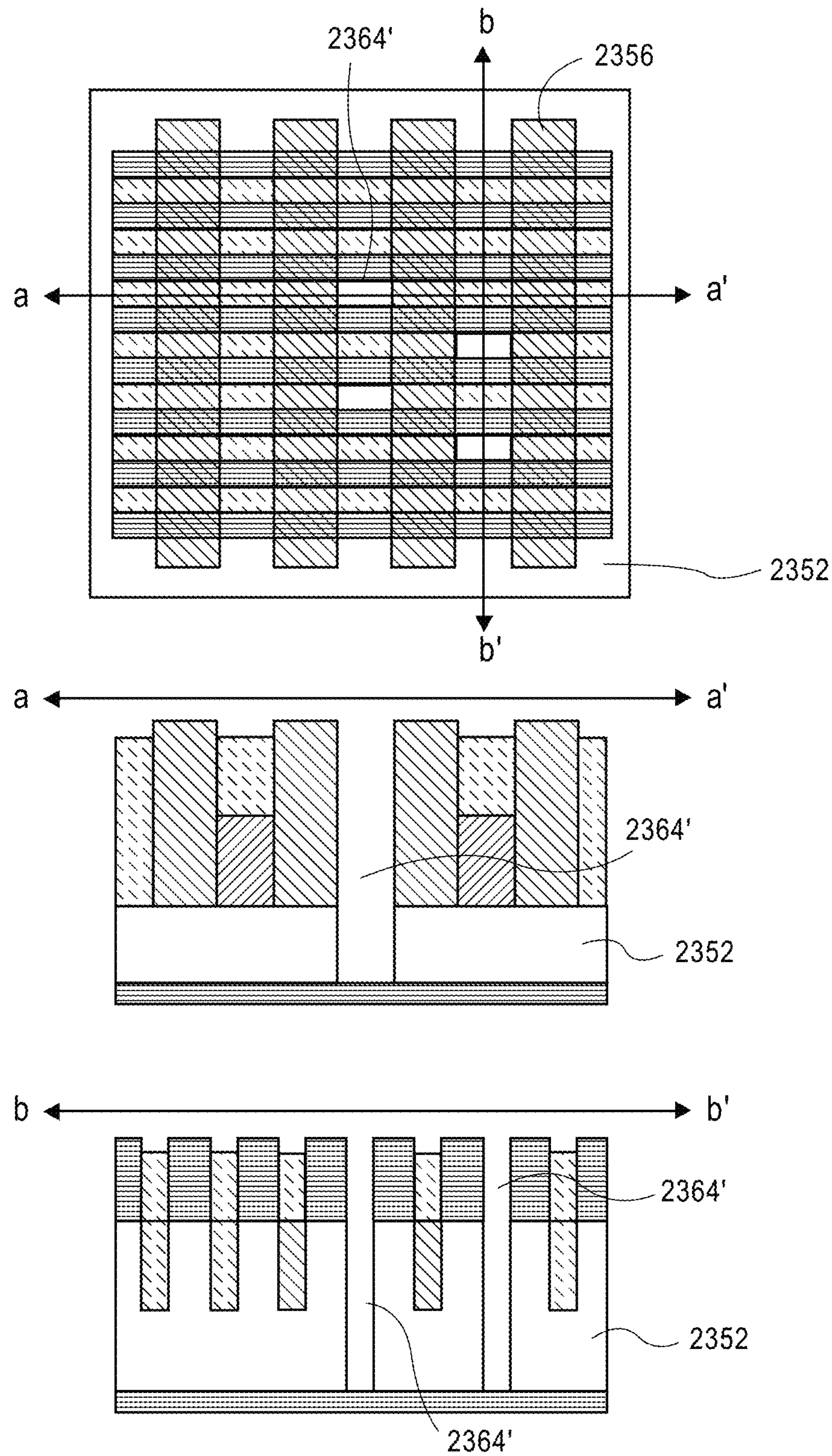

FIG. 23R illustrates a plan view and corresponding cross-sectional views of the structure of FIG. 23Q following via opening etch into the underlying ILD, in accordance with an embodiment of the present disclosure. Referring to the plan view and corresponding cross-sectional views (a) and (b) taken along axes a-a' and b-b', respectively, the via location 2364 of FIG. 23Q are subjected to a selective etch process, such as a selective plasma etch process, to extend the via openings 2364 to opening 2364' which are formed into the underlying ILD layer 2352.

Figure 23S:
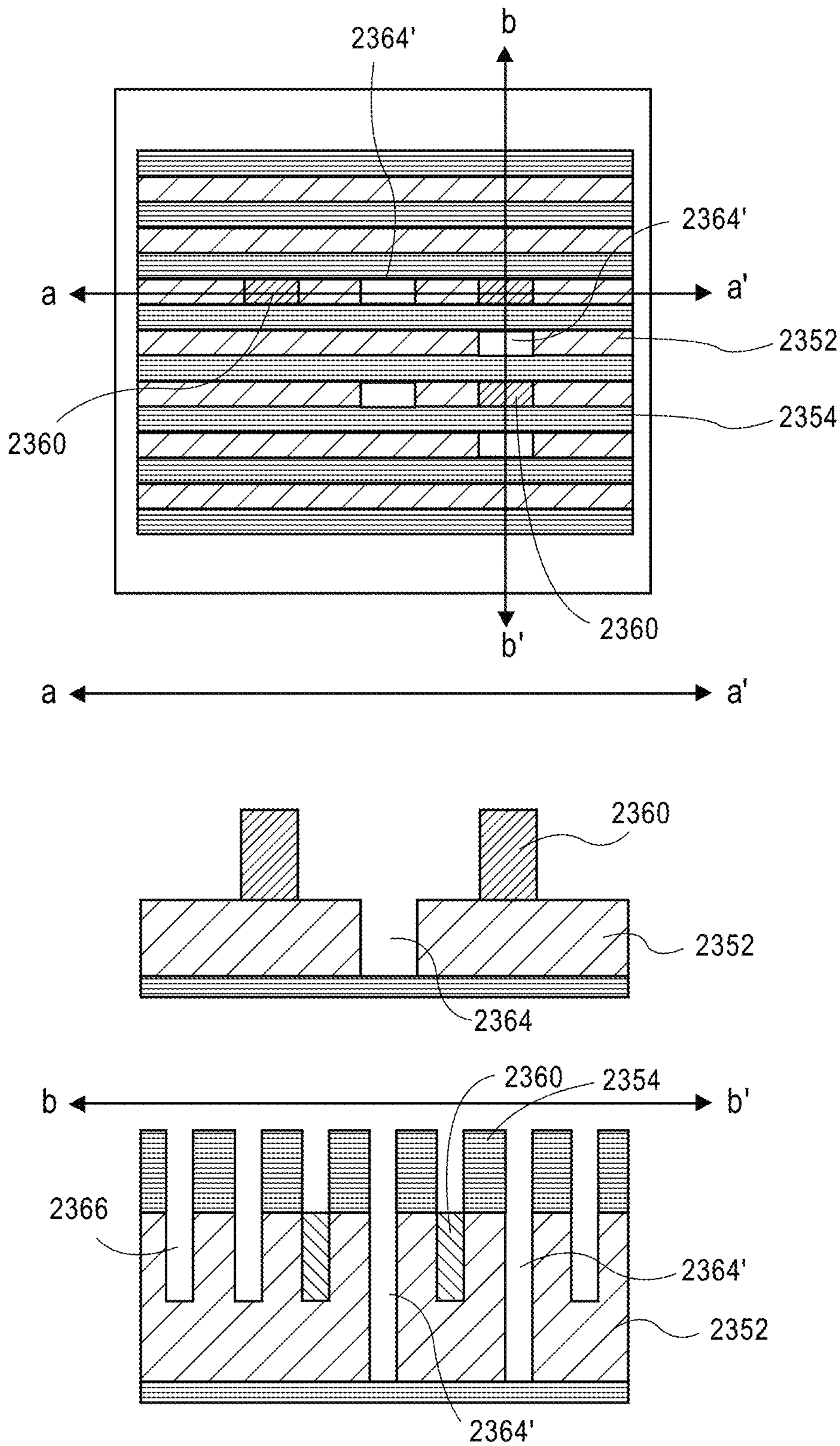

FIG. 23S illustrates a plan view and corresponding cross-sectional views of the structure of FIG. 23R following removal of the second hardmask layer and the remaining photobucket material, in accordance with an embodiment of the present disclosure. Referring to the plan view and corresponding cross-sectional views (a) and (b) taken along axes a-a' and b-b', respectively, the second hardmask layer 2356 as well as any remaining photobucket material (i.e., photobucket material that was not already exposed and developed) is removed. The removal may be performed selective to all other remaining features. In one such embodiment, the second hardmask layer 2356 is a carbon based hardmask material, and the removal is performed by an $O_2$ plasma ash process. Referring again to FIG. 23S, remaining at this stage is the ILD layer 2352 having via openings 2364' formed therein, and the portions of the dielectric layer 2360 that were preserved for the plug locations (e.g., preserved by the overlying photobucket material). Thus, in one embodiment, the structure of FIG. 23S includes an ILD layer 2352 patterned with via openings (for subsequent metal fill) with locations of dielectric layer 2360 to create plugs. The remaining openings 2366 can be filled with metal to form metal lines. It is to be appreciated that the hardmask 2354 may be removed.

Accordingly, once filled with metal interconnect material, the structure of FIG. 23S may subsequently be used as a foundation for forming subsequent metal line/via and ILD layers. Alternatively, once filled with metal interconnect material, the structure of FIG. 23S may represent the final metal interconnect layer in an integrated circuit. Referring again to FIG. 23S, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

It is to be appreciated that the approaches described in association with FIGS. 23A-23L and 23M-23S are not necessarily performed as forming vias aligned to an underlying metallization layer. As such, in some contexts, these process schemes could be viewed as involving blind shooting in the top down direction with respect to any underlying metallization layers. In a third aspect, a subtractive approach provides alignment with an underlying metallization layer. As an example, FIGS. 24A-24I illustrate portions of integrated circuit layers representing various operations in a method of subtractive self-aligned via patterning, in accordance with another embodiment of the present disclosure. In each illustration at each described operation, an angled three-dimensional cross-section view is provided.

Figure 24A:
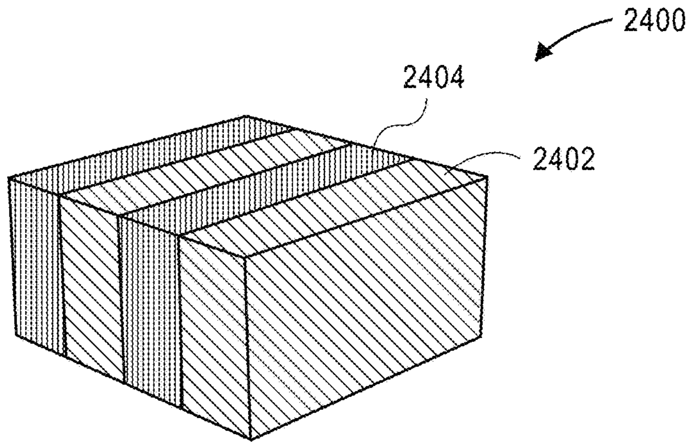
FIGS. 24A-24I illustrate portions of integrated circuit layers representing various operations in a method of subtractive self-aligned via and plug patterning, in accordance with an embodiment of the present disclosure.

FIG. 24A illustrates a starting point structure 2400 for a subtractive via and plug process following deep metal line fabrication, in accordance with an embodiment of the present disclosure. Referring to FIG. 24A, structure 2400 includes metal lines 2402 with intervening interlayer dielectric (ILD) lines 2404. It is to be appreciated that some of the lines 2402 may be associated with underlying vias for coupling to a previous interconnect layer. In an embodiment, the metal lines 2402 are formed by patterning trenches into an ILD material (e.g., the ILD material of lines 2404). The trenches are then filled by metal and, if needed, planarized to the top of the ILD lines 2404. In an embodiment, the metal trench and fill process involves high aspect ratio features. For example, in one embodiment, the aspect ratio of metal line height (h) to metal line width (w) is approximately in the range of 5-10.

Figure 24B:
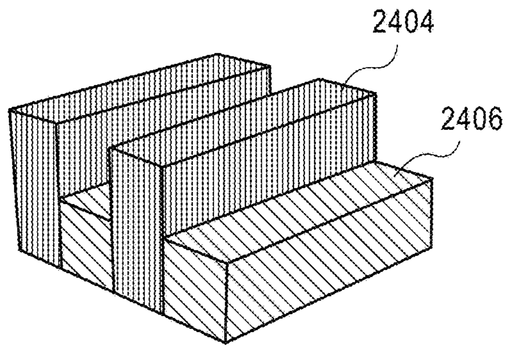

FIG. 24B illustrates the structure of FIG. 24A following recessing of the metal lines, in accordance with an embodiment of the present disclosure. Referring to FIG. 24B, the metal lines 2402 are recessed selectively to provide first level metal lines 2406. The recessing is performed selectively to the ILD lines 2404. The recessing may be performed by etching through dry etch, wet etch, or a combination thereof. The extent of recessing may be determined by the targeted thickness of the first level metal lines 2406 for use as suitable conductive interconnect lines within a back end of line (BEOL) interconnect structure.

Figure 24C:
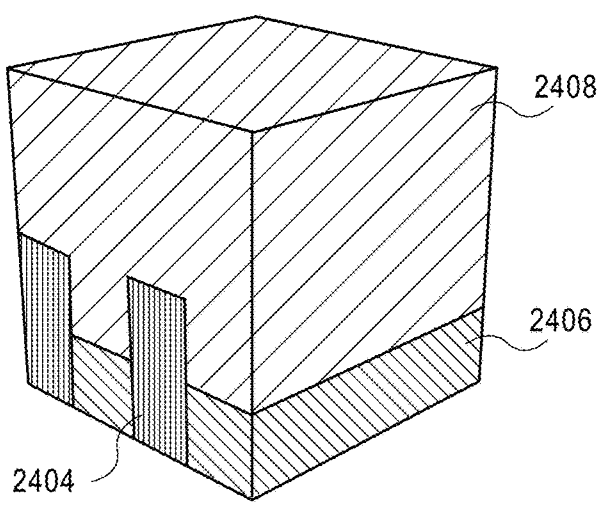

FIG. 24C illustrates the structure of FIG. 24B following formation of an inter-layer dielectric (ILD) layer, in accordance with an embodiment of the present disclosure. Referring to FIG. 24C, an ILD material layer 2408 is deposited and, if necessary, planarized, to a level above the recessed metal lines 2406 and the ILD lines 2404.

Figure 24D:
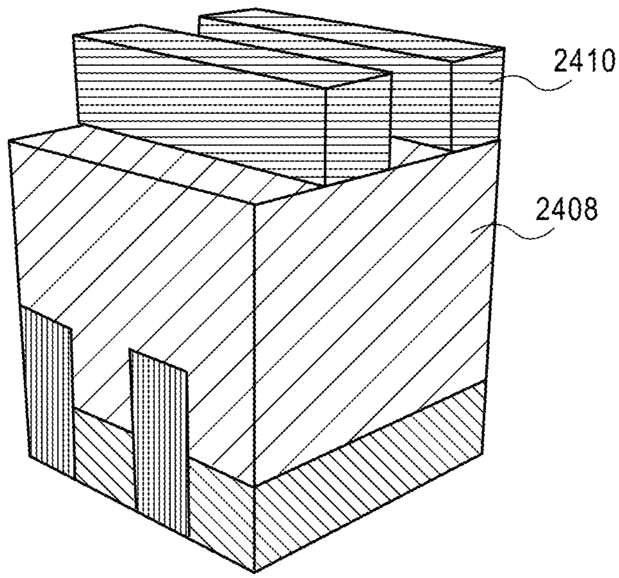

FIG. 24D illustrates the structure of FIG. 24C following deposition and patterning of a hardmask layer, in accordance with an embodiment of the present disclosure. Referring to FIG. 24D a hardmask layer 2410 is formed on the ILD layer 2408. In one such embodiment, the hardmask layer 2410 is formed with a grating pattern orthogonal to the grating pattern of the first level metal lines 2406/ILD lines 2404, as is depicted in FIG. 24D. In an embodiment, the grating structure formed by the hardmask layer 2410 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 2410 of FIG. 24D may have hardmask lines spaced at a constant pitch and having a constant width.

Figure 24E:
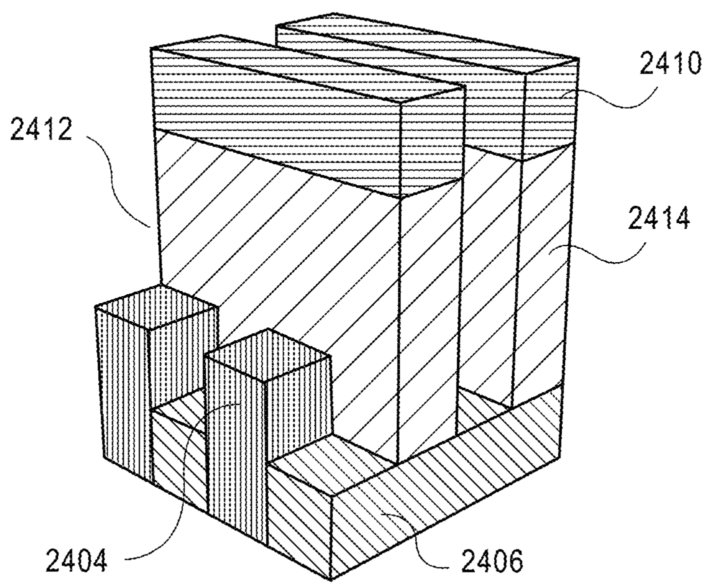

FIG. 24E illustrates the structure of FIG. 24D following trench formation defined using the pattern of the hardmask of FIG. 24D, in accordance with an embodiment of the present disclosure. Referring to FIG. 24E, the exposed regions (i.e., unprotected by 2410) of the ILD layer 2408 are etched to form trenches 2412 and patterned ILD layer 2414. The etch stops on, and thus exposes, the top surfaces of the first level metal lines 2406 and the ILD lines 2404.

Figure 24F:
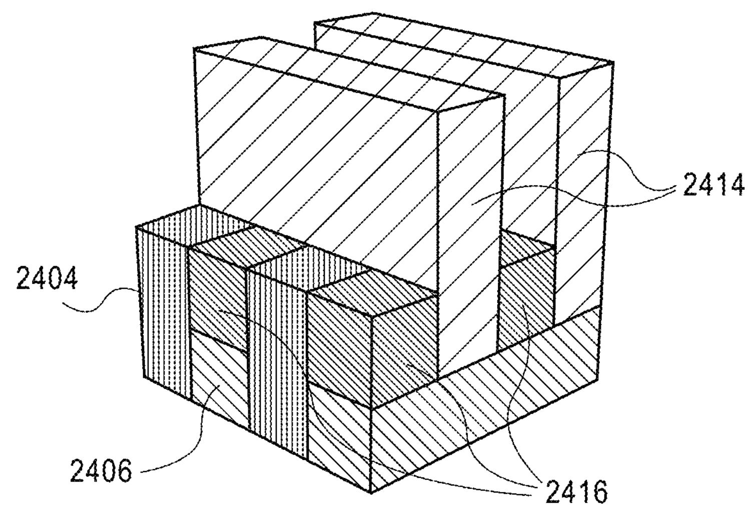

FIG. 24F illustrates the structure of FIG. 24E following photobucket formation in all possible via locations, in accordance with an embodiment of the present disclosure. Referring to FIG. 24F, photobuckets 2416 are formed in all possible via locations above exposed portions of the recessed metal lines 2406. In one embodiment, the photobuckets 2416 are formed essentially co-planar with the top surfaces of the ILD lines 2404, as depicted in FIG. 24F. Additionally, referring again to FIG. 24F, the hardmask layer 2410 may be removed from the patterned ILD layer 2414.

Figure 24G:
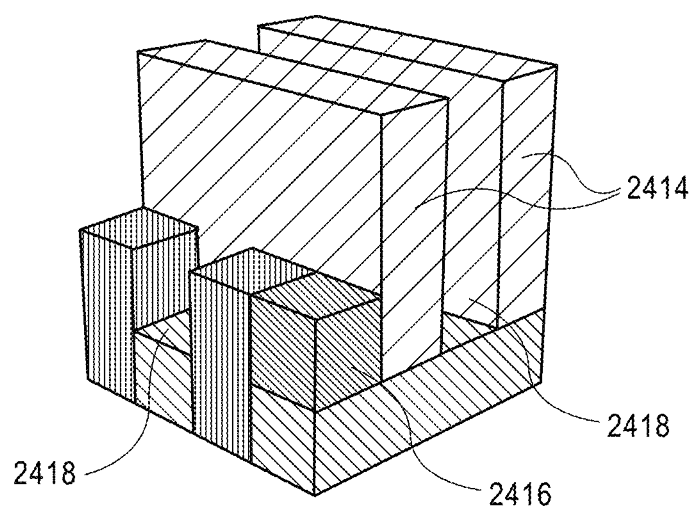

FIG. 24G illustrates the structure of FIG. 24F following via location selection, in accordance with an embodiment of the present disclosure. Referring to FIG. 24G, the photobuckets 2416 from FIG. 24F in select via locations 2418 are removed. In locations where vias are not selected to be formed, the photobuckets 2416 are retained. In one embodiment, in order to form via locations 2418, lithography is used to expose the corresponding photobuckets 2416. The exposed photobuckets may then be removed by a developer.

Figure 24H:
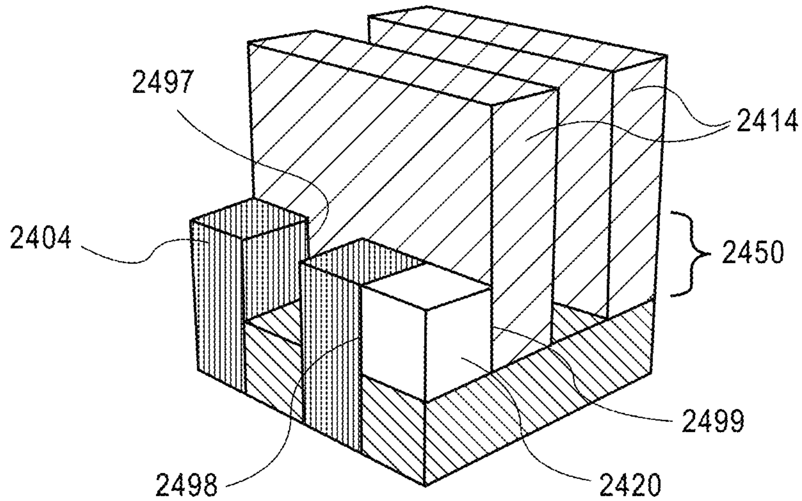

FIG. 24H illustrates the structure of FIG. 24G following conversion of the remaining photobuckets to permanent ILD material, in accordance with an embodiment of the present disclosure. Referring to FIG. 24H, the material of the photobuckets 2416 is modified, e.g., by cross-linking upon a baking operation, in the locations to form a final ILD material 2420. In one such embodiment, the cross-linking provides for a solubility switch upon the baking. The final, cross-linked material has inter-dielectric properties and, thus, can be retained in a final metallization structure.

Referring again to FIG. 24H, in an embodiment, the resulting structure includes up to three different dielectric material regions (ILD lines 2404+ILD lines 2414+cross-linked photobucket 2420) in a single plane 2450 of the metallization structure. In one such embodiment, two or all of ILD lines 2404, ILD lines 2414, and cross-linked photobucket 2420 are composed of a same material. In another such embodiment, ILD lines 2404, ILD lines 2414, and cross-linked photobucket 2420 are all composed of different ILD materials. In either case, in a specific embodiment, a distinction such as a vertical seam between the materials of ILD lines 2404 and ILD lines 2414 (e.g., seam 2497) and/or between ILD lines 2404 and cross-linked photobucket 2420 (e.g., seam 2498) and/or between ILD lines 2414 and cross-linked photobucket 2420 (e.g., seam 2499) may be observed in the final structure.

Figure 24I:
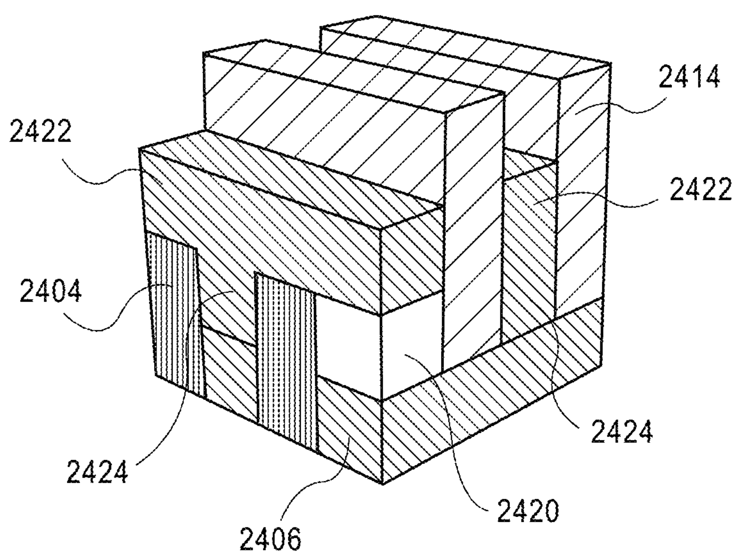

FIG. 24I illustrates the structure of FIG. 24H following metal line and via formation, in accordance with an embodiment of the present disclosure. Referring to FIG. 24I, metal lines 2422 and vias 2424 are formed upon metal fill of the openings of FIG. 24H. The metal lines 2422 are coupled to the underlying metal lines 2406 by the vias 2424. In an embodiment, the openings are filled in a damascene approach or a bottom-up fill approach to provide the structure shown in FIG. 24I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 2414 may be removed to provide air gaps between the resulting metal lines 2424.

The structure of FIG. 24I may subsequently be used as a foundation for forming subsequent metal line/via and ILD layers. Alternatively, the structure of FIG. 24I may represent the final metal interconnect layer in an integrated circuit. Referring again to FIG. 24I, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In accordance with an embodiment of the present disclosure, multi-colored photobuckets are described. One or more embodiments described herein are directed to the use of multicolored photobuckets as an approach for addressing plug and via fabrication below the lithography pitch limit. One or more embodiments described herein are directed to subtractive approaches for self-aligned via and plug patterning, and structures resulting there from. In an embodiment, processes described herein enable realization of self-aligned metallization for back-end of line feature fabrication. Overlay problems anticipated for next generation via and plug patterning may be addressed by one or more approaches described herein.

In an exemplary embodiment, approaches described below build on approaches using so-called photobuckets, in which every possible feature, e.g. via, is re-patterned into a substrate. Then, a photoresist is filled into patterned features and the lithography operation is merely used to choose select vias for via opening formation. In a particular embodiment described below, a lithography operation is used to define a relatively large hole above a plurality of "multicolored photobuckets," which can then be opened up by a flood exposure of a particular wavelength. The multicolored photobucket approach allows for larger critical dimensions (CD)s and/or errors in overlay while retaining the ability to choose the via of interest. In one such embodiment, a trench is used to contain the resist itself and multiple wavelengths of flood exposure are used to selectively open the vias of interest.

More specifically, one or more embodiment described herein involves the use of a subtractive method to pre-form every via or via opening using the trenches already etched. An additional operation is then used to select which of the vias and plugs to retain. Such operations can be illustrated using photobuckets, although the selection process may also be performed using a more conventional resist expose and ILD backfill approach.

In an example, a self-aligned via opening approach may be used. As an exemplary processing scheme, FIGS. 25A-25H illustrate portions of integrated circuit layers representing various operations in a method of subtractive self-aligned via patterning using multi-colored photobuckets, in accordance with an embodiment of the present disclosure. In each illustration at each described operation, cross-sectional views are shown.

Figure 25A:
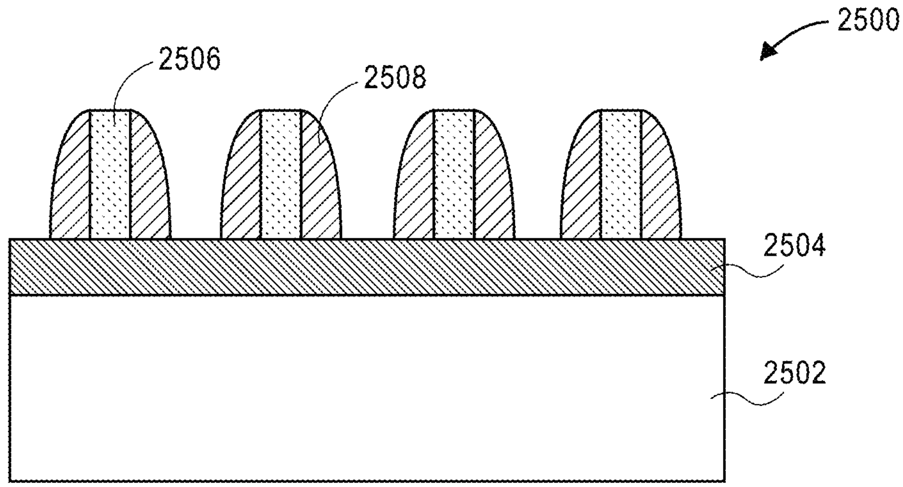
FIGS. 25A-25H illustrate portions of integrated circuit layers representing various operations in a method of subtractive self-aligned via patterning using multi-colored photobuckets, in accordance with an embodiment of the present disclosure.

FIG. 25A illustrates a cross-sectional view of a starting structure 2500 following deposition, but prior to patterning, of a first hardmask material layer 2504 formed on an interlayer dielectric (ILD) layer 2502, in accordance with an embodiment of the present disclosure. Referring to FIG. 25A, a patterned mask 2506 has spacers 2508 formed along sidewalls thereof, on or above the first hardmask material layer 2504.

Figure 25B:
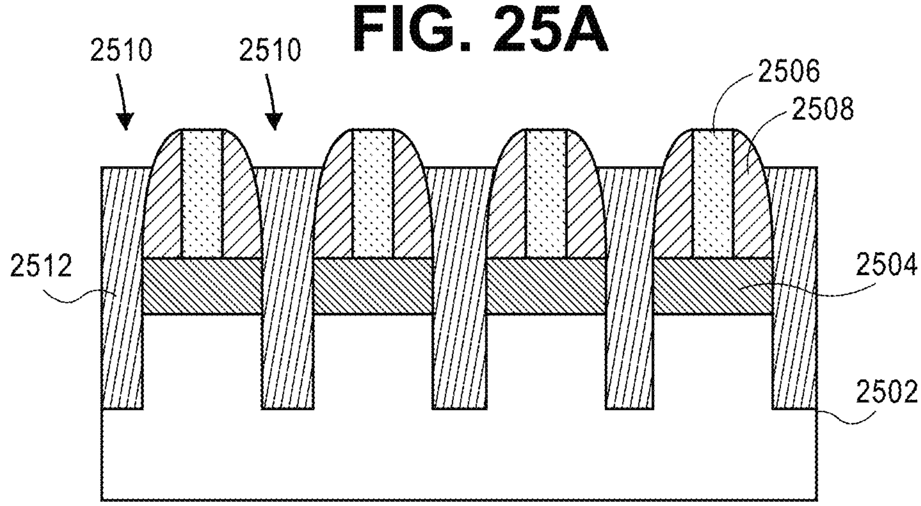

FIG. 25B illustrates the structure of FIG. 25A following first time patterning of the first hardmask layer and subsequent first color photobucket fill, in accordance with an embodiment of the present disclosure. Referring to FIG. 25B, the patterned mask 2506 and corresponding spacers 2508 are used together as a mask during an etch to form trenches 2510 through the first hardmask material layer 2504 and partially into the ILD layer 2502. The trenches 2510 are then filled with first color photobuckets 2512.

Figure 25C:
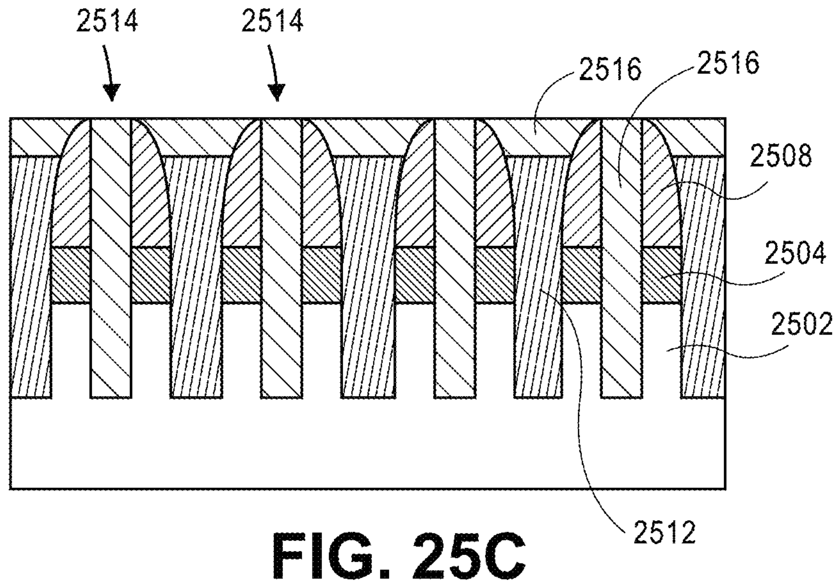

FIG. 25C illustrates the structure of FIG. 25B following second time patterning of the first hardmask layer and subsequent second color photobucket fill, in accordance with an embodiment of the present disclosure. Referring to FIG. 25C, the patterned mask 2506 is removed and a second plurality of trenches 2514 is etched through the first hardmask material layer 2504 and partially into the ILD layer 2502, between spacers 2508. Subsequently, the trenches 2514 are filled with a second color photobucket material layer 2516.

Referring again to FIG. 25C, the negative pattern of the spacers 2508 is thus transferred, e.g., by two etch processes forming trenches 2510 and 2514, to the first hardmask material layer 2504. In one such embodiment, the spacers 2508 and, hence, the trenches 2510 and 2514 are formed with a grating pattern, as is depicted in FIG. 25C. In an embodiment, the grating pattern is a tight pitch grating pattern. In a specific such embodiment, the tight pitch is not achievable directly through conventional lithography. For example, a pattern based on conventional lithography may first be limited to mask 2506, but the pitch may be halved by the use of negative spacer mask patterning, as is depicted in FIGS. 25A-25C. Even further, although not shown, the original pitch may be quartered by a second round of spacer mask patterning. Accordingly, the grating-like pattern of the photobuckets 2512 and 2516, collectively, is spaced at a constant pitch and has a constant width.

Figure 25D:
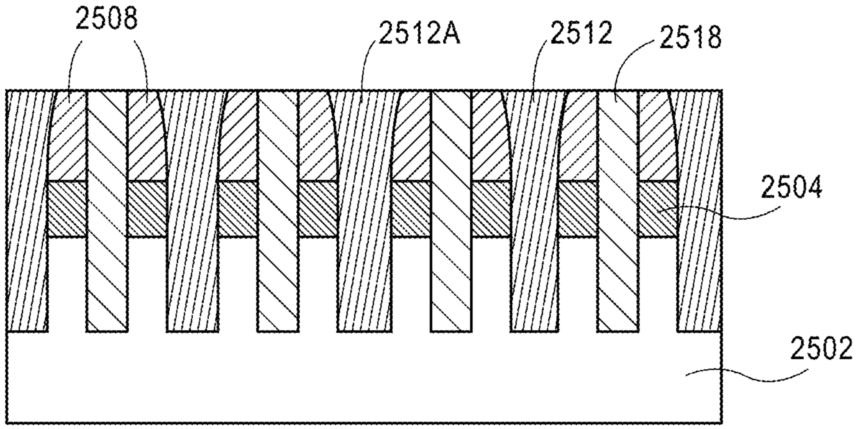

FIG. 25D illustrates the structure of FIG. 25C following planarization to isolate the first and second color photobuckets from one another, in accordance with an embodiment of the present disclosure. Referring to FIG. 25D, the second color photobucket material layer 2516 and the top portions of the spacers 2508 are planarized, e.g., by chemical mechanical polishing (CMP), until the top surfaces of the first color photobuckets 2512 are exposed, forming discrete second color photobuckets 2518 from the photobucket material layer 2516. In one embodiment, the combination of first color photobuckets 2512 and second color photobuckets 2518 represent all possible via locations in a subsequently formed metallization structure.

Figure 25E:
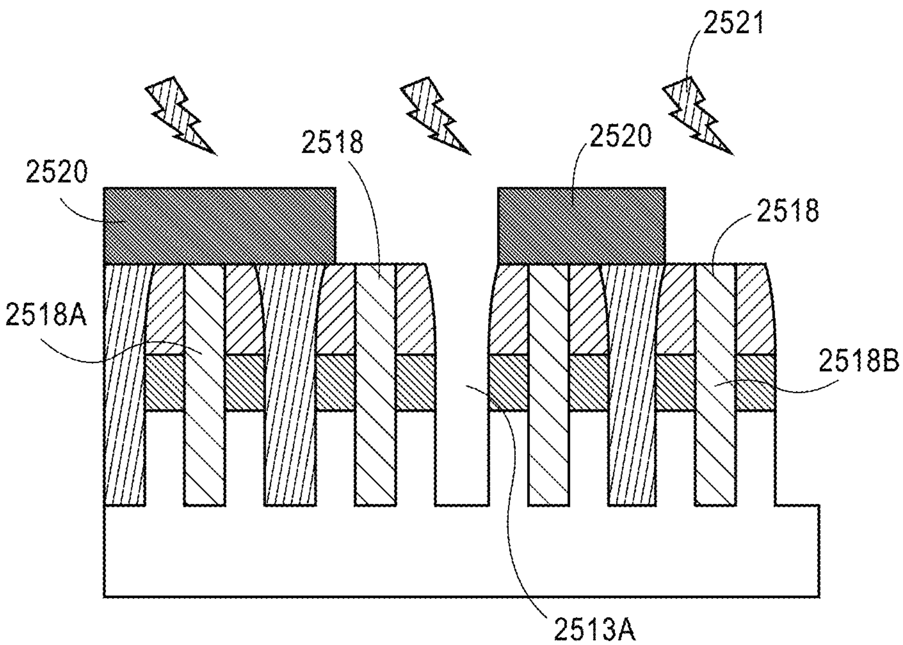

FIG. 25E illustrates the structure of FIG. 25D following exposure and development of a first color photobucket to leave a selected via location, in accordance with an embodiment of the present disclosure. Referring to FIG. 25E, a second hardmask 2520 is formed and patterned on the structure of FIG. 25D. The patterned second hardmask 2520 reveals a selected first color photobucket 2512A. The selected photobucket 2512A is exposed to light irradiation and removed (i.e., developed) to provide a selected via opening 2513A. It is to be appreciated that description herein concerning forming and patterning a hardmask layer involves, in an embodiment, mask formation above a blanket hardmask later. The mask formation may involve use of one or more layers suitable for lithographic processing. Upon patterning the one or more lithographic layers, the pattern is transferred to the hardmask layer by an etch process to provide a patterned hardmask layer.

Referring again to FIG. 25E, it may not be possible to reveal only the selected photobucket 2512A upon patterning of the second hardmask layer 2520. For example, one or more adjacent (or nearby) second color photobuckets 2518 may also be revealed. These additionally revealed photobuckets may not be desirable locations for ultimate via formation. However, any revealed second color photobuckets 2518 are, in an embodiment, not modified upon exposure to the irradiation used to for patterning the group of first color photobuckets 2512. For example, in one embodiment, the first color photobuckets 2512 are susceptible to red flood exposure 2521 and can be developed to remove select of the first color photobuckets 2512, as is shown in FIG. 25E. In that embodiment, the second color photobuckets 2518 are not susceptible to red flood exposure and, thus, cannot be developed and removed even if revealed during the red flood exposure, as is shown in FIG. 25E. In an embodiment, by having neighboring photobuckets of different irradiation susceptibility, larger patterns and/or offset tolerance may be accommodated to relax the restrictions otherwise associated with patterning the second hardmask layer 2520.

Figure 25F:
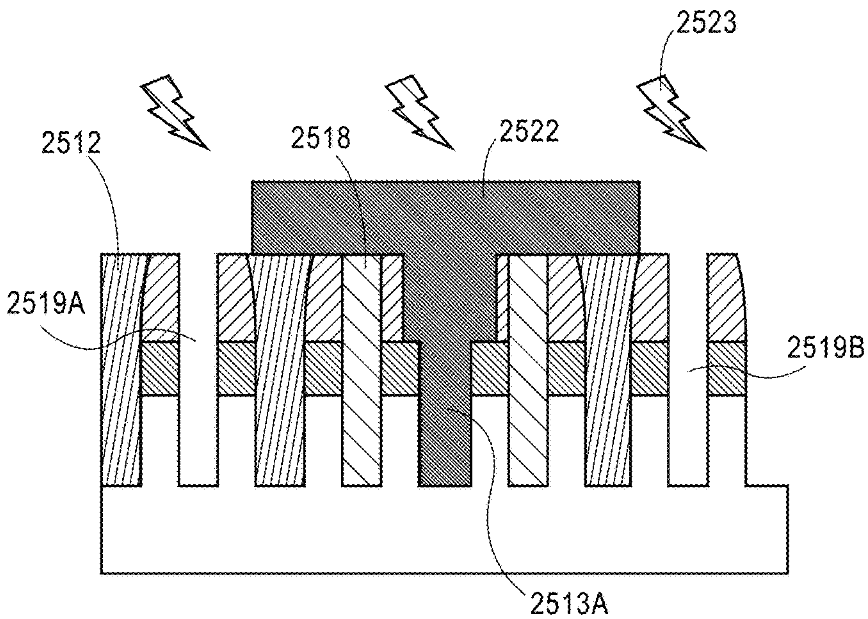

FIG. 25F illustrates the structure of FIG. 25E following exposure and development of a second color photobucket to leave an additional selected via location, in accordance with an embodiment of the present disclosure. Referring to FIG. 25F, a third hardmask 2522 is formed and patterned on the structure of FIG. 25E. The third hardmask 2522 may also fill the selected via opening 2513A, as is depicted in FIG. 25F. The patterned third hardmask 2522 reveals selected second color photobuckets 2518A and 2518B. The selected photobuckets 2518A and 2518B are exposed to light irradiation and removed (i.e., developed) to provide selected via openings 2519A and 2519B, respectively.

Referring again to FIG. 25F, it may not be possible to reveal only the selected photobuckets 2518A and 2518B upon patterning of the third hardmask layer 2522. For example, one or more adjacent (or nearby) first color photobuckets 2512 may also be revealed. These additionally revealed photobuckets may not be desirable locations for ultimate via formation. However, any revealed first color photobuckets 2512 are, in an embodiment, not modified upon exposure to the irradiation used to for patterning the group of second color photobuckets 2518. For example, in one embodiment, the second color photobuckets 2518 are susceptible to green flood exposure 2523 and can be developed to remove select of the second color photobuckets 2518, as is shown in FIG. 25F. In that embodiment, the first color photobuckets 2512 are not susceptible to green flood exposure and, thus, cannot be developed and removed even if revealed during the green flood exposure, as is shown in FIG. 25F. In an embodiment, by having neighboring photobuckets of different irradiation susceptibility, larger patterns and/or offset tolerance may be accommodated to relax the restrictions otherwise associated with patterning the third hardmask layer 2522.

Figure 25G:
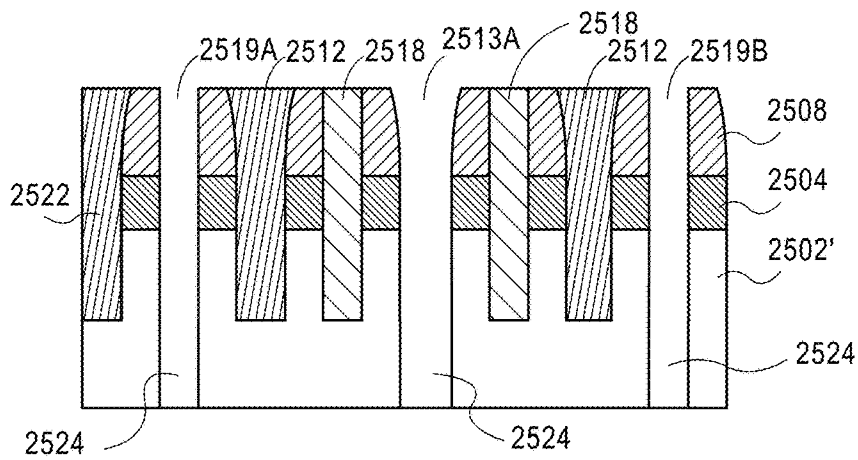

FIG. 25G illustrates the structure of FIG. 25F following removal of the third hardmask layer and etching to form via locations, in accordance with an embodiment of the present disclosure. Referring to FIG. 25G, the third hardmask layer 2522 is removed. In one such embodiment, the third hardmask layer 2522 is a carbon-based hardmask layer and is removed by an ashing process. Then, the pattern of the via openings 2519A, 2513A and 2519B are subjected to a selective etch process, such as a selective plasma etch process, to extend the via openings deeper into the underlying ILD layer 2502, forming via patterned ILD layer 2502' with via locations 2524. The etching is selective to remaining photobuckets 2512 and 2518 and to the spacers 2508.

Figure 25H:
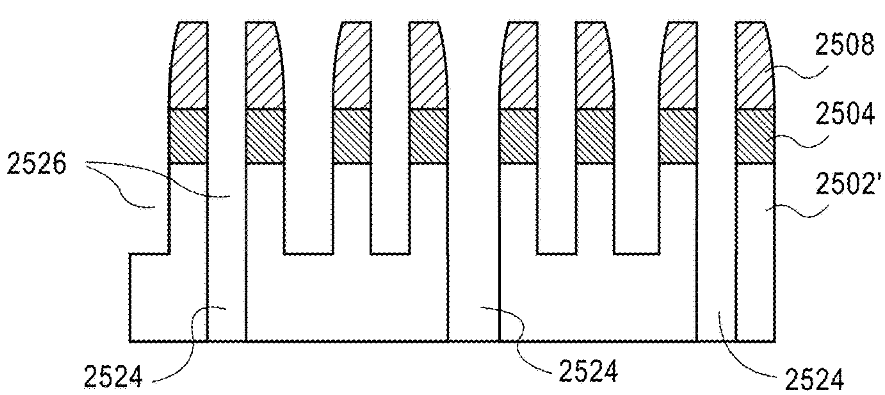

FIG. 25H illustrates the structure of FIG. 25G prior to metal fill, in accordance with an embodiment of the present disclosure. Referring to FIG. 25H, all remaining first color and second color photobuckets 2512 and 2518 are removed. The remaining first color and second color photobuckets 2512 and 2518 may be removed directly, or may first be exposed and developed to enable removal. The removal of the remaining first color and second color photobuckets 2512 and 2518 provides metal line trenches 2526, some of which are coupled to via locations 2524 in patterned ILD layer 2502'. Subsequent process can include removal of spacers 2508 and hardmask layer 2504, and metal fill of metal line trenches 2526 and via locations 2524. In one such embodiment, metallization is formed by a metal fill and polish back process.

The structure of FIG. 25H, upon metal fill, may subsequently be used as a foundation for forming subsequent metal line/via and ILD layers. Alternatively, the structure of FIG. 25H, upon metal fill, may represent the final metal interconnect layer in an integrated circuit. Referring again to FIG. 25H, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Referring again to FIGS. 25A-25H, several options may be considered as viable for providing first color photobuckets 2512 and second color photobuckets 2518. For example, in an embodiment, two different positive tone organic photoresists are used. It is to be appreciated that in one such embodiment, materials with different chemical structures can be selected for first color photobuckets 2512 and second color photobuckets 2518 to allow for different coating, photoactivation and development processes to be used. As an exemplary embodiment, a conventional 193 nm litho poly-methacrylate resist system is chosen for first color photobuckets 2512, while a conventional 248 nm poly-hydroxystyrene photoresist system is chosen for the second color photobuckets 2518. The significant chemical differences between these two types of resins allow two different organic casting solvents to be used; this may be necessary since the material of the second color photobuckets 2518 is coated with the material of the first color photobuckets 2512 already present. The casting solvent for the first color photobuckets 2512 is not limited, while for the second color photobuckets 2518, alcoholic solvents could be used as they still can solubilize PHS materials but not less polar poly-methacrylates.

The combination of a poly-methacrylate resin as the material of the first color photobuckets 2512 and a poly-hydroxystyrene resin as the material of the second color photobuckets 2518 can, in an embodiment, enable two different exposure wavelengths to be used. Typical 193 nm litho polymers are based on poly-methacrylates with 193 nm absorbing photo acid generator (PAG) since the polymer does not absorb strongly at this wavelength. Poly-hydroxystyrenes, on the other hand, may not be appropriate since they absorb 193 nm strongly and prevent activation of PAG throughout the film. In one embodiment, then, the material of the first color photobuckets 2512 can be selectively activated and developed in the presence of 193 nm photons. In order to accentuate photospeed differences between the first color photobuckets 2512 and the second color photobuckets 2518, factors such as PAG absorbance at 193 nm, PAG loading and photoacid strength can be tuned for each. Additionally, strong 193 nm absorbers can be added to the second color photobuckets 2518 (or deposited selectively on top of the second color photobuckets 2518) to decrease PAG activation within the bulk of the film. Following exposure, in a particular embodiment, development of the first color photobuckets 2512 selectively is carried out with standard TMAH developer where minimal development of the second color photobuckets 2518 will occur.

In an embodiment, in order to selectively remove the second color photobuckets 2518 in presence of the first color photobuckets 2512, a second lower energy wavelength is used which only activates PAG in the second color photobuckets 2518 and not in the first color photobuckets 2512. This can be achieved in two ways. First, in one embodiment, PAGs with differing absorbance characteristics are used. For example, trialkylsulfonium salts have very low absorbance at wavelengths such as at 248 nm, whereas triarylsulfoniums have very high absorbance. Thus, selectivity is achieved by using triarylsulfonium or other 248 nm absorbing PAGs in the second color photobuckets 2518 while using trialkylsulfonium or other non-248 nm absorbing PAG in the first color photobuckets 2512. Alternatively, a sensitizer can be incorporated into the second color photobuckets 2518 which absorbs low energy photons transferring energy to PAG selectively in the second color photobuckets 2518 with no activation occurring in the first color photobuckets 2512, since there is no sensitizer present.

Figure 25I:
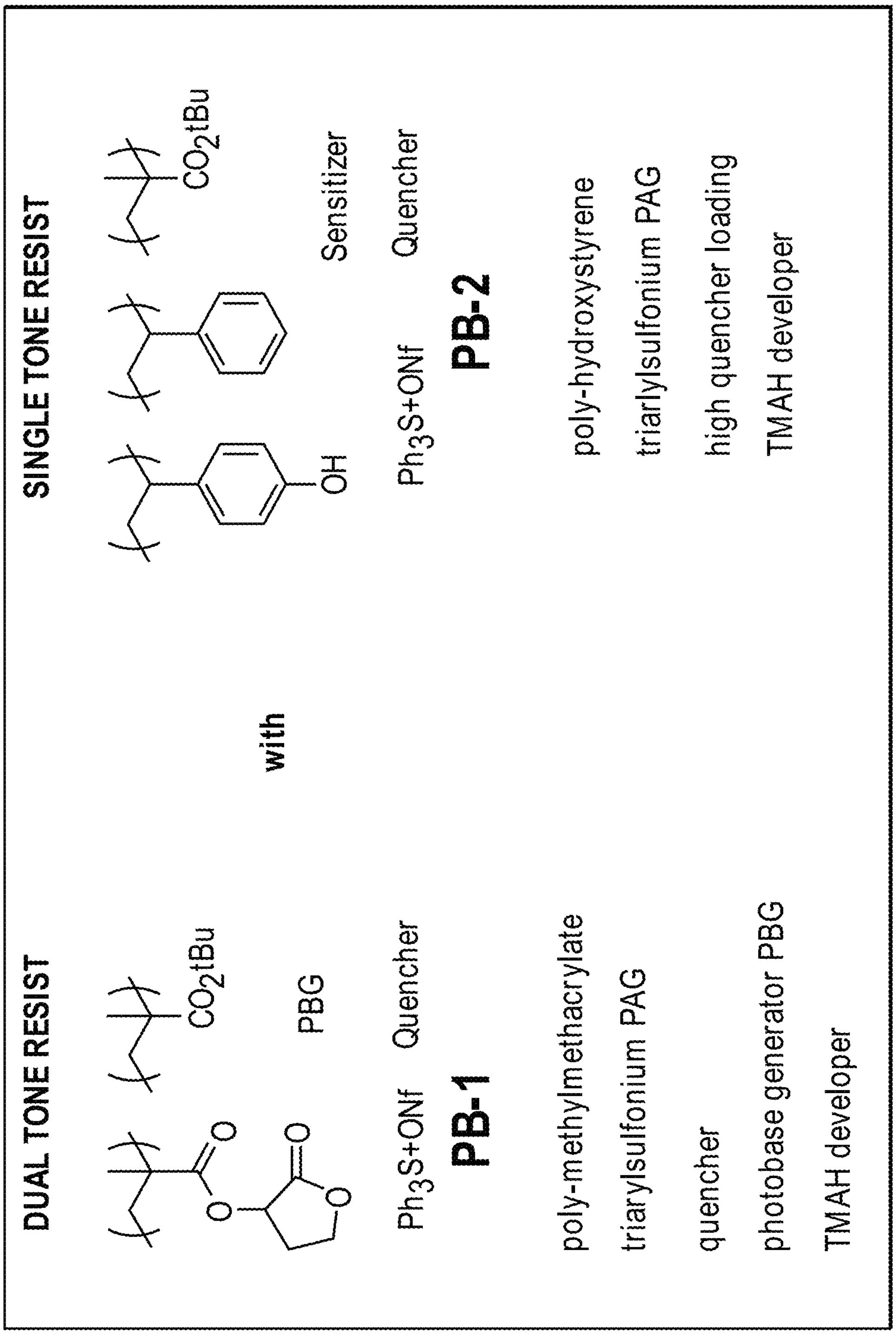
FIG. 25I illustrates an exemplary dual tone resist for one photobucket type and an exemplary single tone resist for another photobucket type, in accordance with an embodiment of the present disclosure.

In another embodiment, FIG. 25I illustrates an exemplary dual tone resist for one photobucket type and an exemplary single tone resist for another photobucket type, in accordance with an embodiment of the present disclosure. Referring to FIG. 25I, in one embodiment, a dual tone photoresist system (PB-1) is used for the material of the first color photobuckets 2512. A single tone (slow) photoresist system (PB-2) is used for the material of the second color photobuckets 2518. A dual tone photoresist may be characterized as having a photo-response that is effectively turned off at higher doses due to activation of photobase generators included in system. The photogenerated base neutralizes photoacid and prevents polymer deprotection. In an embodiment, during exposure of the first color photobuckets 2512, dose is selected such that dual tone resist (PB-1) is operating as a fast positive tone system, whereas single tone resist (PB-2) has not received sufficient photons for solubility switch to be activated. This allows PB-1 to be removed with TMAH developer without removal of PB-2. In order to selectively remove PB-2 without removing PB-1, a higher dose is used for the second exposure (i.e., exposure of the second color photobuckets 2518). The dose selected needs to both activate sufficient PAG in PB-2 to allow dissolution in TMAH and move PB-2 into negative tone response regime through activation of PBG. In this scheme, the same PAGs can be used for PB-1 and PB-2 and the same exposure wavelengths can be used for exposures 1 and 2. It is to be appreciated that PB-1 may require incorporation of photobase generator (PBG); however, it is likely that different types of polymers will be needed to allow coating of PB-2 once PB-1 is already coated. As described above, utilization of poly-methylmethacrylate type resist for PB-1 and PHS-type for PB-2 could satisfy this requirement.

It is to be appreciated that the above designated materials for first and second color photobuckets 2512 and 2518, respectively, could be switched, in accordance with embodiments of the present disclosure. Also, the above multi-color photobucket approach can be referred to as 1-D. Similar approaches could be applied to 2-D systems using crossed gratings, although the photobucket material would have to withstand the etch and cleans from the crossed grating above. The result would be a checkerboard-type pattern with smaller vias/plugs in the perpendicular direction versus those in the approach described above. Additionally, it is to be appreciated that the approaches described in association with FIGS. 25A-25H are not necessarily performed as forming vias aligned to an underlying metallization layer, although they certainly can be implemented as such. In other contexts, these process schemes could be viewed as involving blind shooting in the top down direction with respect to any underlying metallization layers.

In accordance with an embodiment of the present disclosure, photobuckets for conductive tabs are described.

Figure 26A:
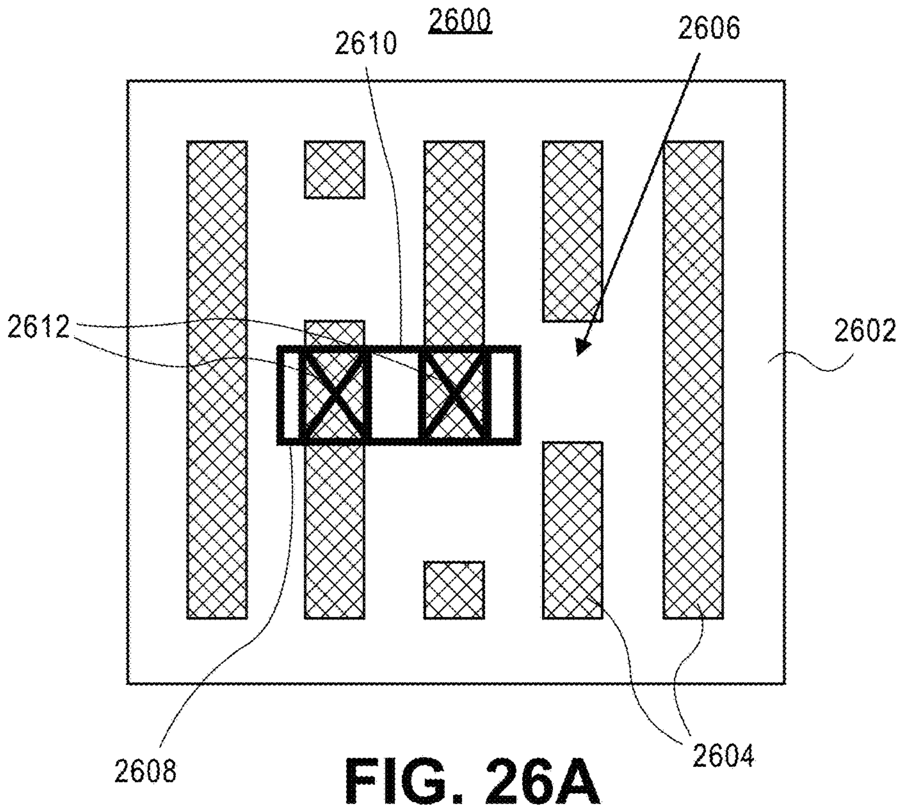
FIG. 26A illustrates a plan view of a conventional back end of line (BEOL) metallization layer.

By way of example, FIG. 26A illustrates a plan view of a conventional back end of line (BEOL) metallization layer. Referring to FIG. 26A, a conventional BEOL metallization layer 2600 is shown with conductive lines or routing 2604 disposed in an inter-layer dielectric layer 2602. The metal lines may generally run parallel to one another and may include cuts, breaks or plugs 2606 in the continuity of one or more of the conductive lines 2604. In order to electrically couple two or more of the parallel metal lines, upper or lower layer routing 2608 is included in a previous or next metallization layer. Such upper or lower layer routing 2608 may include a conductive line 2610 coupling conductive vias 2612. It is to be appreciated that, since the upper or lower layer routing 2608 is included in a previous or next metallization layer, the upper or lower layer routing 2608 can consume vertical real estate of a semiconductor structure that includes the metallization layers.

Figure 26B:
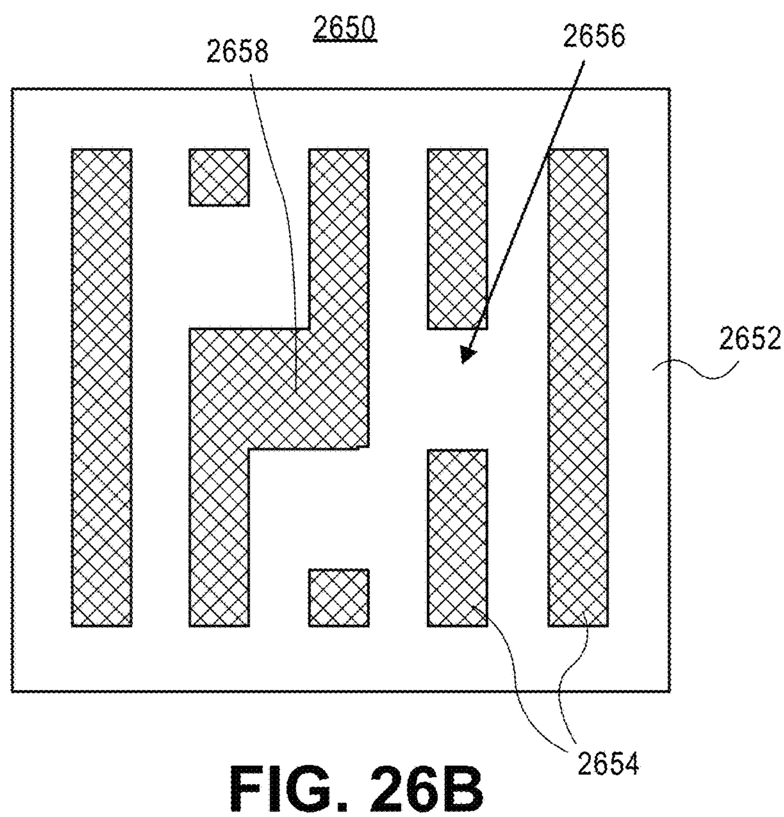
FIG. 26B illustrates a plan view of a back end of line (BEOL) metallization layer having a conductive tab coupling metal lines of the metallization layer, in accordance with an embodiment of the present disclosure.

By contrast, FIG. 26B illustrates a plan view of a back end of line (BEOL) metallization layer having a conductive tab coupling metal lines of the metallization layer, in accordance with an embodiment of the present disclosure. Referring to FIG. 26B, a BEOL metallization layer 2650 is shown with conductive lines or routing 2654 disposed in an inter-layer dielectric layer 2652. The metal lines may generally run parallel to one another and may include cuts, breaks or plugs 2656 in the continuity of one or more of the conductive lines 2654. In order to electrically couple two or more of the parallel metal lines, a conductive tab 158 is included in the metallization layer 2650. It is to be appreciated that, since the conductive tab 2658 is included in the same metallization layer as the conductive lines 2654, the conductive tab 2658 consumption of vertical real estate of a semiconductor structure that includes the metallization layer can be reduced relative to the structure of FIG. 26A.

One or more embodiments described herein are directed to photobucket approaches for damascene plug and tab patterning. Such patterning schemes may be implemented to enable bi-directional spacer-based interconnects. Implementations may be particularly suitable for electrically connecting two parallel lines of a metallization layer where the two metal lines were fabricated using a spacer-based approach which otherwise may restrict the inclusion of conductive connection between two adjacent lines in a same metallization layer. In general, one or more embodiments are directed to an approach that employs a damascene technique to form conductive tabs and non-conductive spaces or interruptions between metals (plugs).

More specifically, one or more embodiment described herein involves the use of a damascene method to form tabs and plugs. Initially, every possible tab and plug location is first patterning in a hardmask layer. An additional operation is then used to select which of the tab and plug locations to retain. The locations are then transferred into an underlying inter-layer dielectric layer. Such operations can be illustrated using photobuckets. In a particular embodiment, a method for damascene patterning of vias, plugs, and tabs with is provided with self-alignment using a photobucketing approach and selective hard masks.

In accordance with an embodiment of the present disclosure, photobucket patterning is used for fabricating plugs and tabs in a self-aligned manner. A general overview process flow can involve (1) fabrication of a cross-grating, followed by (2) photobucketing for plug definition and changing the photoresist to a "hard" material that can withstand downstream processing, followed by (3) grating tone reversal by backfilling with a fillable material, recessing the fillable material, and removing the original cross-grating, followed by (4) photobucketing for "Tab" definition, followed by (5) etch transferring the pattern into an underlying inter-layer dielectric (ILD) layer and polishing away the additional hard mask materials. It is to be appreciated that although the general process flow does not include vias, in an embodiment, approaches described herein can be implemented to extend to multiple passes of plugs, vias, and tabs using a same self-aligned grating.

As an example, FIGS. 27A-27K illustrate angled cross-sectional views representing various operations in a method of fabricating a back end of line (BEOL) metallization layer having a conductive tab coupling metal lines of the metallization layer, in accordance with an embodiment of the present disclosure.

Figure 27A:
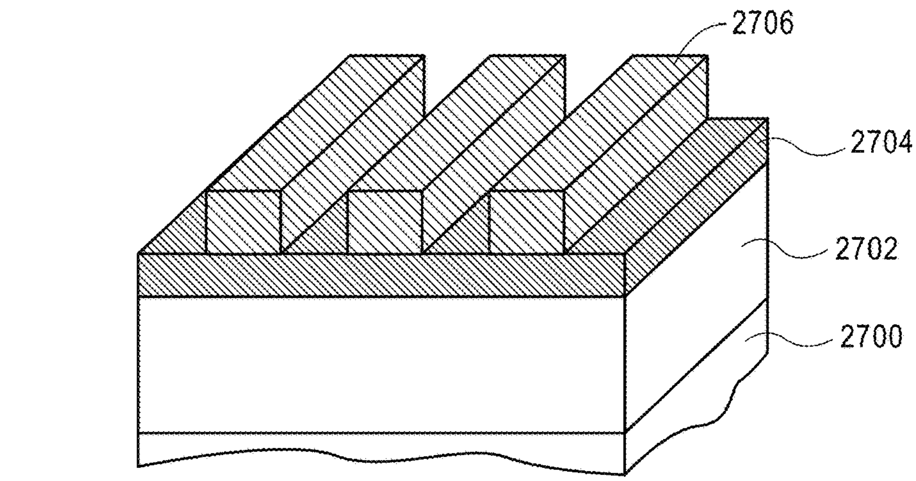
FIGS. 27A-27K illustrate angled cross-sectional views representing various operations in a method of fabricating a back end of line (BEOL) metallization layer having a conductive tab coupling metal lines of the metallization layer, in accordance with an embodiment of the present disclosure.

Referring to FIG. 27A, a first operation in a cross-grating patterning scheme is performed above an inter-layer dielectric (ILD) layer 2702 formed above a substrate 2700. A blanket hardmask 2704 is first formed on the ILD layer 2702. A first grating hardmask 2706 is formed along a first direction above the blanket hardmask 2704. In an embodiment, the first grating hardmask 2706 is formed with a grating pattern, as is depicted in FIG. 27A. In an embodiment, the grating structure of the first grating hardmask 2706 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the first grating hardmask 2706 of FIG. 27A may have hardmask lines tightly spaced at a constant pitch and having a constant width.

Figure 27B:
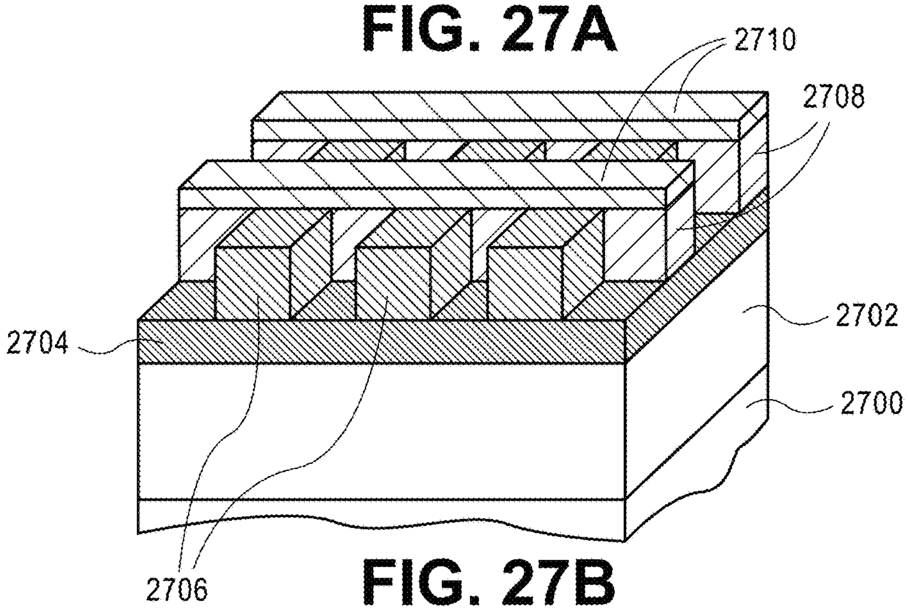

Referring to FIG. 27B, a second operation in a cross-grating patterning scheme is performed above the inter-layer dielectric (ILD) layer 2702. A second grating hardmask 2708 is formed along a second direction above the blanket hardmask 2704. The second direction is orthogonal to the first direction. The second grating hardmask 2708 has an overlying hardmask 2710 thereon. In an embodiment, the second grating hardmask 2710 is fabricated in a patterning process using the overlying hardmask 2710. The continuity of the second grating hardmask 2708 is broken by lines of the first grating hardmask 2706 and, as such, portions of the first grating hardmask 2706 extend under the overlying hardmask 2710. In an embodiment, the second grating hardmask 2708 is formed interleaved with the first grating hardmask 2706. In one such embodiment, the second grating hardmask 2708 is formed by deposition of a second hardmask material layer having a composition different from the first grating hardmask 2706. The second hardmask material layer is then planarized, e.g., by chemical mechanical polishing (CMP), and then patterned using the overlying hardmask 2710 to provide the second grating hardmask 2708. As was the case for the first grating hardmask 2706, in an embodiment, the grating structure of the second grating hardmask 2708 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second grating hardmask 2708 of FIG. 27A may have hardmask lines tightly spaced at a constant pitch and having a constant width.

Figure 27C:
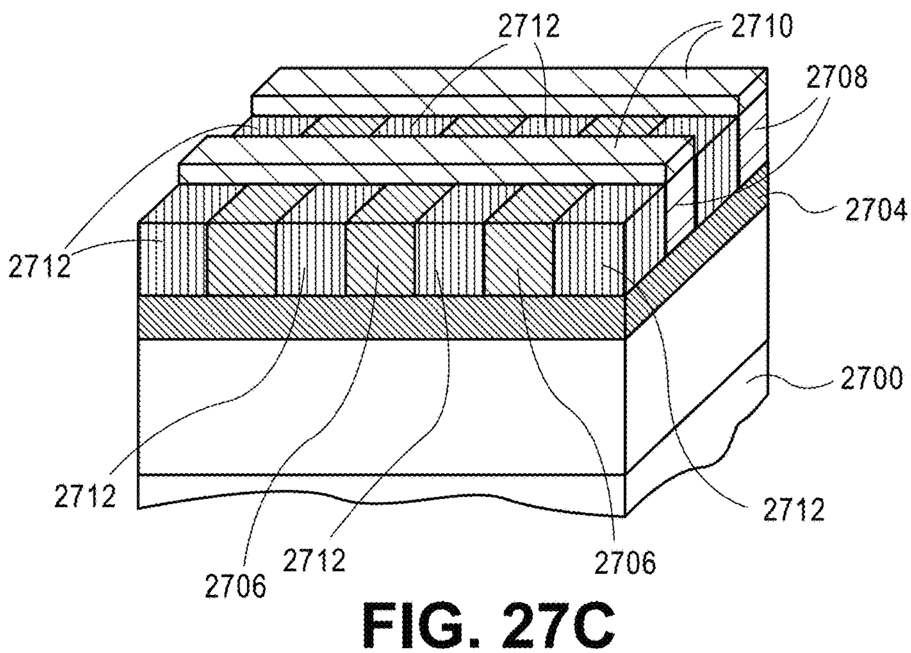

Referring to FIG. 27C, a plug photobucket patterning scheme is performed as a first photobucketing process. In an embodiment, photobuckets 2712 are formed on all of the exposed openings between the first grating hardmask 2706 and the second grating hardmask 2708. In an embodiment, a via patterning process is optionally performed prior to the plug photobucket patterning process. The via patterning may be direct patterning or may involve a separate photobucketing process.

Figure 27D:
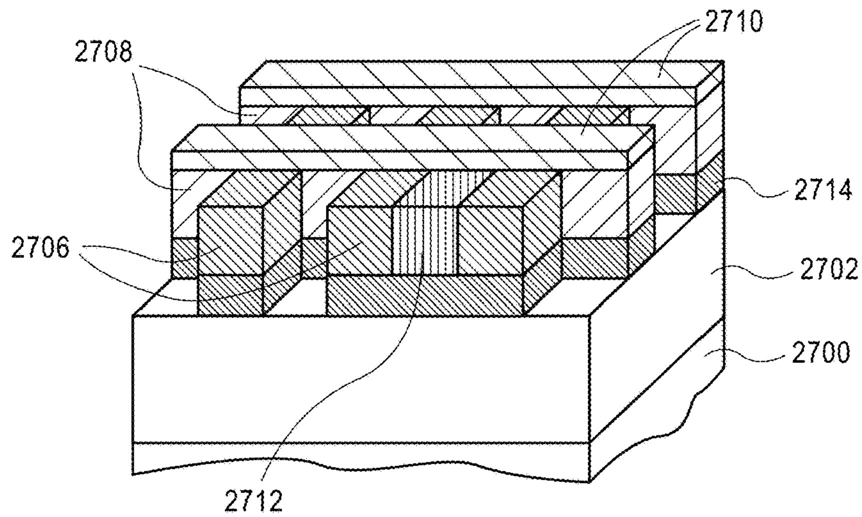

Referring to FIG. 27D, select ones of the photobuckets 2712 are removed while other photobuckets 2712 are retained, e.g., by not exposing a select photobucket 2712 to a lithography and development process used to open all other photobuckets 2712. The exposed portions of the blanket hardmask 2704 of FIG. 27A are then etched to provide first-time patterned hardmask 2714. The retained photobuckets 2712, at this stage, represent the plug locations in a final metallization layer. That is, in the first photobucket process, photobuckets are removed from locations where plugs will not be formed. In one embodiment, in order to form locations where plugs will not be formed, lithography is used to expose the corresponding photobuckets. The exposed photobuckets may then be removed by a developer.

Figure 27E:
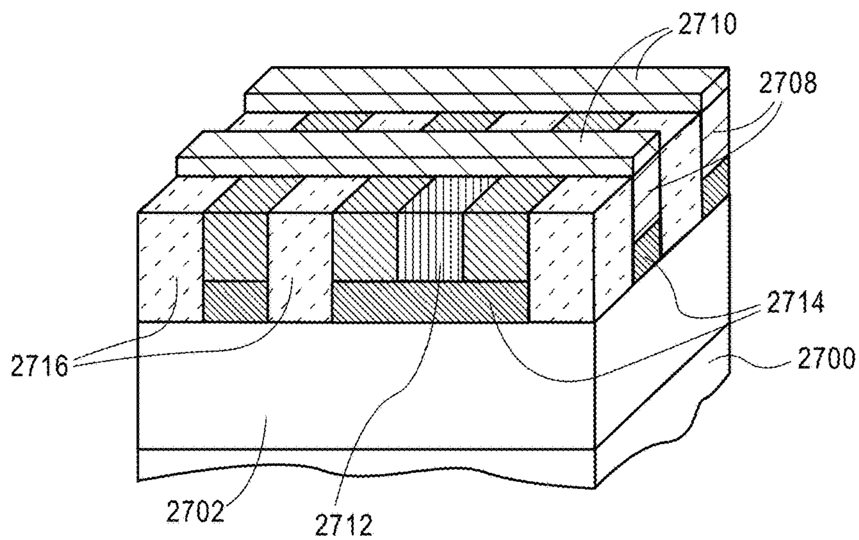

Referring to FIG. 27E, a grating tone reversal process is performed. In an embodiment, dielectric regions 2716 is formed in all of the exposed regions of the structure of FIG. 27D. In an embodiment, the dielectric regions 2716 are formed by deposition of a dielectric layer and etch back to form dielectric regions 2716.

Figure 27F:
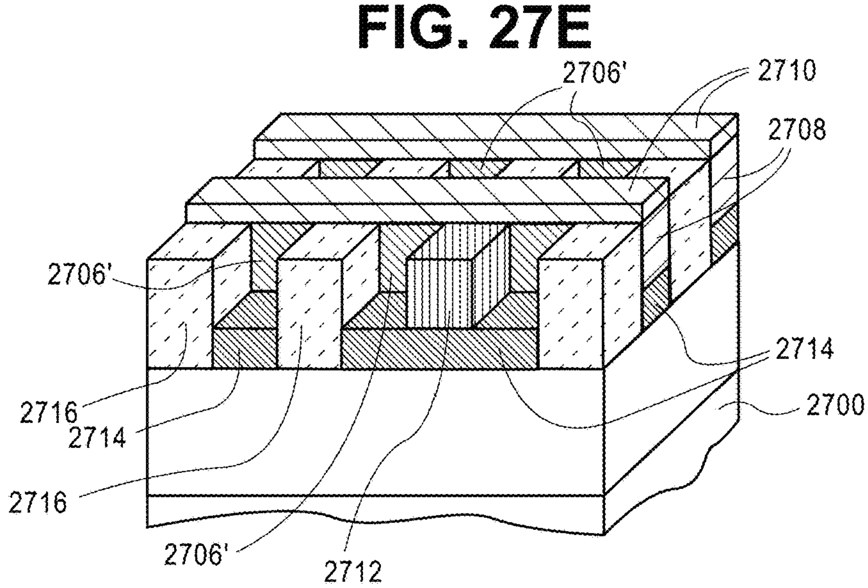

Referring to FIG. 27F, the portions of the first grating hardmask 2706 not covered by the overlying hardmask 2710 are then removed to leave only portions 2706' of the first grating hardmask 2706 remaining under the overlying hardmask 2710.

Figure 27G:
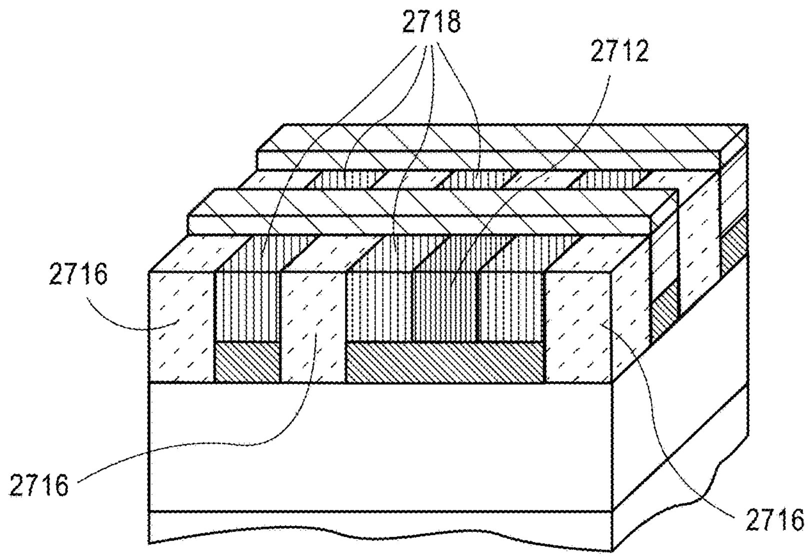

Referring to FIG. 27G, a tab photobucket patterning scheme is performed as a second photobucketing process. In an embodiment, photobuckets 2718 are formed in all of the exposed openings formed upon removal of exposed portions of the first grating hardmask 2706.

Figure 27H:
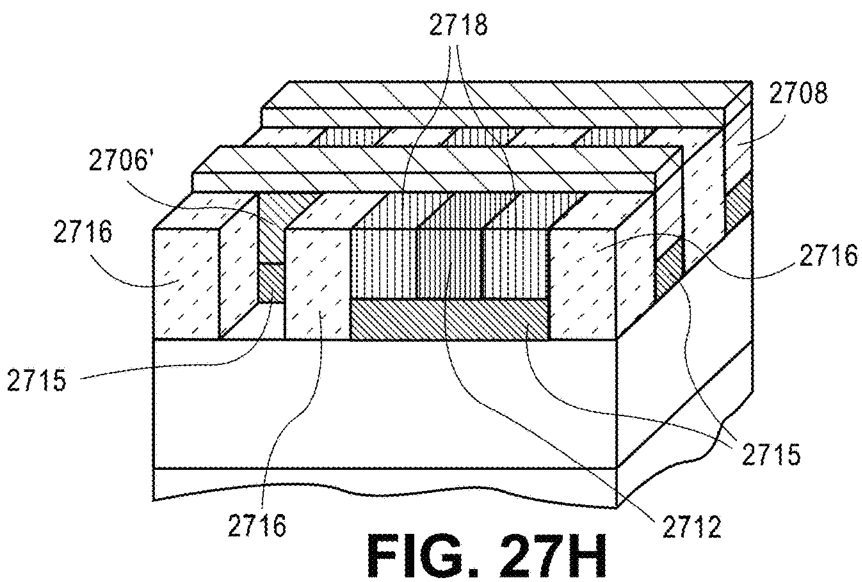

Referring to FIG. 27H, select ones of the photobuckets 2718 are removed while other photobuckets 2718 are retained, e.g., by not exposing photobuckets 2718 to a lithography and development process used to open the other photobuckets. The exposed portions of the first-time patterned hardmask 2714 of FIGS. 27D-27G are then etched to provide second-time patterned hardmask 2715. The retained photobuckets 2718, at this stage, represent the locations where conductive tabs will not be in a final metallization layer. That is, in the second photobucket process, photobuckets are removed from locations where conductive tabs will ultimately be formed. In one embodiment, in order to form locations where conductive tabs will be formed, lithography is used to expose the corresponding photobuckets. The exposed photobuckets may then be removed by a developer.

Figure 27I:
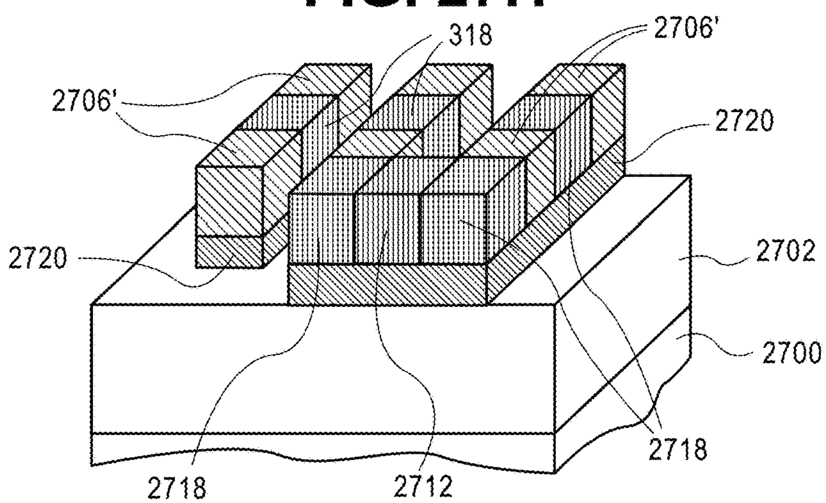

Referring to FIG. 27I, the overlying hardmask 2710, the second grating hardmask 2708, and the dielectric regions 2716 are removed. Subsequently, portions of the second-time patterned hardmask 2715 exposed upon removal of the overlying hardmask 2710 are removed to provide third-time patterned hardmask 2720, the second grating hardmask 2708, and the dielectric regions 2716 are removed. In an embodiment, remaining ones of the photobuckets 2712 and 2718 are first hardened (e.g., by a bake process), prior to removing the overlying hardmask 2710, the second grating hardmask 2708, and the dielectric regions 2716. At this stage, select ones of the photobuckets 2712, select ones of the photobuckets 2718, and retained portions 2706' of the first grating hardmask 2706 remain above the third-time patterned hardmask 2720. In an embodiment, the overlying hardmask 2710, the second grating hardmask 2708, and the dielectric regions 2716 are removed using a selective wet etch process, while the portions of the second-time patterned hardmask 2715 exposed upon removal of the overlying hardmask 2710 are removed to provide third-time patterned hardmask 2720 using a dry etch process.

Figure 27J:
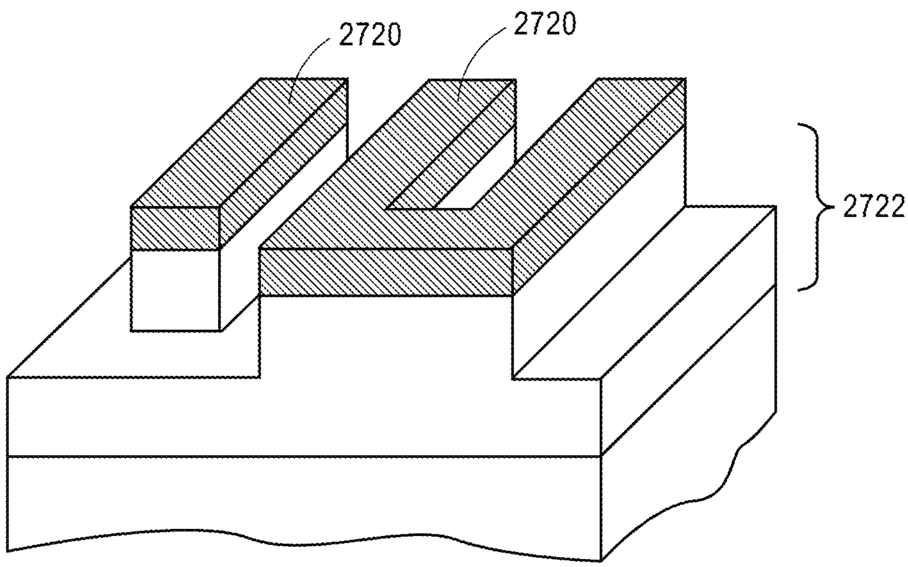

Referring to FIG. 27J, the pattern of the third-time patterned hardmask 2720 is transferred to an upper portion of the ILD layer 2702 to form patterned ILD layer 2722. In an embodiment, then, a plug and tab pattern of the third-time patterned hardmask 2720 is transferred to the ILD layer 2702 to form patterned ILD layer 2722. In an embodiment, an etch process is used to transfer the pattern into the ILD layer 2702. In one such embodiment, the select ones of the photobuckets 2712, select ones of the photobuckets 2718, and retained portions 2706' of the first grating hardmask 2706 remaining above the third-time patterned hardmask 2720 are removed or consumed during the etching used to form patterned ILD layer 2722. In another embodiment, the select ones of the photobuckets 2712, select ones of the photobuckets 2718, and retained portions 2706' of the first grating hardmask 2706 remaining above the third-time patterned hardmask 2720 are removed prior to or subsequent to the etching used to form patterned ILD layer 2722.

Figure 27K:
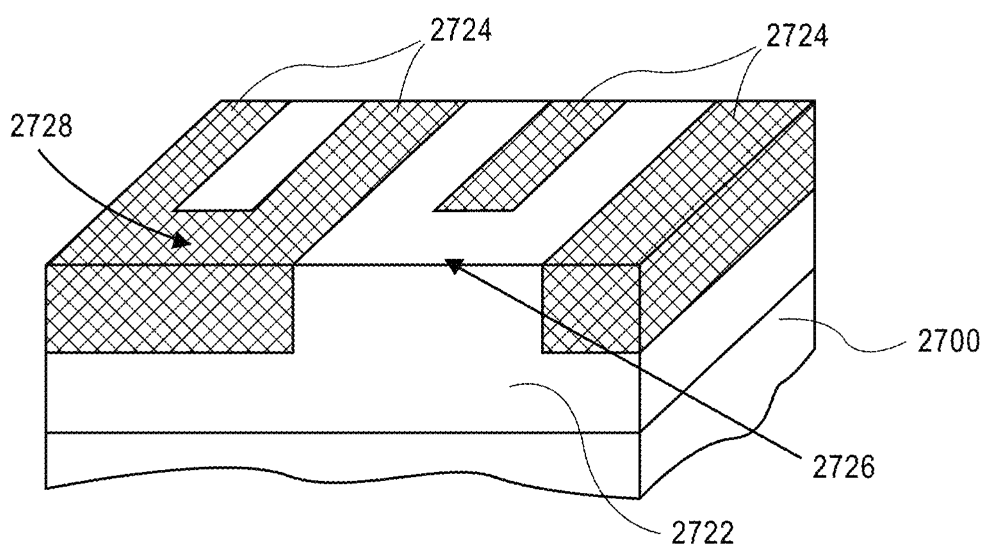

Referring to FIG. 27K, following formation of patterned ILD layer 2732, conductive lines 2724 are formed. In one embodiment, the conductive lines 2724 are formed using a metal fill and polish back process. During the formation of conductive lines 2724, a conductive tab 2728 coupling two metal lines 2724 is also formed. Thus, in an embodiment, a conductive coupling (tab 2728) between conductive lines 2724 is formed at the same time as the conductive lines 2724, in a same ILD layer 2722, and in a same plane as the conductive lines 2724. Additionally, plugs 2726 may be formed as a break or interruption in one or more of the conductive lines 2724, as is depicted in FIG. 27K. In one such embodiment, the plug 2726 is a region of the ILD layer 2702 that is preserved during pattern transfer to form patterned ILD layer 2722. In an embodiment, the third-time patterned hardmask 2720 is removed, as is depicted in FIG. 27K. In one such embodiment, the third-time patterned hardmask 2720 is removed subsequent to forming the conductive lines 2724 and tab 2728, e.g., using a post metallization chemical mechanical planarization (CMP) process.

Referring again to FIG. 27K, in an embodiment, a back end of line (BEOL) metallization layer for a semiconductor structure includes an inter-layer dielectric (ILD) layer 2722 disposed above a substrate 2700. A plurality of conductive lines 2724 is disposed in the ILD layer 2722 along a first direction. A conductive tab 2728 is disposed in the ILD layer 2722. The conductive tab couples two of the plurality of conductive lines 2724 along a second direction orthogonal to the first direction.

Such an arrangement as depicted in FIG. 27K may not otherwise be achievable by conventional lithographic processing at either small pitch, small width, or both. Also, self-alignment may not be achievable with conventional processes. Furthermore, arrangement as depicted in FIG. 27K may not otherwise be achievable in cases where a pitch division scheme is used to ultimately provide a pattern for the conductive lines 2724.

In an embodiment, the conductive tab 2728 is continuous, and not contiguous, with the two of the plurality of conductive lines, as is depicted in FIG. 27K. In an embodiment, the conductive tab 2728 is co-planar with the two of the plurality of conductive lines 2724, as is depicted in FIG. 27K. In an embodiment, the BEOL metallization layer further includes a dielectric plug 2726 disposed at an end of one of the plurality of conductive lines 2724, as is depicted in FIG. 27K. In one embodiment, the dielectric plug 2726 is continuous, and not contiguous, with the ILD layer, as is depicted in FIG. 27K. In one embodiment, although not shown, the BEOL metallization layer further includes a conductive via disposed below and electrically coupled to one of the plurality of conductive lines 2724.

The structure of FIG. 27K may subsequently be used as a foundation for forming subsequent metal line/via and ILD layers. Alternatively, the structure of FIG. 3K may represent the final metal interconnect layer in an integrated circuit. Referring again to FIG. 27K, such self-aligned fabrication by a damascene photobucket approach may be continued to fabricate a next metallization layer. Alternatively, other approaches may be used at this stage to provide additional interconnect layers, such as conventional dual or single damascene approaches. It is also to be appreciated that, although not depicted, one or more of the conductive lines 2724 may be coupled to an underlying conductive via which may be formed using an additional photobucket operation.

In an embodiment, as an alternative to the above described two-dimensional approach, a one-dimensional grating approach may also be implemented for plugs and tabs (and possibly via) patterning. Such a one-dimensional approach provides confinement in only one direction. As such, the pitch may be "tight" in one direction and "loose" in one direction.

One or more embodiments described herein are directed to photobucket approaches for subtractive plug and tab patterning. Such patterning schemes may be implemented to enable bi-directional spacer-based interconnects. Implementations may be particularly suitable for electrically connecting two parallel lines of a metallization layer where the two metal lines were fabricated using a spacer-based approach which otherwise may restrict the inclusion of conductive connection between two adjacent lines in a same metallization layer. In general, one or more embodiments are directed to an approach that employs a subtractive technique to form conductive tabs and non-conductive spaces or interruptions between metals (plugs).

One or more embodiments described herein provide an approach for subtractively patterning vias, cuts, and/or tabs with self-alignment using a photobucketing approach and selective hard masks. Embodiments may involve use of a so-called textile patterning approach for subtractively-patterned self-aligned interconnects, plugs, and vias. A textile approach may involve implementation of a textile pattern of hardmasks with etch selectivity among each hardmask material. In specific embodiments described herein, a textile processing scheme is implemented to pattern interconnects, cuts, and vias subtractively.

As an overview of one or more embodiments described herein, a general overview process flow can involve the following process sequence: (1) fabrication using a textile process flow with four "color" hardmasks that are etch selective to one another, (2) removing a first of the hardmask types for photobucketing for vias, (3) backfilling the first hardmask material, (4) removing a second of the hardmask types for photobucketing for cuts (or plugs), (5) backfilling the second mask material, (6) removing a third of the hardmask types for photobucketing for conductive tabs, (7) subtractively etching metal for cuts and tabs, and (8) hardmask removal and subsequent backfilling with permanent ILD material and polish back.

Figure 28A:
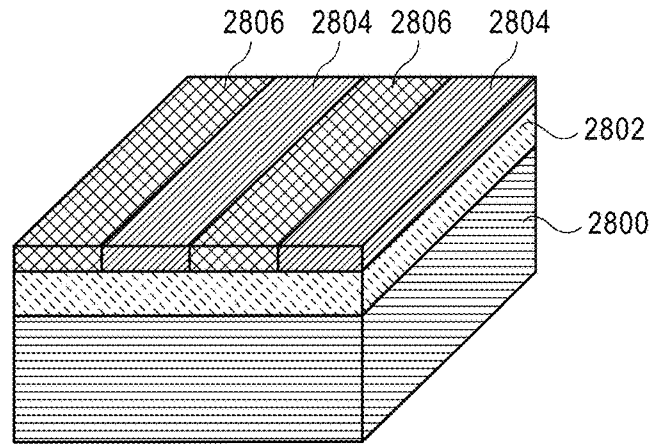
FIGS. 28A-28T illustrate angled cross-sectional views representing various operations in a method of fabricating a back end of line (BEOL) metallization layer having a conductive tab coupling metal lines of the metallization layer, in accordance with an embodiment of the present disclosure.
Figure 28B:
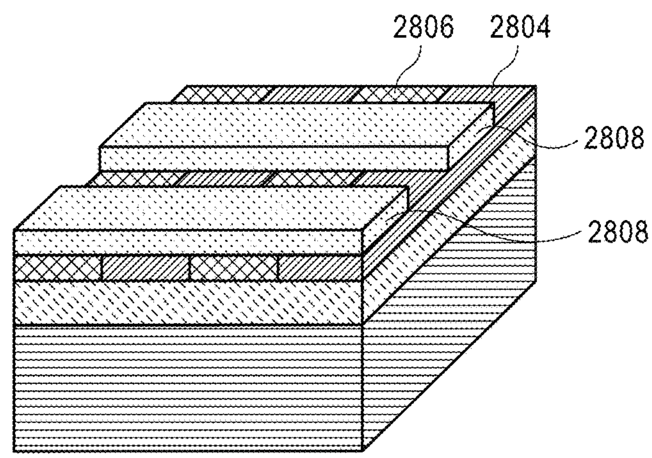
Figure 28C:
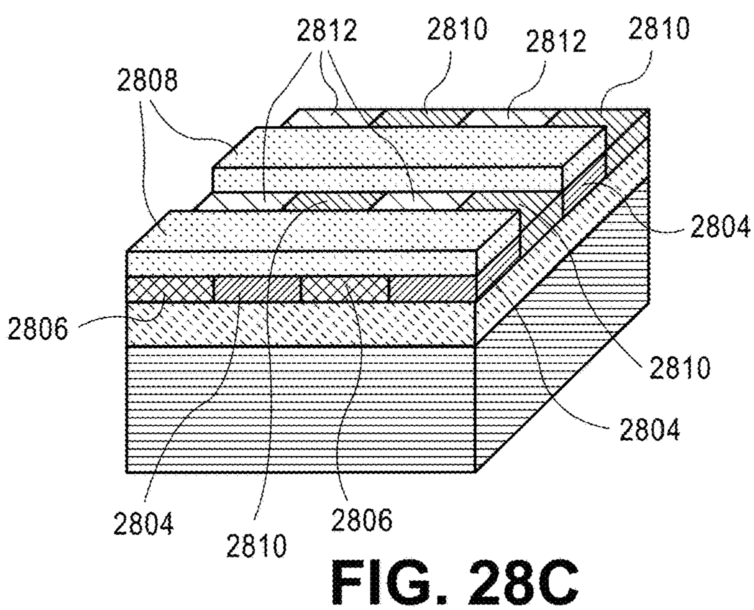
Figure 28D:
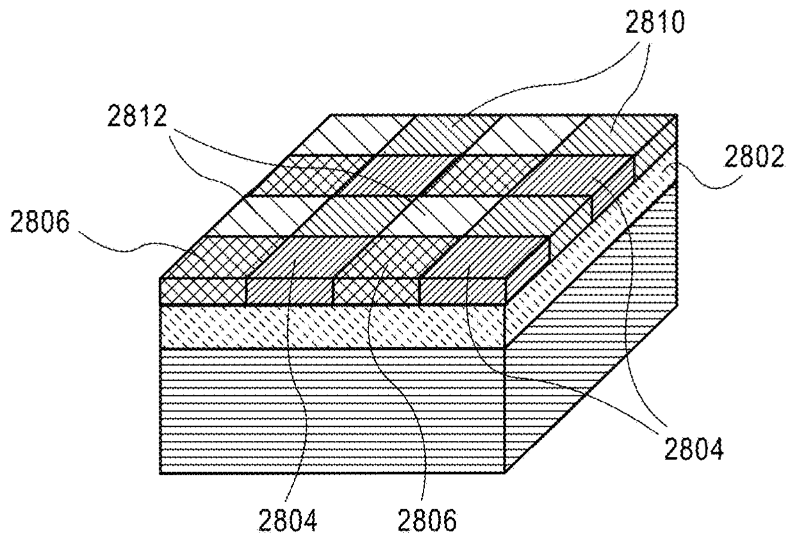
Figure 28E:
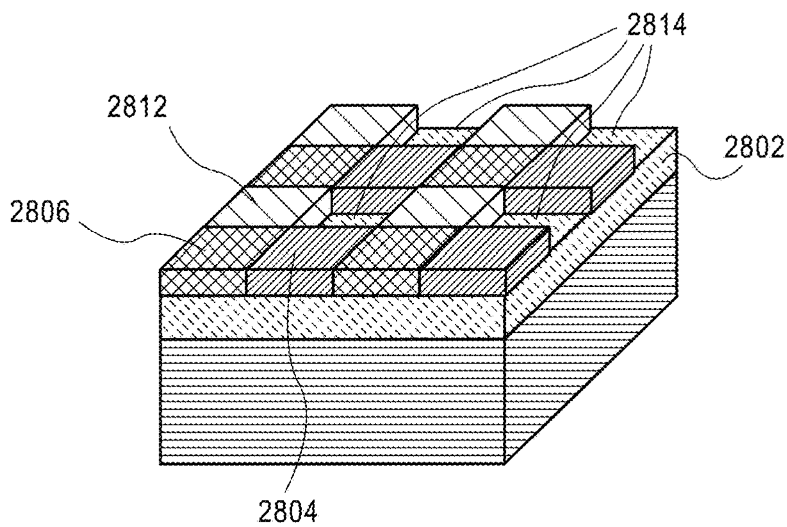
Figure 28F:
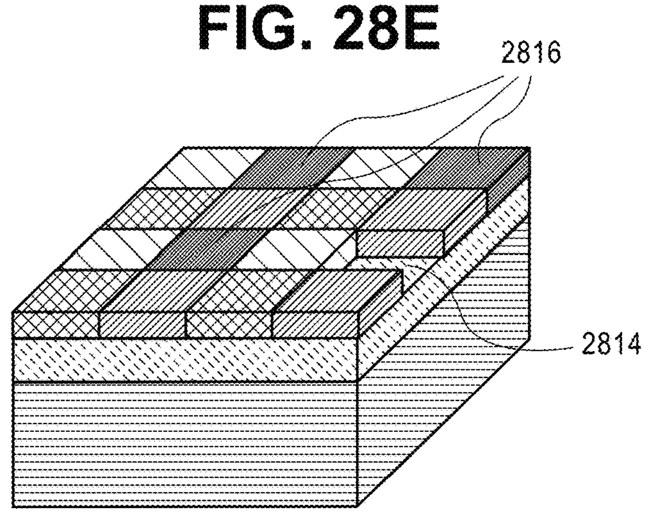
Figure 28G:
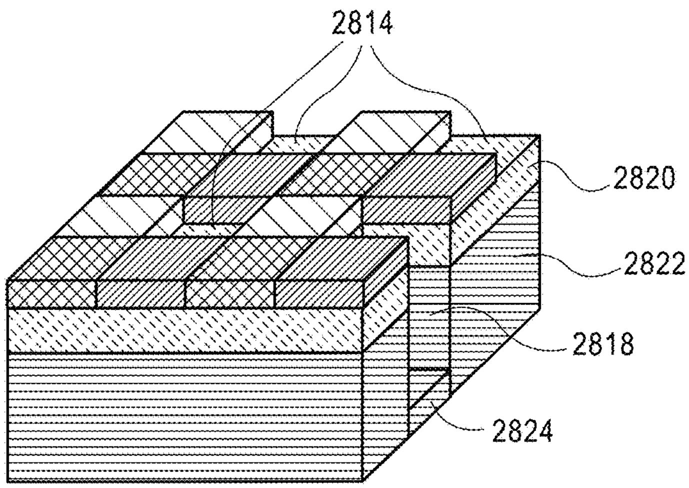
Figure 28H:
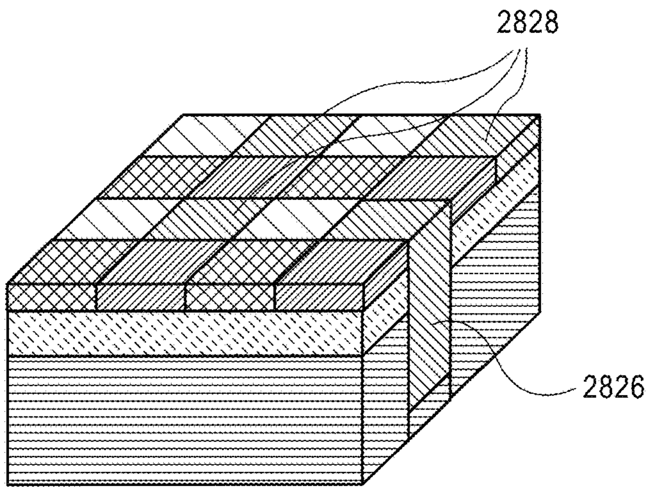
Figure 28I:
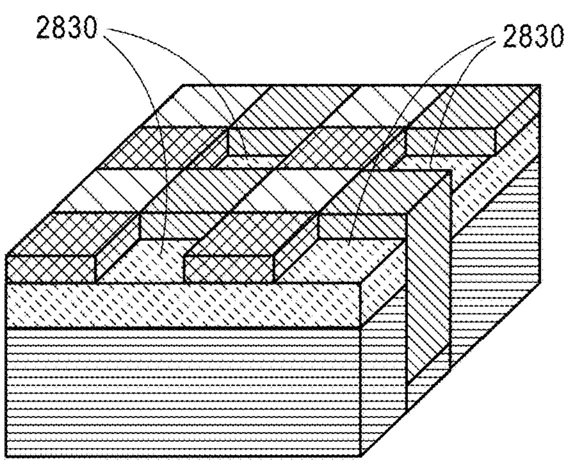
Figure 28J:
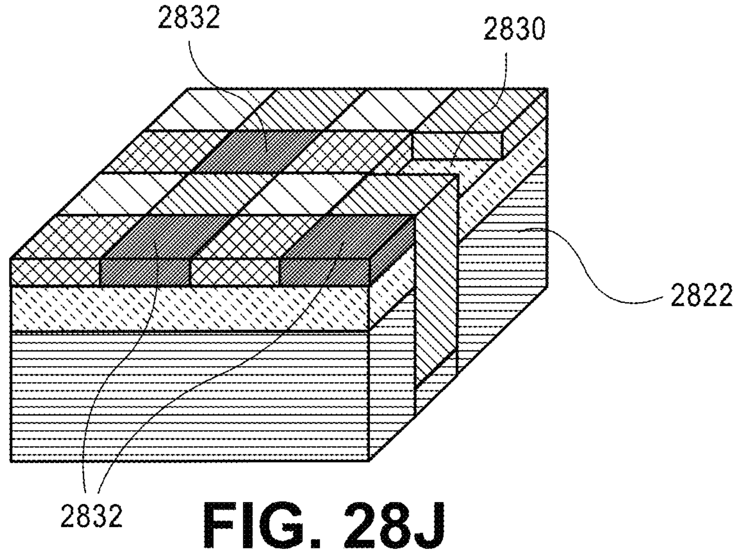
Figure 28K:
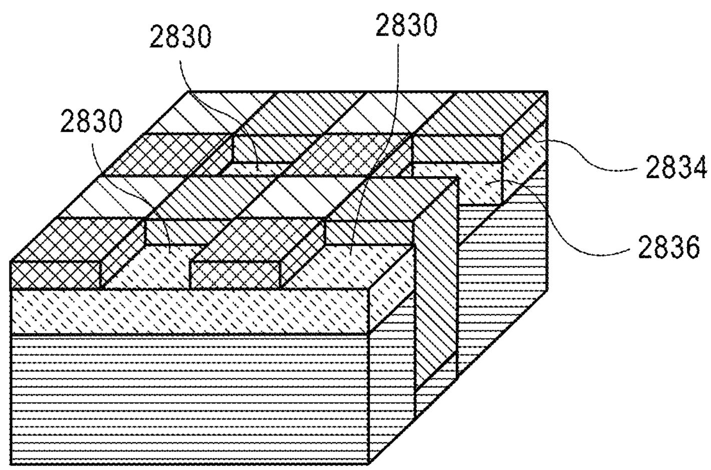
Figure 28L:
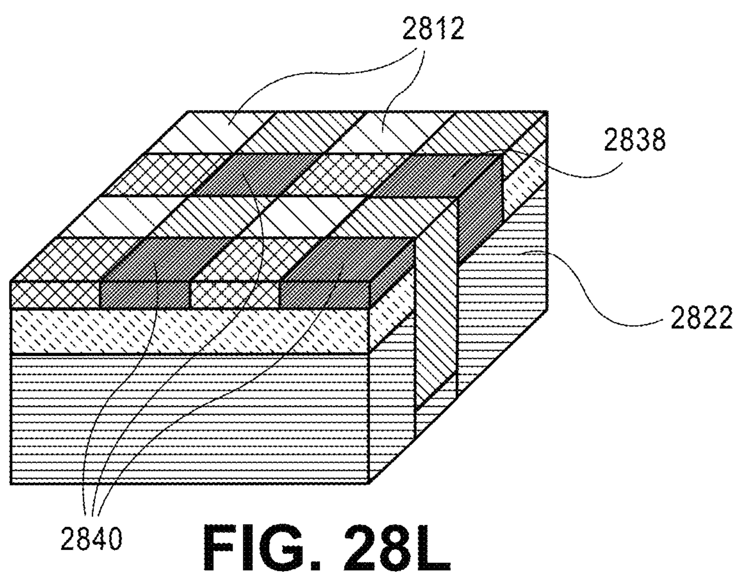
Figure 28M:
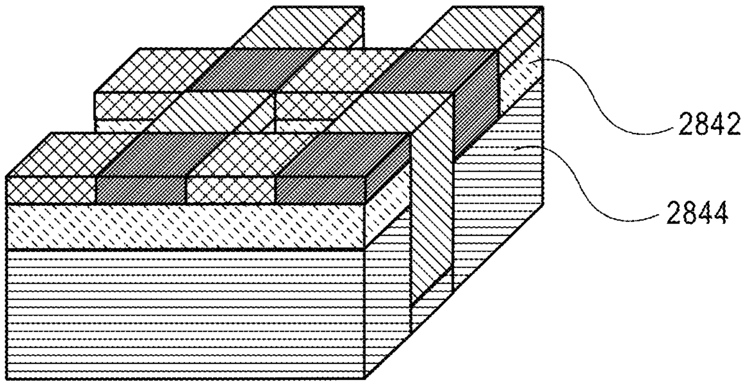
Figure 28N:
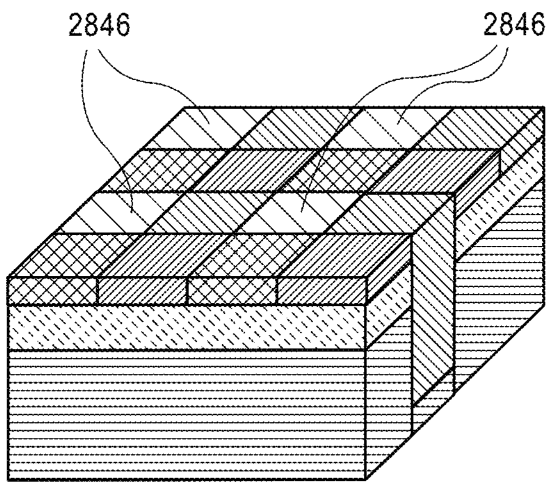
Figure 28O:
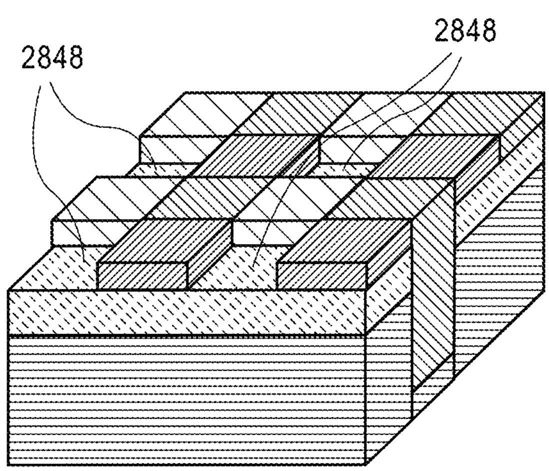
Figure 28P:
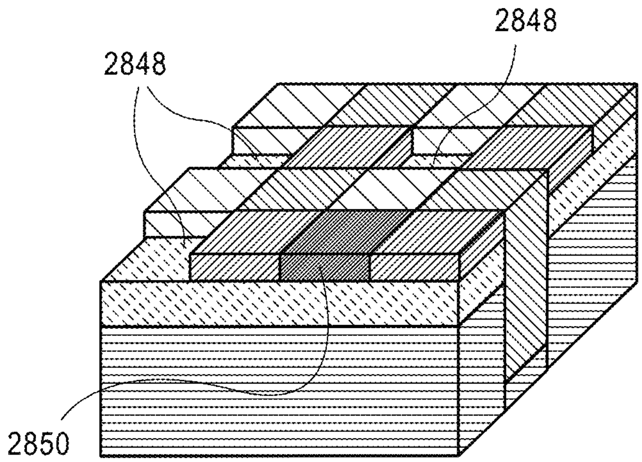
Figure 28Q:
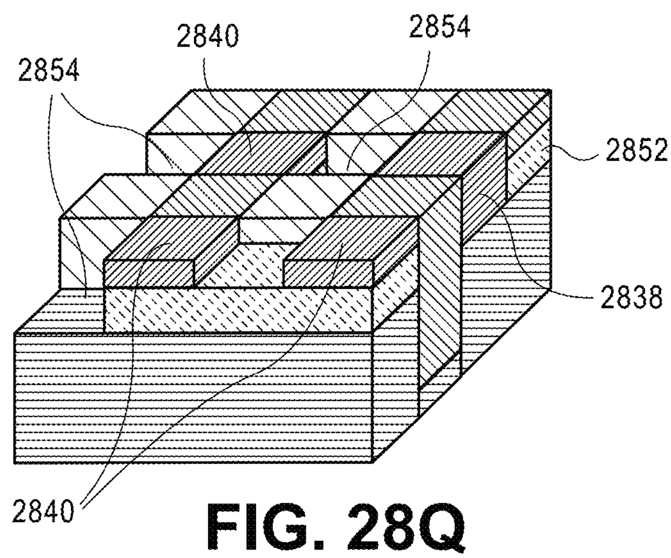
Figure 28R:
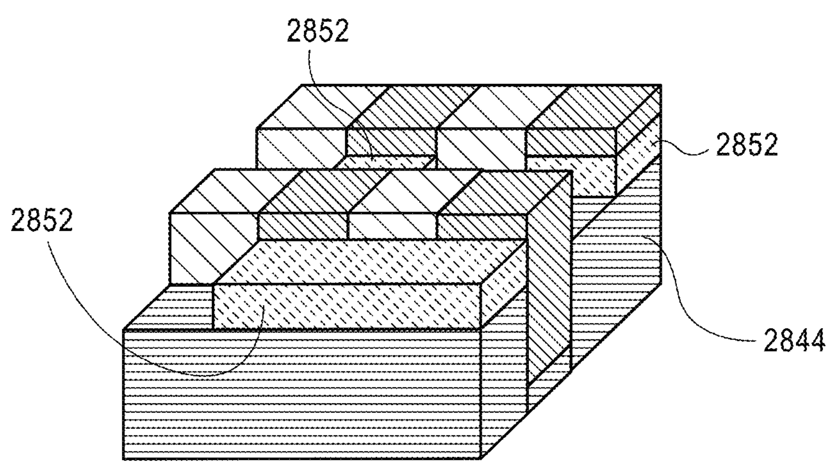
Figure 28S:
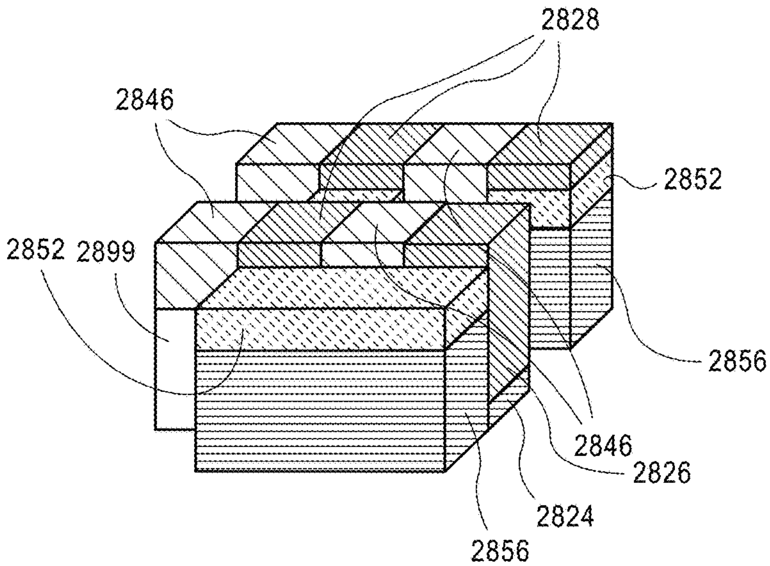
Figure 28T:
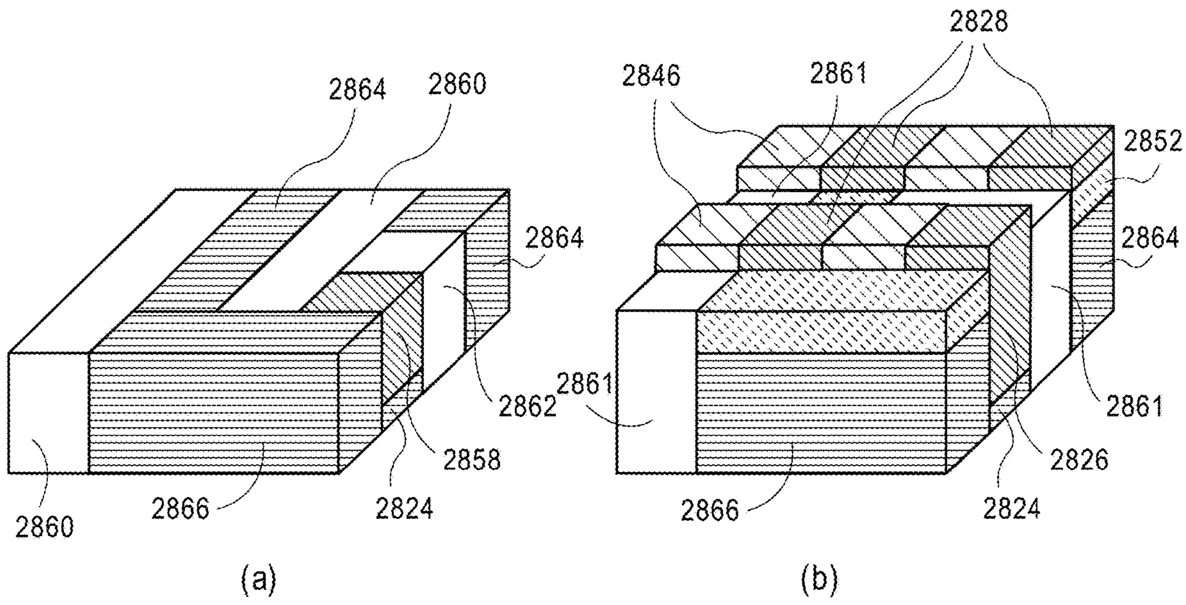

FIGS. 28A-28T illustrate angled cross-sectional views representing various operations in a method of fabricating a back end of line (BEOL) metallization layer having a conductive tab coupling metal lines of the metallization layer, in accordance with an embodiment of the present disclosure.

Referring to FIG. 28A, a grating patterning scheme is performed above a blanket hardmask layer 2802 formed above a metal layer 2800 formed above a substrate (not shown). A first grating hardmask 2804 is formed along a first direction above the blanket hardmask 2802. A second grating hardmask 2806 is formed along the first direction and alternating with the first grating hardmask 2804. In an embodiment, the first grating hardmask 2804 is formed from a material having an etch selectivity different than the material of the second grating hardmask 2806.

In an embodiment, the first and second grating hardmasks 2804 and 2806 are formed with a grating pattern, as is depicted in FIG. 28A. In an embodiment, the grating structure of the first and second grating hardmasks 2804 and 2806 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the first and second grating hardmasks 2804 and 2806 of FIG. 28A may have hardmask lines tightly spaced at a constant pitch and having a constant width.

Referring to FIG. 28B, a sacrificial cross-grating patterning process is performed. An overlying hardmask 2808 is formed with a grating pattern along a second direction, orthogonal to first direction, i.e., orthogonal to the first and second grating hardmasks 2804 and 2806.

In an embodiment, the overlying hardmask 2808 is formed with a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the overlying hardmask 2808 of FIG. 28B may have hardmask lines tightly spaced at a constant pitch and having a constant width.

Referring to FIG. 28C, textile pattern formation is performed. Regions of the first hardmask 2804 exposed between the grating of the overlying hardmask 2808 are selectively etched and replaced with regions of a third hardmask 2810. Regions of the second hardmask 2806 exposed between the grating of the overlying hardmask 2808 are selectively etched and replaced with regions of a fourth hardmask 2812. In an embodiment, the third hardmask 2810 is formed from a material having an etch selectivity different than the material of the first hardmask 2804 and the second hardmask 2806. In a further embodiment, the fourth hardmask 2812 is formed from a material having an etch selectivity different than the material of the first hardmask 2804, the second hardmask 2806, and the third hardmask 2810.

Referring to FIG. 28D, the overlying hardmask 2808 is removed. In an embodiment, the overlying hardmask 2808 is removed using an etch, ash or cleans process selective to the first hardmask 2804, the second hardmask 2806, the third hardmask 2810, and the fourth hardmask 2812 to leave a textile pattern as is illustrated in FIG. 28D.

FIGS. 28E-28H are associated with a via patterning process. Referring to FIG. 28E, the third hardmask 2810 is removed selective to the first hardmask 2804, selective to the second hardmask 2806, and selective to the fourth hardmask 2812 to provide openings 2814 exposing portions of the blanket hardmask 2802. In an embodiment, the third hardmask 2810 is removed selective to the first hardmask 2804, selective to the second hardmask 2806, and selective to the fourth hardmask 2812 using a selective etch or cleans process.

Referring to FIG. 28F, a via photobucket patterning scheme is performed as a first photobucketing process. In an embodiment, photobuckets are formed in all of the exposed openings 2814 of FIG. 28E. Select ones of the photobuckets are removed to re-expose openings 2814 while other photobuckets 2816 are retained, e.g., by not exposing photobuckets 2816 to a lithography and development process used to open all other of the first photobuckets (in the specific case illustrated, three photobuckets are retained while one is removed).

Referring to FIG. 28G, the exposed portion of the blanket hardmask 2802 is then etched to provide first-time patterned hardmask 2820. Additionally, the metal layer 2800 is etched through the opening to provide an etch trench 2818 in a first-time patterned metal layer 2822. The first-time patterned metal layer 2822 includes a conductive via 2824. Subsequent to the subtractive metal etch, the remaining photobuckets 2816 are removed to re-expose associated openings 2814.

Referring to FIG. 28H, the trench 2818 and the openings 2814 are backfilled with a hardmask material. In an embodiment, a material similar to or the same as the material of the third hardmask 2810 is formed on the structure of FIG. 28G and planarized or etched back to provide deep hardmask region 2826 and shallow hardmask region 2828. In one embodiment, deep hardmask region 2826 and shallow hardmask region 2828 are of the third material type (e.g., the material type of third hardmask 2810).

FIGS. 28I-28L are associated with a metal line cut or plug formation patterning process. Referring to FIG. 28I, the first hardmask 2804 is removed selective to the second hardmask 2806, selective to the deep hardmask region 2826 and shallow hardmask region 2828 of the third material type, and selective to the fourth hardmask 2812 to provide openings 2830 exposing portions of the first-time patterned hardmask 2820. In an embodiment, the first hardmask 2804 is removed selective to the second hardmask 2806, selective to the deep hardmask region 2826 and shallow hardmask region 2828 of the third material type, and selective to the fourth hardmask 2812 using a selective etch or cleans process.

Referring to FIG. 28J, a cut or plug photobucket patterning scheme is performed as a second photobucketing process. In an embodiment, photobuckets are formed in all of the exposed openings 2830 of FIG. 28I. Select ones of the photobuckets are removed to re-expose openings 2830 while other photobuckets 2832 are retained, e.g., by not exposing photobuckets 2832 to a lithography and development process used to open all other of the second photobuckets (in the specific case illustrated, three photobuckets are retained while one is removed). The removed photobuckets, at this stage, represent the locations where cuts or plugs will be in a final metallization layer. That is, in the second photobucket process, photobuckets are removed from locations where plugs or cuts will ultimately be formed.

Referring to FIG. 28K, the exposed portion of the first-time patterned hardmask 2820 is then etched to provide second-time patterned hardmask 2834 having a trench 2836 formed therein. Subsequent to the etching, the remaining photobuckets 2832 are removed to re-expose associated openings 2830.

Referring to FIG. 28L, the trench 2834 and the openings 2830 are backfilled with a hardmask material. In an embodiment, a material similar to or the same as the material of the first hardmask 2804 is formed on the structure of FIG. 28K and planarized or etched back to provide deep hardmask region 2838 and shallow hardmask region 2840. In one embodiment, deep hardmask region 2838 and shallow hardmask region 2840 are of the first material type (e.g., the material type of first hardmask 2804).

Referring to FIG. 28M, the fourth hardmask 2812 is removed selective to the deep hardmask region 2838 and shallow hardmask region 2840 of the first material type, selective to the second hardmask 2806, and selective to the deep hardmask region 2826 and shallow hardmask region 2828 of the third material type. In an embodiment, the fourth hardmask 2812 is removed selective to the deep hardmask region 2838 and shallow hardmask region 2840 of the first material type, selective to the second hardmask 2806, and selective to the deep hardmask region 2826 and shallow hardmask region 2828 of the third material type using a selective etch or cleans process. A deep etch process is performed through the resulting openings and entirely through the second-time patterned hardmask 2834 to form third-time patterned hardmask 2842, and entirely through the first-time patterned metal layer 2822 to form second-time patterned metal layer 2844. Although not depicted, at this stage a second cut or plug patterning process may be performed.

Referring to FIG. 28N, the deep openings formed in association with FIG. 28M are backfilled with a hardmask material. In an embodiment, a material similar to or the same as the material of the fourth hardmask 2812 is formed on the structure of FIG. 28M and planarized or etched back to provide deep hardmask regions 2846. In one embodiment, deep hardmask regions 2846 are of the fourth material type (e.g., the material type of fourth hardmask 2812). In an optional embodiment, as illustrated in association with 2899 of FIG. 28S, described below, an ILD layer (such as a low-k dielectric layer) may first be filled and etch back to a level of the second-time patterned metal layer 2844. The hardmask material of the fourth type (i.e., a shallow version of 2846) is then formed on the ILD layer.

FIGS. 28O-28R are associated with a conductive tab formation patterning process. Referring to FIG. 28O, the second hardmask 2806 is removed selective to the deep hardmask region 2838 and shallow hardmask region 2840 of the first material type, selective to the deep hardmask region 2826 and shallow hardmask region 2828 of the third material type, and selective to the deep hardmask regions 2846 of the fourth material type to provide openings 2848 exposing portions of the third-time patterned hardmask 2842. In an embodiment, the second hardmask 2806 is removed selective to the deep hardmask region 2838 and shallow hardmask region 2840 of the first material type, selective to the deep hardmask region 2826 and shallow hardmask region 2828 of the third material type, and selective to the deep hardmask regions 2846 of the fourth material type using a selective etch or cleans process.

Referring to FIG. 28P, a conductive tab photobucket patterning scheme is performed as a third photobucketing process. In an embodiment, photobuckets are formed in all of the exposed openings 2848 of FIG. 28O. Select ones of the photobuckets are removed to re-expose openings 2848 while other photobuckets 2850 are retained, e.g., by not exposing photobuckets 2850 to a lithography and development process used to open all other of the third photobuckets (in the specific case illustrated, one photobucket 2850 is retained while three are removed). The removed photobuckets, at this stage, represent the locations where conductive tabs will not be formed in a final metallization layer. That is, in the third photobucket process, photobuckets 2850 are retained locations where conductive tabs will ultimately be formed.

Referring to FIG. 28Q, the exposed portion of the third-time patterned hardmask 2842 is then etched through openings 2848 to provide fourth-time patterned hardmask 2852 having trenches 2854 formed therein. Subsequent to the etching, the remaining photobucket 2850 is removed.

Referring to FIG. 28R, the deep hardmask region 2838 and shallow hardmask region 2840 of the first material type is removed selective to the deep hardmask region 2826 and shallow hardmask region 2828 of the third material type and selective to the deep hardmask regions 2846 of the fourth material type to further expose portions of the fourth-time patterned hardmask 2852. In an embodiment, the deep hardmask region 2838 and shallow hardmask region 2840 of the first material type is removed selective to the deep hardmask region 2826 and shallow hardmask region 2828 of the third material type and selective to the deep hardmask regions 2846 of the fourth material type using a selective etch or cleans process.

Referring to FIG. 28S, a deep etch process is performed through the resulting openings and entirely through the second-time patterned metal layer 2844 to form third-time patterned metal layer 2856. At this stage, in the case that an ILD layer 2899 is formed at the operation associated with FIG. 28N, as described above in an optional embodiment, portions of such an ILD layer 2899 are viewable in the structure of FIG. 28S.

Referring to part (a) of FIG. 28T, in an embodiment, hardmask removal of remaining hardmask portions 2828, 2846, 2852 of FIG. 28S is performed, and the structure is subsequently planarized. In one embodiment, the height of deep hardmask region 2826 is reduced, but the region is not all together removed, to form via cap 2858 and ILD 2860. Additionally, a plug region 2862 is formed. In one embodiment, ILD 2899 is formed in association with FIG. 28N, and in one such embodiment plug region 2862 includes a material different than ILD 2899. In another embodiment, ILD 2899 is not formed in association with FIG. 28N, and the entire portions of ILD 2860 and plug 2862 are formed at the same time and with a same material, e.g., using an ILD back-fill process. In an embodiment, the metallization portion of the structure includes metal lines 2864, a conductive via 2824 (having via cap 2858 thereon), and a conductive tab 2866, as is depicted in part (a) of FIG. 28T.

Referring to part (a) of FIG. 28T, in an embodiment, an ILD backfill 2861 is formed on the structure of FIG. 28S. In one such embodiment, an ILD film is deposited and then etched back to provide the structure of part (b) of FIG. 28T. In an embodiment, leaving the hardmasks of FIG. 28S in place, templating of a next metallization layer may be performed. That is, the topography with the leave-behind hard masks may be used to template the next layer patterning process.

In either case, whether part (a) or (b) of FIG. 28T, embodiments described herein include a leave-behind hardmask material (2858 or 2826) above a conductive via 2824 of a final metallization layer in a semiconductor structure. Additionally, referring again to FIG. 28A-28T, it is to be appreciated that the order for cut, via, and tab patterning may be interchangeable. Also, while the exemplary process flow shows one cut, one via, and one tab pass, multiple passes of each type of patterning may be performed.

Referring again to part (a) of FIG. 28T, in an embodiment, a back end of line (BEOL) metallization layer for a semiconductor structure includes an inter-layer dielectric (ILD) layer 2860. A plurality of conductive lines 2864 is disposed in the ILD layer 2860 along a first direction. A conductive tab 2866 couples two of the plurality of conductive lines 2864 along a second direction orthogonal to the first direction.

Such an arrangement as depicted in FIG. 28T may not otherwise be achievable by conventional lithographic processing at either small pitch, small width, or both. Also, self-alignment may not be achievable with a conventional processing scheme. Furthermore, arrangements as depicted in FIG. 28T may not otherwise be achievable in cases where a pitch division scheme is used to ultimately provide a pattern for the conductive lines 2864.

In an embodiment, the conductive tab 2866 is continuous, but not contiguous, with the two of the plurality of conductive lines 2864. In an embodiment, the conductive tab 2866 is co-planar with the two of the plurality of conductive lines 2866. In an embodiment, the BEOL metallization layer further includes a plug of dielectric material 2862 disposed at an end of one of the plurality of conductive lines 2866. In one embodiment, the BEOL metallization layer further includes a conductive via.

The structures of FIG. 28T may subsequently be used as a foundation for forming subsequent metal line/via and ILD layers. Alternatively, the structures of FIG. 28T may represent the final metal interconnect layer in an integrated circuit. Referring again to FIG. 28T, such self-aligned fabrication by a subtractive photobucket approach may be continued to fabricate a next metallization layer. Alternatively, other approaches may be used at this stage to provide additional interconnect layers, such as conventional dual or single damascene approaches.

In accordance with an embodiment of the present disclosure, resist tailoring for tolerance of exposure misalignment is described. Resist tailoring may include one or more of an internal quench, a grafted layer quench, or a layer-on-top quench. One or more embodiments described herein are directed to two-stage bake photoresists with releasable quenchers. Applications may be directed toward one or more of extreme ultra-violet (EUV) lithography, general lithography applications, solutions for overlay issues, and general photoresist technologies. In an embodiment, materials are described that are suitable for improving performance of photo-bucket-based approaches. In such an approach, a resist material is confined to a pre-patterned hardmask. Select ones of the photobuckets are then removed using a high-resolution lithography tool, e.g., an EUV lithography tool. Specific embodiments may be implemented to improve uniformity of the resist material response across a given photobucket.

To provide context, one goal in a photobucket approach may be the ability to first diffuse any EUV-released acids across an exposed photobucket to improve the uniformity of the resist response across the selected bucket. In past approaches, this has been achieved by the use of special materials which enable the acid to diffuse across the photobucket at a low enough temperature to avoid a solubility-switch reaction instigated from these acids. However, the action of another resist component, namely the quencher, may prevent such an advantage from being fully realized. In particular, the quencher may neutralize the acids before they are able to diffuse or spread across a given photobucket. Addressing such issues, in accordance with one or more embodiments described herein, a standard quencher is replaced with a quencher that can be released by an ultraviolet (UV) exposure or the like, providing the ability to avoid premature acid neutralization.

More particularly, in accordance with one or more embodiments described herein, a photobucket resist material including a UV-released quencher is implemented to effectively provide a "2-stage PEB" where the effect of EUV exposure is effectively averaged across a given photobucket. Such embodiments may enable a "digital" bucket response, in which the entire photobucket either clears out or does not. In specific embodiments, such a response is more tolerant to edge-placement errors, in which an aerial image does not perfectly align to the photobucket grid.

Figures 29A, 29B, 29C:
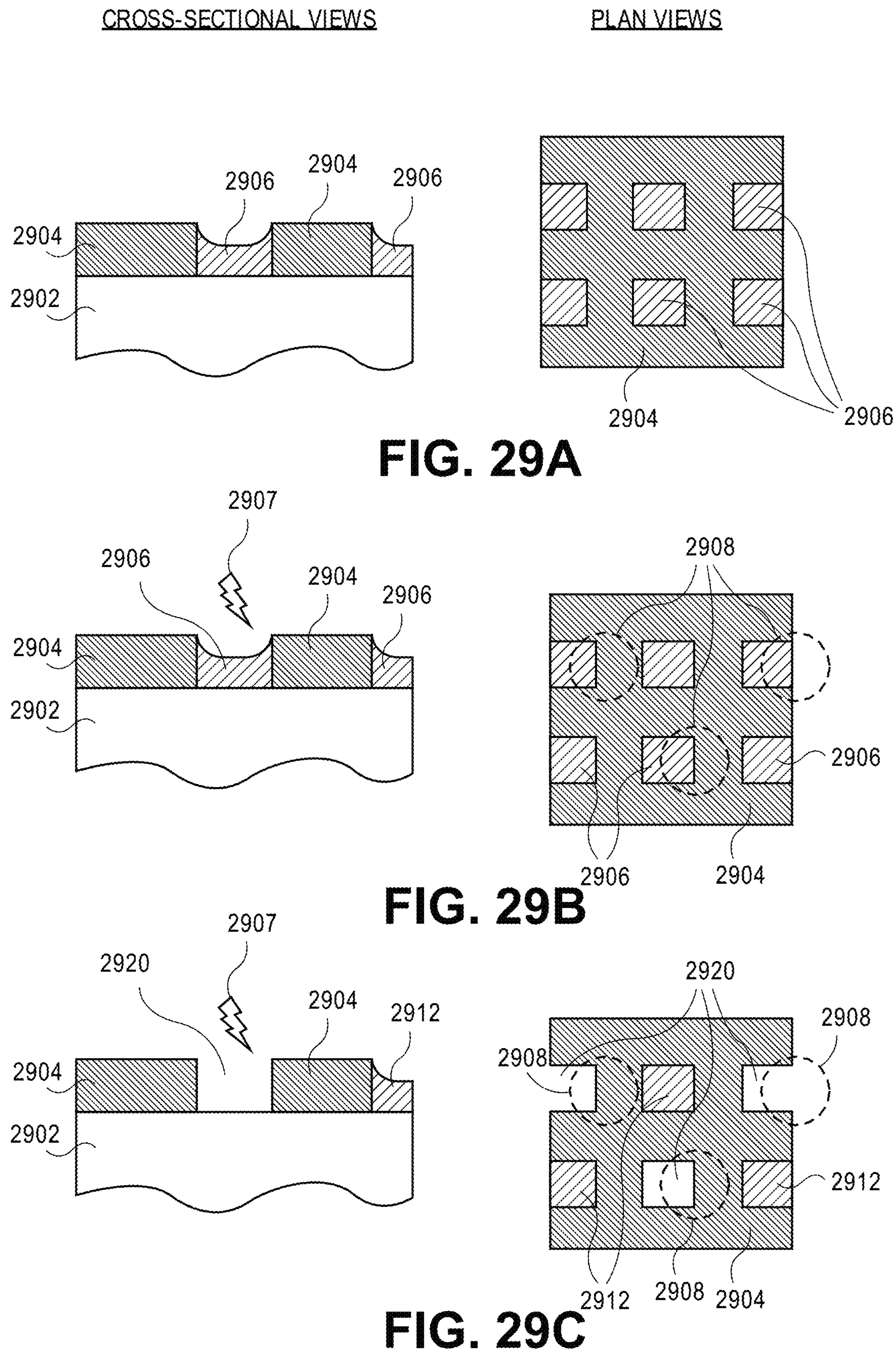
FIGS. 29A-29C illustrates cross-sectional views and corresponding plan views of various operations in a method of patterning using photobuckets including a two-stage bake photoresist, in accordance with an embodiment of the present disclosure.
Figure 29D:
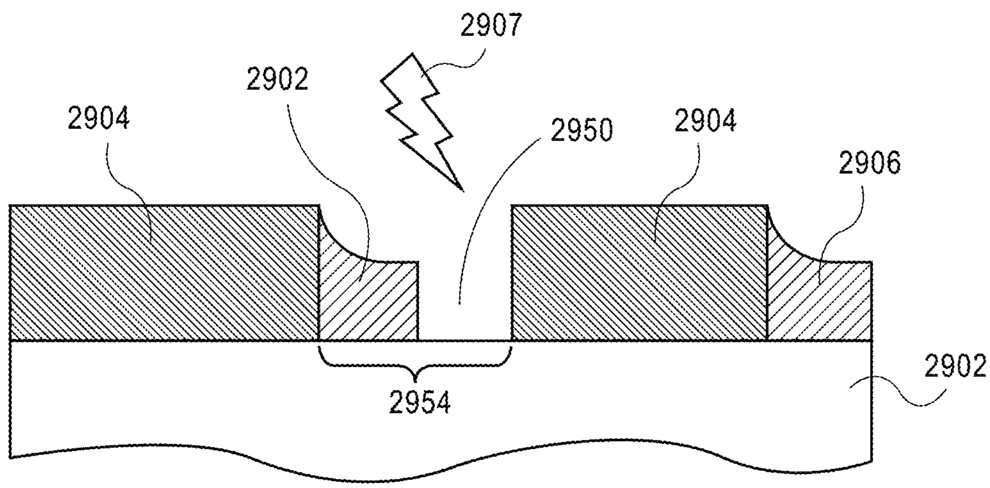
FIG. 29D illustrates a cross-sectional view of a conventional resist photobucket structure following photobucket development after a mis-aligned exposure.

To exemplify one or more of the concepts involved herein, FIGS. 29A-29C illustrates cross-sectional views and corresponding plan views of various operations in a method of patterning using photobuckets including a two-stage bake photoresist, in accordance with an embodiment of the present disclosure.

Referring to FIG. 29A, a pre-patterned hardmask 2904 is disposed above a substrate 2902. The pre-patterned hardmask 2904 has openings filled with a two-stage bake photoresist 2906. The two-stage bake photoresist 2906 is confined to the openings in the pre-patterned hardmask 2904, e.g., to provide a grid of potential via locations.

Referring to FIG. 29B, select ones of the photobuckets are subjected to an exposure 2907 from a lithography tool. The two-stage bake photoresist 2906 is exposed with a lithography tool, e.g., an EUV lithography tool, to select which vias to open. In an embodiment, alignment between the lithography tool and the pre-patterned hardmask 2904 grid is imperfect resulting in an asymmetry of exposure in the target bucket and/or partial exposure in the neighboring bucket. As seen in the plan view, the exposure 2907 is a displaced aerial image 2908.

Referring to FIG. 29C, although the exposure of FIG. 29B may have involved mis-alignment and partial exposure of non-selected photobuckets, only the selected photobuckets are cleared to form openings 2920, leaving unselected photobuckets as closed photobuckets 2912. In one embodiment, the process used to ensure only select photobuckets are ultimately opened, following exposure 2907 of select regions of the two-stage bake photoresist 2906, all of the two-stage bake photoresist 2906 is first baked for acid diffusion. An ultra-violet (UV) quench release is then performed for acid neutralization. A second bake is then performed for a solubility switch, as described in greater detail below. In a specific embodiment, the photoacids released from the first bake operation are diffused throughout the photobucket. The UV flood exposure releases quenchers and then the final solubility-switch bake is performed. The process is elaborated below in association with FIGS. 30A-30E.

As a result, the select locations which receive a greater exposure are ultimately cleared to provide open photobucket locations 2920 following development. The non-selected locations which receive no exposure, or only partial exposure but to a lesser extent in the case of mis-alignment, remain as closed photobucket locations 2912 following development.

To exemplify a contrasting scenario where a conventional photoresist is used, FIG. 1D illustrates a cross-sectional view of a conventional resist photobucket structure following photobucket development after a mis-aligned exposure. A photobucket region 2954 is shown as only partially cleared 2950 with some residual photoresist 2952 remaining. In the case that the photobucket 2954 is a selected photobucket, the misaligned exposure 2907 only partially clears the photobucket, which may lead to subsequent poor quality fabrication of conductive structure in such locations. In the case that the photobucket 2954 is a non-selected photobucket, some unwanted opening 2950 occurs, potentially leading to subsequent formation of conductive structures in unwanted locations.

In a more detailed process description, FIGS. 30A-30E illustrates schematic views of various operations in a method of patterning using photobuckets including a two-stage bake photoresist, in accordance with an embodiment of the present disclosure.

Figure 30A:
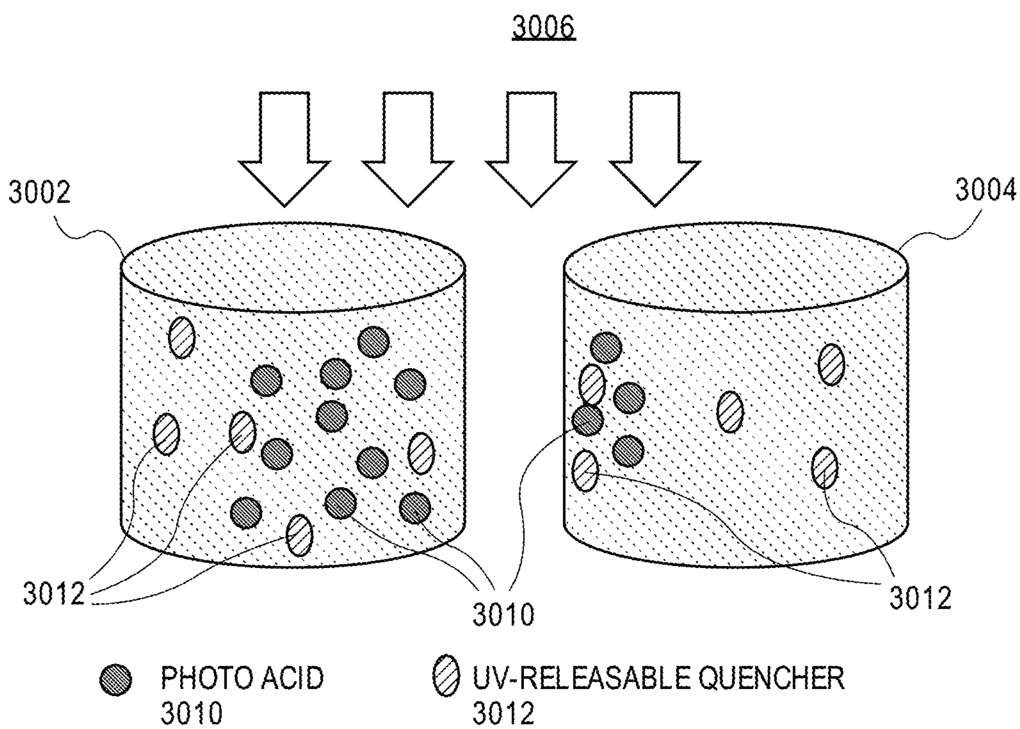
FIGS. 30A-30E illustrates schematic views of various operations in a method of patterning using photobuckets including a two-stage bake photoresist, in accordance with an embodiment of the present disclosure.

Referring to FIG. 30A, first 3002 and second 3004 photobuckets each include a photolyzable composition including an acid-deprotectable photoresist material, a photo-acid-generating (PAG) component 3010, and a photo-base-generating component 3012. A misaligned EUV or e-beam exposure 3006 is performed on a selected photobucket 3002 and a non-selected photobucket 3004, which heavily exposes the selected photobucket 3002 and partially exposes the non-selected photobucket 3004 but to a lesser extent. In a specific embodiment, the photo-base-generating component 3012 is a UV-releasable quencher.

Figure 30B:
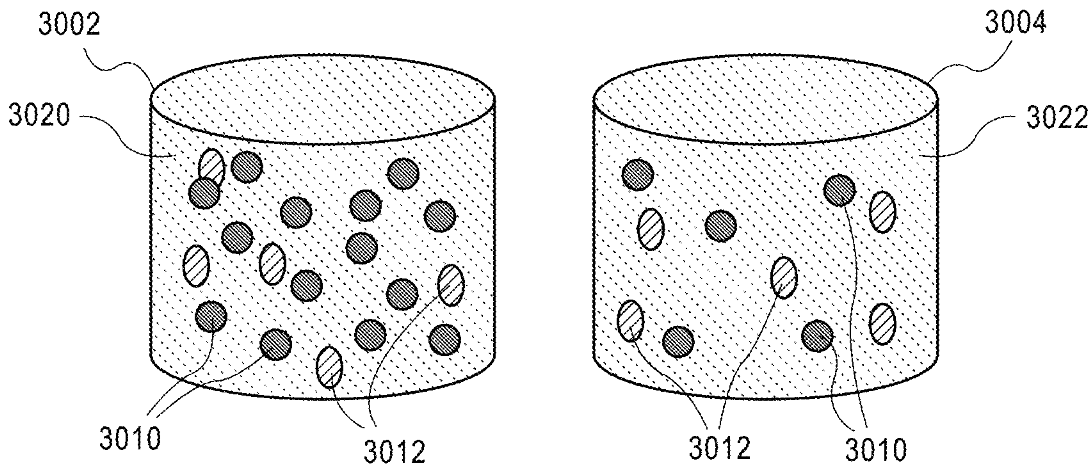

Referring to FIG. 30B, a first bake is performed. In one embodiment, the first bake is performed at a temperature too low to cause a solubility switch. In one such embodiment, the bake is a diffusion only bake leading to diffused materials 3020 and 3022 of photobuckets 3002 and 3004, respectively.

Figure 30C:
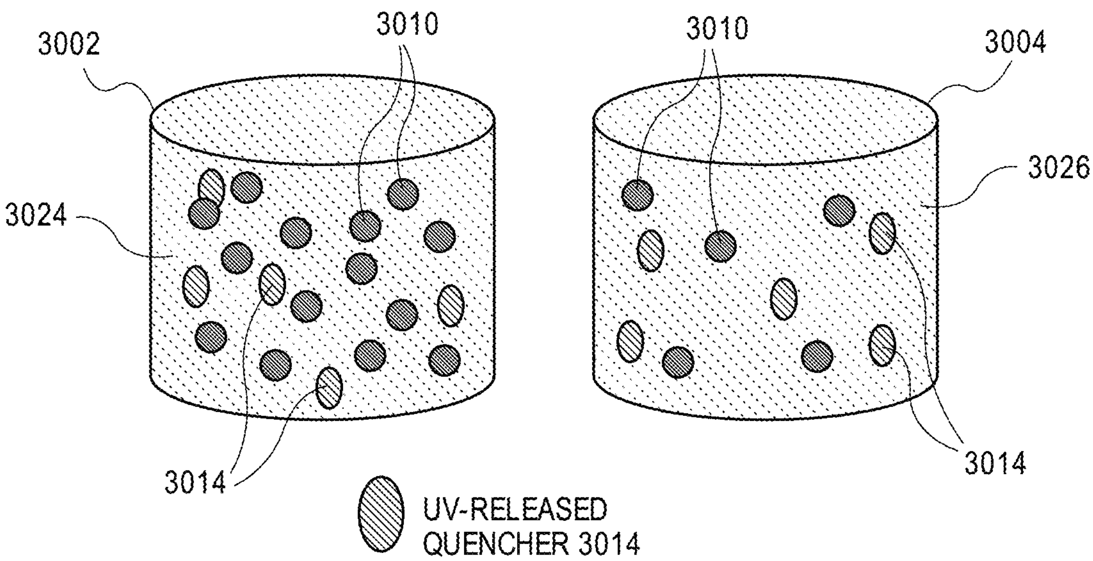

Referring to FIG. 30C, quenchers 3014 are released to form materials 3024 and 3026 for photobuckets 3002 and 3004, respectively. In one embodiment, the quenchers 3014 are UV-released quenchers. In a specific such embodiment, the UV-released quenchers are released by UV flood exposure, e.g., a 365 nm exposure. In an embodiment, the photobuckets 3002 and 3004 are both exposed to the flood exposure to the same extent.

Figure 30D:
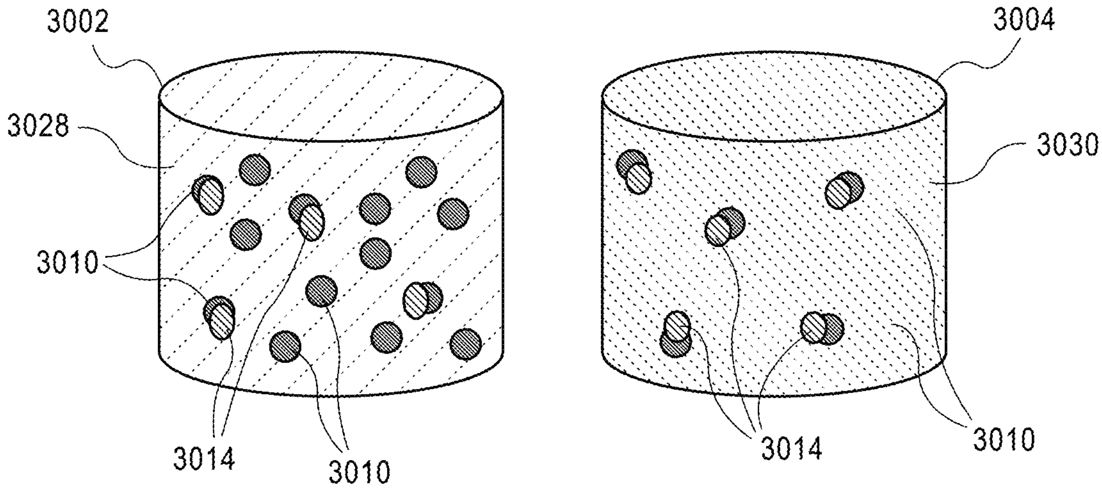

Referring to FIG. 30D, a second bake is performed to provide materials 3028 and 3030 of photobuckets 3002 and 3004, respectively. In an embodiment, the second bake is generates a solubility switch, in which a sub-critical acid concentration quenched. In this manner, there are essentially no local acid concentrations. That is, deprotection of part of an unintended only partially exposed photobucket does not occur.

Figure 30E:
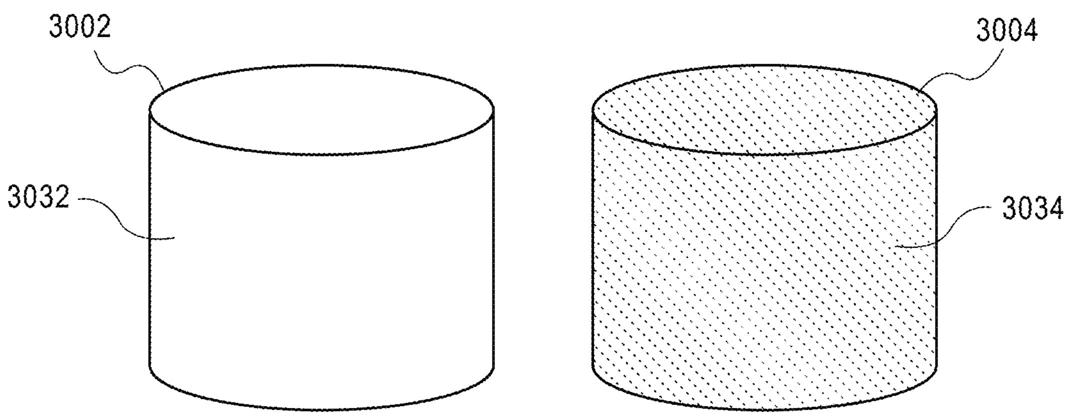

Referring to FIG. 30E, the photobuckets 3002 and 3004 are subjected to a development process. The selected photobucket 3002 is cleared upon development to provide a cleared photobucket 3032. The non-selected photobucket 3004 is not cleared upon development and remains a blocked photobucket 3034. In this way, even in the event of a mis-aligned exposure, a digital photobucket response (open or closed only, without partial open) is achieved.

It is to be appreciated that not all embodiments require a single composition to achieve a two-stage bake photoresist. In a first alternative example, FIGS. 30A' illustrates a schematic view of an operation in another method of patterning using photobuckets, in accordance with an embodiment of the present disclosure. Referring to FIG. 30A', first 3002' and second 3004' photobuckets each include a grafted photo-base-generating component 3050 along a bottom and sidewalls of the first 3002' and second 3004' photobuckets. A photolyzable composition is formed within the grafted photo-base-generating component 3050. The photolyzable composition includes an acid-deprotectable photoresist material and a photo-acid-generating (PAG) component 3010'. An exposure 3006' and multi-stage development process may then performed similar to the above described approaches.

In a second alternative example, FIGS. 30A" illustrates a schematic view of an operation in another method of patterning using photobuckets, in accordance with an embodiment of the present disclosure. Referring to FIG. 30A", first 3002" and second 3004" photobuckets each include a photolyzable composition including an acid-deprotectable photoresist material and a photo-acid-generating (PAG) component 3010". Subsequent to performing a first bake, a layer 3060 including a base-generating component is formed on the first 3002" and second 3004". The photobuckets 3002" and 3004" are then exposed to ultraviolet (UV) radiation. In this case, the base component does not need to be introduced via a photo-base generator, but may rather be deposited in a later process operation, e.g., by vapor deposition of a base layer or exposure to basic atmosphere NMP.

Applications of the above described photoresist compositions and approaches may be implemented for to create regular structures covering all possible via (or plug) locations, followed by selective patterning of only the desired features. To provide further material details, in an embodiment, referring again to FIGS. 30A-30E, photobuckets 3002 and 3004 include photolyzable composition. The photolyzable composition includes an acid-deprotectable photoresist material having substantial transparency at a wavelength. The photolyzable composition also includes a photo-acid-generating (PAG) component having substantial transparency at the wavelength. The photolyzable composition includes a base-generating component having substantial absorptivity at the wavelength. In alternative embodiments, the acid-deprotectable photoresist material is not substantially transparent at the wavelength.

In an embodiment, the base-generating component is one selected from the group consisting of a photo-base-generating component, an electron-base-generating component, a chemical-base-generating component, and a UV-base-generating component. In one embodiment, the base-generating component is a sonication-base-generating component. In an embodiment, the base-generating component is UV-absorbing. In an embodiment, the base-generating component includes a low-energy UV chromophore. In a specific such embodiment, the low-energy UV chromophore is selected from the group consisting of anthracenylcarbamates, naphthalenylcarbamates, 2-nitrophenylcarbamates, arylcarbamates, coumarins, phenylglyoxylic acid, substituted acetophenones and benzophenones. In one embodiment, the low-energy UV chromophore is a photo-released amine. In an embodiment, the base-generating component includes a material selected from the group consisting of N,N-dicyclohexyl-2-nitrophenylcarbamate, N,N-disubstituted carbamates and mono-substituted carbamates.

In an embodiment, the PAG component includes a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate, or other examples containing —SO3 sulfonate anion bound to organic group. In an embodiment, the acid-deprotectable photoresist material is an acid-deprotectable material selected from the group consisting of a polymer, a molecular glass, a carbosilane and a metal oxide. In one embodiment, a metal oxide is used and a release base is not needed. In an embodiment, the acid-deprotectable photoresist material includes a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking.

In an embodiment, the wavelength is approximately 365 nm. In an embodiment, the acid-deprotectable photoresist material is substantially absorbing at a wavelength of approximately 13.5 nanometers. In an embodiment, the acid-deprotectable photoresist material is substantially absorbing at an energy approximately in the range of 5-150 keV. In an embodiment, a molar ratio of the PAG component to the base-generating component is at least 50:1.

Referring again to FIGS. 30A-30E, 30A' and 30A", in accordance with an embodiment of the present disclosure, a method of selecting a photobucket for semiconductor processing includes providing a structure having a first photobucket 3002 neighboring a second photobucket 3004. The structure is exposed to extreme ultraviolet (EUV) or e-beam radiation 3006, where the first photobucket 3002 is exposed to the EUV or e-beam radiation 3006 to a greater extent than the second photobucket 3004. Subsequent to exposing the structure to EUV or e-beam radiation 3006, a first bake of the first and second photobuckets is performed as is described in association with FIG. 30B. Subsequent to performing the first bake, the structure to ultraviolet (UV) radiation, where the first photobucket is exposed to the UV radiation to approximately the same extent as the second photobucket, as is described in association with FIG. 30C. Subsequent to exposing the structure to UV radiation, a second bake of the first and second photobuckets is performed as is described in association with FIG. 30D. Subsequent to performing the second bake, the structure is developed. The developing opens the first photobucket and leaves the second photobucket closed as is described in association with FIG. 30E.

In an embodiment, exposing the structure to extreme ultraviolet (EUV) or e-beam radiation includes exposing the structure to energy having a wavelength approximately 13.5 nanometers. In another embodiment, exposing the structure to extreme ultraviolet (EUV) or e-beam radiation includes exposing the structure to energy in the range of 5-150 keV. In an embodiment, exposing the structure to UV radiation includes exposing the structure to energy having a wavelength approximately 365 nanometers. In an embodiment, the first bake is performed at a temperature approximately in the range of 50-120 degrees Celsius for a duration of approximately in the range of 0.5-5 minutes. In an embodiment, the second bake is performed at a temperature approximately in the range of 100-180 degrees Celsius for a duration of approximately in the range of 0.5-5 minutes.

In an embodiment, referring specifically to FIG. 30A, the first and second photobuckets each include a photolyzable composition including an acid-deprotectable photoresist material, a photo-acid-generating (PAG) component, and a photo-base-generating component. In one such embodiment, exposing the structure to extreme ultraviolet (EUV) or e-beam radiation includes activating the PAG component. The first bake diffuses acid formed from activating the PAG component throughout the first and second photobuckets. Exposing the structure to UV radiation includes activating the photo-base-generating component. The second bake quenches a total amount of acid formed in the second photobucket with base generated from the photo-base-generating component but does not quench a total amount of acid formed in the first photobucket.

In another embodiment, referring specifically to FIG. 30A', the first and second photobuckets each include a grafted photo-base-generating component along a bottom and sidewalls of the first and second photobuckets and a photolyzable composition formed within the grafted photo-base-generating component. The photolyzable composition includes an acid-deprotectable photoresist material and a photo-acid-generating (PAG) component. In one such embodiment, exposing the structure to extreme ultraviolet (EUV) or e-beam radiation includes activating the PAG component. The first bake diffuses acid formed from activating the PAG component throughout the first and second photobuckets. Exposing the structure to UV radiation includes activating the grafted photo-base-generating component. The second bake quenches a total amount of acid formed in the second photobucket with base generated from the photo-base-generating component but does not quench a total amount of acid formed in the first photobucket.

In another embodiment, referring specifically to FIG. 30A", the first and second photobuckets each include a photolyzable composition including an acid-deprotectable photoresist material and a photo-acid-generating (PAG) component. The method further includes, subsequent to performing the first bake and prior to exposing the structure to ultraviolet (UV) radiation, forming a layer including a base-generating component on the first and second photo-buckets. In one such embodiment, exposing the structure to extreme ultraviolet (EUV) or e-beam radiation includes activating the PAG component. The first bake diffuses acid formed from activating the PAG component throughout the first and second photobuckets. Exposing the structure to UV radiation includes activating the base-generating component. The second bake quenches a total amount of acid formed in the second photobucket with base generated from the base-generating component but does not quench a total amount of acid formed in the first photobucket.

In any of the above described cases, in an embodiment, developing the structure includes, in the case of positive tone development, immersion or coating with standard aqueous TMAH developer (e.g., in a concentration range from 0.1M-1M) or other aqueous or alcoholic developer based on tetraalkylammonium hydroxides for 30-120 seconds followed by rinse with DI water. In another embodiment, in the case of negative tone development, developing the structure includes immersion or coating with organic solvents such as cyclohexanone, 2-heptanone, propylene glycol methylethyl acetate or others followed by rinse with another organic solvent such as hexane, heptane, cyclohexane or the like.

In an exemplary embodiment, approaches described above build on approaches using so-called photobuckets, in which every possible feature, e.g. via, is pre-patterned into a substrate. Then, a photoresist is filled into patterned features and the lithography operation is merely used to choose select vias for via opening formation. In a particular embodiment, a lithography operation is used to define a relatively large hole above a plurality of photobuckets that include a two-stage bake photoresist, as described above. The two-stage bake photoresist photobucket approach allows for larger critical dimensions (CD)s and/or errors in overlay while retaining the ability to choose the via of interest.

In accordance with an embodiment of the present disclosure, image tone reversal of resist, e.g., for photobuckets, is described. One or more embodiments described herein are directed to a class of materials with special properties to enable pattern reversal (e.g., holes reversed to posts), and related processing approaches and the structures resulting there from. The class of materials may be a class of soft materials, e.g., photoresist-like materials. As a general approach, a resist-like material is deposited in a pre-patterned hardmask. The resist-like material may then be selected out with a high-resolution lithography tool, e.g., an extreme ultra-violet (EUV) processing tool. On the other hand, resist-like material may instead be left to remain permanently in a finally fabricated structure, e.g., as an inter-layer dielectric (ILD) material or structure (“plugs”) that form breaks between metal lines. Overlay (edge placement) problems anticipated for next generation plug patterning may be addressed by one or more approaches described herein.

More specifically, one or more embodiments described herein are directed to use of a spin-on dielectric (e.g., ILD) with particular properties that enable the filling of holes (“buckets”) in a patterned photoresist layer without destroying the photoresist layer pattern. First, the spin-on dielectric material is introduced in a solvent which does not dissolve or cause intermixing of the photoresist and the dielectric material. It is to be appreciated that good fillability of holes is required. Initial cross-linking (or setting) of the spin-on dielectric film is accomplished under conditions where the photoresist and spin-on dielectric do not intermix and lose pattern information. Once the pattern is reversed, the material within the bucket is then converted through baking/curing to a dielectric with desired properties such as k-value, modulus, etch selectivity etc. Although not limited to such material, a spin-on dielectric material based on a 1,3,5-trisilacyclohexane building block may be implemented to satisfy the above criteria. Cross-linking with loss of solubility of such a material (or other silicon based dielectrics) can be initiated either thermally, or at lower temperatures, by use of acid, base or Lewis acid catalyst processes. In one embodiment, such low temperature catalysis is critical for the implementation of approaches described herein.

In an embodiment, approaches described herein involves taking a best imaging performance (e.g., which comes from positive tone materials) in order to produce a negative-tone pattern, where the final film possesses sought after material properties. The final material properties may be akin to those of a high performance low-k dielectric/ILD material). By contrast, state-of the art options for direct patterning of dielectric films are limited and not expected to exhibit the necessary lithographic performance to be manufacturable for future scaled down technology generations.

As described in greater detail below in association with FIGS. 31 and 32A-32H, in accordance with embodiments described herein, trenches pre-patterned in an ILD material are filled with chemically amplified photoresist. Using high resolution lithography (e.g., EUV), selected holes within the trenches are exposed and removed via conventional positive tone processing. At this stage, the empty holes are treated with a pre-catalyst layer. In one such embodiment, the pre-catalyst layer is a self-assembled monolayer (SAM)-containing attached catalyst layer. The resulting decorated holes are then filled with dielectric precursor, with accompanying overburden. The localization (or close proximity) of the catalyst in the holes leads to selective cross-linking and setting of the dielectric in the holes only. Overburden and photoresist are removed followed by final curing of dielectric (if needed) and metallization processes.

In accordance with an embodiment of the present disclosure, a key feature of approaches described herein involves the accommodation of varying pattern density with varying thickness of overburden. In one embodiment, such accommodation is enabled since cross-linking only occurs in/near the hole and an overburden ultimately removed by planarization (e.g., by chemical mechanical polishing). In an embodiment, selective cross-linking of a dielectric material in a hole is effected without effecting the same in regions of overburden. In a particular embodiment, following positive tone lithographic patterning and development, a hydrophilic Si—OH terminated surface is exposed in the holes and anywhere photoresist has been removed. The hydrophilic surface may be present prior to photoresist coating or created during, e.g., tetramethylammonium hydroxide (TMAH) development or subsequent rinses. It is to be appreciated that photoresist that has not been exposed and developed will maintain characteristic mildly or strongly hydrophobic nature and, thus, the patterning process effectively creates hydrophilic and hydrophobic domains.

In an embodiment, the exposed hydrophilic surface is functionalized with a surface grafting agent which carries either catalyst or pre-catalyst needed to cross-link a dielectric material. Subsequent coating of dielectric leads to the filling of holes with overburden, as described above, and as illustrated in greater detail below. Upon activation and controlled diffusion of pre-catalyst with, e.g., a low temperature bake, the dielectric material is selectively cross-linked in the hole with minimal cross-linking occurring in the overburden, i.e., directly above the hole. The overburden dielectric material can then be removed using casting solvent or dissolution in another solvent. It is to be appreciated that the removal process may also remove photoresist, or photoresist can be removed with another solvent or by an ashing process. In an embodiment, with the tone reversed, the dielectric material may be baked/cured at a relatively higher temperature prior to metallization or other processing.

In accordance with one or more embodiments described herein, there are several approaches for installing catalyst or pre-catalyst in a hole. For some dielectric materials, strong Bronsted acids are required. In other cases, strong Lewis acids may be employed. For ease of description herein, the term "acid" is used to refer to both scenarios. In an embodiment, direct adsorption of catalyst or pre-catalyst is employed. In this scenario, the catalyst is coated onto a hydrophilic surface and held strongly via H-bonding or other electrostatic interaction. Subsequent coating of a dielectric material leads to acid and dielectric precursor localized in the hole, where thermal or other activation initiates desired cross-linking chemistry. In an exemplary embodiment, the reaction of an Si—OH rich surface with the strong Lewis acid $B(C_6F_5)_3$ leading to formation of $Si—O—B(C_6F_5)_3H^+$. This resulting Lewis acid is used to catalyze cross-linking of hydrosilane precursor molecules at relatively lower temperature than non-catalyzed processes. In one embodiment, the large size of the catalyst employed minimizes diffusion into the overburden regions.

In another embodiment, approaches involve covalent adhesion of a catalyst or pre-catalyst via silane chemistries such as chloro-, alkoxy-, and amino silanes or other surface grafting groups that may include siloxanes, silyl chlorides, alkenes, alkynes, amines, phosphines, thiols, phosphonic acids or carboxylic acids. In this scenario, a catalyst or precatalyst is covalently linked to a grafting agent. For example, well-known acid generators (e.g., photo- or thermal) based on onium salts can be attached to siloxanes (e.g. $[(MeO)_3Si—CH_2CH_2CH_2SR_2][X]$, where R=alkyl or aryl groups and X=weakly coordinating anions such as triflate, nonaflate, $H—B(C_6F_5)_3$, $BF_4$, etc.). The catalyst or pre-catalyst can be either selectively attached to the ILD of interest, or selectively removed from the resist using thermal, dry etch, or wet etch processes. In yet another embodiment, the catalyst or pre-catalyst is introduced prior to photoresist coating using similar techniques. In this scenario, to be effective, the grafted material must not interfere with lithography and must survive subsequent processing.

Figure 31:
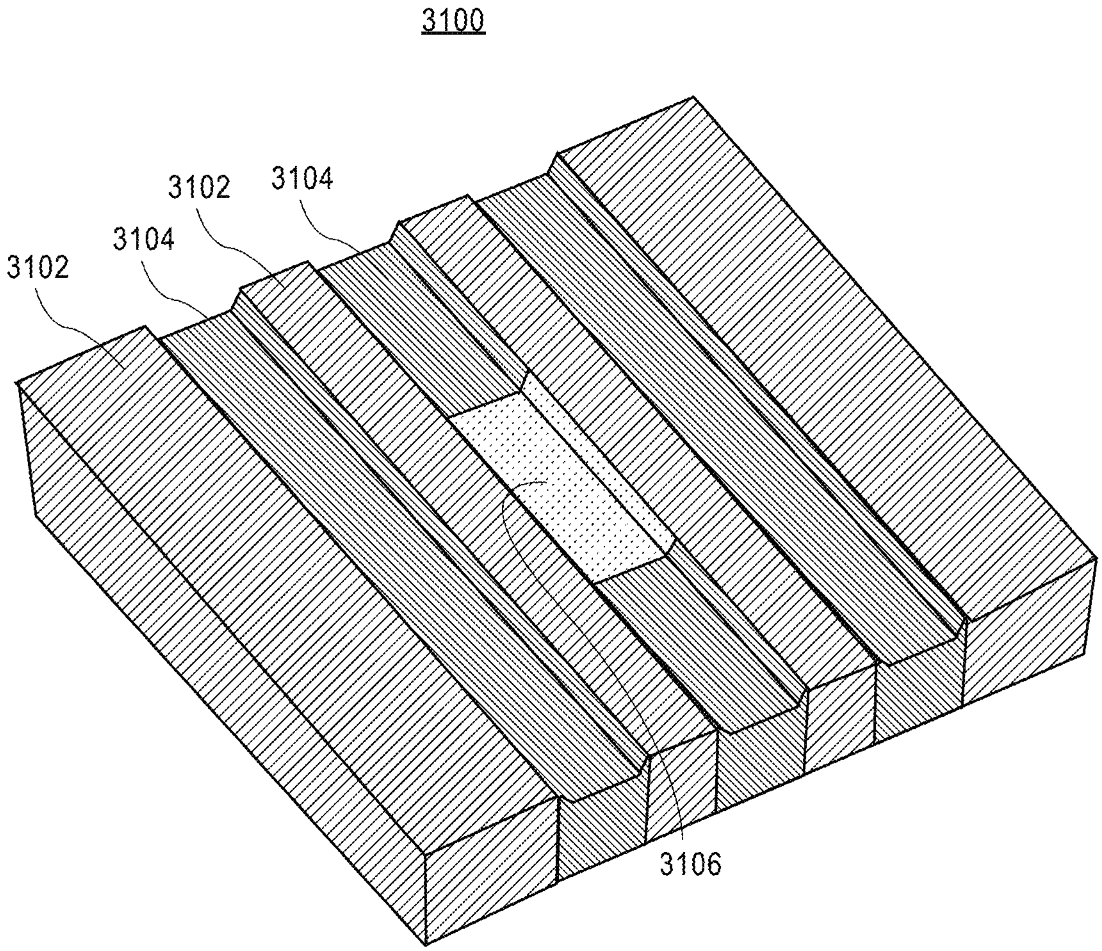
FIG. 31 illustrates an angled view of an alternating pattern of inter-layer dielectric (ILD) lines and resist lines, with a hole formed in one of the resist lines, in accordance with an embodiment of the present disclosure.

As an exemplary vehicle for demonstrating the concepts described herein, FIG. 31 illustrates an angled view of an alternating pattern of inter-layer dielectric (ILD) lines and resist lines, with a hole formed in one of the resist lines, in accordance with an embodiment of the present disclosure. Referring to FIG. 31, a pattern 3100 includes alternating ILD lines 3102 and resist lines 3104. A hole 3106 is formed in one of the resist lines 3104, e.g., by conventional lithography. As described below, in association with FIGS. 32A-32H, a pattern such as the pattern 3100 can be subjected to tone reversal.

In an exemplary process flow, FIGS. 32A-32H illustrate cross-sectional views in a fabrication process involving image tone-reversal with a dielectric using bottom-up cross-linking, in accordance with an embodiment of the present disclosure.

Figure 32A:
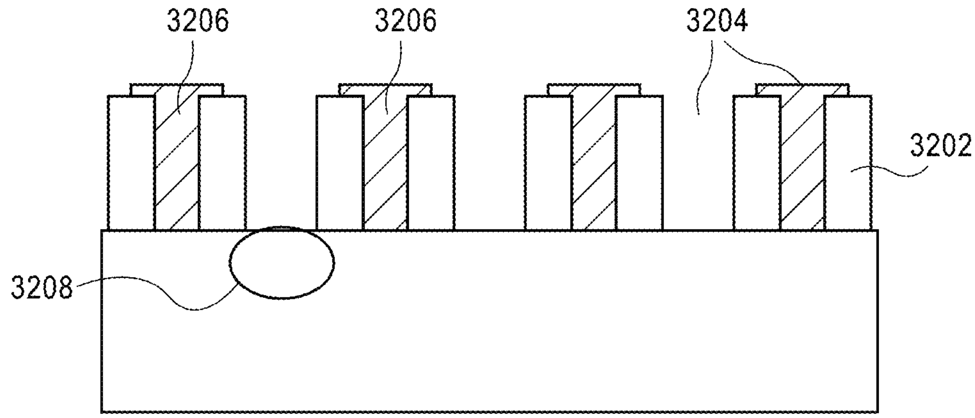
FIGS. 32A-32H illustrate cross-sectional views in a fabrication process involving image tone-reversal with a dielectric using bottom-up cross-linking, in accordance with an embodiment of the present disclosure.

FIG. 32A illustrates a cross-sectional view of a starting structure following pre-patterning of trenches 3204 in an ILD material 3202. Select ones of the trenches 3204 are filled with a chemically amplified photoresist 3206, while others have been processed to provide unfilled trenches (or unfilled trench portions, as shown in FIG. 31). For example, in one embodiment, using high resolution lithography (e.g., extreme ultra-violet (EUV) lithography), selected holes within the trenches 3204 are exposed and removed via conventional positive tone processing.

Although not depicted for simplicity, it is to be appreciated that the unfilled trenches (or holes formed within filled trenches) may expose underlying features, such as underlying metal lines, in region 3208. Furthermore, in an embodiment, the starting structure may be patterned in a grating-like pattern with trenches spaced at a constant pitch and having a constant width. The pattern, for example, may be fabricated by a pitch halving or pitch quartering approach. Some of the trenches may be associated with underlying vias or lower level metallization lines.

Figure 32B:
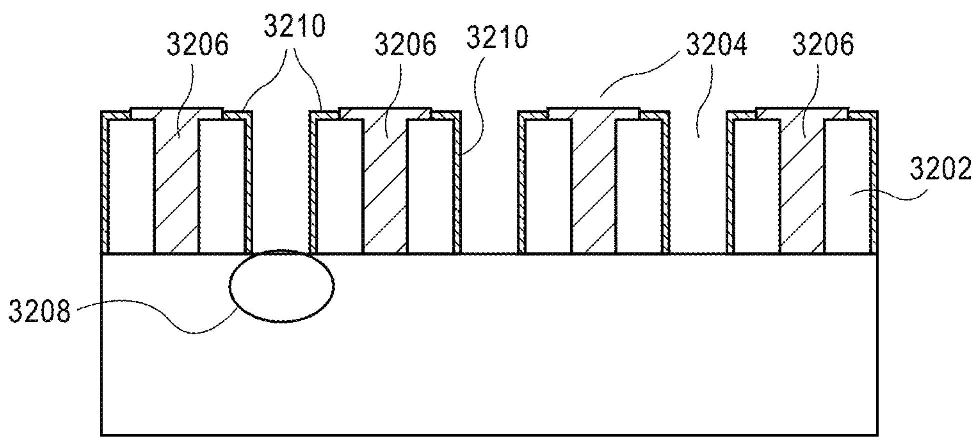

FIG. 32B illustrates a cross-sectional view of the structure of FIG. 32A following treatment of the empty trenches or holes with a pre-catalyst layer 3210 which, in one embodiment, is a self-assembled monolayer (SAM)-containing catalyst material. In one such embodiment, as depicted, the pre-catalyst layer 3210 is formed on exposed portions of the ILD 3202, but not on exposed portions of the resist 3206 or any exposed metal such as at regions 3208. In an embodiment, the pre-catalyst layer 3210 is formed by exposing the structure of FIG. 32A to pre-catalyst-forming molecules in the vapor phase, or molecules dissolved in solvent. In one embodiment, the pre-catalyst layer is a layer of catalyst or pre-catalyst formed by direct adsorption, as described above. In another embodiment, the pre-catalyst layer 3210 is a layer of catalyst or pre-catalyst formed by covalent adhesion.

Figure 32C:
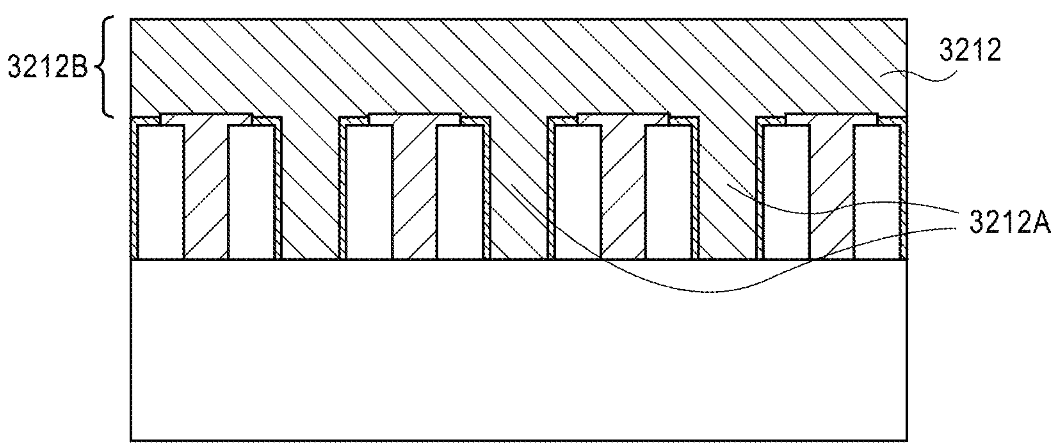

FIG. 32C illustrates a cross-sectional view of the structure of FIG. 32B following filling of the resulting decorated holes with a dielectric material 3212. It is to be appreciated that the dielectric material 3212 has a portion 3212A filling the trenches or holed and a portion 3212B above the trenches or holes. The portions 3212B is referred to herein as overburden. In one embodiment, the dielectric material 3212 is a spin-on dielectric material.

In an embodiment, the dielectric material 3212 is selected from a class of materials based on hydrosilane precursor molecules, where catalyst mediates reaction of Si—H bonds with cross-linkers such as water, tetraethoxyorthosilicate (TEOS), hexaethoxytrisilacyclohexane or similar multifunctional cross-linkers. In one such embodiment, the dielectric material 3212 includes trisilacyclohexanes which may subsequently be linked together by O groups. In other embodiments, alkoxy silane based dielectric precursors or silsesquioxane (SSQ) are used for the dielectric material 3212.

Figure 32D:
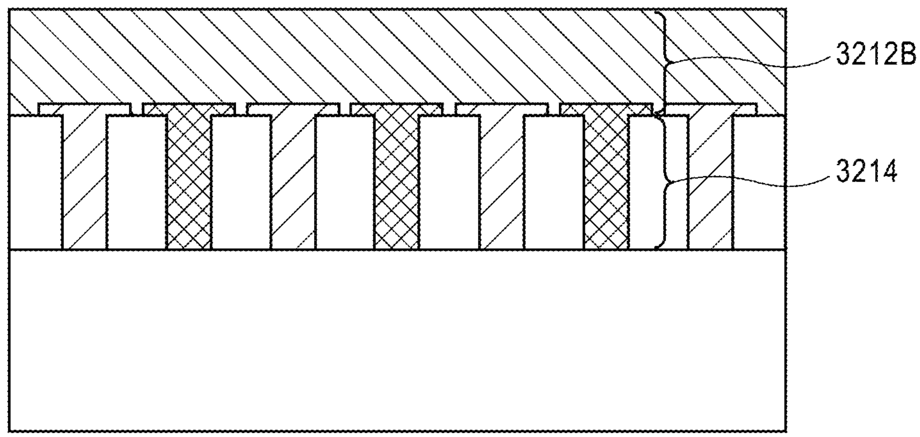

FIG. 32D illustrates a cross-sectional view of the structure of FIG. 32C following cross-linking of the portions 3212A of the dielectric material 3212. In an embodiment, the localization (or close proximity) of the catalyst (e.g., pre-catalyst layer 3210) in the unfilled trenches or holes leads to selective cross-linking to form cross-linked regions 3214 and setting of the portions 3212A of the dielectric material 3212 in the holes only. That is, in an embodiment, the portions 3212B of the dielectric material 3212 are not cross-linked. In an embodiment, the cross-linking used to form regions 3214 is effected by a thermal curing process, i.e., by heating.

Figure 33A:
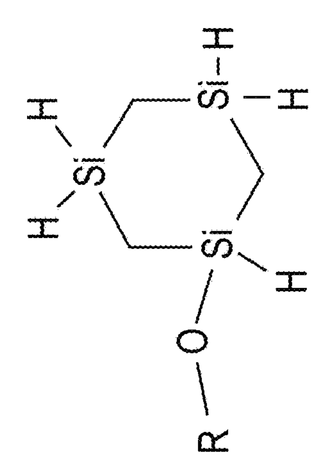
FIG. 33A illustrates a trisilacyclohexane molecule, in accordance with an embodiment of the present disclosure.
Figure 33B:
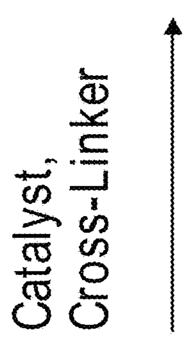
FIG. 33B illustrates two cross-linked (XL) trisilacyclohexane molecules to form a cross-linked material, in accordance with an embodiment of the present disclosure.
Figure 33B:
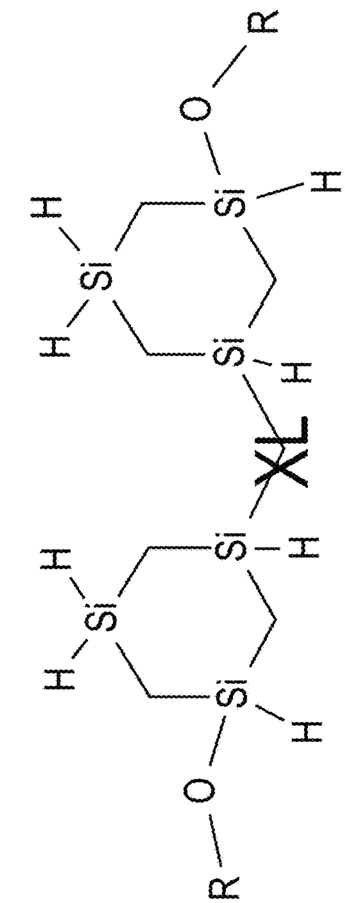
Figure 33C:
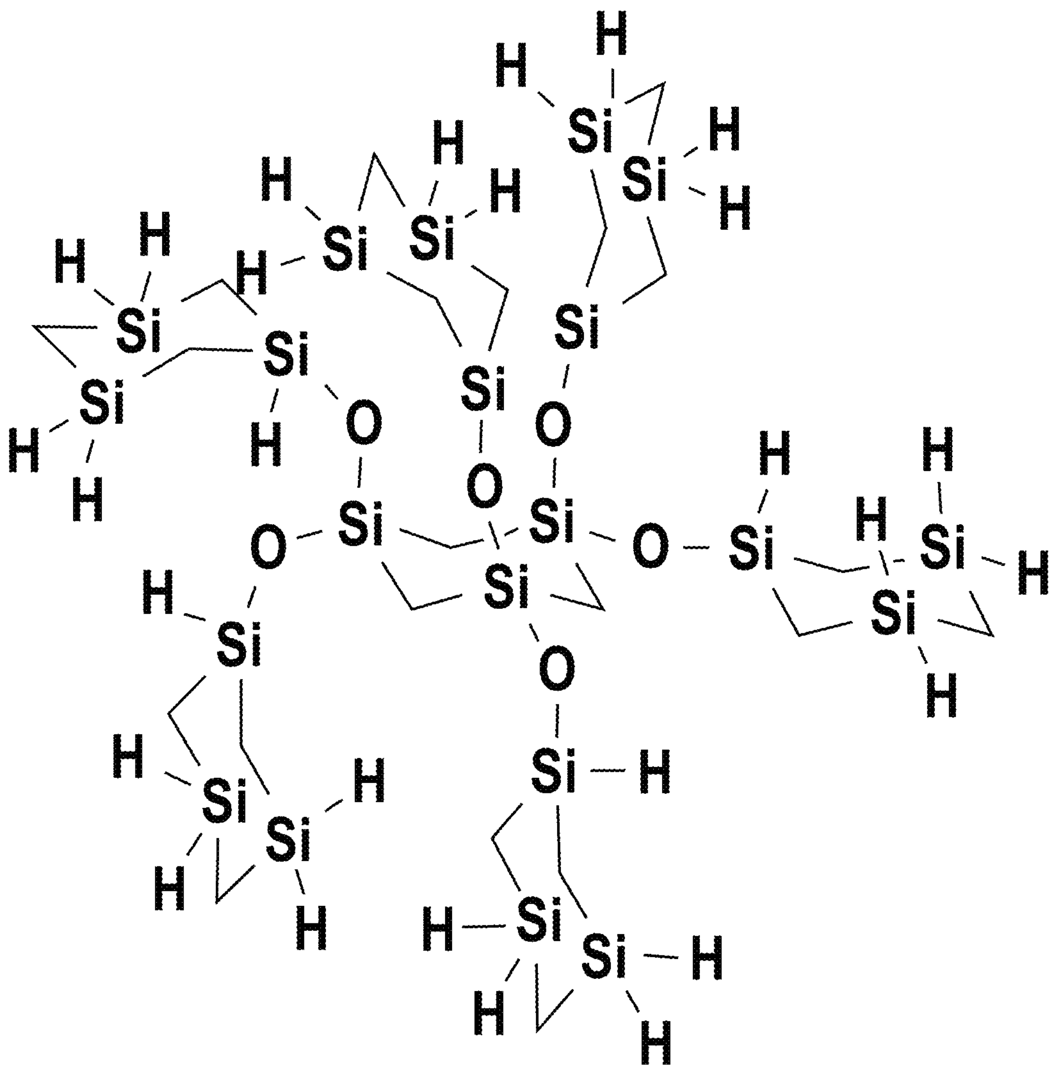
FIG. 33C illustrates an idealized representation of a linked trisilacyclohexane structure, in accordance with an embodiment of the present disclosure.

In an embodiment, the dielectric material 3212 includes trisilacyclohexanes and the cross-linking used to form regions 3214 incudes linking trisilacyclohexanes together by O groups. Referring to FIG. 33A, a trisilacyclohexane 3300 is illustrated. Referring to FIG. 33B, two cross-linked (XL) trisilacyclohexane molecules 3300 form a cross-linked material 3320. FIG. 33C illustrates an idealized representation of a linked trisilacyclohexane structure 3340. It is to be appreciated that, in reality, structure 3340 is used to represent a complex mix of oligomers, but the common point is the H-capped trisilacyclohexane rings.

Figure 32E:
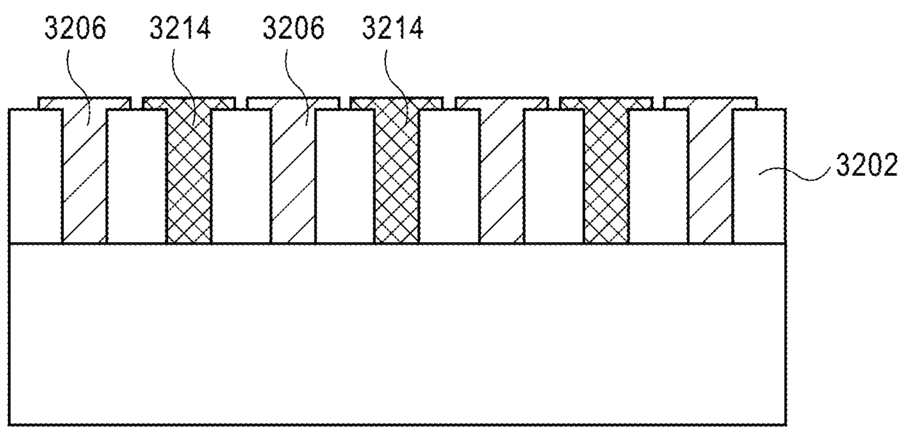
Figure 32F:
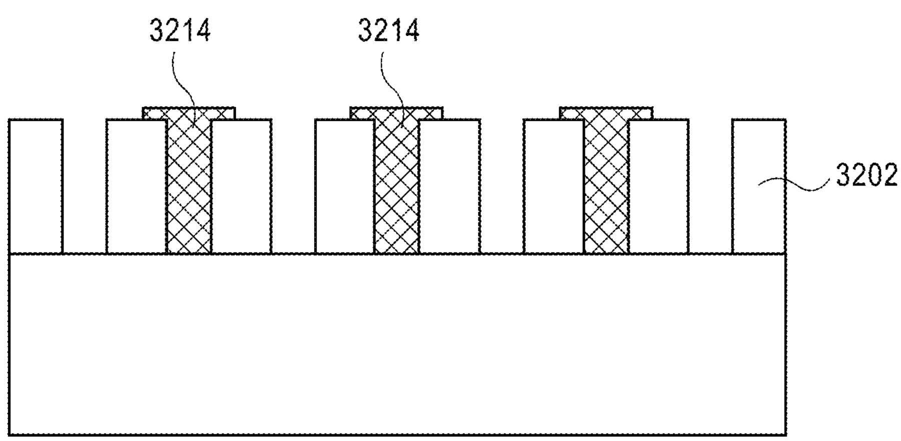

FIG. 32E illustrates a cross-sectional view of the structure of FIG. 32D following removal of the overburden regions 3212B of the dielectric material 3212. FIG. 32F illustrates a cross-sectional view of the structure of FIG. 32E following removal of the resist 3206 selective to the cross-linked regions 3214. In an embodiment, as is depicted, the resist 3206 is removed in a subsequent and different processing operation (such as a second wet chemical development operation) from the processing operation used to remove the overburden regions 3212B of the dielectric material 3212 (such as a first wet chemical development operation). In another embodiment, however, the resist 3206 is removed in a same processing operation used to remove the overburden regions 3212B of the dielectric material 3212 (such as a wet chemical development operation). In an embodiment, the remaining cross-linked regions 3214 are subjected to an additional curing process (e.g., additional heating following the cross-linking curing process). In one embodiment, the additional curing is performed following removal of the resist 3206 and the overburden regions 3212B.

Figure 32G:
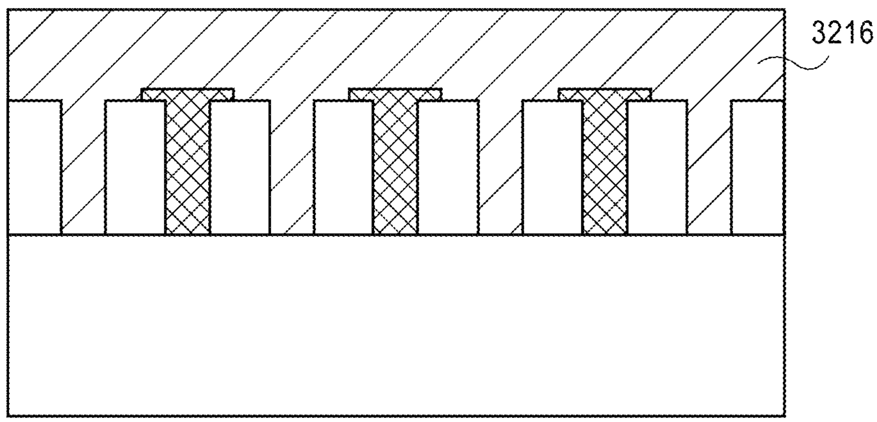

FIG. 32G illustrates a cross-sectional view of the structure of FIG. 32F following formation of a metal fill layer 3216. The metal fill layer 3216 may be formed in the open trenches (or holes) from FIG. 32F, and in overburden regions. The metal fill layer may be a single material layer, or may be formed from several layers, including conductive liner layers and fill layers. Any suitable deposition process, such as electroplating, chemical vapor deposition or physical vapor deposition, may be used to form metal fill layer 3216. In an embodiment, the metal fill layer 3216 is composed of a conductive material such as, but not limited to, Al, Ti, Zr, Hf, V, Ru, Co, Ni, Pd, Pt, Cu, W, Ag, Au or alloys thereof.

Figure 32H:
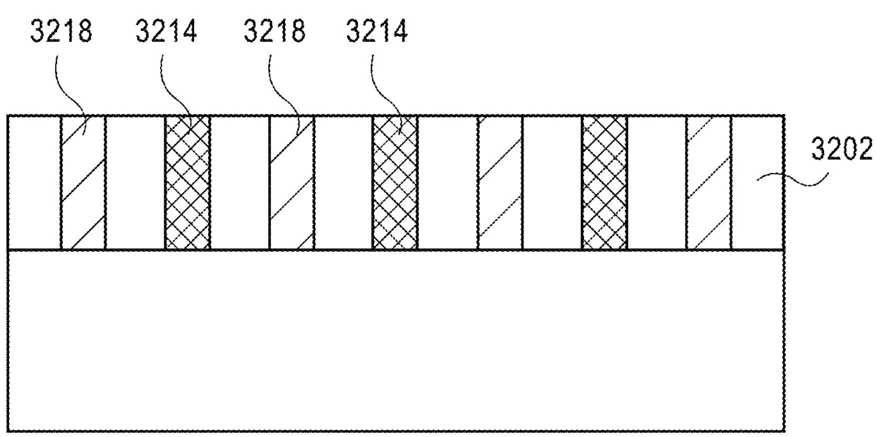

FIG. 32H illustrates a cross-sectional view of the structure of FIG. 32G following planarization of the metal fill layer to form metal features 3218 (e.g., metal lines or vias). In an embodiment, the planarization of the metal fill layer 3216 to form metal features 3218 is performed using a chemical mechanical polishing process. An exemplary resulting structure is shown in FIG. 32H, where metal features 3218 alternate with cross-linked (dielectric) regions 3214 in an ILD material 3202.

It is to be appreciated that the resulting structure of FIG. 32H may subsequently be used as a foundation for forming subsequent metal line/via and ILD layers. Alternatively, the structure of FIG. 32H may represent the final metal interconnect layer in an integrated circuit. Furthermore, it is to be appreciated that the above examples do not include etch-stop or metal capping layers in the Figures that may otherwise be necessary for patterning. However, for clarity, such layers are not included in the Figures since they do not impact the overall bottom-up fill concept.

With reference again to FIGS. 32A-32H, such a patterning scheme may be implemented as an integrated patterning approach that involves creating regular structures covering all possible locations, followed by selective patterning of only the desired features. The cross-lined regions 3214 represent a material that can remain in a final structure as an ILD between the ends of the metal lines (e.g., as plugs).

In accordance with an embodiment of the present disclosure, diagonal mask patterning is described. One or more embodiments described herein are directed to diagonal hardmask patterning for overlay improvements, particularly in the fabrication of back end of line (BEOL) features for semiconductor integrated circuits. Applications of patterning based on diagonal hardmasks may include, but need not be limited to, implementation in 193 nm immersion lithography, extreme ultraviolet (EUV) lithography, interconnect fabrication, overlay improvements, overlay budget, plug patterning, via patterning. Embodiments may be particularly useful for the self-aligned fabrication of BEOL structures.

In an embodiment, approaches described herein involve an integration scheme that tolerates increased via and plug overlay margin relative to existing approaches. In one such embodiment, all potential vias and plugs are pre-patterned and filled with resist to form a plurality of photobuckets. Subsequently, in a specific embodiment, EUV or 193 nm lithography is used to select certain of the via and plug locations for actual, ultimate, via and plug fabrication. In an embodiment, diagonal line patterning is used to increase nearest-neighbor distances resulting in an increase by a factor of the square root of two in overlay budget. More specifically, one or more embodiment described herein involves the use of a subtractive method to pre-form every via and plug using the trenches already etched. An additional operation is then used to select which of the vias and plugs to retain. Such operations are illustrated using photobuckets, although the selection process may also be performed using a more conventional resist expose and ILD backfill approach.

Figure 34A:
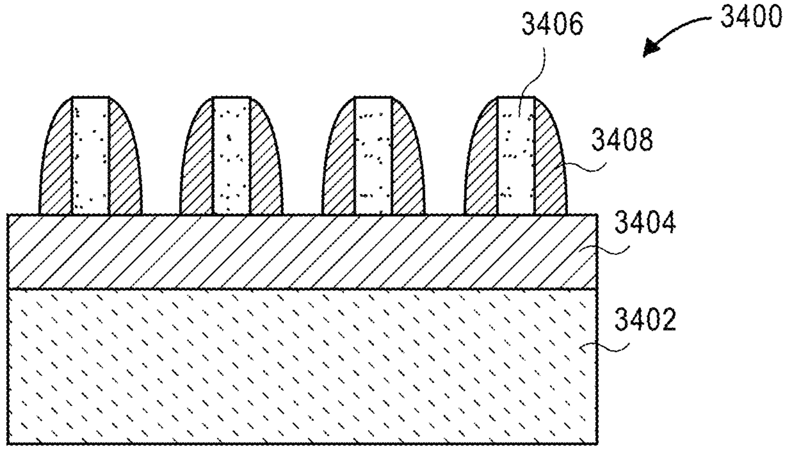
FIGS. 34A-34X illustrate portions of integrated circuit layers representing various operations in a method of self-aligned via and plug patterning using diagonal hardmasks, in accordance with an embodiment of the present disclosure.

In an aspect, a diagonal hardmask approach may be implemented. As an example, FIGS. 34A-34X illustrate portions of integrated circuit layers representing various operations in a method of self-aligned via and plug patterning using diagonal hardmasks, in accordance with an embodiment of the present disclosure. In each illustration at each described operation, cross-sectional and/or plan and/or angled views are shown. These views will be referred to herein as corresponding cross-sectional views, plan views and angled views.

FIG. 34A illustrates a cross-sectional view of a starting structure 3400 following deposition, but prior to patterning, of a first hardmask material layer 3404 formed on an interlayer dielectric (ILD) layer 3402, in accordance with an embodiment of the present disclosure. Referring to FIG. 34A, a patterned mask 3406 has spacers 3408 formed along sidewalls thereof, on or above the first hardmask material layer 3404.

Figure 34B:
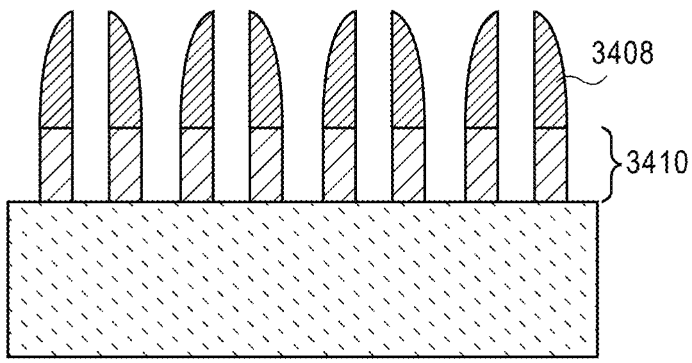

FIG. 34B illustrates a cross-sectional view of the structure of FIG. 34A following patterning of the first hardmask layer by pitch doubling, in accordance with an embodiment of the present disclosure. Referring to FIG. 34B, the patterned mask 3406 is removed and the resulting pattern of the spacers 3408 is transferred, e.g., by an etch process, to the first hardmask material layer 3404 to form a first patterned hardmask 3410. In one such embodiment, the first patterned hardmask 3410 is formed with a grating pattern, as is depicted in FIG. 34B. In an embodiment, the grating structure of the first patterned hardmask 3410 is a tight pitch grating structure. In a specific such embodiment, the tight pitch is not achievable directly through conventional lithography. For example, a pattern based on conventional lithography may first be formed (mask 3406), but the pitch may be halved by the use of spacer mask patterning, as is depicted in FIGS. 34A and 34B. Even further, although not shown, the original pitch may be quartered by a second round of spacer mask patterning. Accordingly, the grating-like pattern of the first patterned hardmask 3410 of FIG. 34B may have hardmask lines spaced at a constant pitch and having a constant width.

Figure 34C:
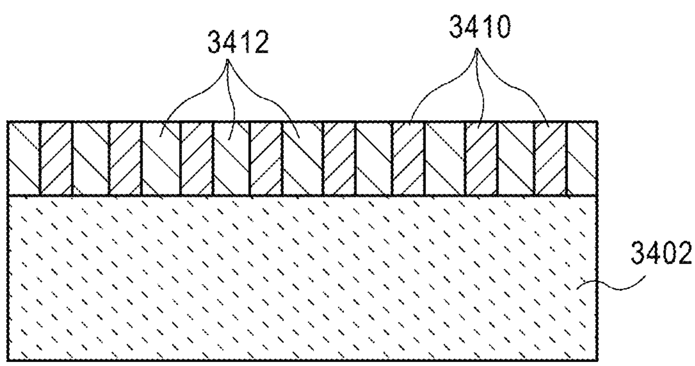

FIG. 34C illustrates a cross-sectional view of the structure of FIG. 34B following formation of a second patterned hardmask, in accordance with an embodiment of the present disclosure. Referring to FIG. 34C, a second patterned hardmask 3412 is formed interleaved with the first patterned hardmask 3410. In one such embodiment, the second patterned hardmask 3412 is formed by deposition of a second hardmask material layer (e.g., having a composition different from the first hardmask material layer 3404). The second hardmask material layer is then planarized, e.g., by chemical mechanical polishing (CMP), to provide the second patterned hardmask 3412.

Figure 34D:
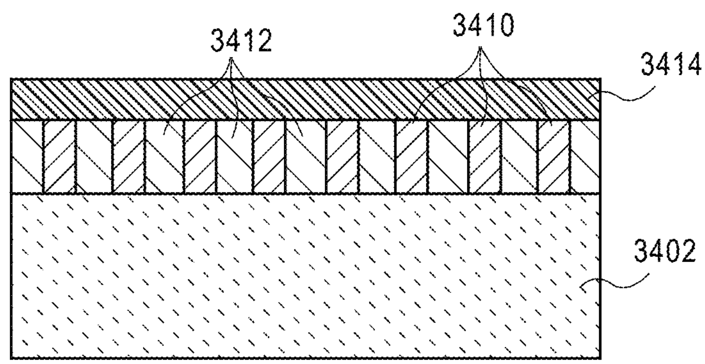

FIG. 34D illustrates a cross-sectional view of the structure of FIG. 34C following deposition of a hardmask cap layer (third hardmask layer), in accordance with an embodiment of the present disclosure. Referring to FIG. 34D, a hardmask cap layer 3414 is formed on the first patterned hardmask 3410 and the first patterned hardmask 3412. In one such embodiment, the material composition and etch selectivity of the hardmask cap layer 3414 is different as compared to the first patterned hardmask 3410 and the first patterned hardmask 3412.

Figure 34E:
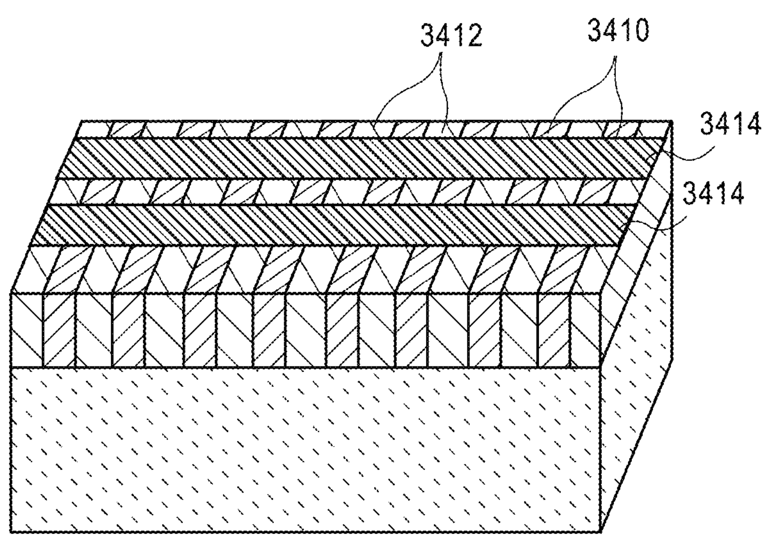

FIG. 34E illustrates an angled view of the structure of FIG. 34D following patterning of the hardmask cap layer, in accordance with an embodiment of the present disclosure. Referring to FIG. 34E, a patterned hardmask cap layer 3414 is formed on the first patterned hardmask 3410 and the first patterned hardmask 3412. In one such embodiment, the patterned hardmask cap layer 3414 is formed with a grating pattern orthogonal to the grating pattern of the first patterned hardmask 3410 and the first patterned hardmask 3412, as is depicted in FIG. 34E. In an embodiment, the grating structure formed by the patterned hardmask cap layer 3414 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the patterned hardmask cap layer 3414 of FIG. 34E may have hardmask lines spaced at a constant pitch and having a constant width. It is to be appreciated that description herein concerning forming and patterning a hardmask layer (or hardmask cap layer, such as hardmask cap layer 3414) involves, in an embodiment, mask formation above a blanket hardmask or hardmask cap layer. The mask formation may involve use of one or more layers suitable for lithographic processing. Upon patterning the one or more lithographic layers, the pattern is transferred to the hardmask or hardmask cap layer by an etch process to provide a patterned hardmask or hardmask cap layer.

Figure 34F:
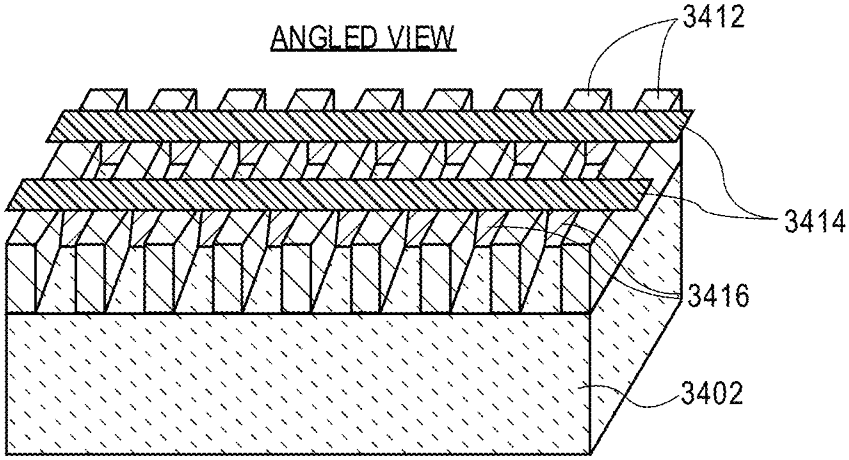
Figure 34F:
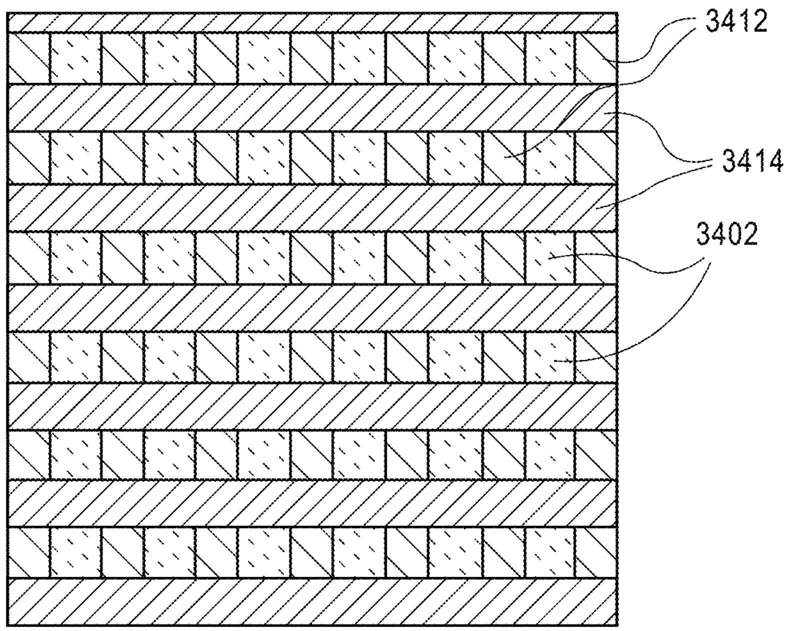

FIG. 34F illustrates an angled view and corresponding plan view of the structure of FIG. 34E following further patterning of the first patterned hardmask, in accordance with an embodiment of the present disclosure. Referring to FIG. 34F, using the patterned hardmask cap layer 3414 as a mask, the first patterned hardmask 3410 is further patterned to form first patterned hardmask 3416. The second patterned hardmask 3412 is not further patterned in this process. In an embodiment, the first patterned hardmask 3410 is patterned to a depth sufficient to expose regions of ILD layer 3402 as is depicted in FIG. 34F.

Figure 34G:
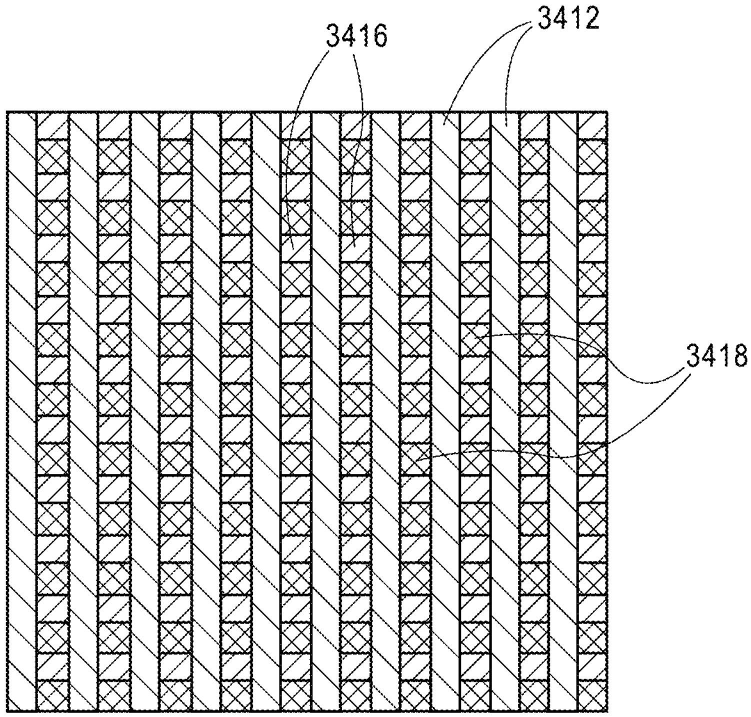

FIG. 34G illustrates a plan view of the structure of FIG. 34F following removal of the hardmask cap layer and formation of a fourth hardmask layer, in accordance with an embodiment of the present disclosure. Referring to FIG. 34G, the hardmask cap layer (third hardmask layer) 3414 is removed, e.g., by a wet etch process, dry etch process, or CMP process. A fourth hardmask layer 3418 is formed on the resulting structure by, in one embodiment, a deposition and CMP process. In one such embodiment, the fourth hardmask layer 3418 is formed by deposition of a material layer different from the material of the second patterned hardmask layer 3412 and the first patterned hardmask layer 3416.

Figure 34H:
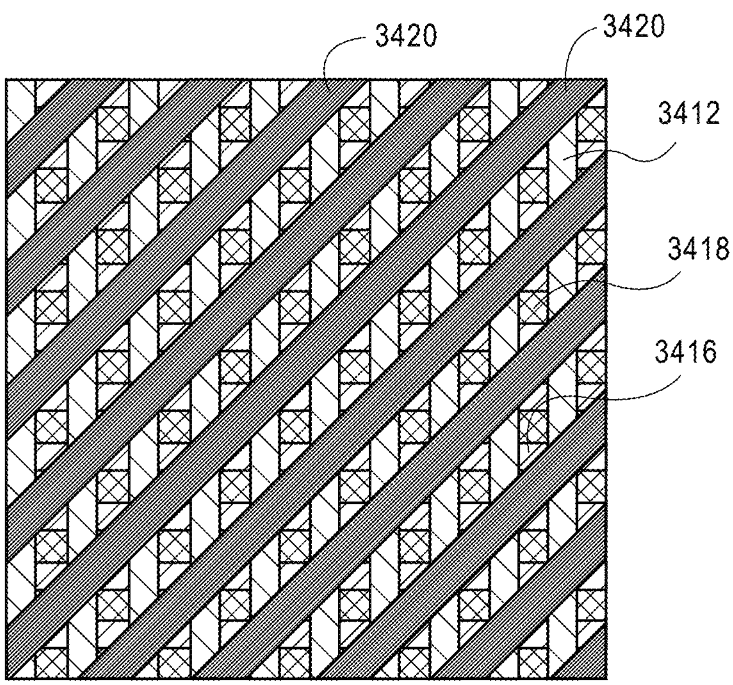

FIG. 34H illustrates a plan view of the structure of FIG. 34G following deposition and patterning of a first diagonal hardmask layer, in accordance with an embodiment of the present disclosure. Referring to FIG. 34H, a first diagonal hardmask layer 3420 is formed on the fourth hardmask layer 3418, the second patterned hardmask layer 3412, and the first patterned hardmask layer 3416 arrangement of FIG. 34G. In an embodiment, the first diagonal hardmask layer 3420 has a pattern essentially or highly symmetrically diagonal, e.g., at 45 degrees relative to the grating structure of the second pattern hardmask layer 3412, to cover alternate lines of the fourth hardmask layer 3418. In an embodiment, the diagonal pattern of the first diagonal hardmask layer 3420 is printed at minimum critical dimension (CD), i.e., without the use of pitch halving or pitch quartering. It is to be appreciated that the individual lines may be printed even larger than minimum CD so long as some area of adjacent rows of the fourth hardmask layer 3418 remains revealed. Regardless, the grating-like pattern of the first diagonal hardmask layer 3420 of FIG. 34H may have hardmask lines spaced at a constant pitch and having a constant width. It is to be appreciated that description herein concerning forming and patterning a diagonal hardmask layer (such as the first diagonal hardmask layer 3420) involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a diagonally patterned hardmask layer. In a particular embodiment, the first diagonal hardmask layer is a carbon-based hardmask layer.

Figure 34I:
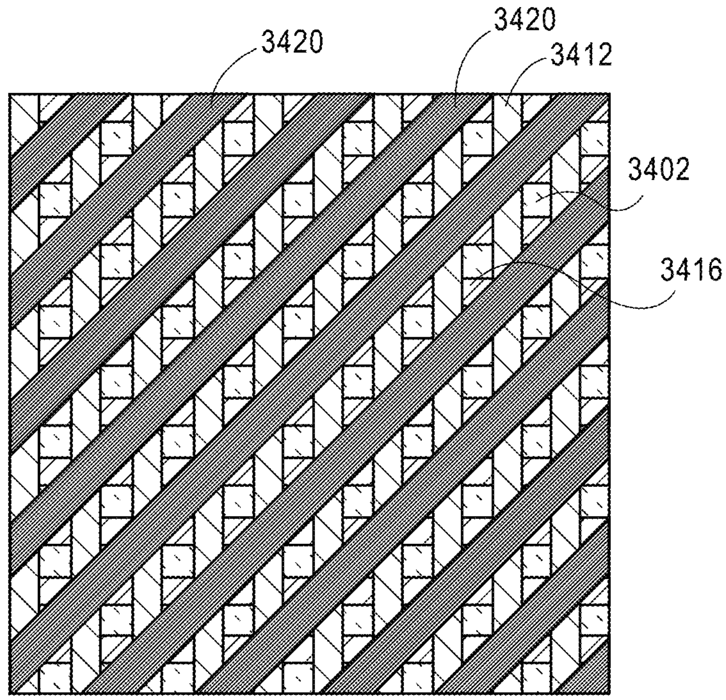

FIG. 34I illustrates a plan view of the structure of FIG. 34H following removal of revealed regions of the fourth hardmask layer, in accordance with an embodiment of the present disclosure. Referring to FIG. 34I, using the first diagonal hardmask layer 3420 as a mask, revealed regions of the fourth hardmask layer 3418 are removed. In one such embodiment, the revealed regions of the fourth hardmask layer 3418 are removed by an isotropic etch process (e.g., a wet etch process or non-anisotropic plasma etch process) such that any partial exposure leads to full removal of the partially revealed block of fourth hardmask material. In one embodiment, regions where the fourth hardmask layer 3418 have been removed reveal portions of the ILD layer 3402, as is depicted in FIG. 34I.

Figure 34J:
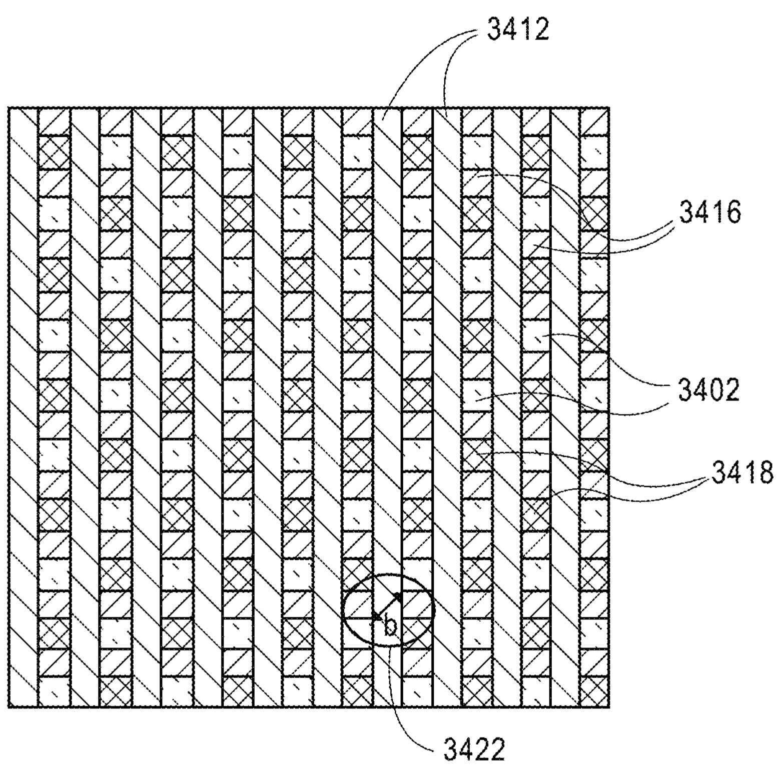

FIG. 34J illustrates a plan view of the structure of FIG. 34I following removal of the first diagonal hardmask layer, in accordance with an embodiment of the present disclosure. Referring to FIG. 34J, the first diagonal hardmask layer 3420 is removed to reveal the first patterned hardmask layer 3416 and the second patterned hardmask layer 3412. Also revealed are the portions of the fourth hardmask layer 3418 that were protected from isotropic etching by the first diagonal hardmask layer 3420. Accordingly, along each alternate row or down each alternate column of the resulting grid-like pattern of FIG. 34J, a region of the fourth hardmask layer 3418 is alternated with a revealed region of the underlying ILD layer 3402. That is, the result is a checkerboard pattern of ILD layer 3402 regions and fourth hardmask layer regions 3418. As such, an increase by a factor the square root of two is achieved in the nearest neighbor distance 3422 (shown as distance in direction b). In a particular embodiment, the first diagonal hardmask layer 3420 is a carbon-based hardmask material and is removed with a plasma ashing process.

Figure 34K:
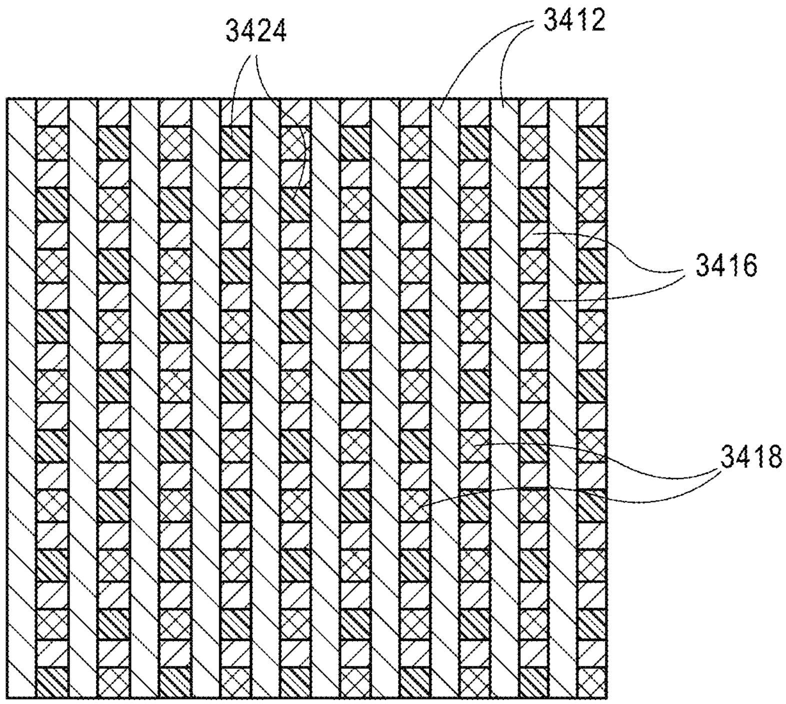

FIG. 34K illustrates a plan view of the structure of FIG. 34J following first plurality of photobucket formation, in accordance with an embodiment of the present disclosure. Referring to FIG. 34K, a first plurality of photobuckets 3424 is formed in openings above the ILD layer 3402 such that no portion of the ILD layer 3402 remains revealed. The photobuckets 3424, at this stage, represent a first half of all possible via locations in a resulting metallization layer.

Figure 34L:
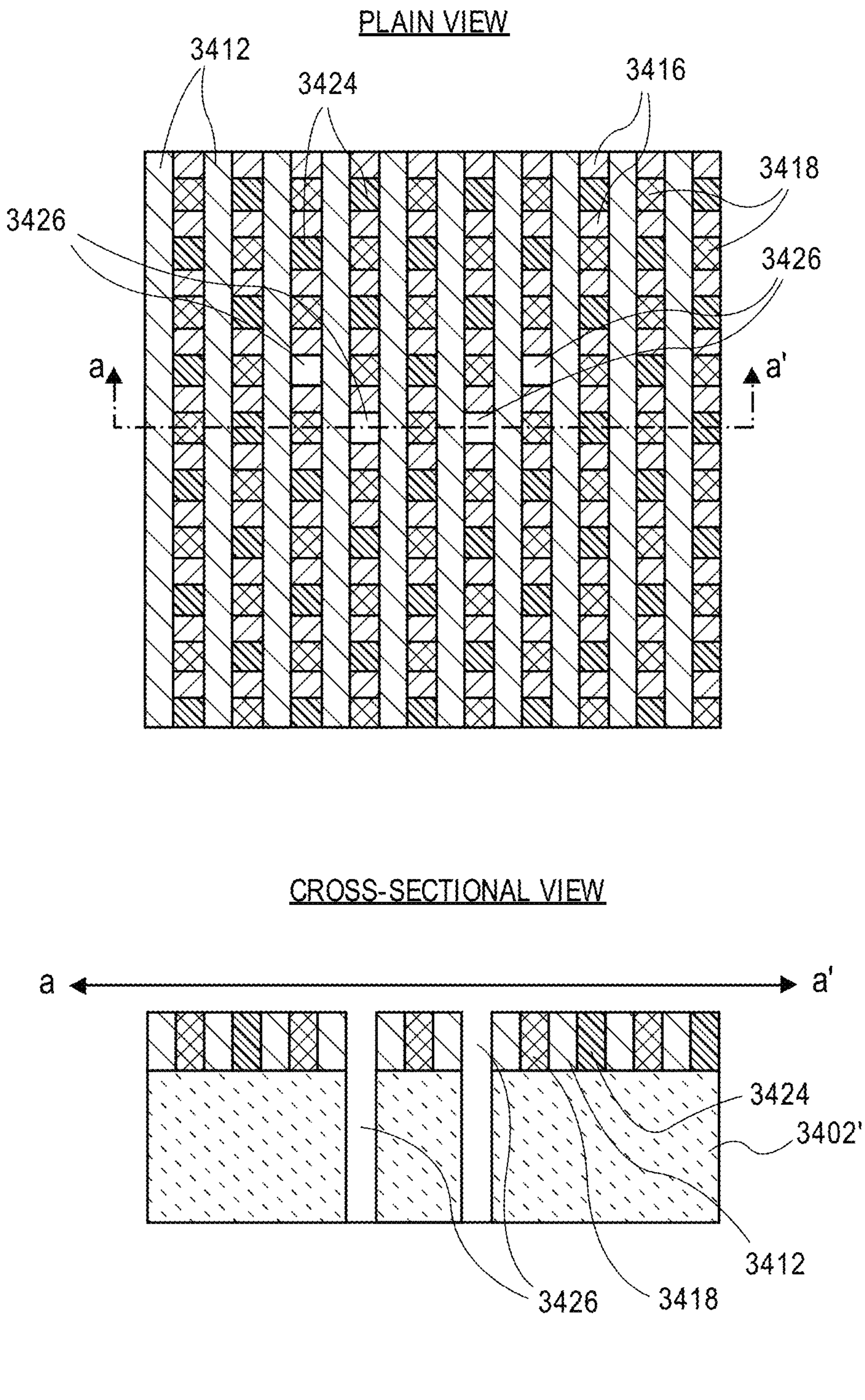

FIG. 34L illustrates a plan view and corresponding cross-sectional view (taken along the a-a' axis) of the structure of FIG. 34K following photobucket exposure and development to form selected via locations, and subsequent via opening etch into the underlying ILD, in accordance with an embodiment of the present disclosure. Referring to FIG. 34L select photobuckets 3424 are exposed and removed to provide selected via locations 3426. The via locations 3426 are subjected to a selective etch process, such as a selective plasma etch process, to extend via openings into the underlying ILD layer 3402, forming patterned ILD layer 3402'. The etching is selective to remaining, unexposed, photobuckets 3424, selective to the first patterned hardmask layer 3416, selective to the second patterned hardmask layer 3412, and selective to the fourth hardmask layer 3418.

Figure 34M:
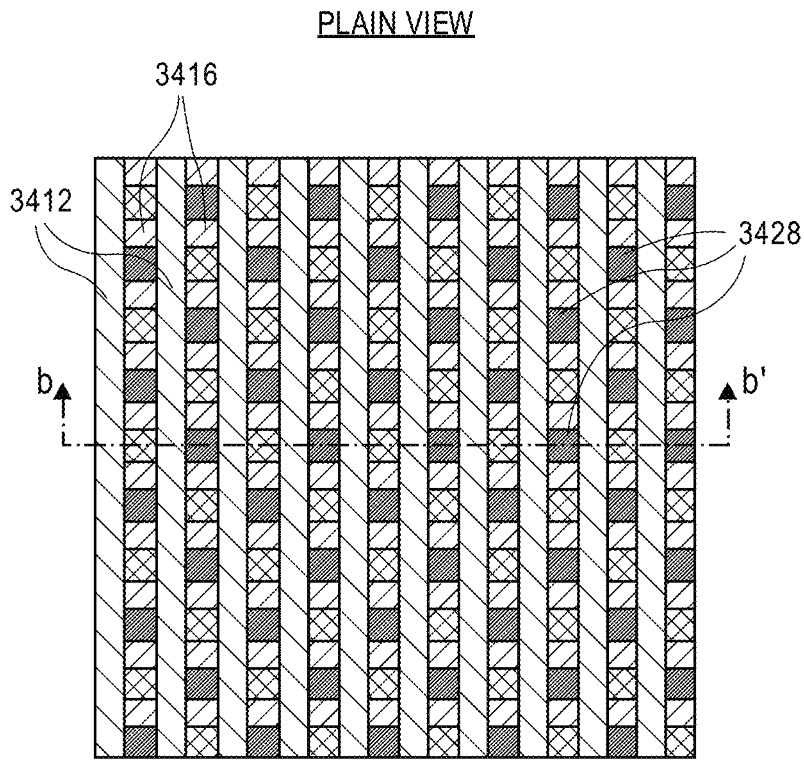
Figure 34M:
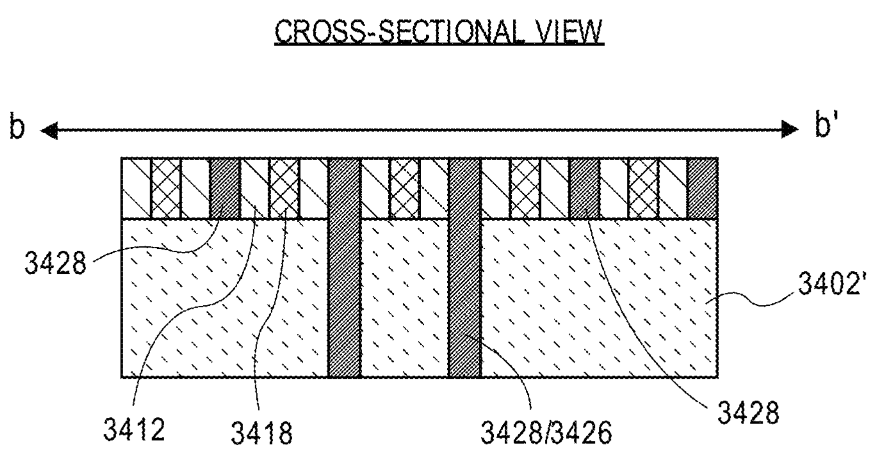

FIG. 34M illustrates a plan view and corresponding cross-sectional view (taken along the b-b' axis) of the structure of FIG. 34L following removal of the remaining photobuckets and subsequent formation of a fifth hardmask material, in accordance with an embodiment of the present disclosure. Referring to FIG. 34M, the remaining of the first plurality of photobuckets 3424 are removed, e.g., by a selective etch or ash process. All openings revealed (e.g., openings formed upon removal of photobuckets 3424 along with the via locations 3426) are then filled with a hardmask material 3428, such as a carbon-based hardmask material.

Figure 34N:
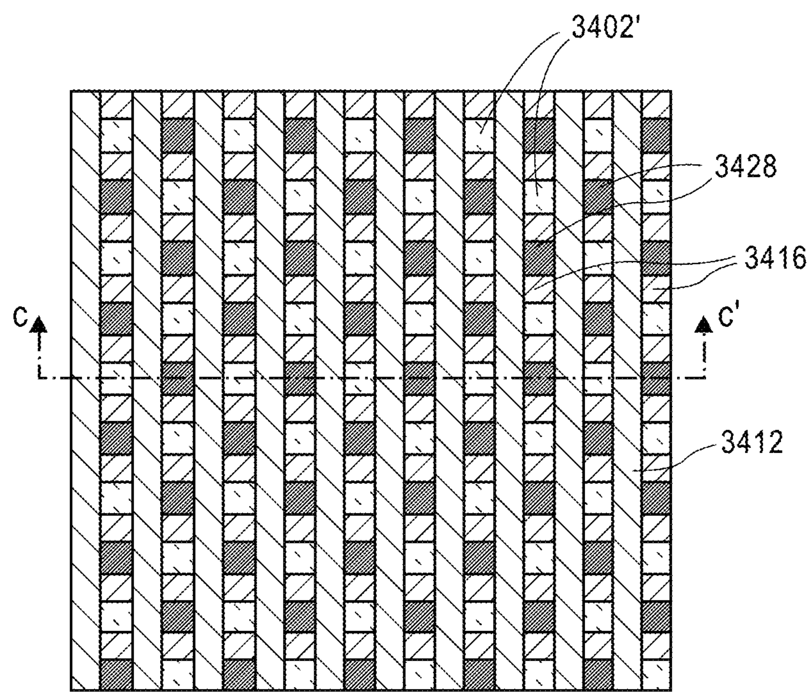
Figure 34N:
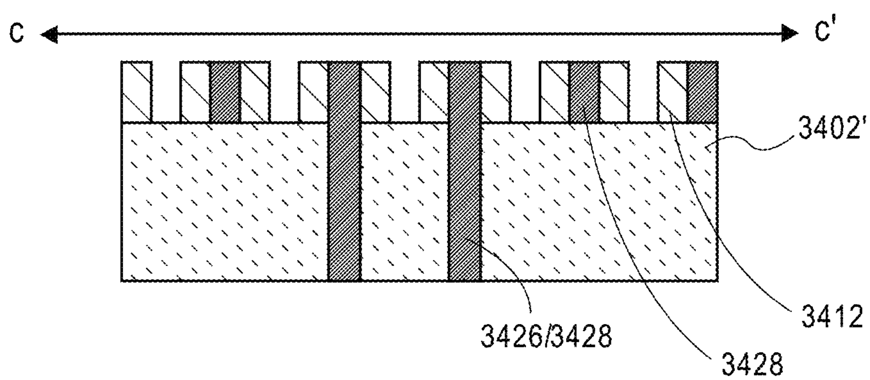

FIG. 34N illustrates a plan view and corresponding cross-sectional view (taken along the c-c' axis) of the structure of FIG. 34M following removal of the remaining regions of the fourth hardmask layer, in accordance with an embodiment of the present disclosure. Referring to FIG. 34N, all remaining regions of the fourth hardmask layer 3418 are removed, e.g., by a selective etch or ash process. In one embodiment, regions where the remaining fourth hardmask layer 3418 have been removed reveal portions of the patterned ILD layer 3402', as is depicted in FIG. 34N.

Figure 34O:
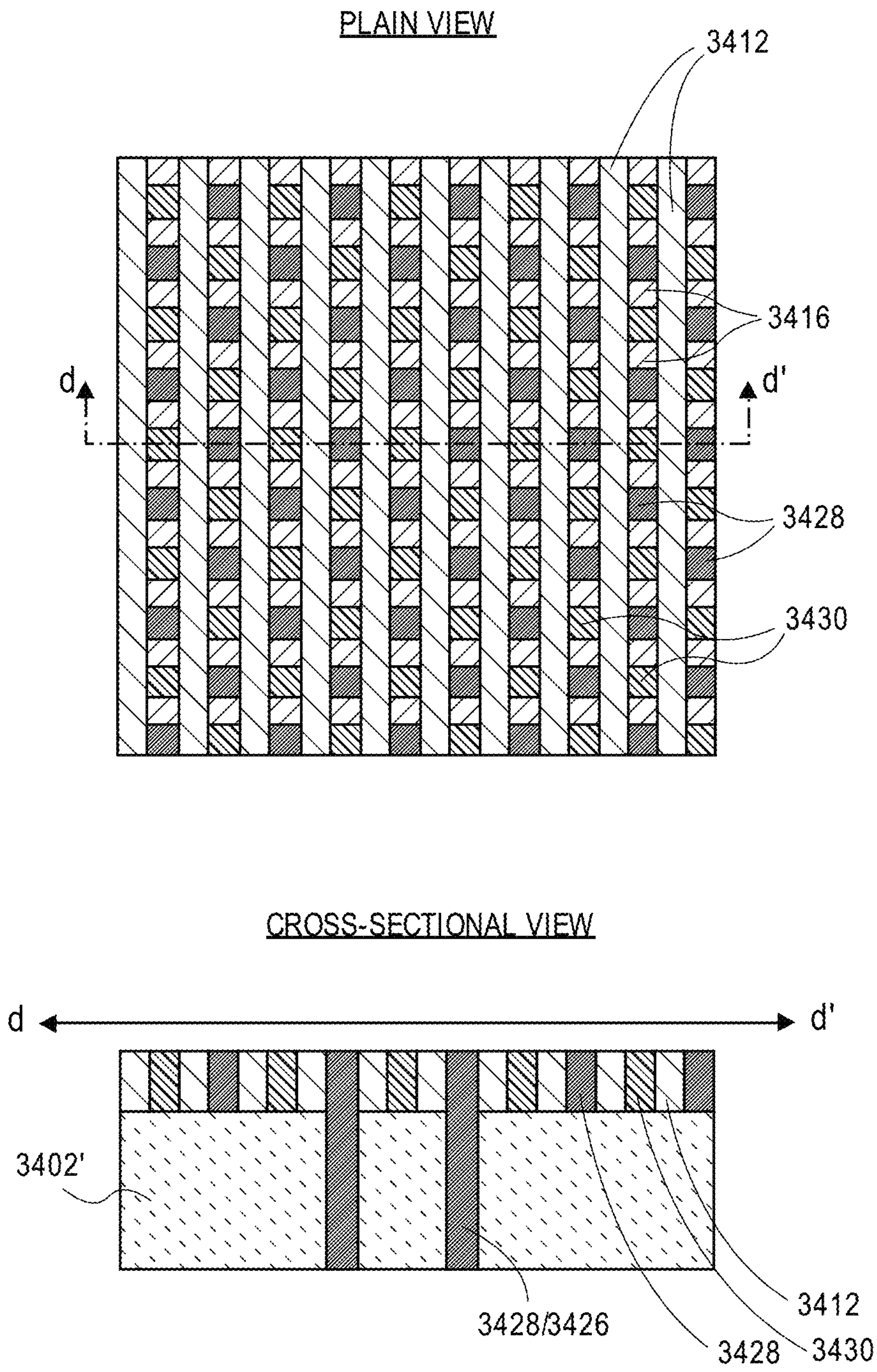

FIG. 34O illustrates a plan view and corresponding cross-sectional view (taken along the d-d' axis) of the structure of FIG. 34N following second plurality of photobucket formation, in accordance with an embodiment of the present disclosure. Referring to FIG. 34O, a second plurality of photobuckets 3430 is formed in openings above the patterned ILD layer 3402' such that no portion of the patterned ILD layer 3402' remains revealed. The photobuckets 3430, at this stage, represent a second half of all possible via locations in a resulting metallization layer.

Figure 34P:
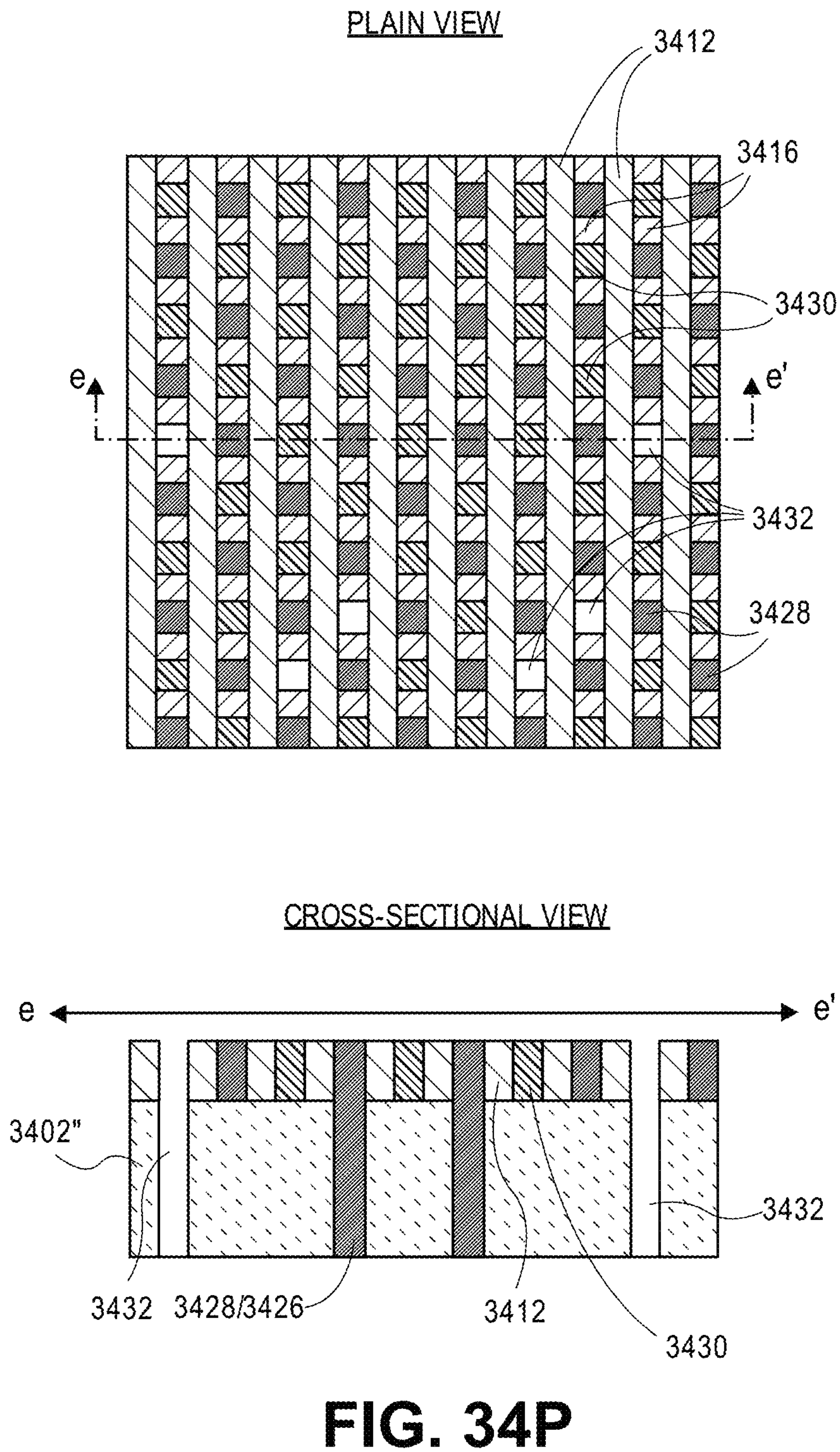

FIG. 34P illustrates a plan view and corresponding cross-sectional view (taken along the e-e' axis) of the structure of FIG. 34O following photobucket exposure and development to form selected via locations, and subsequent via opening etch into the underlying ILD, in accordance with an embodiment of the present disclosure. Referring to FIG. 34P, select photobuckets 3430 are exposed and removed to provide selected via locations 3432. The via locations 3432 are subjected to a selective etch process, such as a selective plasma etch process, to extend via openings into the underlying patterned ILD layer 3402', forming further patterned ILD layer 3402". The etching is selective to remaining, unexposed, photobuckets 3430, selective to the first patterned hardmask layer 3416, selective to the second patterned hardmask layer 3412, and selective to the hardmask material 3428.

Figure 34Q:
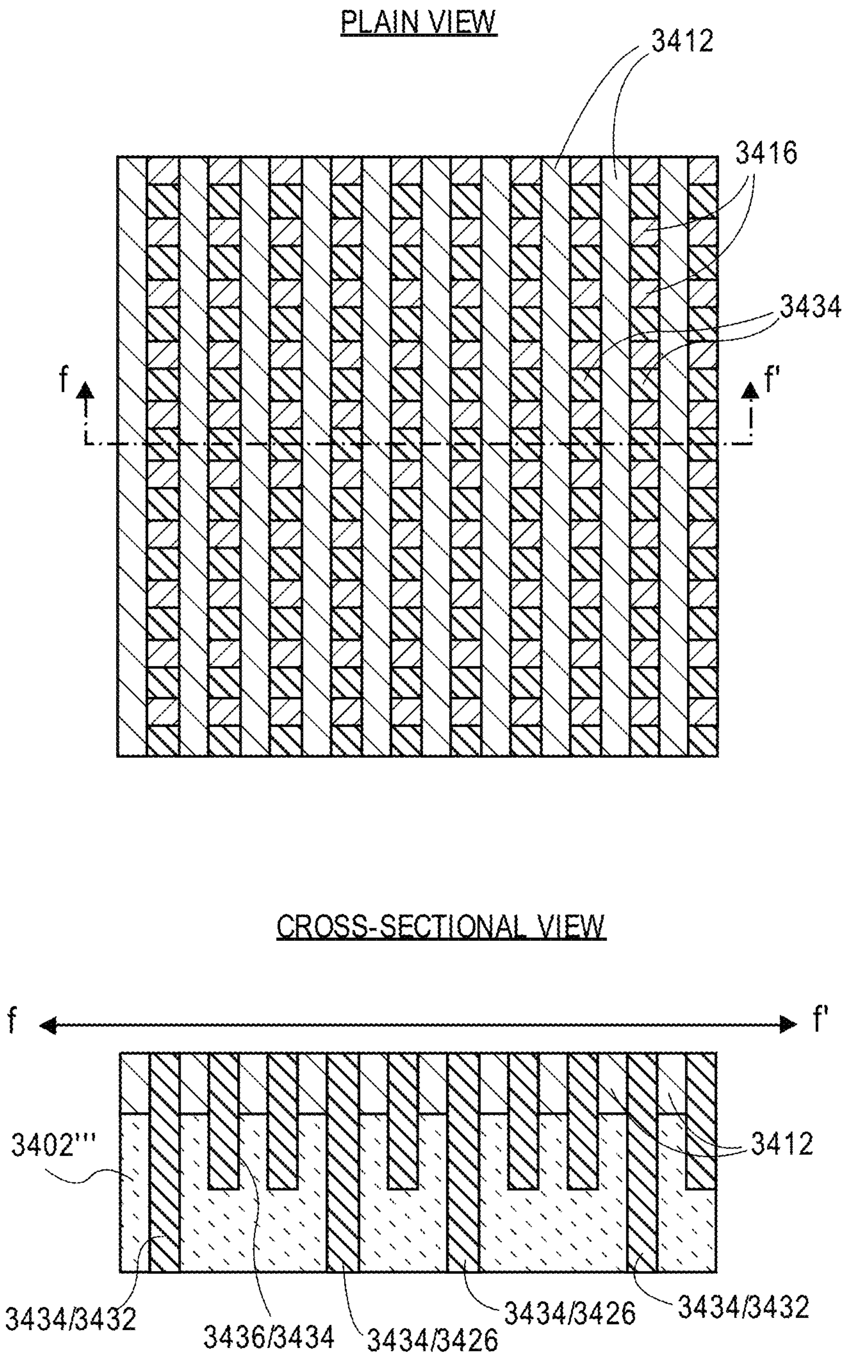

FIG. 34Q illustrates a plan view and corresponding cross-sectional view (taken along the f-f' axis) of the structure of FIG. 34P following removal of the fifth hardmask material, trench etching, and subsequent sacrificial layer formation, in accordance with an embodiment of the present disclosure. Referring to FIG. 34Q, hardmask material layer 3428 is removed, revealing all of the original first and second halves of the potential via locations. The patterned ILD layer 3402" is then patterned to form ILD layer 3402''' which includes the via openings 3432 and 3426, along with trenches 3436 where via openings were not formed. The trenches 3436 will ultimately be used for metal line fabrication, as is described below. Upon completion of the trench etch, all openings (including via openings 3426 and 3432 and trenches 3436) are filled with a sacrificial material 3434. In one embodiment, the hardmask material layer 3428 is a carbon-based hardmask material and is removed with a plasma ashing process. In one embodiment, the sacrificial material 3434 is flowable organic or inorganic material such as a sacrificial light absorbing material (SLAM). The sacrificial material 3434 is either formed to, or planarized to, a level of the first patterned hardmask 3416 and the second patterned hardmask 3412, as is depicted in FIG. 34Q.

Figure 34R:
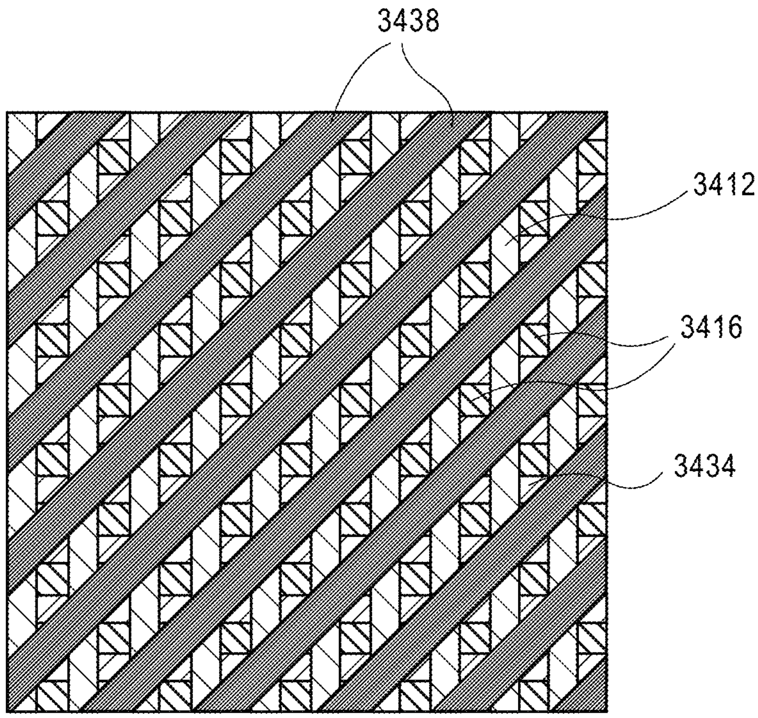

FIG. 34R illustrates a plan view of the structure of FIG. 34Q following deposition and patterning of a second diagonal hardmask layer, in accordance with an embodiment of the present disclosure. Referring to FIG. 34R, a second diagonal hardmask layer 3438 is formed on the sacrificial material 3434, the second patterned hardmask layer 3412, and the first patterned hardmask layer 3416 arrangement of FIG. 34Q. In an embodiment, the second diagonal hardmask layer 3438 has a pattern essentially or highly symmetrically diagonal, e.g., at 45 degrees relative to the grating structure of the second pattern hardmask layer 3412, to cover alternate lines of the first patterned hardmask layer 3416. In an embodiment, the diagonal pattern of the second diagonal hardmask layer 3438 is printed at minimum critical dimension (CD), i.e., without the use of pitch halving or pitch quartering. It is to be appreciated that the individual lines may be printed even larger than minimum CD so long as some area of adjacent rows of the first patterned hardmask layer 3416 remains revealed. Regardless, the grating-like pattern of the second diagonal hardmask layer 3438 of FIG. 34R may have hardmask lines spaced at a constant pitch and having a constant width. It is to be appreciated that description herein concerning forming and patterning a diagonal hardmask layer (such as the second diagonal hardmask layer 3438) involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a diagonally patterned hardmask layer. In a particular embodiment, the second diagonal hardmask layer 3438 is a carbon-based hardmask layer.

Figure 34S:
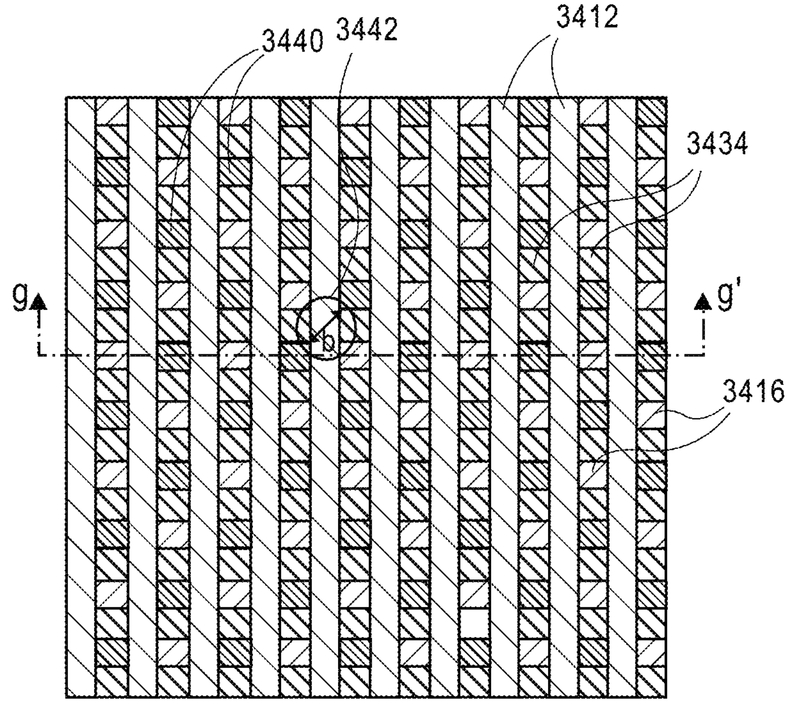
Figure 34S:
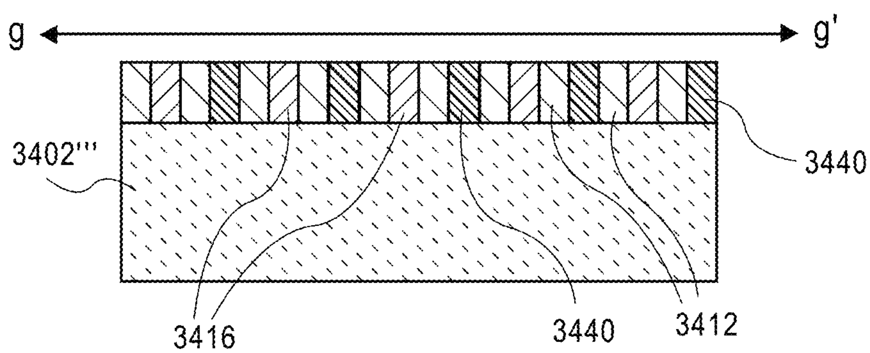

FIG. 34S illustrates a plan view and corresponding cross-sectional view (taken along the g-g' axis) of the structure of FIG. 34R following removal of revealed regions of the first patterned hardmask layer, removal of the second diagonal hardmask layer, and following third plurality of photobucket formation, in accordance with an embodiment of the present disclosure. Referring to FIG. 34S, using the second diagonal hardmask layer 3438 as a mask, revealed regions of the first patterned hardmask layer 3416 are removed. In one such embodiment, the revealed regions of the first patterned hardmask layer 3416 are removed by an isotropic etch process (e.g., a wet etch process or non-anisotropic plasma etch process) such that any partial revealing leads to full removal of the partially revealed block of the first patterned hardmask layer 3416. Referring again to FIG. 34S, the second diagonal hardmask layer 3438 is removed to reveal the sacrificial material 3434 and the second patterned hardmask layer 3412. Also revealed are the portions of the first patterned hardmask layer 3416 that were protected from isotropic etching by the second diagonal hardmask layer 3438. In a particular embodiment, the second diagonal hardmask layer 3438 is a carbon-based hardmask material and is removed with a plasma ashing process. Referring again to FIG. 34S, a third plurality of photobuckets 3440 is formed in the resulting openings above the patterned ILD layer 3402''' such that no portion of the patterned ILD layer 3402''' remains revealed. The photobuckets 3440, at this stage, represent a first half of all possible plug locations in a resulting metallization layer. Accordingly, along each alternate row or down each alternate column of the resulting grid-like pattern of FIG. 34S, a region of the first patterned hardmask layer 3416 is alternated with a photobucket 3440. That is, the result is a checkerboard pattern of photobucket 3440 regions and first patterned hardmask layer 3416 regions. As such, an increase by a factor the square root of two is achieved in the nearest neighbor distance 3442 (shown as distance in direction b).

Figure 34T:
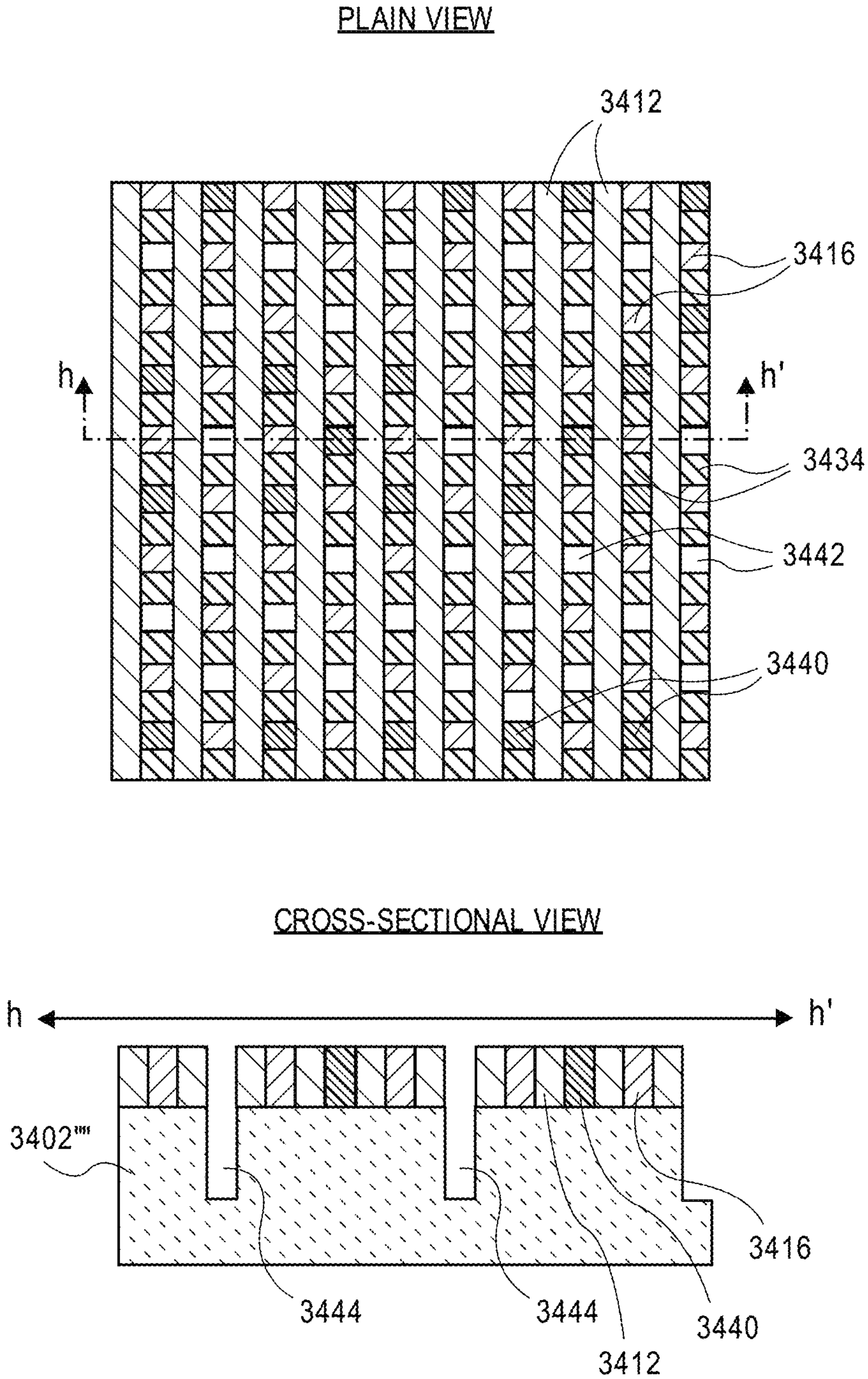

FIG. 34T illustrates a plan view and corresponding cross-sectional view (taken along the h-h' axis) of the structure of FIG. 34S following plug location selection and trench etching, in accordance with an embodiment of the present disclosure. Referring to FIG. 34T, the photobuckets 3440 from FIG. 34S in are removed from locations 3442 where plugs will not be formed. In locations where plugs are selected to be formed, the photobuckets 3440 are retained. In one embodiment, in order to form locations 3442 where plugs will not be formed, lithography is used to expose the corresponding photobuckets 3440. The exposed photobuckets may then be removed by a developer. The patterned ILD layer 3402''' is then patterned to form ILD layer 3402'''' which includes trenches 3444 formed at locations 3442. The trenches 3444 will ultimately be used for metal line fabrication, as is described below.

Figure 34U:
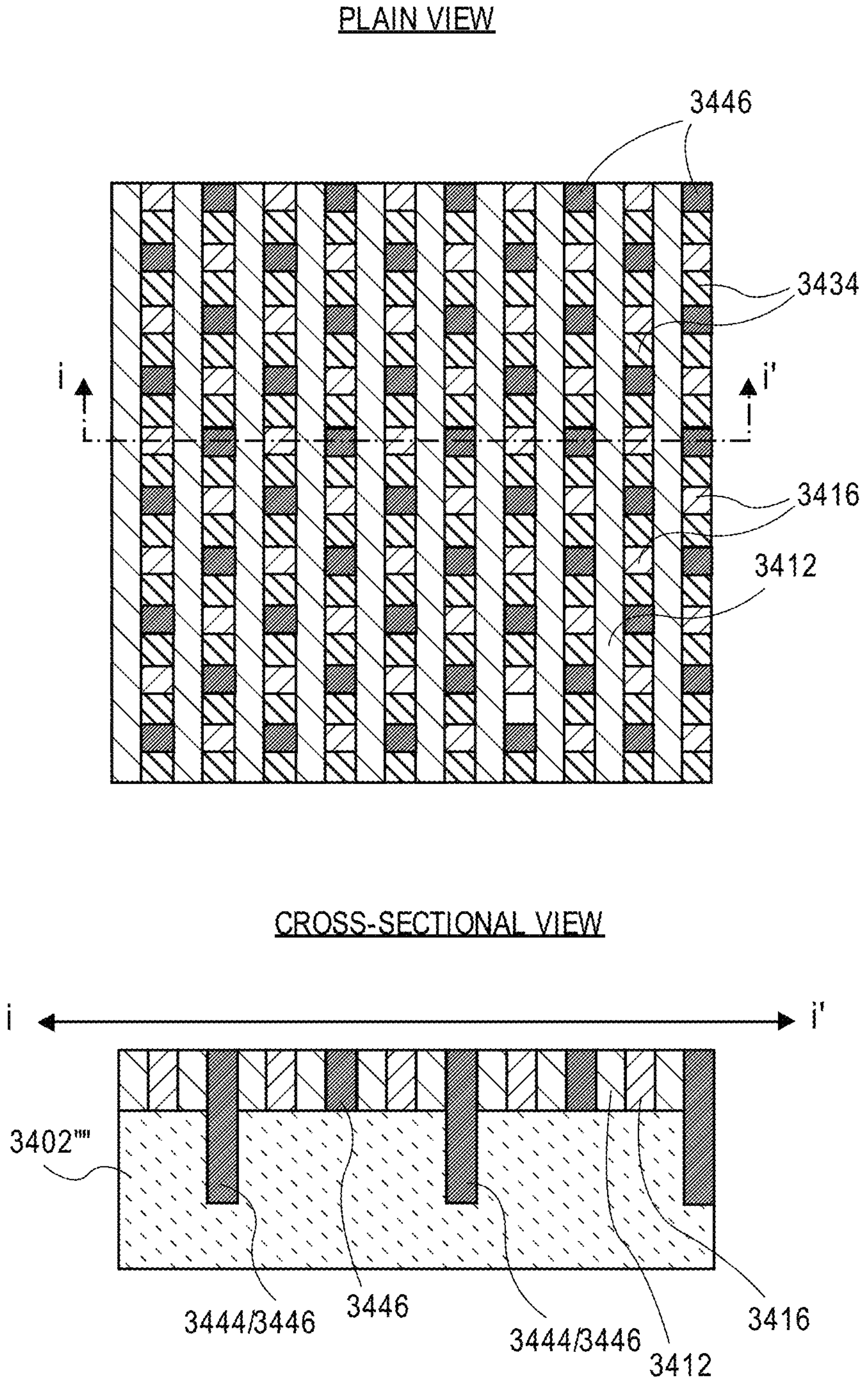

FIG. 34U illustrates a plan view and corresponding cross-sectional view (taken along the i-i' axis) of the structure of FIG. 34T following removal of remaining third photobuckets and subsequent hardmask formation, in accordance with an embodiment of the present disclosure. Referring to FIG. 34U, all remaining photobuckets 3440 are removed, e.g., by an ashing process. Upon removal of all remaining photobuckets 3440, all openings (including trenches 3444) are filled with a hardmask material layer 3446. In one embodiment, the hardmask material layer 3446 is a carbon-based hardmask material.

Figure 34V:
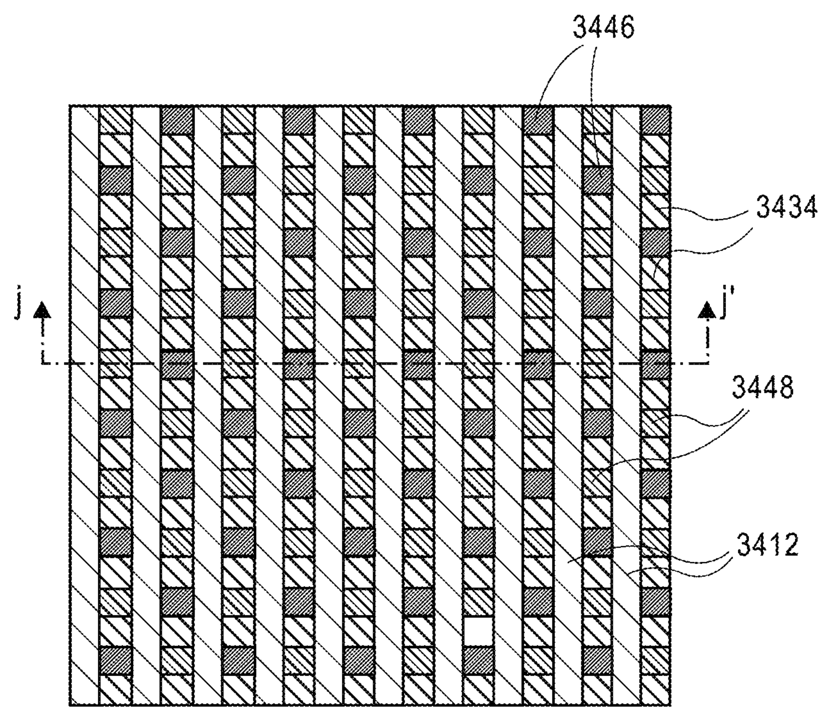
Figure 34V:
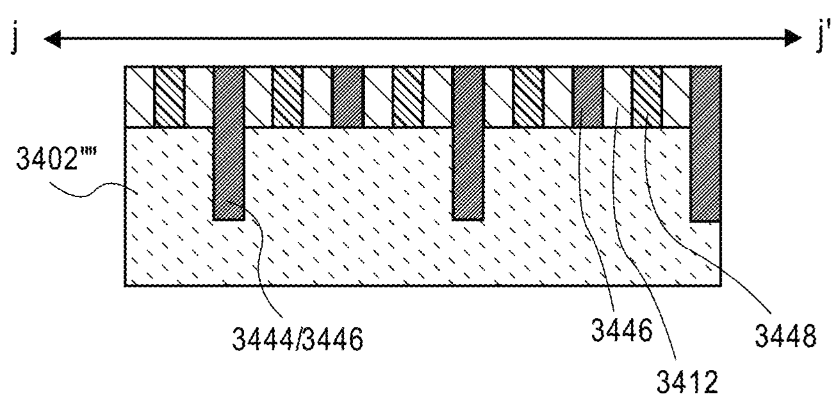

FIG. 34V illustrates a plan view and corresponding cross-sectional view (taken along the j-j' axis) of the structure of FIG. 34V following first patterned hardmask removal and fourth plurality of photobucket formation, in accordance with an embodiment of the present disclosure. Referring to FIG. 34V, the first patterned hardmask layer 3416 is removed (e.g., by a selective dry or wet etch process), and a fourth plurality of photobuckets 3448 is formed in the resulting openings above the patterned ILD layer 3402'''' such that no portion of the patterned ILD layer 3402'''' remains revealed. The photobuckets 3448, at this stage, represent a second half of all possible plug locations in a resulting metallization layer.

Figure 34W:
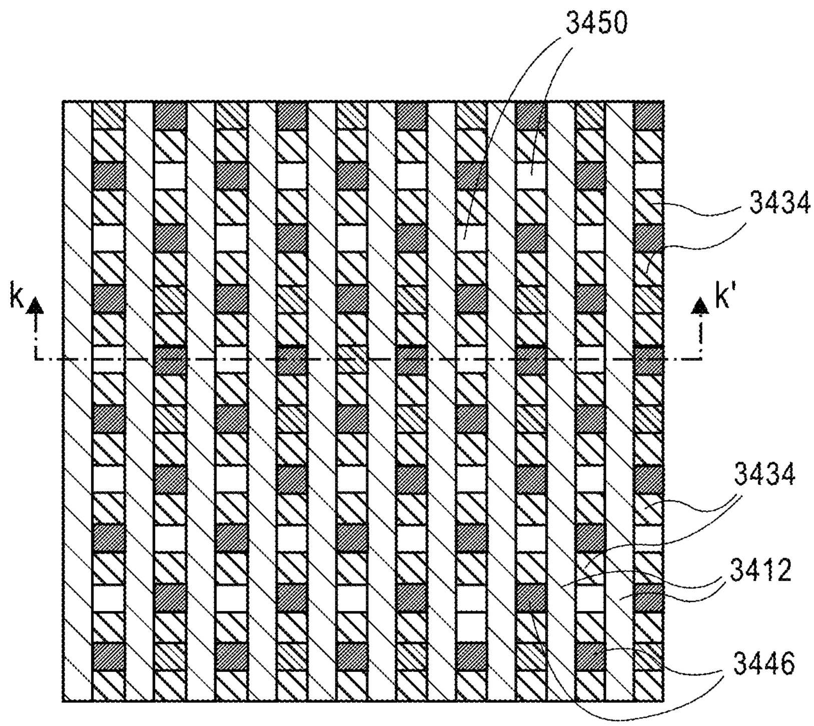
Figure 34W:
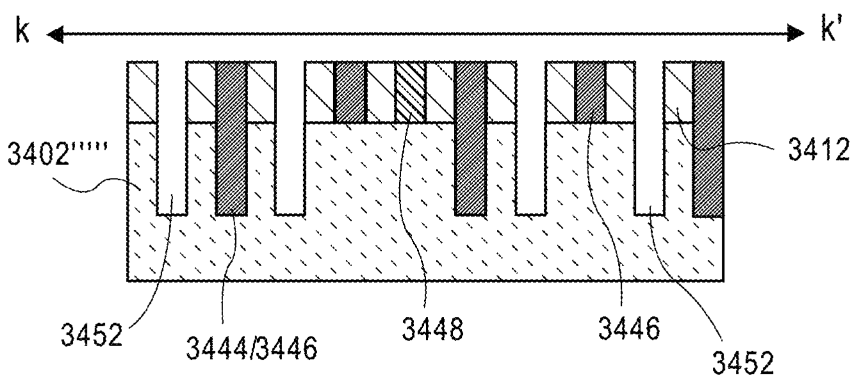
Figure 34X:
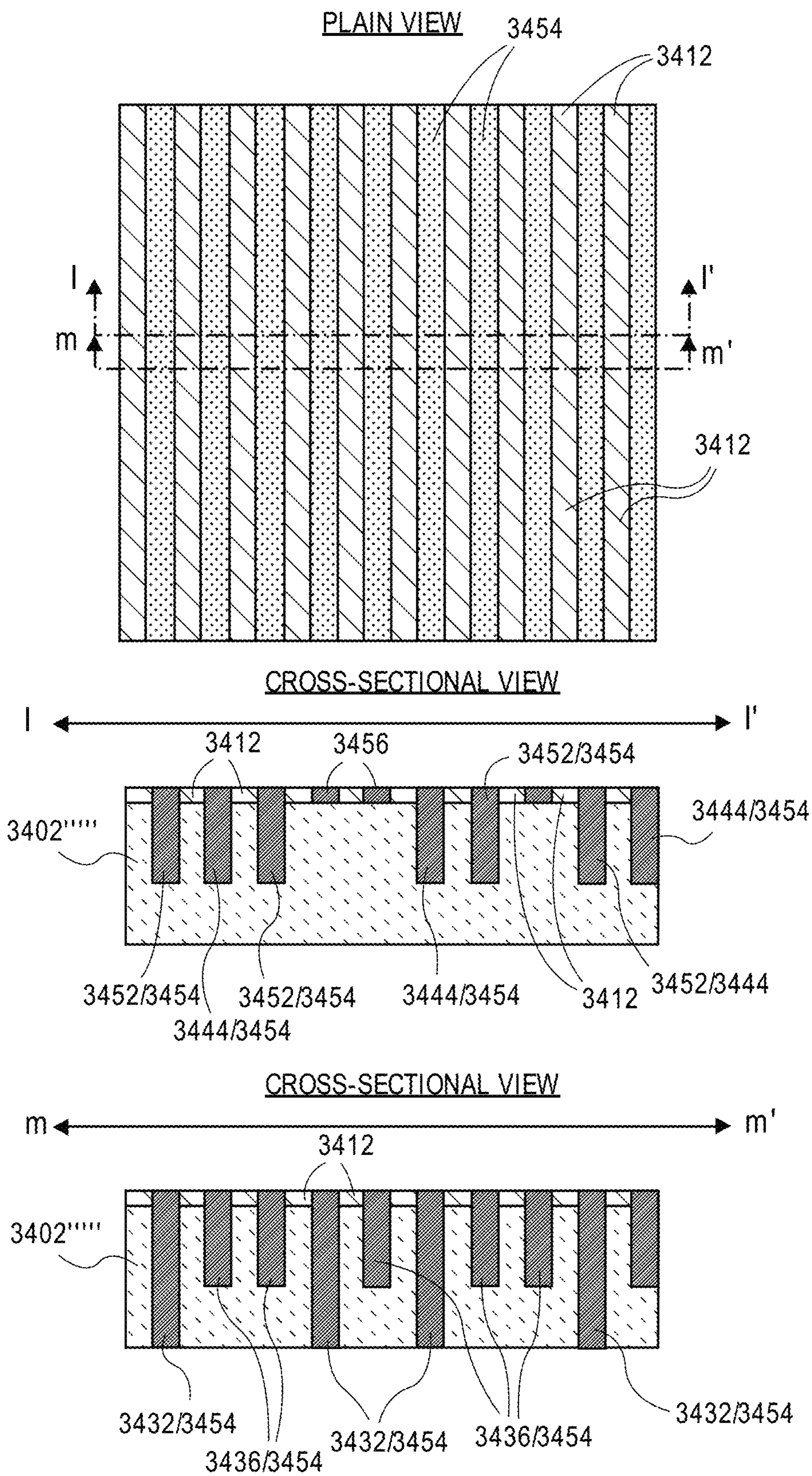

FIG. 34W illustrates a plan view and corresponding cross-sectional view (taken along the k-k' axis) of the structure of FIG. 34V following plug location selection and trench etching, in accordance with an embodiment of the present disclosure. Referring to FIG. 34W, the photobuckets 3448 from FIG. 34V in are removed from locations 3450 where plugs will not be formed. In locations where plugs are selected to be formed, the photobuckets 3448 are retained. In one embodiment, in order to form locations 3450 where plugs will not be formed, lithography is used to expose the corresponding photobuckets 3448. The exposed photobuckets may then be removed by a developer. The patterned ILD layer 3402'''' is then patterned to form ILD layer 3402''''' which includes trenches 3452 formed at locations 3450. The trenches 3452 will ultimately be used for metal line fabrication, as is described below.

FIG. 34X illustrates a plan view and corresponding first cross-sectional view (taken along the l-l' axis) and second cross-sectional view (taken along the m-m' axis) of the structure of FIG. 34W following removal of remaining fourth photobuckets, hardmask material layer and sacrificial material, and subsequent metal fill, in accordance with an embodiment of the present disclosure. Referring to FIG. 34X, remaining fourth photobuckets 3448, hardmask material layer 3446 and sacrificial material 3434 are removed. In one such embodiment, the hardmask material layer 3446 is a carbon-based hardmask material, and both the hardmask material layer 3446 and the remaining fourth photobuckets 3448 are removed with a plasma ashing process. In one embodiment, the sacrificial material 3434 is removed in a different etch process. Referring to the plan view of FIG. 34X, metallization 3454 is formed interleaved and co-planar with the second patterned hardmask layer 3412. Referring to the first cross-sectional view taken along the l-l' axis of the plan view of FIG. 34X, the metallization 3454 fills trenches 3452 and 3454 (i.e., as corresponding to the cross-sectional view taken along the k-k' axis of FIG. 34W) formed in patterned interlayer dielectric layer 3402'''''. Referring to the second cross-sectional view taken along the m-m' axis of the plan view of FIG. 34X, the metallization 3454 also fills trenches 3436 and via openings 3432 and 3426 (i.e., as corresponding to the cross-sectional view taken along the f-f' axis of FIG. 34Q) formed in patterned interlayer dielectric layer 3402'''''. Thus, the metallization 3454 is used to form a plurality of conductive lines and conductive vias in an interlayer dielectric layer for a metallization structure, such as a BEOL metallization structure.

In an embodiment, the metallization 3454 is formed by a metal fill and polish back process. In one such embodiment, the second patterned hardmask layer 3412 is reduced in thickness during the polish back process. In a particular such embodiment, although reduced in thickness, a portion of the second patterned hardmask 3412 is retained, as is depicted in FIG. 34X. Accordingly, metal features 3456 that are neither conductive lines nor conductive vias formed in the patterned interlayer dielectric layer 3402""" remain interleaved with the second patterned hardmask layer and on or above (but not in) the patterned interlayer dielectric layer 3402""", as is also depicted in FIG. 34X. In an alternative particular embodiment (not shown), the second patterned hardmask 3412 is entirely removed during the polish back. Accordingly, metal features 3456 that are neither conductive lines nor conductive vias are not retained in the final structure. In either case, the described structures for FIG. 34X may subsequently be used as a foundation for forming subsequent metal line/via and ILD layers. Alternatively, the structure of FIG. 34X may represent the final metal interconnect layer in an integrated circuit.

It is to be appreciated that the above process operations may be practiced in alternative sequences, not every operation need be performed and/or additional process operations may be performed. Referring again to FIG. 34X, metallization layer fabrication by using a diagonal hardmask may be complete at this stage. A next layer fabricated in a like manner likely requires initiation of the entire process once again. Alternatively, other approaches may be used at this stage to provide additional interconnect layers, such as conventional dual or single damascene approaches.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In accordance with embodiments described herein, optical and SEM metrology for photobuckets is described. It is to be appreciated that the use of a pre-patterned hard mask to define lithographic pattern can make overlay measurements challenging because the response to exposure of such patterning is digital (binary) and feature sizes are quantized. Hence, the size of the underlying mask pattern becomes the minimum measurable unit of overlay, which is too large for effective process control. The approach described below not only enables an overlay measure that is much smaller than the underlying pre-patterned hard mask size, but also provides a signal response that is amplified many times that of the overlay shift, enabling a very accurate overlay measure.

To provide a structural framework for concepts described herein, FIGS. 35A-35D illustrate cross-sectional views and corresponding top-down views representing various operations a patterning processing scheme using pre-patterned hard masks, in accordance with an embodiment of the present disclosure.

Figure 35A:
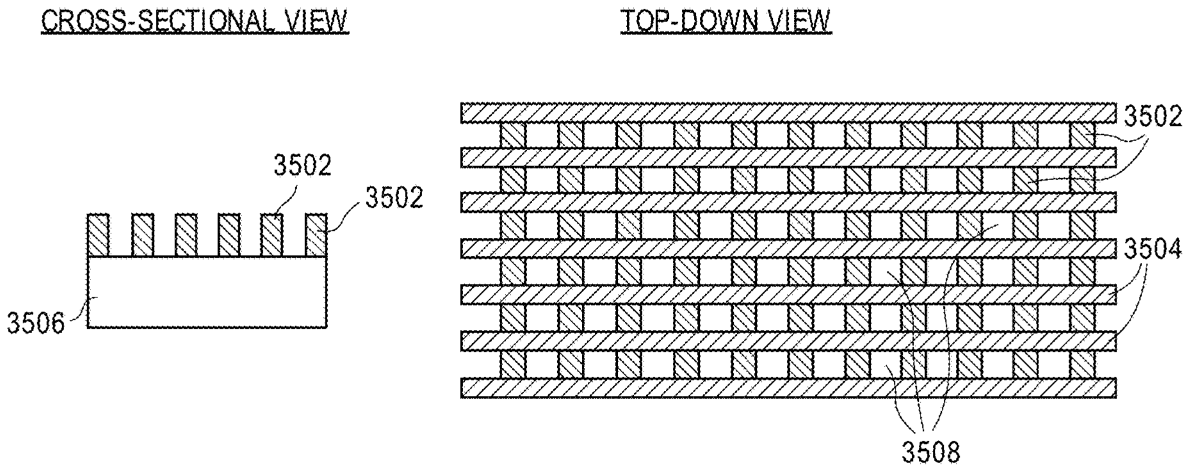
FIGS. 35A-35D illustrate cross-sectional views and corresponding top-down views representing various operations a patterning processing scheme using pre-patterned hard masks, in accordance with an embodiment of the present disclosure.

Referring to FIG. 35A, a first pre-patterned hardmask 3502 and a second pre-patterned hardmask 3504 are formed above an underlying layer 3506. All possible via or plug locations are exposed as openings 3508 in the pre-patterned hardmask 3502 and the second pre-patterned hardmask 3504.

Figure 35B:
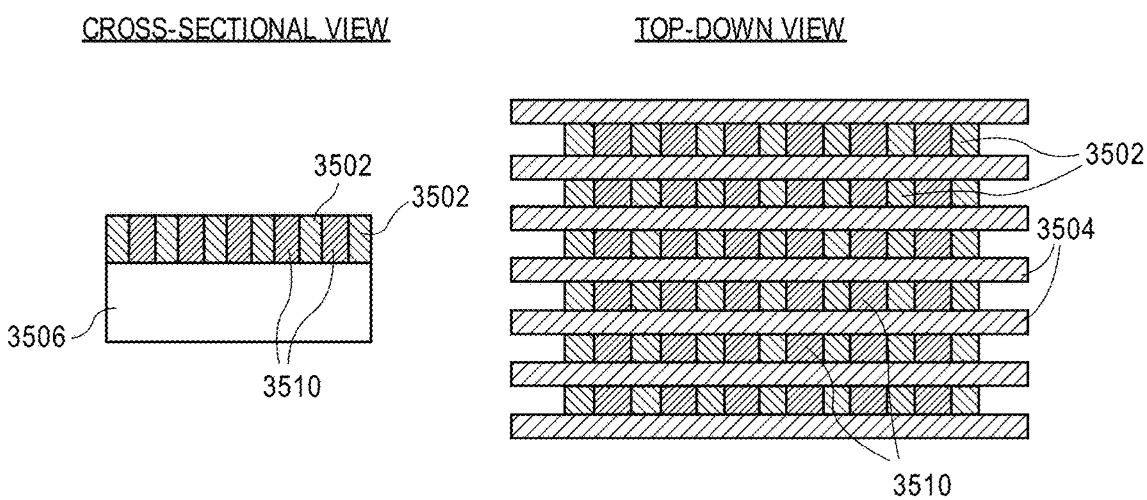

Referring to FIG. 35B, a plurality of photoresist layer portions 3510 is formed in the openings 3508 of FIG. 35A.

Figure 35C:
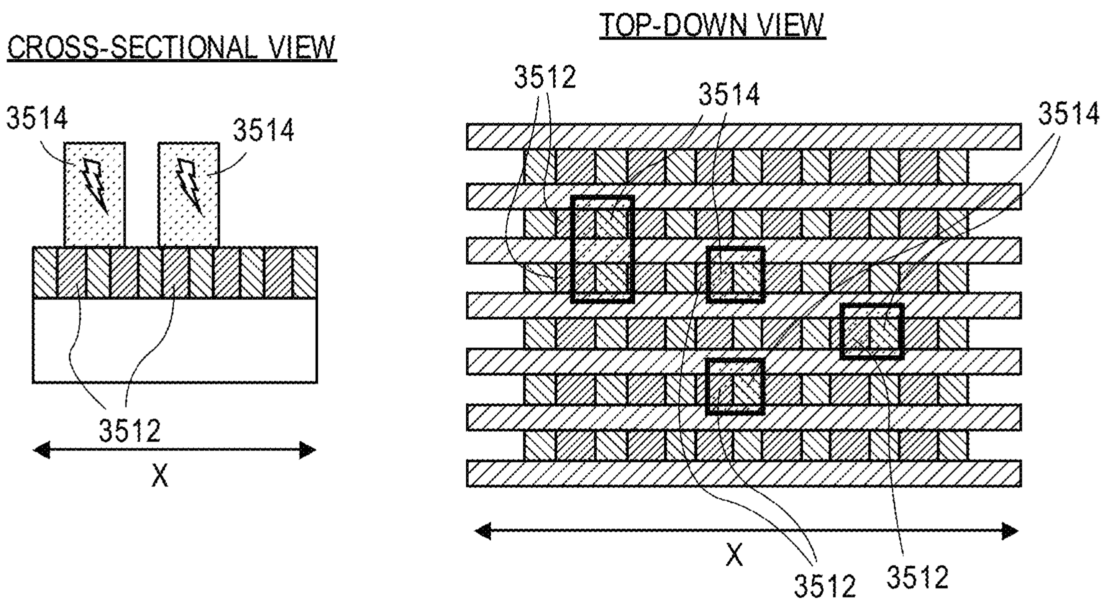

Referring to FIG. 35C, select ones 3512 of the plurality of photoresist layer portions 3510 are exposed by a lithographic exposure 3514. The select ones 3512 of the plurality of photoresist layer portions 3510 exposed by the lithographic exposure 3514 may represent the via or plug locations that will ultimately be opened or selected.

However, in accordance with an embodiment of the present disclosure, the lithographic exposure 3514 has an overlay error in the X-direction of FIG. 35C. For example, the exposed photoresist layer 3512 on the left hand-side of the cross-section view is shifted to the right to an extent that a portion of the photo-resist is not exposed by the lithographic exposure 3514. All exposed photoresist layers 3512 of the top-down view are shifted to the right to an extent that a portion of the photo-resist is not exposed by the lithographic exposure 3514. Furthermore, the shift may be substantial enough to partially expose neighboring locations, as is depicted in FIG. 35C.

Figure 35D:
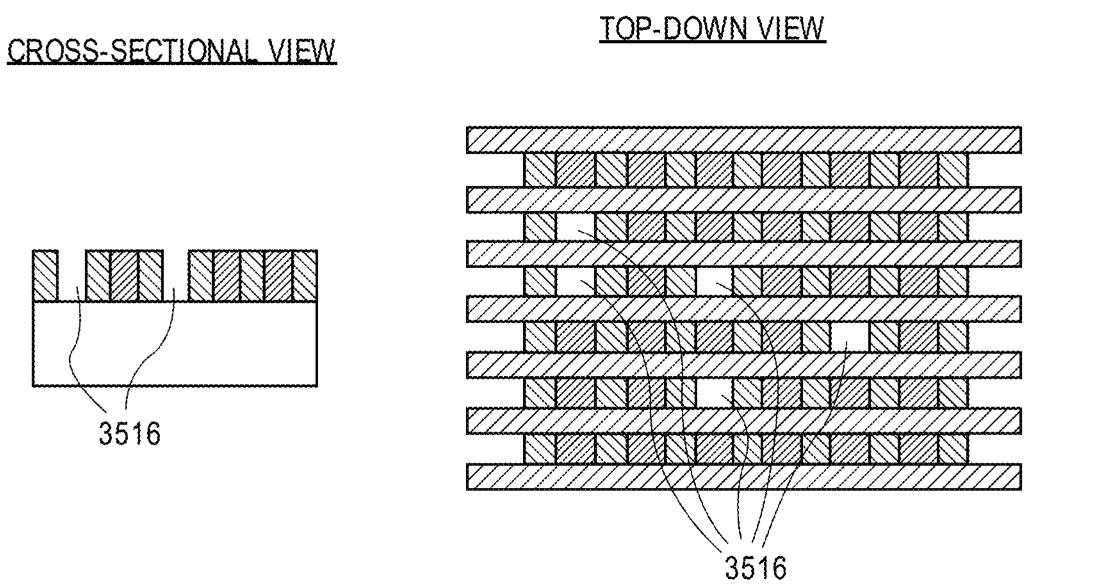

Referring to FIG. 35D, the select locations 3512 are cleared of exposed photo-resist to provide openings 3516.

The openings 3516 may be used for subsequent via or plug fabrication, depending on the specific layer of the semiconductor structure.

However, in the case that an insufficient exposure of the locations 3512 is performed due to overlay error, some openings 3516 may catastrophically not be completely opened. In general, the exposure 3514 must provide a critical number of electrons or photons to completely clear the select ones 3512 of the plurality of photoresist layer portions 3510 to provide openings 3516. Some overlay error may be tolerated, but substantial overlay error may not be tolerated. Additionally, as described in greater detail below, even in the case that all openings 3516 are completely opened, successful fabrication of a next layer may require an overlay measurement based at least to some extent on the openings 3516.

One or more embodiments described herein are directed to approaches involving the use of multi-pitch grating structures on a layer to extract overlay information relative to an underlying layer. Embodiments described herein may be implemented to solve issues associated with measuring overlay between a layer patterned on top of a pre-patterned hardmask (e.g., via or plug) and the underlying pre-patterned hard mask layer (e.g., photobucket) by using an optical metrology tool. In an embodiment, gratings are patterned at two or more pitches that are different from the underlying pre-patterned gratings, but parallel to one of the underlying gratings. A shift in overlay of the current layer versus the hard mask pattern results in an optical signal that moves with the overlay and is proportional to the overlay error. By comparison, optical overlay typically involves real features, thus providing an analogue response. Here, movement is quantized as opposed moving in analogue motion. That is, the response is digital (e.g., digitized and magnified motion) in that it is based on steps. In one embodiment, a "fringe" pattern is measured.

FIGS. 36A-36E described below demonstrate the generation of optical signals using photobuckets that respond to a change in overlay. It is to be appreciated that conventional optical metrology tools measure relatively large targets (e.g., 20-30 microns). For embodiments described herein, structures are generated from arrays of lines/spaces that are below the resolution limit of an inspection tool and which leverage the photobuckets concept to create moving edges that can be detected/measured with conventional overlay measurement algorithms. The final pattern seen by the metrology tool shows measurable optical edges due to diffraction and scattering of light from sub-resolution patterns that move with overlay. FIG. 36F shows a possible optical metrology mark for use in association with FIGS. 36A-36E.

Figure 36A:
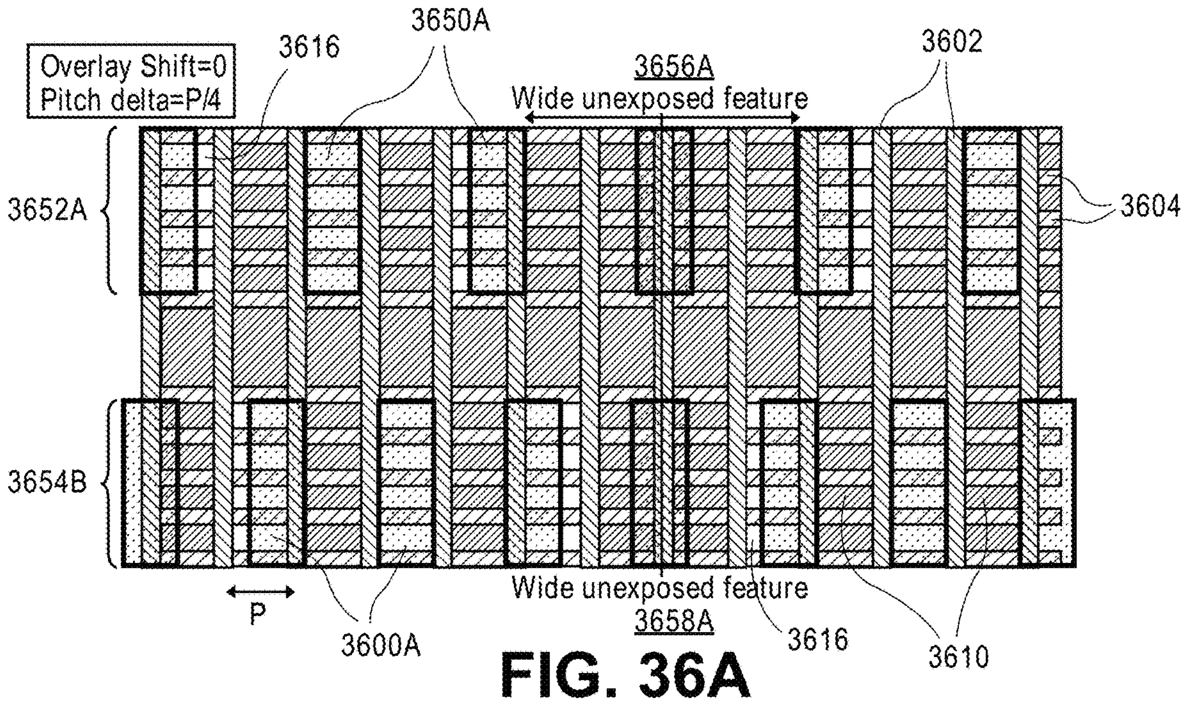
FIG. 36A illustrates a top-down view of an overlay scenario where a current layer is overlaid on an underlying pre-patterned hard mask grid, in accordance with an embodiment of the present disclosure.

FIG. 36A illustrates a top-down view of an overlay scenario where a current layer is overlaid on an underlying pre-patterned hard mask grid, in accordance with an embodiment of the present disclosure.

Referring to FIG. 36A, an underlying layer includes a first pre-patterned hardmask 3602 and a second pre-patterned hardmask 3604. A plurality of photoresist layer portions 3610 and a plurality of openings 3616 (having been exposed and developed) are among the first pre-patterned hardmask 3602 and the second pre-patterned hardmask 3604 structures. A current layer is represented by overlay images 3650A. The overlay images 3650A have an overlay shift of zero and a pitch delta of P/4. The pitch of the overlay images 3650A of the current layer shown as 25% larger (in the top half region 3652A) and 25% smaller (in the bottom half region 3654A) as an exemplary embodiment. Wide unexposed features 3656A and 3658A are included in the current layer, as is depicted in FIG. 36A.

Figure 36B:
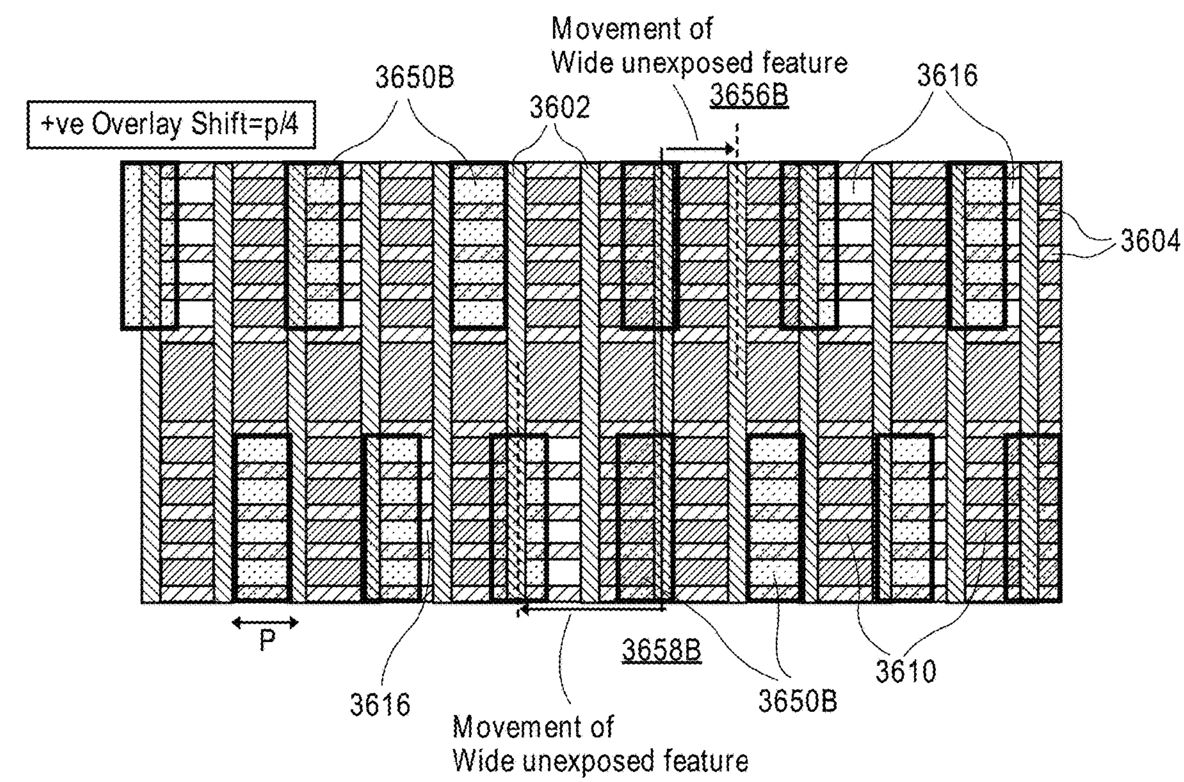
FIG. 36B illustrates a top-down view of an overlay scenario where a current layer has a positive overlay of quarter pitch with respect to an underlying pre-patterned hard mask grid, in accordance with an embodiment of the present disclosure.

FIG. 36B illustrates a top-down view of an overlay scenario where a current layer has a positive overlay of quarter pitch with respect to an underlying pre-patterned hard mask grid, in accordance with an embodiment of the present disclosure.

Referring to FIG. 36B, an underlying layer includes a first pre-patterned hardmask 3602 and a second pre-patterned hardmask 3604. A plurality of photoresist layer portions 3610 and a plurality of openings 3616 (having been exposed and developed) are among the first pre-patterned hardmask 3602 and the second pre-patterned hardmask 3604 structures. A current layer is represented by overlay images 3650B. The overlay images 3650B have a positive (+ve) overlay shift of P/4. Wide unexposed features 3656B and 3658B are included in the current layer, with movement of the wide unexposed features 3656B and 3658B as depicted in FIG. 36B.

Figure 36C:
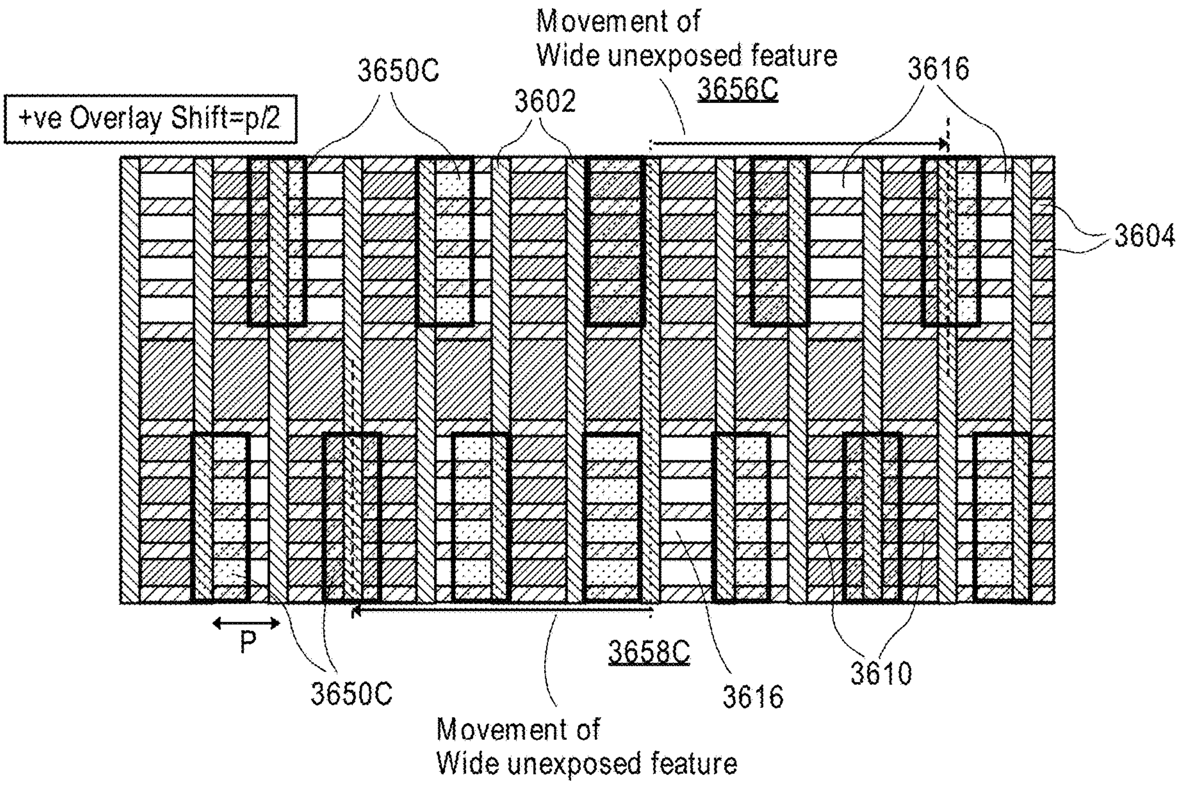
FIG. 36C illustrates a top-down view of an overlay scenario where a current layer has a positive overlay of half pitch with respect to an underlying pre-patterned hard mask grid, in accordance with an embodiment of the present disclosure.

FIG. 36C illustrates a top-down view of an overlay scenario where a current layer has a positive overlay of half pitch with respect to an underlying pre-patterned hard mask grid, in accordance with an embodiment of the present disclosure.

Referring to FIG. 36C, an underlying layer includes a first pre-patterned hardmask 3602 and a second pre-patterned hardmask 3604. A plurality of photoresist layer portions 3610 and a plurality of openings 3616 (having been exposed and developed) are among the first pre-patterned hardmask 3602 and the second pre-patterned hardmask 3604 structures. A current layer is represented by overlay images 3650C. The overlay images 3650C have a positive (+ve) overlay shift of P/2. Wide unexposed features 3656C and 3658C are included in the current layer, with movement of the wide unexposed features 3656C and 3658C as depicted in FIG. 36C.

Figure 36D:
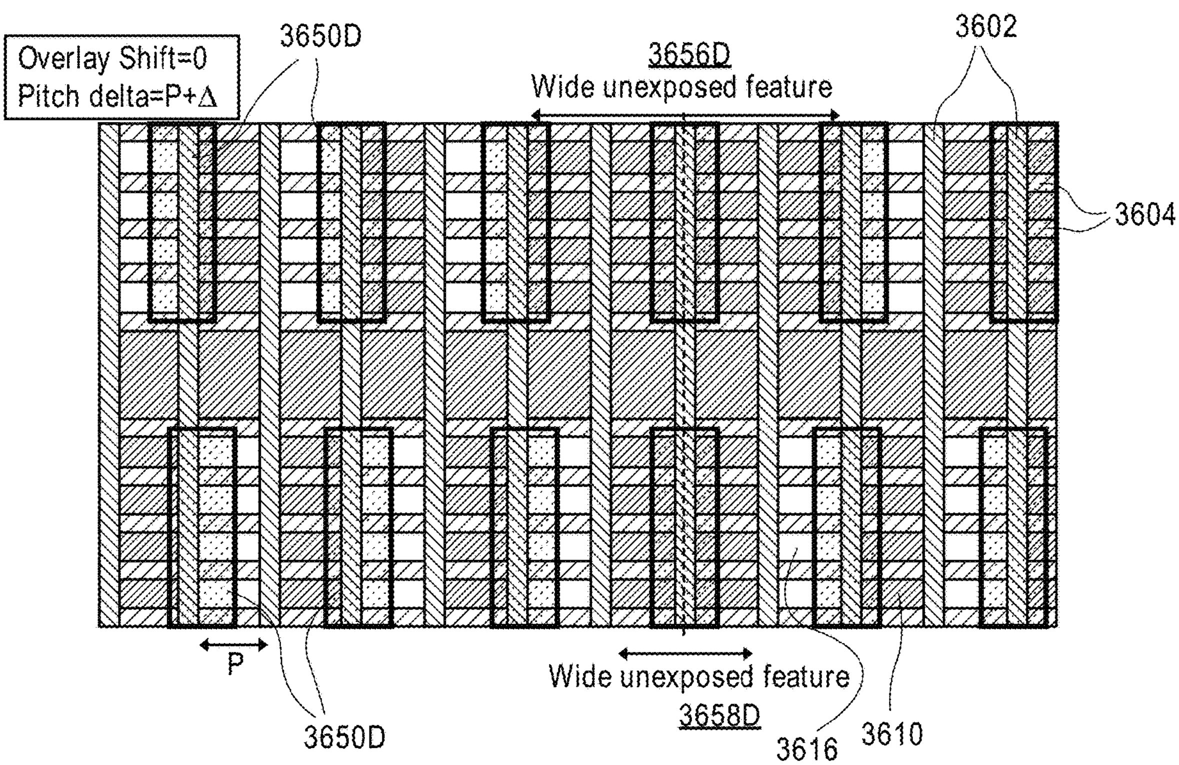
FIG. 36D illustrates a top-down view of an overlay scenario where a current layer has a positive overlay of an arbitrary value Δ with respect to an underlying pre-patterned hard mask grid, in accordance with an embodiment of the present disclosure.

FIG. 36D illustrates a top-down view of an overlay scenario where a current layer has a positive overlay of an arbitrary value Δ with respect to an underlying pre-patterned hard mask grid, in accordance with an embodiment of the present disclosure.

Referring to FIG. 36D, an underlying layer includes a first pre-patterned hardmask 3602 and a second pre-patterned hardmask 3604. A plurality of photoresist layer portions 3610 and a plurality of openings 3616 (having been exposed and developed) are among the first pre-patterned hardmask 3602 and the second pre-patterned hardmask 3604 structures. A current layer is represented by overlay images 3650D. The overlay images 3650D have an overlay shift of zero and a pitch delta of P+Δ. Wide unexposed features 3656D and 3658D are included in the current layer, as is depicted in FIG. 36D.

Figure 36E:
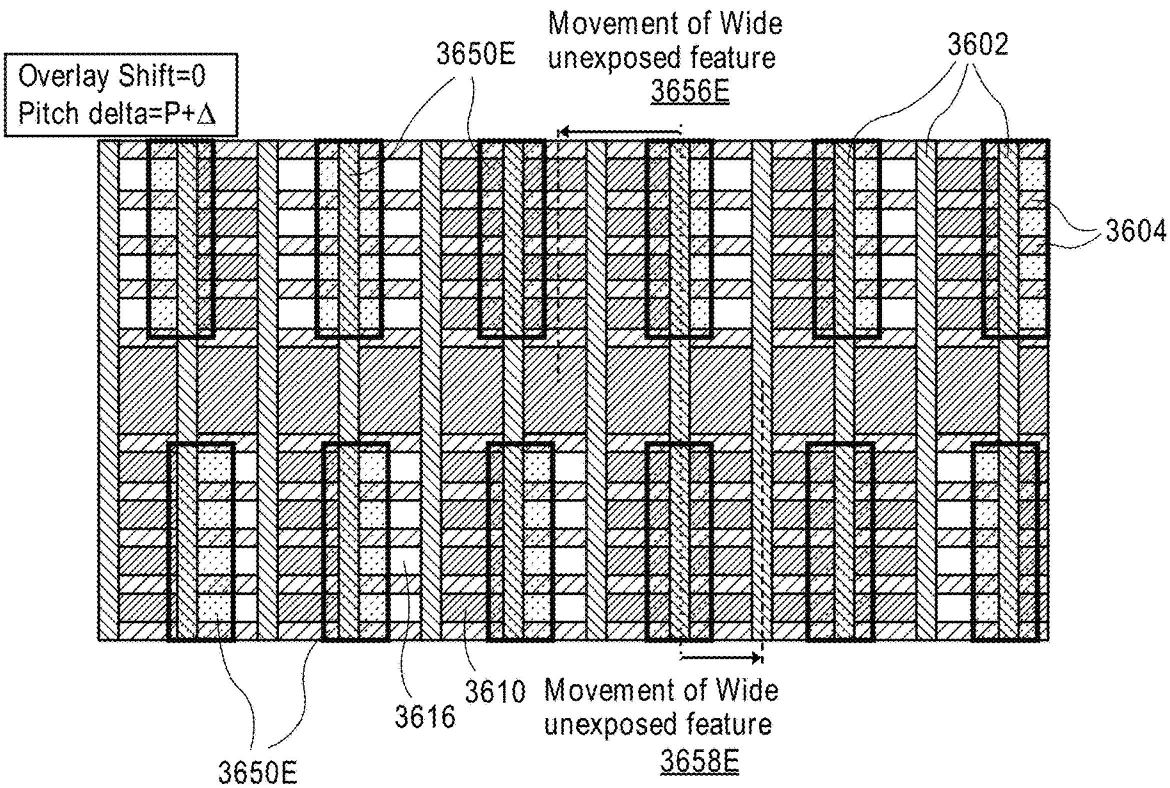
FIG. 36E illustrates a top-down view of an overlay scenario where a current layer has a positive overlay of an arbitrary value Δ with respect to an underlying pre-patterned hard mask grid, where a measurable Δ is made as small as needed by changing s resist sensitivity and/or the drawn feature size, in accordance with an embodiment of the present disclosure.
Figure 36F:
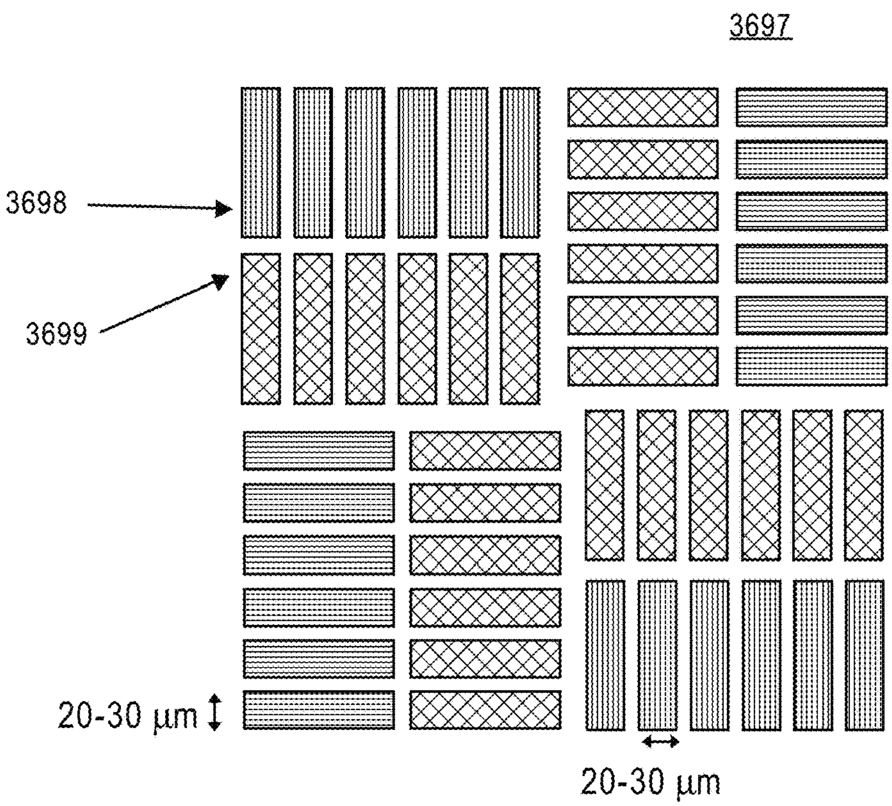
FIG. 36F illustrates an exemplary metrology structure suitable for the approaches described above in association with FIGS. 36A-36E, in accordance with an embodiment of the present disclosure.

FIG. 36E illustrates a top-down view of an overlay scenario where a current layer has a positive overlay of an arbitrary value Δ with respect to an underlying pre-patterned hard mask grid, where a measurable Δ is made as small as needed by changing s resist sensitivity and/or the drawn feature size, in accordance with an embodiment of the present disclosure.

Referring to FIG. 36E, an underlying layer includes a first pre-patterned hardmask 3602 and a second pre-patterned hardmask 3604. A plurality of photoresist layer portions 3610 and a plurality of openings 3616 (having been exposed and developed) are among the first pre-patterned hardmask 3602 and the second pre-patterned hardmask 3604 structures. A current layer is represented by overlay images 3650E. The overlay images 3650E have an overlay shift of +Δ and a pitch delta of P+Δ. Wide unexposed features 3656E and 3658E are included in the current layer, with movement of the wide unexposed features 3656E and 3658E as depicted in FIG. 36E. In an embodiment, for a small overlay shift of Δ, the measured signal is amplified to the order of P, and Δ can be as small as needed.

FIG. 36F illustrates an exemplary metrology structure suitable for the approaches described above in association with FIGS. 36A-36E, in accordance with an embodiment of the present disclosure. Referring to FIG. 36F, a metrology structure 3697 includes both layer 1 features 3698 (e.g., underlying layer) and layer 2 features 3699 (e.g., current layer). In one embodiment, the width of each of the features is approximately 20-30 microns, as is depicted in FIG. 36F. Such a structure may be included in a scribe line or on die in a drop-in cell, for example. In an embodiment, a completed die may include a region having a beat frequency of wide features formed by an array of vias or plugs in a collection of narrow features. The presence of two different beat frequencies in any direction may imply the use of the above described technique to measure overlay. The approach described above may enable accurate measurement of overlay in photobuckets for every via or plug patterning layer that uses the technique. Embodiments may enhance accuracy for future generations of technology while using current technology overlay measurement tools.

One or more embodiments described herein are directed to approaches involving measuring overlay on pre-patterned hardmask (e.g., photobuckets) using critical dimension scanning electron microscopy (CDSEM) techniques. Embodiments described herein may be implemented to solve issues associated with measuring overlay between a via and/or plug layer patterned on top of a pre-patterned hardmask layer (e.g., photobucket layer) and the underlying pre-patterned hardmask layer by using a scanning electron microscope (e.g., CDSEM). In an embodiment, via or plug locations are patterned at pitches that are slightly different from the underlying pre-patterned hardmask pitch. Due to an overlay mismatch, the position of the photobucket that clears depends on the amount of overlay mismatch.

Figure 37A:
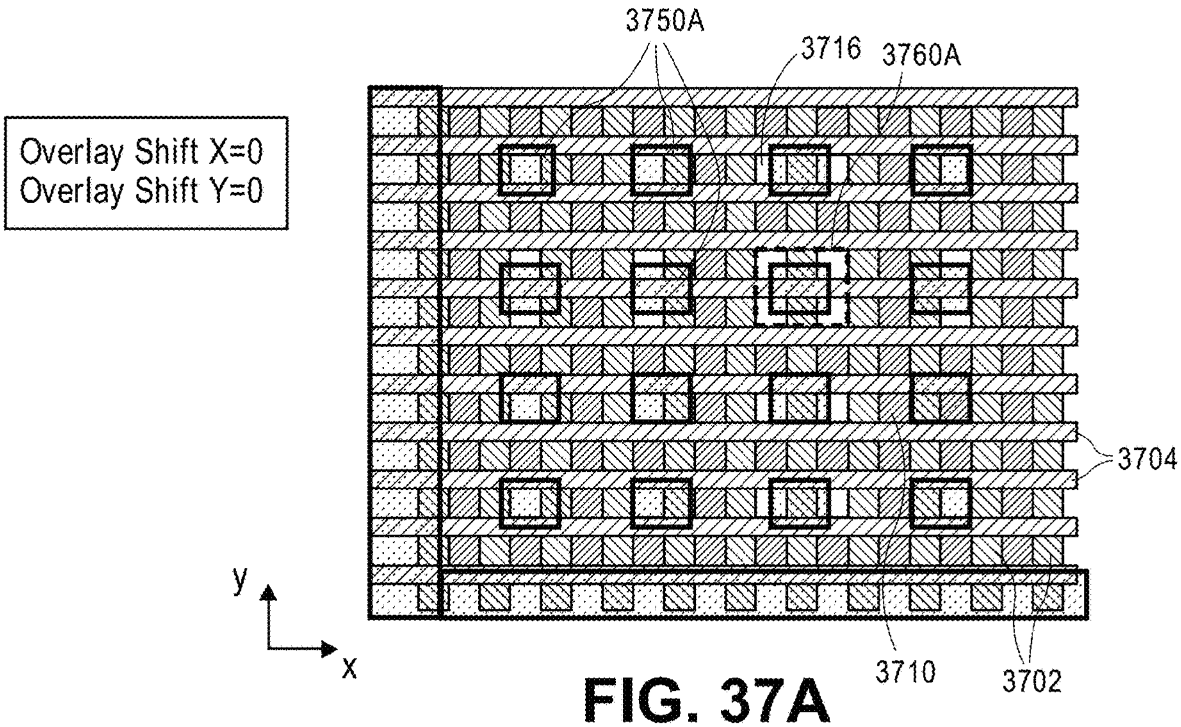
FIG. 37A illustrates a top-down view of an overlay scenario where a current layer is overlaid on an underlying pre-patterned hardmask, in accordance with an embodiment of the present disclosure.

FIG. 37A illustrates a top-down view of an overlay scenario where a current layer is overlaid on an underlying pre-patterned hardmask, in accordance with an embodiment of the present disclosure.

Referring to FIG. 37A, an underlying layer includes a first pre-patterned hardmask 3702 and a second pre-patterned hardmask 3704. A plurality of photoresist layer portions 3710 and a plurality of openings 3716 (having been exposed and developed) are among the first pre-patterned hardmask 3702 and the second pre-patterned hardmask 3704 structures. A current layer is represented by overlay images 3750A. The overlay images 3750A have an overlay shift in X of zero and in Y of zero. The pitch of the overlay images 3750A of the current layer is 25% larger relative to the underlying layer as an exemplary embodiment, i.e., patterned at pitch+Δ, where Δ=P/4. Region 3760A highlights a location of a "photobucket cluster" at zero overlay shift ($PB_{0,0}$).

Figure 37B:
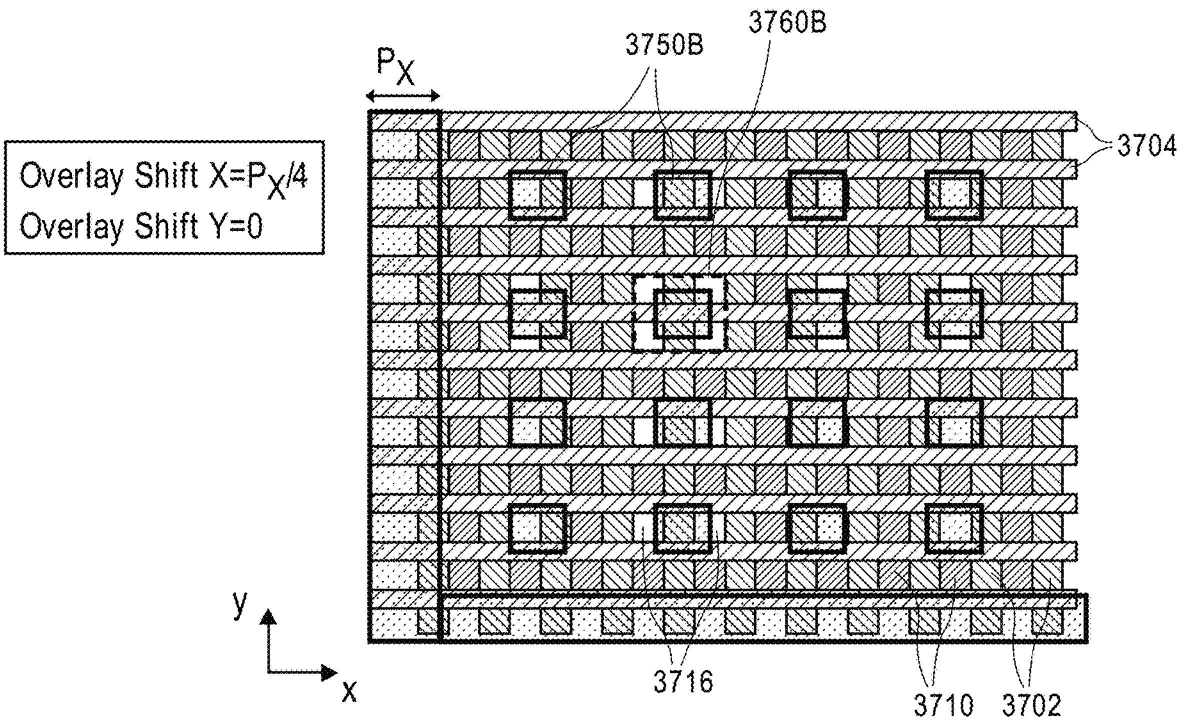
FIG. 37B illustrates a top-down view of an overlay scenario where a current layer has a positive overlay of quarter pitch with respect to the underlying pre-patterned hardmask grid in the X-direction, in accordance with an embodiment of the present disclosure.

FIG. 37B illustrates a top-down view of an overlay scenario where a current layer has a positive overlay shift of quarter pitch with respect to the underlying pre-patterned hardmask grid in the X-direction, in accordance with an embodiment of the present disclosure.

Referring to FIG. 37B, an underlying layer includes a first pre-patterned hardmask 3702 and a second pre-patterned hardmask 3704. A plurality of photoresist layer portions 3710 and a plurality of openings 3716 (having been exposed and developed) are among the first pre-patterned hardmask 3702 and the second pre-patterned hardmask 3704 structures. A current layer is represented by overlay images 3750B. The overlay images 3750B have an overlay shift in X of $P_X/4$ and in Y of zero. The pitch of the overlay images 3750B of the current layer is 25% larger relative to the underlying layer as an exemplary embodiment, i.e., patterned at pitch+Δ, where Δ=P/4. Region 3760B highlights a location of X=−2$P_X$ and Y=0 for a photobucket cluster with respect to $PB_{0,0}$. The region 3760B and corresponding open/closed vertical column move left by an amount equal to twice the pitch. It is to be appreciated that the open/closed column will have a different contrast from the other columns due to the fact that the exposed photobucket density is different from the other columns in the region.

Figure 37C:
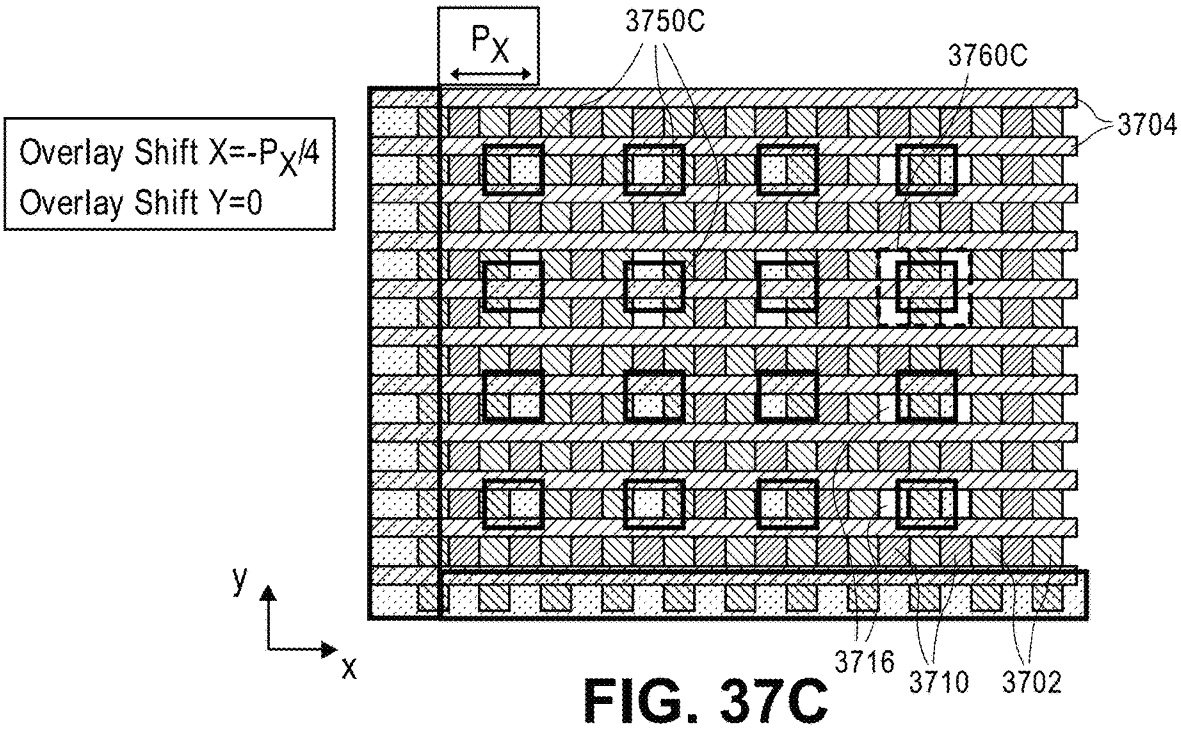
FIG. 37C illustrates a top-down view of an overlay scenario where a current layer has a negative overlay of quarter pitch with respect to the underlying pre-patterned hardmask grid in the X-direction, in accordance with an embodiment of the present disclosure.

FIG. 37C illustrates a top-down view of an overlay scenario where a current layer has a negative overlay of quarter pitch with respect to the underlying pre-patterned hardmask grid in the X-direction, in accordance with an embodiment of the present disclosure.

Referring to FIG. 37C, an underlying layer includes a first pre-patterned hardmask 3702 and a second pre-patterned hardmask 3704. A plurality of photoresist layer portions 3710 and a plurality of openings 3716 (having been exposed and developed) are among the first pre-patterned hardmask 3702 and the second pre-patterned hardmask 3704 structures. A current layer is represented by overlay images 3750C. The overlay images 3750C have an overlay shift in X of −$P_X/4$ and in Y of zero. The pitch of the overlay images 3750C of the current layer is 25% larger relative to the underlying layer as an exemplary embodiment, i.e., patterned at pitch+Δ, where Δ=P/4. Region 3760C highlights a location of X=+2$P_X$ and Y=0 for a photobucket cluster with respect to $PB_{0,0}$. The region 3760C and corresponding open/closed vertical column move right by an amount equal to twice the pitch.

Figure 37D:
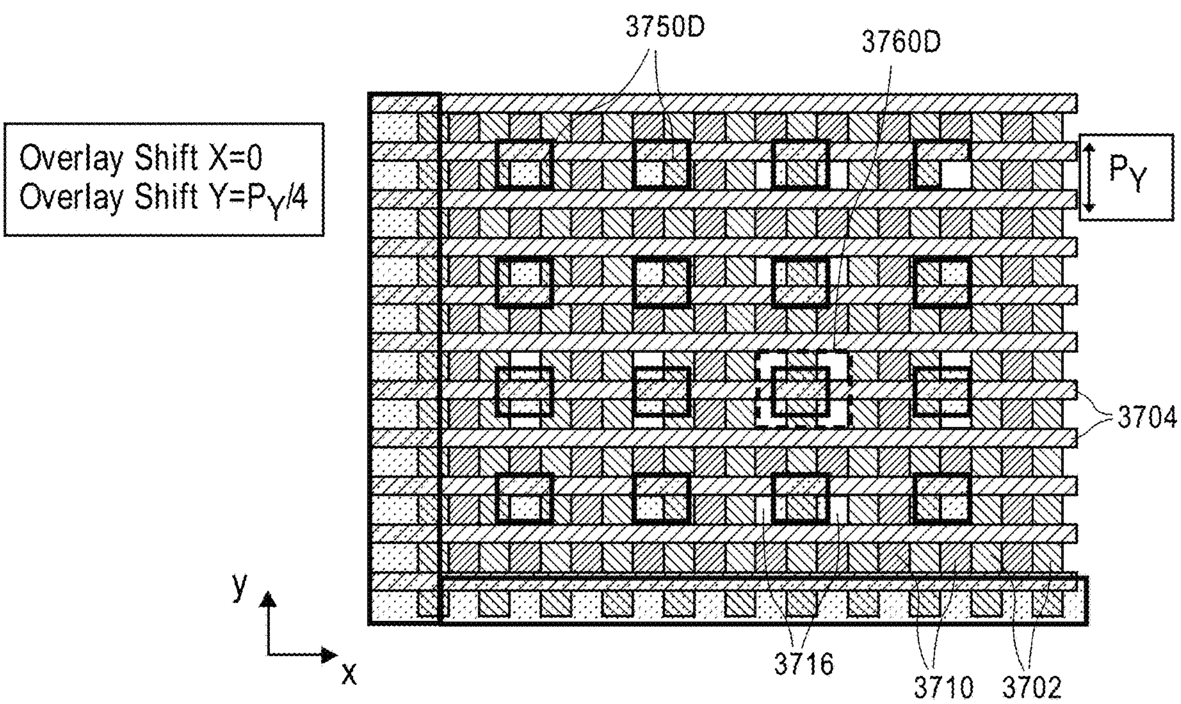
FIG. 37D illustrates a top-down view of an overlay scenario where a current layer has a positive overlay of quarter pitch with respect to the underlying pre-patterned hardmask grid in the Y-direction, in accordance with an embodiment of the present disclosure.

FIG. 37D illustrates a top-down view of an overlay scenario where a current layer has a positive overlay of quarter pitch with respect to the underlying pre-patterned hardmask grid in the Y-direction, in accordance with an embodiment of the present disclosure.

Referring to FIG. 37D, an underlying layer includes a first pre-patterned hardmask 3702 and a second pre-patterned hardmask 3704. A plurality of photoresist layer portions 3710 and a plurality of openings 3716 (having been exposed and developed) are among the first pre-patterned hardmask 3702 and the second pre-patterned hardmask 3704 structures. A current layer is represented by overlay images 3750D. The overlay images 3750D have an overlay shift in X of zero and in Y of $P_Y/4$. The pitch of the overlay images 3750D of the current layer is 25% larger relative to the underlying layer as an exemplary embodiment, i.e., patterned at pitch+Δ, where Δ=P/4. Region 3760D highlights a location of X=0 and Y=−2$P_Y$ for a photobucket cluster with respect to $PB_{0,0}$. The region 3760D and corresponding open/closed horizontal row move down by an amount equal to twice the pitch.

Figure 37E:
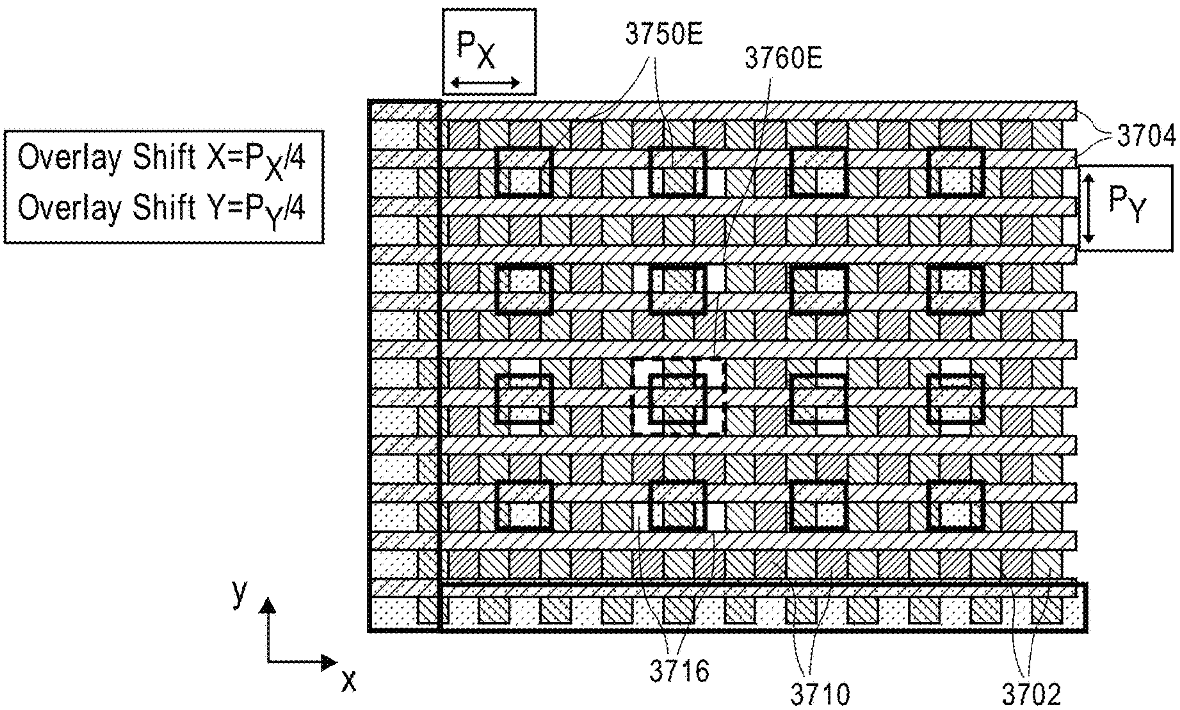
FIG. 37E illustrates a top-down view of an overlay scenario where a current layer has a positive overlay of quarter pitch with respect to the underlying pre-patterned hardmask grid in the X-direction and has a positive overlay of quarter pitch with respect to the underlying pre-patterned hardmask grid in the Y-direction, in accordance with an embodiment of the present disclosure.

FIG. 37E illustrates a top-down view of an overlay scenario where a current layer has a positive overlay of quarter pitch with respect to the underlying pre-patterned hardmask grid in the X-direction and has a positive overlay of quarter pitch with respect to the underlying pre-patterned hardmask grid in the Y-direction, in accordance with an embodiment of the present disclosure.

Referring to FIG. 37E, an underlying layer includes a first pre-patterned hardmask 3702 and a second pre-patterned hardmask 3704. A plurality of photoresist layer portions

3710 and a plurality of openings 3716 (having been exposed and developed) are among the first pre-patterned hardmask 3702 and the second pre-patterned hardmask 3704 structures. A current layer is represented by overlay images 3750E. The overlay images 3750E have an overlay shift in X of $P_X/4$ and in Y of $P_Y/4$. The pitch of the overlay images 3750E of the current layer is 25% larger relative to the underlying layer as an exemplary embodiment, i.e., patterned at pitch+Δ, where Δ=P/4. Region 3760E highlights a location of $X=-2P_X$ and $Y=-2P_Y$ for a photobucket cluster with respect to $PB_{0,0}$. The region 3760E and corresponding open/closed horizontal row move down by an amount equal to twice the pitch. Additionally, the region 3760E and corresponding open/closed vertical column move left by an amount equal to twice the pitch.

With reference again to FIGS. 37A-37E, it is to be appreciated that cross-sectional analysis of a semiconductor chip may reveal an alignment mark that includes vertical and horizontal arrays of vias and/or plugs among a plurality of gridded vias and plugs as indicative of the application of one or more embodiments described herein. Such structures may be included in a scribe line or on die in a drop-in cell, for example. The application of such an approach may enable accurate measurement of overlay in photobuckets for every via and/or plug patterning layer that is intended for use with CD SEM metrology. It is also to be appreciated that conventional overlay techniques may not work with this style of patterning.

In accordance with an embodiment of the present disclosure, new structures for high resolution phase shift masks (PSM) fabrication for lithography, such as extreme ultraviolet lithography (EUV), are described. Such PSM masks may be used for general (direct) lithography or complementary lithography.

Photolithography is commonly used in a manufacturing process to form patterns in a layer of photoresist. In the photolithography process, a photoresist layer is deposited over an underlying layer that is to be etched. Typically, the underlying layer is a semiconductor layer, but may be any type of hardmask or dielectric material. The photoresist layer is then selectively exposed to radiation through a photomask or reticle. The photoresist is then developed and those portions of the photoresist that are exposed to the radiation are removed, in the case of "positive" photoresist.

The photomask or reticle used to pattern the wafer is placed within a photolithography exposure tool, commonly known as a "stepper" or "scanner." In the stepper or scanner machine, the photomask or reticle is placed between a radiation source and a wafer. The photomask or reticle is typically formed from patterned chrome (absorber layer) placed on a quartz substrate. The radiation passes substantially unattenuated through the quartz sections of the photomask or reticle in locations where there is no chrome. In contrast, the radiation does not pass through the chrome portions of the mask. Because radiation incident on the mask either completely passes through the quartz sections or is completely blocked by the chrome sections, this type of mask is referred to as a binary mask. After the radiation selectively passes through the mask, the pattern on the mask is transferred into the photoresist by projecting an image of the mask into the photoresist through a series of lenses.

As features on the photomask or reticle become closer and closer together, diffraction effects begin to take effect when the size of the features on the mask are comparable to the wavelength of the light source. Diffraction blurs the image projected onto the photoresist, resulting in poor resolution.

One state of the art method of preventing diffraction patterns from interfering with the desired patterning of the photoresist is to cover selected openings in the photomask or reticle with a transparent layer known as a shifter. The shifter shifts one of the sets of exposing rays out of phase with another adjacent set, which nullifies the interference pattern from diffraction. This approach is referred to as a phase shift mask (PSM) approach. Nevertheless, alternative mask fabrication schemes that reduce defects and increase throughput in mask production are important focus areas of lithography process development.

One or more embodiments of the present disclosure are directed to methods for fabricating lithographic masks and the resulting lithographic masks. To provide context, the requirement to meet aggressive device scaling goals set forth by the semiconductor industry harbors on the ability of lithographic masks to pattern smaller features with high fidelity. However, approaches to pattern smaller and smaller features present formidable challenges for mask fabrication. In this regard, lithographic masks widely in use today rely on the concept of phase shift mask (PSM) technology to pattern features. However, reducing defects while creating smaller and smaller patterns remains one of the biggest obstacles in mask fabrication. Use of the phase shift mask may have several disadvantages. First, the design of a phase shift mask is a relatively complicated procedure that requires significant resources. Second, because of the nature of a phase shift mask, it is difficult to check whether or not defects are present in the phase shift mask. Such defects in phase shift masks arise out of the current integration schemes employed to produce the mask itself. Conventional phase shift masks adopt a cumbersome and somewhat defect prone approach to pattern thick light absorbing materials and then transfer the pattern to a secondary layer that aids in the phase shifting. To complicate matters, the absorber layer is subjected to plasma etch twice and, consequently, unwanted effects of plasma etch such as loading effects, reactive ion etch lag, charging and reproducible effects leads to defects in mask production.

Innovation in materials and novel integration techniques to fabricate defect free lithographic masks remains a high priority to enable device scaling. Accordingly, in order to exploit the full benefits of a phase shift mask technology, a novel integration scheme that employs (i) patterning a shifter layer with high fidelity and (ii) patterning an absorber only once and during the final stages of fabrication may be needed. Additionally, such a fabrication scheme may also offer other advantages such as flexibility in material choices, decreased substrate damage during fabrication, and increased throughput in mask fabrication.

Figure 38:
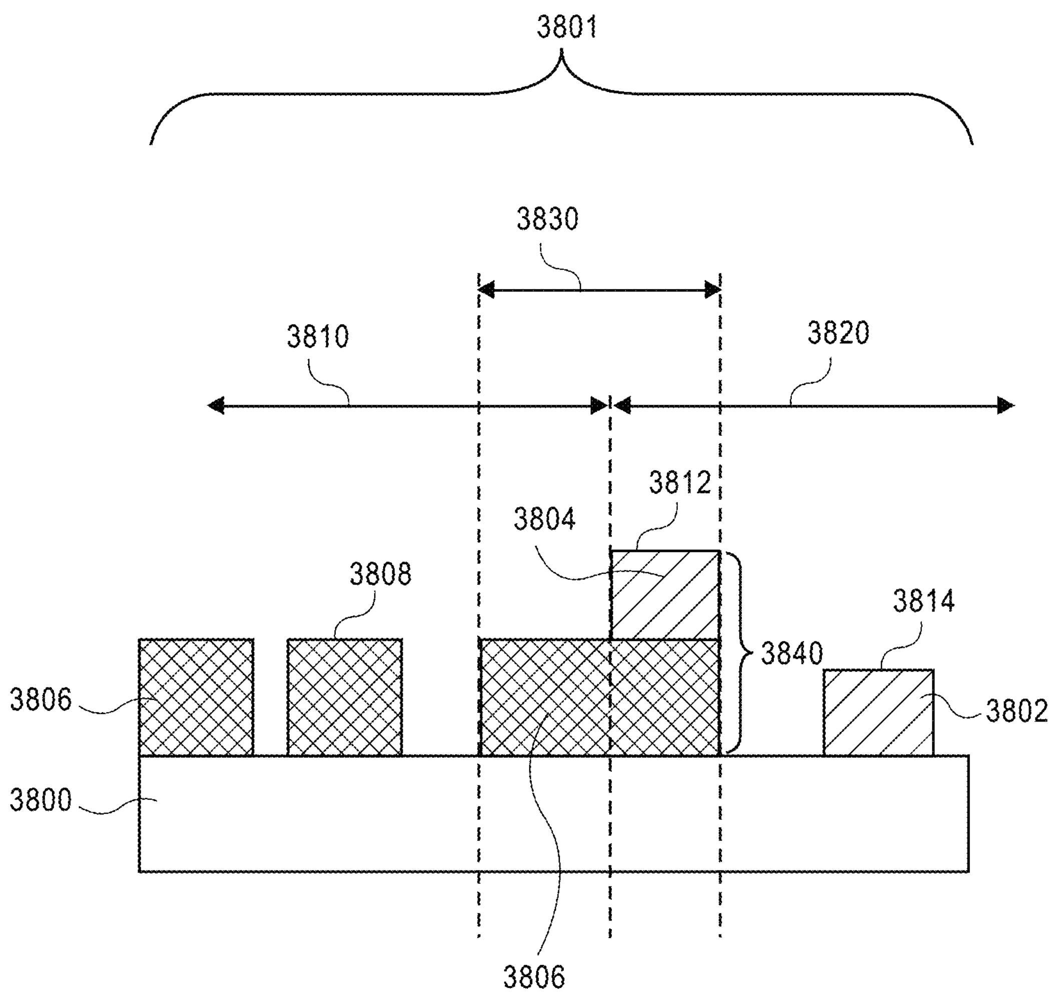
FIG. 38 illustrates a cross sectional view of a lithography mask structure, in accordance with an embodiment of the present disclosure.

FIG. 38 illustrates a cross sectional view of a lithography mask structure 3801 in accordance with an embodiment of the present disclosure. The lithography mask 3801 includes an in-die region 3810, a frame region 3820 and a die-frame interface region 3830. The die-frame interface region 3830 includes adjacent portions of the in-die region 3810 and the frame region 3820. The in-die region 3810 includes a patterned shifter layer 3806 disposed directly on a substrate 3800, wherein the patterned shifter layer has features that have sidewalls. The frame region 3820 surrounds the in-die region 3810 and includes a patterned absorber layer 3802 disposed directly on the substrate 3800.

The die-frame interface region 3830, disposed on substrate 3800, includes a dual layer stack 3840. The dual layer stack 3840 includes an upper layer 3804, disposed on the lower patterned shifter layer 3806. The upper layer 3804 of the dual layer stack 3840 is composed of a same material as the patterned absorber layer 3802 of the frame region 3820.

In an embodiment, an uppermost surface 3808 of the features of the patterned shifter layer 3806 have a height that is different than an uppermost surface 3812 of features of the die-frame interface region and different than an uppermost surface 3814 of the features in the frame region. Furthermore, in an embodiment the height of the uppermost surface 3812 of the features of the die-frame interface region is different than the height of the uppermost surface 3814 of the features of the frame region. Typical thickness of the phase shifter layer 3806 ranges from 40-100 nm, while a typical thickness of the absorber layer ranges from 30-100 nm. In an embodiment, the thickness of the absorber layer 3802 in the frame region 3820 is 50 nm, the combined thickness of the absorber layer 3804 which is disposed on the shifter layer 3806 in the die-frame interface region 3830 is 120 nm and the thickness of the absorber in the frame region is 70 nm. In an embodiment, the substrate 3800 is quartz, the patterned shifter layer includes a material such as but not limited to molybdenum-silicide, molybdenum-silicon oxynitride, molybdenum-silicon nitride, silicon oxynitride, or silicon nitride, and the absorber material is chrome.

In accordance with an embodiment of the present disclosure, complementary electron beam lithography is described. One or more embodiments described herein are directed to lithographic approaches and tooling involving or suitable for complementary e-beam lithography (CEBL), including semiconductor processing considerations when implementing such approaches and tooling.

Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). The process of transferring integrated circuit (IC) designs to the wafer entails the following: optical lithography to print unidirectional lines (either strictly unidirectional or predominantly unidirectional) in a pre-defined pitch, pitch division techniques to increase line density, and EBL to "cut" the lines. EBL is also used to pattern other critical layers, notably contact and via holes. Optical lithography can be used alone to pattern other layers. When used to complement optical lithography, EBL is referred to as CEBL, or complementary EBL. CEBL is directed to cutting lines and holes. By not attempting to pattern all layers, CEBL plays a complementary but crucial role in meeting the industry's patterning needs at advanced (smaller) technology nodes (e.g., 10 nm or smaller such as 7 nm or 5 nm technology nodes). CEBL also extends the use of current optical lithography technology, tools and infrastructure.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

As described above, electron beam (ebeam) lithography may be implemented to complement standard lithographic techniques in order to achieved desired scaling of features for integrated circuit fabrication. An electron beam lithography tool may be used to perform the ebeam lithography. In an exemplary embodiment, FIG. 39 is a cross-sectional schematic representation of an ebeam column of an electron beam lithography apparatus.

Figure 39:
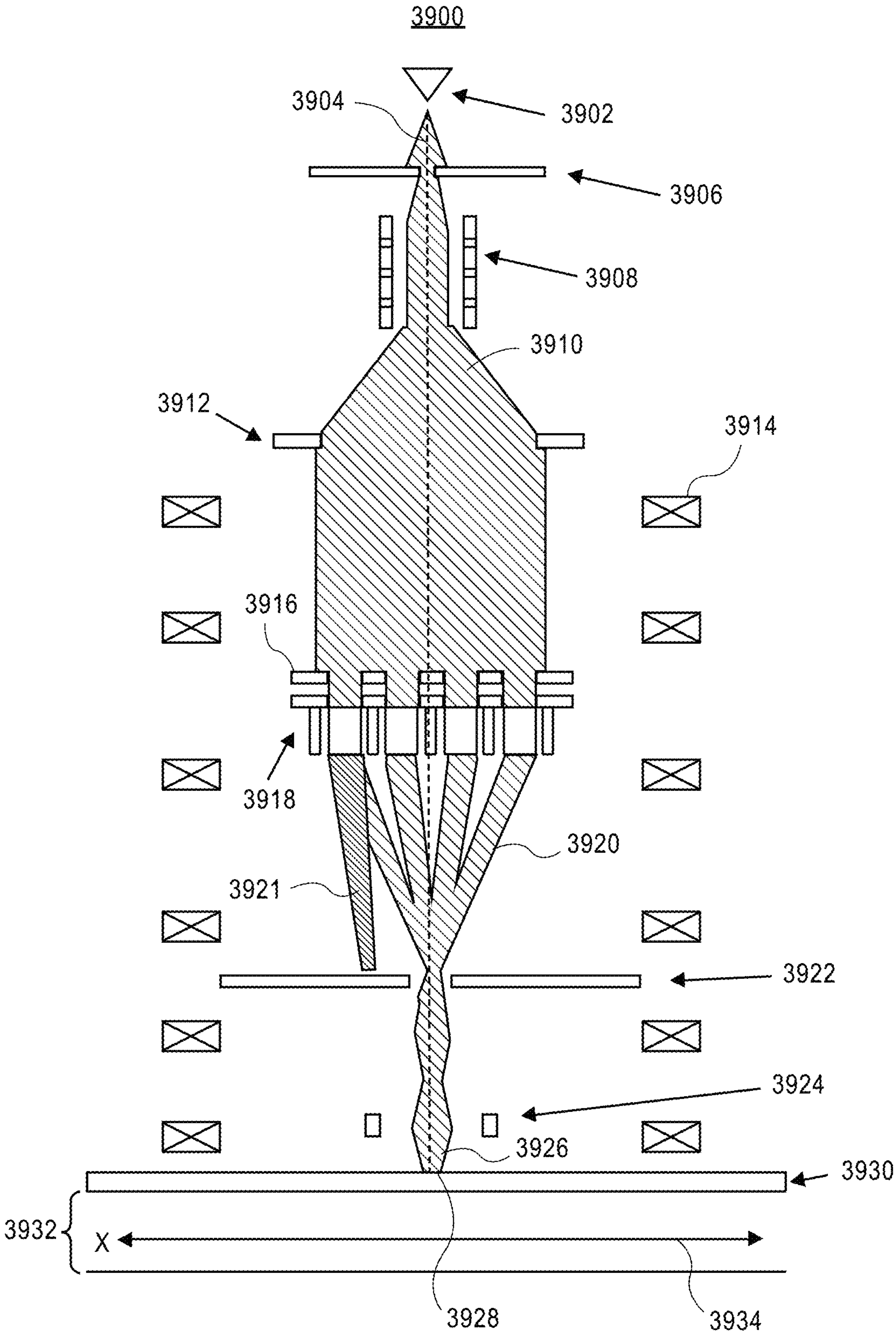
FIG. 39 is a cross-sectional schematic representation of an ebeam column of an electron beam lithography apparatus.

Referring to FIG. 39, an ebeam column 3900 includes an electron source 3902 for providing a beam of electrons 3904. The beam of electrons 3904 is passed through a limiting aperture 3906 and, subsequently, through high aspect ratio illumination optics 3908. The outgoing beam 3910 is then passed through a slit 3912 and may be controlled by a slim lens 3914, e.g., which may be magnetic. Ultimately, the beam 3904 is passed through a shaping aperture 3916 (which may be a one-dimensional (1-D) shaping aperture) and then through a blanker aperture array (BAA) 3918. The BAA 3918 includes a plurality of physical apertures therein, such as openings formed in a thin slice of silicon. It may be the case that only a portion of the BAA 3918 is exposed to the ebeam at a given time. Alternatively, or in conjunction, only a portion 3920 of the ebeam 3904 that passes through the BAA 3918 is allowed to pass through a final aperture 3922 (e.g., beam portion 3921 is shown as blocked) and, possibly, a stage feedback deflector 3924.

Referring again to FIG. 39, the resulting ebeam 3926 ultimately impinges as a spot 3928 on a surface of a wafer 3930, such as a silicon wafer used in IC manufacture. Specifically, the resulting ebeam may impinge on a photoresist layer on the wafer, but embodiments are not so limited. A stage scan 3932 moves the wafer 3930 relative to the beam 3926 along the direction of the arrow 3934 shown in FIG. 39. It is to be appreciated that an ebeam tool in its entirely may include numerous columns 3900 of the type depicted in FIG. 39. Also, the ebeam tool may have an associated base computer, and each column may further have a corresponding column computer.

In an embodiment, when referring below to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the ebeam through to the sample or deflects the beam into, e.g., a Faraday cup or blanking aperture. The ebeam column or apparatus including such a BAA may be built to deflect the overall beam coverage to just a portion of the BAA, and then individual openings in the BAA are electrically configured to pass the ebeam ("on") or not pass ("off"). For example, un-deflected electrons pass through to the wafer and expose a resist layer, while deflected electrons are caught in the Faraday cup or blanking aperture. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example provided below, the spots generated from the BAA 4310 have a pitch the same as the pitch of the lines 4300 (when both columns of BAA openings are considered together). Meanwhile, the spots generated from only one column of the staggered array of the BAA 4310 have twice the pitch as the pitch of the lines 4300.

Figure 40:
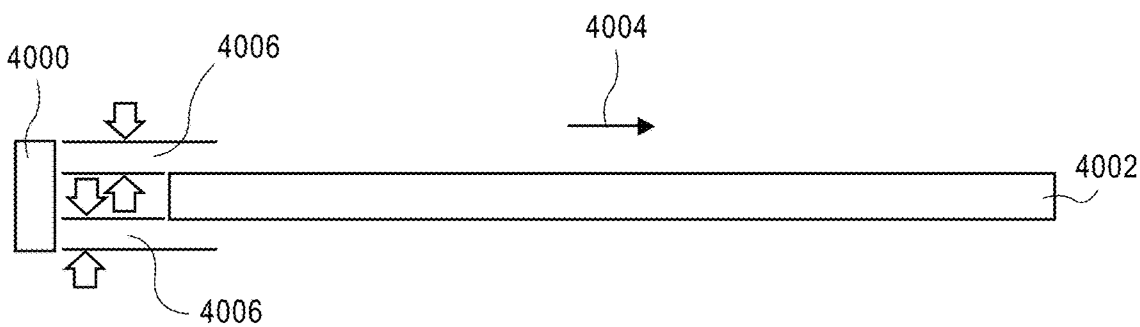
FIG. 40 illustrates an aperture (left) of a blanking aperture array (BAA) relative to a line (right) to be cut or to have vias placed in targeted locations while the line is scanned under the aperture.

In an embodiment, a staggered beam aperture array is implemented to solve throughput of an ebeam machine while also enabling minimum wire pitch. With no stagger, consideration of edge placement error (EPE) means that a minimum pitch that is twice the wire width cannot be cut since there is no possibility of stacking vertically in a single stack. For example, FIG. 40 illustrates an aperture 4000 of a BAA relative to a line 4002 to be cut or to have vias placed in targeted locations while the line is scanned along the direction of the arrow 4004 under the aperture 4000. Referring to FIG. 40, for a given line 4002 to be cut or vias to be placed, the EPE 4006 of the cutter opening (aperture) results in a rectangular opening in the BAA grid that is the pitch of the line.

Figure 41:
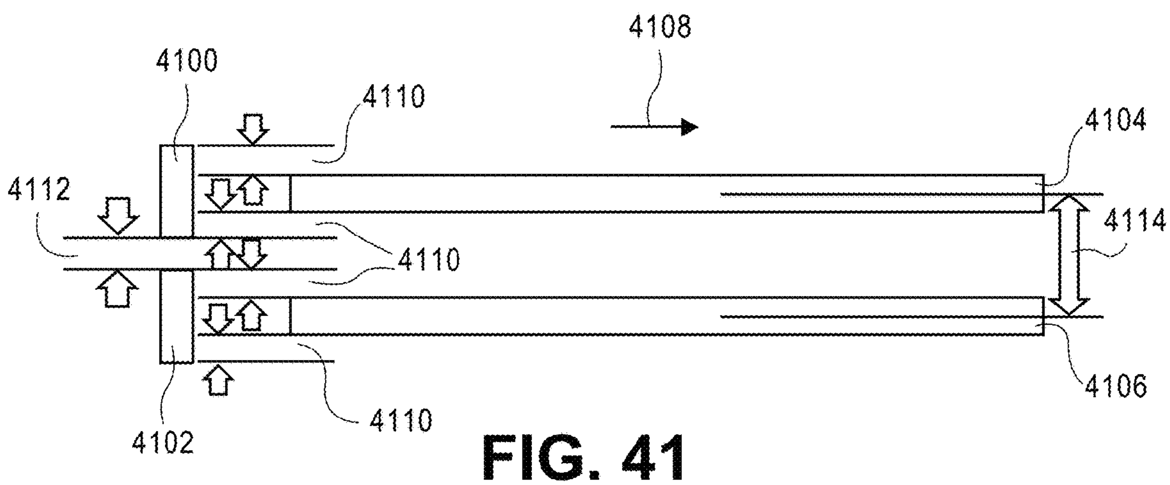
FIG. 41 illustrates two non-staggered apertures (left) of a BAA relative to two lines (right) to be cut or to have vias placed in targeted locations while the lines are scanned under the apertures.

FIG. 41 illustrates two non-staggered apertures 4100 and 4102 of a BAA relative to two lines 4104 and 4106, respectively, to be cut or to have vias placed in targeted locations while the lines are scanned along the direction of the arrow 4108 under the apertures 4100 and 4102. Referring to FIG. 41, when the rectangular opening 4000 of FIG. 40 is placed in a vertical single column with other such rectangular openings (e.g., now as 4100 and 4102), the allowed pitch of the lines to be cut is limited by 2×EPE 4110 plus the distance requirement 4112 between the BAA opens 4100 and 4102 plus the width of one wire 4104 or 4106. The resulting spacing 4114 is shown by the arrow on the far right of FIG. 41. Such a linear array may severely limit the pitch of the wiring to be substantially greater than 3-4× of the width of the wires, which may be unacceptable. Another possibly unacceptable alternative would be to cut tighter pitch wires in two (or more) passes with slightly offset wire locations; this approach could severely limit the throughput of the ebeam machine.

Figure 42:
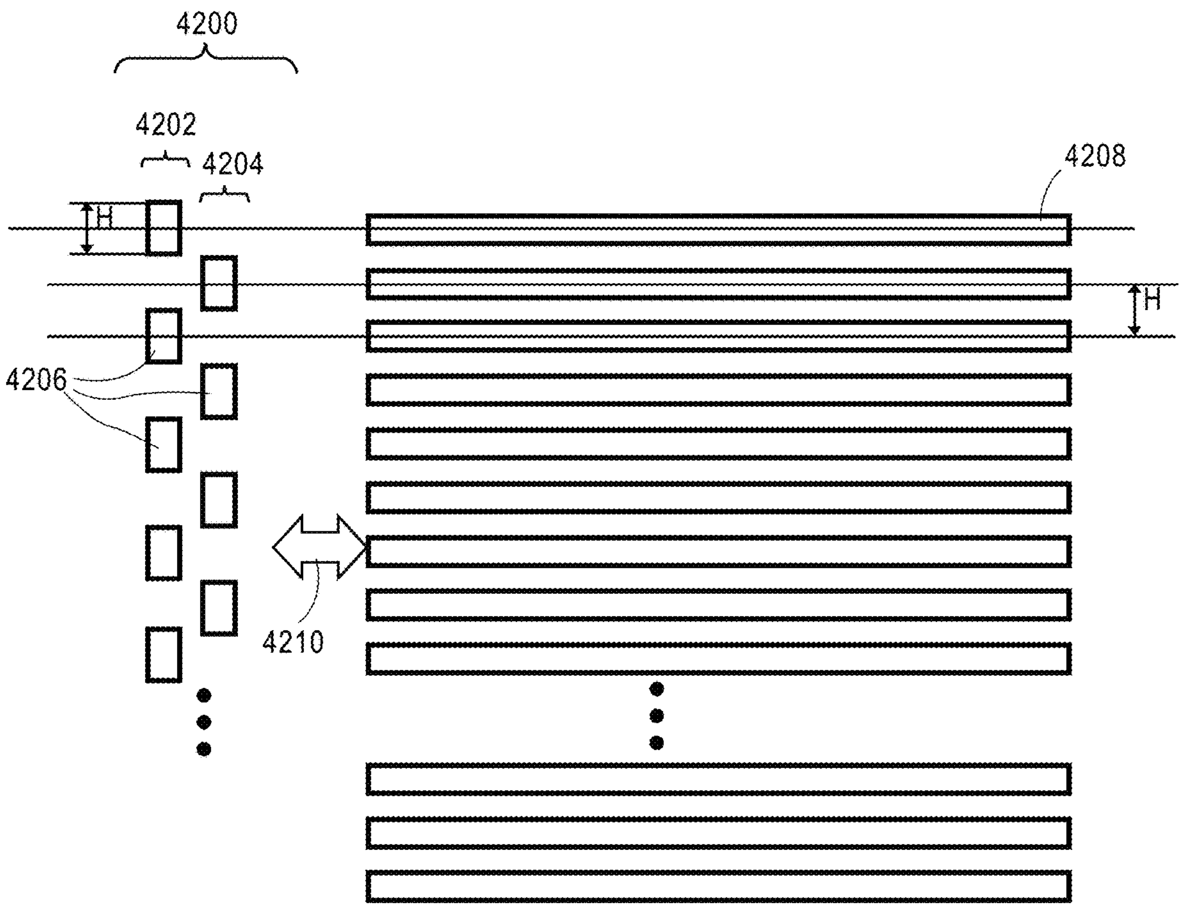
FIG. 42 illustrates two columns of staggered apertures (left) of a BAA relative to a plurality of lines (right) to be cut or to have vias placed in targeted locations while the lines are scanned under the apertures, with scanning direction shown by the arrow, in accordance with an embodiment of the present disclosure.

By contrast to FIG. 41, FIG. 42 illustrates two columns 4202 and 4204 of staggered apertures 4206 of a BAA 4200 relative to a plurality of lines 4208 to be cut or to have vias placed in targeted locations while the lines 4208 are scanned along the direction 4210 under the apertures 4206, with scanning direction shown by the arrow, in accordance with an embodiment of the present disclosure. Referring to FIG. 41, a staggered BAA 4200 includes two linear arrays 4202 and 4204, staggered spatially as shown. The two staggered arrays 4202 and 4204 cut (or place vias at) alternate lines 4208. The lines 4208 are, in one embodiment, placed on a tight grid at twice the wire width. As used throughout the present disclosure, the term staggered array can refer to a staggering of openings 4206 that stagger in one direction (e.g., the vertical direction) and either have no overlap or have some overlap when viewed as scanning in the orthogonal direction (e.g., the horizontal direction). In the latter case, the effective overlap provides for tolerance in misalignment.

It is to be appreciated that, although a staggered array is shown herein as two vertical columns for simplicity, the openings or apertures of a single "column" need not be columnar in the vertical direction. For example, in an embodiment, so long as a first array collectively has a pitch in the vertical direction, and a second array staggered in the scan direction from the first array collectively has the pitch in the vertical direction, the a staggered array is achieved. Thus, reference to or depiction of a vertical column herein can actually be made up of one or more columns unless specified as being a single column of openings or apertures. In one embodiment, in the case that a "column" of openings is not a single column of openings, any offset within the "column" can be compensated with strobe timing. In an embodiment, the critical point is that the openings or apertures of a staggered array of a BAA lie on a specific pitch in the first direction, but are offset in the second direction to allow them to place cuts or vias without any gap between cuts or vias in the first direction.

Thus, one or more embodiments are directed to a staggered beam aperture array where openings are staggered to allow meeting EPE cuts and/or via requirements as opposed to an inline arrangement that cannot accommodate for EPE technology needs. By contrast, with no stagger, the problem of edge placement error (EPE) means that a minimum pitch that is twice the wire width cannot be cut since there is no possibility of stacking vertically in single stack. Instead, in an embodiment, use of a staggered BAA enables much greater than 4000 times faster than individually ebeam writing each wire location. Furthermore, a staggered array allows a wire pitch to be twice the wire width. In a particular embodiment, an array has 4096 staggered openings over two columns such that EPE for each of the cut and via locations can be made. It is to be appreciated that a staggered array, as contemplated herein, may include two or more columns of staggered openings.

In an embodiment, use of a staggered array leaves space for including metal around the apertures of the BAA which contain one or two electrodes for passing or steering the ebeam to the wafer or steering to a Faraday cup or blanking aperture. That is, each opening may be separately controlled by electrodes to pass or deflect the ebeam. In one embodiment, the BAA has 4096 openings, and the ebeam apparatus covers the entire array of 4096 openings, with each opening electrically controlled. Throughput improvements are enabled by sweeping the wafer under the opening as shown by the thick black arrows.

In a particular embodiment, a staggered BAA has two rows of staggered BAA openings. Such an array permits tight pitch wires, where wire pitch can be 2× the wire width. Furthermore, all wires can be cut in a single pass (or vias can be made in a single pass), thereby enabling throughput on the ebeam machine. FIG. 21A illustrates two columns of staggered apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present disclosure.

Figure 43A:
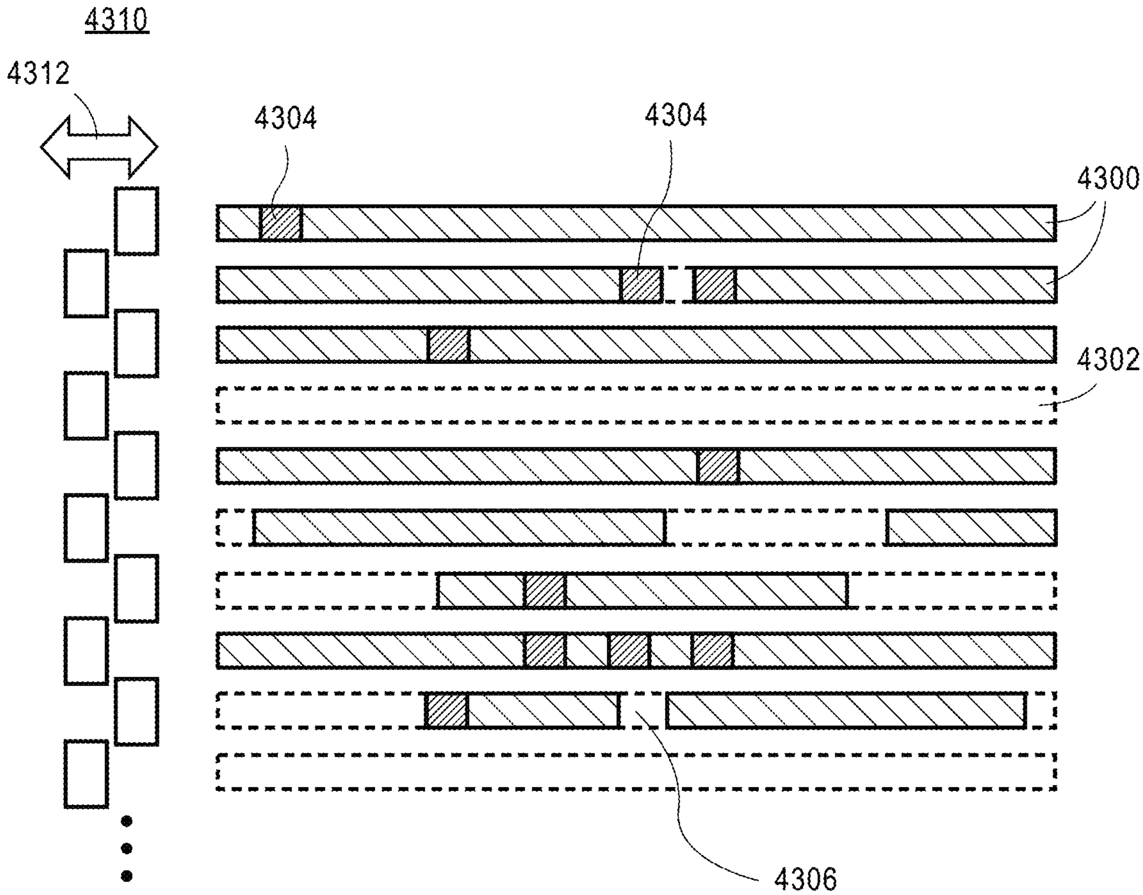
FIG. 43A illustrates two columns of staggered apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present disclosure.

Referring to FIG. 43A, the line result from a single staggered array could be as depicted, where lines are of single pitch, with cuts and vias patterned. In particular, FIG. 43A depicts a plurality of lines 4300 or open line positions 4302 where no lines exist. Vias 4304 and cuts 4306 may be formed along lines 4300. The lines 4300 are shown relative to a BAA 4310 having a scanning direction 4312. Thus, FIG. 43A may be viewed as a typical pattern produced by a single staggered array. Dotted lines show where cuts occurred in the patterned lines (including total cut to remove a full line or line portion). The via locations 4304 are patterning vias that land on top of the wires 4300.

It is to be appreciated that an ebeam column that includes a staggered beam aperture array (staggered BAA) as described above may also include other features in addition to those described in association with FIG. 39. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

Figure 43B:
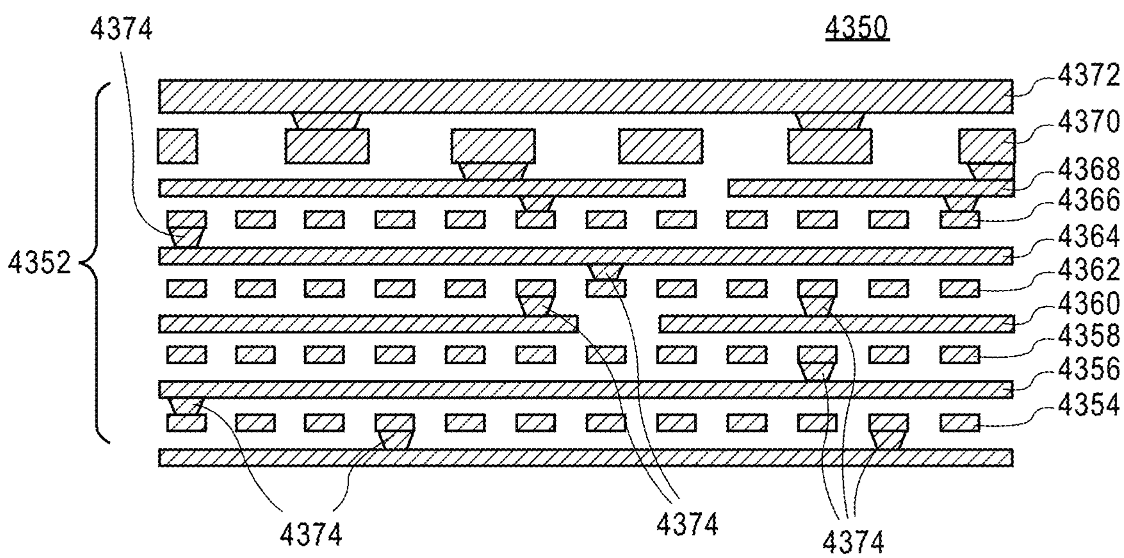
FIG. 43B illustrates a cross-sectional view of a stack of metallization layers in an integrated circuit based on metal line layouts of the type illustrated in FIG. 21A, in accordance with an embodiment of the present disclosure.

FIG. 43B illustrates a cross-sectional view of a stack 4350 of metallization layers 4352 in an integrated circuit based on metal line layouts of the type illustrated in FIG. 43A, in accordance with an embodiment of the present disclosure. Referring to FIG. 43B, in an exemplary embodiment, a metal cross-section for an interconnect stack 4350 is derived from a single BAA array for the lower eight matched metal layers 4354, 4356, 4358, 4360, 4362, 4364, 4366 and 4368. It is to be appreciated that upper thicker/wider metal lines 4370 and 4372 would not be made with the single BAA. Via locations 4374 are depicted as connecting the lower eight matched metal layers 4354, 4356, 4358, 4360, 4362, 4364, 4366 and 4368.

Overall, in an embodiment, complementary lithography as described herein involves first fabricating a gridded layout by conventional or state-of the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. Patterning of the pitch divided gridded layout may then be patterned using electron beam direct write (EBDW) "cuts." In one such embodiment, 193 nm immersion scaling can be extended for many generations with cost effective pitch division. In one embodiment, complementary EBL is used to break gratings continuity and to pattern vias. In another embodiment, complementary EUV is used to break gratings continuity and to pattern vias.

Figure 44:
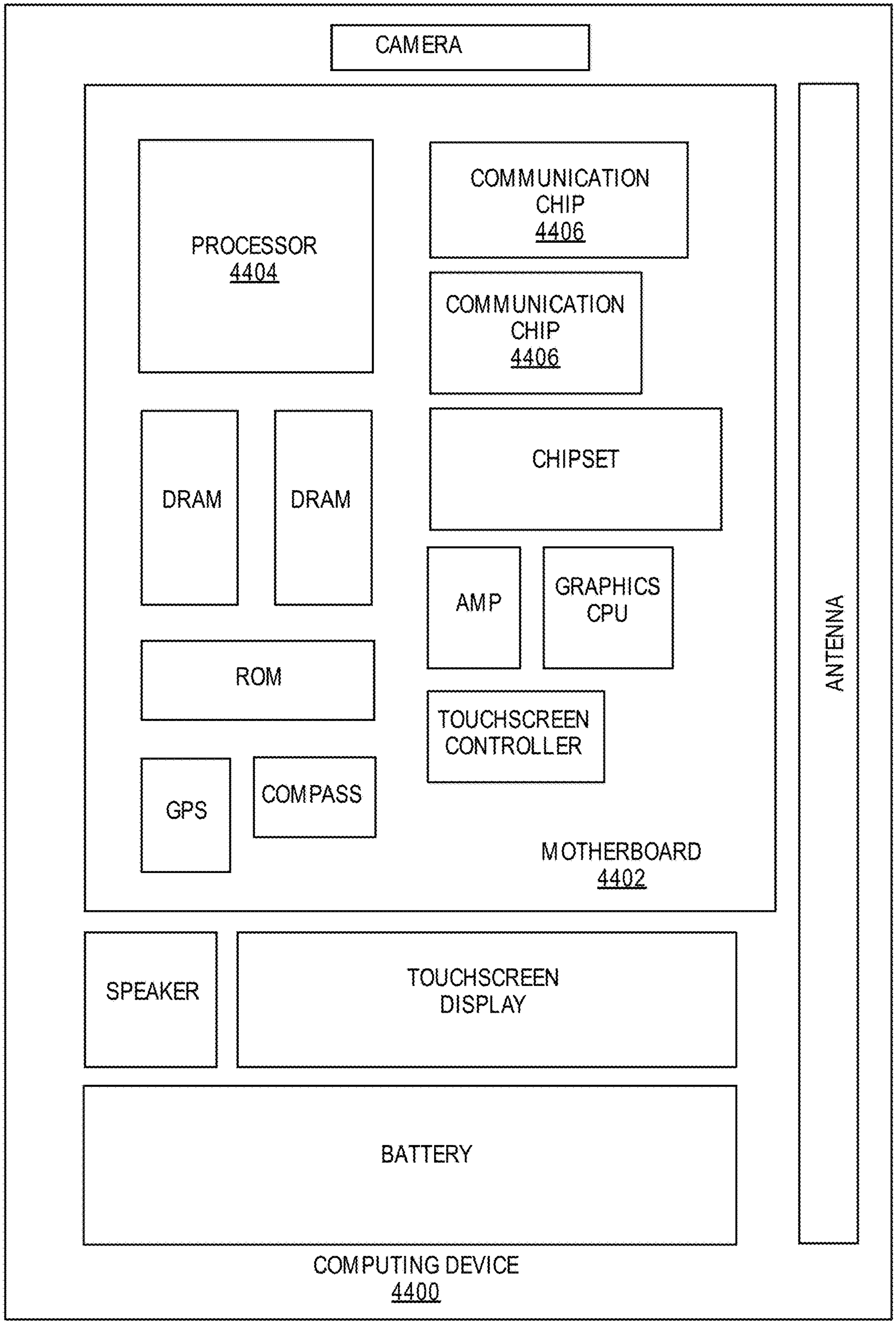
FIG. 44 illustrates a computing device in accordance with one implementation of the disclosure.

FIG. 44 illustrates a computing device 4400 in accordance with one implementation of the disclosure. The computing device 4400 houses a board 4402. The board 4402 may include a number of components, including but not limited to a processor 4404 and at least one communication chip 4406. The processor 4404 is physically and electrically coupled to the board 4402. In some implementations the at least one communication chip 4406 is also physically and electrically coupled to the board 4402. In further implementations, the communication chip 4406 is part of the processor 4404.

Depending on its applications, computing device 4400 may include other components that may or may not be physically and electrically coupled to the board 4402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 4406 enables wireless communications for the transfer of data to and from the computing device 4400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 4406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 4400 may include a plurality of communication chips 4406. For instance, a first communication chip 4406 may be dedicated to shorter range wireless communications such as Wi-Fi and Bluetooth and a second communication chip 4406 may be dedicated to longer range wireless communications such as GPS, EDGE, GPRS, CDMA, WiMAX, LTE, Ev-DO, and others.

The processor 4404 of the computing device 4400 includes an integrated circuit die packaged within the processor 4404. In some implementations of embodiments of the disclosure, the integrated circuit die of the processor includes one or more devices, such as MOS-FET transistors built in accordance with implementations of the disclosure. The term "processor" may refer to any device or portion of a device that processes electronic data from registers and/or memory to transform that electronic data into other electronic data that may be stored in registers and/or memory.

The communication chip 4406 also includes an integrated circuit die packaged within the communication chip 4406. In accordance with another implementation of the disclosure, the integrated circuit die of the communication chip is built in accordance with implementations of the disclosure.

In further implementations, another component housed within the computing device 4400 may contain an integrated circuit die built in accordance with implementations of embodiments of the disclosure.

In various embodiments, the computing device 4400 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 4400 may be any other electronic device that processes data.

Figure 45:
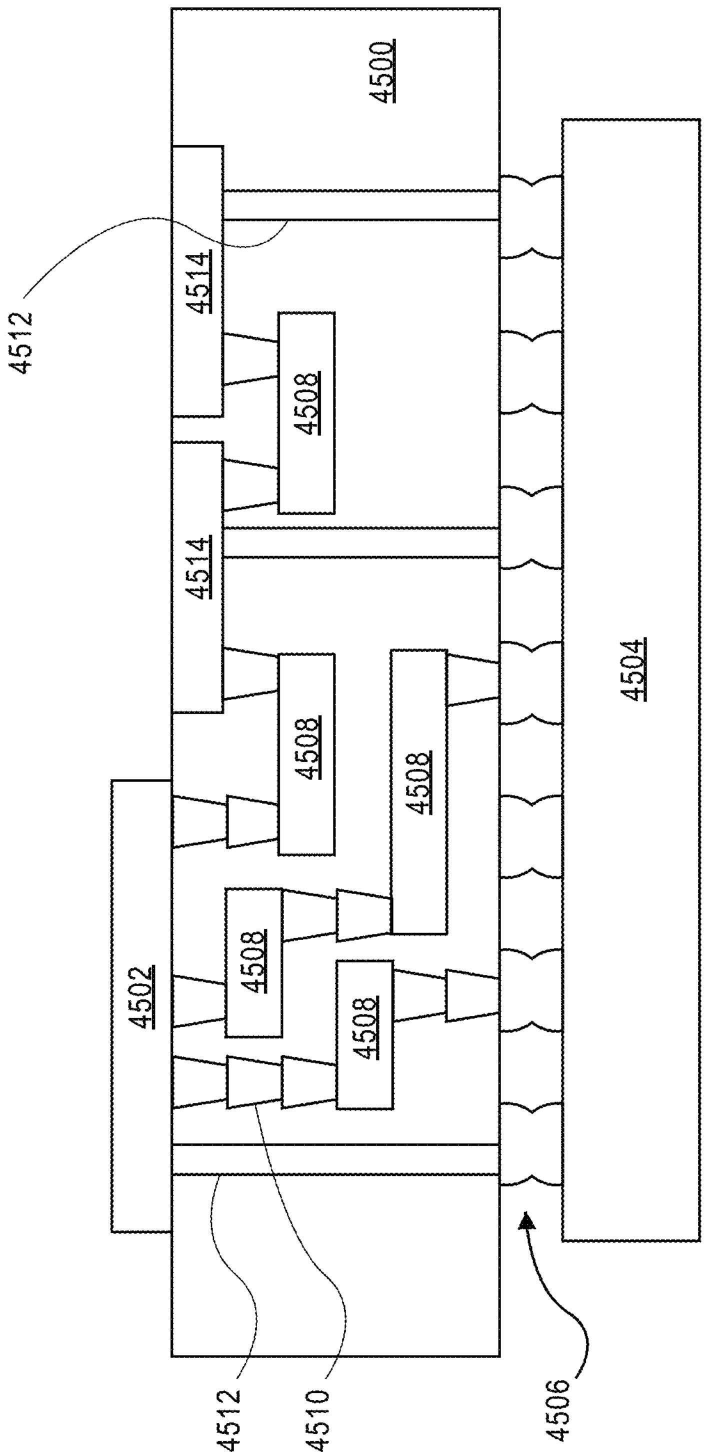
FIG. 45 illustrates an interposer that includes one or more embodiments of the disclosure.

FIG. 45 illustrates an interposer 4500 that includes one or more embodiments of the disclosure. The interposer 4500 is an intervening substrate used to bridge a first substrate 4502 to a second substrate 4504. The first substrate 4502 may be, for instance, an integrated circuit die. The second substrate 4504 may be, for instance, a memory module, a computer motherboard, or another integrated circuit die. Generally, the purpose of an interposer 4500 is to spread a connection to a wider pitch or to reroute a connection to a different connection. For example, an interposer 4500 may couple an integrated circuit die to a ball grid array (BGA) 506 that can subsequently be coupled to the second substrate 4504. In some embodiments, the first and second substrates 4502/4504 are attached to opposing sides of the interposer 4500. In other embodiments, the first and second substrates 4502/4504 are attached to the same side of the interposer 4500. And in further embodiments, three or more substrates are interconnected by way of the interposer 4500.

The interposer 4500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 4508 and vias 4510, including but not limited to through-silicon vias (TSVs) 4512. The interposer 4500 may further include embedded devices 4514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 4500. In accordance with embodiments of the disclosure, apparatuses or processes disclosed herein may be used in the fabrication of interposer 4500.

Thus, embodiments of the present disclosure include sub-10 nm pitch patterning and self-assembled devices.

Example embodiment 1: An integrated circuit structure includes a plurality of semiconductor bodies protruding from a surface of a semiconductor substrate, the plurality of semiconductor bodies having a grating pattern interrupted by a partial body portion. A trench isolation layer is between the plurality of semiconductor bodies and adjacent to lower portions of the plurality of semiconductor bodies, but not adjacent to upper portions of the plurality of semiconductor bodies, where the trench isolation layer is over the partial body portion. One or more gate electrode stacks are on top surfaces and laterally adjacent to sidewalls of the upper portions of the plurality of semiconductor bodies and on portions of the trench isolation layer. A back end of line (BEOL) metallization layer is above the one or more gate electrode stacks, the BEOL metallization layer including a plurality of alternating first and second conductive line types along a same direction, wherein a total composition of the first conductive line type is different from a total composition of the second conductive line type.

Example embodiment 2: The integrated circuit structure of example embodiment 1, wherein the lines of the first conductive line type are spaced apart by a pitch, and wherein the lines of the second conductive line type are spaced apart by the pitch.

Example embodiment 3: The integrated circuit structure of example embodiment 1 or 2, wherein the plurality of alternating first and second conductive line types is in an inter-layer dielectric (ILD) layer.

Example embodiment 4: The integrated circuit structure of example embodiment 1 or 2, wherein the lines of the plurality of alternating first and second conductive line types are separated by an air gap.

Example embodiment 5: The integrated circuit structure of example embodiment 1, 2, 3 or 4, wherein the total composition of the first conductive line type substantially includes copper, and wherein the total composition of the second conductive line type substantially includes a material selected from the group consisting of Al, Ti, Zr, Hf, V, Ru, Co, Ni, Pd, Pt, Cu, W, Ag, Au and alloys thereof.

Example embodiment 6: The integrated circuit structure of example embodiment 1, 2, 3, 4 or 5, wherein the lines of the plurality of alternating first and second conductive line types each include a barrier layer along a bottom of and sidewalls of the line.

Example embodiment 7: The integrated circuit structure of example embodiment 1, 2, 3, 4 or 5, wherein the lines of the plurality of alternating first and second conductive line types each include a barrier layer along a bottom of the line but not along sidewalls of the line.

Example embodiment 8: The integrated circuit structure of example embodiment 1, 2, 3, 4, 5, 6 or 7, wherein one or more of the lines of the plurality of alternating first and second conductive line types is connected to an underlying via connected to an underlying metallization layer, the underlying metallization layer between the one or more gate electrode stacks and the BEOL metallization layer, and wherein one or more of the lines of the plurality of alternating first and second conductive line types is interrupted by a dielectric plug.

Example embodiment 9: The integrated circuit structure of example embodiment 1, 2, 3, 4, 5, 6, 7 or 8, wherein the grating pattern has a constant pitch.

Example embodiment 10: The integrated circuit structure of example embodiment 1, 2, 3, 4, 5, 6, 7, 8 or 9, further including source or drain regions on both sides of the one or more gate electrode stacks, wherein the source or drain regions are adjacent to the upper portions of the plurality of semiconductor bodies and include a semiconductor material different than the semiconductor material of the semiconductor bodies.

Example embodiment 11: The integrated circuit structure of example embodiment 1, 2, 3, 4, 5, 6, 7, 8 or 9, further including source or drain regions on both sides of the one or more gate electrode stacks, wherein the source or drain regions are within the upper portions of the plurality of semiconductor bodies.

Example embodiment 12: The integrated circuit structure of example embodiment 1, 2, 3, 4, 5, 6, 7, 8, 9, 10 or 11, wherein each of the one or more gate electrode stacks includes a high-k gate dielectric layer and a metal gate electrode.

Example embodiment 13: The integrated circuit structure of example embodiment 1, 2, 3, 4, 5, 6, 7, 8, 9, 10, 11 or 12, wherein the first conductive line types have an upper surface with a metallic composition different from a metallic composition of an upper surface of the second conductive line types.

Example embodiment 14: An integrated circuit structure includes a plurality of semiconductor bodies protruding from a surface of a semiconductor substrate, the plurality of semiconductor bodies having a grating pattern interrupted by a partial body portion. A trench isolation layer is between the plurality of semiconductor bodies and adjacent to lower portions of the plurality of semiconductor bodies, but not adjacent to upper portions of the plurality of semiconductor bodies, where the trench isolation layer is over the partial body portion. One or more gate electrode stacks is on top surfaces and laterally adjacent to sidewalls of the upper portions of the plurality of semiconductor bodies and on portions of the trench isolation layer. A back end of line (BEOL) metallization layer is above the one or more gate electrode stacks, the BEOL metallization layer including a plurality of alternating first and second conductive line types along a same direction, wherein the lines of the plurality of alternating first and second conductive line types each include a barrier layer along a bottom of the line but not along sidewalls of the line.

Example embodiment 15: The integrated circuit structure of example embodiment 14, wherein the lines of the first conductive line type are spaced apart by a pitch, and wherein the lines of the second conductive line type are spaced apart by the pitch.

Example embodiment 16: The integrated circuit structure of example embodiment 14 or 15, wherein the plurality of alternating first and second conductive line types is in an inter-layer dielectric (ILD) layer.

Example embodiment 17: The integrated circuit structure of example embodiment 14 or 15, wherein the lines of the plurality of alternating first and second conductive line types are separated by an air gap.

Example embodiment 18: The integrated circuit structure of example embodiment 14, 15, 16 or 17, wherein a total composition of the first conductive line type is the same as a total composition of the second conductive line type.

Example embodiment 19: The integrated circuit structure of example embodiment 14, 15, 16 or 17, wherein a total composition of the first conductive line type substantially includes copper, and wherein a total composition of the second conductive line type substantially includes a material selected from the group consisting of Al, Ti, Zr, Hf, V, Ru, Co, Ni, Pd, Pt, Cu, W, Ag, Au and alloys thereof.

Example embodiment 20: The integrated circuit structure of example embodiment 14, 15, 16, 17, 18 or 19, wherein one or more of the lines of the plurality of alternating first and second conductive line types is connected to an underlying via connected to an underlying metallization layer, the underlying metallization layer between the one or more gate electrode stacks and the BEOL metallization layer, and wherein one or more of the lines of the plurality of alternating first and second conductive line types is interrupted by a dielectric plug.

Example embodiment 21: The integrated circuit structure of example embodiment 14, 15, 16, 17, 18, 19 or 20, wherein the grating pattern has a constant pitch.

Example embodiment 22: The integrated circuit structure of example embodiment 14, 15, 16, 17, 18, 19, 20 or 21, further including source or drain regions on both sides of the one or more gate electrode stacks, wherein the source or drain regions are adjacent to the upper portions of the plurality of semiconductor bodies and include a semiconductor material different than the semiconductor material of the semiconductor bodies.

Example embodiment 23: The integrated circuit structure of example embodiment 14, 15, 16, 17, 18, 19, 20 or 21, further including source or drain regions on both sides of the one or more gate electrode stacks, wherein the source or drain regions are within the upper portions of the plurality of semiconductor bodies.

Example embodiment 24: The integrated circuit structure of example embodiment 14, 15, 16, 17, 18, 19, 20, 21, 22 or 23, wherein each of the one or more gate electrode stacks includes a high-k gate dielectric layer and a metal gate electrode.

Example embodiment 25: An integrated circuit structure includes a plurality of semiconductor bodies protruding from a surface of a semiconductor substrate, the plurality of semiconductor bodies having a first grating pattern interrupted by a partial body portion. A trench isolation layer is between the plurality of semiconductor bodies and adjacent to lower portions of the plurality of semiconductor bodies, but not adjacent to upper portions of the plurality of semiconductor bodies, where the trench isolation layer is over the partial body portion. One or more gate electrode stacks is on top surfaces and laterally adjacent to sidewalls of the upper portions of the plurality of semiconductor bodies and on portions of the trench isolation layer. A first back end of line (BEOL) metallization layer is above the one or more gate electrode stacks, the first BEOL metallization layer including a second grating of alternating metal lines and dielectric lines in a first direction. A second BEOL metallization layer is above the first BEOL metallization layer, the second BEOL metallization layer including a third grating of alternating metal lines and dielectric lines in a second direction. The second direction is orthogonal to the first direction. Each metal line of the third grating of the second BEOL metallization layer is on a dielectric layer including alternating distinct regions of a first dielectric material and a second dielectric material corresponding to the alternating metal lines and dielectric lines of the first BEOL metallization layer. Each dielectric line of the third grating of the second BEOL metallization layer includes a continuous region of a third dielectric material distinct from the alternating distinct regions of the first dielectric material and the second dielectric material.

Example embodiment 26: The integrated circuit structure of example embodiment 25, wherein a metal line of the second BEOL metallization layer is electrically coupled to a metal line of the first BEOL metallization layer by a via having a center directly aligned with a center of the metal line of the first BEOL metallization layer and with a center of the metal line of the second BEOL metallization layer.

Example embodiment 27: The integrated circuit structure of example embodiment 25 or 26, wherein a metal line of the second BEOL metallization layer is disrupted by a plug having a center directly aligned with a center of a dielectric line of the first BEOL metallization layer.

Example embodiment 28: The integrated circuit structure of example embodiment 25, 26 or 27, wherein none of the first dielectric material, the second dielectric material, and the third dielectric material are the same material.

Example embodiment 29: The integrated circuit structure of example embodiment 25, 26 or 27, wherein only two of the first dielectric material, the second dielectric material, and the third dielectric material are the same material.

Example embodiment 30: The integrated circuit structure of example embodiment 25, 26, 27, 28 or 29, wherein the alternating distinct regions of the first dielectric material and the second dielectric material are separated by seams, and wherein the continuous region of the third dielectric material is separated from the alternating distinct regions of the first dielectric material and the second dielectric material by seams.

Example embodiment 31: The integrated circuit structure of example embodiment 25, 26, 27 or 30, wherein all of the first dielectric material, the second dielectric material, and the third dielectric material are the same material.

Example embodiment 32: The integrated circuit structure of example embodiment 25, 26, 27, 28, 29, 30 or 31, wherein the first grating pattern has a constant pitch.

Example embodiment 33: The integrated circuit structure of example embodiment 25, 26, 27, 28, 29, 30, 31 or 32, further including source or drain regions on both sides of the one or more gate electrode stacks, wherein the source or drain regions are adjacent to the upper portions of the plurality of semiconductor bodies and include a semiconductor material different than the semiconductor material of the semiconductor bodies.

Example embodiment 34: The integrated circuit structure of example embodiment 25, 26, 27, 28, 29, 30, 31 or 32, further including source or drain regions on both sides of the one or more gate electrode stacks, wherein the source or drain regions are within the upper portions of the plurality of semiconductor bodies.

Example embodiment 35: The integrated circuit structure of example embodiment 25, 26, 27, 28, 29, 30, 31, 32, 33 or 34, wherein each of the one or more gate electrode stacks includes a high-k gate dielectric layer and a metal gate electrode.

Example embodiment 36: The integrated circuit structure of example embodiment 25, 26, 27, 28, 29, 30, 31, 32, 33, 34 or 35, wherein an etch stop layer or an additional dielectric layer separates the first BEOL metallization layer and the second BEOL metallization layer.

Example embodiment 37: A method of fabricating an integrated circuit structure includes forming a plurality of backbone features above a substrate, forming a first set of spacers along sidewalls of each of the plurality of backbone features, the first set of spacers having a first material composition different than a material composition of the plurality of backbone features, forming a second set of spacers along sidewalls of each of the first set of spacers, the second set of spacers having a second material composition different than the first material composition and different than the material composition of the plurality of backbone features, forming a third set of spacers along sidewalls of each of the second set of spacers, the third set of spacers having a third material composition different than the first material composition, different than the second material composition, and different than the material composition of the plurality of backbone features, forming a fourth set of spacers along sidewalls of each of the third set of spacers, the fourth set of spacers having the second material composition, forming a fifth set of spacers laterally adjacent to sidewalls of each of the fourth set of spacers, the fifth set of spacers having the first material composition, removing the plurality of backbone features subsequent to forming the fifth set of spacers, forming a sixth set of spacers along sidewalls of each of the first set of spacers and along sidewalls of each of the fifth set of spacers subsequent to removing the plurality of backbone features, the sixth set of spacers having the second material composition, forming a final feature in each opening between adjacent pairs of spacers of the sixth set of spacers, planarizing the first set of spacers, the second set of spacers, the third set of spacers, the fourth set of spacers, the fifth set of spacers, the sixth set of spacers, and the final features to form a target foundation layer, and using the target foundation layer to form a metallization layer of a semiconductor structure.

Example embodiment 38: The method of example embodiment 37, wherein forming the plurality of backbone features includes using a standard lithography operation.

Example embodiment 39: The method of example embodiment 37 or 38, wherein forming the plurality of backbone features includes forming a plurality of features including a material selected from the group consisting of silicon nitride, silicon oxide and silicon carbide.

Example embodiment 40: The method of example embodiment 37, 38 or 39, wherein forming the first set of spacers includes depositing a material of the first set of spacers conformal with the plurality of backbone features using an atomic layer deposition (ALD) process, and anisotropically etching the material of the first set of spacers to form the first set of spacers along the sidewalls of each of plurality of backbone features.

Example embodiment 41: The method of example embodiment 37, 38 or 39, wherein forming the first set of spacers includes selectively growing a material of the first set of spacers along the sidewalls of each of plurality of backbone features.

Example embodiment 42: The method of example embodiment 37, 38, 39, 40 or 41, wherein each final feature has a lateral width greater than a lateral width of each spacers from the first set of spacers, the second set of spacers, the third set of spacers, the fourth set of spacers, the fifth set of spacers, and the sixth set of spacers.

Example embodiment 43: The method of example embodiment 37, 38, 39, 40, 41 or 42, wherein each final feature is formed by a merging of material growth formed along adjacent pairs of spacers of the sixth set of spacers.

Example embodiment 44: The method of example embodiment 37, 38, 39, 40, 41, 42 or 43, wherein each final feature includes the third material composition.

Example embodiment 45: The method of example embodiment 37, 38, 39, 40, 41, 42, 43 or 44, wherein using the target foundation layer to form the metallization layer of the semiconductor structure includes removing all portions of the first material composition to form a first plurality of trenches, and forming a first plurality of conductive lines in the first plurality of trenches.

Example embodiment 46: The method of example embodiment 45, wherein using the target foundation layer to form the metallization layer of the semiconductor structure further includes removing all portions of the third material composition to form a second plurality of trenches, and forming a second plurality of conductive lines in the second plurality of trenches.

Example embodiment 47: The method of example embodiment 46, wherein the first plurality of conductive lines and the second plurality of conductive lines are of a same composition.

Example embodiment 48: The method of example embodiment 46, wherein the first plurality of conductive lines and the second plurality of conductive lines are of a different composition.

Example embodiment 49: The method of example embodiment 37, 38, 39, 40, 41, 42, 43, 44, 45, 46, 47 or 48, further including forming an additional 20-200 sets of spacers between forming the fifth set of spacers and the sixth set of spacers, and prior to removing the plurality of backbone features.

Example embodiment 50: A target structure for fabricating an integrated circuit structure includes a first set of spacers above a hardmask layer above a substrate, the first set of spacers having a first material composition. A second set of spacers is along outer sidewalls of each of the first set of spacers, the second set of spacers having a second material composition different than the first material composition. A third set of spacers is along sidewalls of each of the second set of spacers, the third set of spacers having a third material composition different than the first material composition, and different than the second material composition. A fourth set of spacers is along sidewalls of each of the third set of spacers, the fourth set of spacers having the second material composition. A fifth set of spacers is laterally adjacent to sidewalls of each of the fourth set of spacers, the fifth set of spacers having the first material composition. A sixth set of spacers is along inner sidewalls of each of the first set of spacers and along sidewalls of each of the fifth set of spacers, the sixth set of spacers having the second material composition. A final feature is in each opening between adjacent pairs of spacers of the sixth set of spacers.

Example embodiment 51: The target structure of example embodiment 50, wherein the first set of spacers, the second set of spacers, the third set of spacers, the fourth set of spacers, the fifth set of spacers, the sixth set of spacers, and the final features are substantially co-planar with one another.

Example embodiment 52: The target structure of example embodiment 50 or 51, wherein each final feature has a lateral width greater than a lateral width of each spacers from the first set of spacers, the second set of spacers, the third set of spacers, the fourth set of spacers, the fifth set of spacers, and the sixth set of spacers.

Example embodiment 53: The target structure of example embodiment 52, wherein the lateral width of each final feature is in the range of 6-12 nanometers.

Example embodiment 54: The target structure of example embodiment 50, 51, 52 or 53, wherein each final feature has a seam approximately centered within the final feature.

Example embodiment 55: The target structure of example embodiment 50, 51, 52, 53 or 54, wherein each final feature includes the third material composition.

What is claimed is:

1. A method of fabricating an integrated circuit structure, the method comprising:

forming a plurality of backbone features above a semiconductor substrate, a semiconductor layer, or a stack of semiconductor layers;

forming a first set of spacers along sidewalls of each of the plurality of backbone features, the first set of spacers having a first material composition different than a material composition of the plurality of backbone features;

forming a second set of spacers along sidewalls of each of the first set of spacers, the second set of spacers having a second material composition different than the first material composition and different than the material composition of the plurality of backbone features;

subsequent to forming the second set of spacers, removing the plurality of backbone features;

subsequent to removing the plurality of backbone features, forming a third set of spacers along sidewalls of each of the first set of spacers, the third set of spacers having the second material composition;

forming a final feature in each opening between adjacent pairs of spacers of the third set of spacers;

planarizing the first set of spacers, the second set of spacers, the third set of spacers, and the final features to form a target foundation layer; and using the target foundation layer to form a plurality of fins or three-dimensional bodies in the semiconductor substrate, the semiconductor layer, or the stack of semiconductor layers.

2. The method of claim 1, wherein forming the plurality of backbone features comprises using a standard lithography operation.

3. The method of claim 1, wherein forming the plurality of backbone features comprises forming a plurality of features comprising a material selected from the group consisting of silicon nitride, silicon oxide and silicon carbide.

4. The method of claim 1, wherein forming the first set of spacers comprises:

depositing a material of the first set of spacers conformal with the plurality of backbone features using an atomic layer deposition (ALD) process; and anisotropically etching the material of the first set of spacers to form the first set of spacers along the sidewalls of each of plurality of backbone features.

5. The method of claim 1, wherein forming the first set of spacers comprises selectively growing a material of the first set of spacers along the sidewalls of each of plurality of backbone features.

6. The method of claim 1, wherein each final feature has a lateral width greater than a lateral width of each spacer from the first set of spacers, the second set of spacers, and the third set of spacers.

7. The method of claim 1, wherein each final feature is formed by a merging of material growth formed along adjacent pairs of spacers of the third set of spacers.

8. The method of claim 1, wherein each final feature comprises a third material composition.

9. The method of claim 1, wherein using the target foundation layer to form the metallization layer of the semiconductor structure comprises:

removing all portions of the first material composition to form a first plurality of trenches; and forming a first plurality of conductive lines in the first plurality of trenches.

10. The method of claim 9, wherein using the target foundation layer to form the metallization layer of the semiconductor structure further comprises:

forming a second plurality of trenches; and forming a second plurality of conductive lines in the second plurality of trenches.

11. The method of claim 10, wherein the first plurality of conductive lines and the second plurality of conductive lines are of a same composition.

12. The method of claim 10, wherein the first plurality of conductive lines and the second plurality of conductive lines are of a different composition.

13. The method of claim 1, further comprising forming additional sets of spacers between forming the second set of spacers and the third set of spacers, and prior to removing the plurality of backbone features.

14. A method of fabricating an integrated circuit structure, the method comprising:

forming a plurality of backbone features above a semiconductor substrate, a semiconductor layer, or a stack of semiconductor layers;

forming a first set of spacers along sidewalls of each of the plurality of backbone features, the first set of spacers having a first material composition different than a material composition of the plurality of backbone features;

forming a second set of spacers along sidewalls of each of the first set of spacers, the second set of spacers having a second material composition different than the first material composition and different than the material composition of the plurality of backbone features;

forming a third set of spacers along sidewalls of each of the second set of spacers, the third set of spacers having a third material composition different than the first material composition, different than the second material composition, and different than the material composition of the plurality of backbone features;

forming a fourth set of spacers along sidewalls of each of the third set of spacers, the fourth set of spacers having the second material composition;

forming a fifth set of spacers laterally adjacent to sidewalls of each of the fourth set of spacers, the fifth set of spacers having the first material composition;

subsequent to forming the fifth set of spacers, removing the plurality of backbone features;

subsequent to removing the plurality of backbone features, forming a sixth set of spacers along sidewalls of each of the first set of spacers and along sidewalls of each of the fifth set of spacers, the sixth set of spacers having the second material composition;

forming a final feature in each opening between adjacent pairs of spacers of the sixth set of spacers;

planarizing the first set of spacers, the second set of spacers, the third set of spacers, the fourth set of spacers, the fifth set of spacers, the sixth set of spacers, and the final features to form a target foundation layer; and using the target foundation layer to form a plurality of fins or three-dimensional bodies in the semiconductor substrate, the semiconductor layer, or the stack of semiconductor layers.

15. The method of claim 14, wherein forming the plurality of backbone features comprises using a standard lithography operation.

16. The method of claim 14, wherein forming the plurality of backbone features comprises forming a plurality of features comprising a material selected from the group consisting of silicon nitride, silicon oxide and silicon carbide.

17. The method of claim 14, wherein forming the first set of spacers comprises:

depositing a material of the first set of spacers conformal with the plurality of backbone features using an atomic layer deposition (ALD) process; and anisotropically etching the material of the first set of spacers to form the first set of spacers along the sidewalls of each of plurality of backbone features.

18. The method of claim 14, wherein forming the first set of spacers comprises selectively growing a material of the first set of spacers along the sidewalls of each of plurality of backbone features.

19. The method of claim 14, wherein each final feature has a lateral width greater than a lateral width of each spacers from the first set of spacers, the second set of spacers, the third set of spacers, the fourth set of spacers, the fifth set of spacers, and the sixth set of spacers.

20. The method of claim 14, wherein each final feature is formed by a merging of material growth formed along adjacent pairs of spacers of the sixth set of spacers.

* * * * *